US008796917B2

(12) United States Patent
Kang et al.

(10) Patent No.: US 8,796,917 B2
(45) Date of Patent: Aug. 5, 2014

(54) COMPOUND FOR AN ORGANIC OPTOELECTRONIC DEVICE, ORGANIC LIGHT EMITTING DIODE INCLUDING THE SAME, AND DISPLAY INCLUDING THE ORGANIC LIGHT EMITTING DIODE

(75) Inventors: Dong-Min Kang, Uiwang-si (KR); Myeong-Soon Kang, Uiwang-si (KR); Nam-Soo Kim, Uiwang-si (KR); Chang-Ju Shin, Uiwang-si (KR); Nam-Heon Lee, Uiwang-si (KR); Ho-Kuk Jung, Uiwang-si (KR); Mi-Young Chae, Uiwang-si (KR)

(73) Assignee: Cheil Industries, Inc, Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/552,731

(22) Filed: Jul. 19, 2012

(65) Prior Publication Data

US 2012/0280613 A1 Nov. 8, 2012

Related U.S. Application Data

(63) Continuation-in-part of application No. PCT/KR2011/003224, filed on Apr. 29, 2011.

(30) Foreign Application Priority Data

Dec. 31, 2010 (KR) ........................ 10-2010-0140563

(51) Int. Cl.
*C07D 401/10* (2006.01)
*C07D 413/10* (2006.01)
*H05B 33/14* (2006.01)

(52) U.S. Cl.
USPC ........... 313/504; 544/180; 544/294; 544/333; 546/101; 546/102

(58) Field of Classification Search
None
See application file for complete search history.

(56) References Cited

U.S. PATENT DOCUMENTS

| | | | |
|---|---|---|---|
| 2006/0049410 | A1 | 3/2006 | Hosokawa et al. |
| 2007/0267958 | A1 | 11/2007 | Kitazawa et al. |
| 2009/0026919 | A1 | 1/2009 | Stosssel et al. |
| 2009/0242877 | A1 | 10/2009 | Kondakov |
| 2010/0327270 | A1 | 12/2010 | Buesing et al. |

FOREIGN PATENT DOCUMENTS

| | | | | |
|---|---|---|---|---|
| JP | 2006-069932 | | 3/2006 | |
| JP | 2007-015993 | | 1/2007 | |
| JP | 2007-223928 | | 9/2007 | |
| JP | 2010-027761 | | 2/2010 | |
| KR | 10-2006-0096980 | A | 9/2006 | |
| KR | 10-2007-0052764 | A | 5/2007 | |
| KR | 10-2008-0016007 | A | 2/2008 | |
| KR | 10-2008-0041754 | A | 5/2008 | |
| KR | 10-2009-0131958 | A | 12/2009 | |
| KR | 10-2011-0005666 | A | 1/2011 | |
| KR | 10-2011-0047803 | A | 5/2011 | |
| KR | 10-2011-0076488 | A | 7/2011 | |
| KR | 10-2011-0096453 | A | 8/2011 | |
| WO | WO-2004/017137 | A1 | 2/2004 | |
| WO | WO-2006/021982 | A1 | 3/2006 | |
| WO | WO-2006/039982 | A1 | 4/2006 | |
| WO | WO-2009/100925 | A1 | 8/2009 | |
| WO | WO 2010036036 | A2 * | 4/2010 | .............. C07C 15/28 |

OTHER PUBLICATIONS

Herz & Lewis, Dimer of 1,3-diphenyl-1,3-butadiene, 23 J.O.C. 1646-53 (1958) (CAS Abstract).*

Badger et al., Synthetic Applications of Activated Metal Catalysts, J. Chem. Soc. 616-20 (1956).*

Scholz et al. "Photochemical reactions in organic semiconductor thin films", Organic Electronics 8, 2007, pp. 709-717.

Adachi et al. "Electroluminescence in Organic Films with Three-Layer Structure", Japanese Journal of Applied Physics, vol. 27, No. 2, Feb. 1988, pp. L269-L271.

Identification Search Reports in PCT/KR2011/003224, dated Feb. 6, 2012 (Kang, et al.).

* cited by examiner

*Primary Examiner* — Janet L Andres
*Assistant Examiner* — Timothy R Rozof
(74) *Attorney, Agent, or Firm* — Lee & Morse, P.C.

(57) ABSTRACT

A compound for an organic optoelectronic device, an organic light emitting diode, and a display device, the compound being represented by the following Chemical Formula 1:

[Chemical Formula 1]

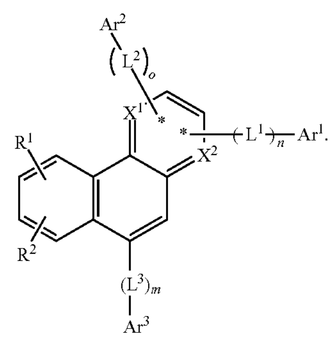

19 Claims, 5 Drawing Sheets

COMPOUND FOR AN ORGANIC OPTOELECTRONIC DEVICE, ORGANIC LIGHT EMITTING DIODE INCLUDING THE SAME, AND DISPLAY INCLUDING THE ORGANIC LIGHT EMITTING DIODE

CROSS-REFERENCE TO RELATED APPLICATIONS

This application is a continuation-in-part of pending International Application No. PCT/KR2011/003224 entitled "Compound for Organic Optoelectronic Device, Organic Light Emitting Diode Including the Same and Display Including the Organic Light Emitting Diode," which was filed on Apr. 29, 2011, the entire contents of which are hereby incorporated by reference.

Korean Patent Application No. 10-2010-0140563, filed on Dec. 31, 2010, in the Korean Intellectual Property Office, and entitled: "Compound for Organic Optoelectronic Device, Organic Light Emitting Diode Including the Same and Display Including the Organic Light Emitting Diode," is incorporated by reference herein in its entirety.

BACKGROUND

1. Field

Embodiments relate to a compound for an organic optoelectronic device, an organic light emitting diode including the same, and a display including the organic light emitting diode.

2. Description of the Related Art

An organic optoelectronic device is, in a broad sense, a device for transforming photo-energy to electrical energy, or conversely, a device for transforming electrical energy to photo-energy.

An organic optoelectronic device may be classified as follows in accordance with its driving principles. One type of organic optoelectronic device is an electronic device driven as follows: excitons may be generated in an organic material layer by photons from an external light source; the excitons may be separated into electrons and holes; and the electrons and holes may be transferred to different electrodes as a current source (voltage source).

Another type of organic optoelectronic device is an electronic device driven as follows: a voltage or a current may be applied to at least two electrodes to inject holes and/or electrons into an organic material semiconductor positioned at an interface of the electrodes, and the device may be driven by the injected electrons and holes.

Examples of an organic optoelectronic device may include an organic photoelectric device, an organic solar cell, an organic photo conductor drum, and an organic transistor, and it requires a hole injecting or transporting material, an electron injecting or transporting material, or a light emitting material.

An organic light emitting diode (OLED) has recently drawn attention due to an increase in demand for flat panel displays. In general, organic light emission may refer to transformation of electrical energy to photo-energy.

SUMMARY

Embodiments are directed to a compound for an organic optoelectronic device, an organic light emitting diode including the same, and a display including the organic light emitting diode The embodiments may be realized by providing a compound for an organic optoelectronic device, the compound being represented by the following Chemical Formula 1:

[Chemical Formula 1]

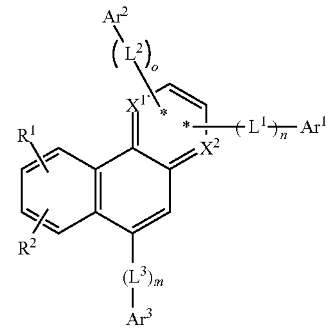

wherein, in Chemical Formula 1 $X^1$ and $X^2$ are each independently —N— or —CR'—, in which R' is hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, or forms a sigma bond with one of the *, $R^1$ and $R^2$ are each independently hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, $Ar^1$ to $Ar^3$ are each independently a substituted or unsubstituted C6 to C30 aryl group or a substituted or unsubstituted C3 to C30 heteroaryl group, $L^1$ to $L^3$ are each independently a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof, and n, m, and o are each independently 0 or 1.

The compound may be represented by the following Chemical Formula 2:

[Chemical Formula 2]

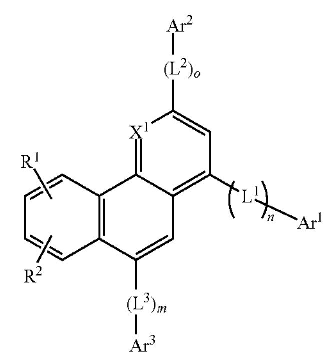

wherein, in Chemical Formula 2 $X^1$ is —N— or —CR'—, in which R' is hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, $R^1$ and $R^2$ are each independently hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, $Ar^1$ to $Ar^3$ are each independently a substituted or unsubstituted C6 to C30 aryl group or a substituted or unsubstituted C3 to C30 heteroaryl group, $L^1$ to $L^3$ are each independently a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof, and n, m, and o are each independently 0 or 1.

$X^1$ may be N. At least one of $Ar^1$ or $Ar^2$ may be a substituted or unsubstituted C3 to C30 heteroaryl group.

$Ar^1$ may be a substituted or unsubstituted C3 to C30 heteroaryl group, and $Ar^2$ and $Ar^3$ may each independently be a substituted or unsubstituted C6 to C30 aryl group.

$Ar^2$ may be a substituted or unsubstituted C3 to C30 heteroaryl group, and $Ar^1$ and $Ar^3$ may each independently be a substituted or unsubstituted C6 to C30 aryl group.

The substituted or unsubstituted C3 to C30 heteroaryl group may be a substituted or unsubstituted imidazolyl group, a substituted or unsubstituted triazolyl group, a substituted or unsubstituted tetrazolyl group, a substituted or unsubstituted carbazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphpyridinyl group, a substituted or unsubstituted quinoxalinyl group, a substituted or unsubstituted quinazolinyl group, a substituted or unsubstituted acridinyl group, a substituted or unsubstituted phenanthrolinyl group, a substituted or unsubstituted phenazinyl group, or a combination thereof.

The substituted or unsubstituted C6 to C30 aryl group may be a substituted or unsubstituted phenyl group, a substituted or unsubstituted naphthyl group, a substituted or unsubstituted triperylenyl group, a substituted or unsubstituted fluorenyl group, a substituted or unsubstituted spirofluorenyl group, a substituted or unsubstituted biphenyl group, a substituted or unsubstituted terphenyl group, a substituted or unsubstituted pyrenyl group, a substituted or unsubstituted perylenyl group, a substituted or unsubstituted phenanthrenyl group, a substituted or unsubstituted anthracenyl group, or a combination thereof.

The embodiments may also be realized by providing a compound for an organic optoelectronic device, the compound being represented by one of the following Chemical Formulae A1 to A189:

[Chemical Formula A1]

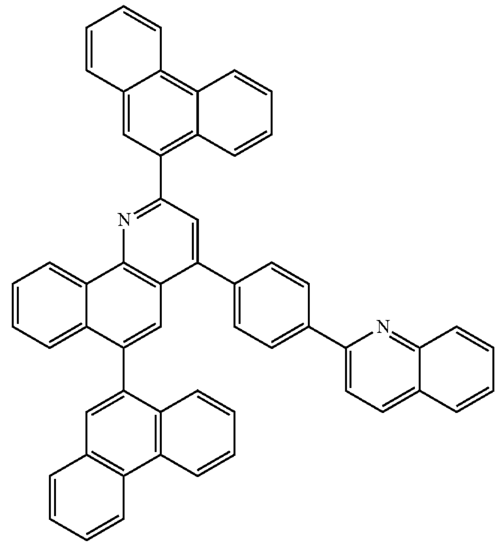

[Chemical Formula A2]

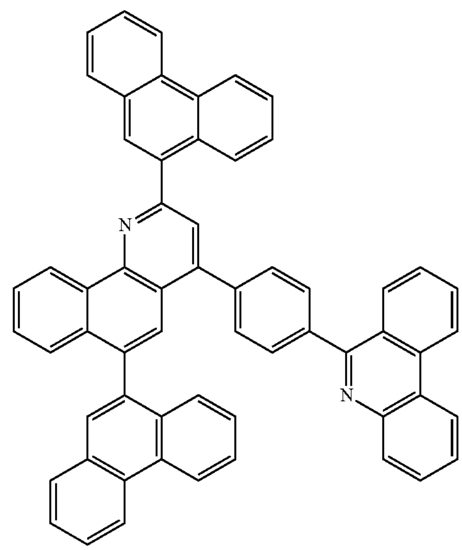

[Chemical Formula A3]

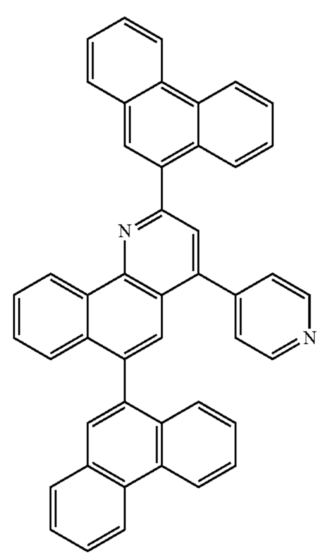

[Chemical Formula A4]
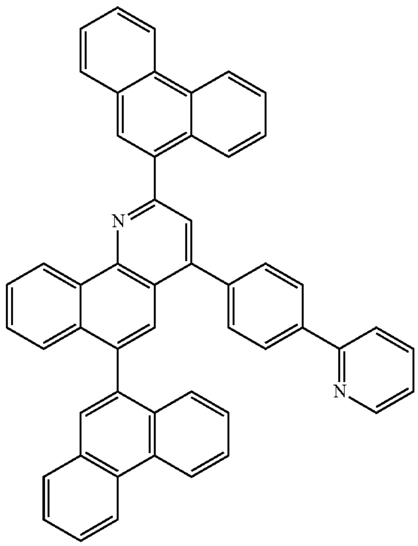
[Chemical Formula A5]
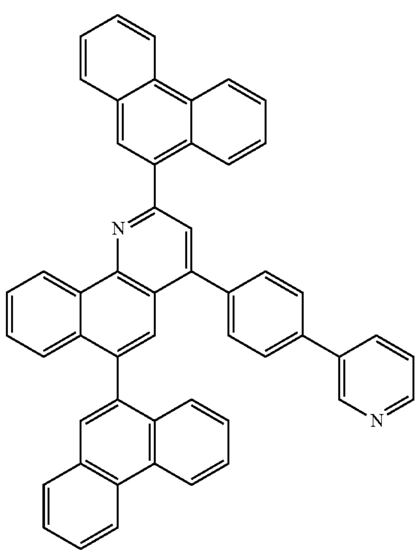
[Chemical Formula A6]
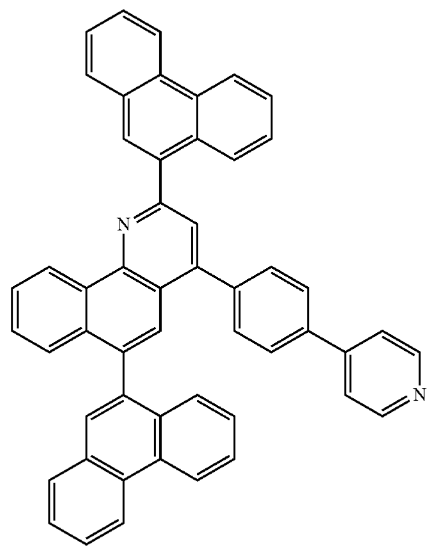
[Chemical Formula A7]
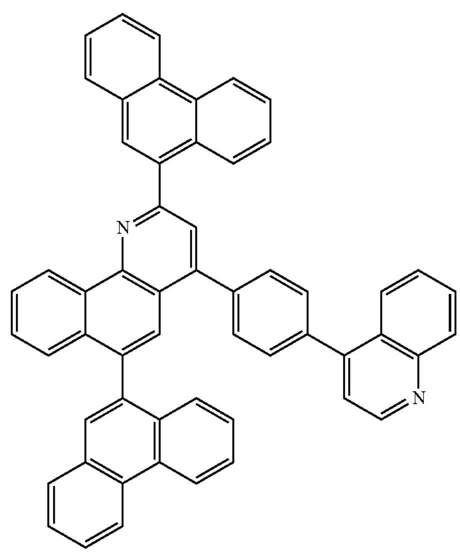

-continued
[Chemical Formula A8]
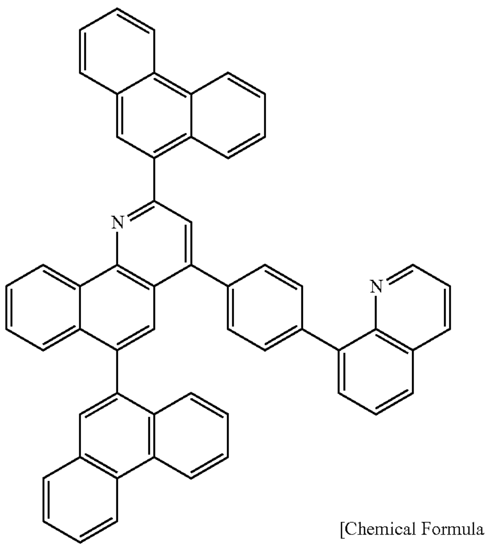
[Chemical Formula A9]
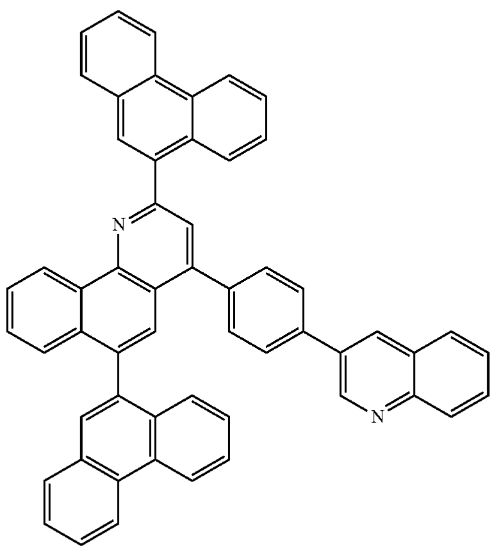
[Chemical Formula A10]
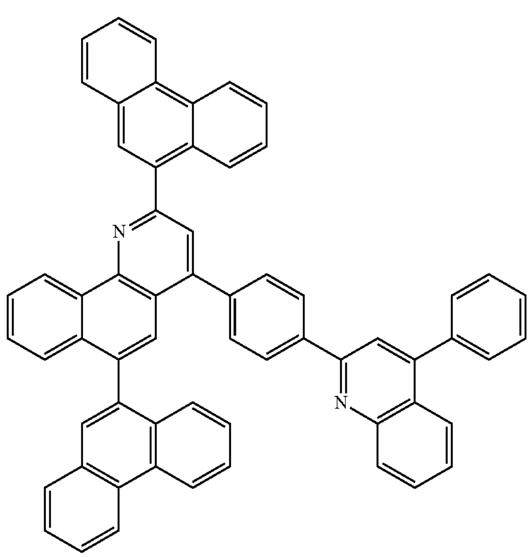
-continued
[Chemical Formula A11]
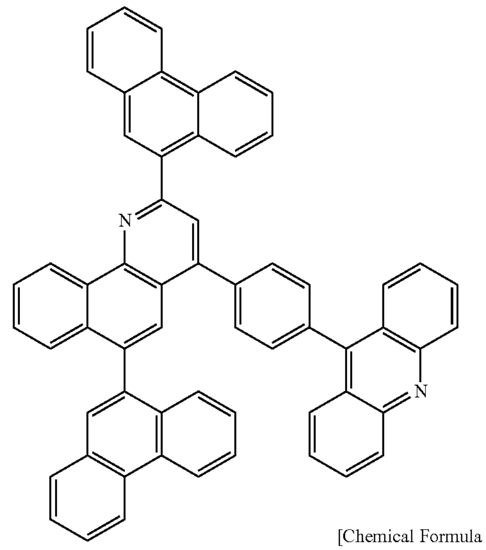
[Chemical Formula A12]
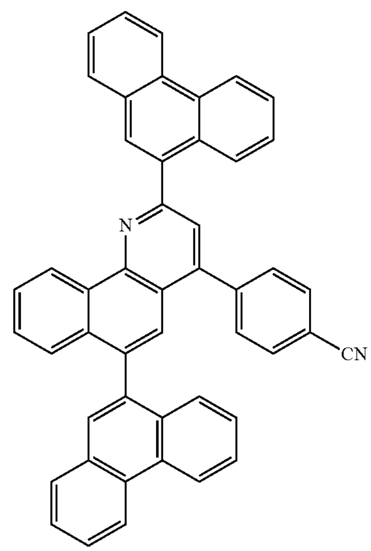
[Chemical Formula A13]
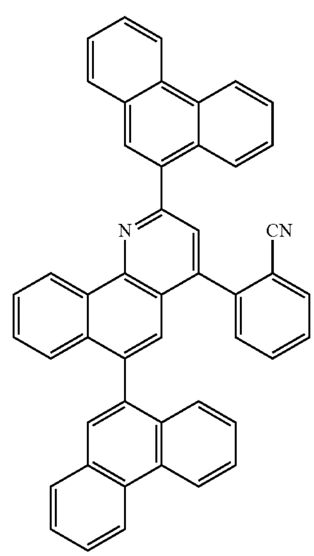

-continued
[Chemical Formula A14]
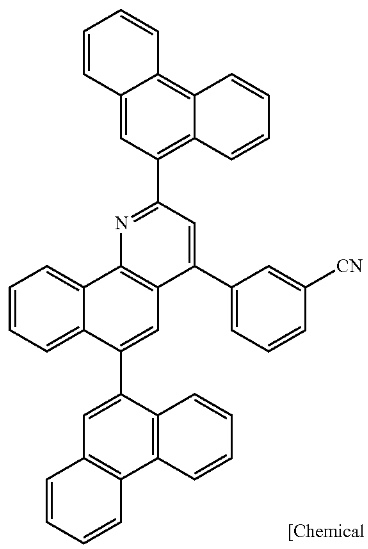
[Chemical Formula A15]
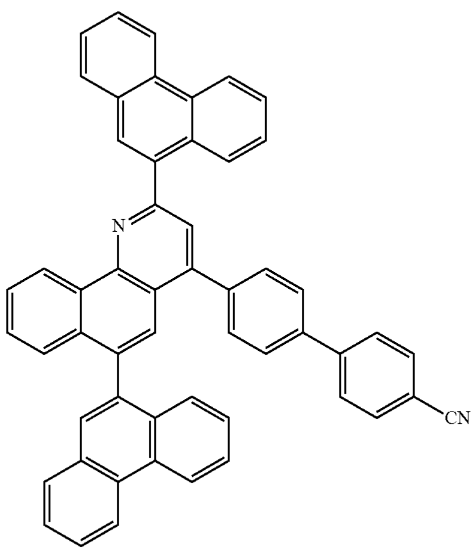
[Chemical Formula A16]
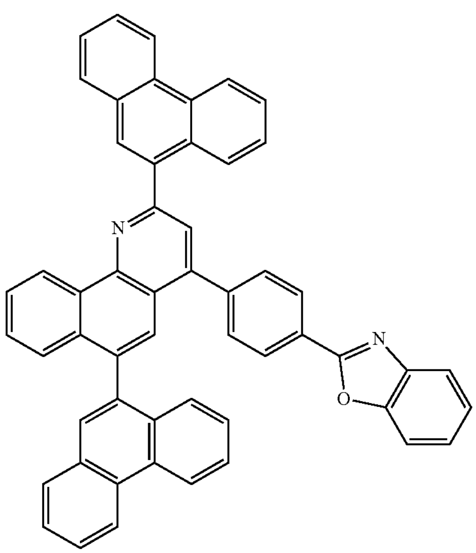
-continued
[Chemical Formula A17]
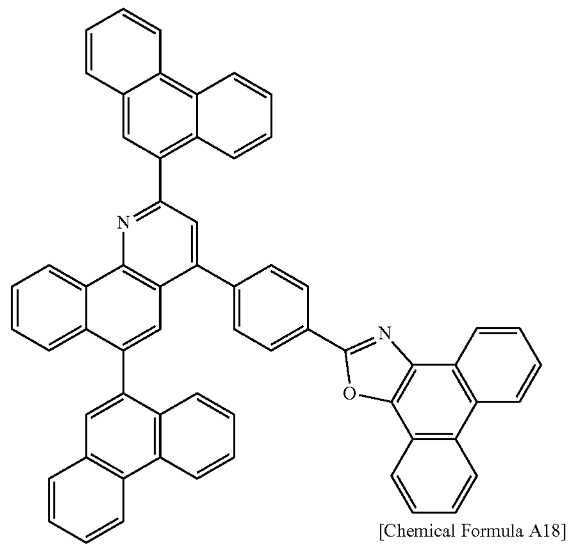
[Chemical Formula A18]
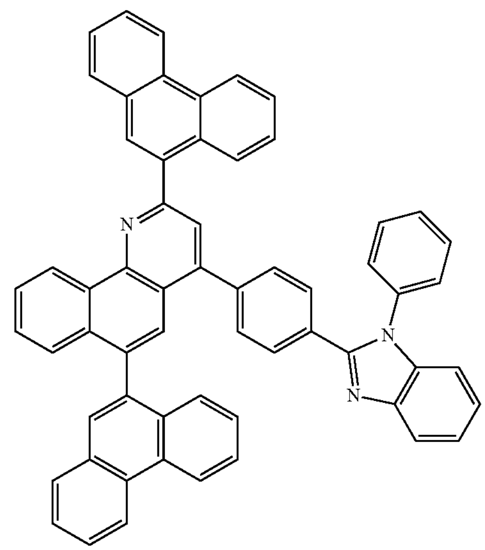
[Chemical Formula A19]
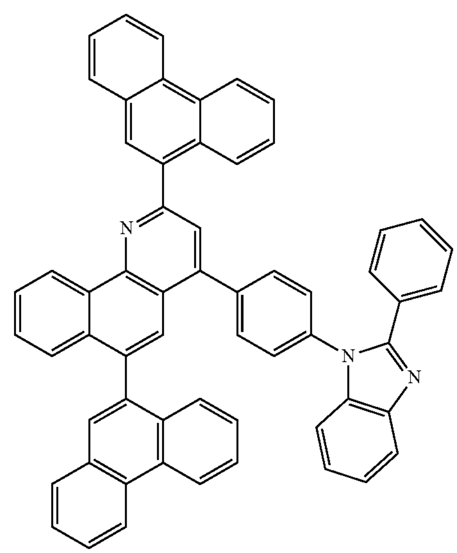

[Chemical Formula A20]
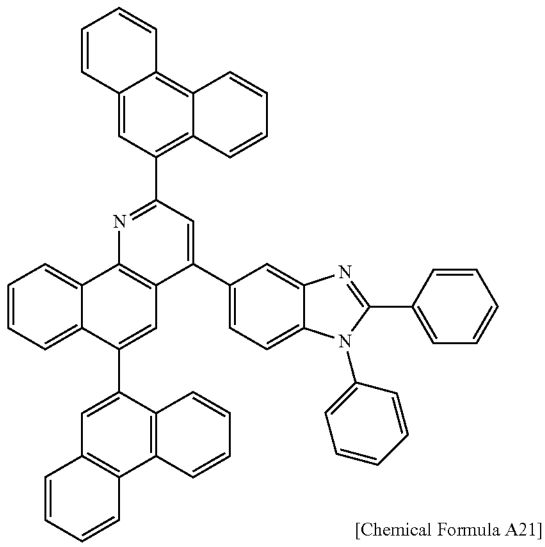
[Chemical Formula A21]
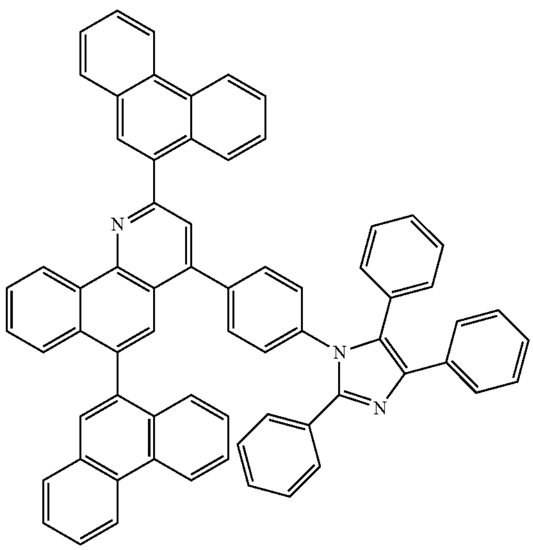
[Chemical Formula 22]
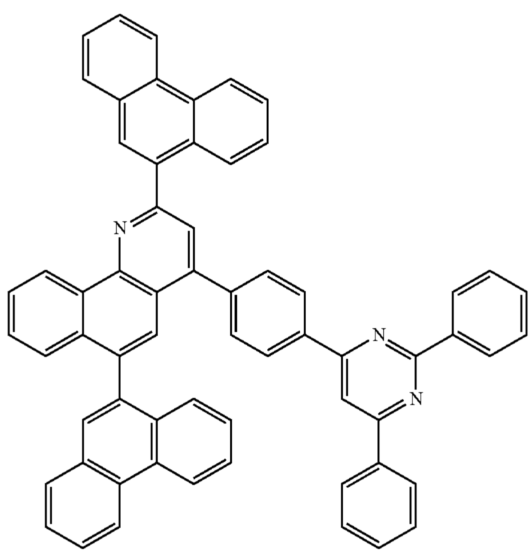
[Chemical Formula A23]
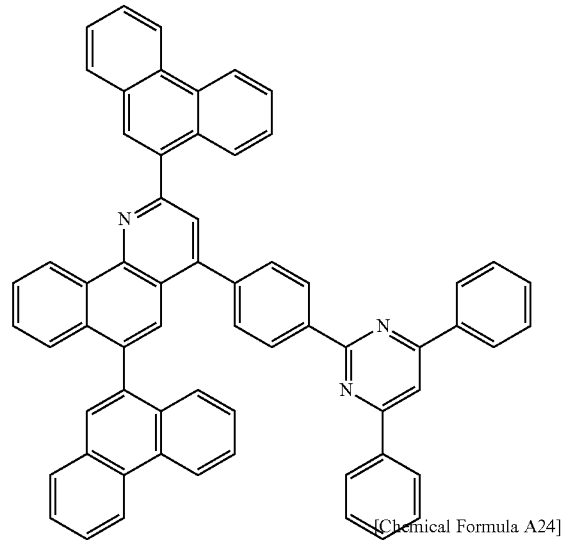
[Chemical Formula A24]
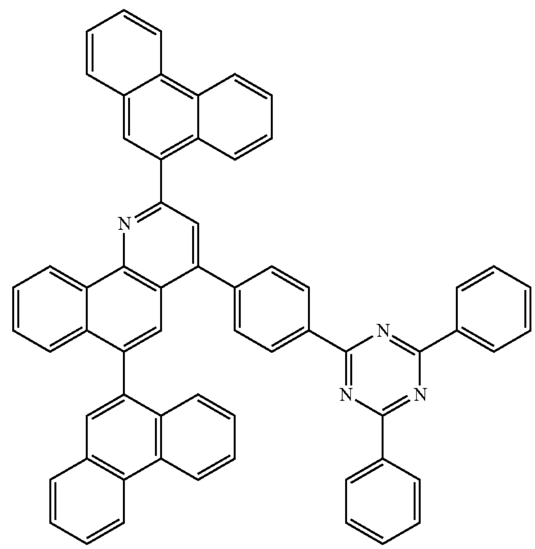
[Chemical Formula A25]
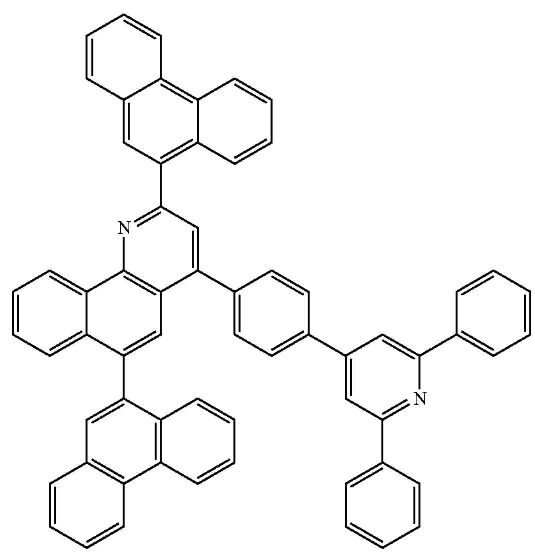

-continued
[Chemical Formula A26]
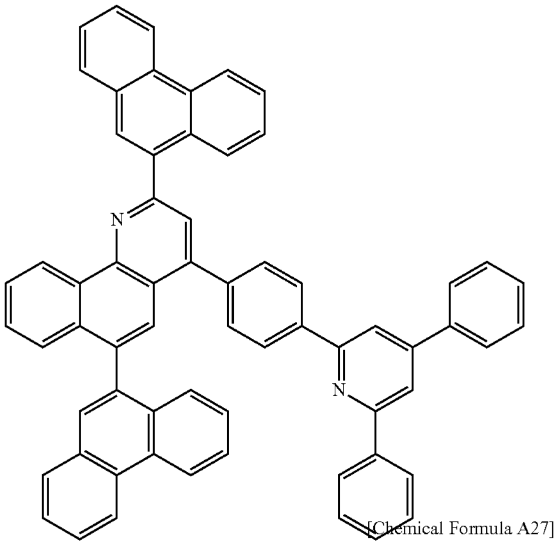
[Chemical Formula A27]
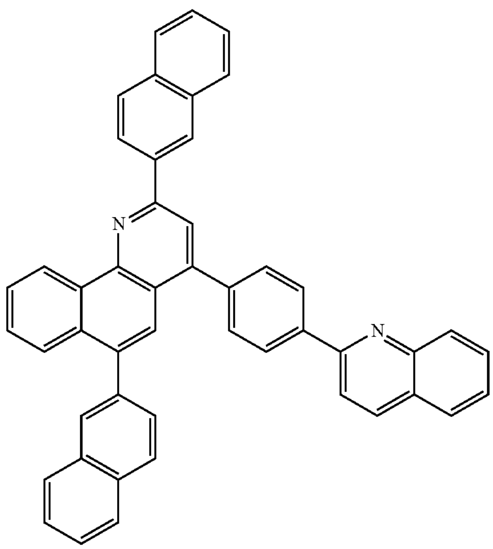
[Chemical Formula A28]
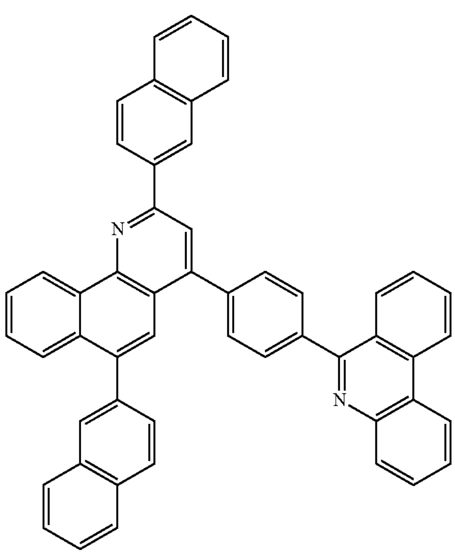
-continued
[Chemical Formula A29]
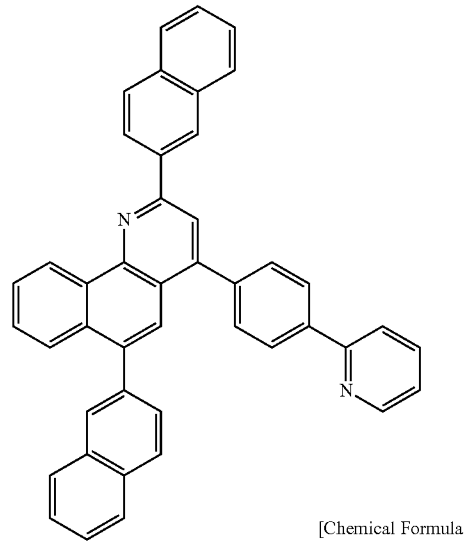
[Chemical Formula A30]
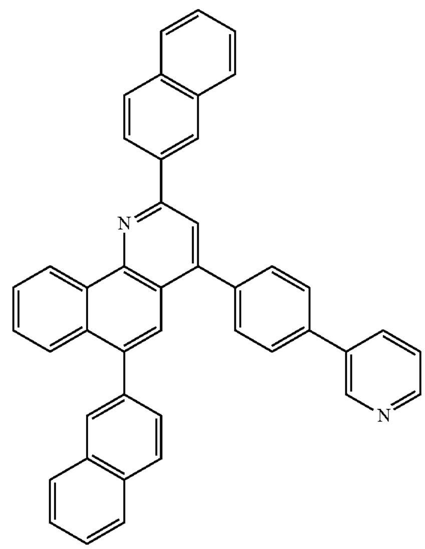
[Chemical Formula A31]
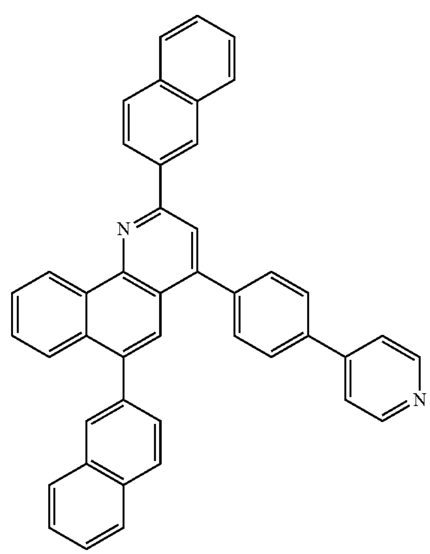

[Chemical Formula A32]
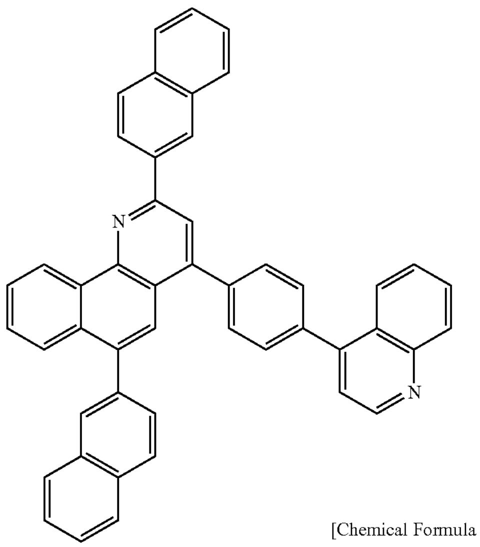
[Chemical Formula A33]
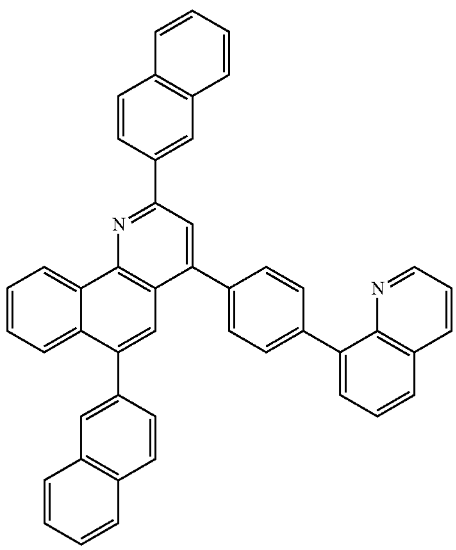
[Chemical Formula A34]
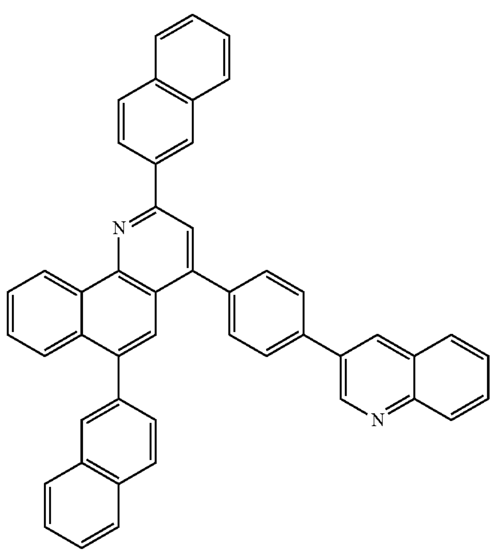
[Chemical Formula A35]
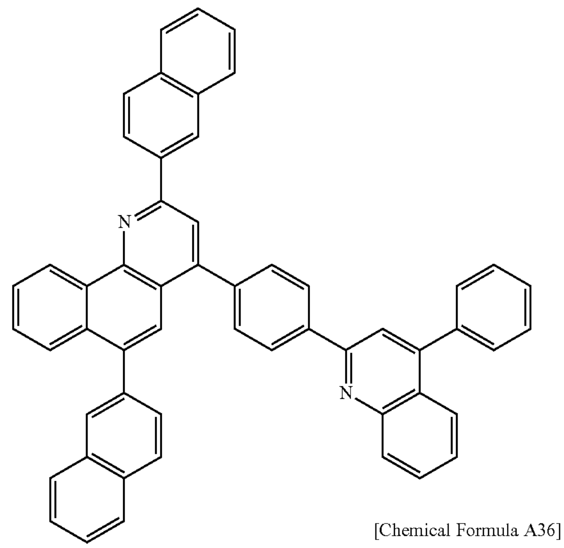
[Chemical Formula A36]
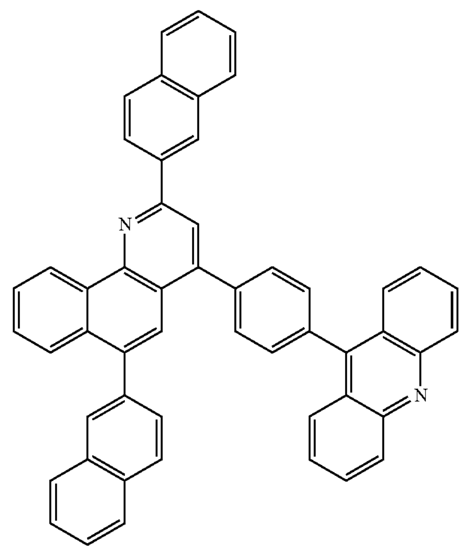
[Chemical Formula A37]
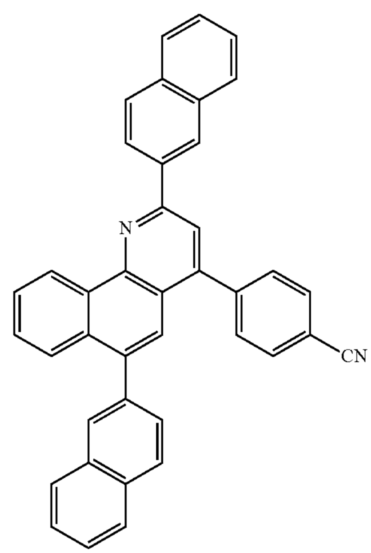

-continued
[Chemical Formula A38]
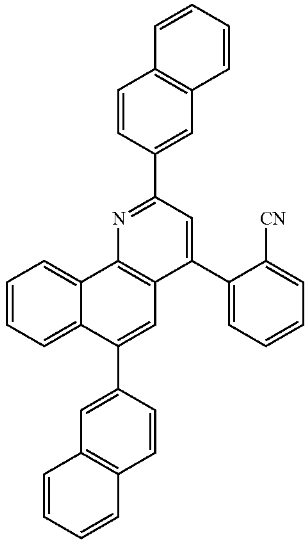
[Chemical Formula A39]
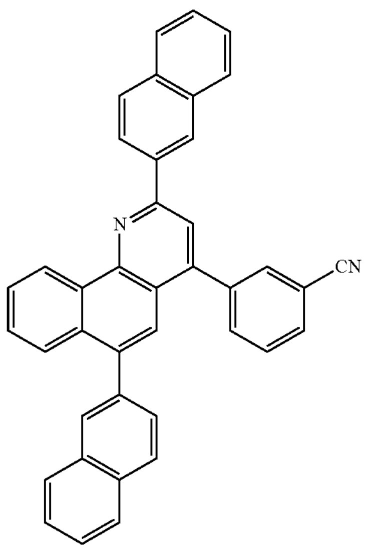
[Chemical Formula A40]
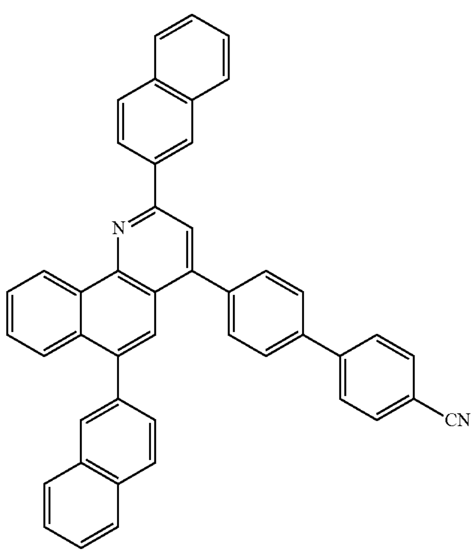
-continued
[Chemical Formula A41]
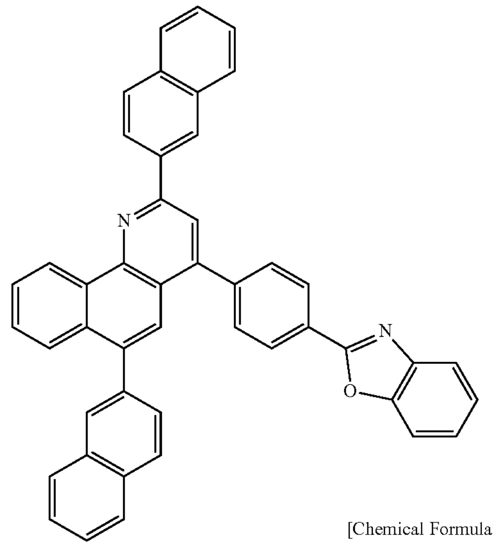
[Chemical Formula A42]
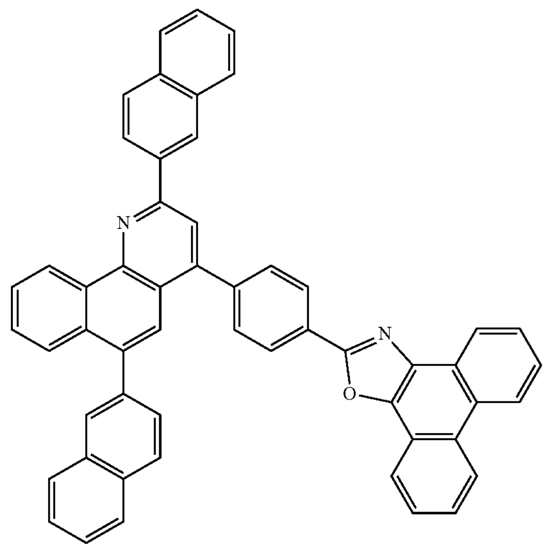
[Chemical Formula A43]
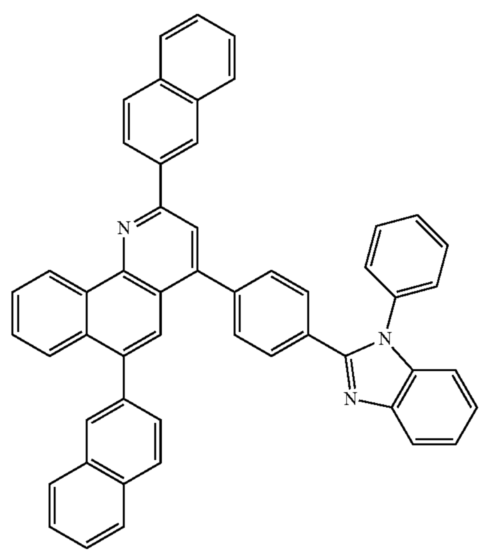

[Chemical Formula A44]
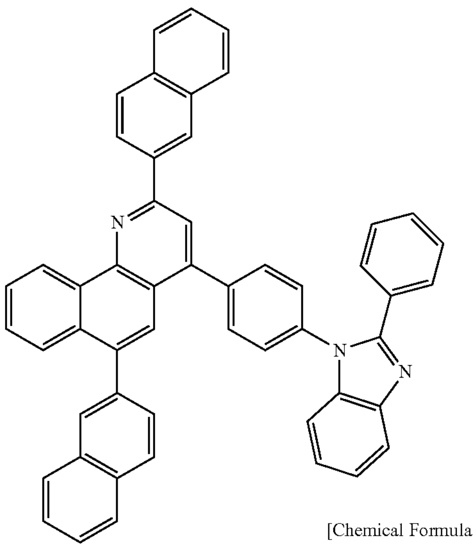
[Chemical Formula A45]
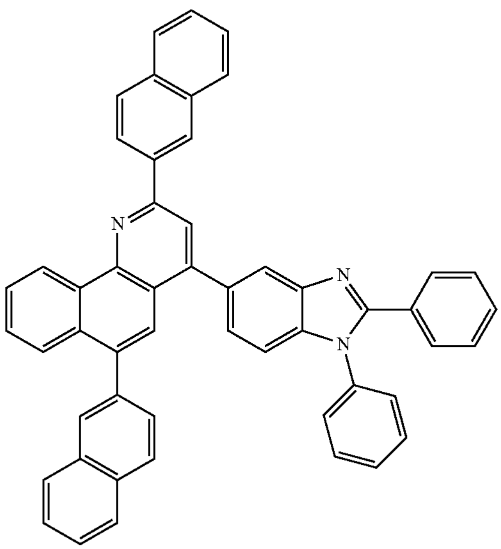
[Chemical Formula A46]
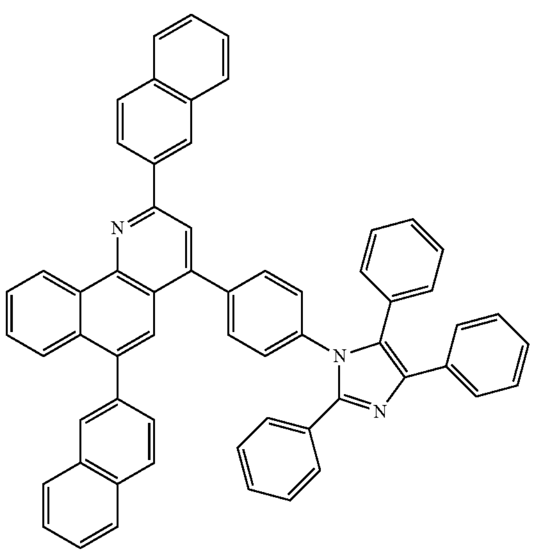
[Chemical Formula A47]
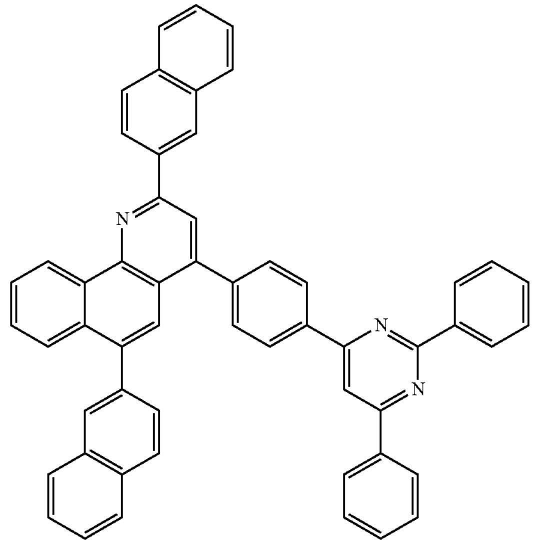
[Chemical Formula A48]
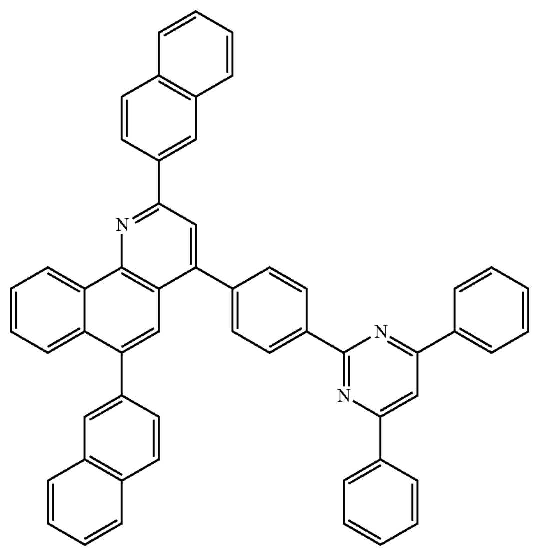
[Chemical Formula A49]
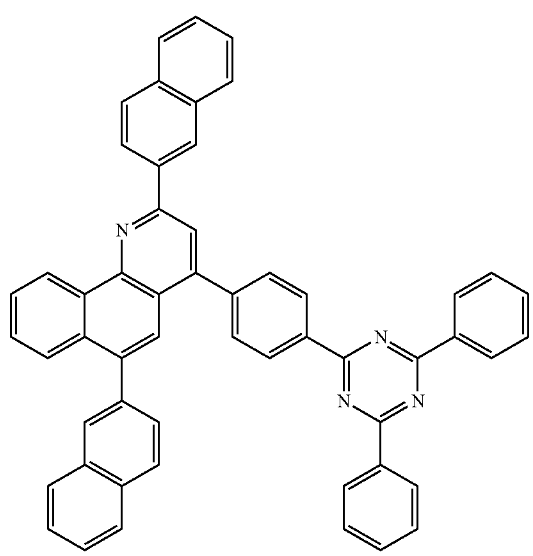

-continued
[Chemical Formula A50]
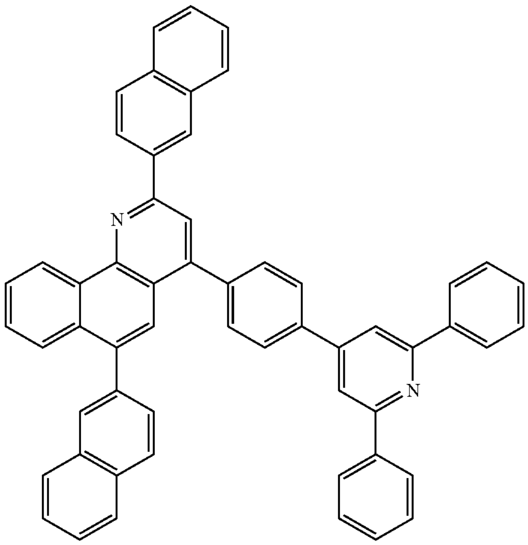
[Chemical Formula A51]
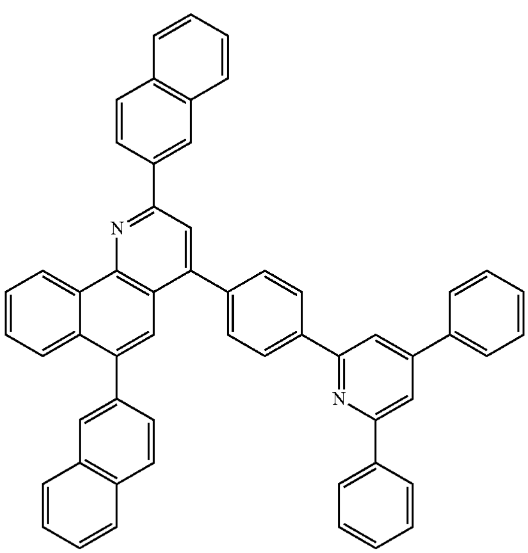
-continued
[Chemical Formula A52]
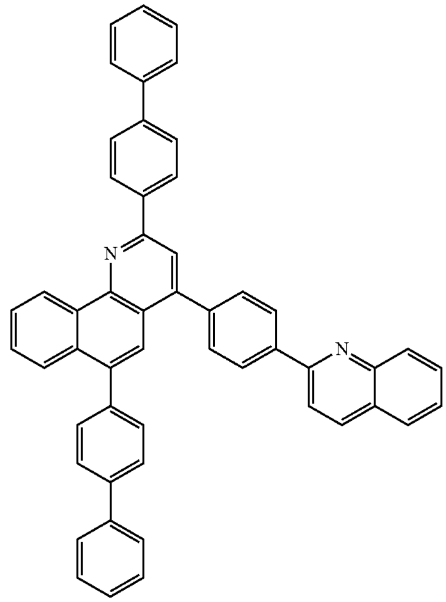
[Chemical Formula A53]
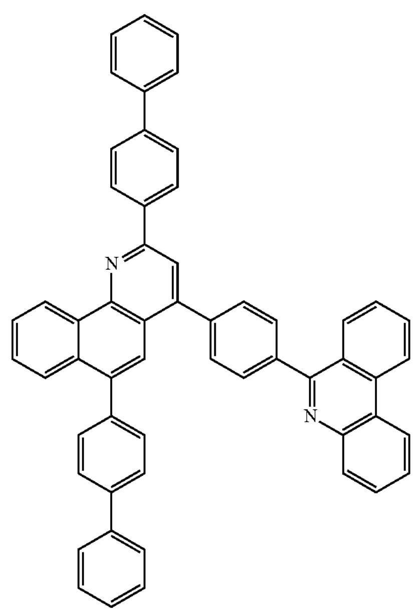

-continued
[Chemical Formula A54]
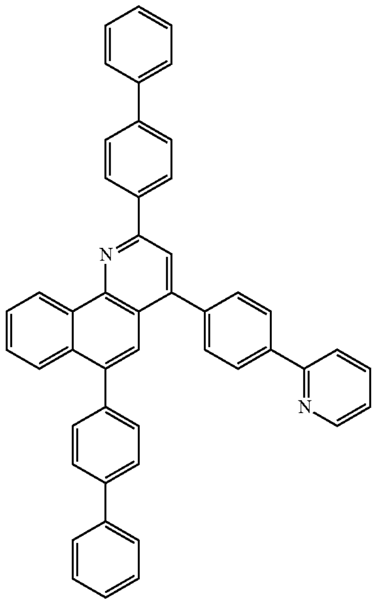
[Chemical Formula A55]
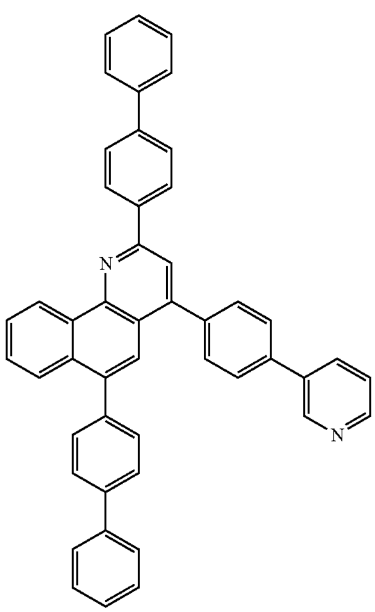
-continued
[Chemical Formula A56]
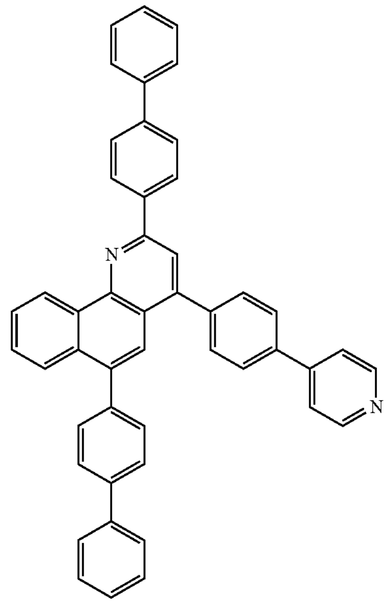
[Chemical Formula A57]
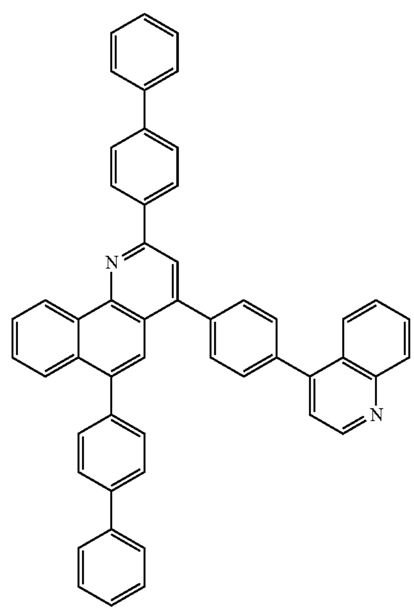

-continued
[Chemical Formula A58]
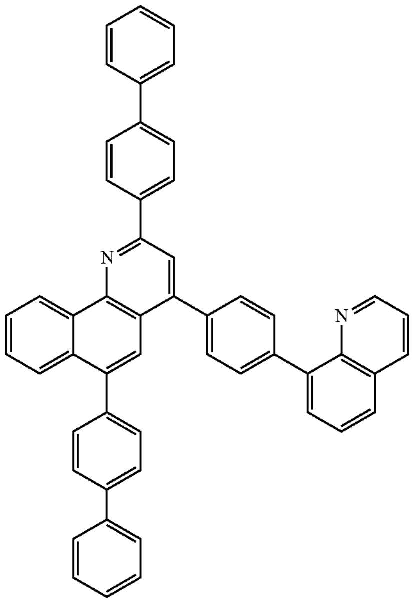
[Chemical Formula A59]
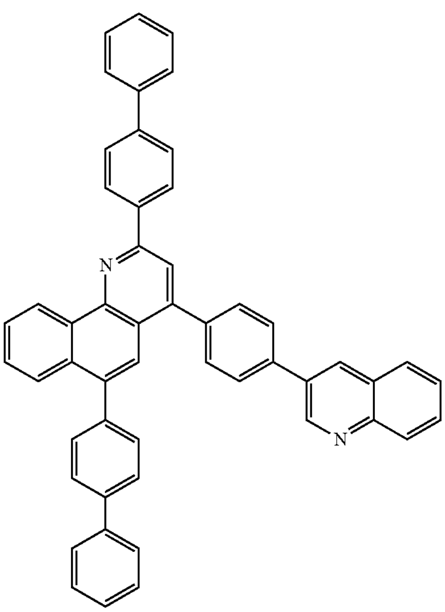
-continued
[Chemical Formula A60]
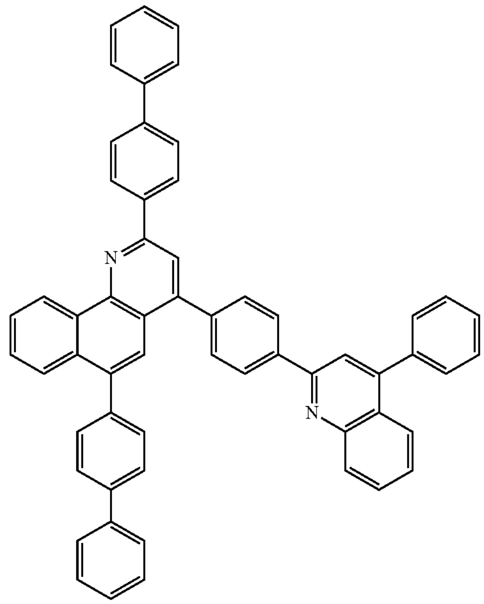
[Chemical Formula A61]
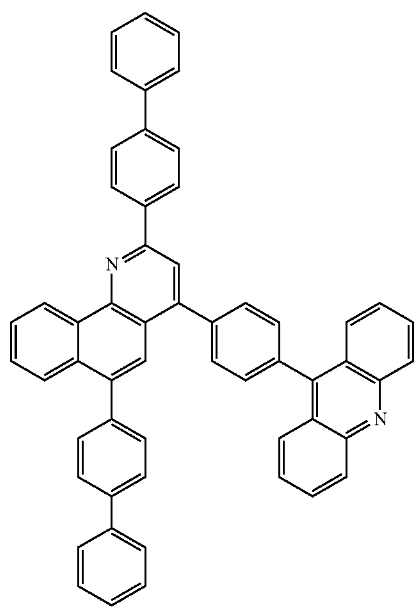

-continued
[Chemical Formula A62]
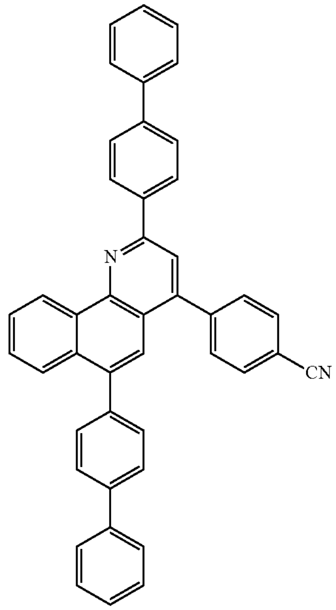
[Chemical Formula A63]
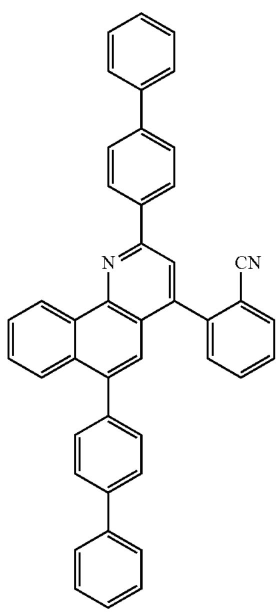
-continued
[Chemical Formula A64]
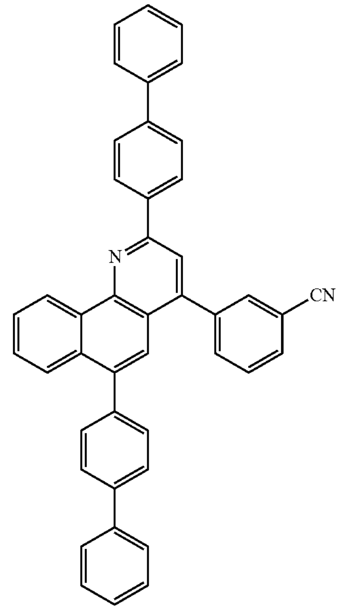
[Chemical Formula A65]
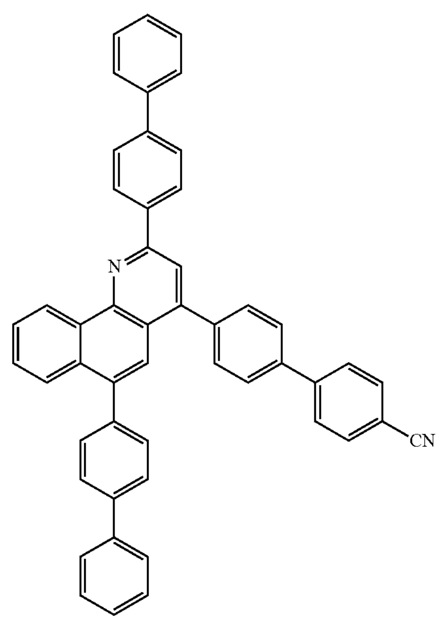

-continued
[Chemical Formula A66]
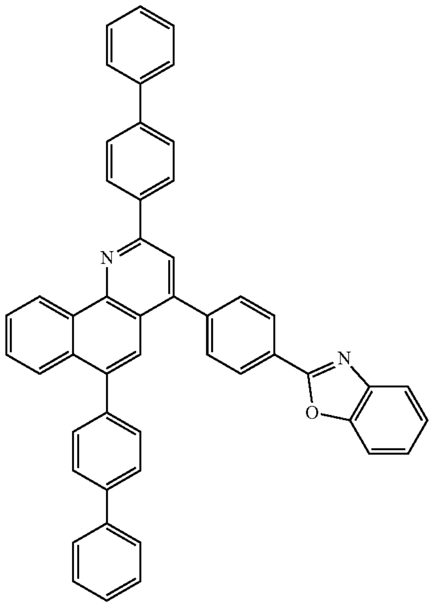
[Chemical Formula A67]
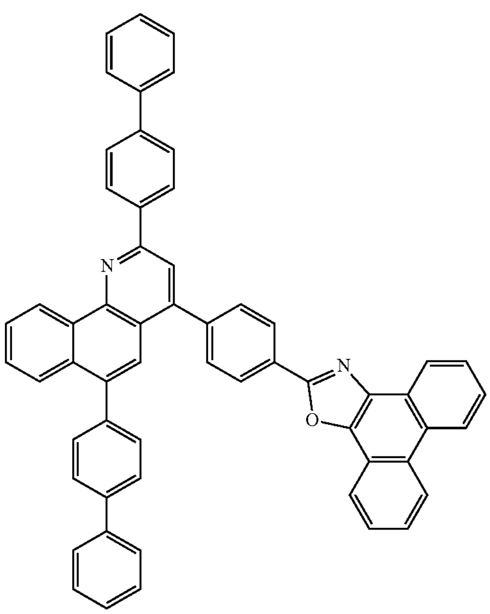
-continued
[Chemical Formula A68]
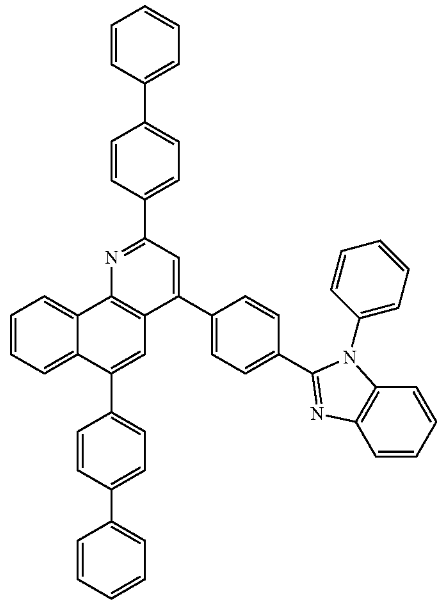
[Chemical Formula A69]
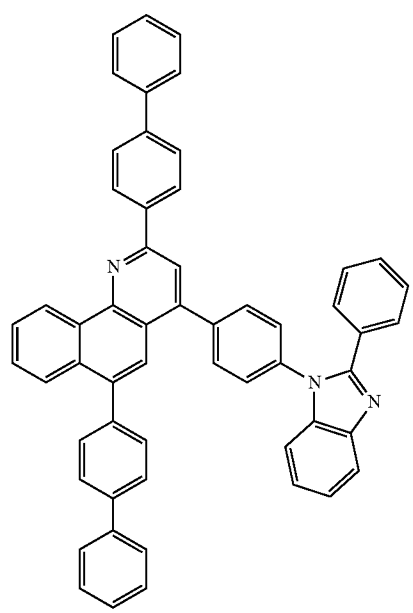

-continued
[Chemical Formula A70]
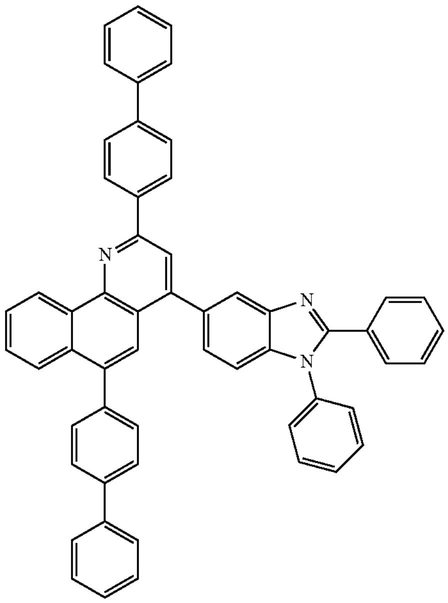
[Chemical Formula A71]
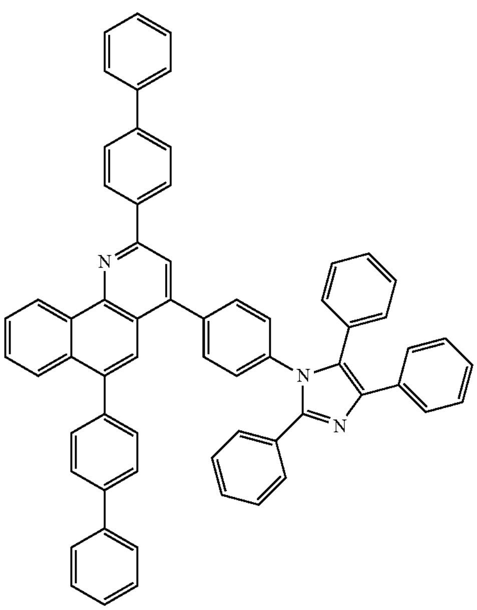
-continued
[Chemical Formula A72]
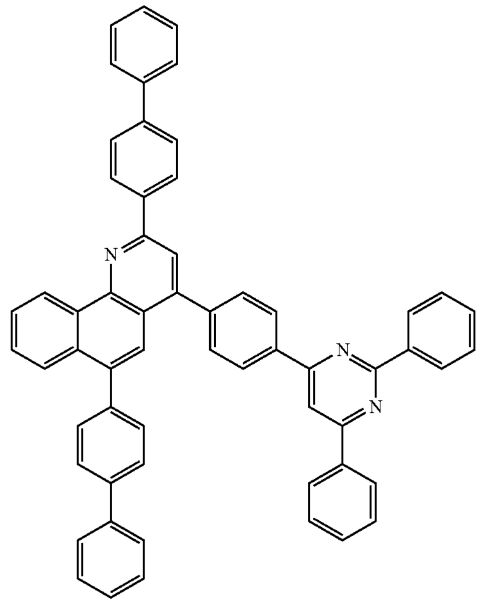
[Chemical Formula A73]
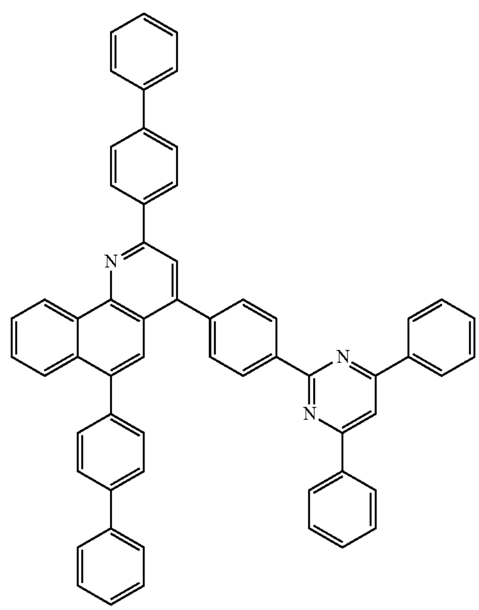

-continued
[Chemical Formula A74]
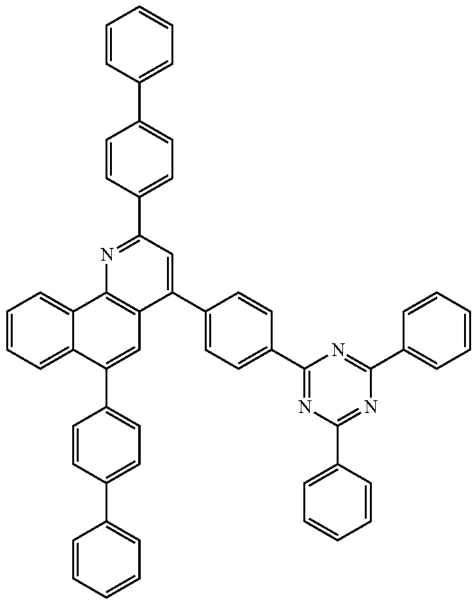
[Chemical Formula A75]
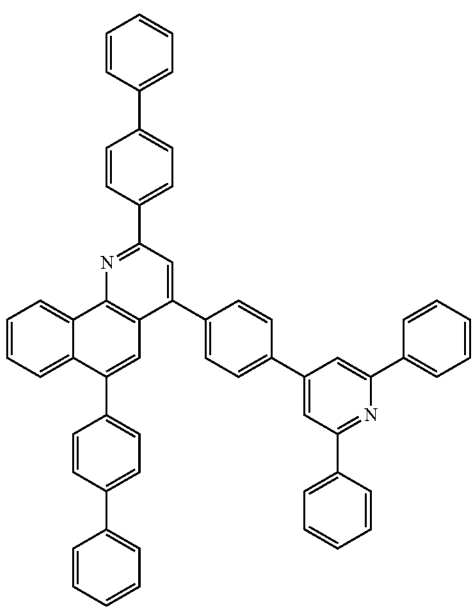
-continued
[Chemical Formula A76]
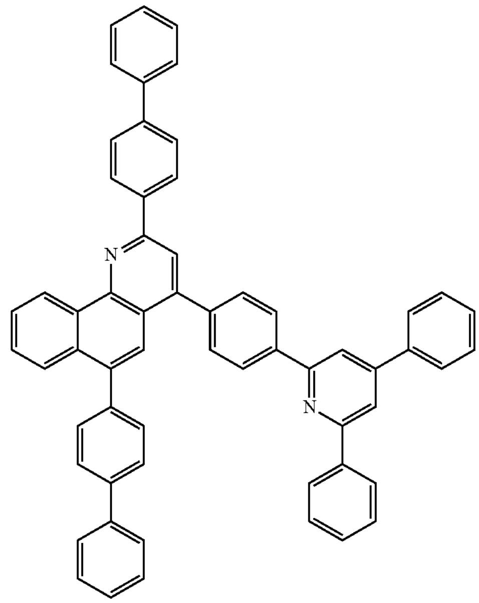
[Chemical Formula A77]
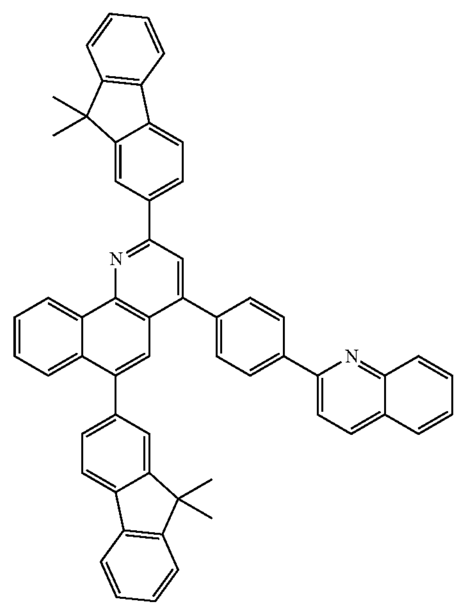

-continued
[Chemical Formula A78]
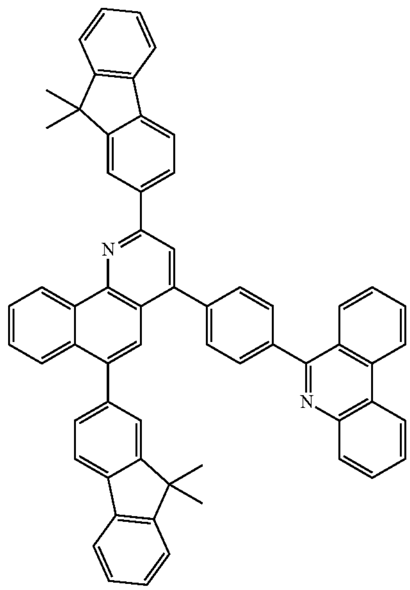
[Chemical Formula A79]
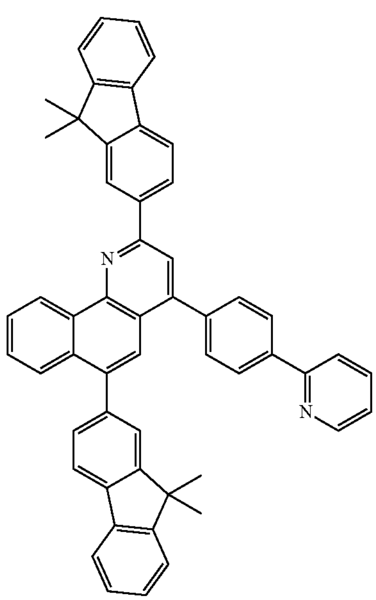
-continued
[Chemical Formula A80]
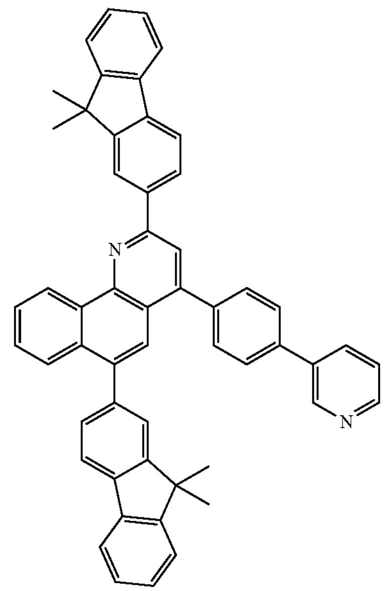
[Chemical Formula A81]
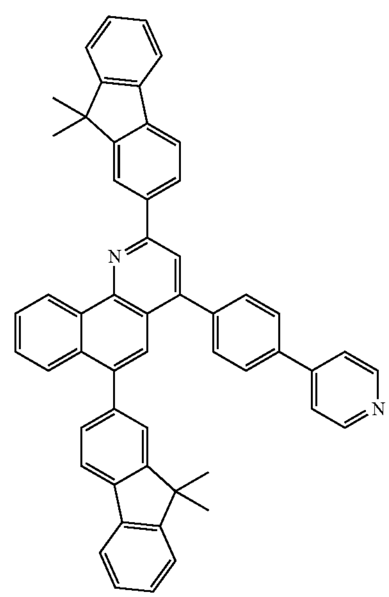

-continued
[Chemical Formula A82]
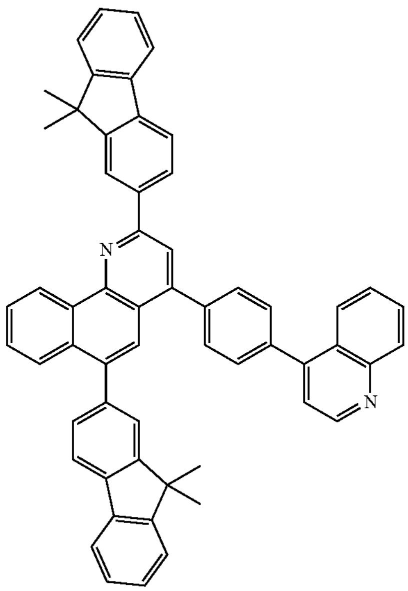
[Chemical Formula A83]
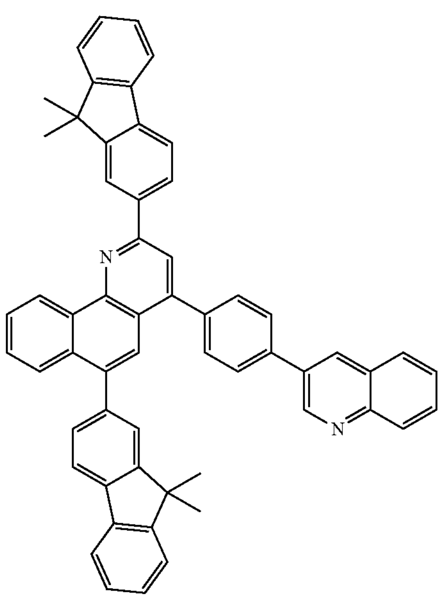
-continued
[Chemical Formula A84]
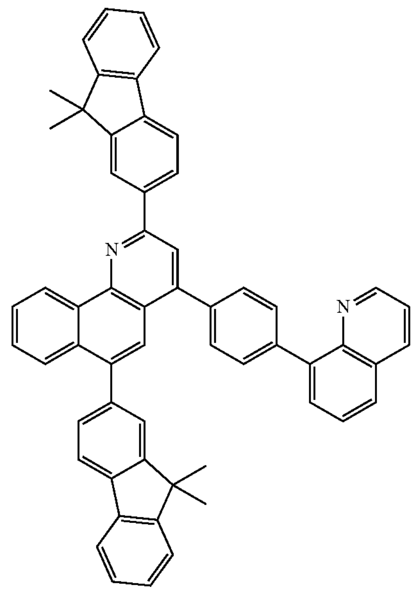
[Chemical Formula A85]
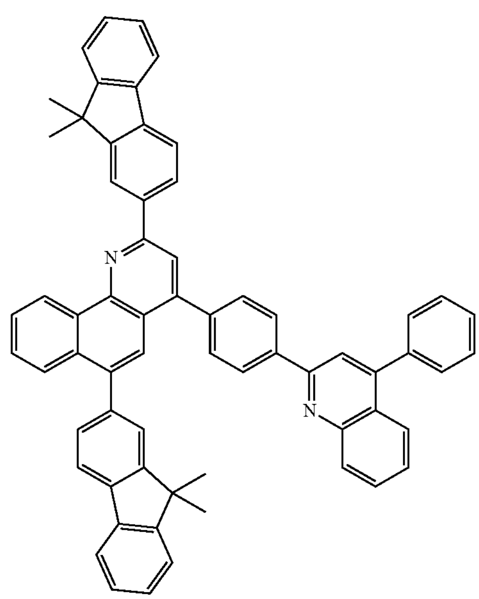

-continued
[Chemical Formula A86]
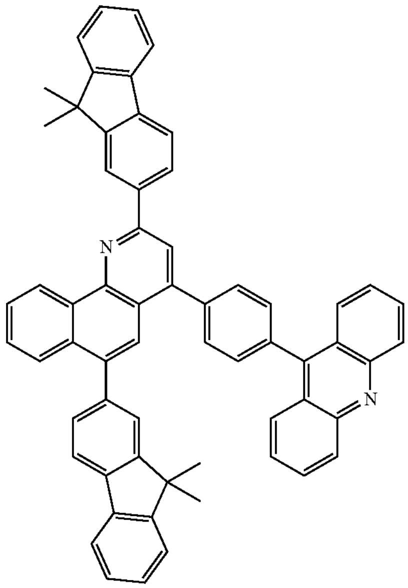
[Chemical Formula A87]
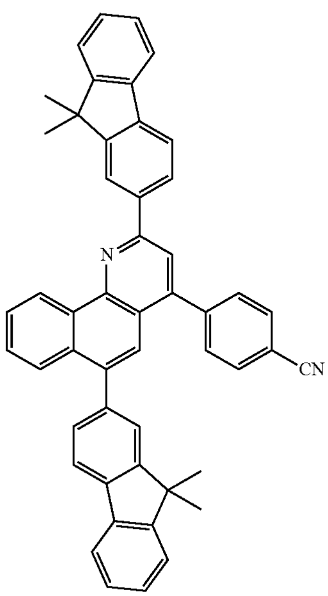
-continued
[Chemical Formula A88]
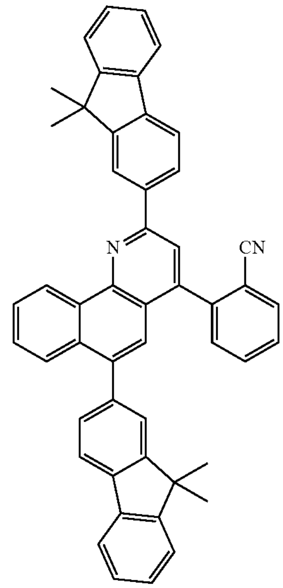
[Chemical Formula A89]
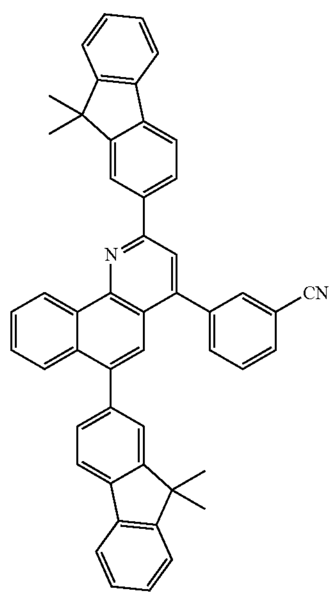

-continued
[Chemical Formula A90]
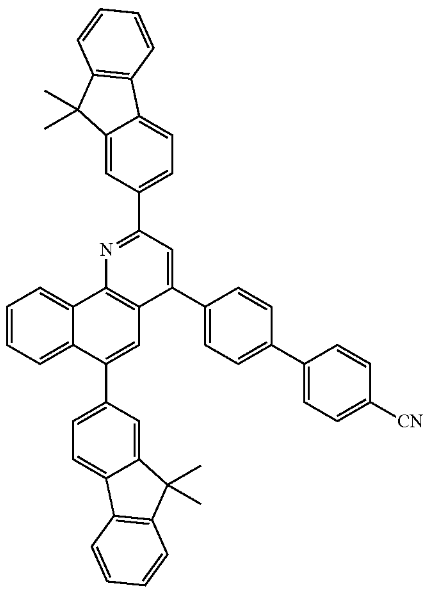
[Chemical Formula A91]
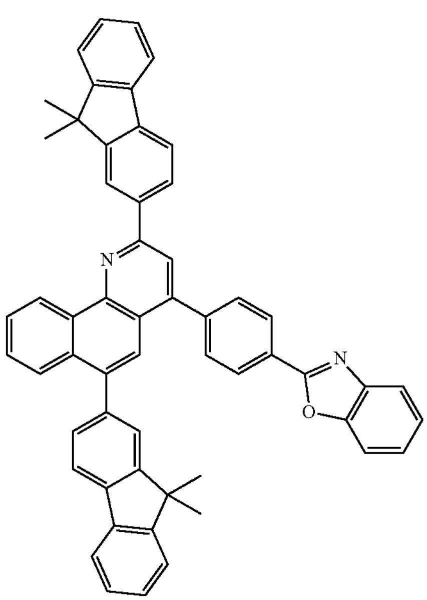
-continued
[Chemical Formula A92]
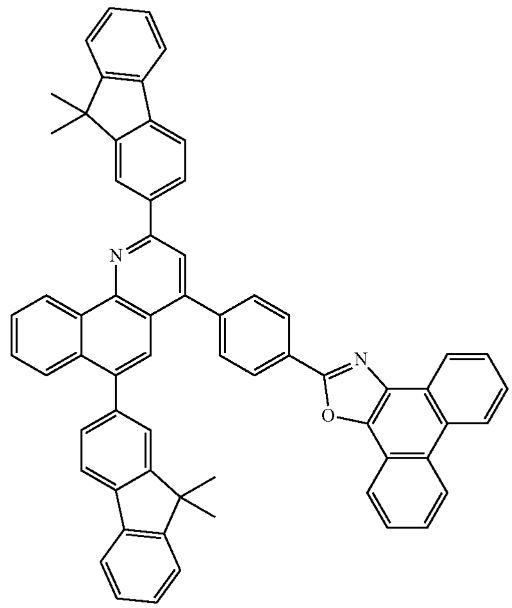
[Chemical Formula A93]
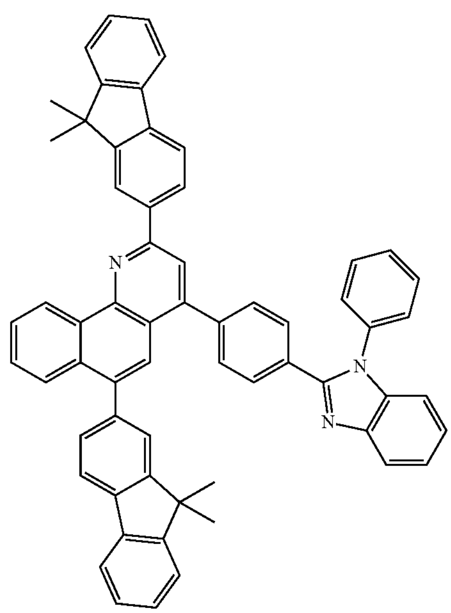

-continued
[Chemical Formula A94]
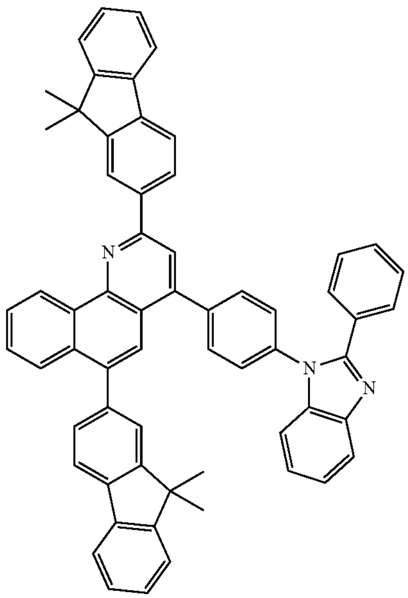
[Chemical Formula A95]
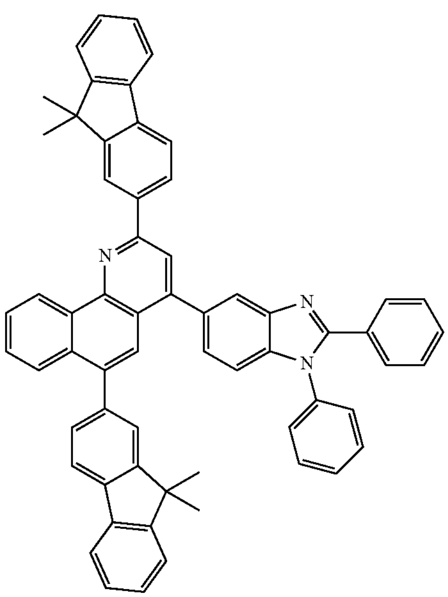
-continued
[Chemical Formula A96]
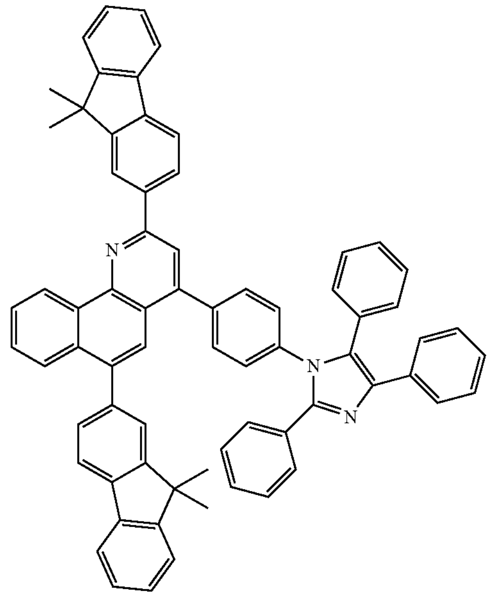
[Chemical Formula A97]
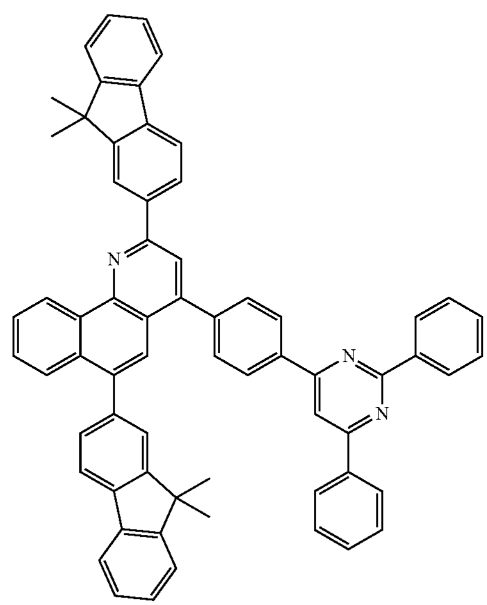

[Chemical Formula A98]
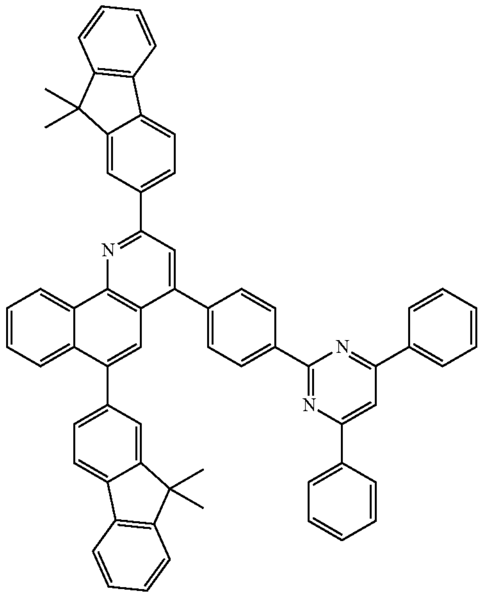
[Chemical Formula A99]
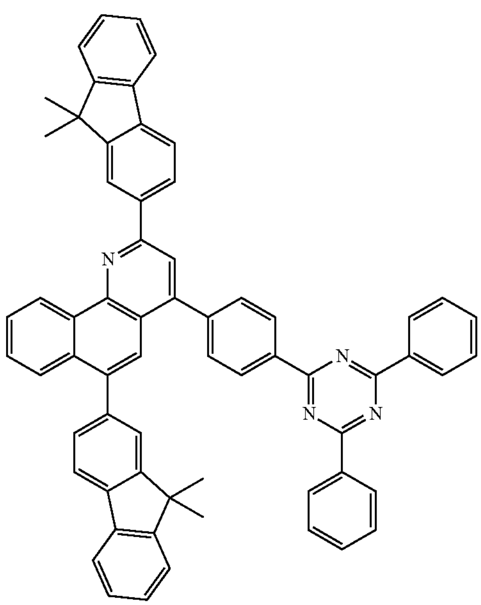
[Chemical Formula A100]
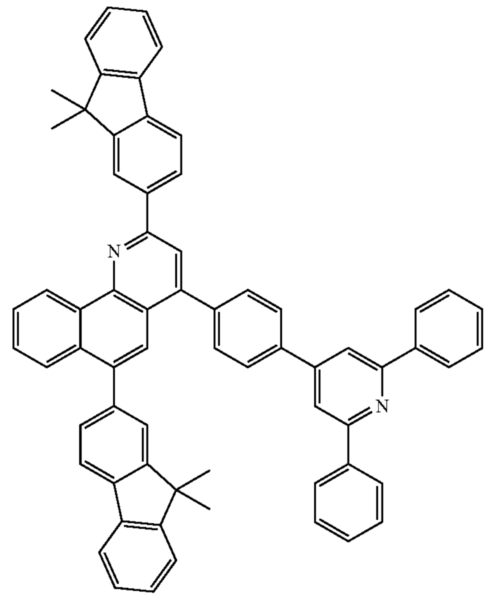
[Chemical Formula A101]
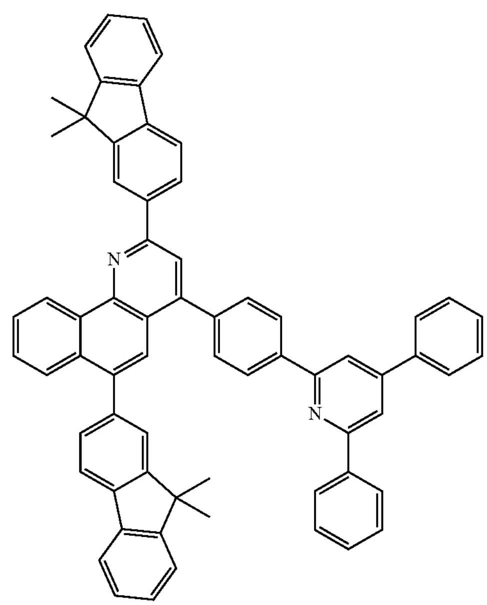

-continued
[Chemical Formula A102]
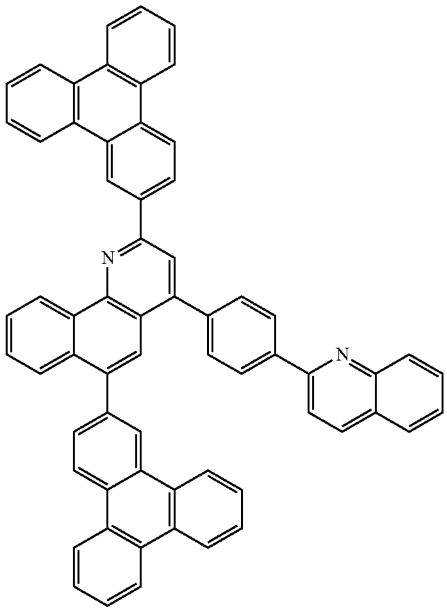
[Chemical Formula A103]
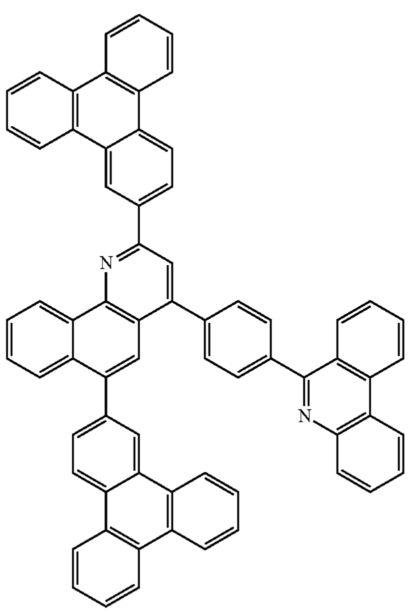
-continued
[Chemical Formula A104]
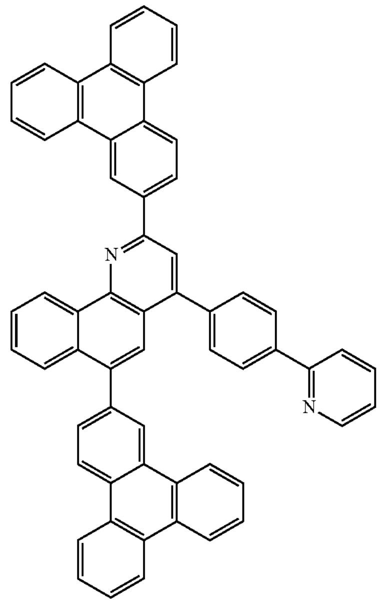
[Chemical Formula A105]
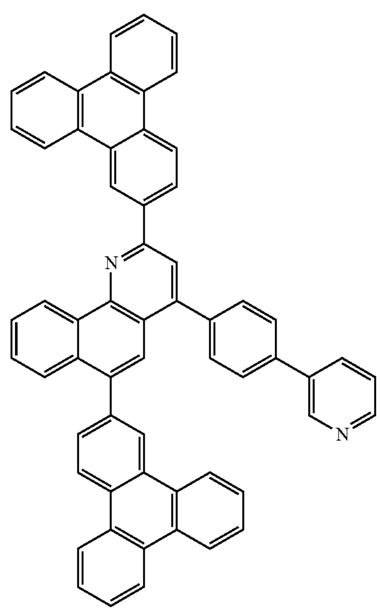

-continued
[Chemical Formula A106]
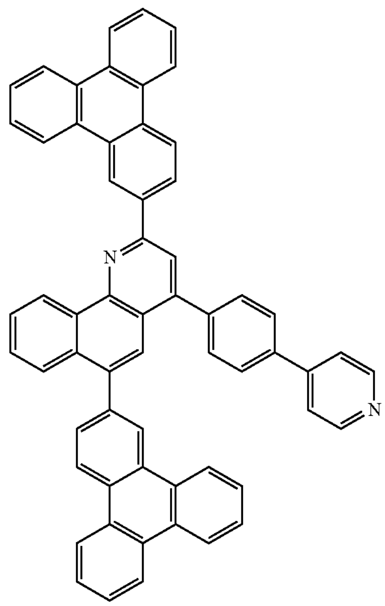
[Chemical Formula A107]
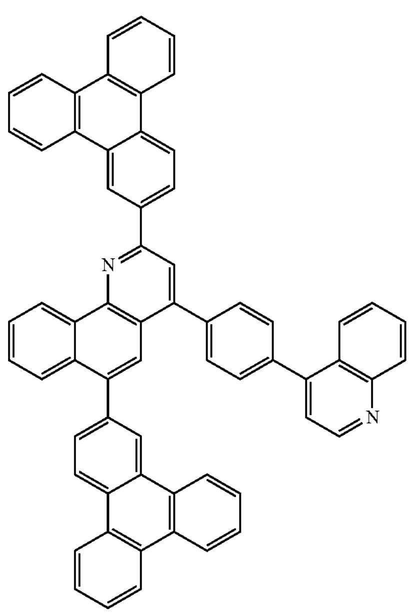
-continued
[Chemical Formula A108]
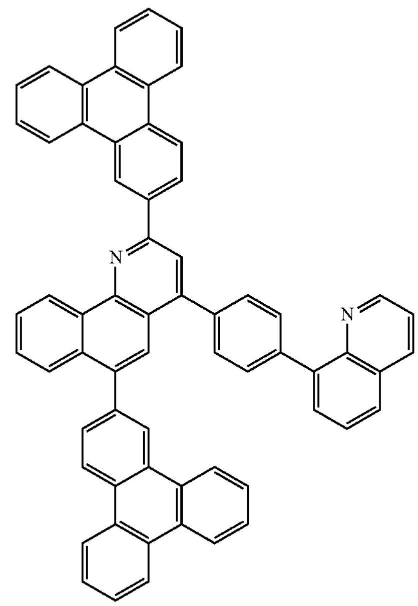
[Chemical Formula A109]
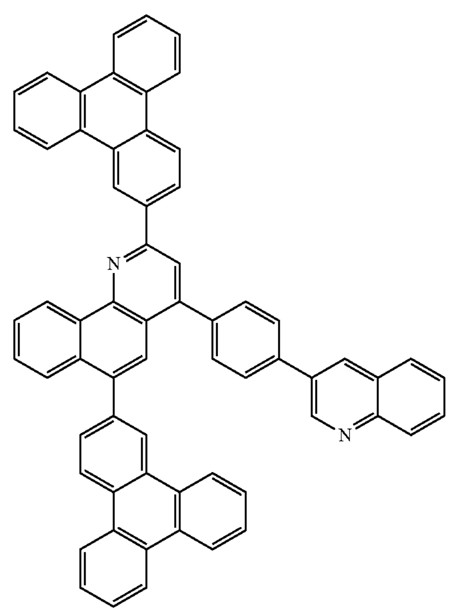

-continued
[Chemical Formula A110]
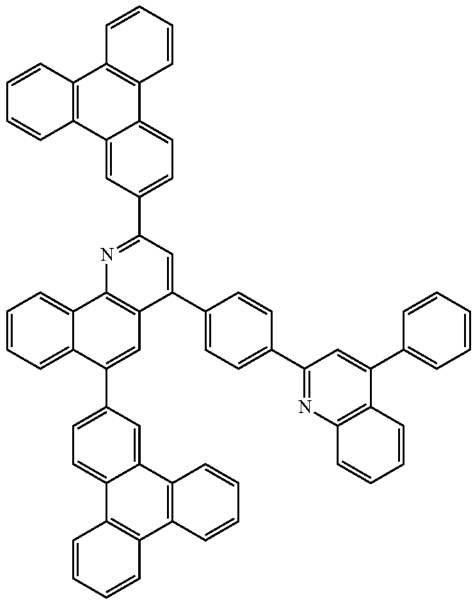
[Chemical Formula A111]
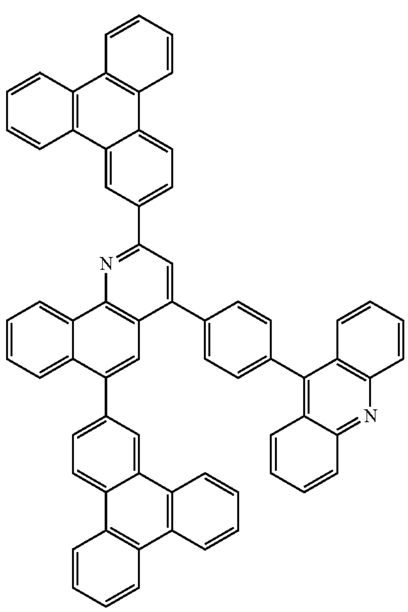
-continued
[Chemical Formula A112]
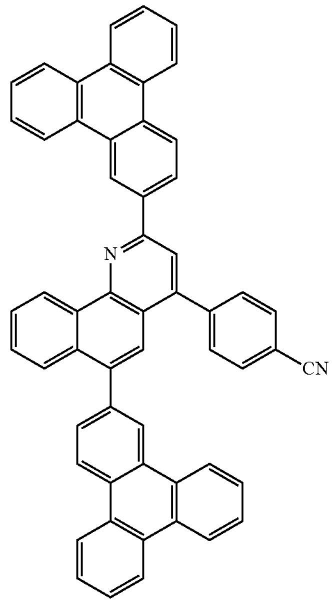
[Chemical Formula A113]
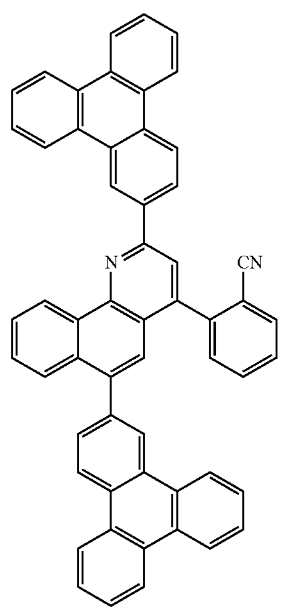

-continued
[Chemical Formula A114]
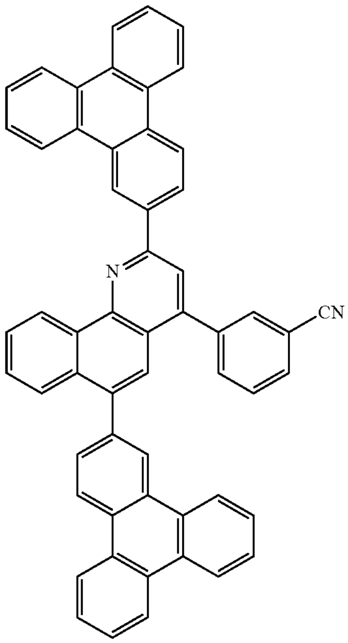
[Chemical Formula A115]
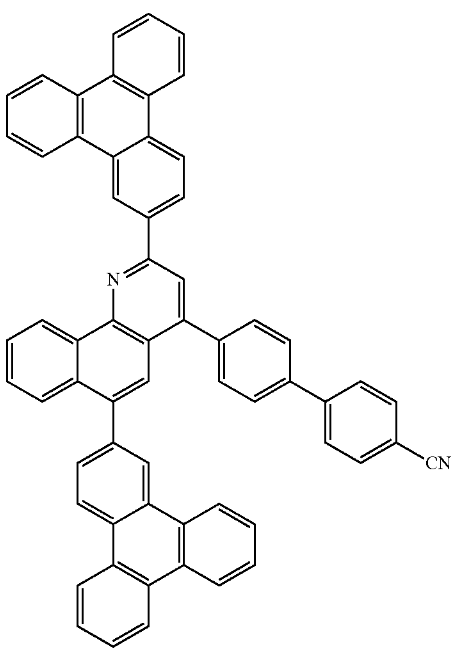
-continued
[Chemical Formula A116]
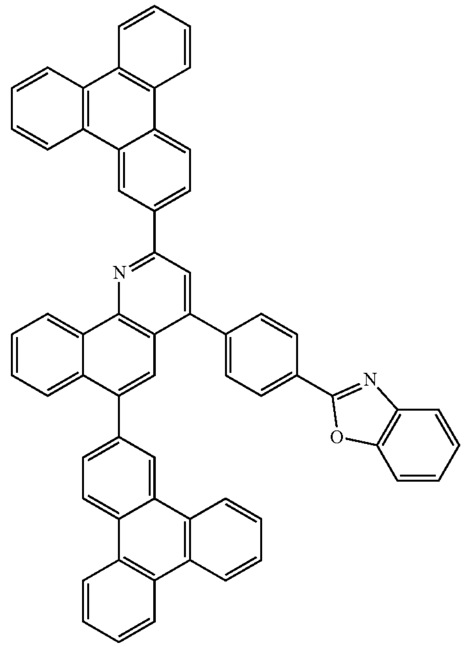
[Chemical Formula A117]
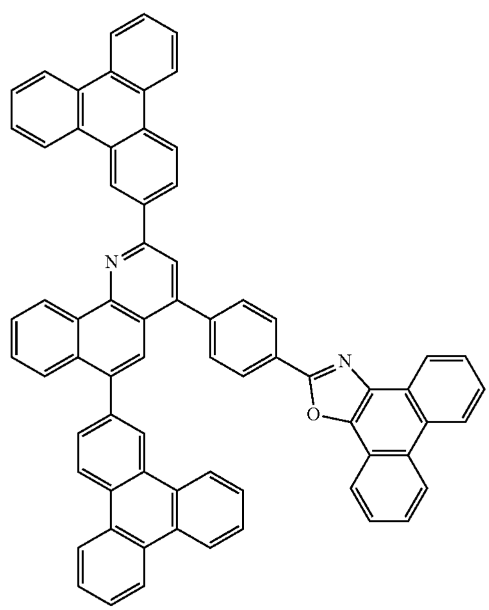

[Chemical Formula A118]
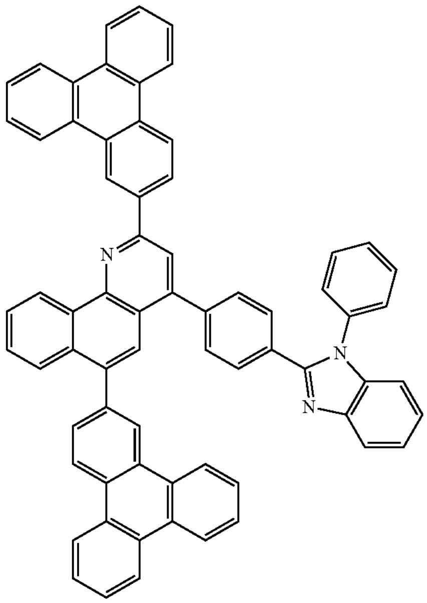
[Chemical Formula A119]
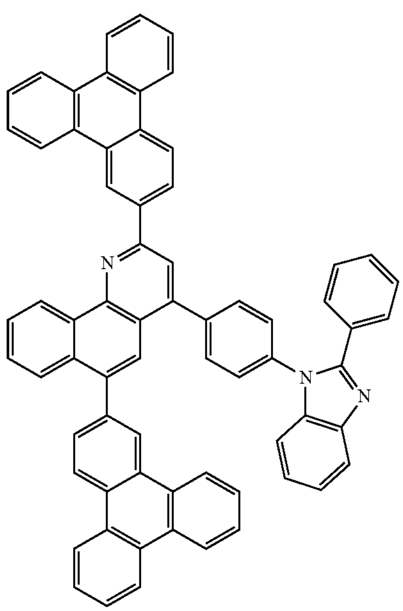
[Chemical Formula A120]
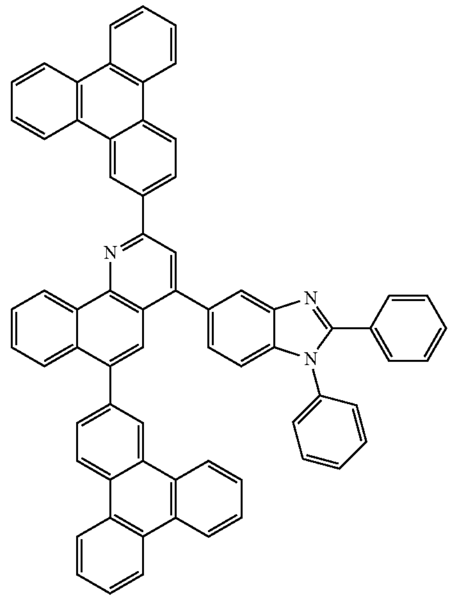
[Chemical Formula A121]
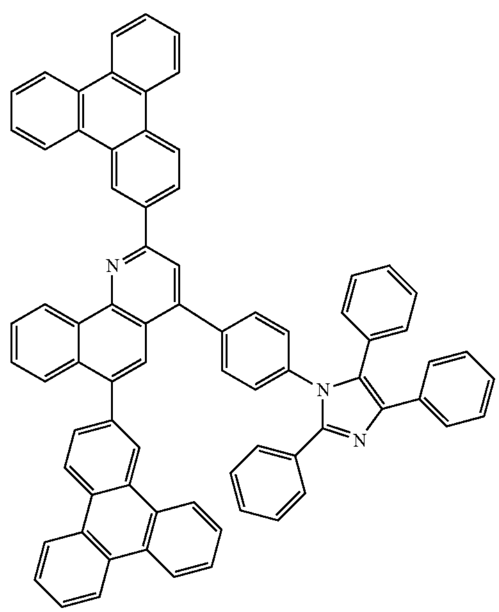

-continued
[Chemical Formula A122]
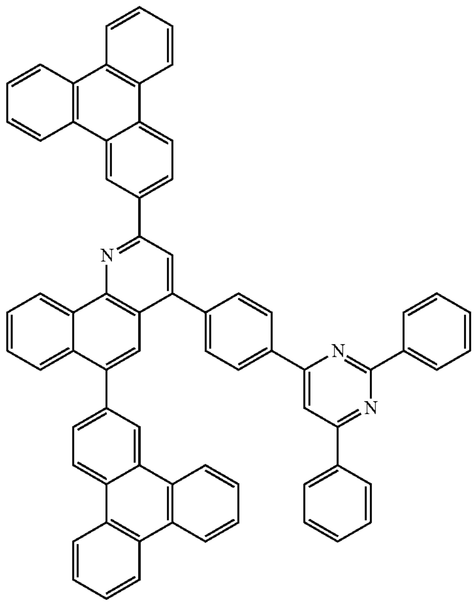
[Chemical Formula A123]
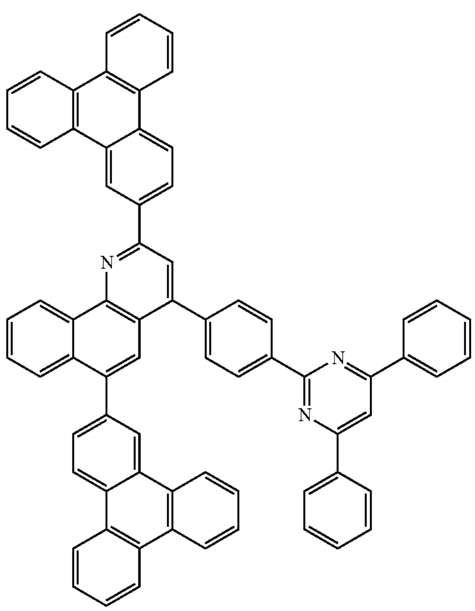
-continued
[Chemical Formula A124]
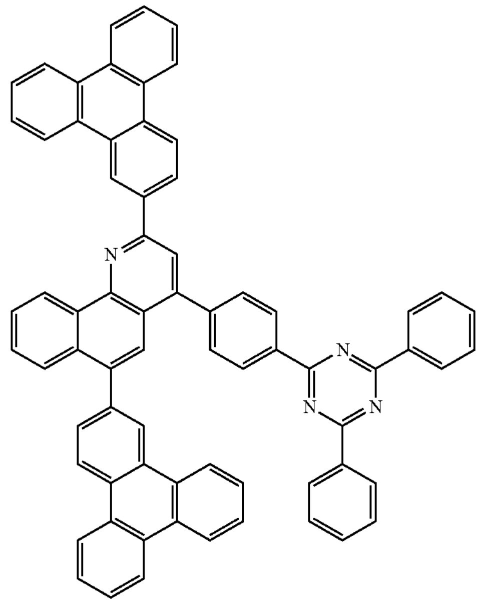
[Chemical Formula A125]
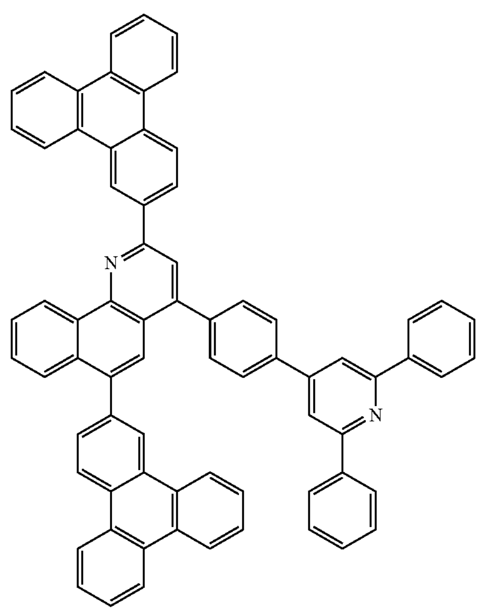

-continued
[Chemical Formula A126]
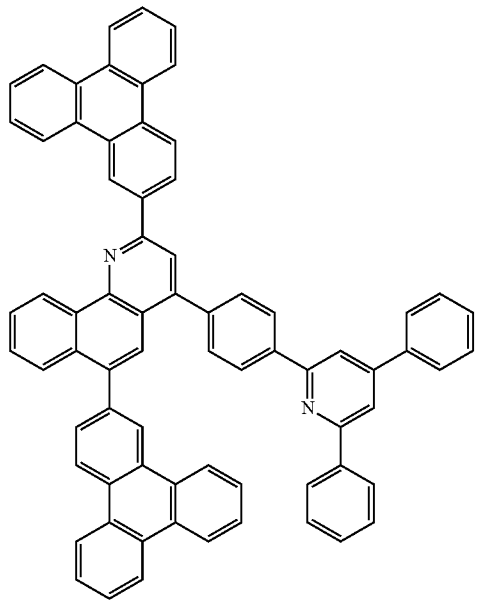
[Chemical Formula A127]
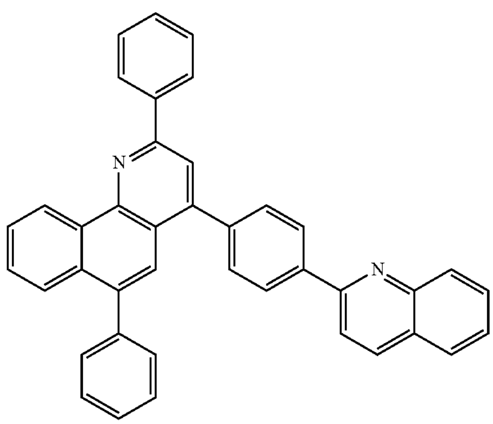
[Chemical Formula A128]
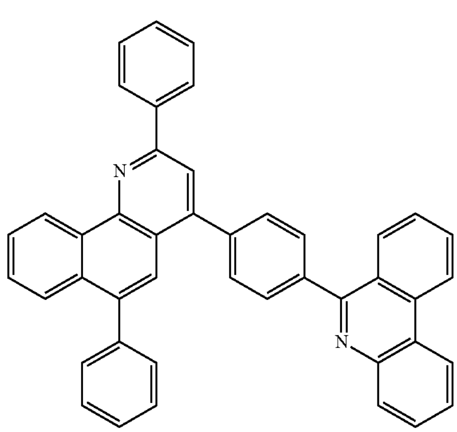
-continued
[Chemical Formula A129]
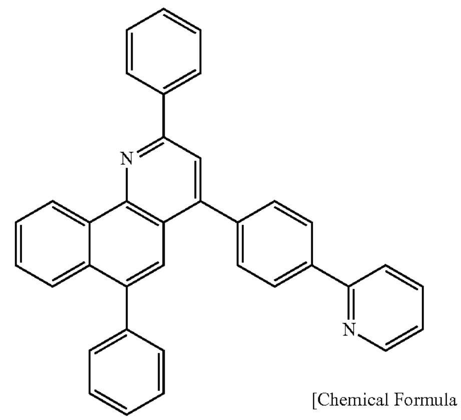
[Chemical Formula A130]
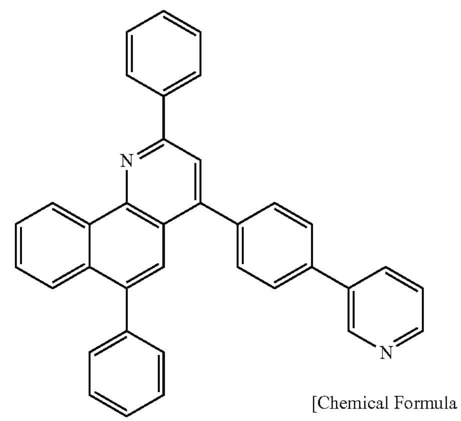
[Chemical Formula A131]
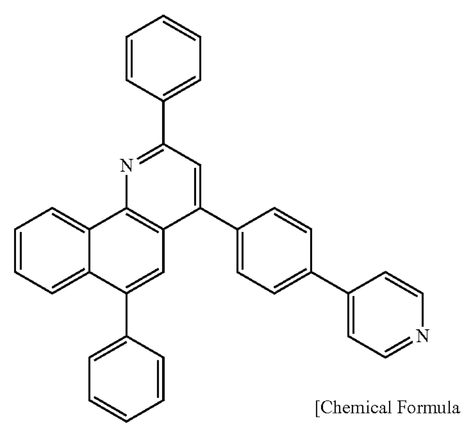
[Chemical Formula A132]
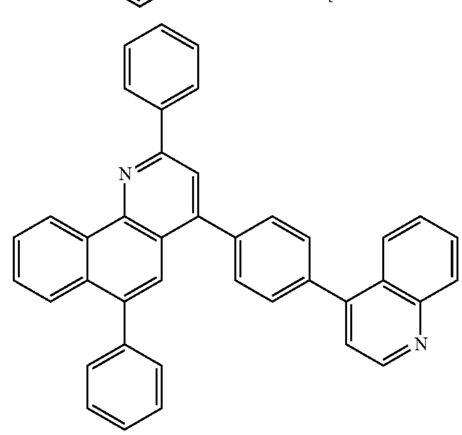

-continued
[Chemical Formula A133]
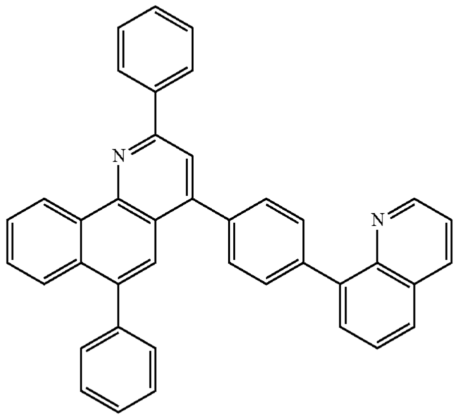
[Chemical Formula A134]
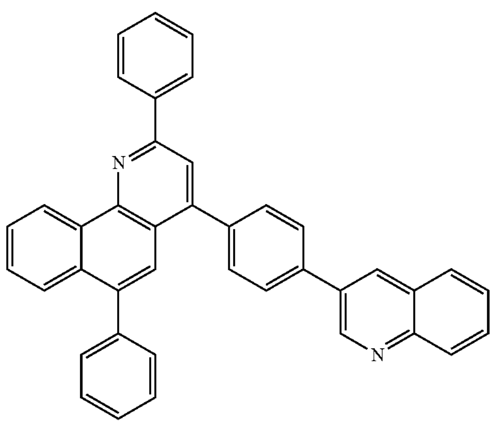
[Chemical Formula A135]
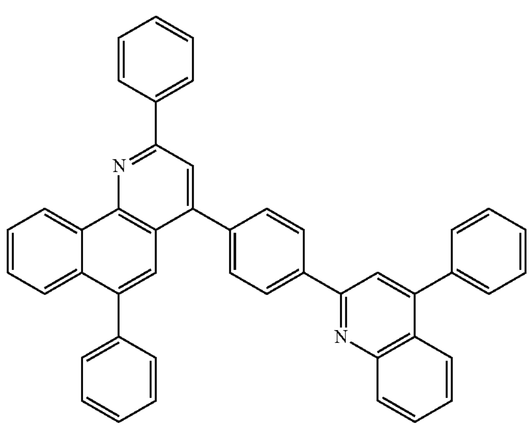
-continued
[Chemical Formula A136]
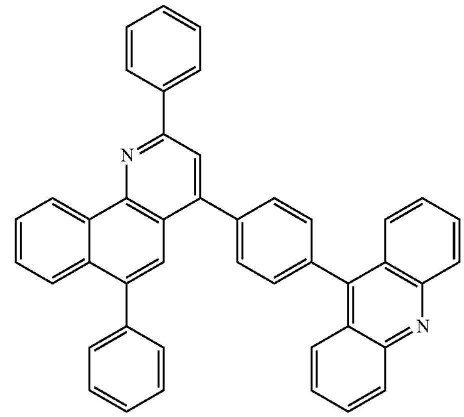
[Chemical Formula A137]
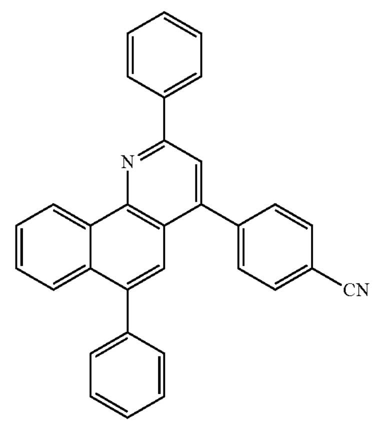
[Chemical Formula A138]
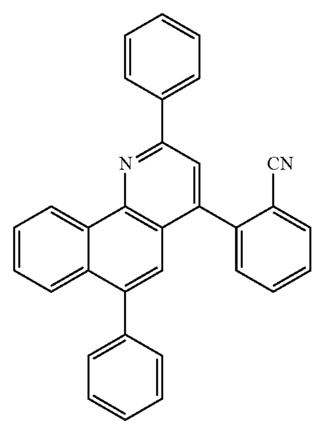

-continued
[Chemical Formula A139]
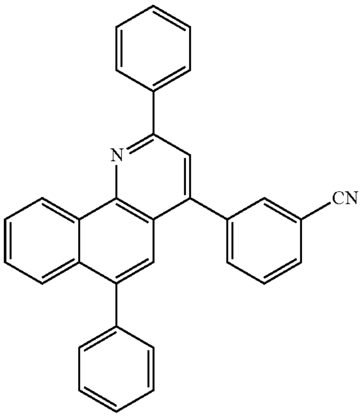
[Chemical Formula A140]
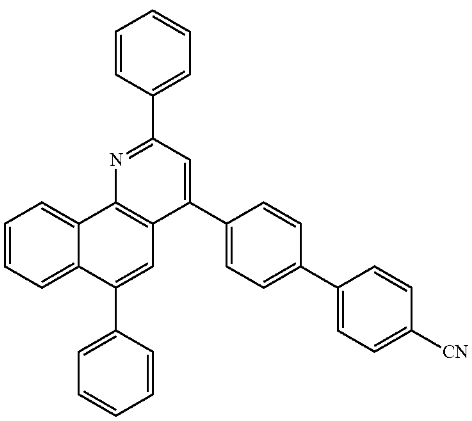
[Chemical Formula A141]
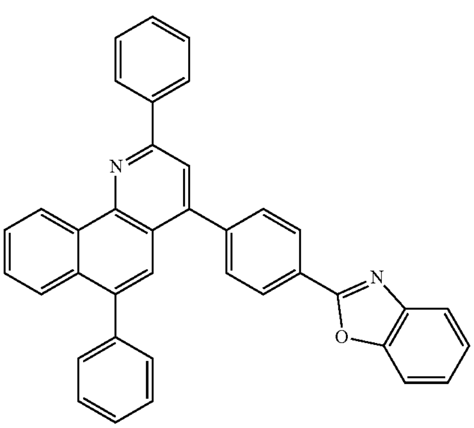
-continued
[Chemical Formula A142]
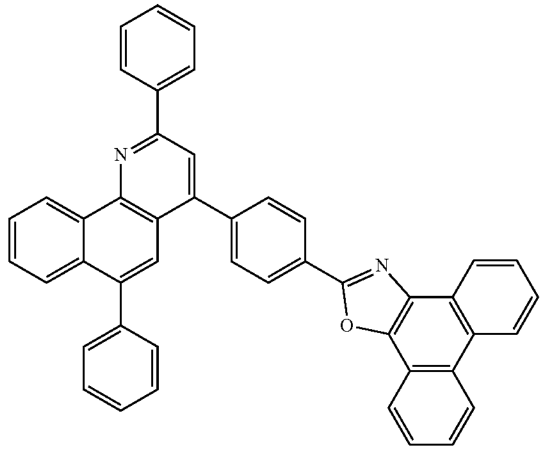
[Chemical Formula A142]
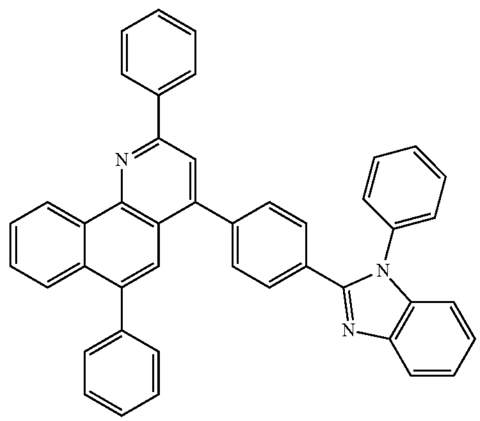
[Chemical Formula A144]
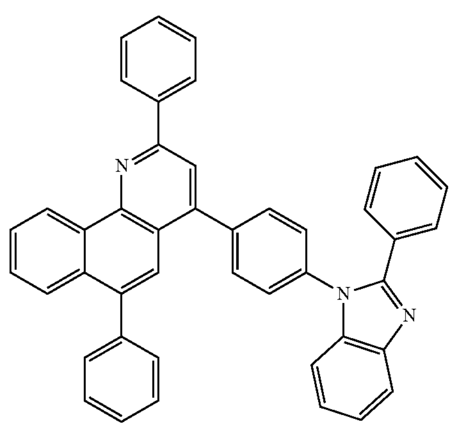

-continued
[Chemical Formula A145]
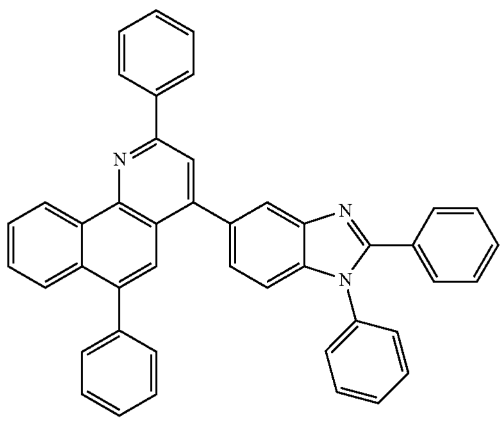
[Chemical Formula A146]
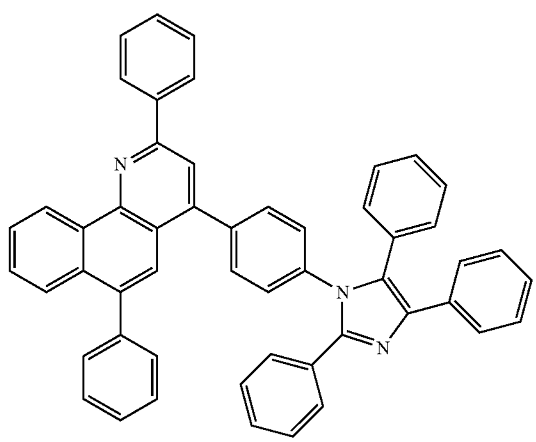
[Chemical Formula A147]
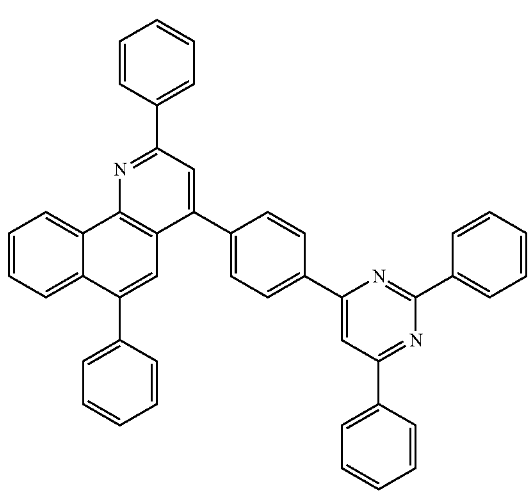
-continued
[Chemical Formula A148]
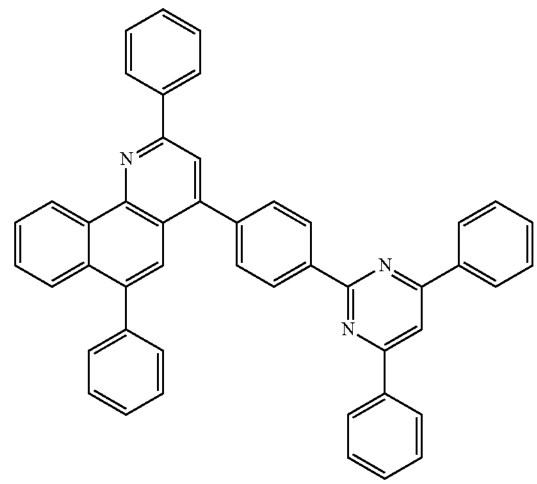
[Chemical Formula A149]
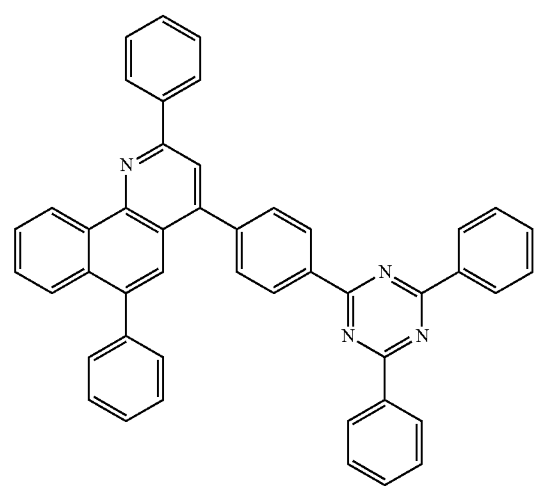
[Chemical Formula A150]
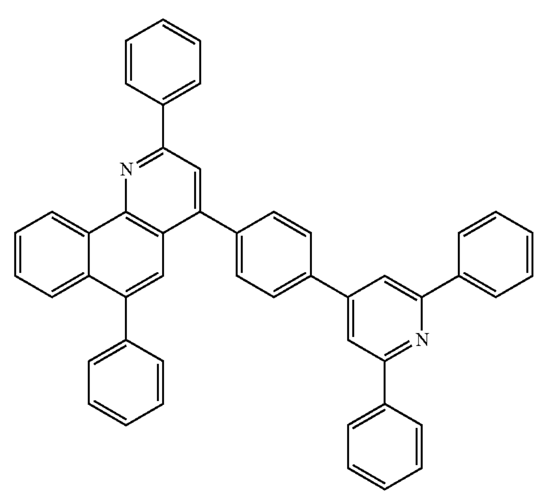

-continued
[Chemical Formula A151]
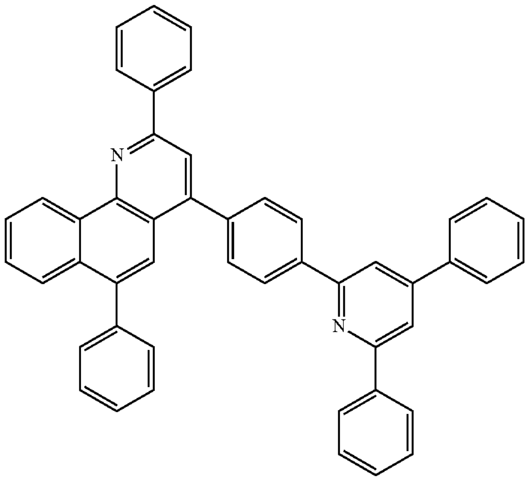
[Chemical Formula A152]
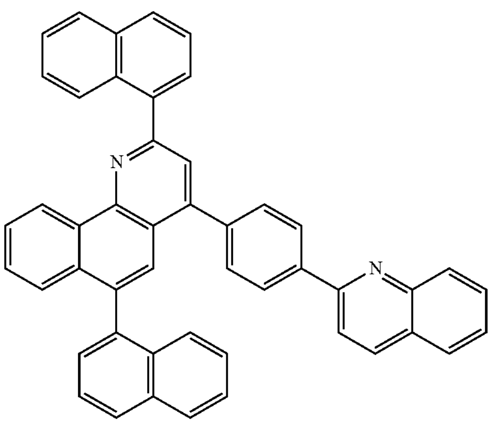
[Chemical Formula A153]
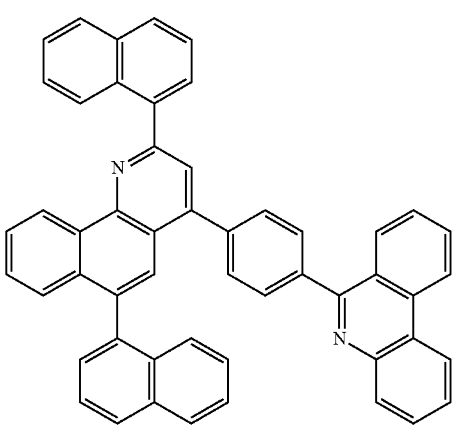
-continued
[Chemical Formula A154]
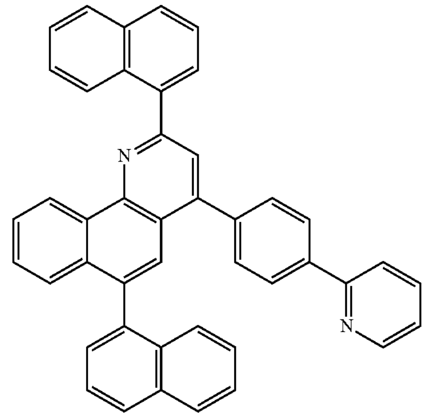
[Chemical Formula A155]
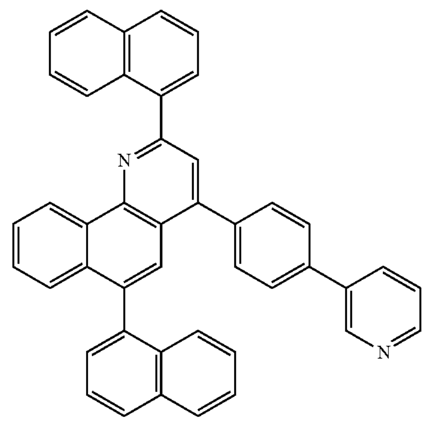
[Chemical Formula A156]
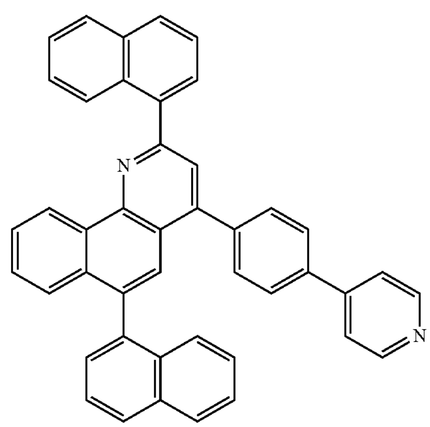

[Chemical Formula A157]
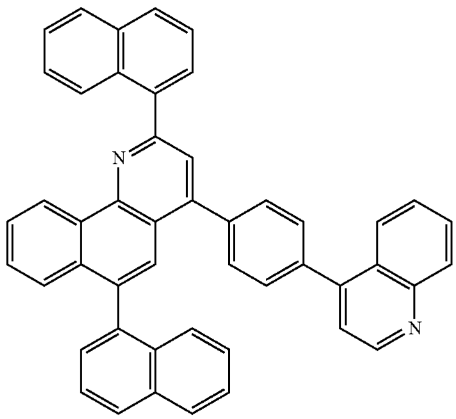
[Chemical Formula A158]
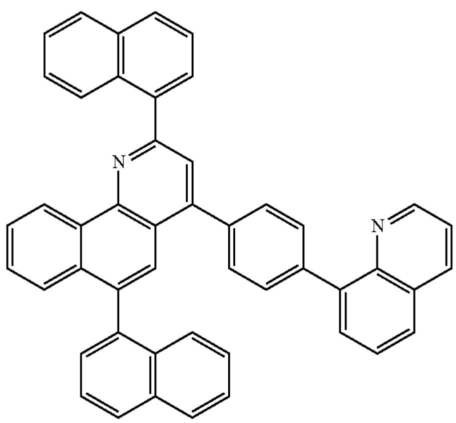
[Chemical Formula A159]
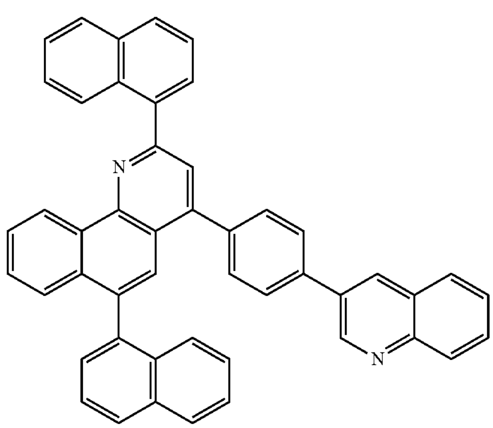
[Chemical Formula A160]
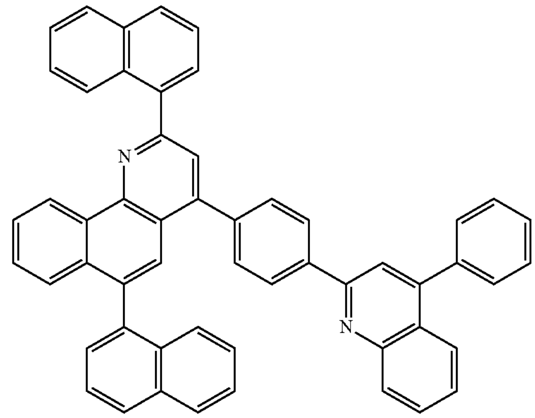
[Chemical Formula A161]
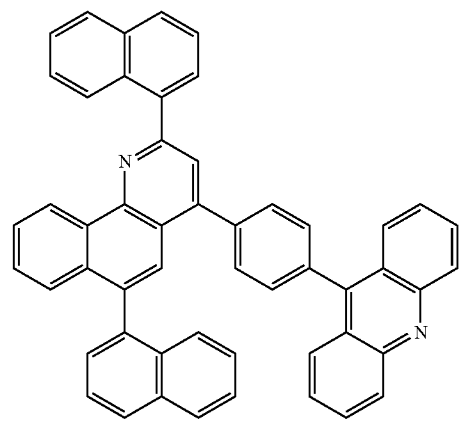
[Chemical Formula A162]
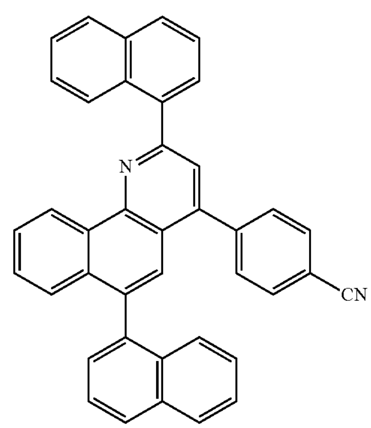

[Chemical Formula A163]
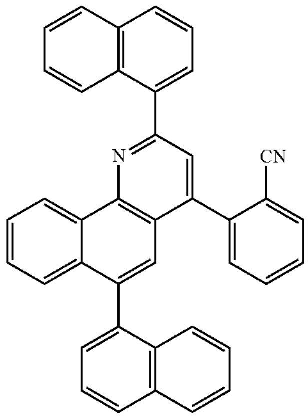
[Chemical Formula A164]
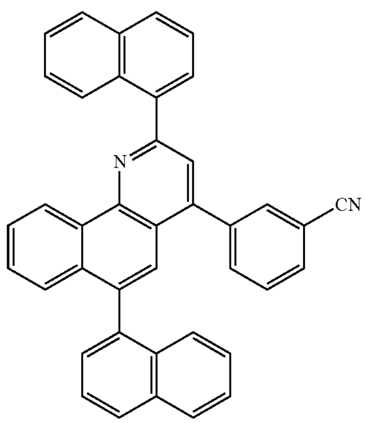
[Chemical Formula A165]
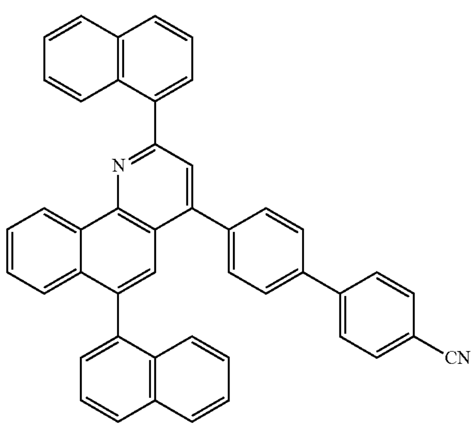
[Chemical Formula A166]
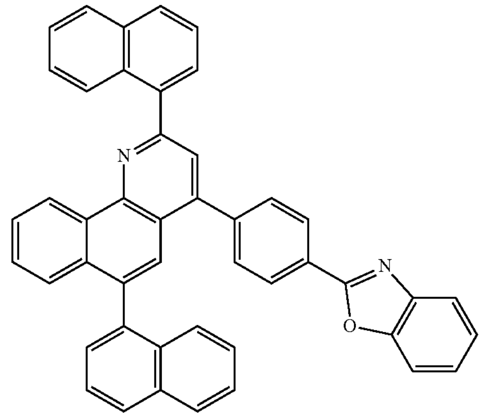
[Chemical Formula A167]
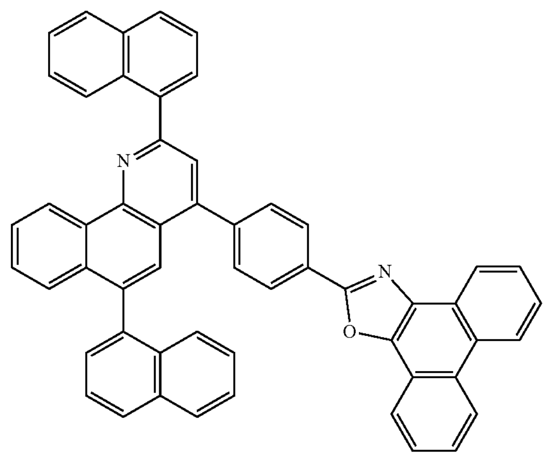
[Chemical Formula A168]
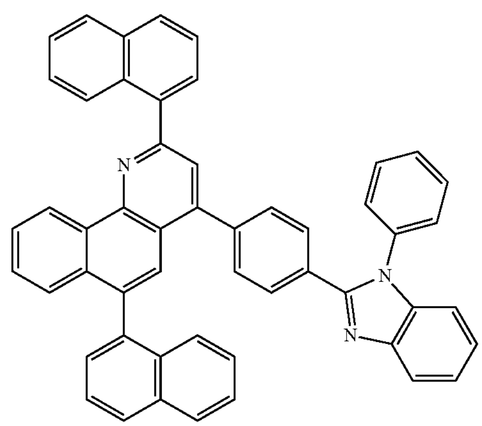

-continued
[Chemical Formula A169]
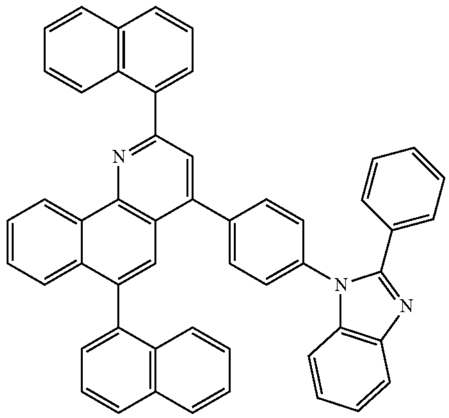
[Chemical Formula A170]
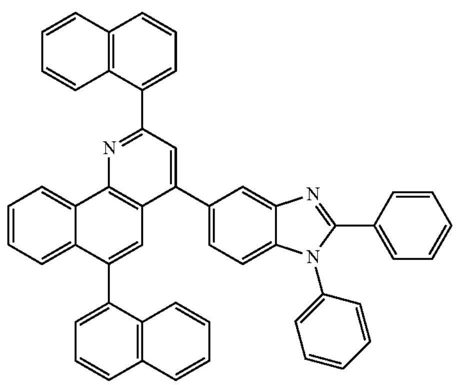
[Chemical Formula A171]
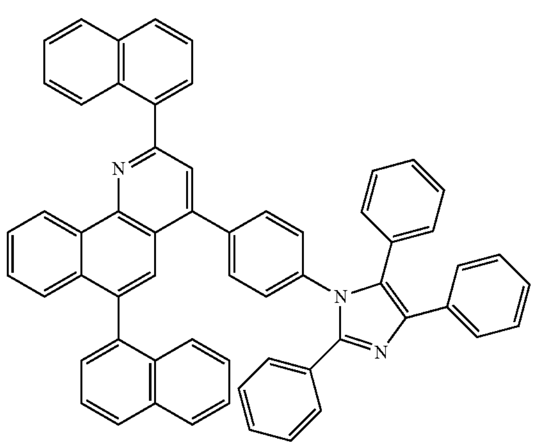
-continued
[Chemical Formula A172]
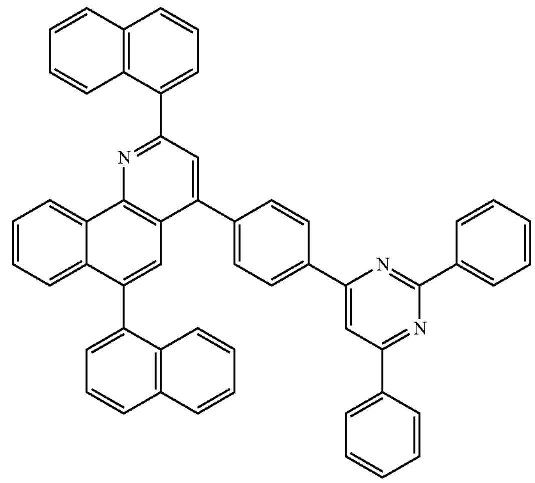
[Chemical Formula A173]
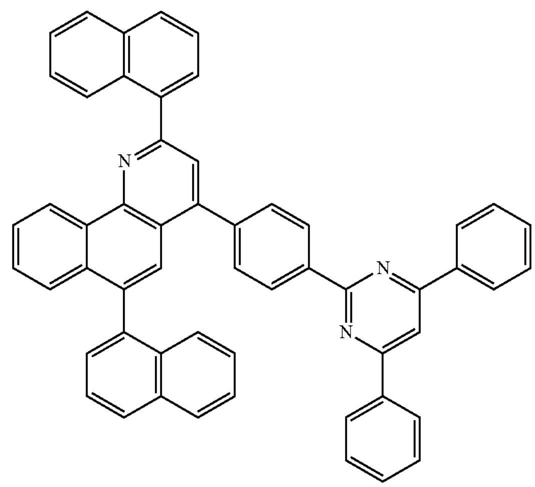
[Chemical Formula A174]
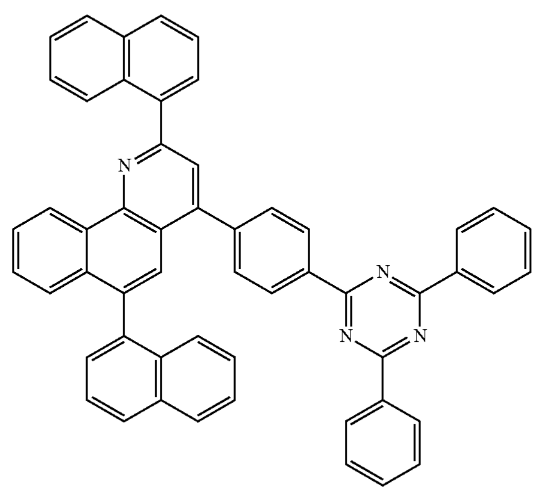

-continued
[Chemical Formula A175]
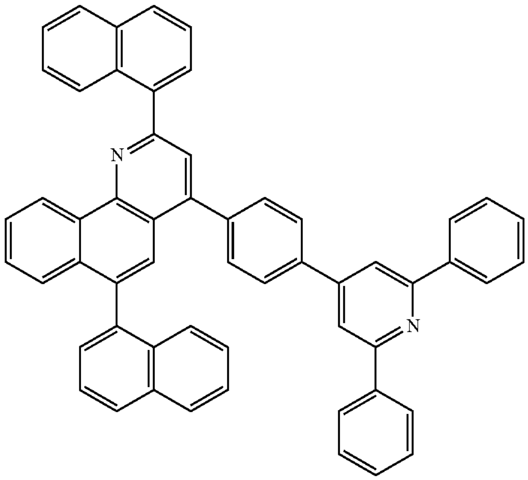
[Chemical Formula A176]
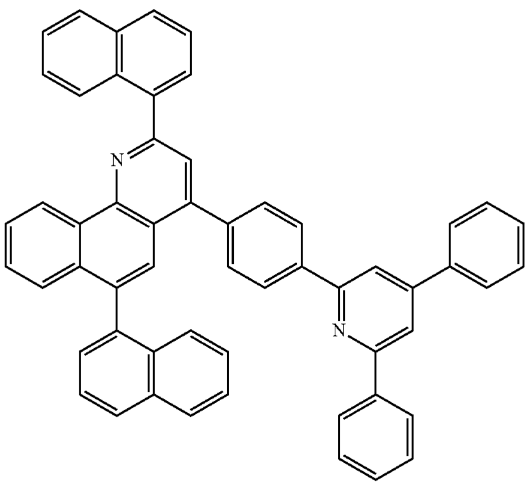
[Chemical Formula A177]
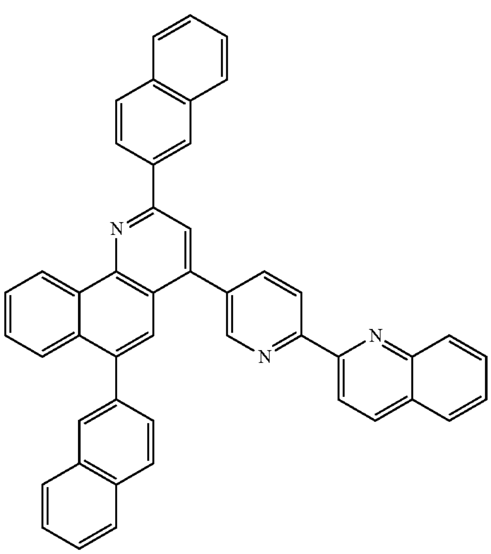
-continued
[Chemical Formula A178]
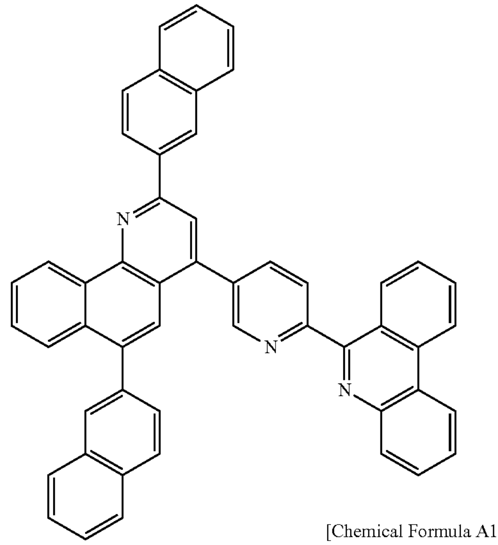
[Chemical Formula A179]
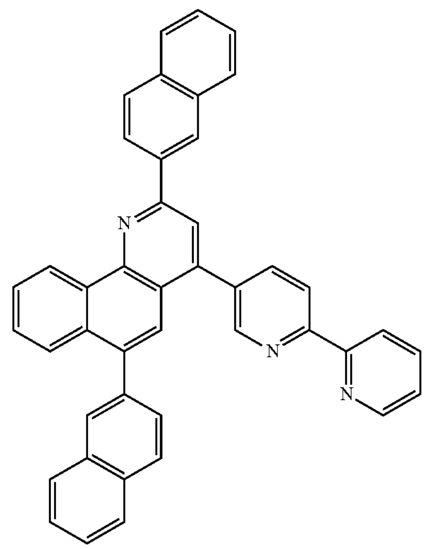
[Chemical Formula A180]
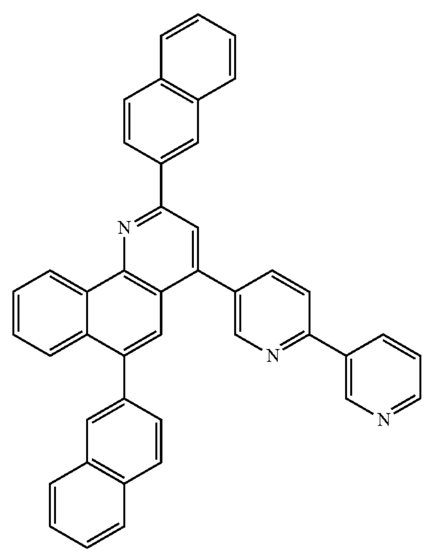

[Chemical Formula A181]
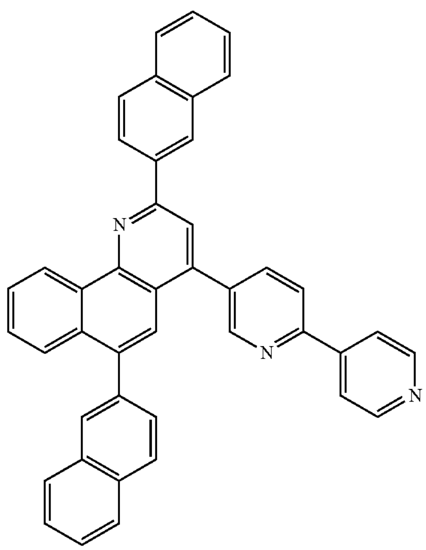
[Chemical Formula A182]
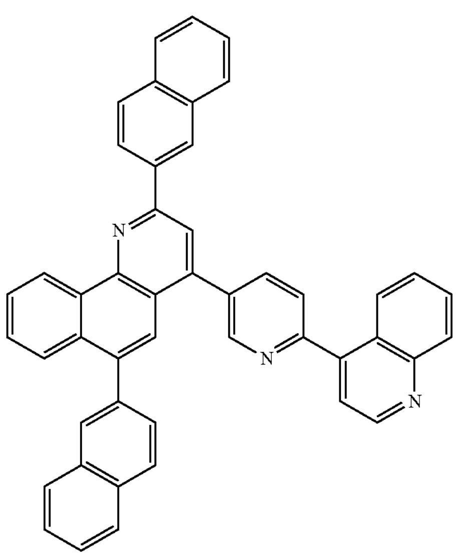
[Chemical Formula A183]
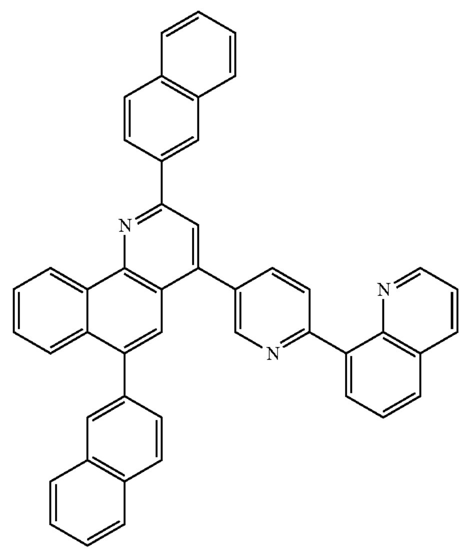
[Chemical Formula A184]
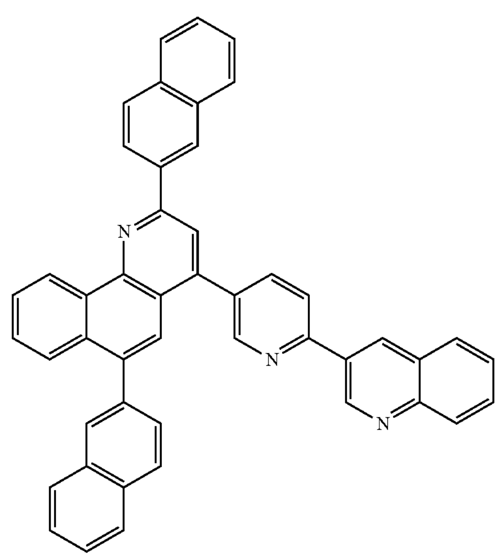

[Chemical Formula A185]
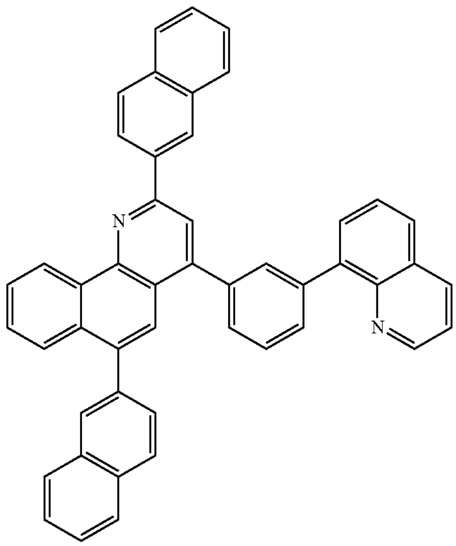
[Chemical Formula A187]
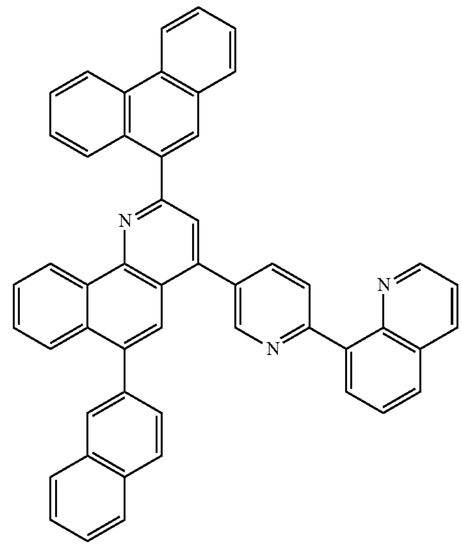
[Chemical Formula A186]
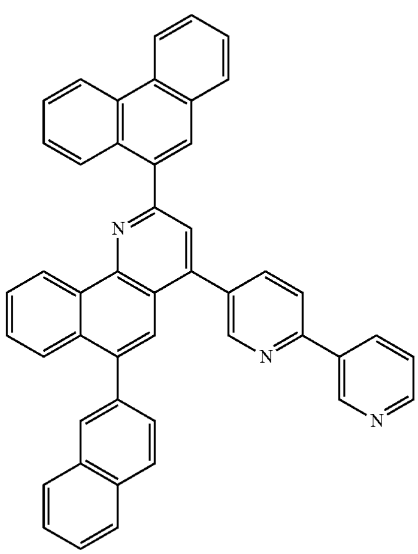
[Chemical Formula A188]
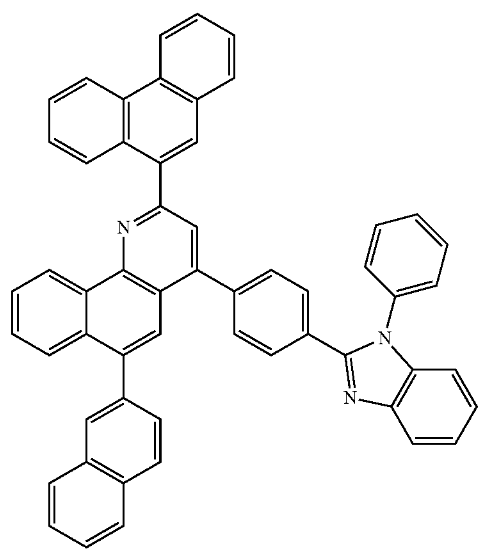

-continued
[Chemical Formula A189]
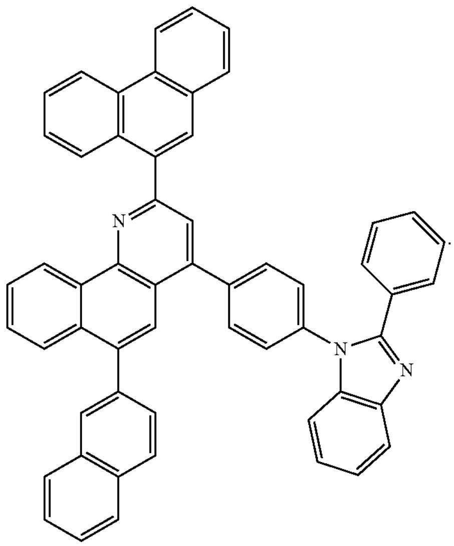
The embodiments may also be realized by providing a compound for an organic optoelectronic device, the compound being represented by one of the following Chemical Formulae B1 to B175:
[Chemical Formula B1]
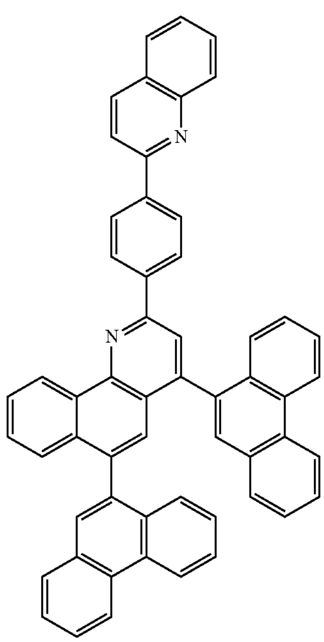
-continued
[Chemical Formula B2]
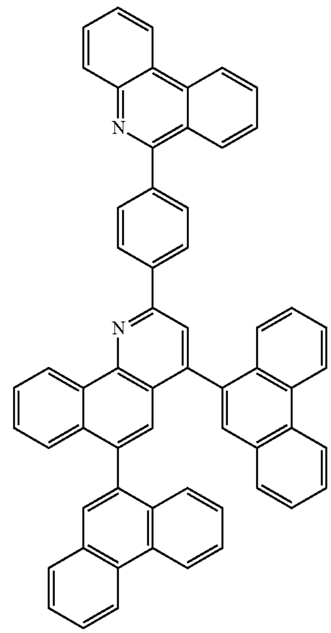 [SMILES: c1ccc2c(c1)cc(-c1cc3c(-c4cc5ccccc5c5ccccc45)cc(-c4ccc(-c5nc6ccccc6c6ccccc56)cc4)nc3c3ccccc13)c1ccccc12]
[Chemical Formula B3]
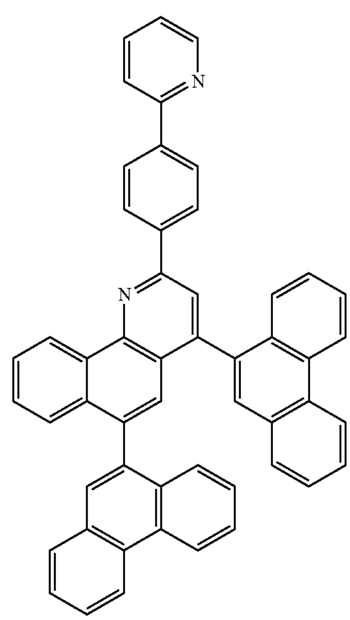

[Chemical Formula B4]
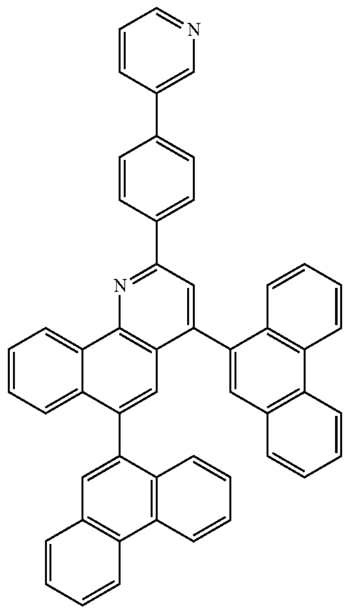
[Chemical Formula B6]
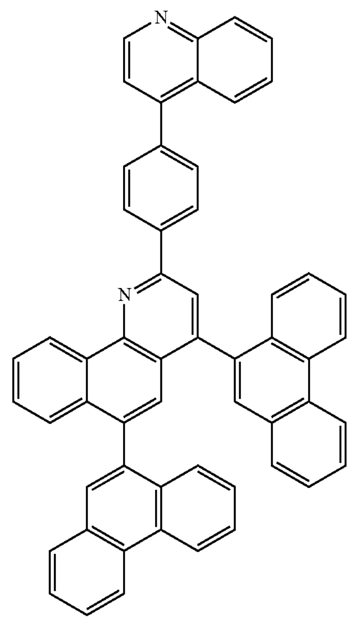
[Chemical Formula B5]
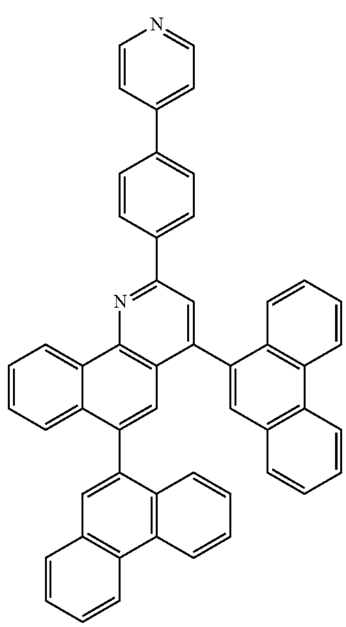
[Chemical Formula B7]
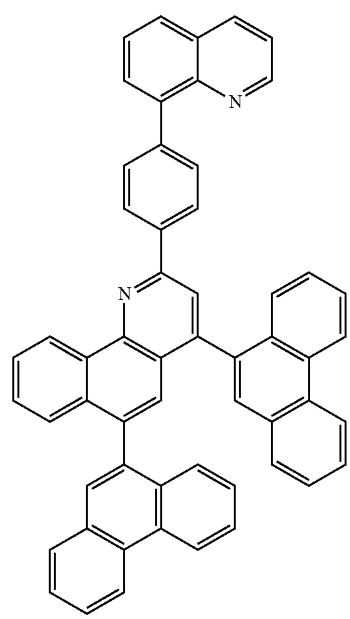

-continued
[Chemical Formula B8]
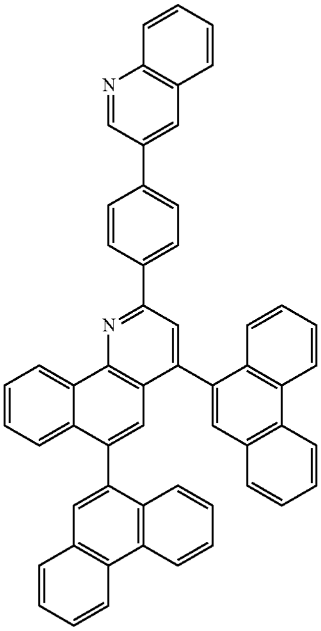
[Chemical Formula B9]
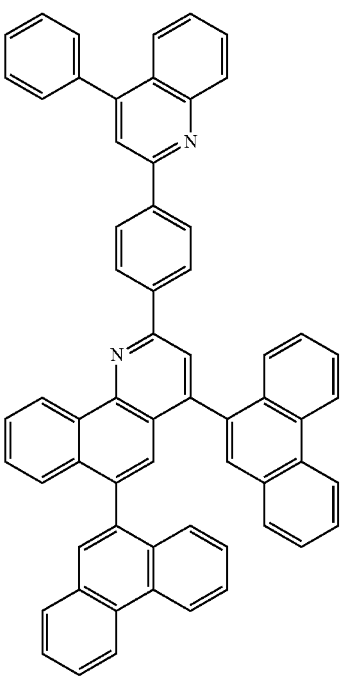
-continued
[Chemical Formula B10]
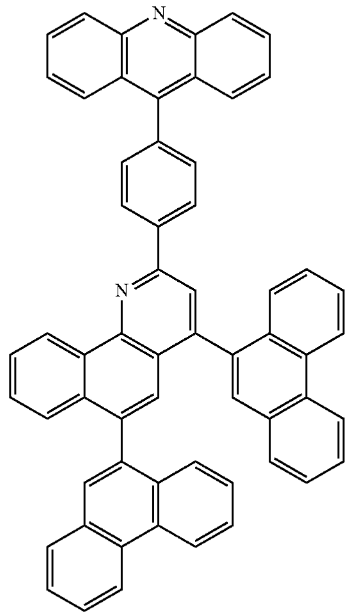
[Chemical Formula B11]
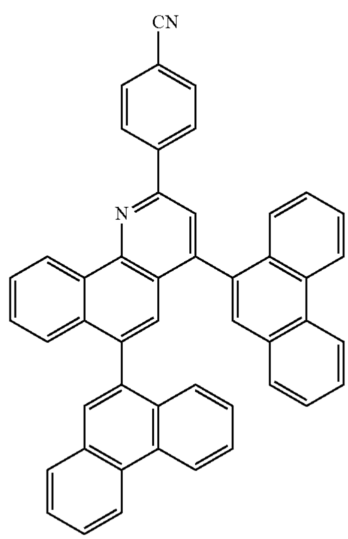

-continued
[Chemical Formula B12]
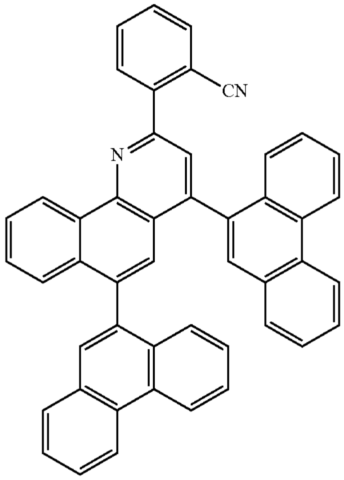
[Chemical Formula B13]
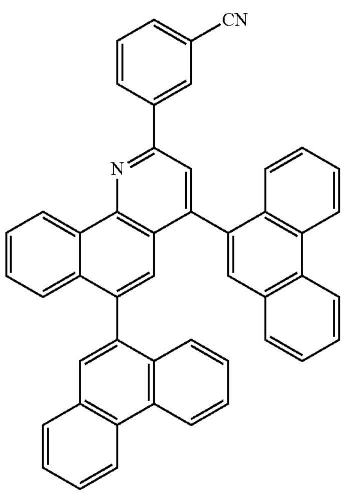
[Chemical Formula B14]
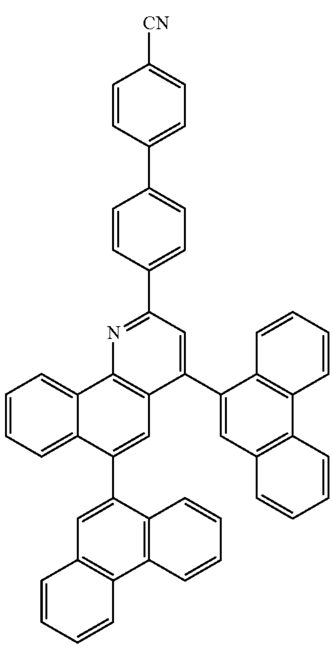
-continued
[Chemical Formula B15]
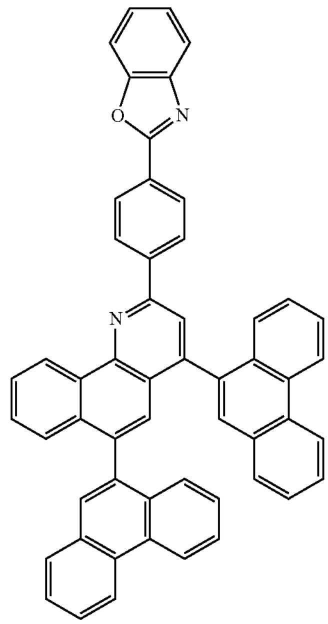
[Chemical Formula B16]
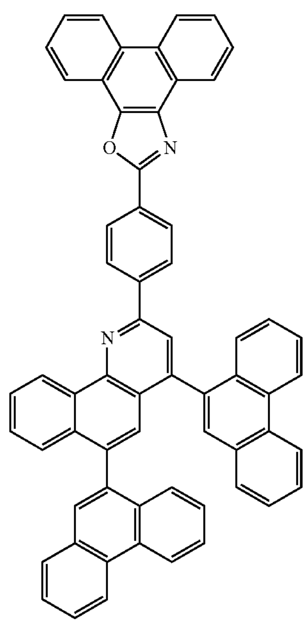

[Chemical Formula B17]
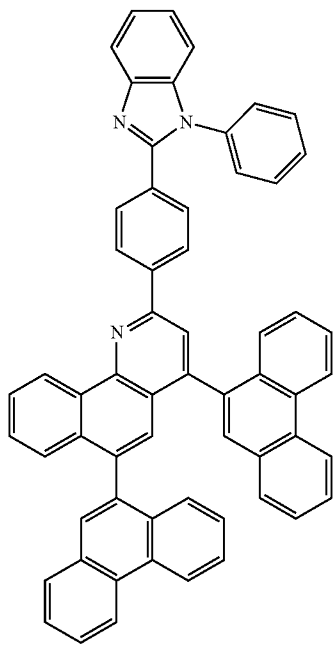
[Chemical Formula B18]
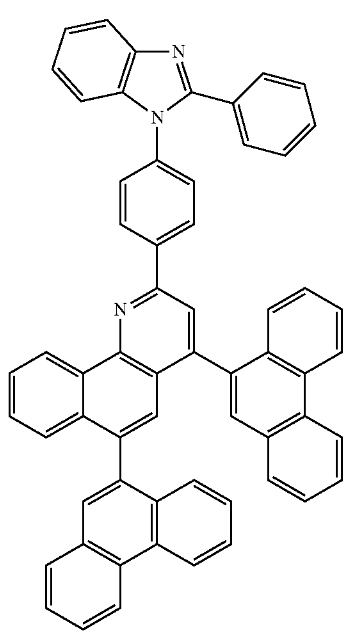
[Chemical Formula B19]
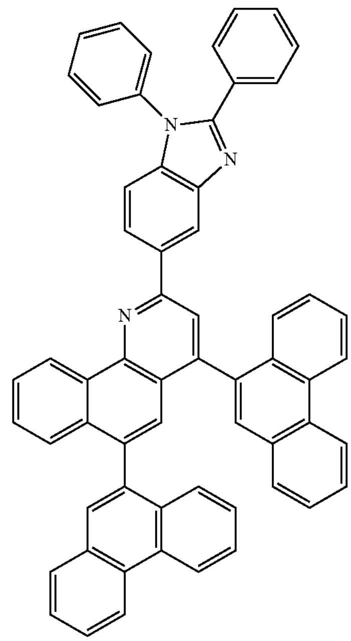
[Chemical Formula B20]
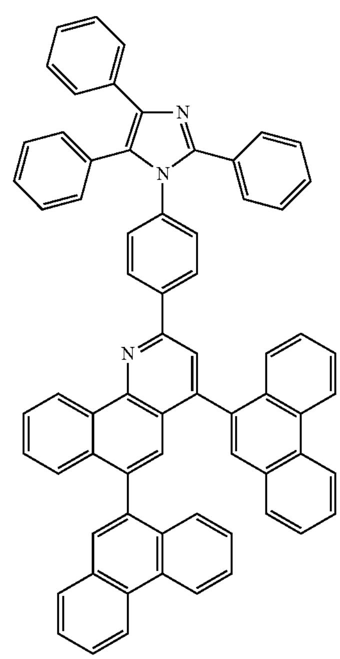

-continued
[Chemical Formula B21]
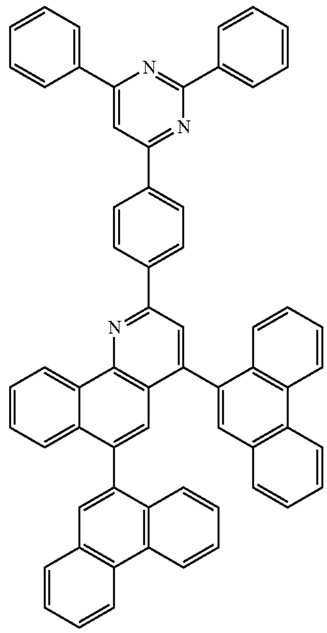
[Chemical Formula B22]
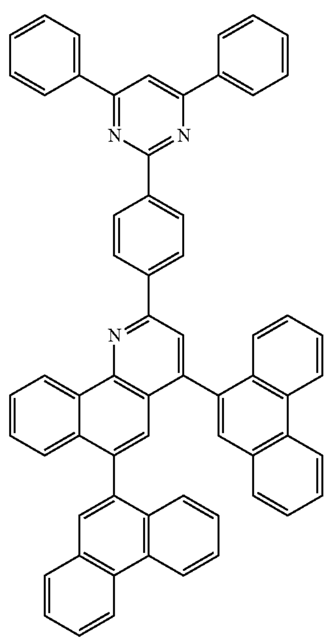
-continued
[Chemical Formula B23]
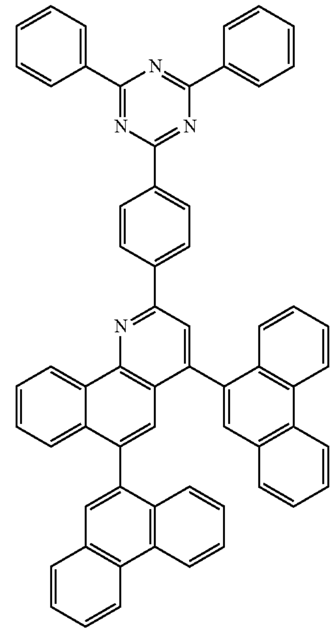
[Chemical Formula B24]
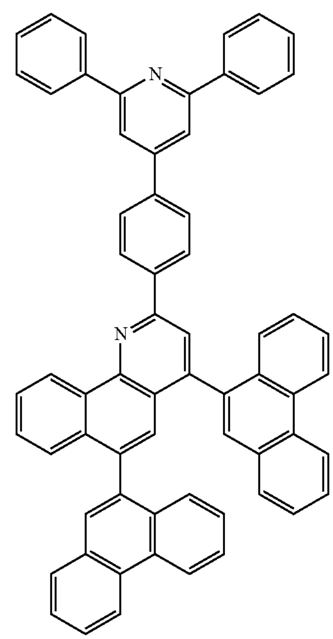

-continued
[Chemical Formula B25]
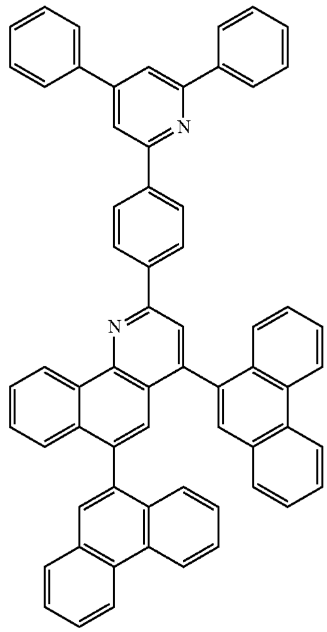
[Chemical Formula B26]
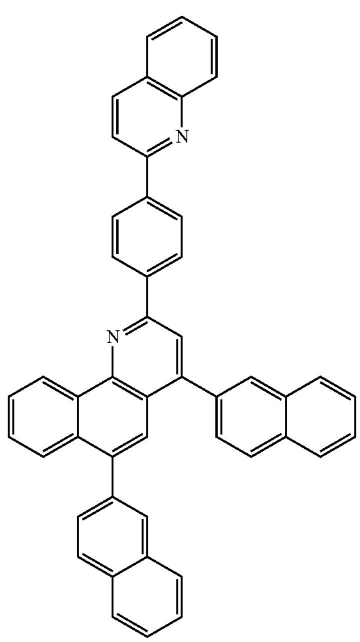
-continued
[Chemical Formula B27]
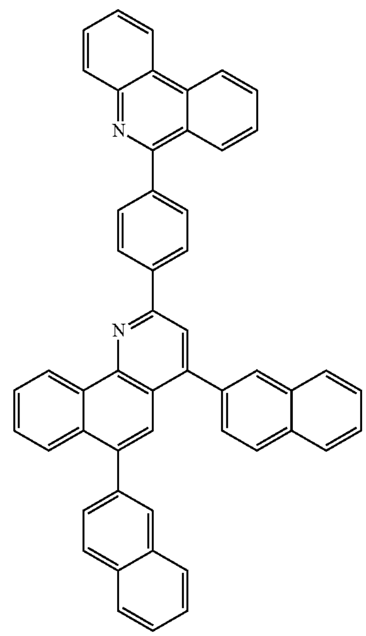
[Chemical Formula B28]
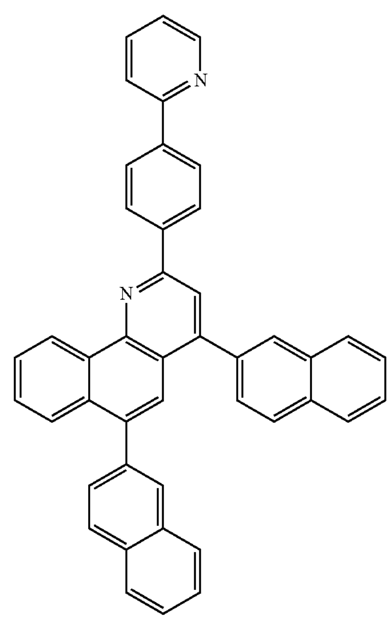

-continued
[Chemical Formula B29]
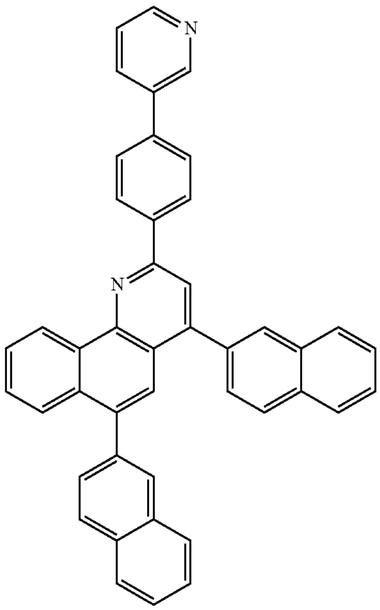
[Chemical Formula B30]
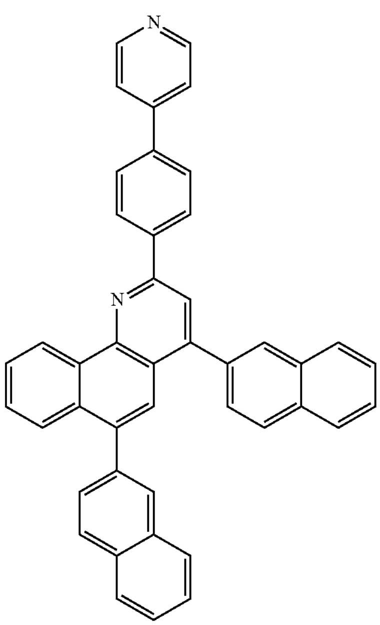
-continued
[Chemical Formula B31]
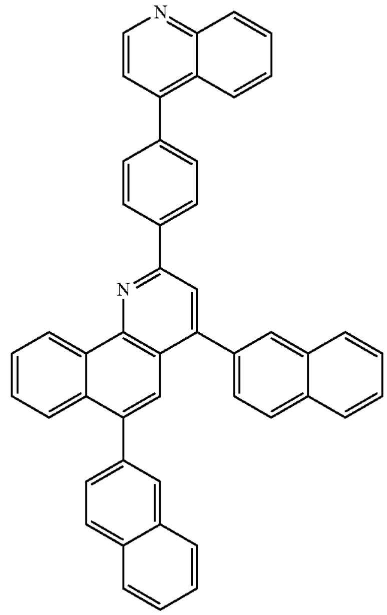
[Chemical Formula B32]
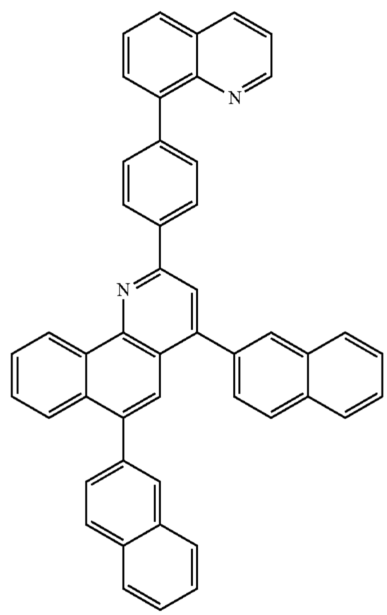

[Chemical Formula B33]
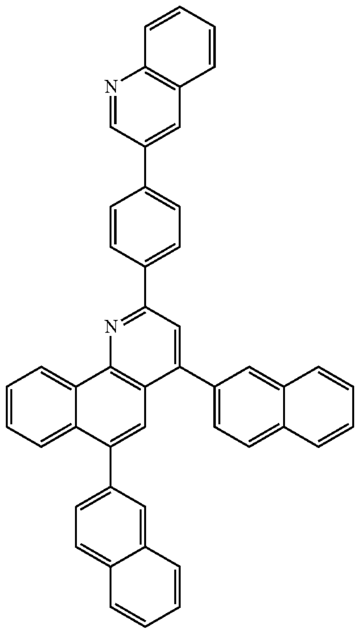
[Chemical Formula B34]
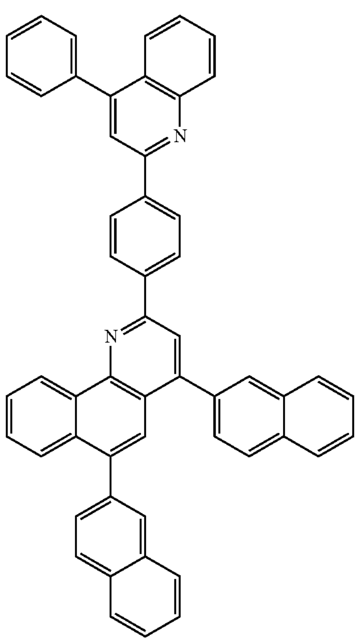
[Chemical Formula B35]
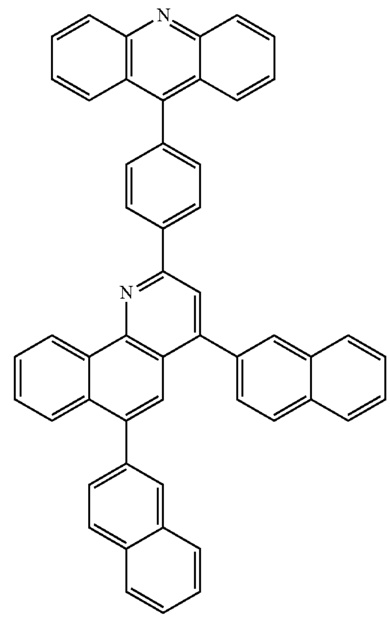
[Chemical Formula B36]
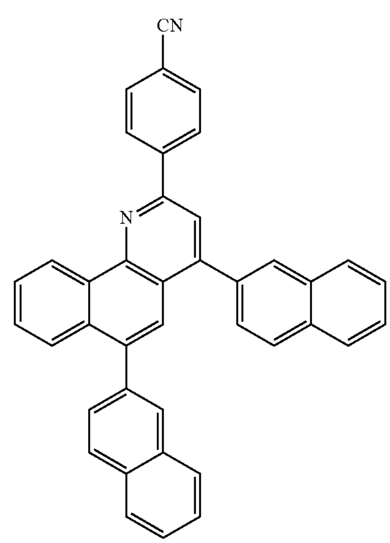

-continued
[Chemical Formula B37]
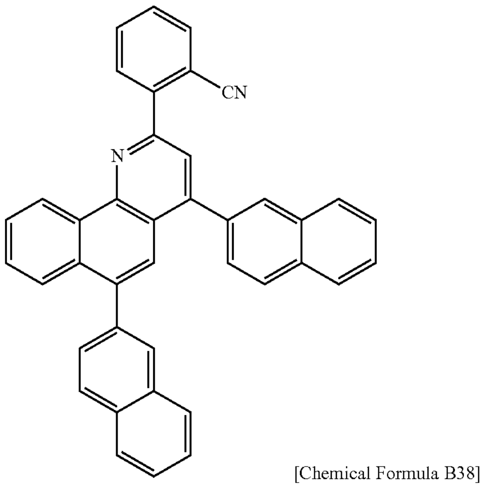
[Chemical Formula B38]
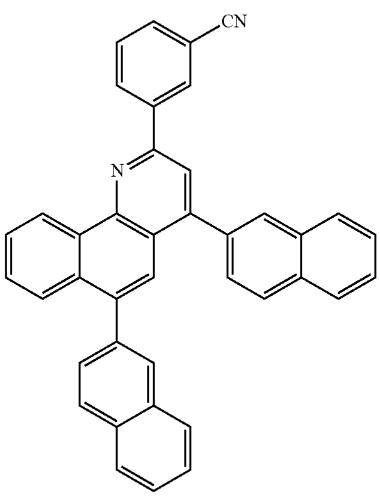
[Chemical Formula B39]
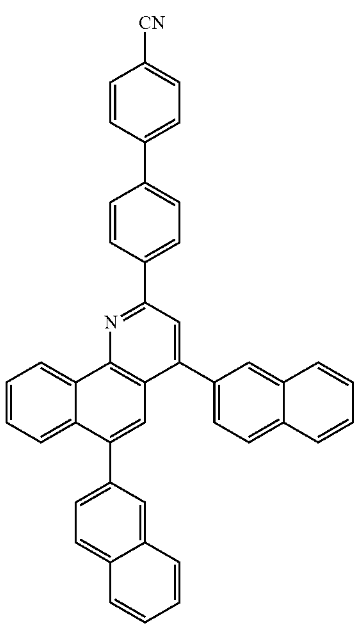
-continued
[Chemical Formula B40]
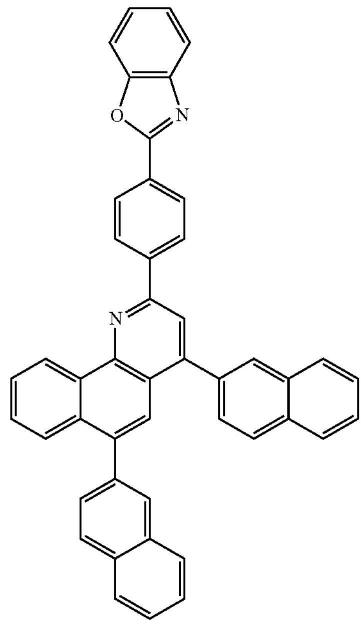
[Chemical Formula B41]
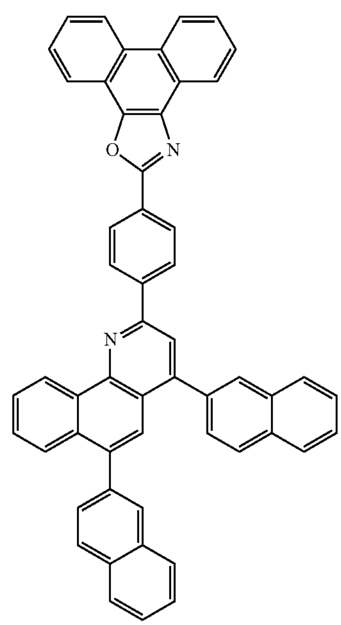

[Chemical Formula B42]
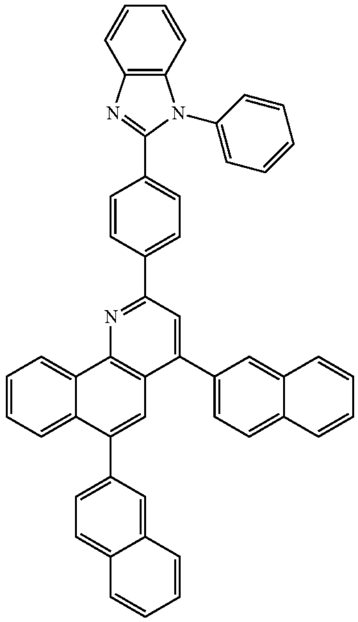
[Chemical Formula B43]
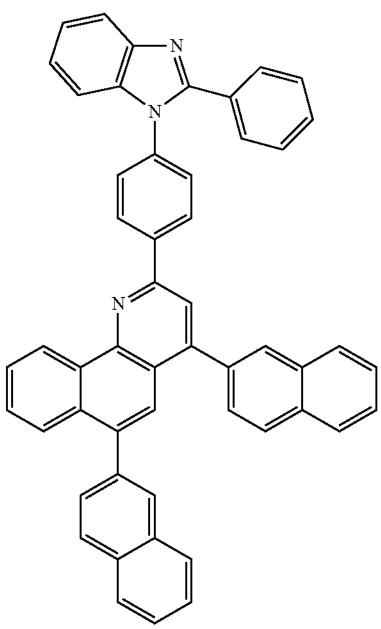
[Chemical Formula B44]
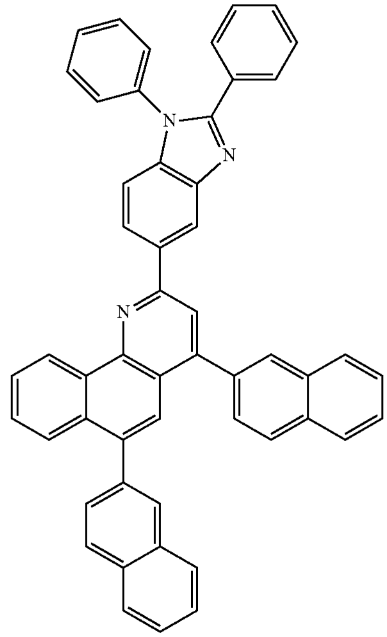
[Chemical Formula B45]
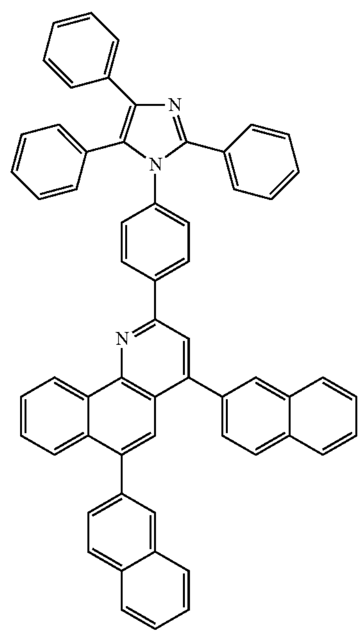

[Chemical Formula B46]
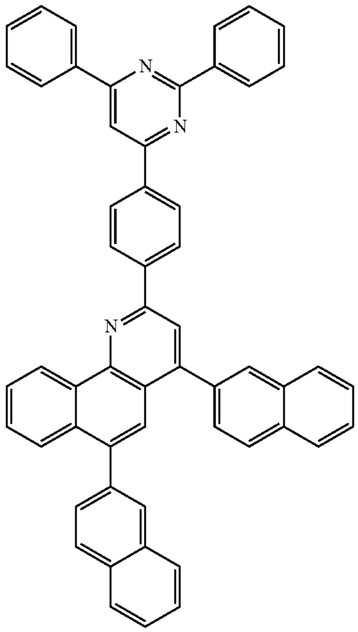
[Chemical Formula B47]
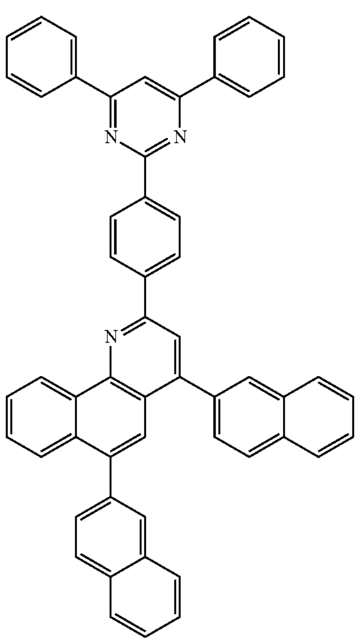
[Chemical Formula B48]
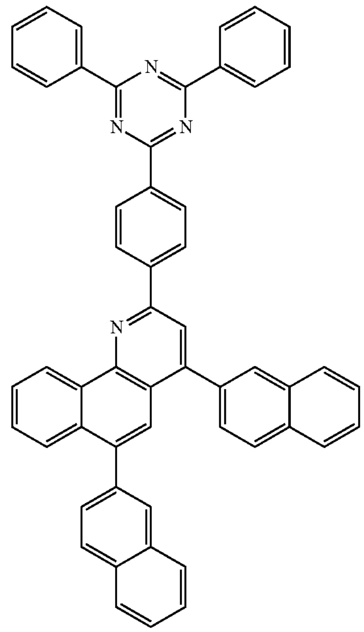
[Chemical Formula B49]
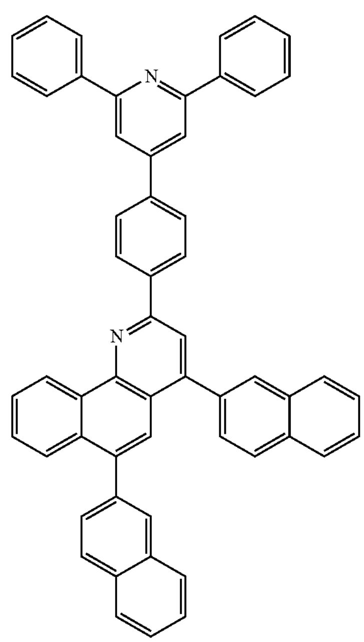

-continued
[Chemical Formula B50]
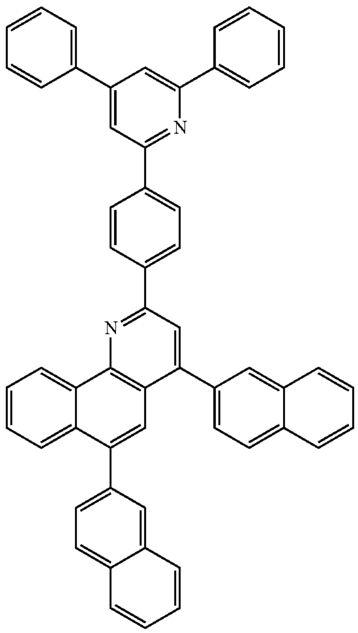
[Chemical Formula B51]
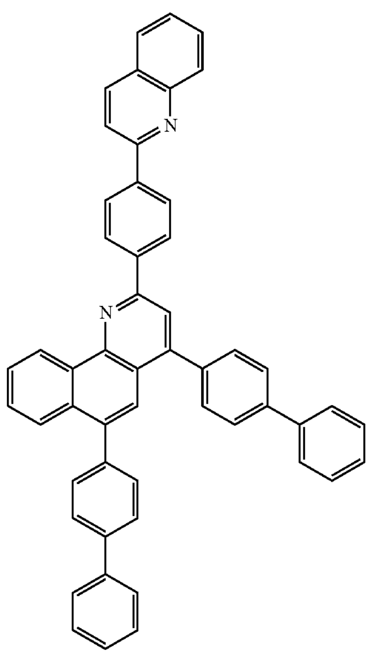
-continued
[Chemical Formula B52]
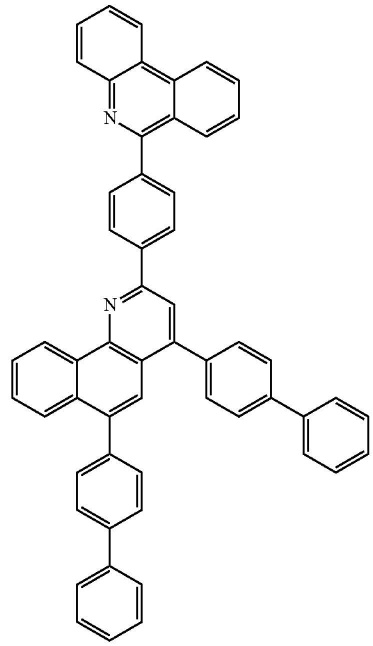
[Chemical Formula B53]
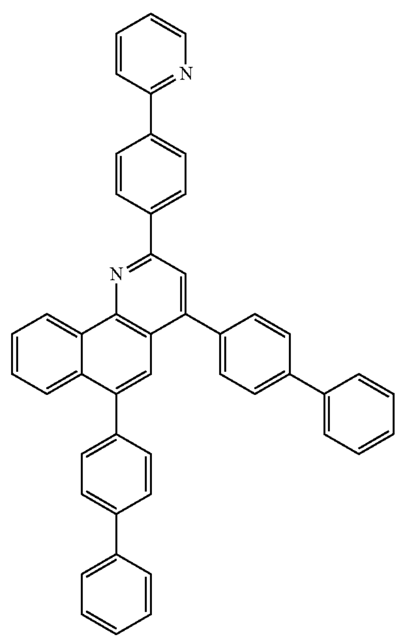

-continued
[Chemical Formula B54]
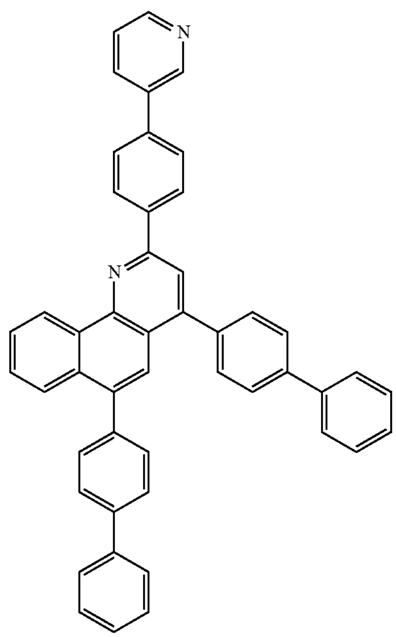
[Chemical Formula B55]
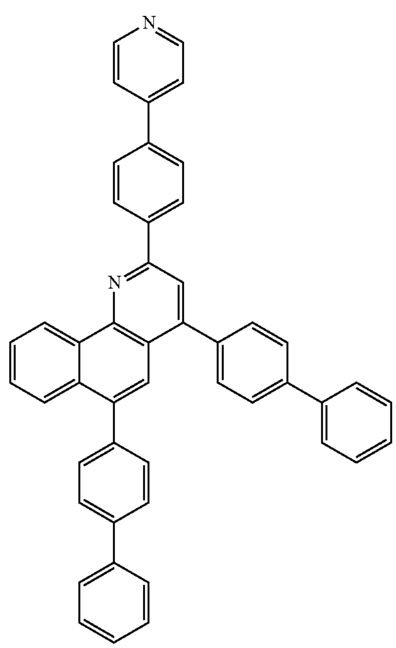
-continued
[Chemical Formula B56]
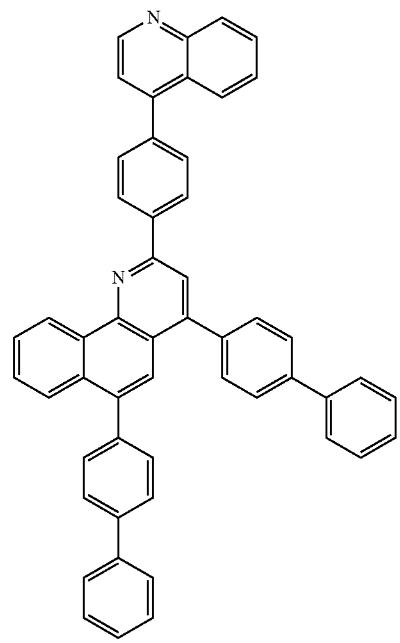
[Chemical Formula B57]
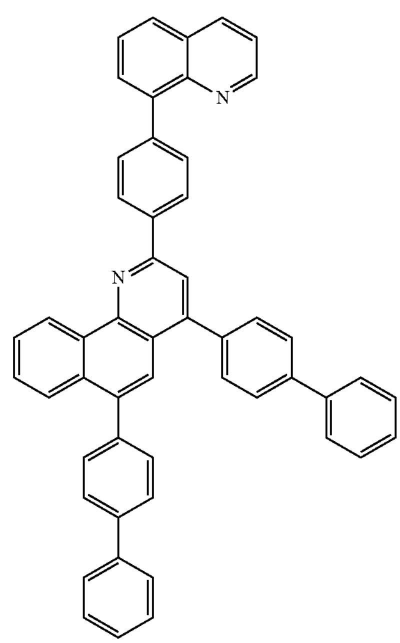

[Chemical Formula B58]
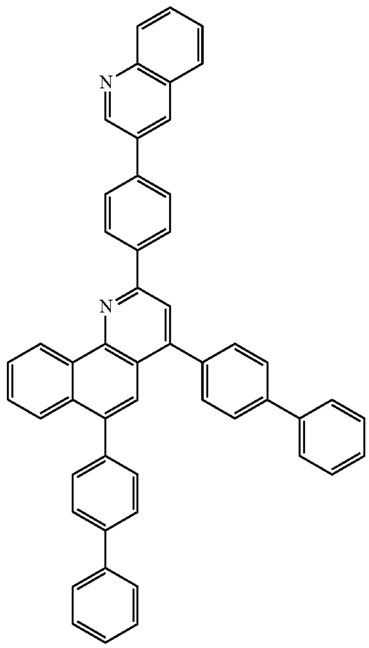
[Chemical Formula B59]
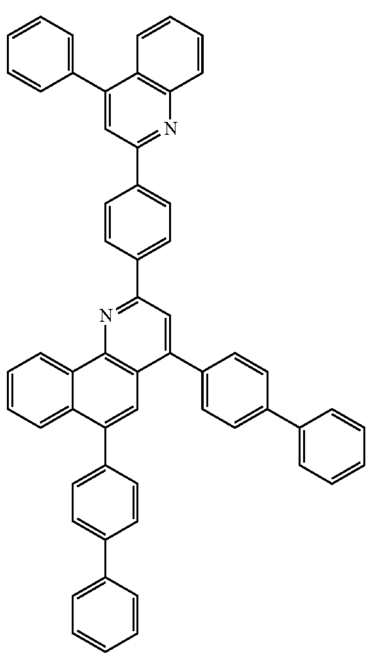
[Chemical Formula B60]
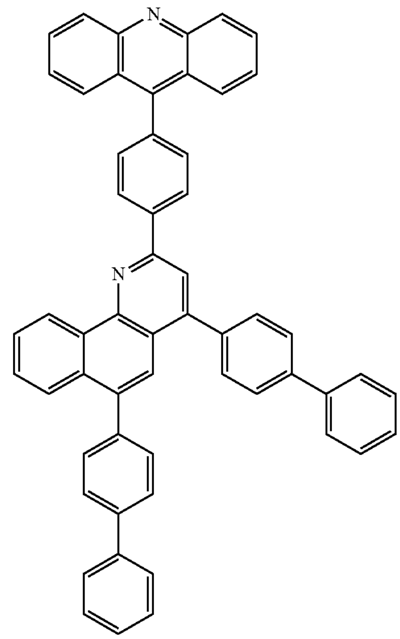
[Chemical Formula B61]
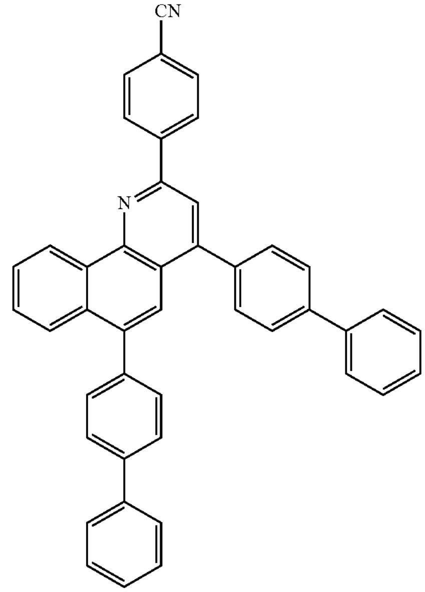

[Chemical Formula B62]
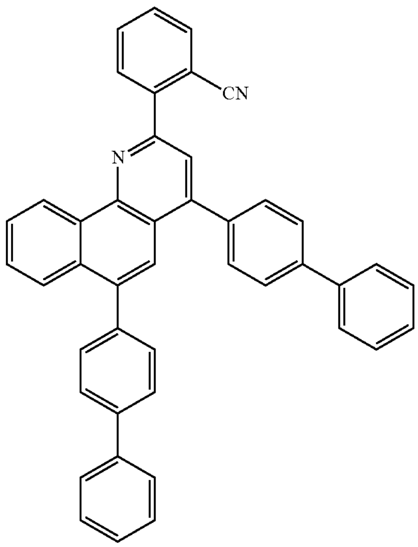
[Chemical Formula B63]
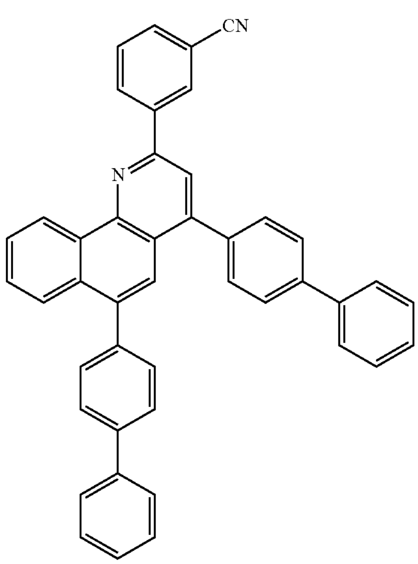
[Chemical Formula B64]
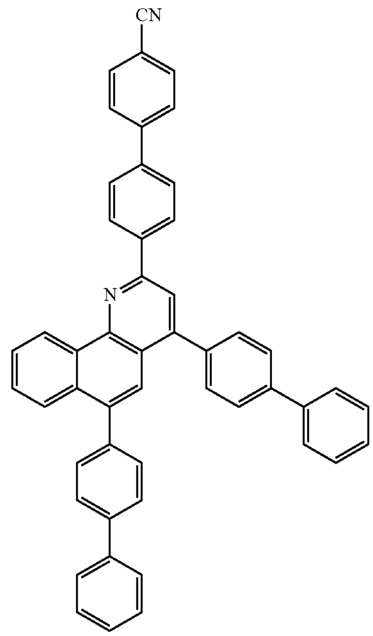
[Chemical Formula B65]
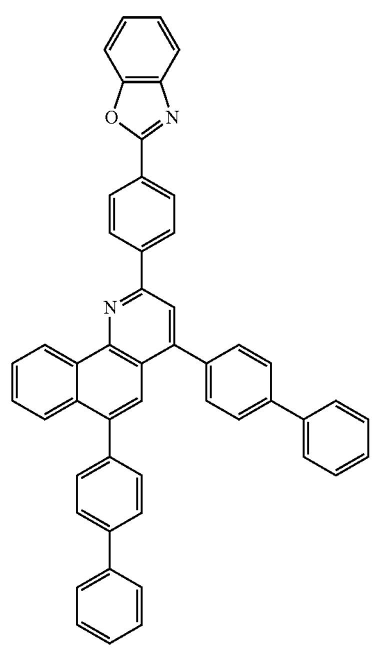

-continued
[Chemical Formula B66]
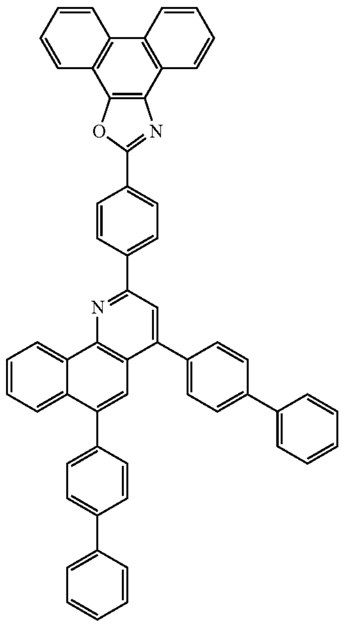
[Chemical Formula B67]
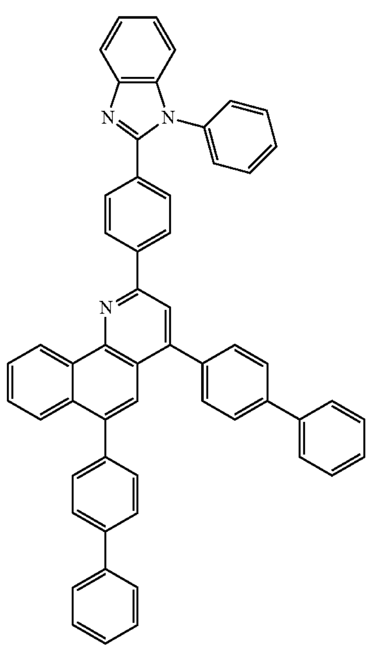
-continued
[Chemical Formula B68]
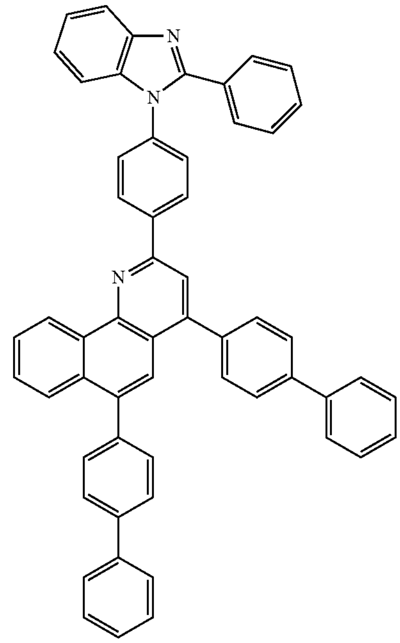
[Chemical Formula B69]
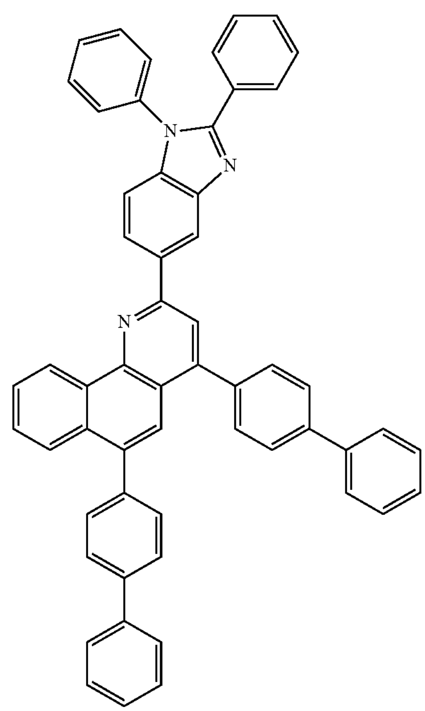

-continued
[Chemical Formula B70]
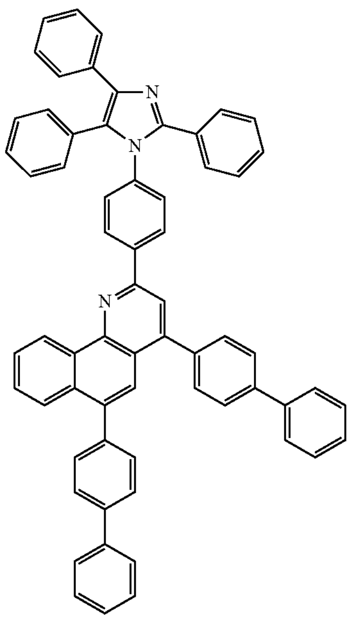
[Chemical Formula B71]
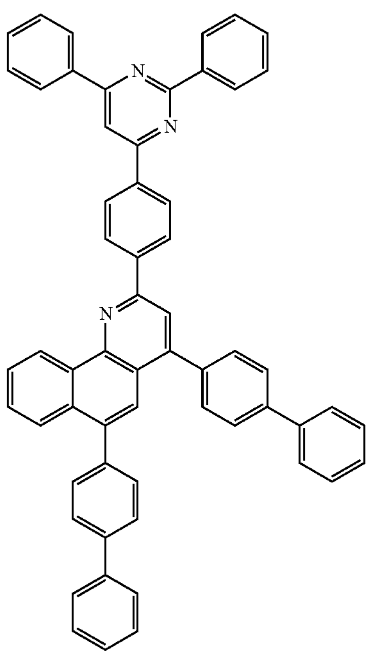
-continued
[Chemical Formula B72]
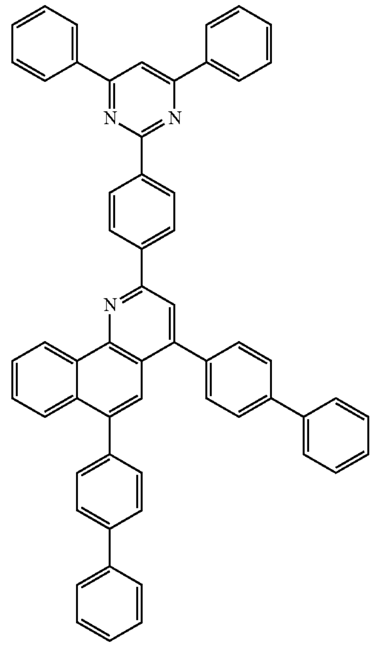
[Chemical Formula B73]
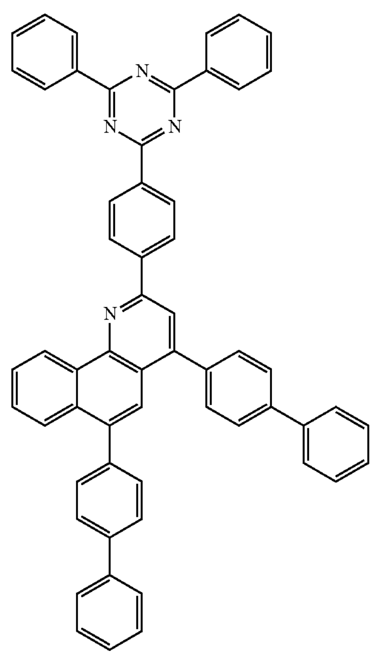

-continued
[Chemical Formula B74]
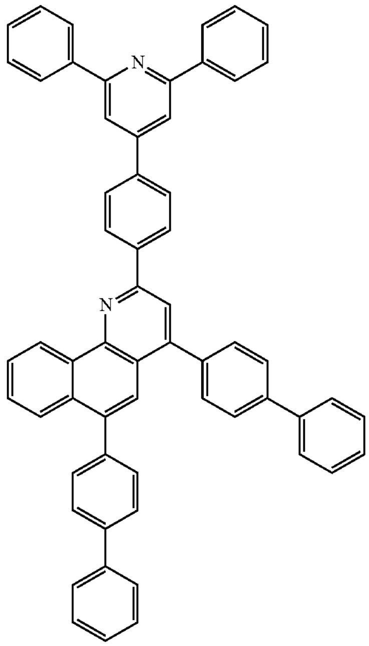
[Chemical Formula B75]
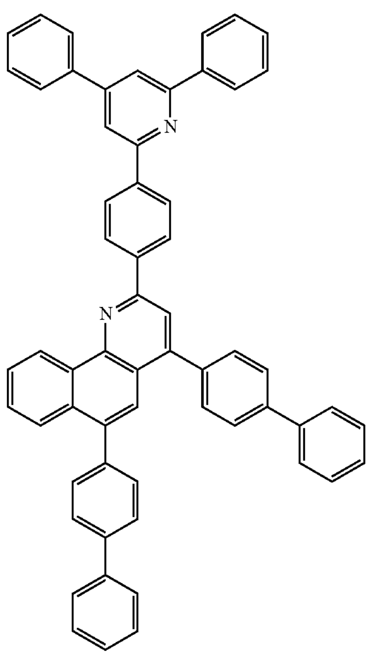
-continued
[Chemical Formula B76]
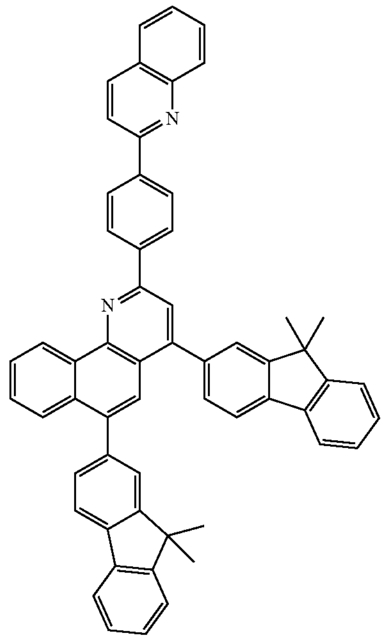
[Chemical Formula B77]
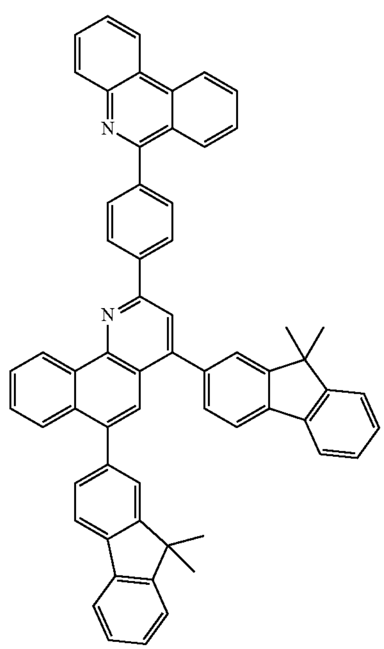

[Chemical Formula B78]
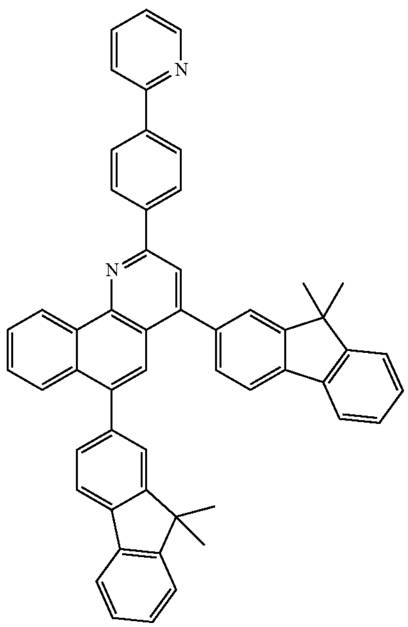
[Chemical Formula B79]
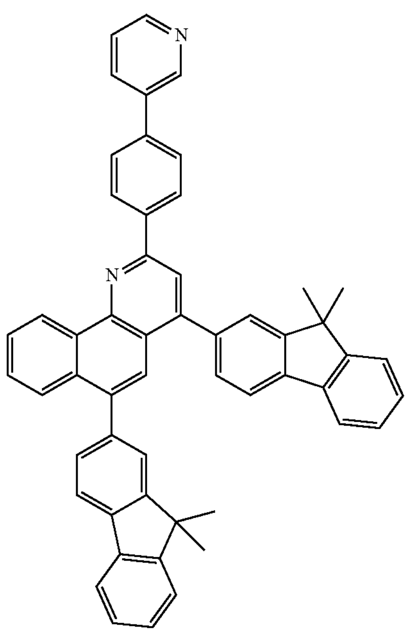
[Chemical Formula B80]
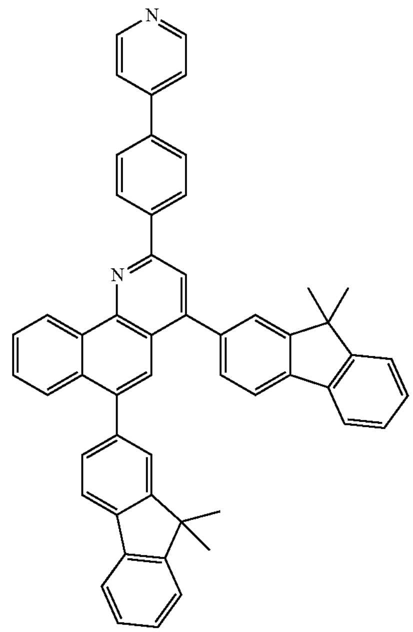
[Chemical Formula B81]
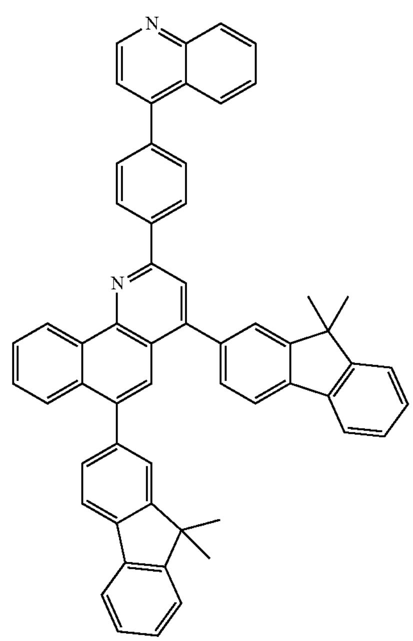

-continued
[Chemical Formula B82]
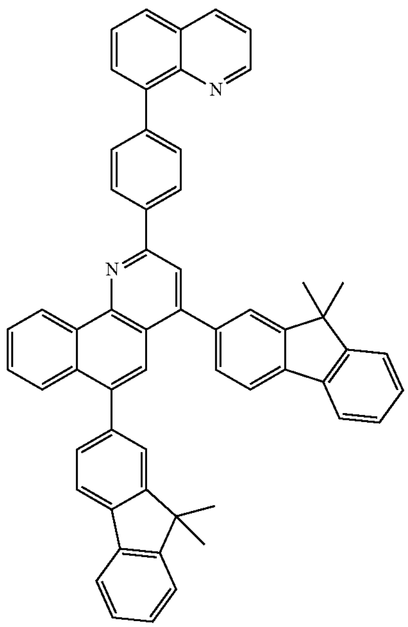
[Chemical Formula B83]
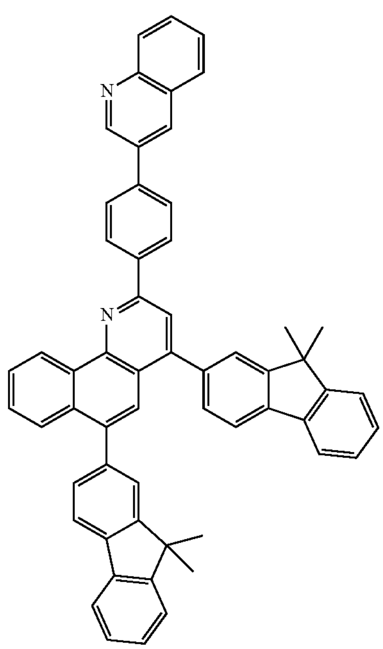
-continued
[Chemical Formula B84]
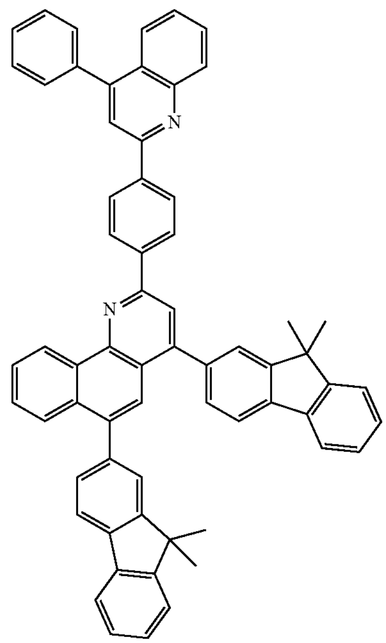
[Chemical Formula B85]
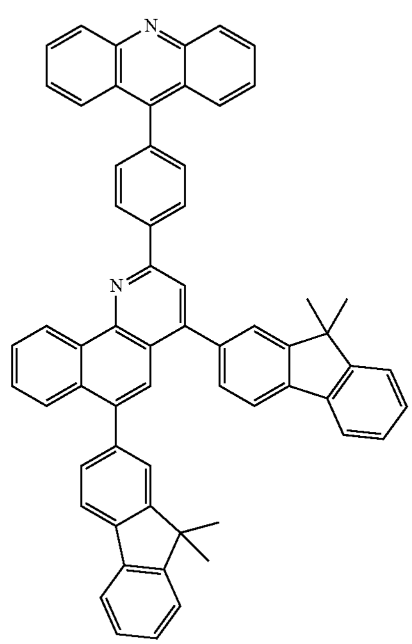

-continued
[Chemical Formula B86]
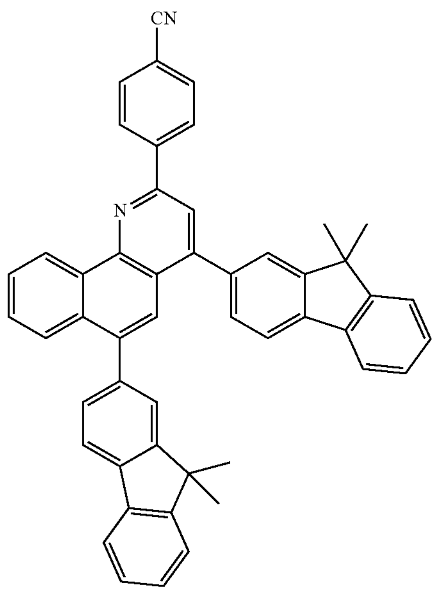
[Chemical Formula B87]
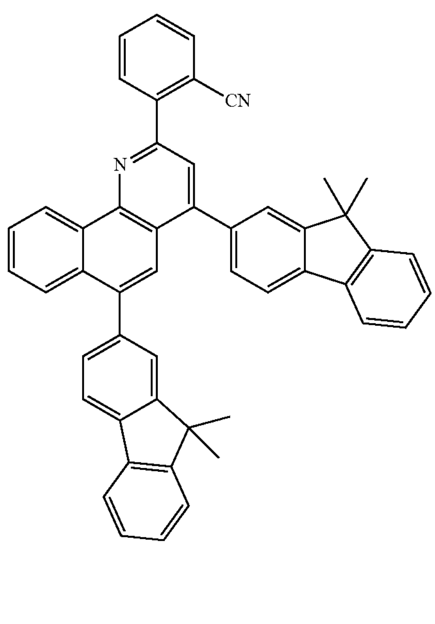
-continued
[Chemical Formula B88]
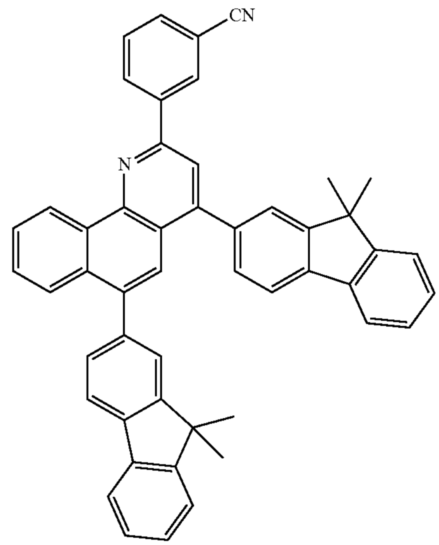
[Chemical Formula B89]
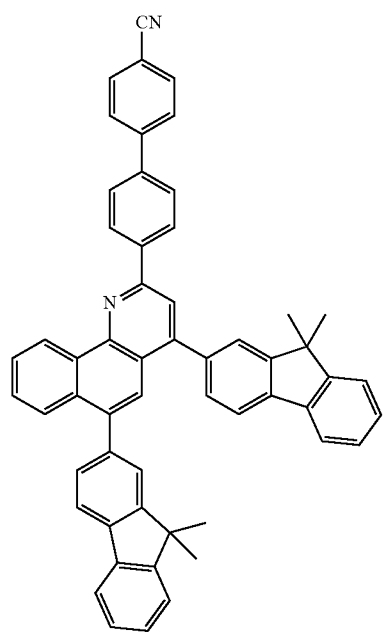

[Chemical Formula B90]
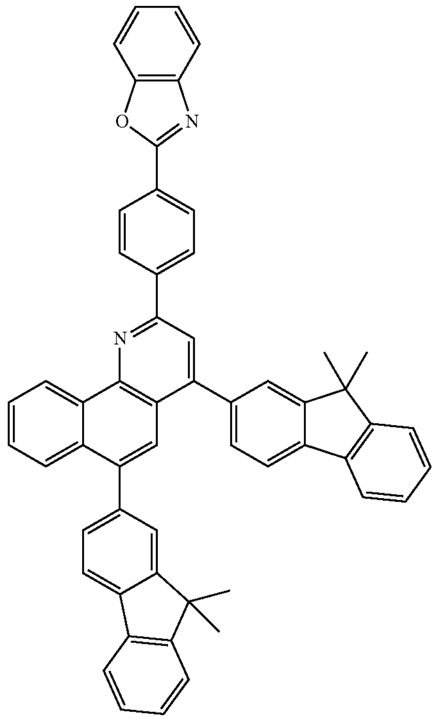
[Chemical Formula B91]
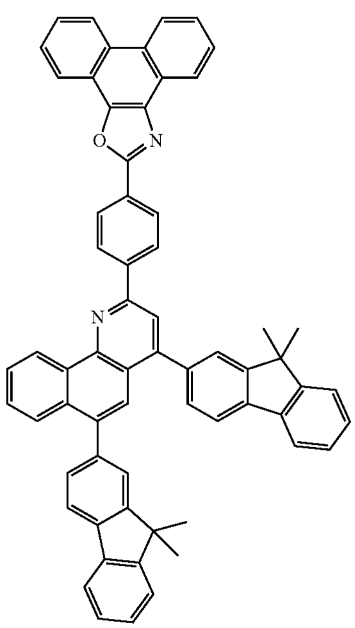
[Chemical Formula B92]
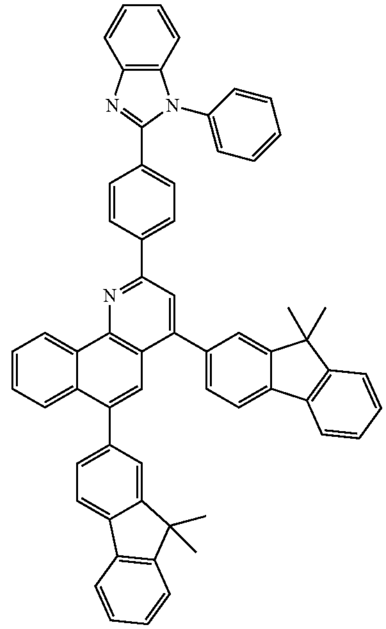
[Chemical Formula B93]
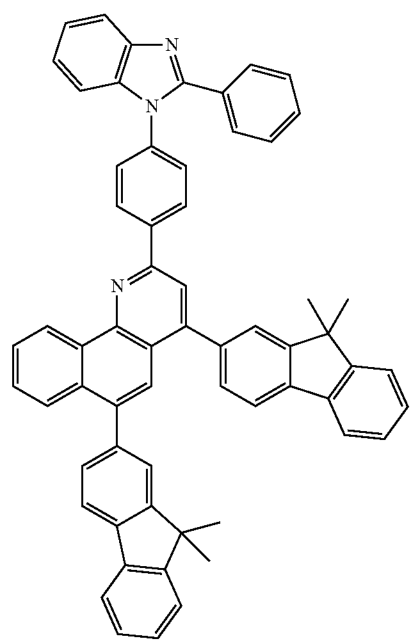

-continued
[Chemical Formula B94]
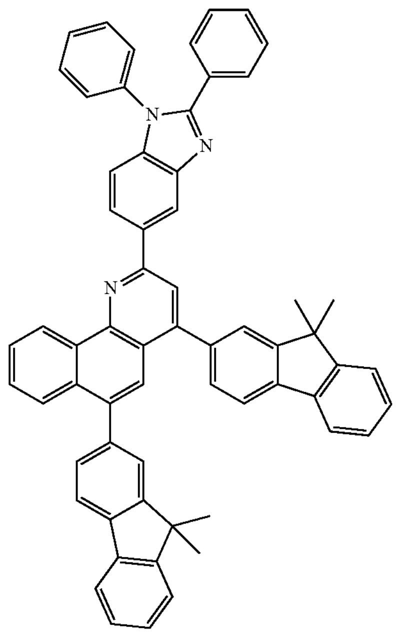
[Chemical Formula B95]
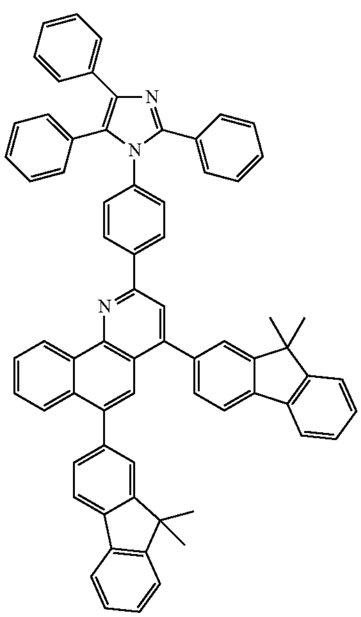
-continued
[Chemical Formula B96]
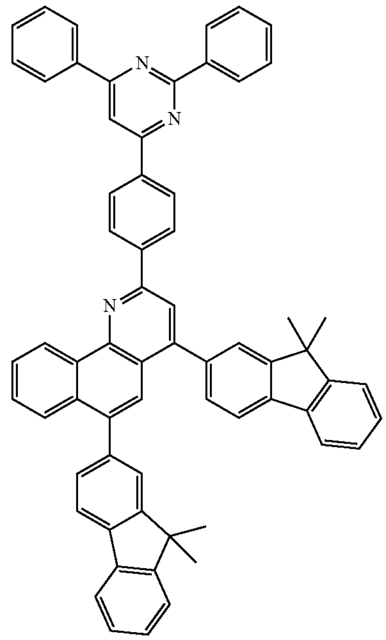
[Chemical Formula B97]
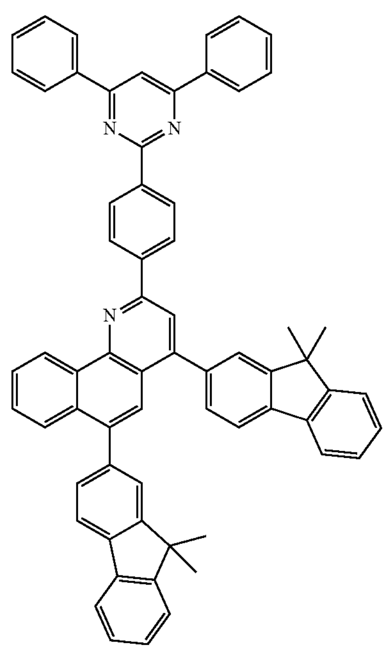

-continued
[Chemical Formula B98]
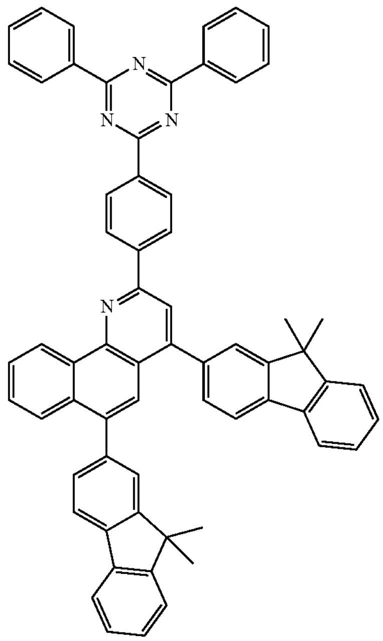
[Chemical Formula B99]
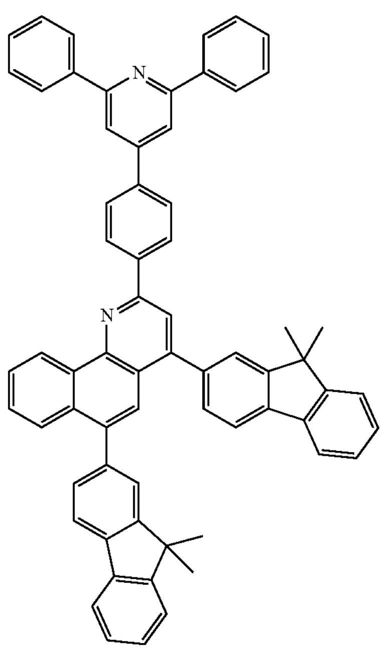
-continued
[Chemical Formula B100]
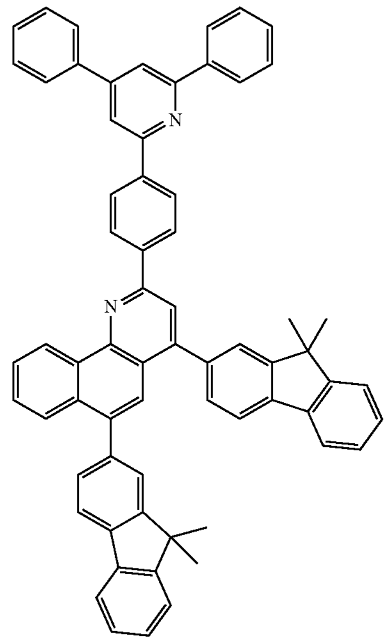
[Chemical Formula B101]
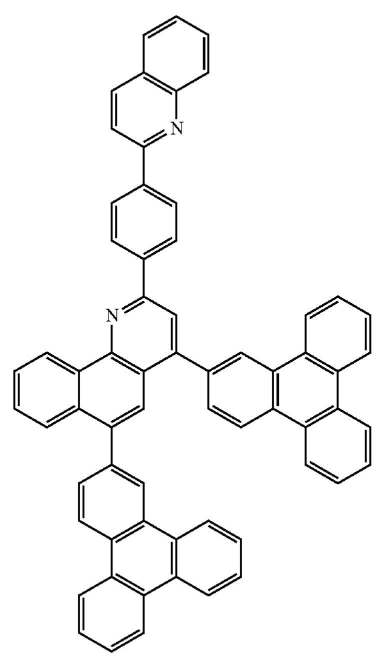

-continued
[Chemical Formula B102]
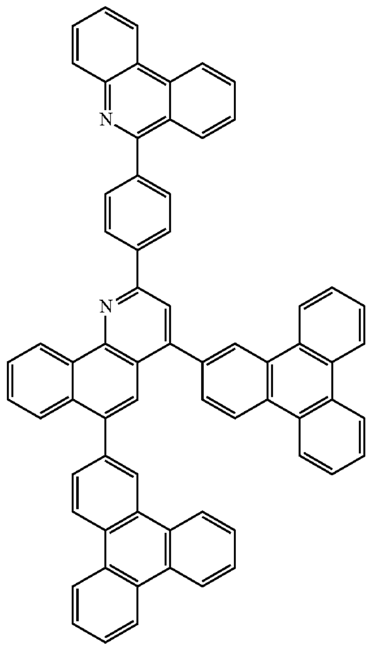
[Chemical Formula B103]
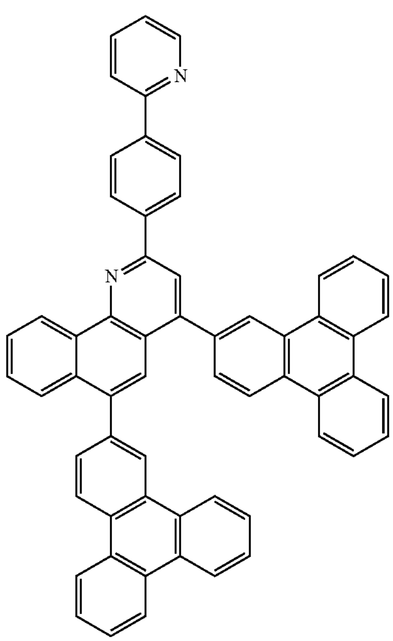
-continued
[Chemical Formula B104]
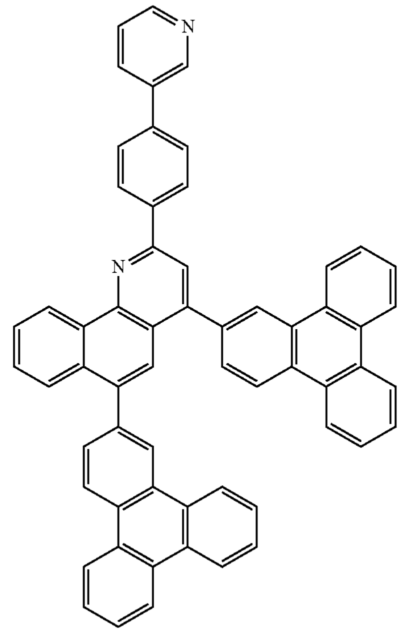
[Chemical Formula B105]
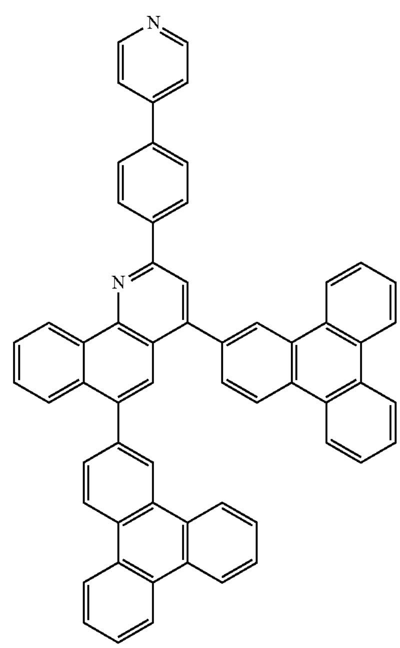

-continued
[Chemical Formula B106]
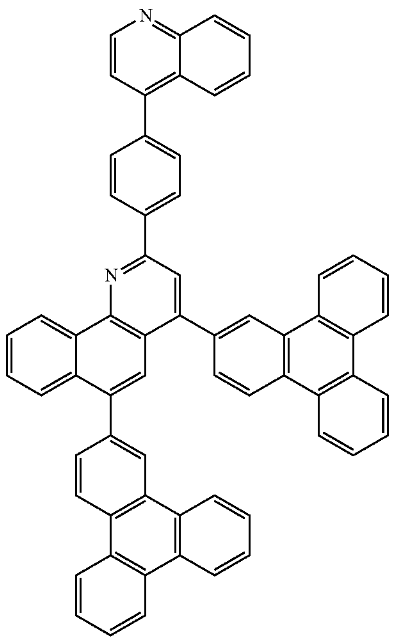
[Chemical Formula B107]
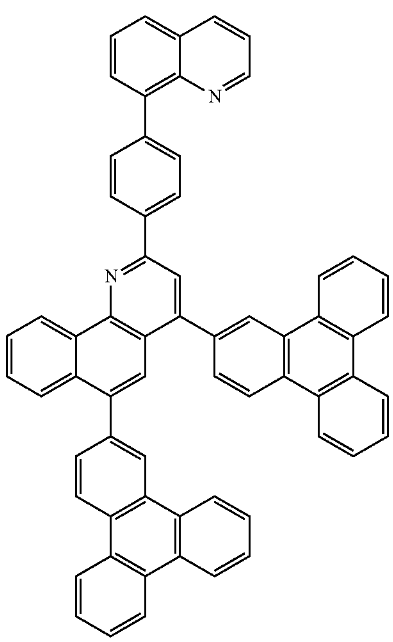
-continued
[Chemical Formula B108]
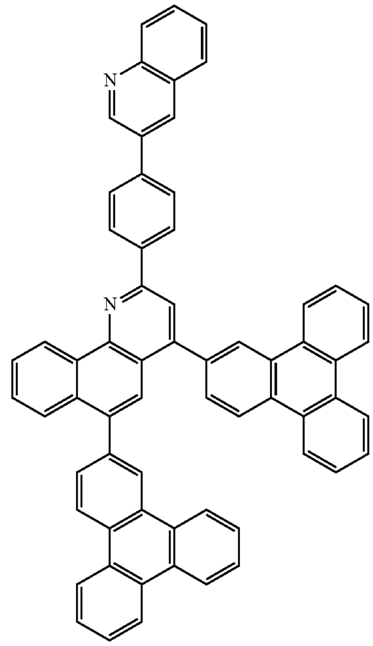
[Chemical Formula B109]
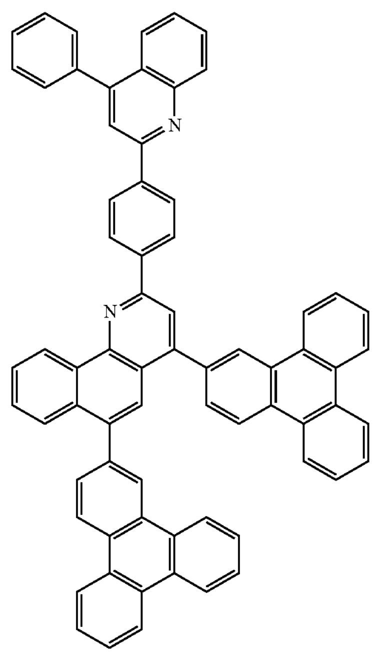

[Chemical Formula B110]
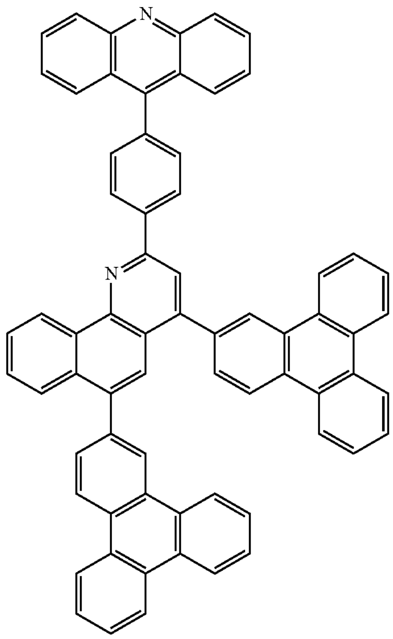
[Chemical Formula B111]
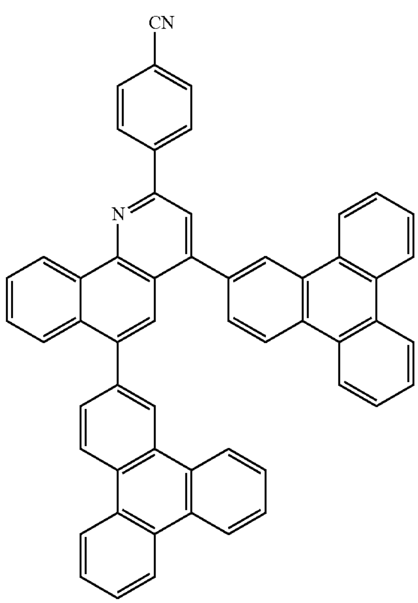
[Chemical Formula B112]
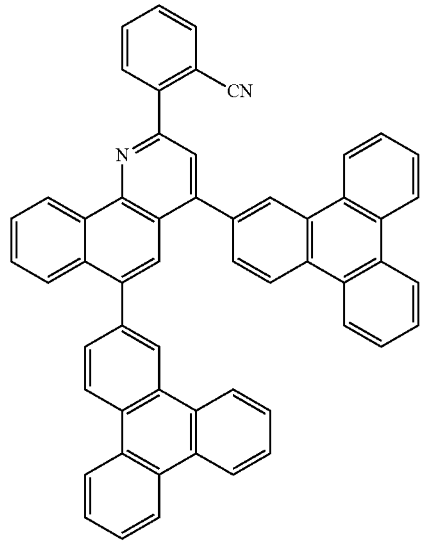
[Chemical Formula B113]
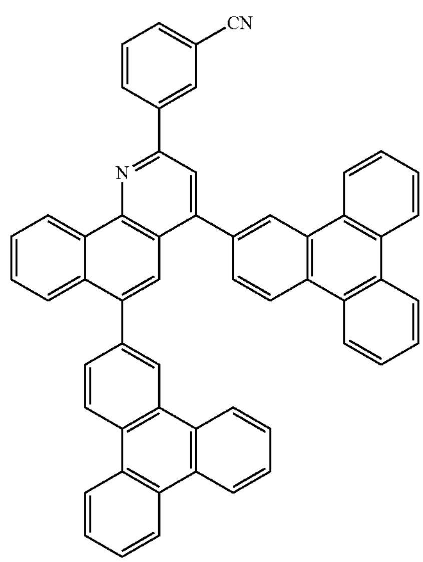

-continued
[Chemical Formula B114]
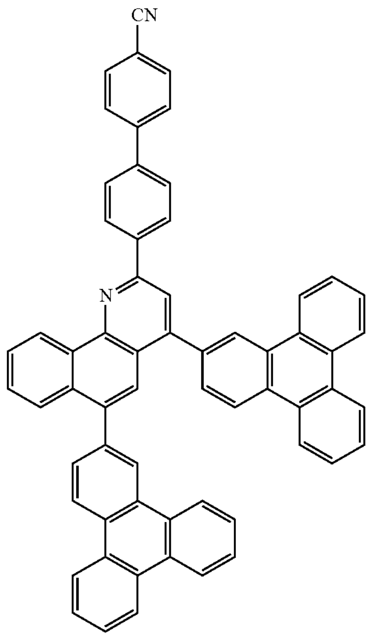
[Chemical Formula B115]
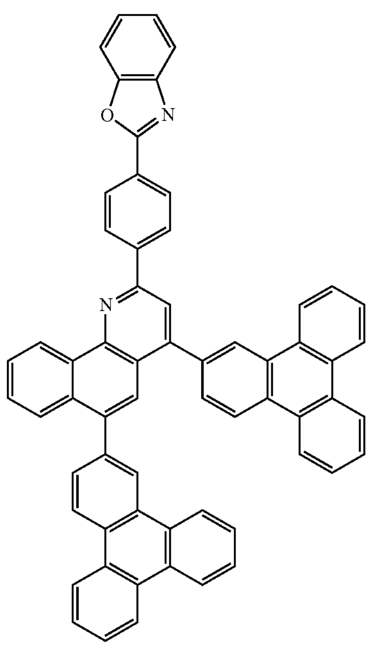
-continued
[Chemical Formula B116]
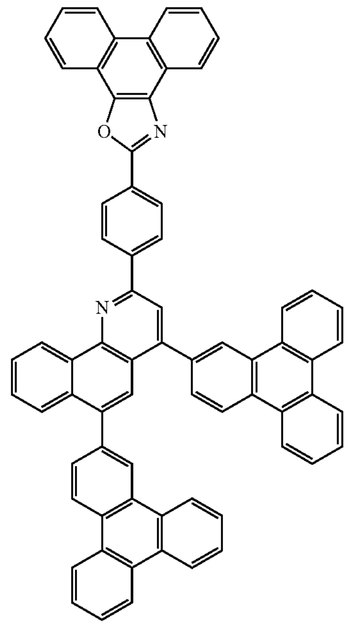
[Chemical Formula B117]
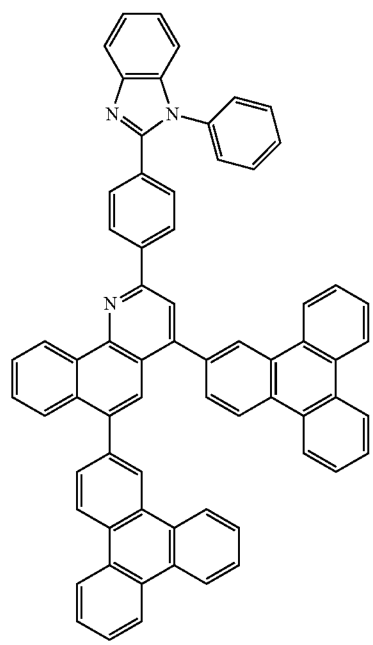

[Chemical Formula B118]
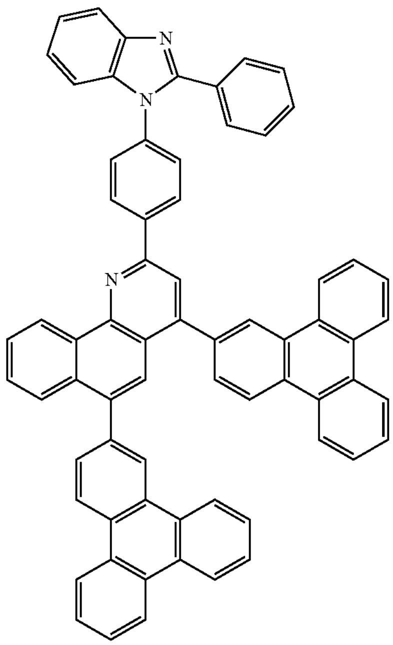
[Chemical Formula B119]
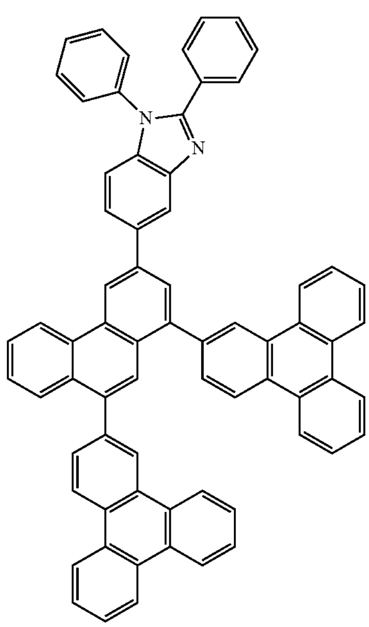
[Chemical Formula B120]
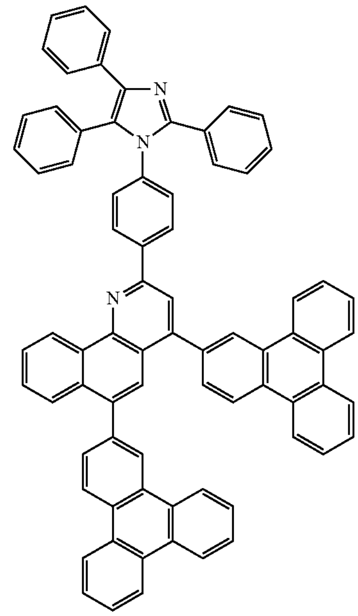
[Chemical Formula B121]
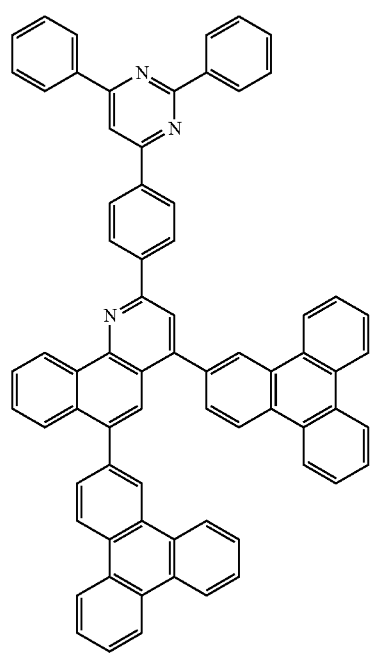

-continued
[Chemical Formula B122]
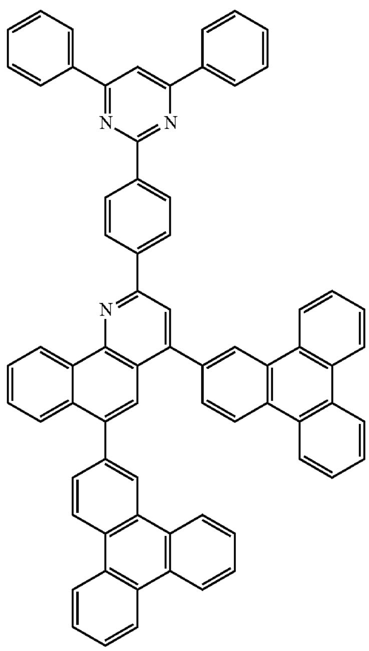
[Chemical Formula B123]
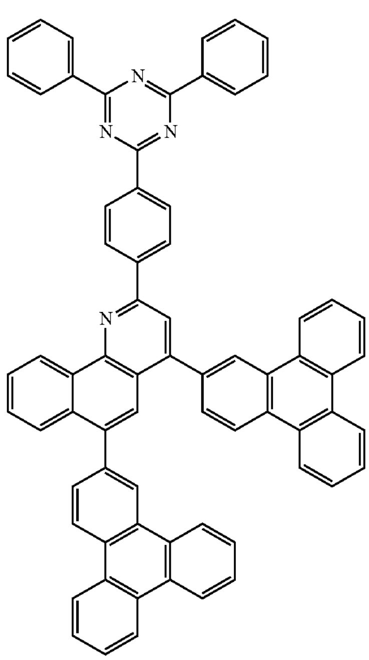
-continued
[Chemical Formula B124]
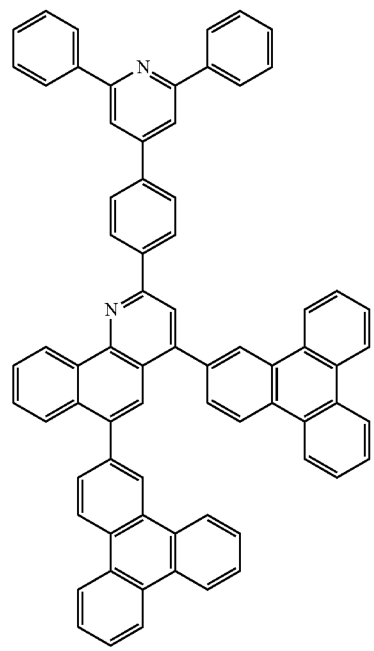
[Chemical Formula B125]
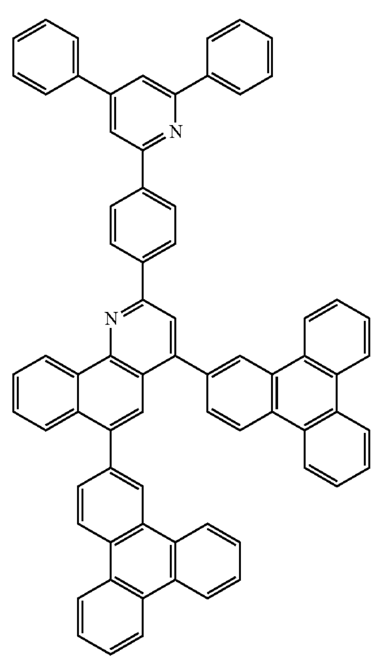

[Chemical Formula B126]
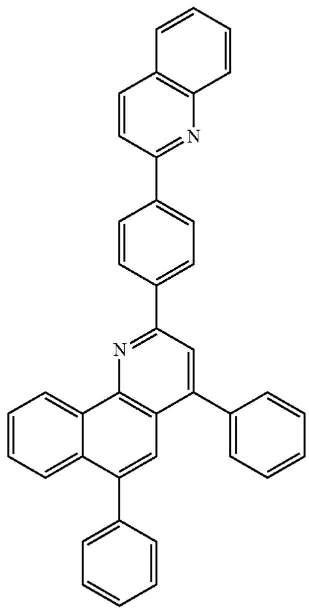
[Chemical Formula B127]
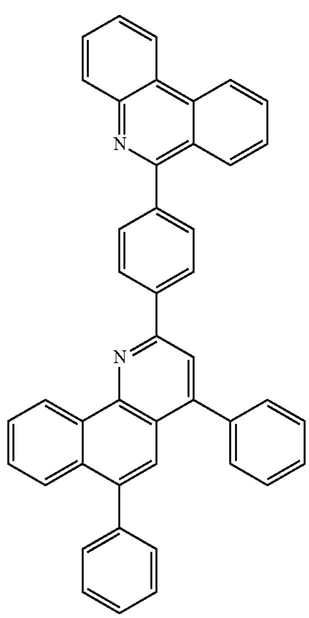
[Chemical Formula B128]
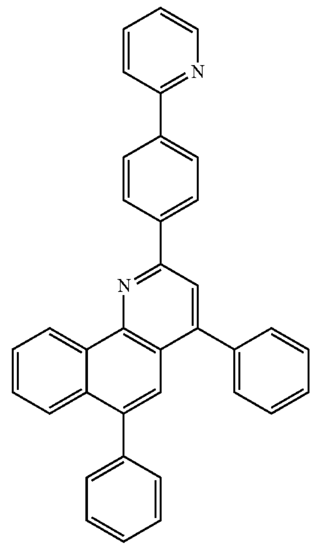
[Chemical Formula B129]
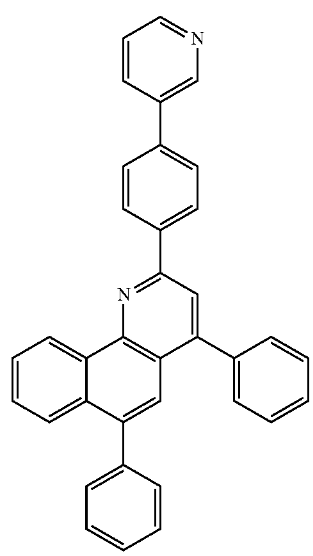

[Chemical Formula B130]
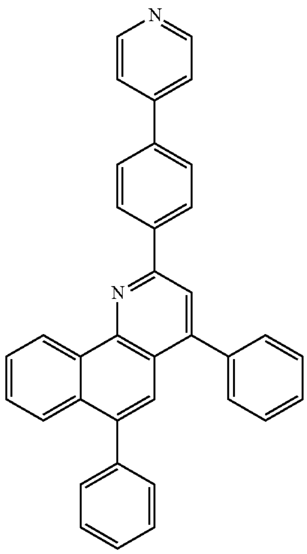
[Chemical Formula B131]
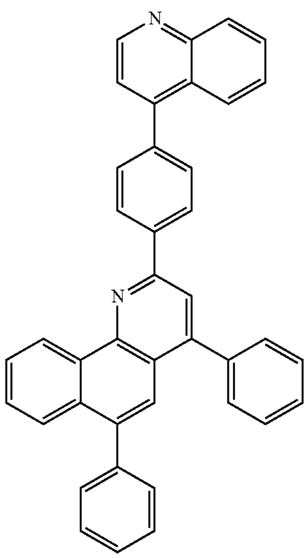
[Chemical Formula B132]
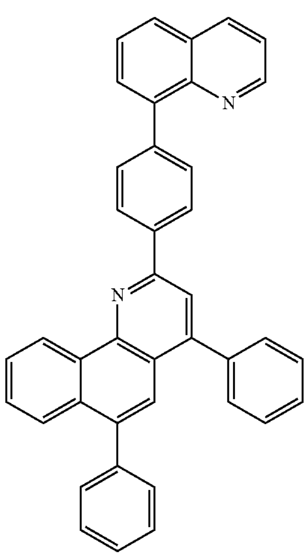
[Chemical Formula B133]
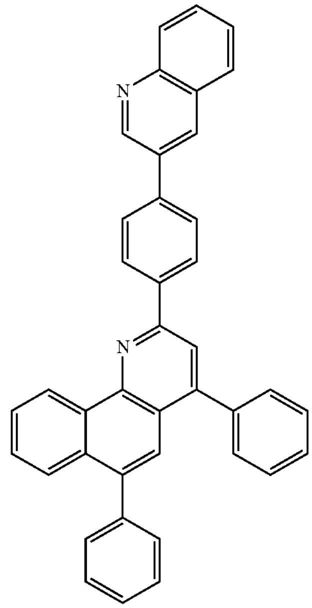
[Chemical Formula B134]
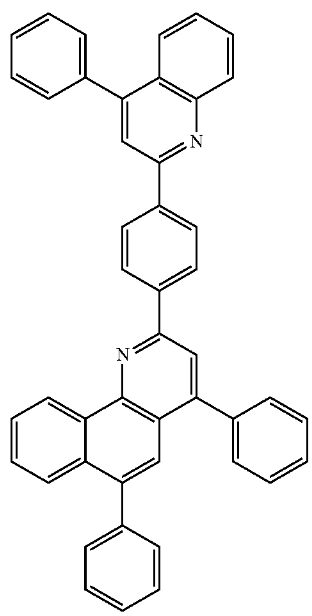

-continued
[Chemical Formula B135]
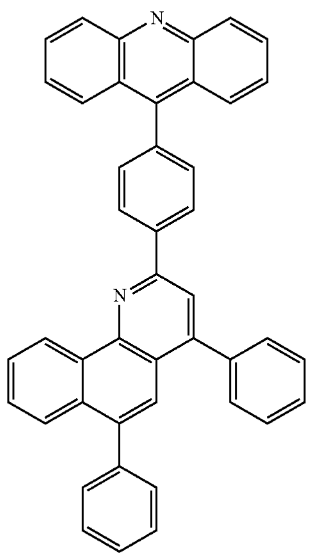
[Chemical Formula B136]
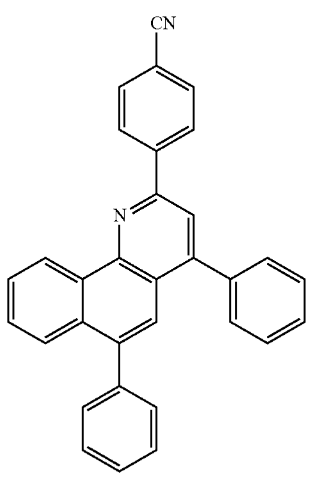
[Chemical Formula B137]
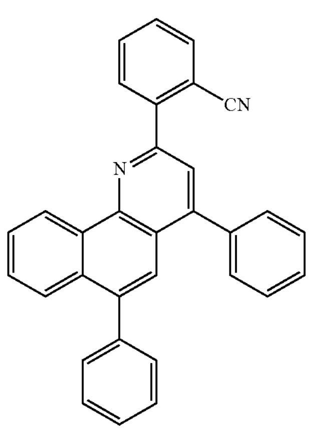
-continued
[Chemical Formula B138]
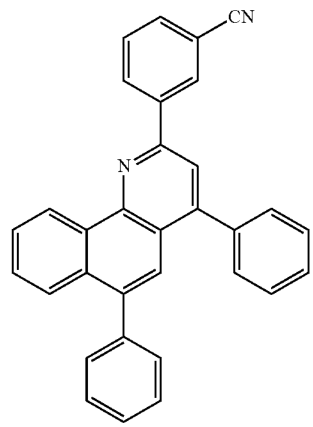
[Chemical Formula B139]
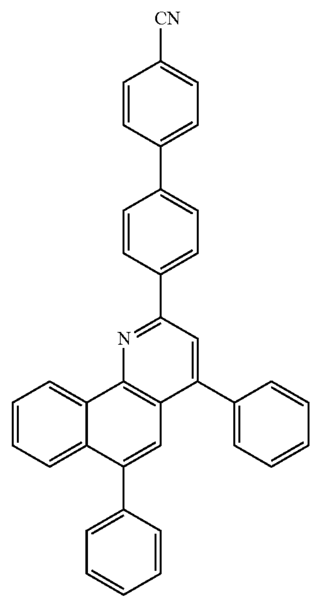
[Chemical Formula B140]
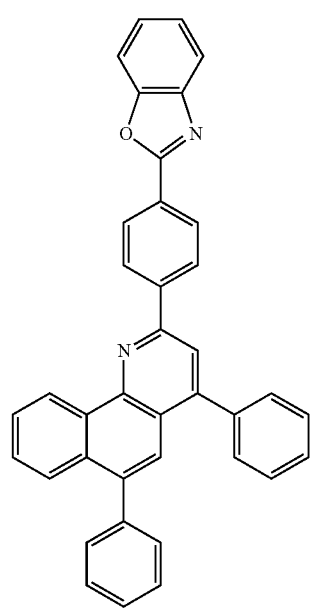

[Chemical Formula B141]
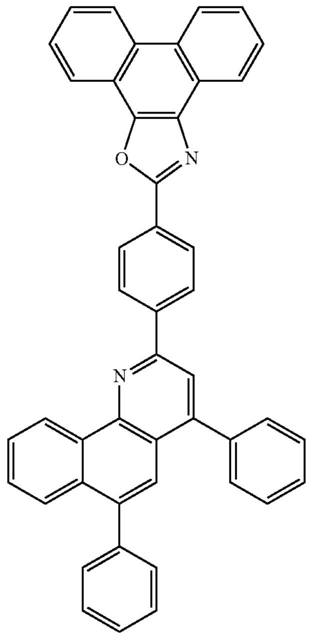
[Chemical Formula B142]
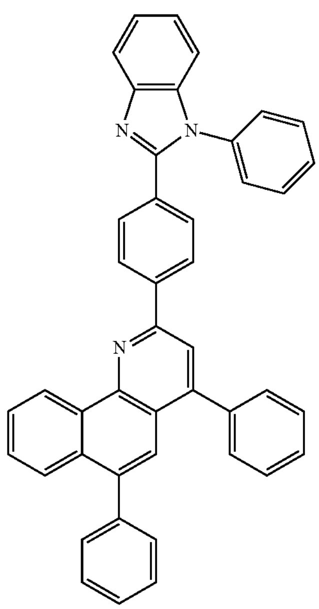
[Chemical Formula B143]
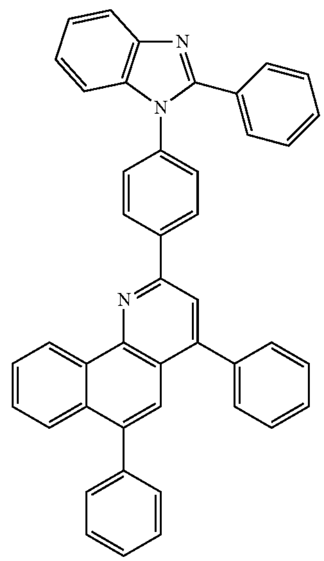
[Chemical Formula B144]
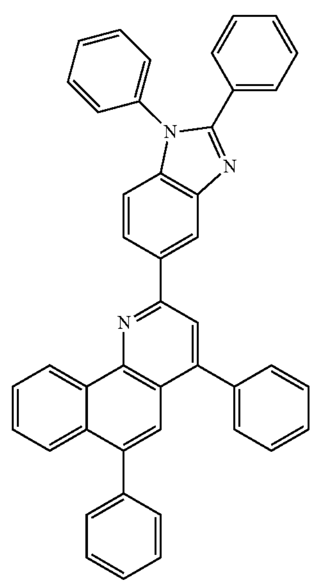

[Chemical Formula B145]
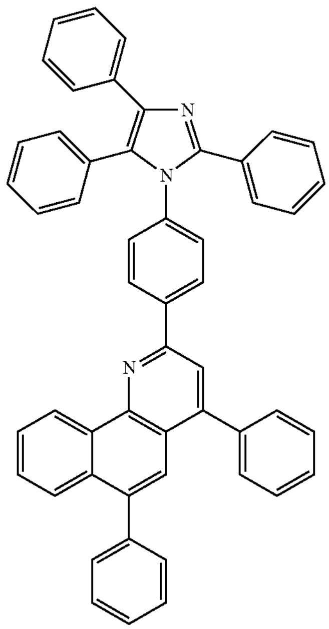
[Chemical Formula B146]
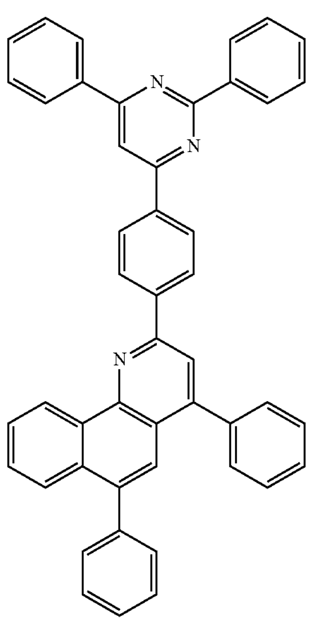
[Chemical Formula B147]
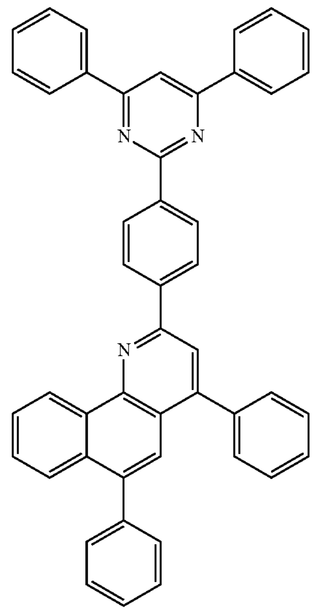
[Chemical Formula B148]
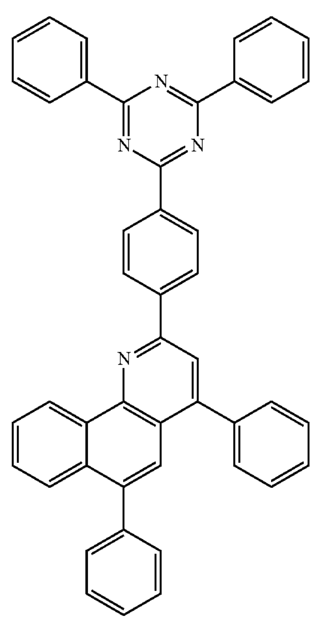

-continued
[Chemical Formula B149]
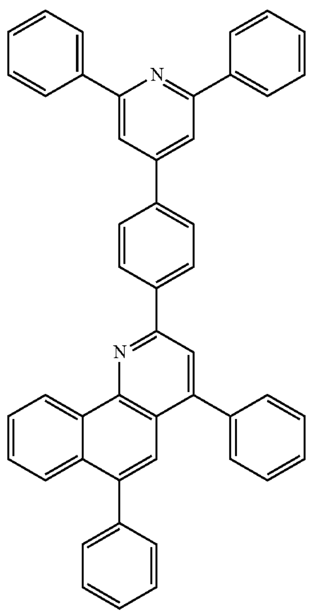
[Chemical Formula B150]
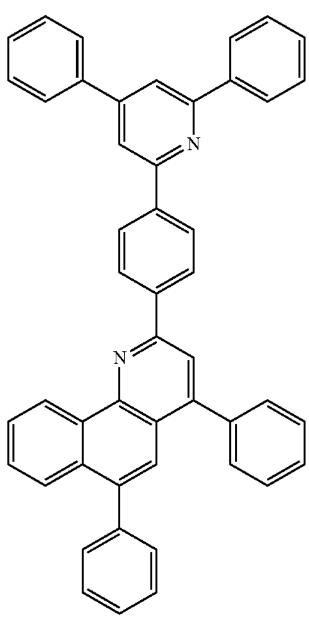
-continued
[Chemical Formula B151]
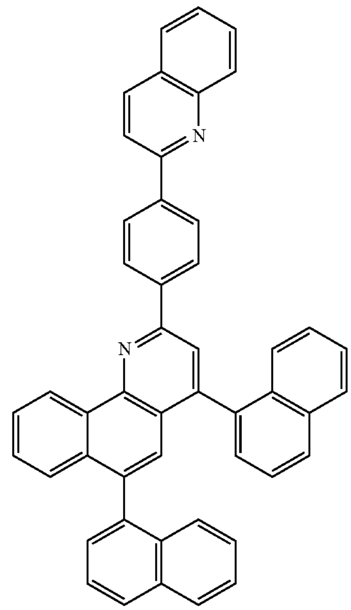
[Chemical Formula B152]
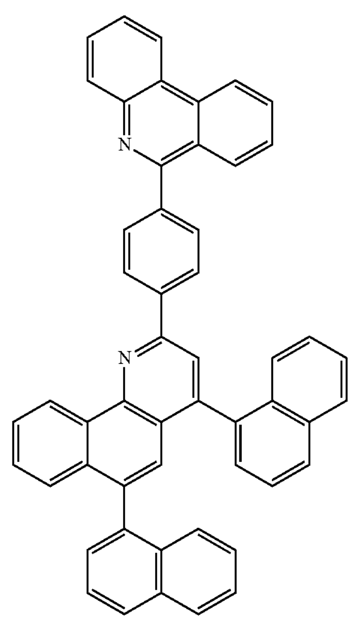

[Chemical Formula B153]
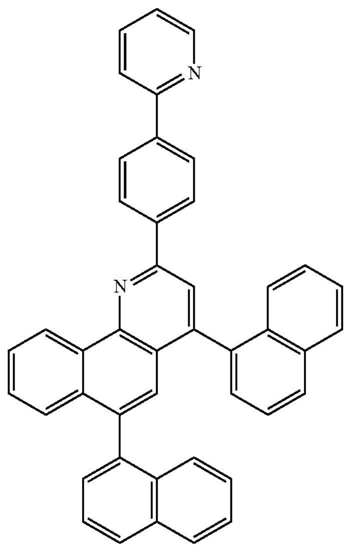
[Chemical Formula B154]
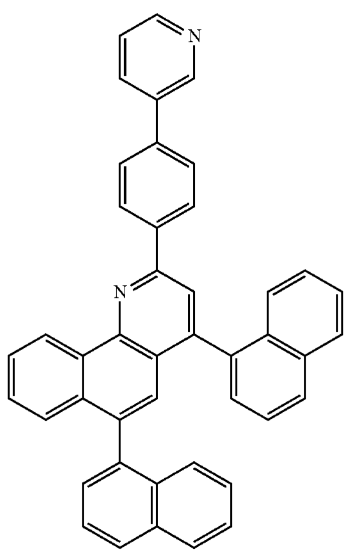
[Chemical Formula B155]
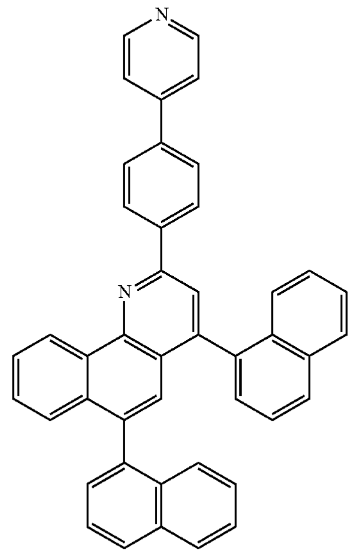
[Chemical Formula B156]
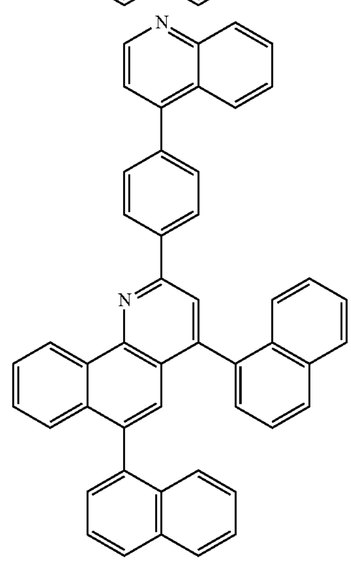
[Chemical Formula B157]
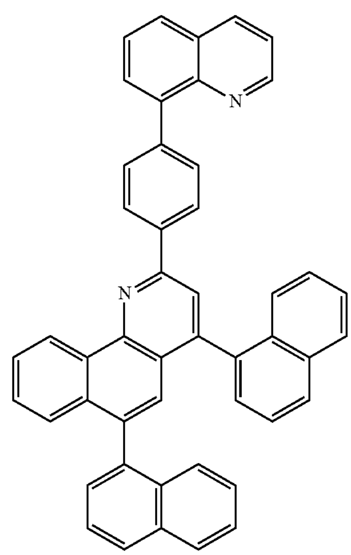

-continued
[Chemical Formula B158]
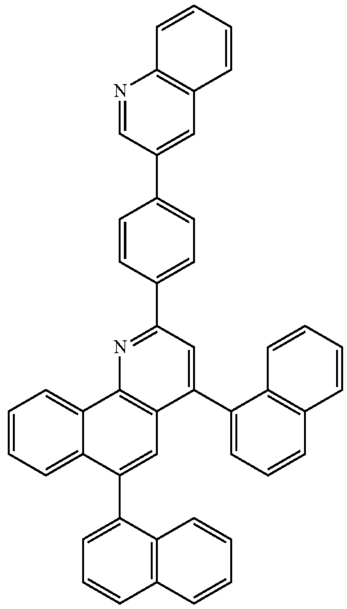
[Chemical Formula B159]
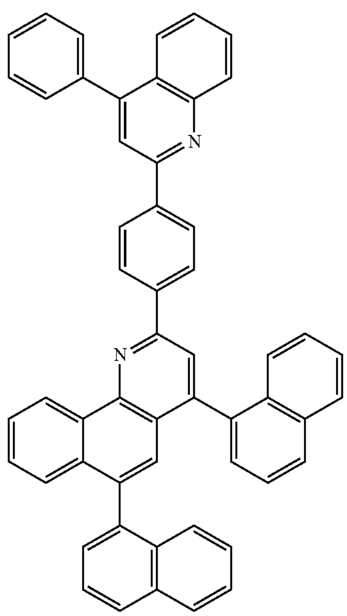
-continued
[Chemical Formula B160]
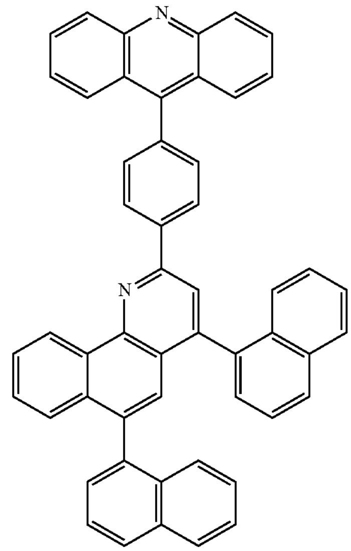
[Chemical Formula B161]
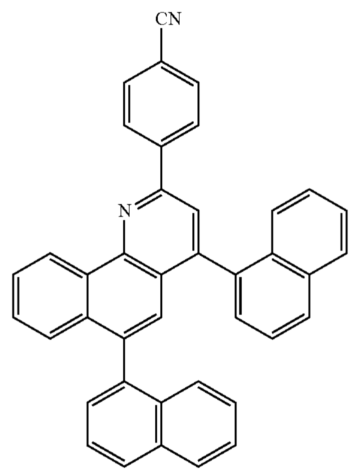
[Chemical Formula B162]
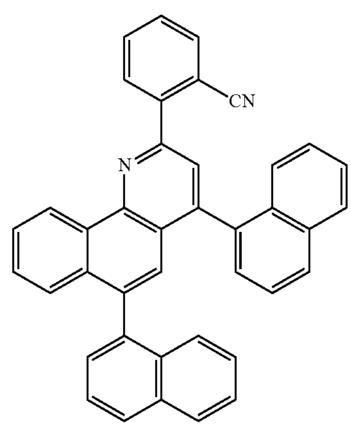

[Chemical Formula B163]
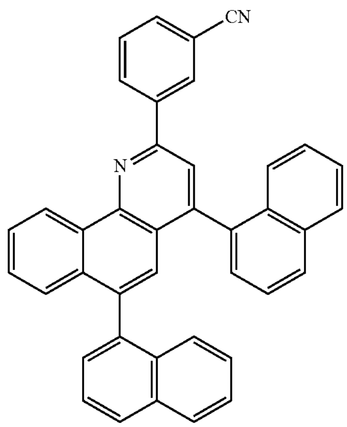
[Chemical Formula B164]
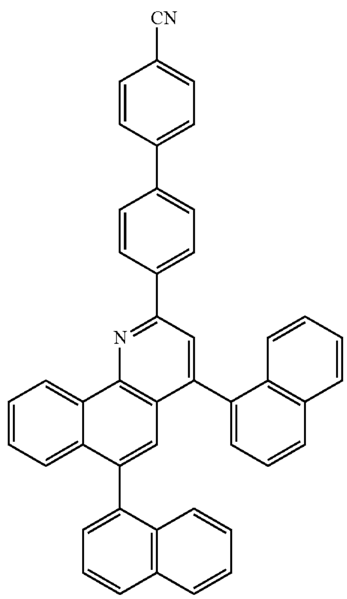
[Chemical Formula B165]
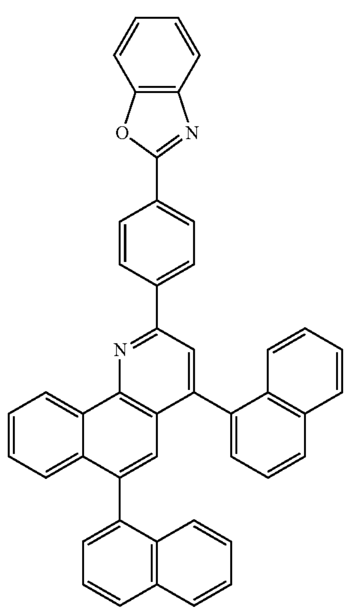
[Chemical Formula B166]
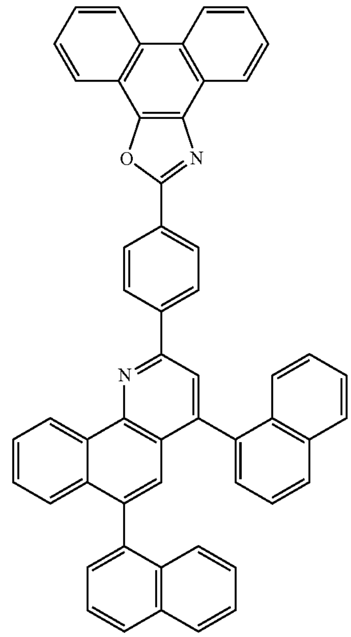
[Chemical Formula B167]
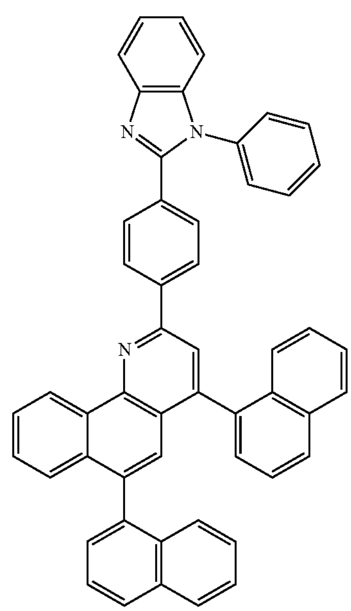

-continued
[Chemical Formula B168]
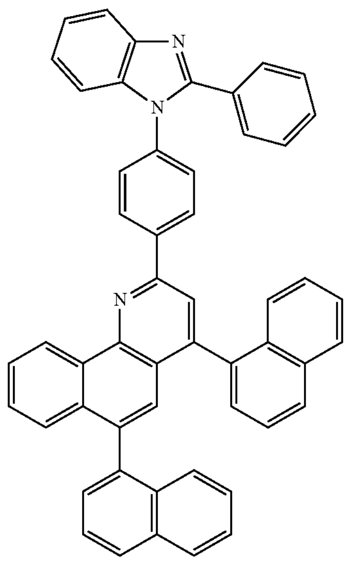
[Chemical Formula B169]
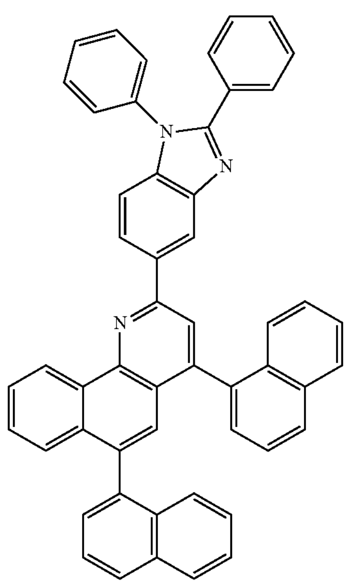
-continued
[Chemical Formula B170]
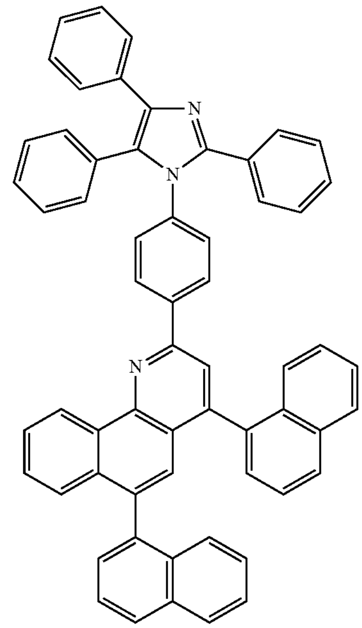
[Chemical Formula B171]
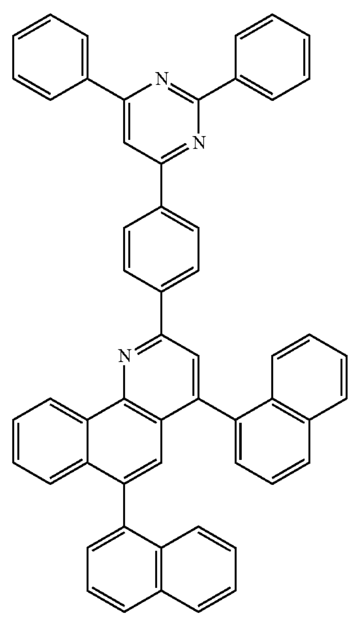

-continued
[Chemical Formula B172]
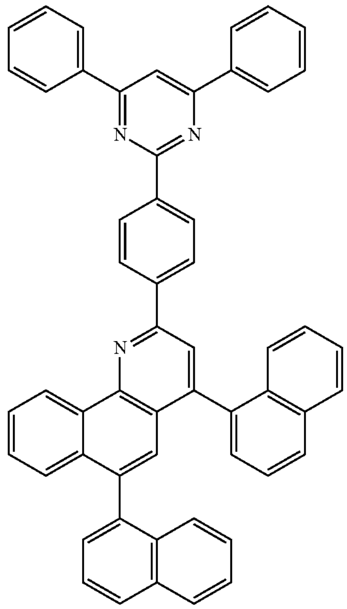
[Chemical Formula B173]
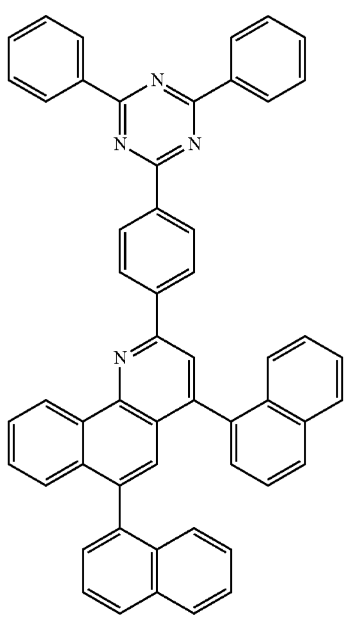
-continued
[Chemical Formula B174]
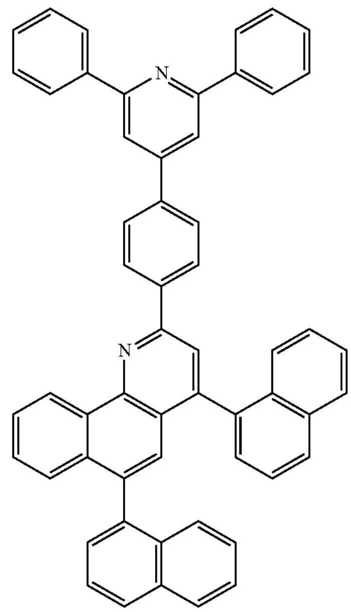
[Chemical Formula B175]
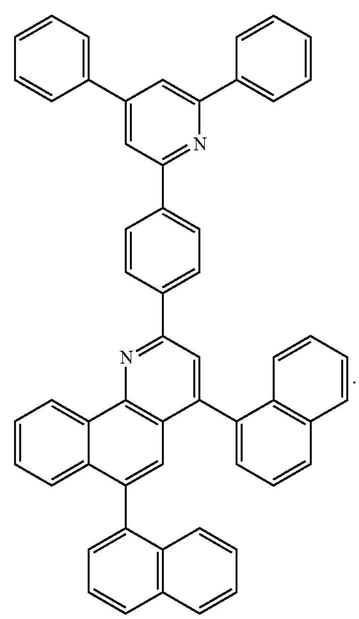
The embodiments may also be realized by providing a compound for an organic optoelectronic device, the compound being represented by one of the following Chemical Formulae C1 to C173:

-continued
[Chemical Formula C1]
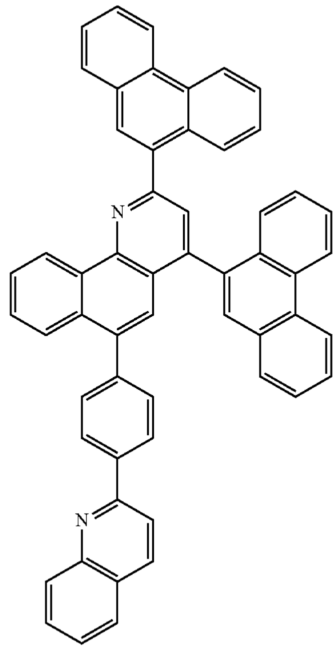
[Chemical Formula C2]
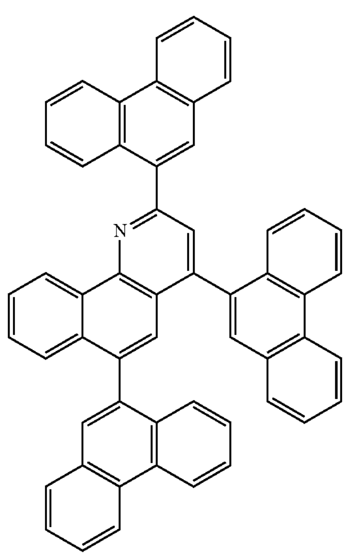
[Chemical Formula C3]
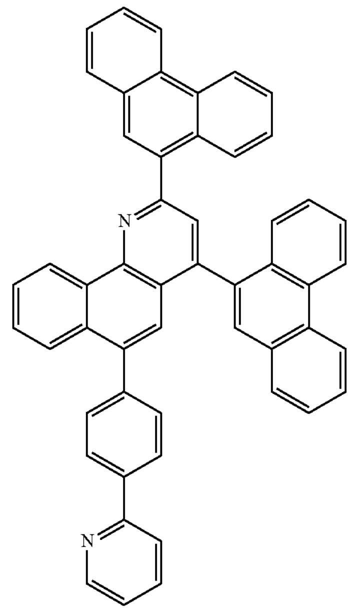 [SMILES: c1ccc(-c2ccc(-c3cc4c(-c5cc6ccccc6c6ccccc56)cc(-c5cc6ccccc6c6ccccc56)nc4c4ccccc34)cc2)nc1]
[Chemical Formula C4]
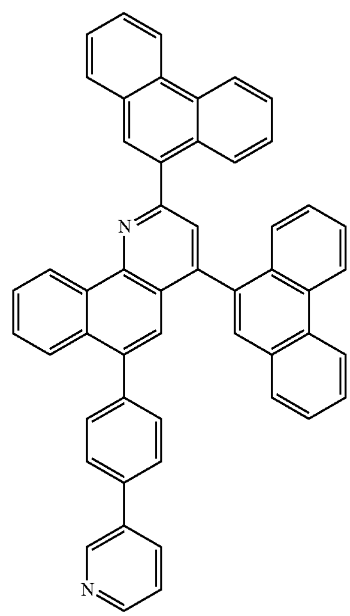

-continued
[Chemical Formula C5]
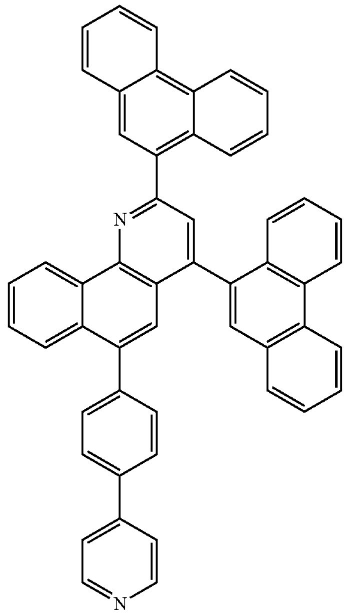
[Chemical Formula C6]
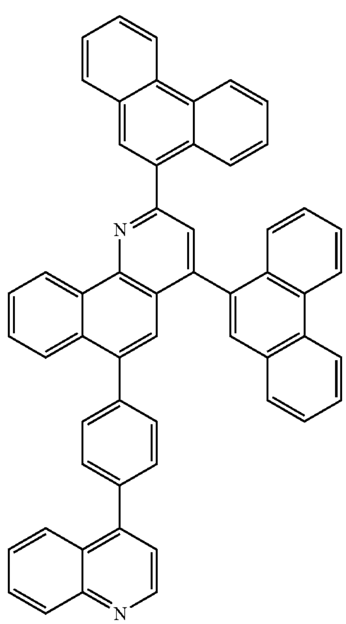
-continued
[Chemical Formula C7]
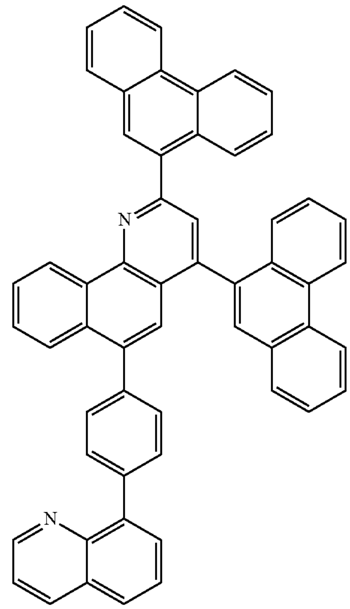
[Chemical Formula C8]
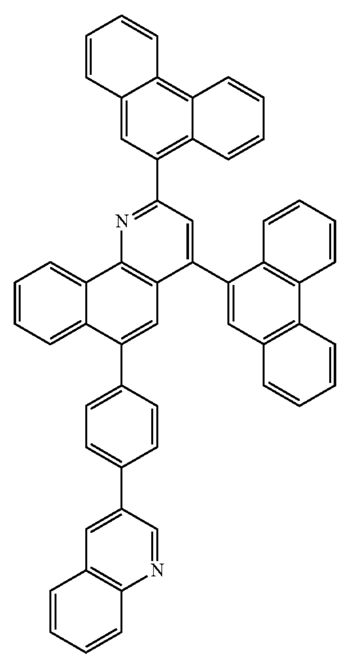

-continued
[Chemical Formula C9]
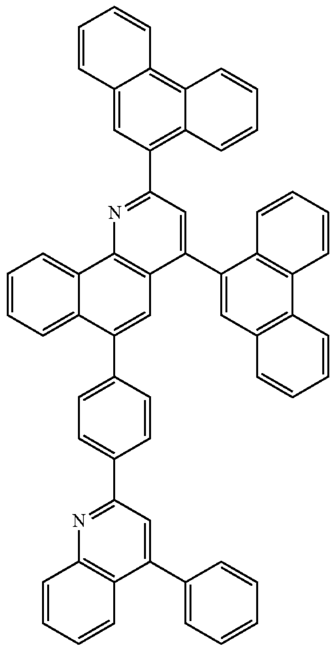
[Chemical Formula C10]
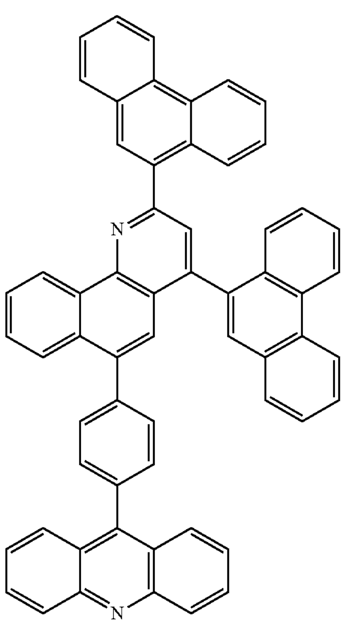
-continued
[Chemical Formula C11]
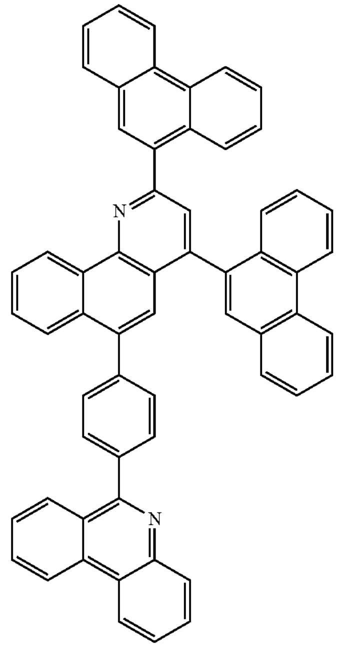
[Chemical Formula C12]
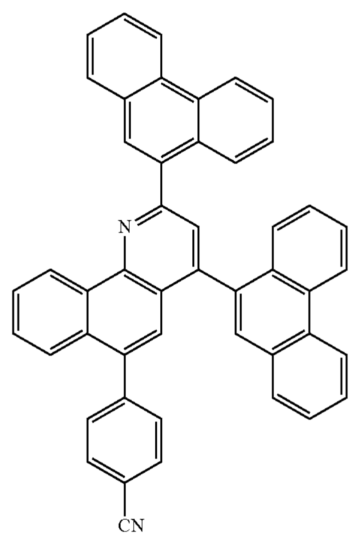
[Chemical Formula C13]
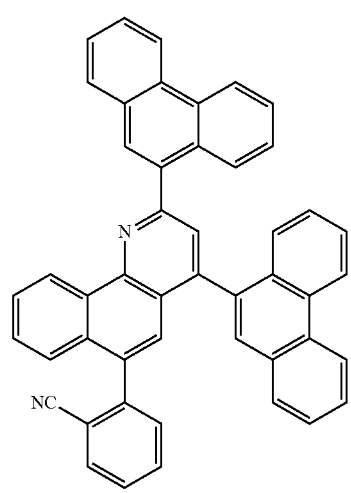

[Chemical Formula C14]
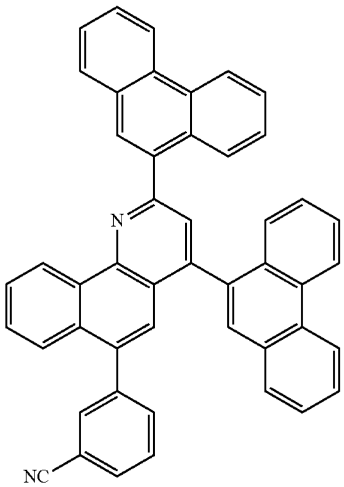
[Chemical Formula C15]
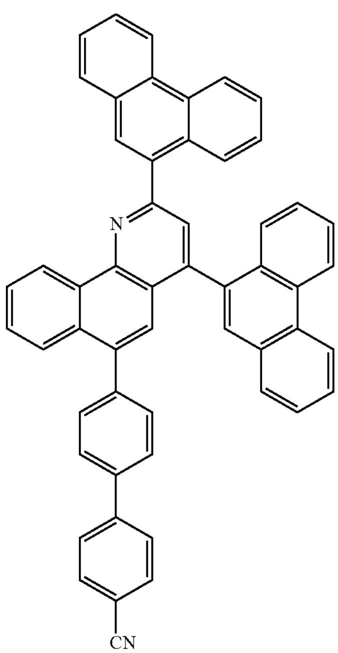
[Chemical Formula C16]
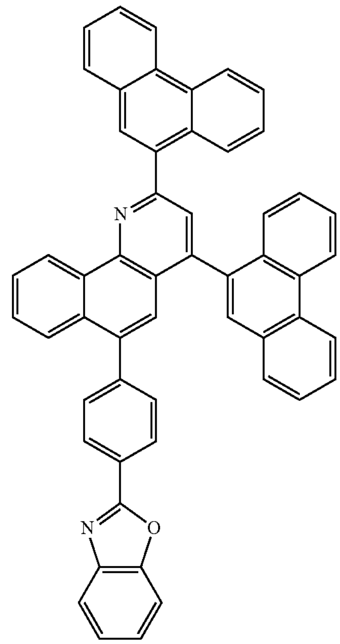
[Chemical Formula C17]
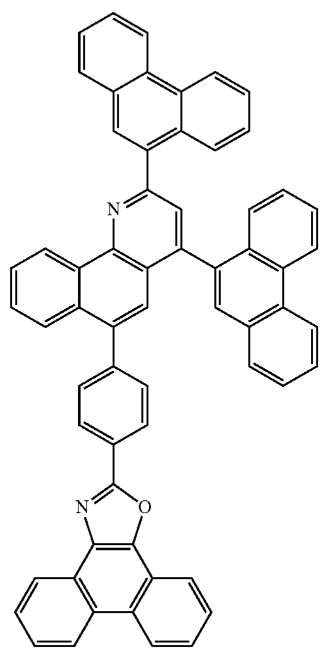

-continued
[Chemical Formula C18]
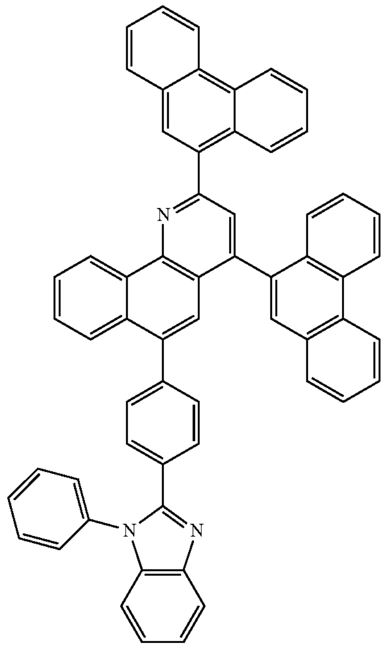
[Chemical Formula C19]
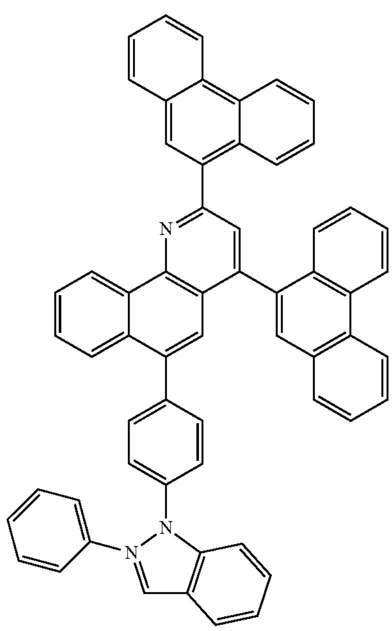
-continued
[Chemical Formula C20]
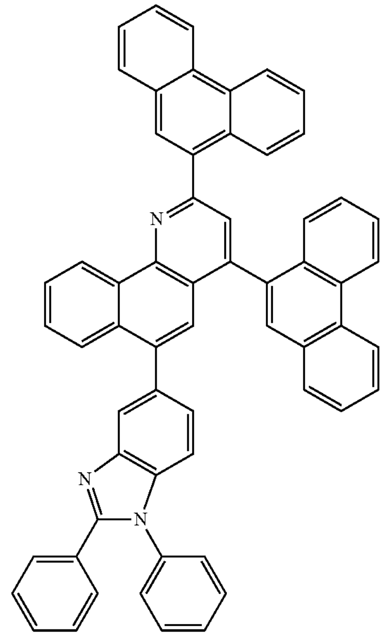
[Chemical Formula C21]
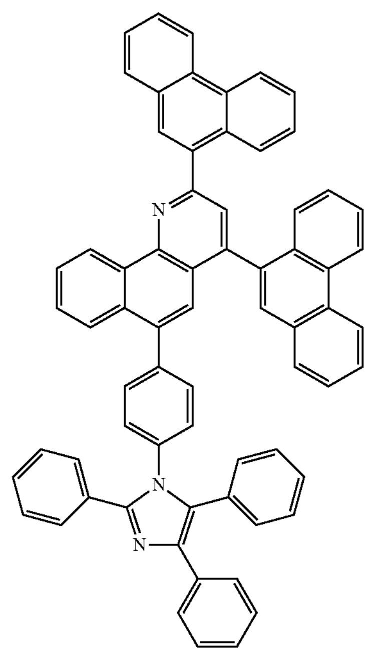

-continued
[Chemical Formula C22]
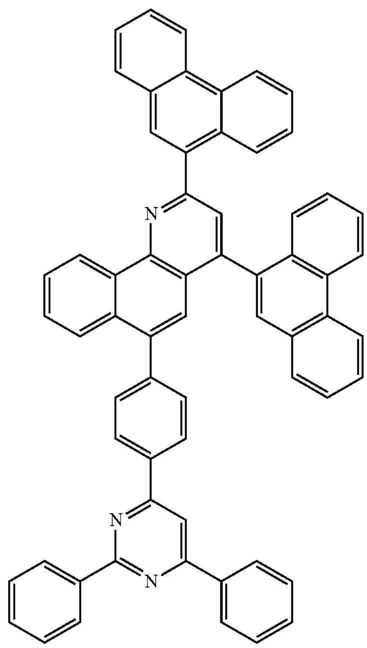
[Chemical Formula 23]
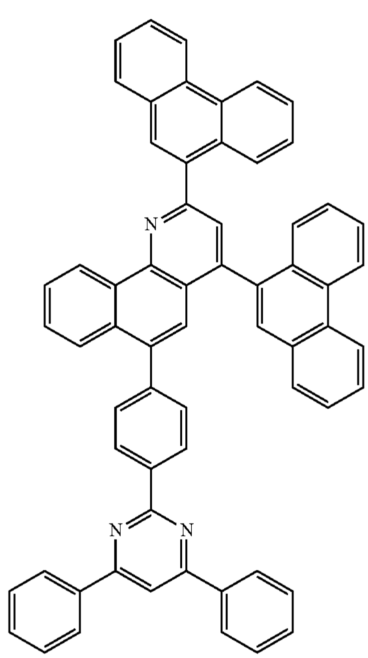
-continued
[Chemical Formula 24]
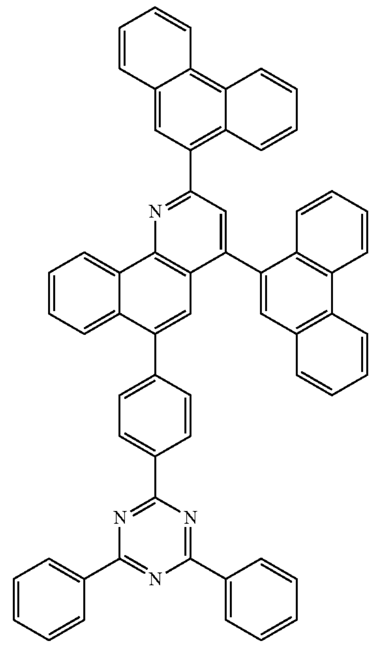
[Chemical Formula C25]
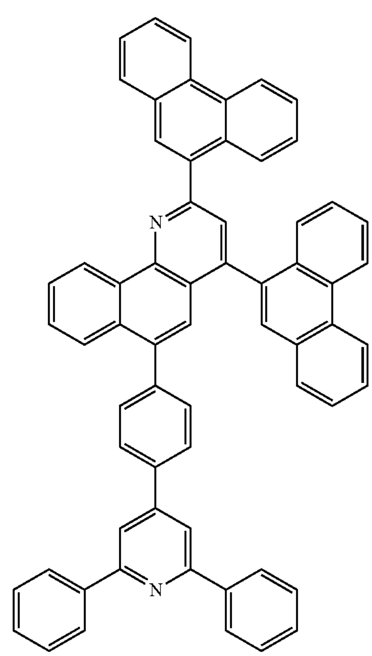

[Chemical Formula C26]
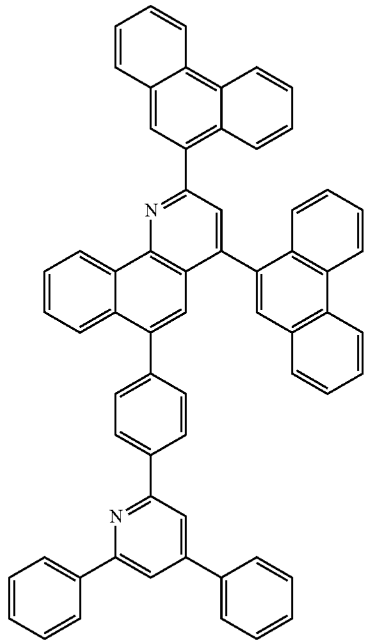
[Chemical Formula C27]
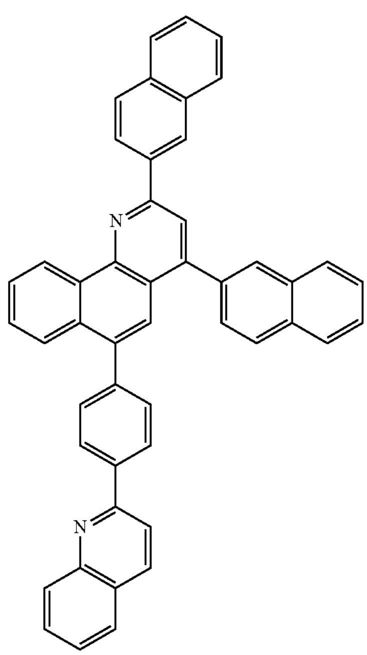
[Chemical Formula C28]
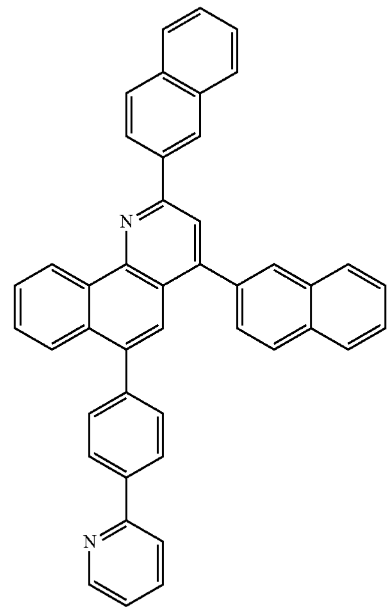
[Chemical Formula C29]
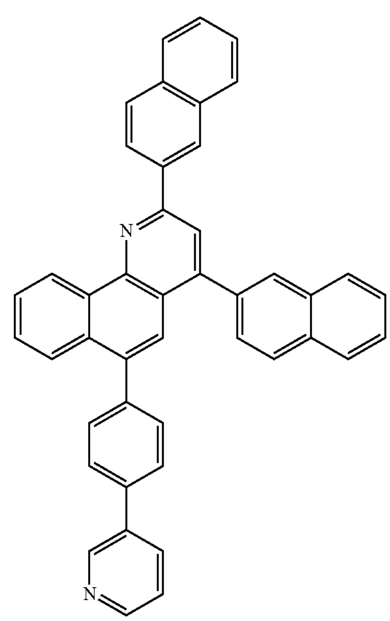

[Chemical Formula C30]
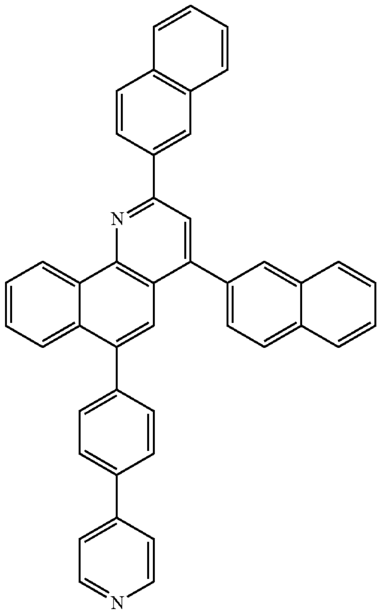
[Chemical Formula C31]
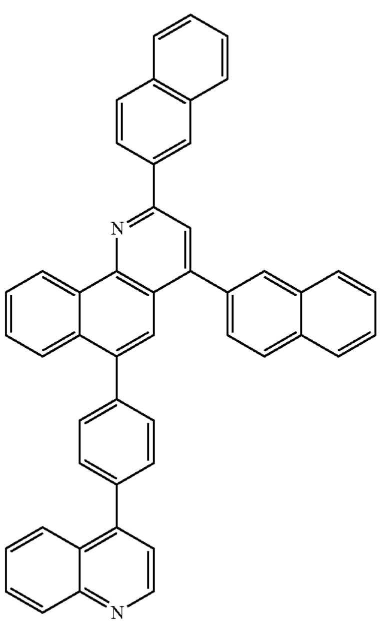
[Chemical Formula C32]
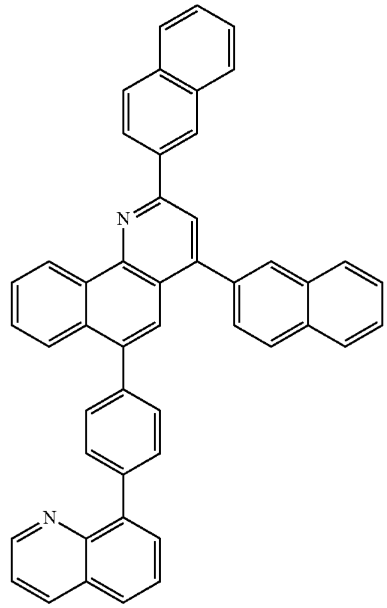
[Chemical Formula C33]
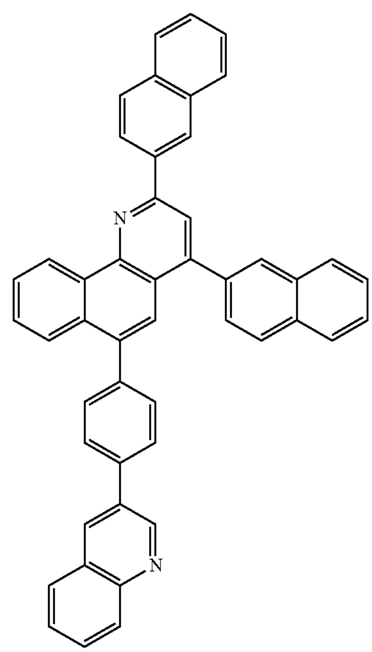

[Chemical Formula C34]
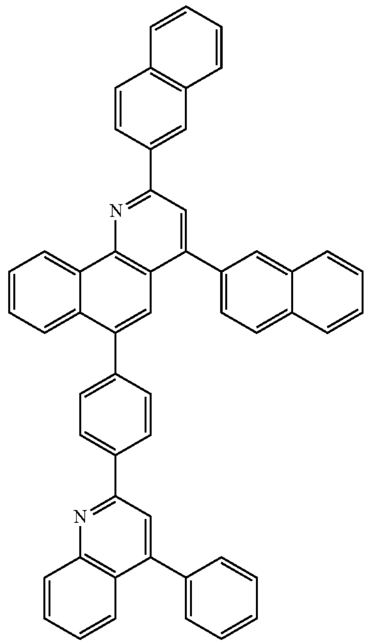
[Chemical Formula C35]
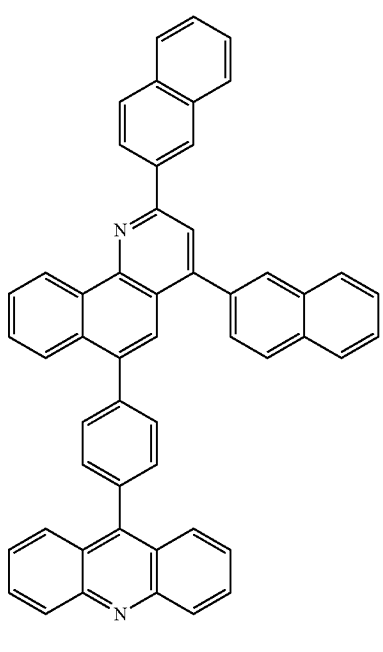
[Chemical Formula C36]
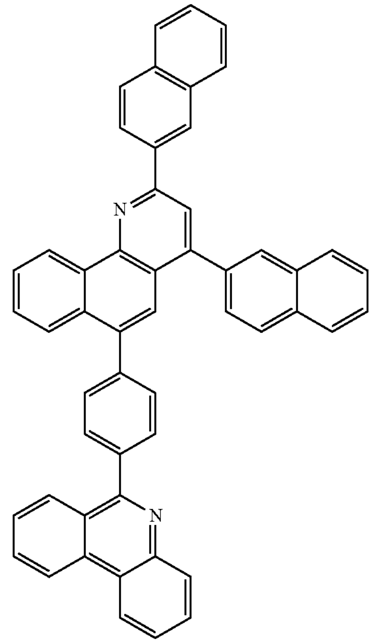
[Chemical Formula C37]
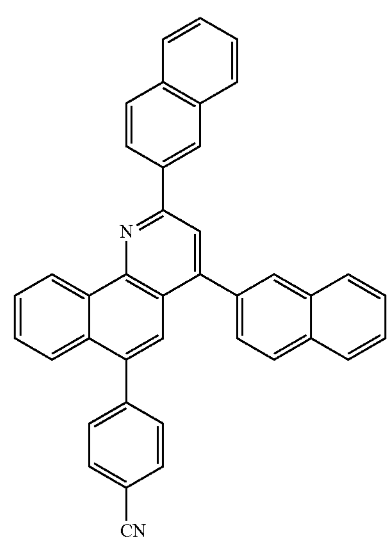

-continued
[Chemical Formula C38]
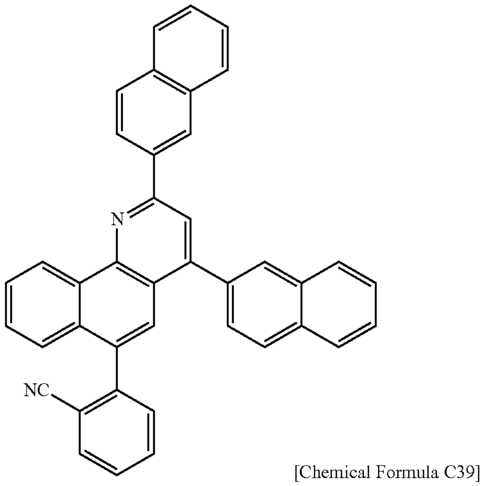
[Chemical Formula C39]
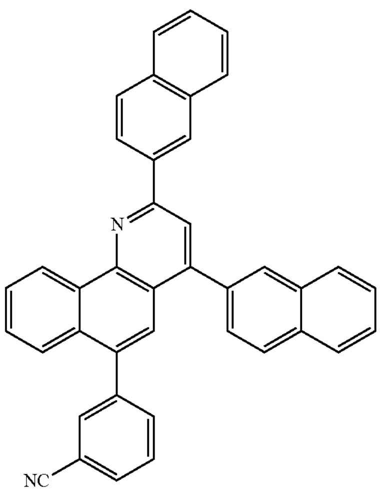
[Chemical Formula C40]
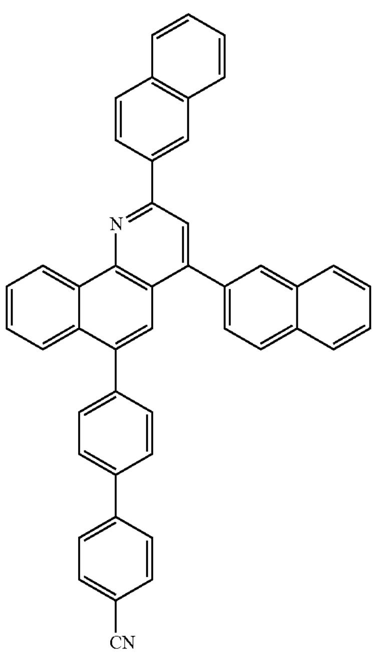
-continued
[Chemical Formula C41]
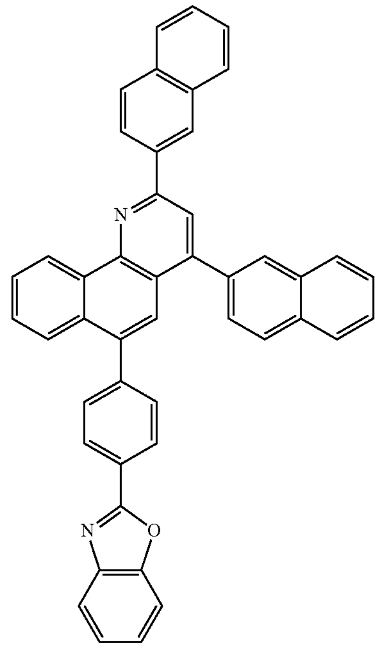
[Chemical Formula C42]
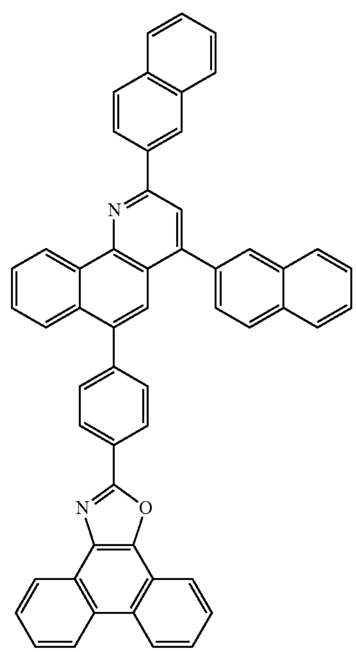

-continued
[Chemical Formula C43]
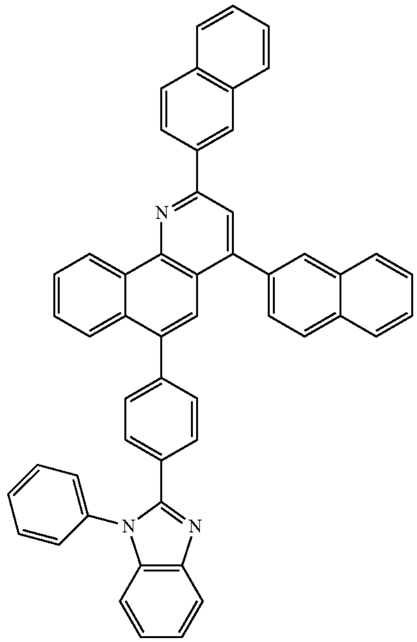
[Chemical Formula C44]
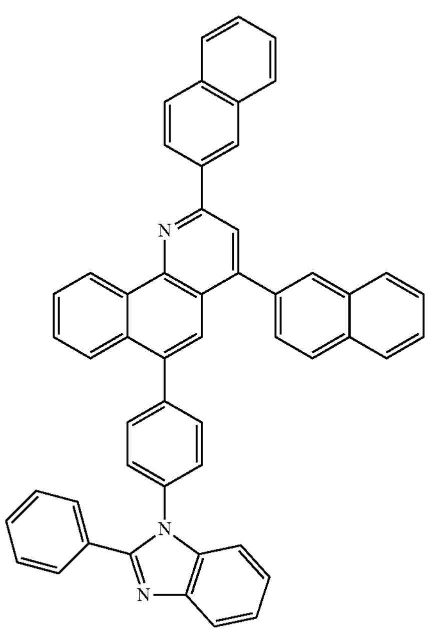
-continued
[Chemical Formula C45]
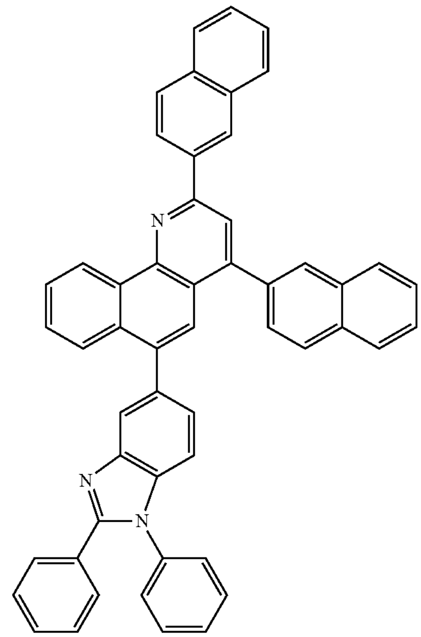
[Chemical Formula C46]
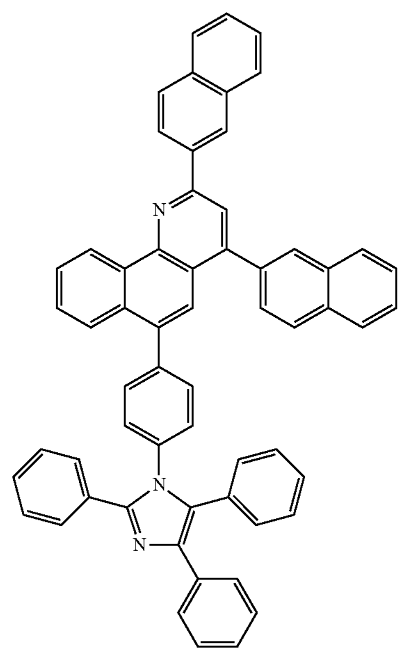

-continued
[Chemical Formula C47]
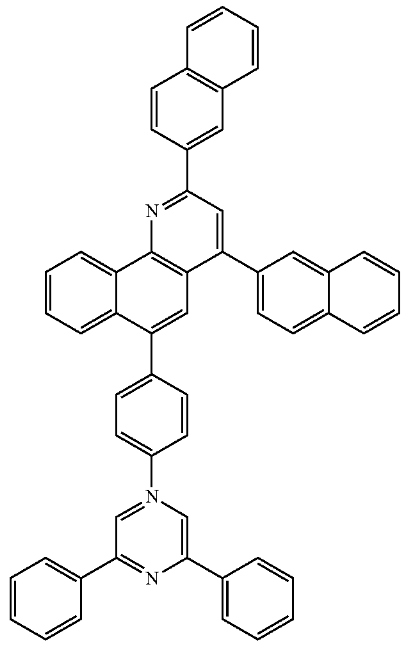
[Chemical Formula C48]
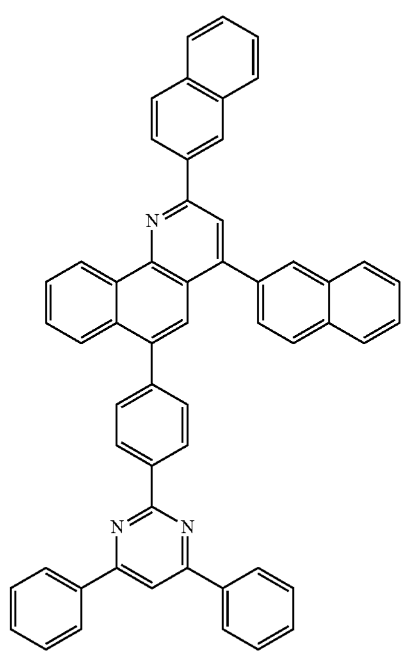
-continued
[Chemical Formula C49]
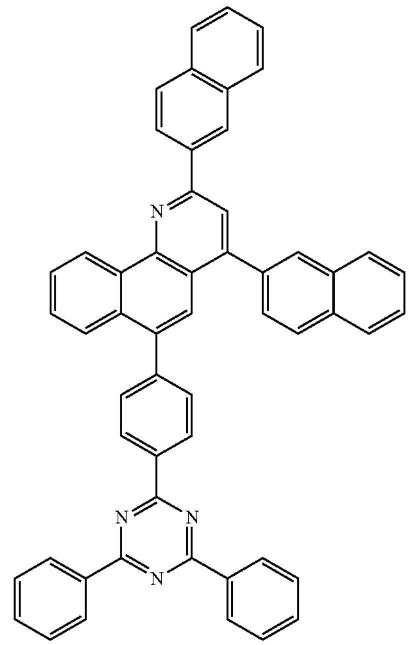
[Chemical Formula C50]
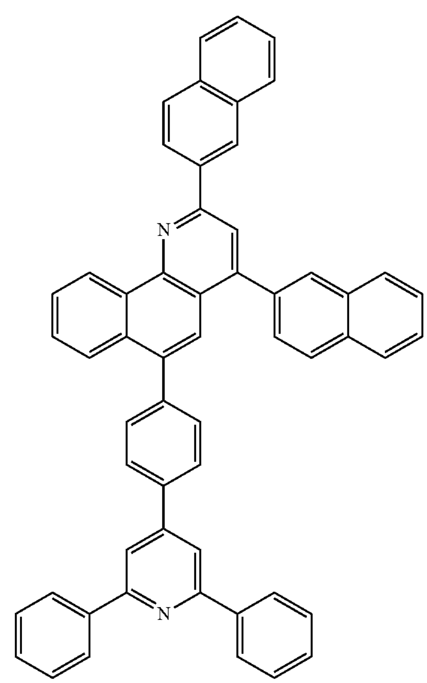

-continued
[Chemical Formula C51]
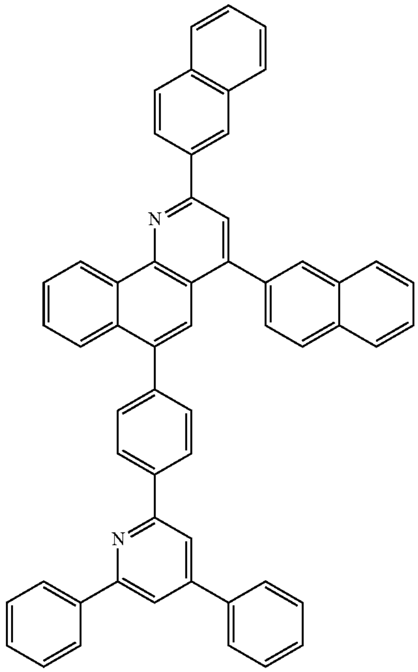
[Chemical Formula C52]
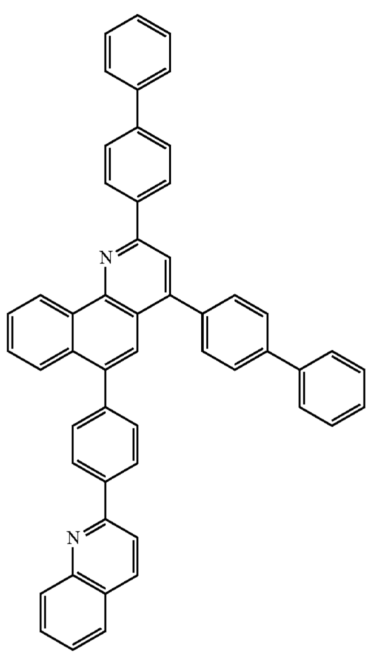
-continued
[Chemical Formula C53]
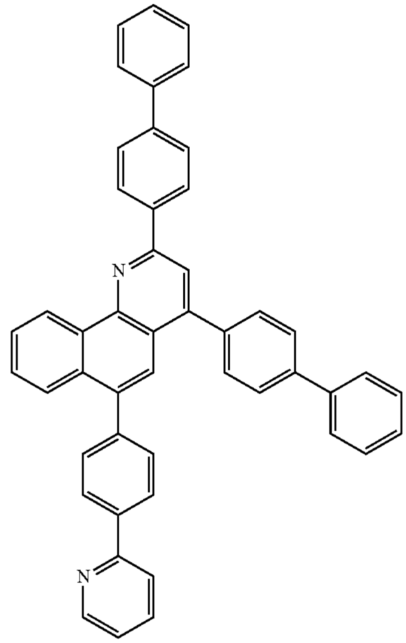
[Chemical Formula C54]
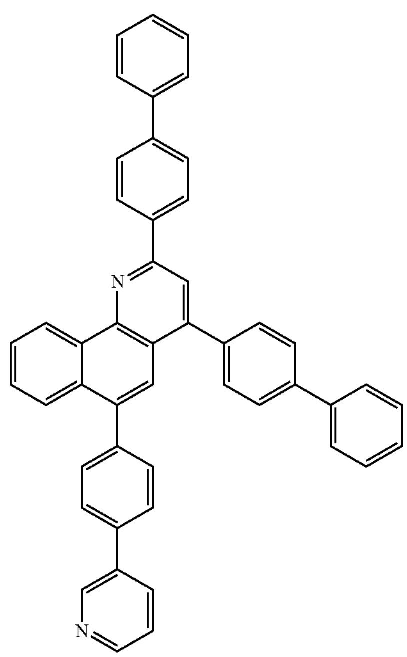

-continued
[Chemical Formula C55]
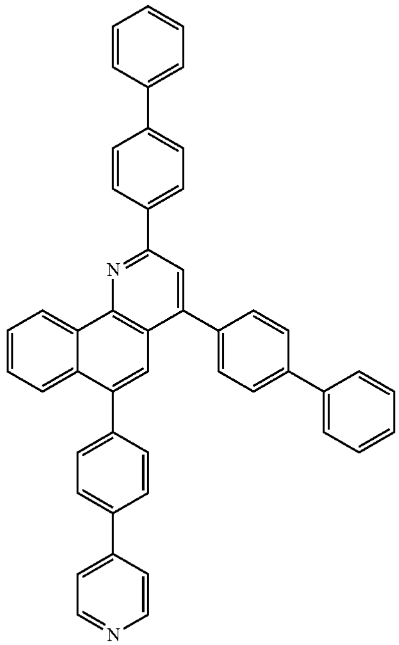
[Chemical Formula C56]
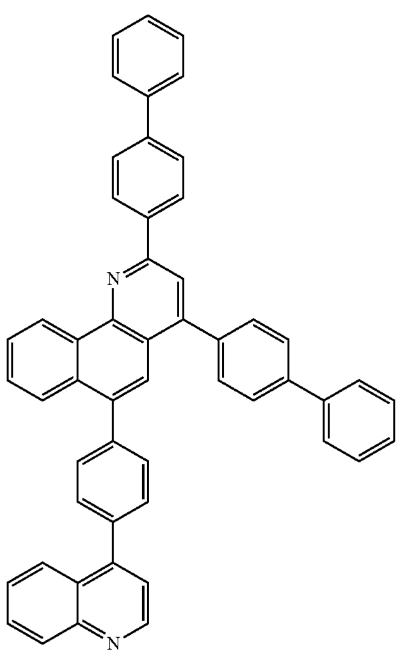
-continued
[Chemical Formula C57]
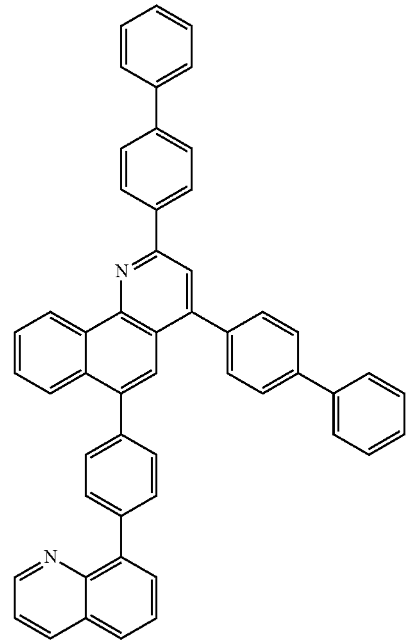
[Chemical Formula C58]
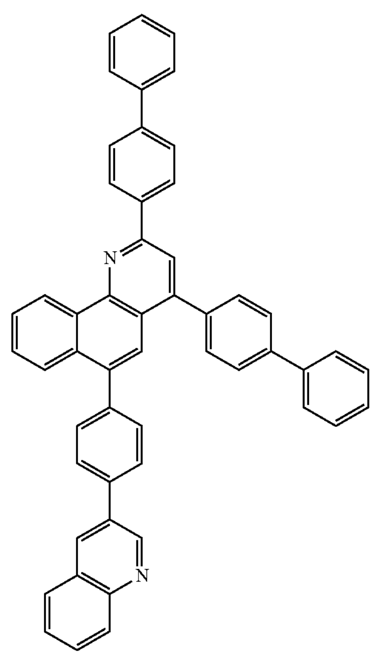

-continued
[Chemical Formula C59]
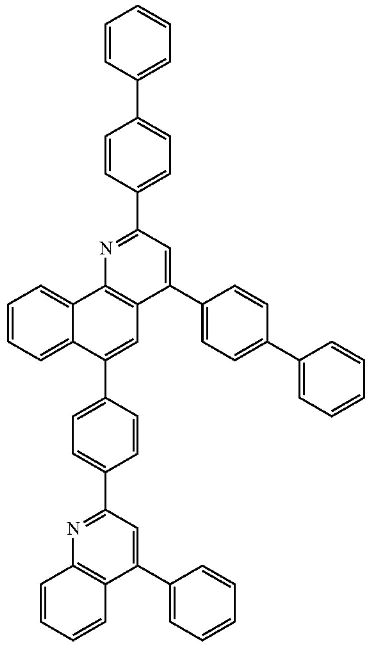
[Chemical Formula C60]
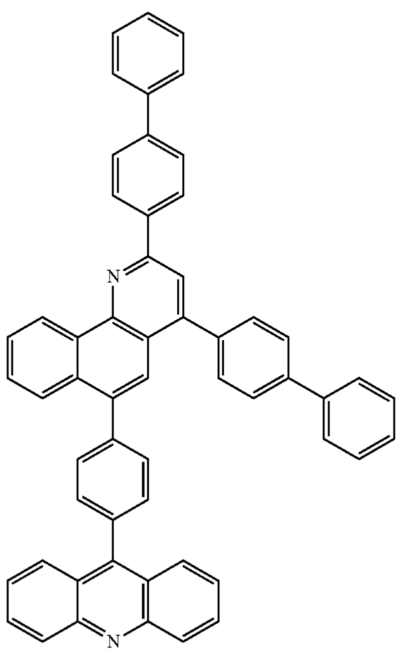
-continued
[Chemical Formula C61]
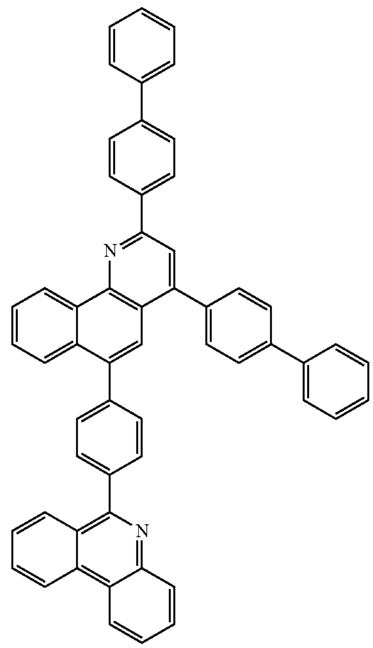
[Chemical Formula C62]
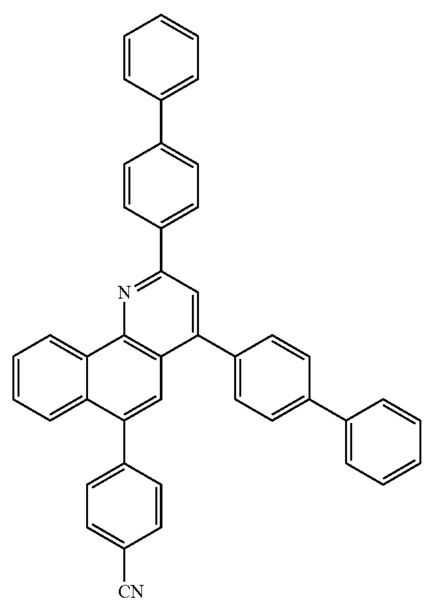

[Chemical Formula C63]
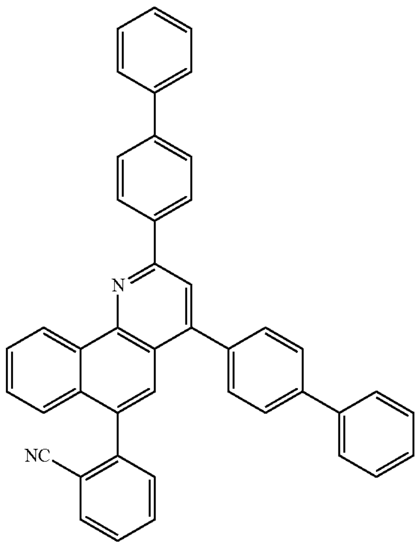
[Chemical Formula C64]
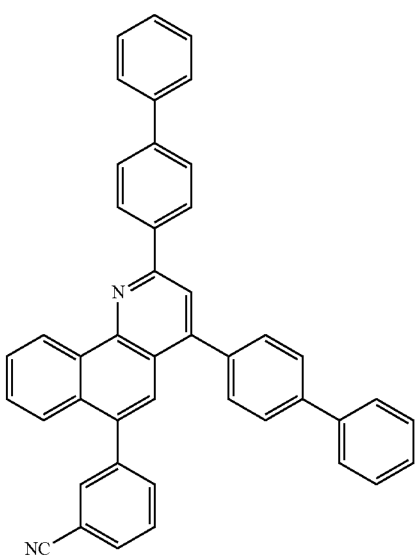
[Chemical Formula C65]
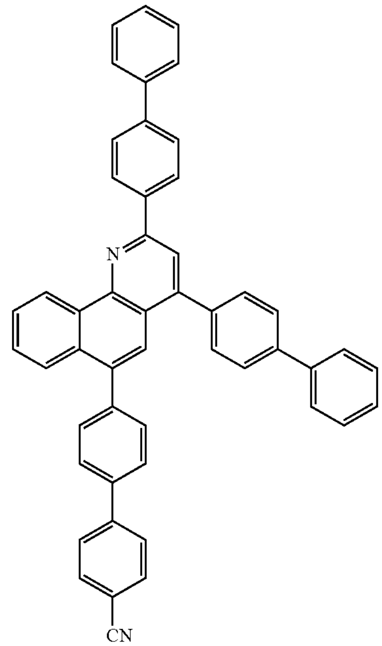
[Chemical Formula C66]
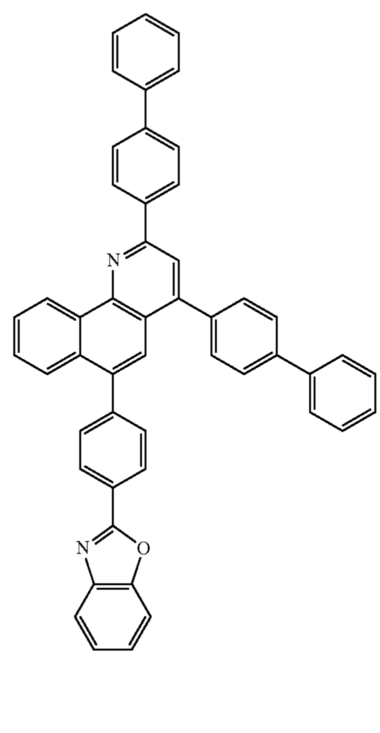

[Chemical Formula C67]
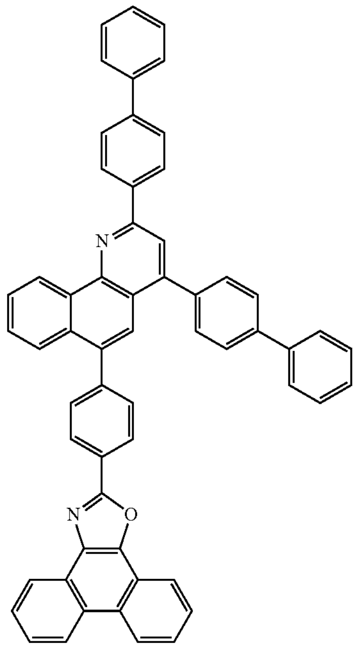
[Chemical Formula C68]
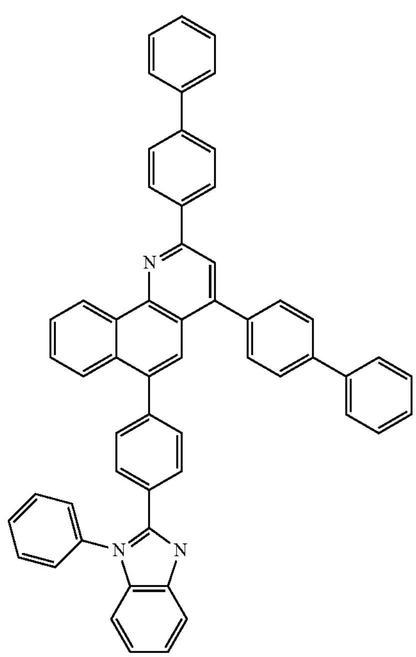
[Chemical Formula C69]
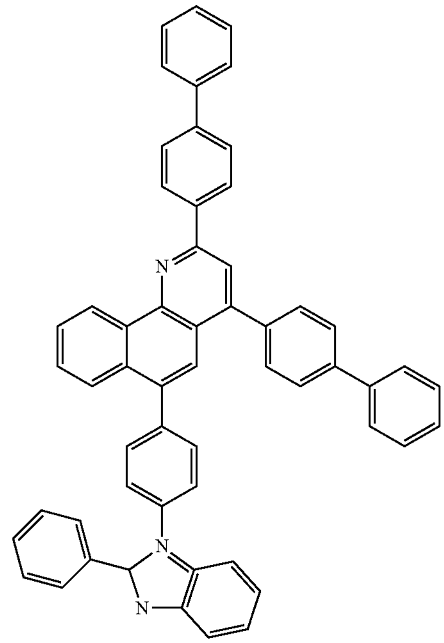
[Chemical Formula C70]
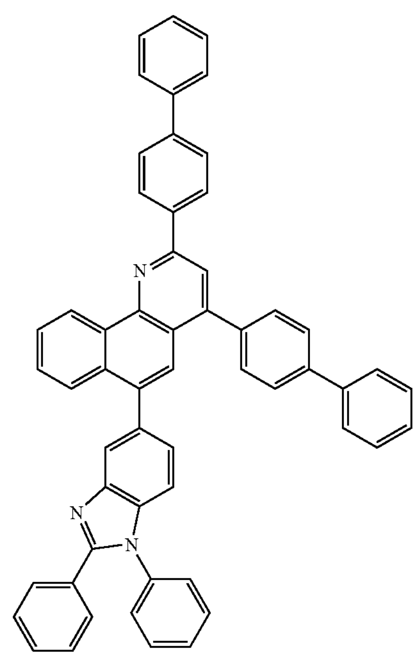

[Chemical Formula C71]
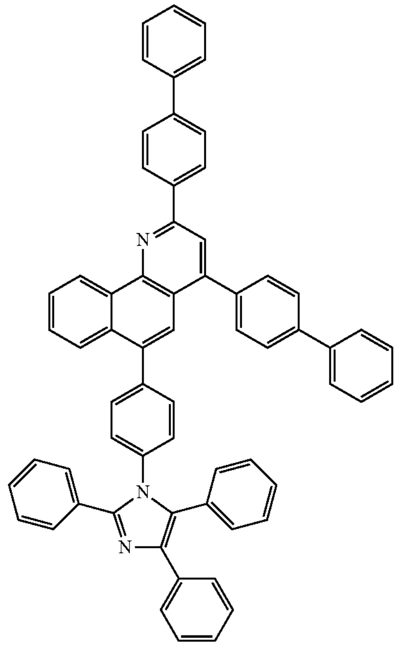
[Chemical Formula C72]
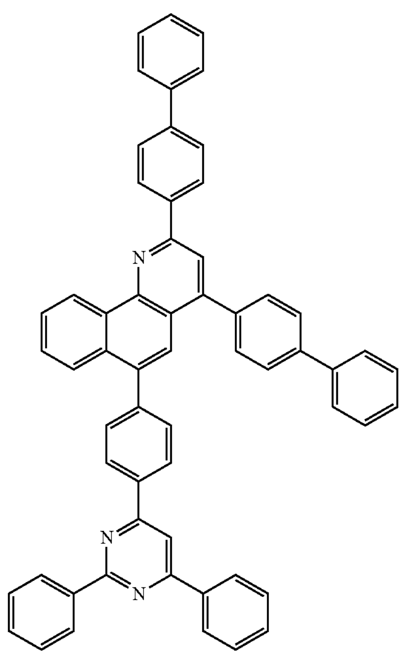
[Chemical Formula C73]
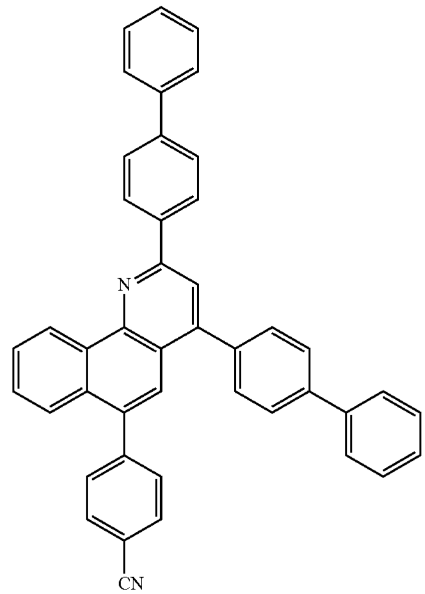
[Chemical Formula C74]
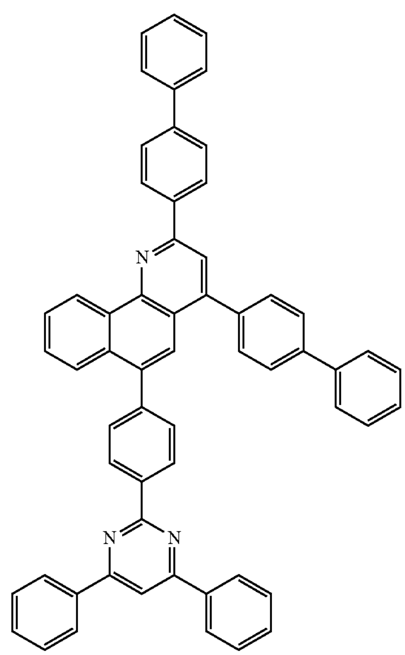

-continued
[Chemical Formula C75]
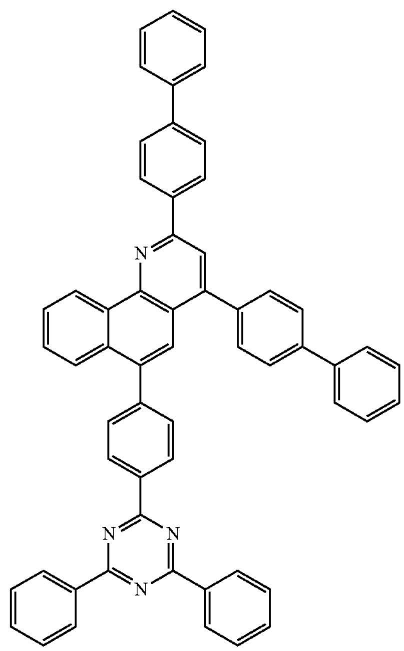
[Chemical Formula C76]
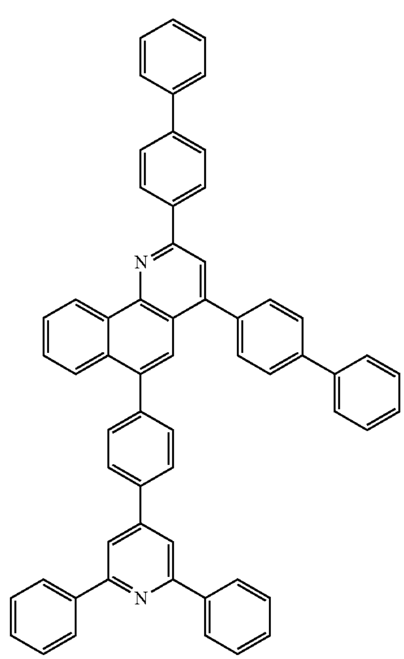
-continued
[Chemical Formula C77]
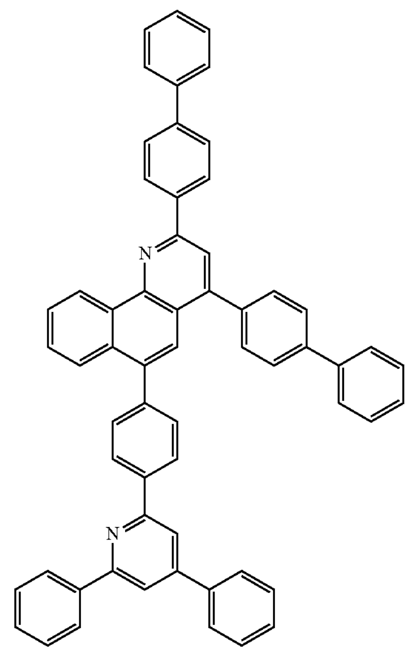
[Chemical Formula C78]
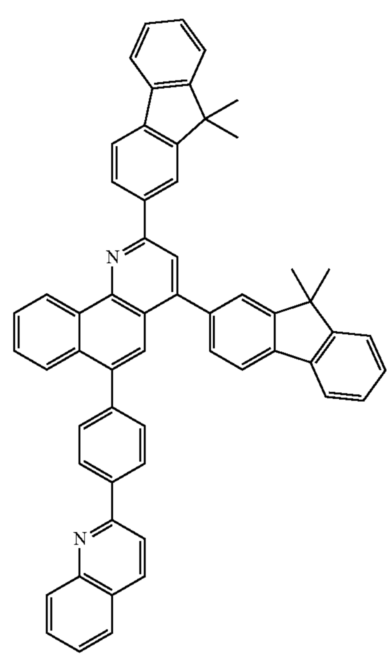

[Chemical Formula C79]
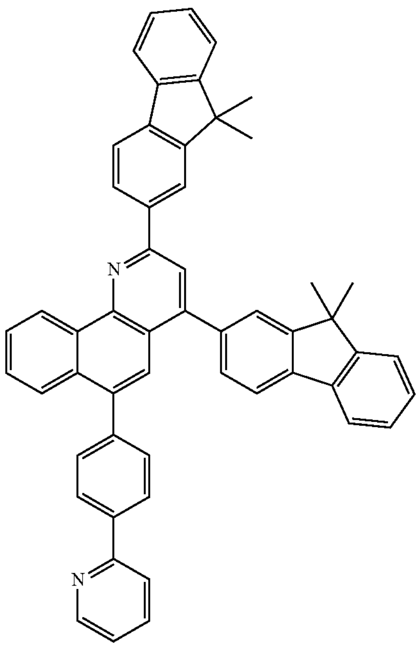
[Chemical Formula C80]
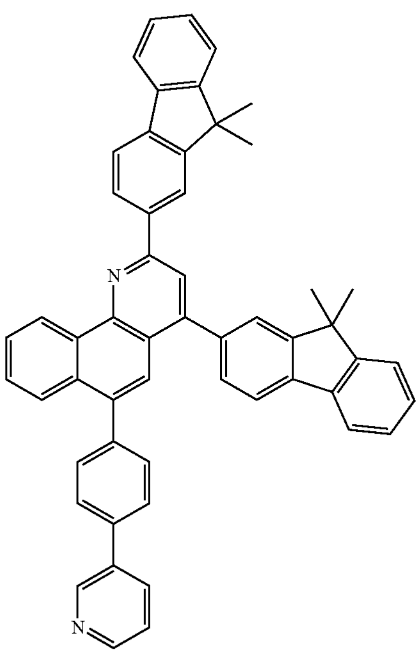
[Chemical Formula C81]
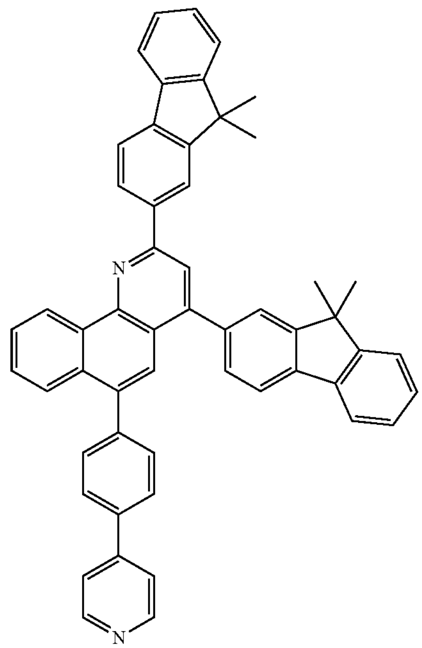
[Chemical Formula C82]
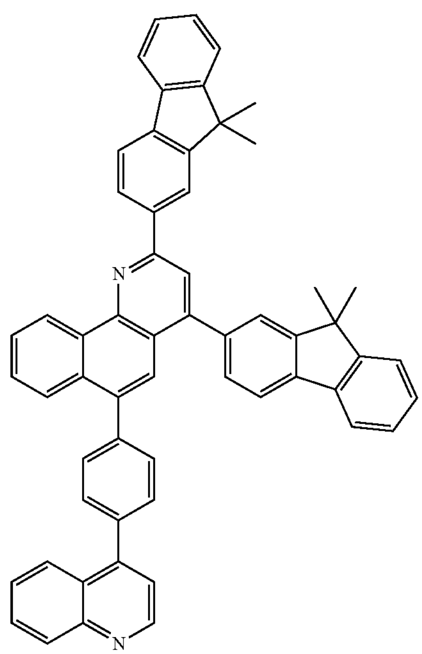

[Chemical Formula C83]
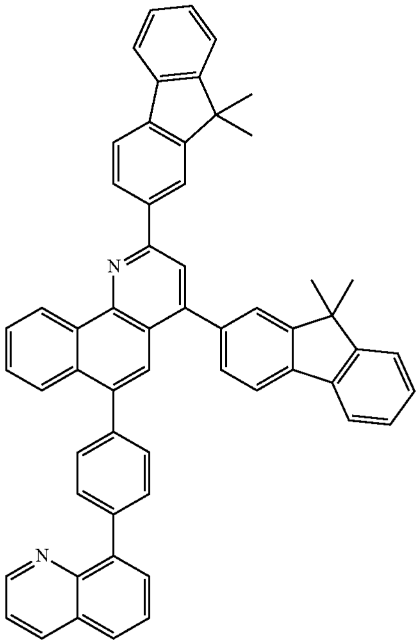
[Chemical Formula C84]
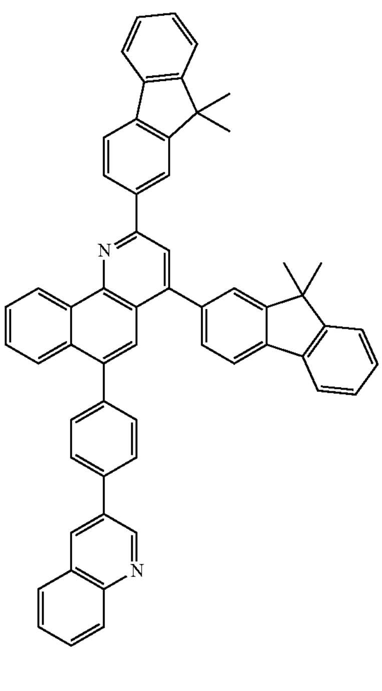
[Chemical Formula C85]
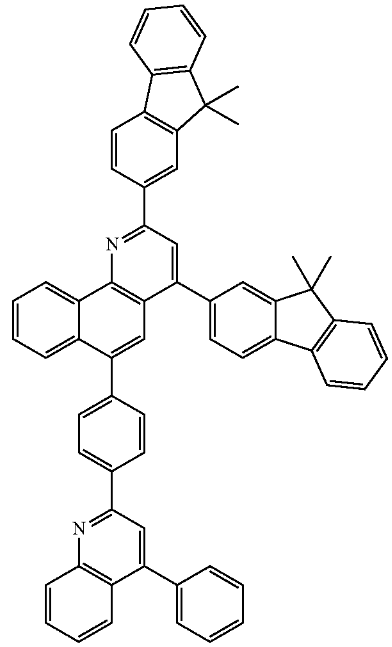
[Chemical Formula C86]
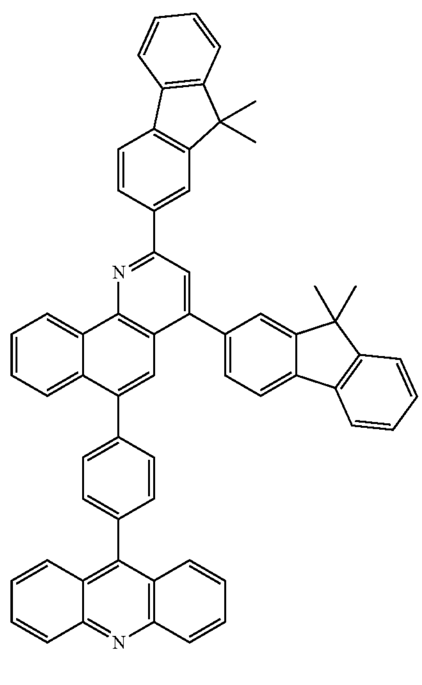

[Chemical Formula C87]
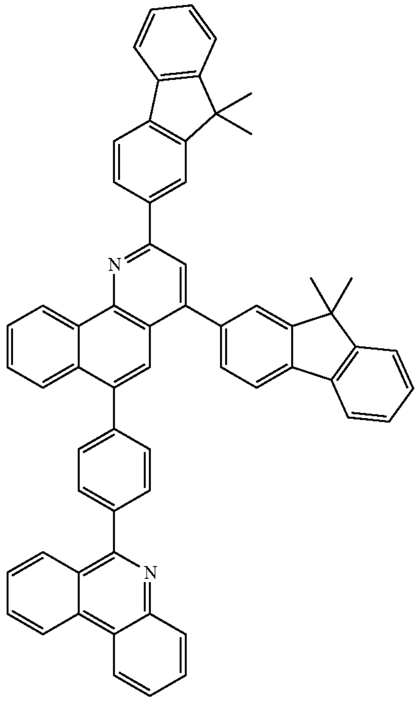
[Chemical Formula C88]
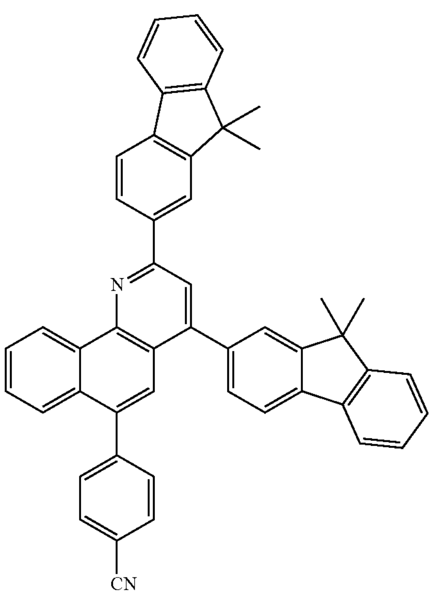
[Chemical Formula C89]
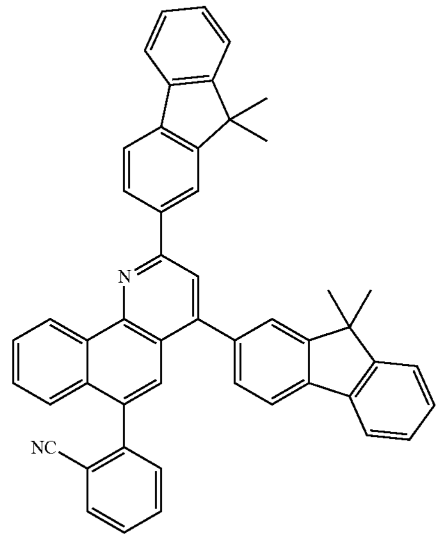
[Chemical Formula C90]
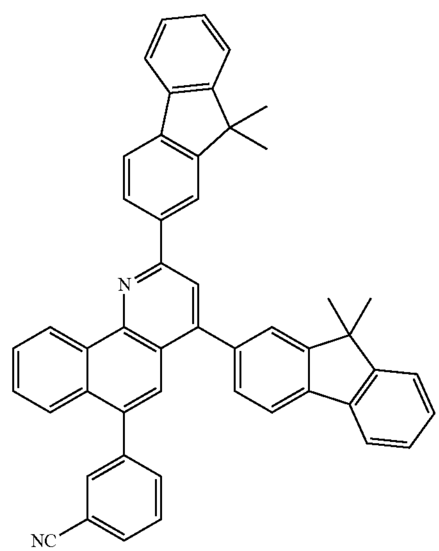

-continued
[Chemical Formula C91]
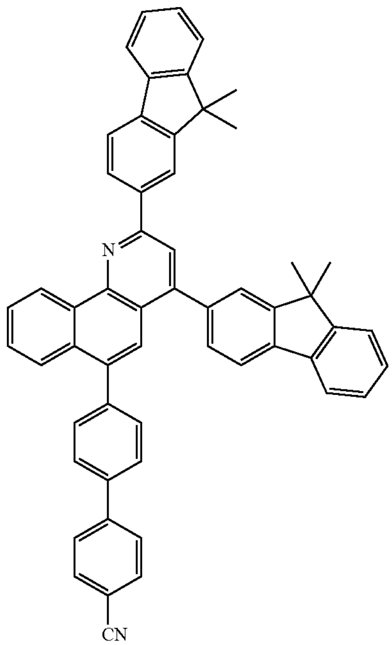
[Chemical Formula C92]
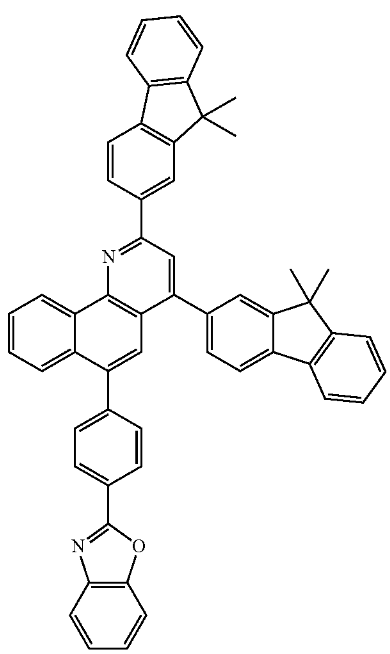
-continued
[Chemical Formula C93]
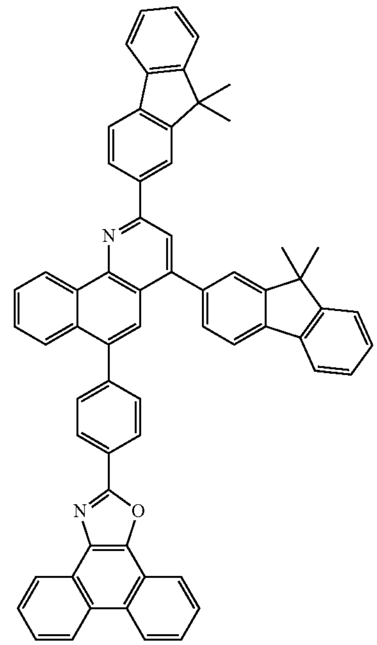
[Chemical Formula C94]
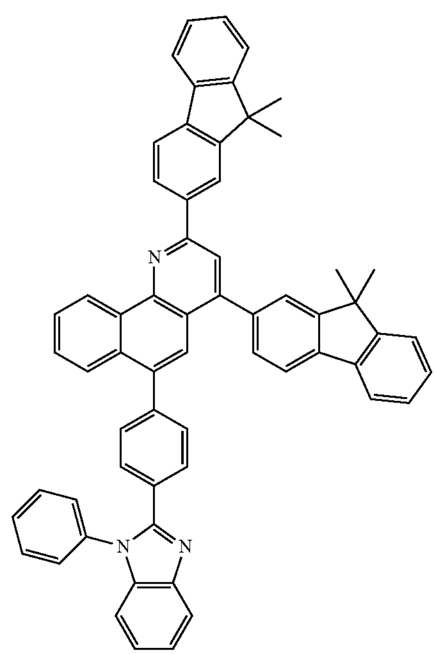

-continued
[Chemical Formula C95]
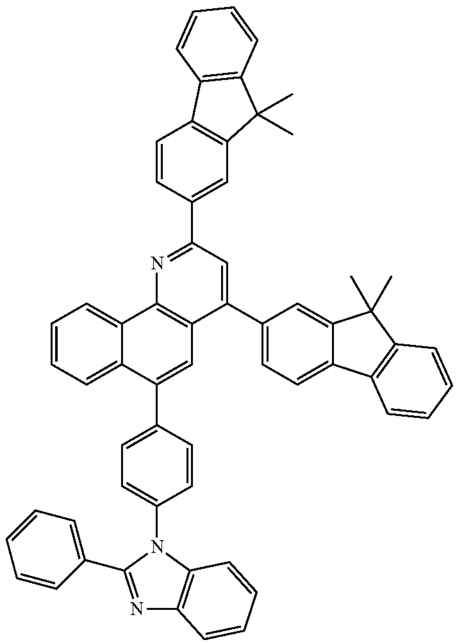
[Chemical Formula C96]
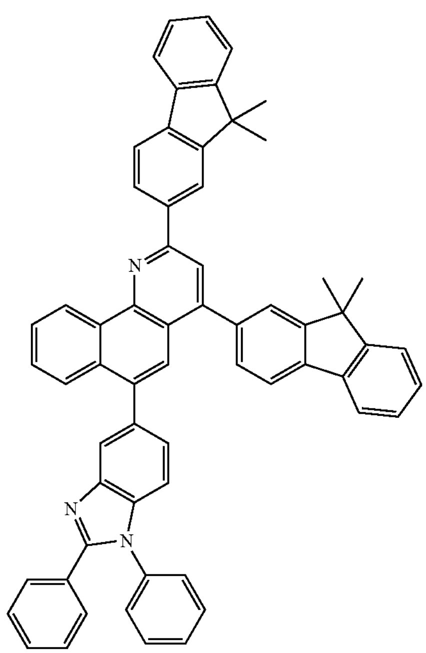
-continued
[Chemical Formula C97]
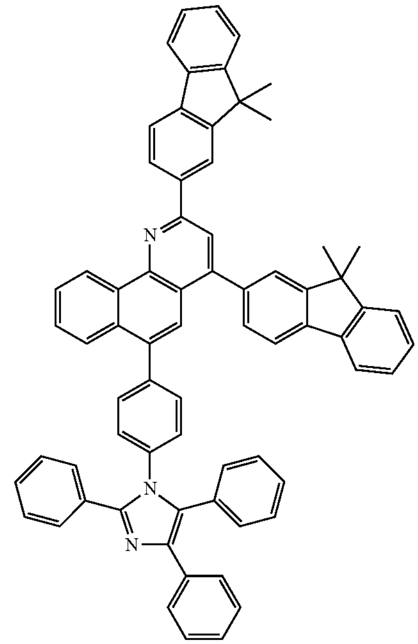
[Chemical Formula C98]
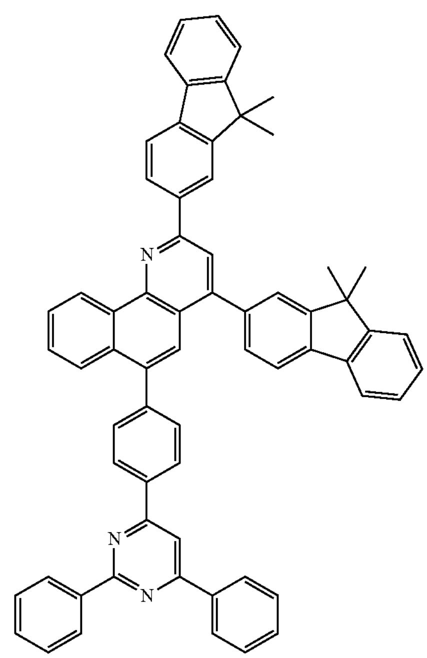

-continued
[Chemical Formula C99]
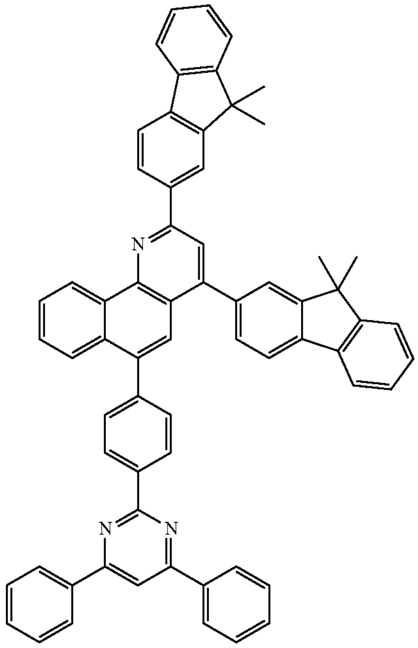
[Chemical Formula C100]
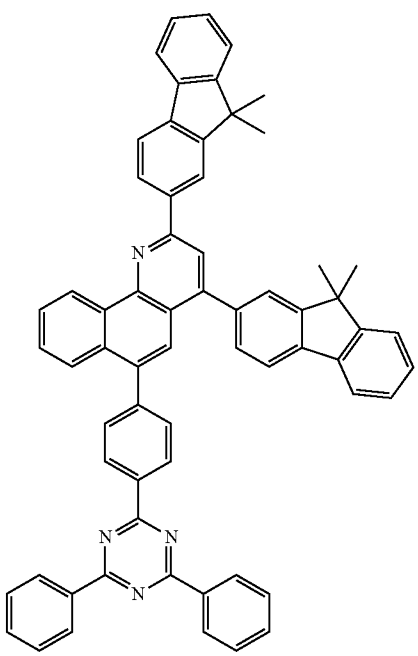
-continued
[Chemical Formula C101]
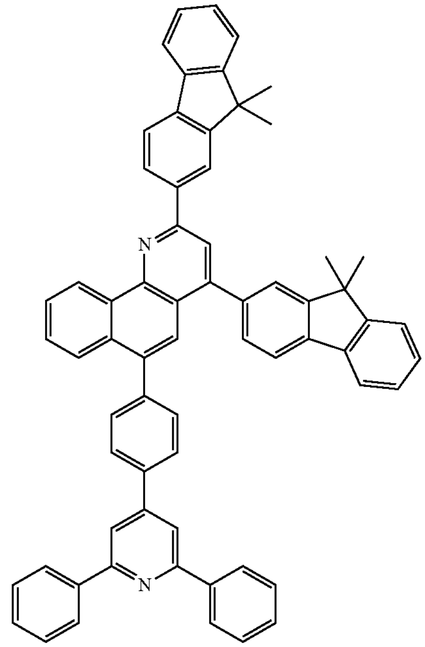
[Chemical Formula C102]
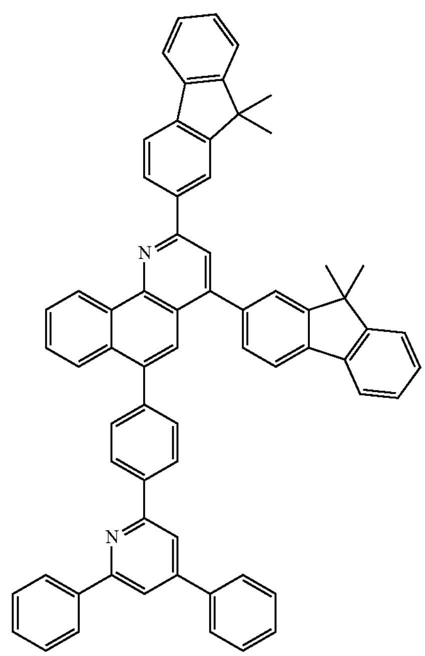

-continued
[Chemical Formula C103]
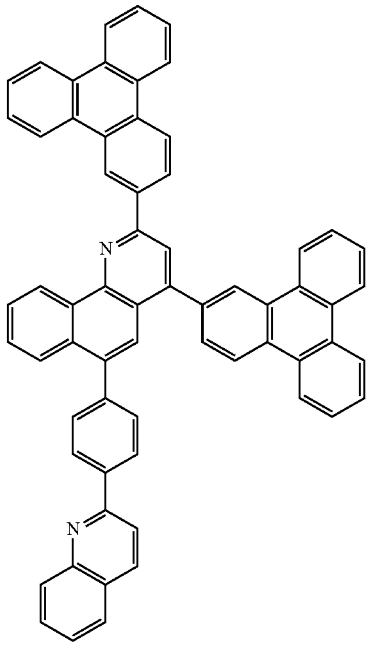
[Chemical Formula C104]
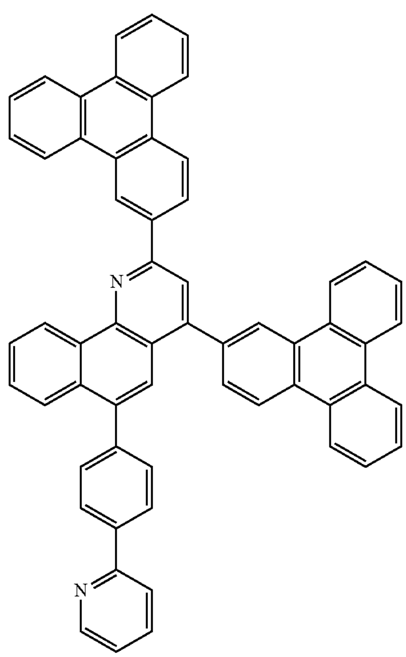
-continued
[Chemical Formula C105]
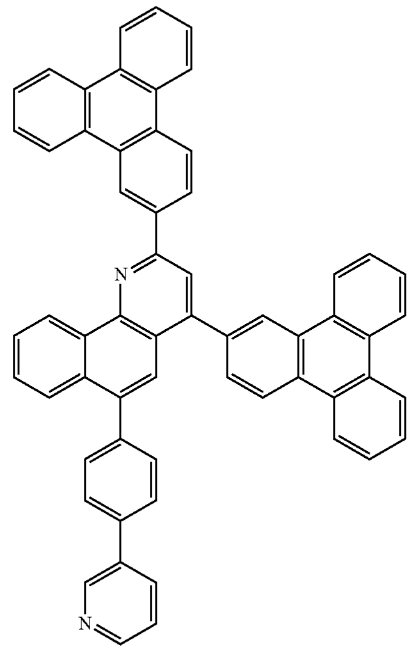
[Chemical Formula C106]
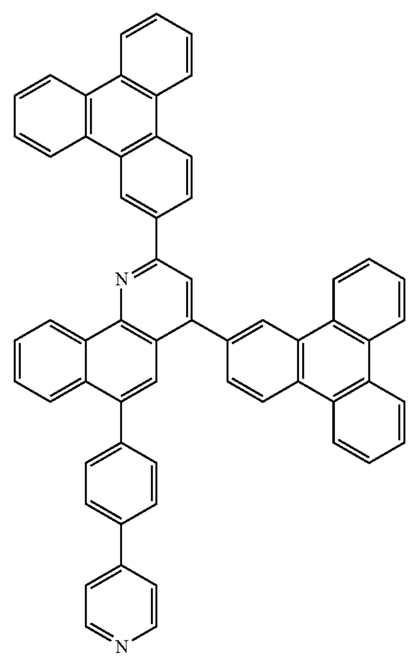

-continued
[Chemical Formula C107]
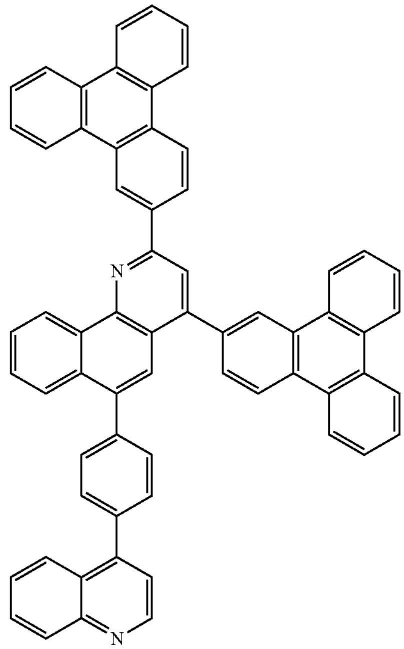
[Chemical Formula C108]
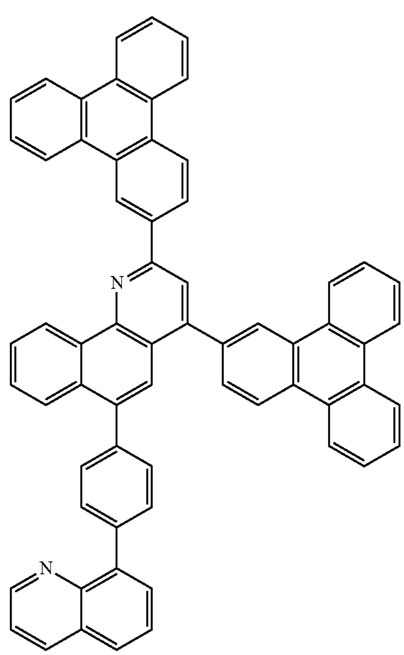
-continued
[Chemical Formula C109]
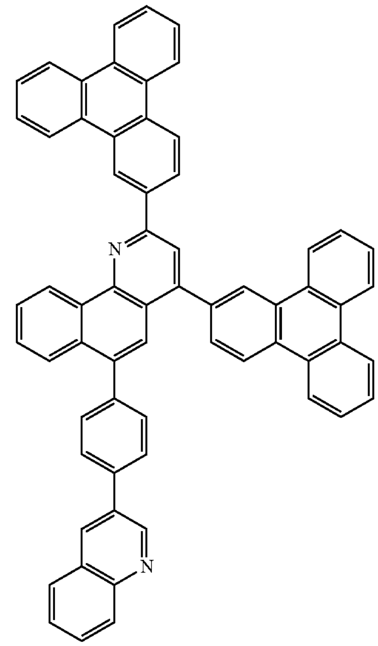
[Chemical Formula C110]
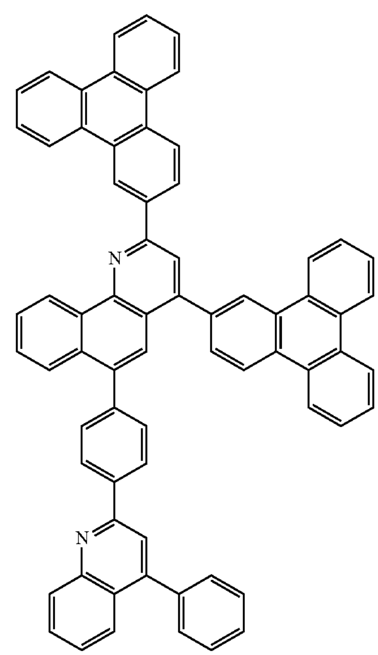

[Chemical Formula C111]
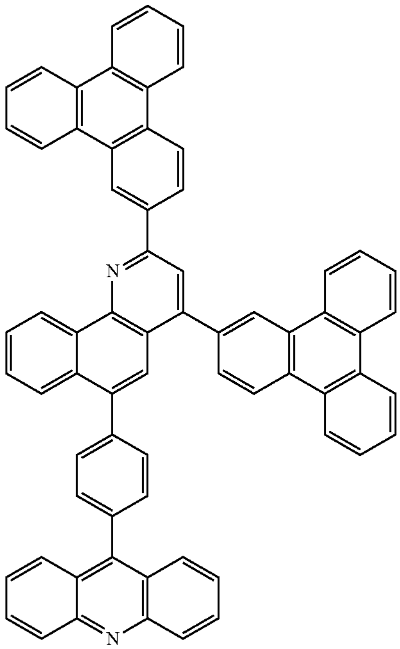
[Chemical Formula C112]
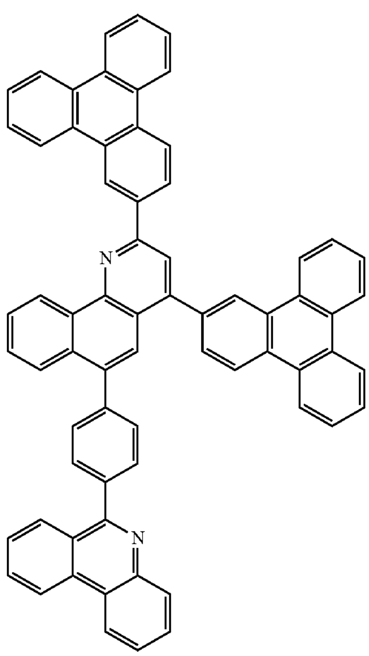
[Chemical Formula C113]
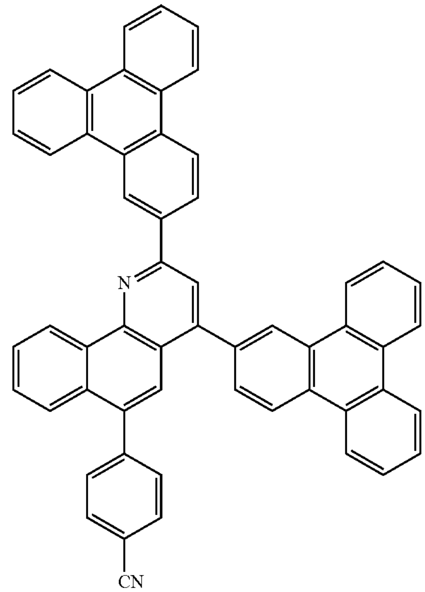
[Chemical Formula C114]
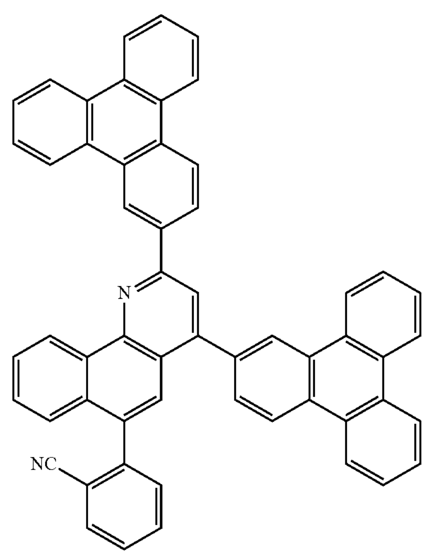

-continued
[Chemical Formula C115]
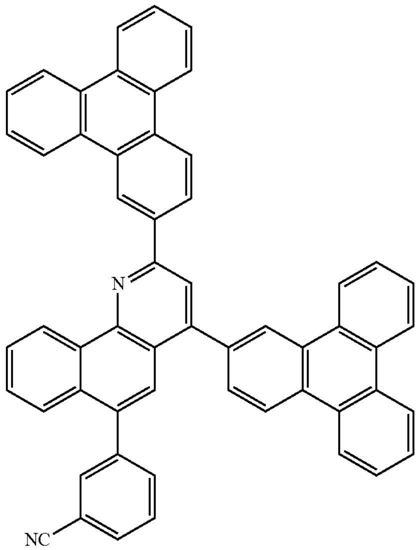
[Chemical Formula C116]
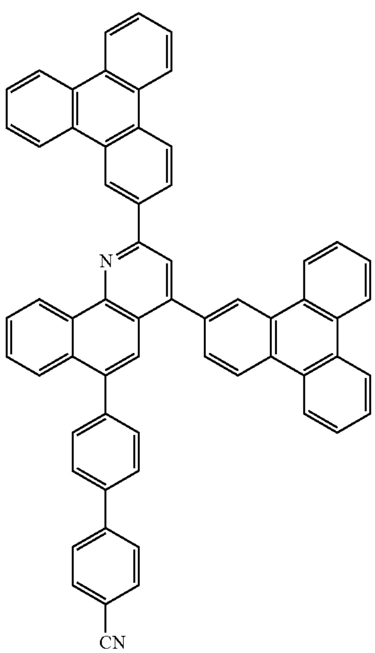
-continued
[Chemical Formula C117]
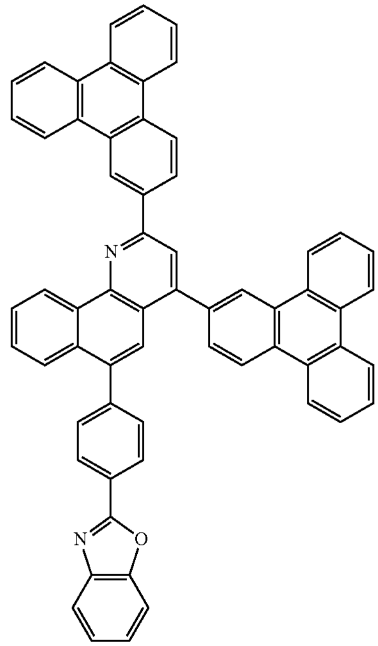
[Chemical Formula C118]
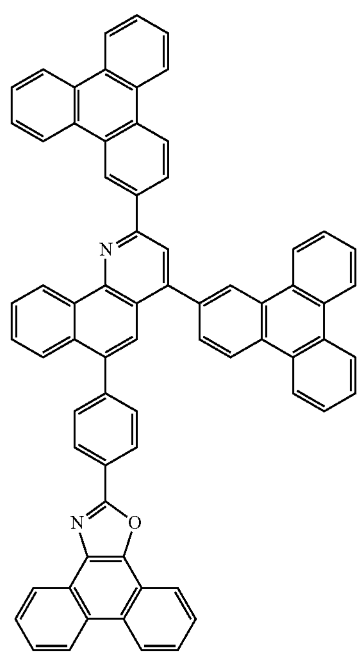

-continued
[Chemical Formula C119]
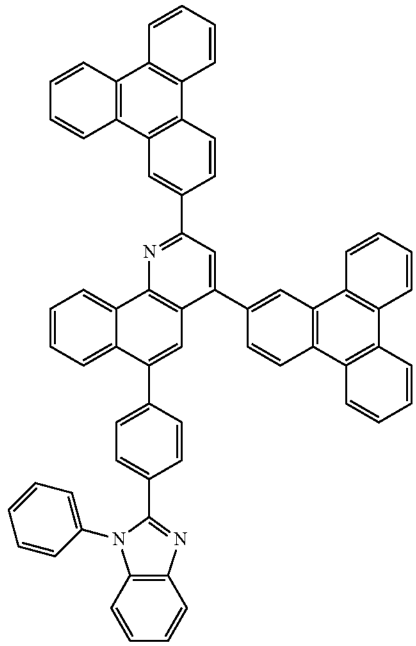
[Chemical Formula C120]
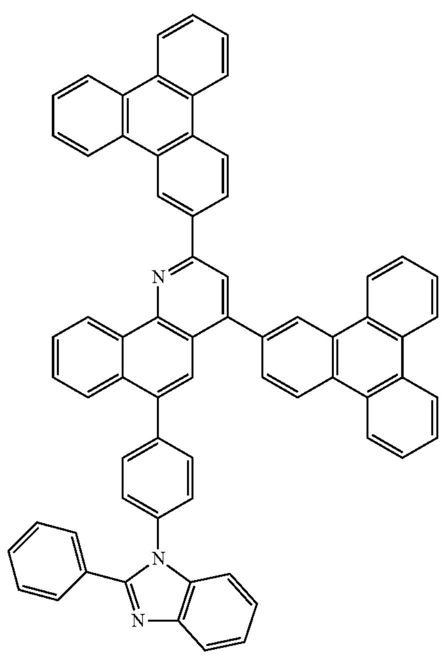
-continued
[Chemical Formula C121]
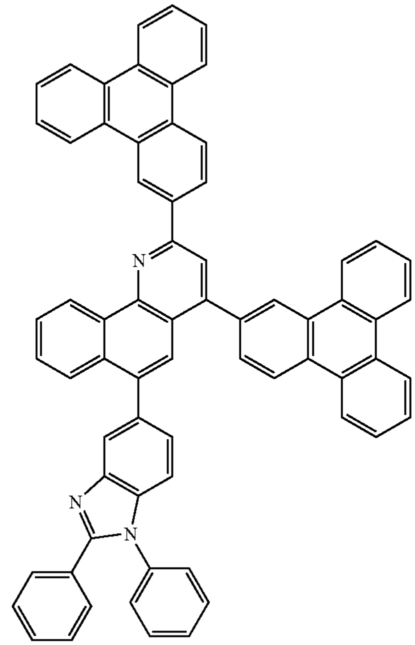
[Chemical Formula C122]
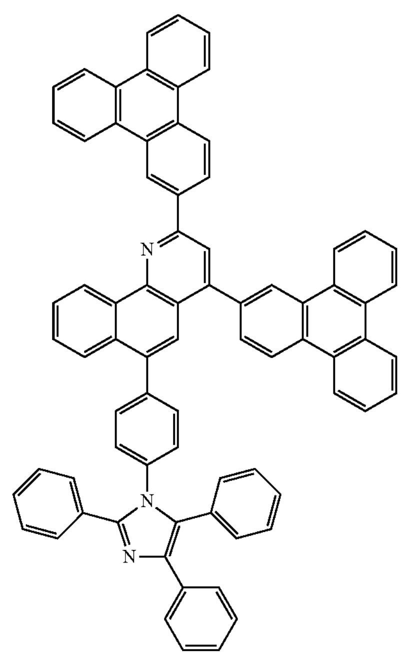

-continued
[Chemical Formula C123]
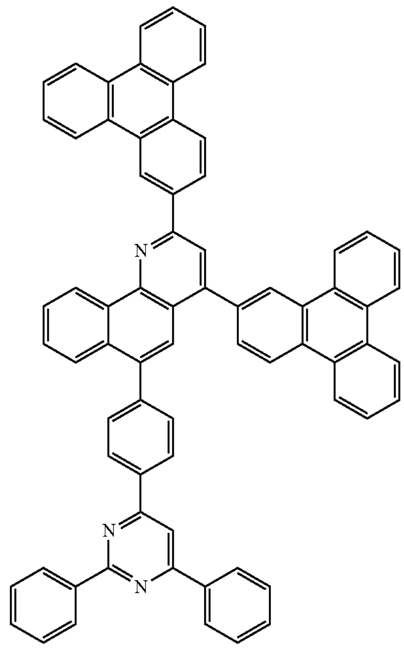
[Chemical Formula C124]
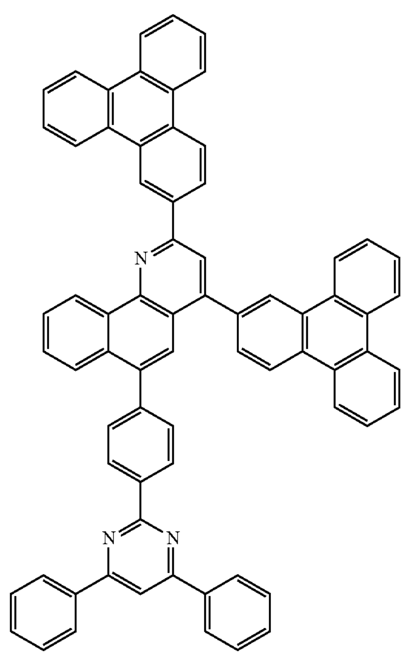
-continued
[Chemical Formula C125]
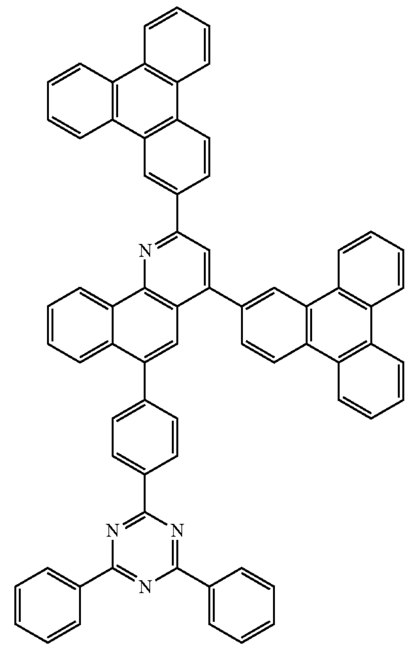
[Chemical Formula C126]
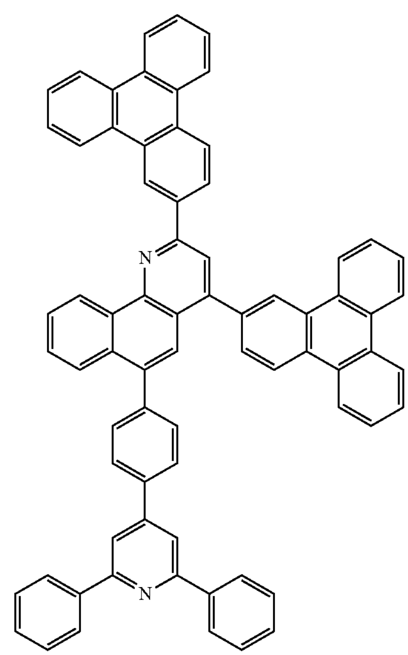

-continued
[Chemical Formula C127]
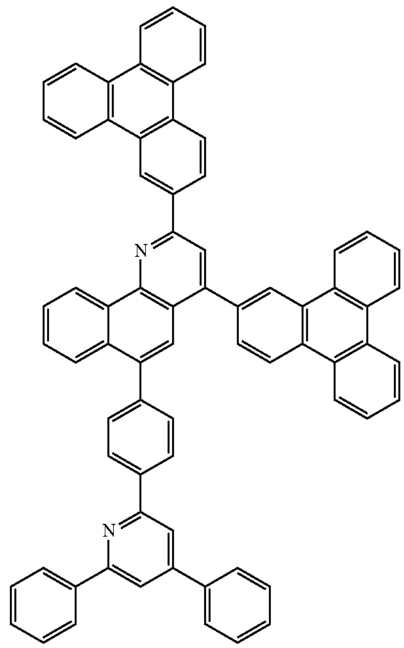
[Chemical Formula C128]
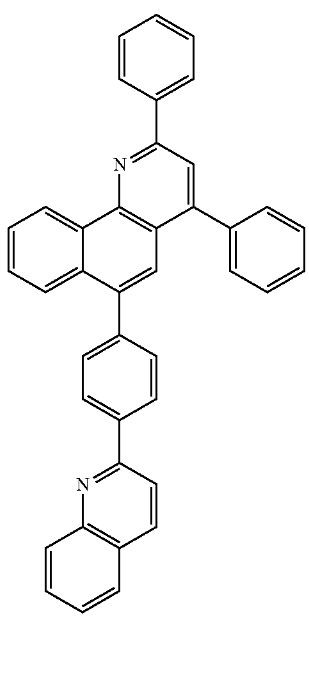
-continued
[Chemical Formula C129]
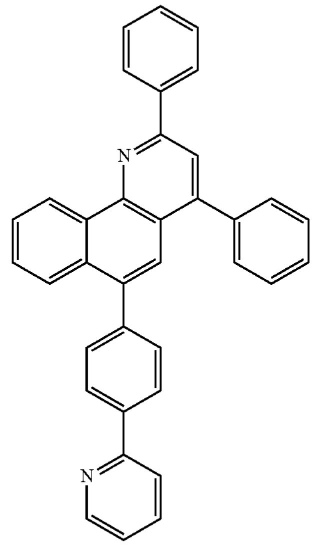
[Chemical Formula C130]
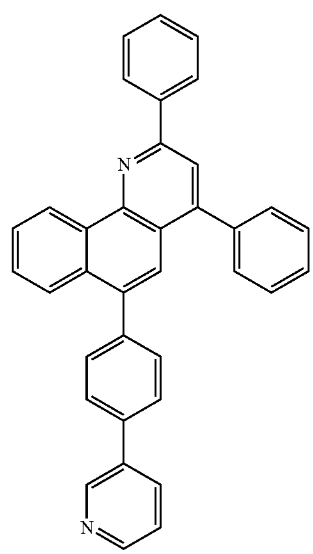

-continued
[Chemical Formula C131]
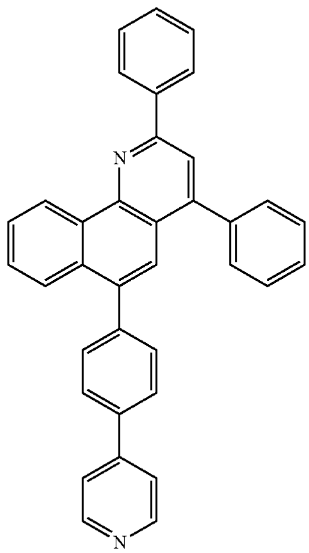
[Chemical Formula C132]
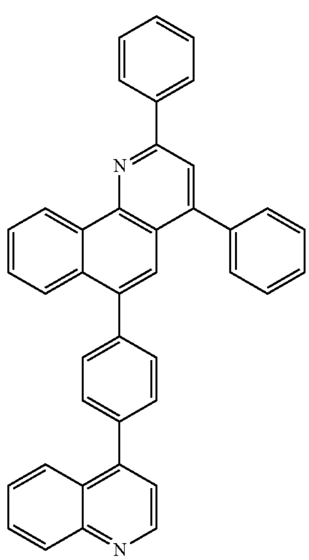
-continued
[Chemical Formula C133]
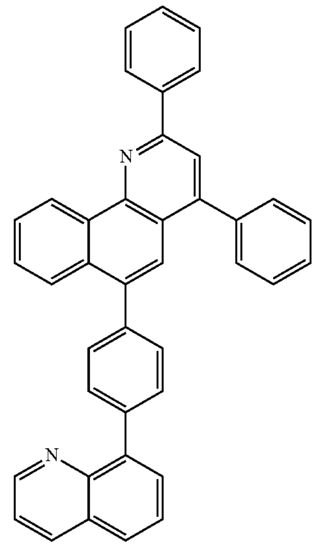
[Chemical Formula C134]
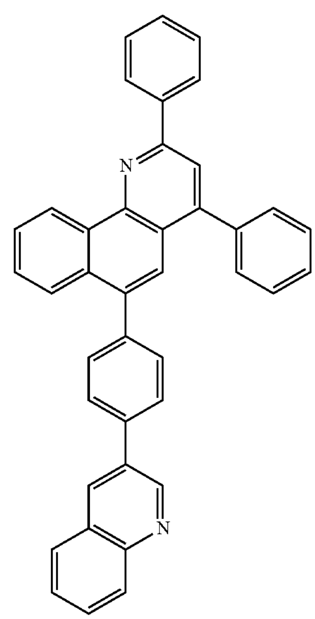

[Chemical Formula C135]
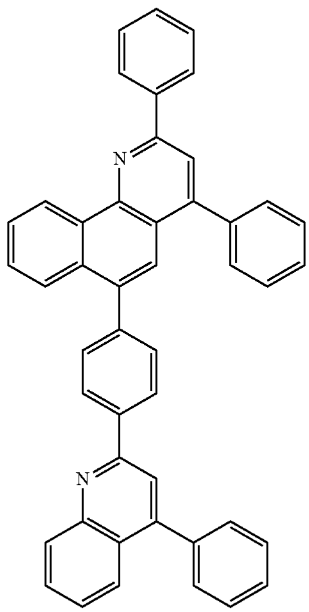
[Chemical Formula C136]
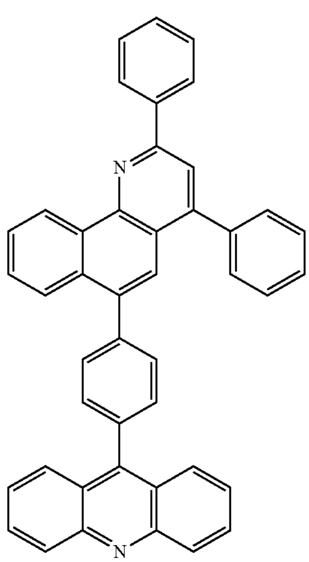
[Chemical Formula C137]
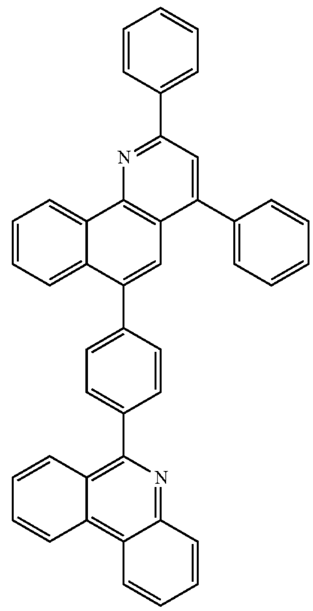
[Chemical Formula C138]
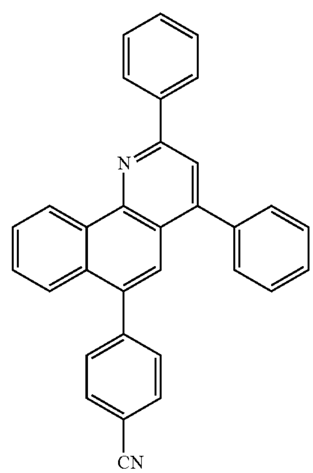
[Chemical Formula C139]
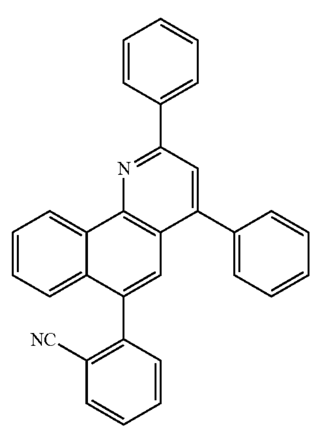

[Chemical Formula C140]
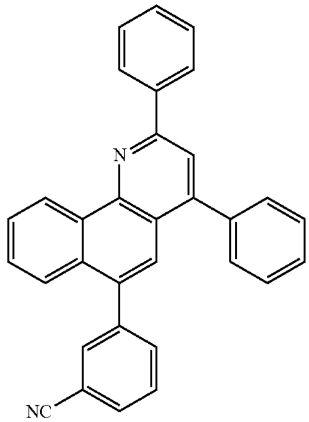
[Chemical Formula C141]
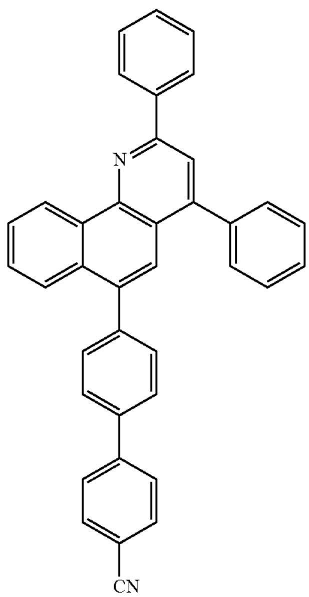
[Chemical Formula C142]
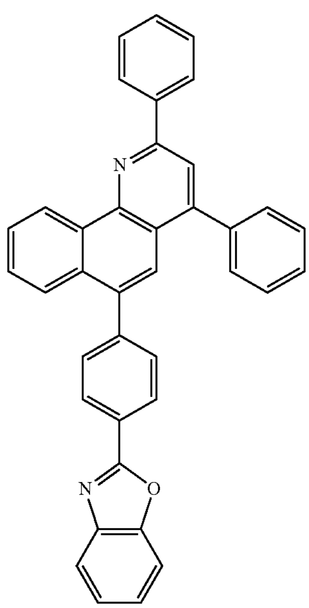
[Chemical Formula C143]
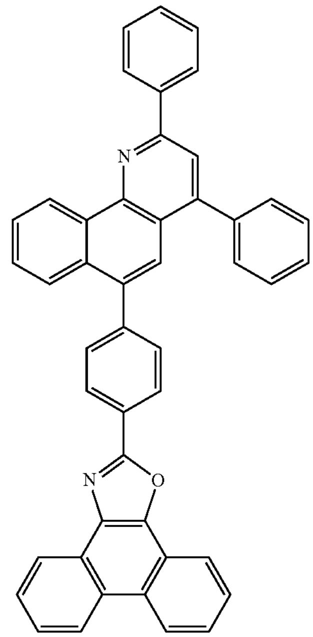
[Chemical Formula C144]
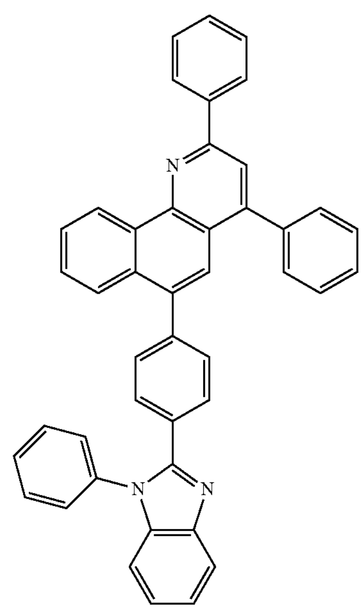

[Chemical Formula C145]
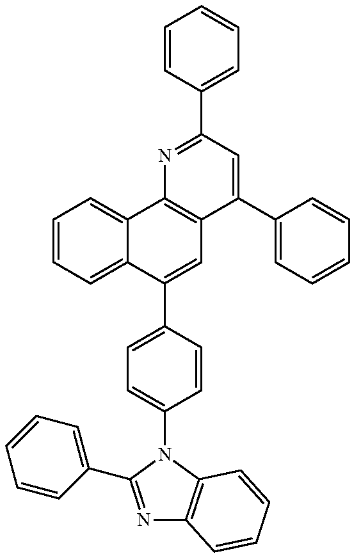
[Chemical Formula C146]
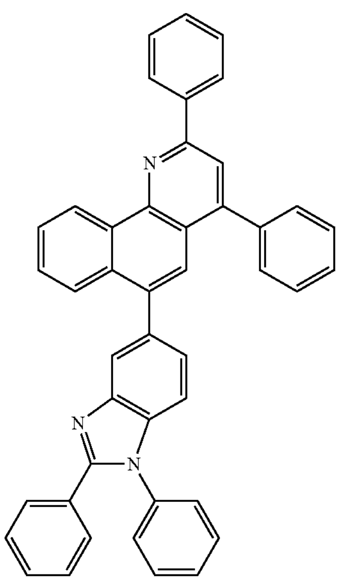
[Chemical Formula C147]
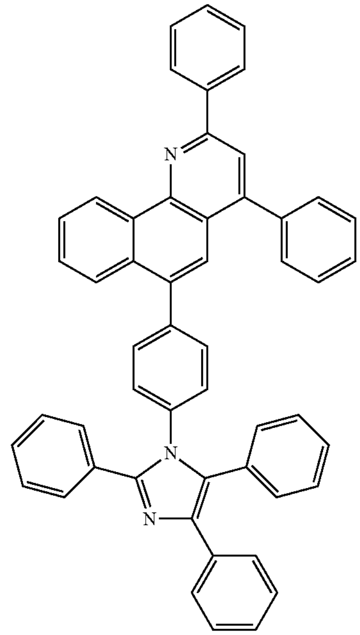
[Chemical Formula C148]
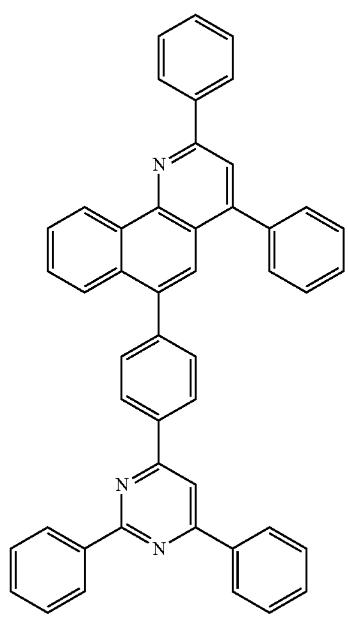

-continued
[Chemical Formula C149]
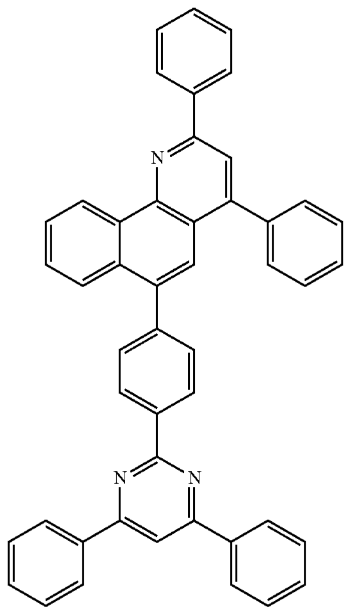
[Chemical Formula C150]
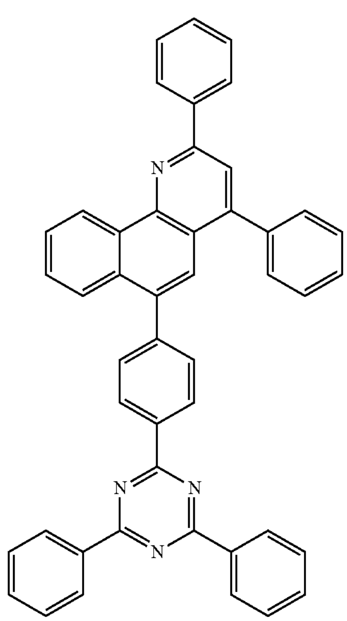
-continued
[Chemical Formula C151]
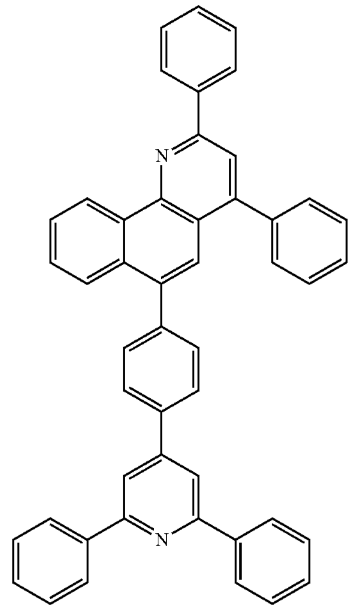
[Chemical Formula C152]
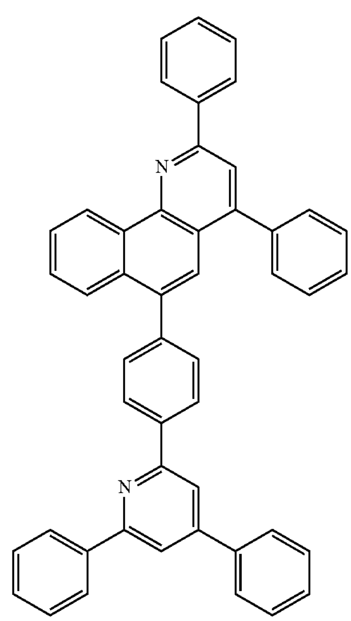

[Chemical Formula C149]
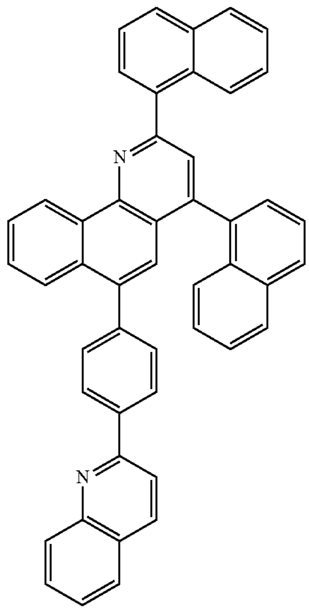
[Chemical Formula C150]
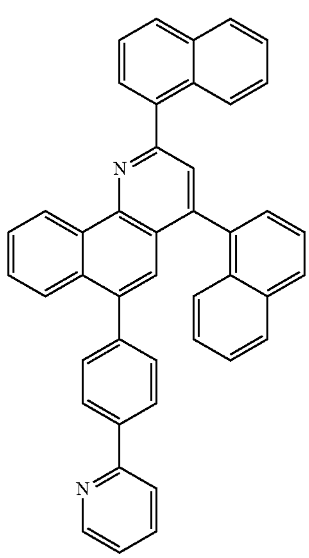
[Chemical Formula C151]
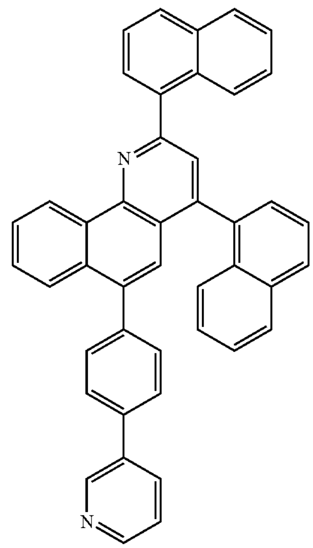
[Chemical Formula C152]
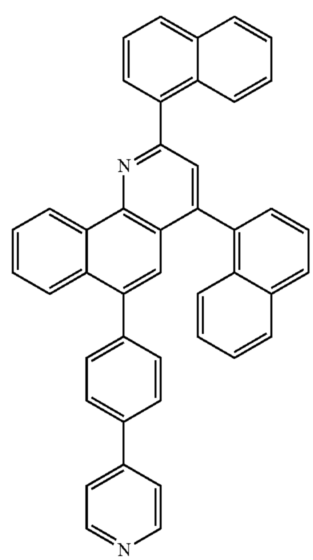

-continued
[Chemical Formula C153]
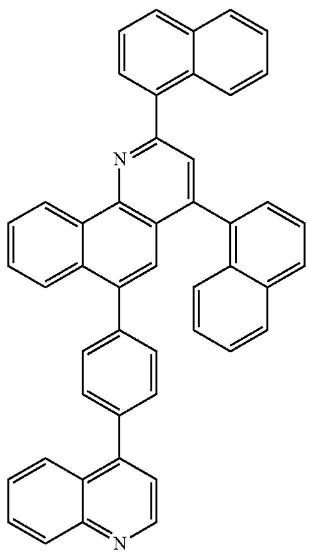
[Chemical Formula C154]
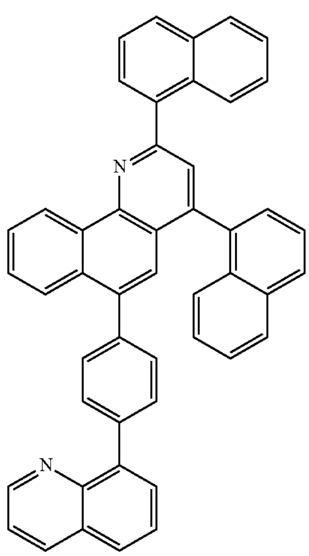
-continued
[Chemical Formula C155]
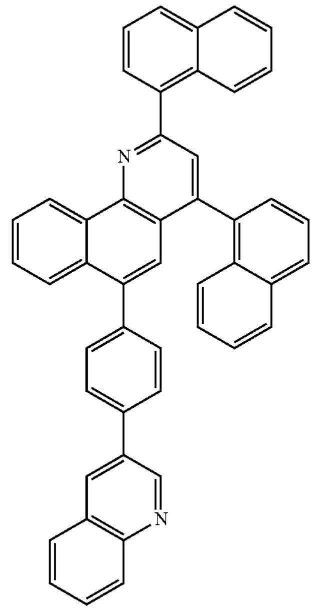
[Chemical Formula C156]
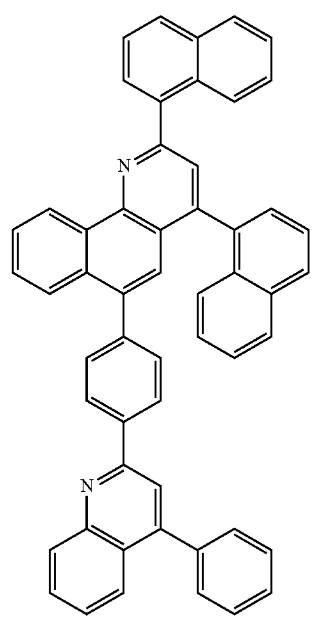

[Chemical Formula C157]
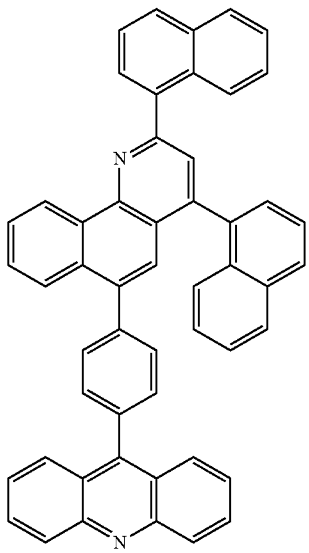
[Chemical Formula C158]
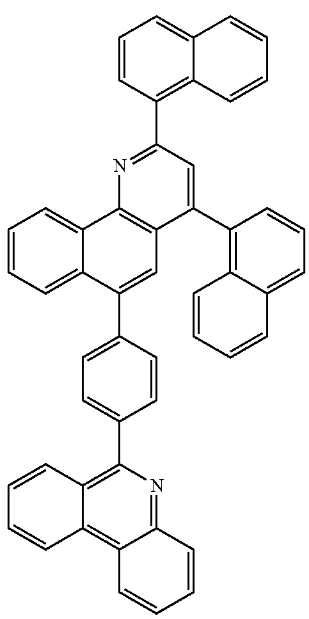
[Chemical Formula C159]
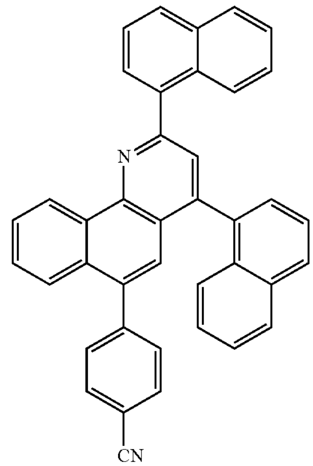
[Chemical Formula C160]
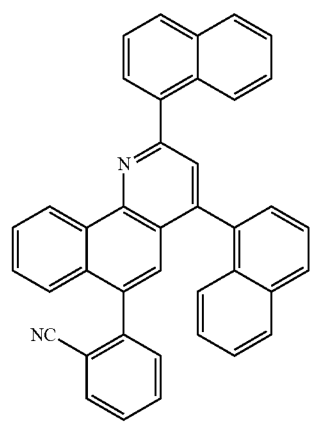
[Chemical Formula C161]
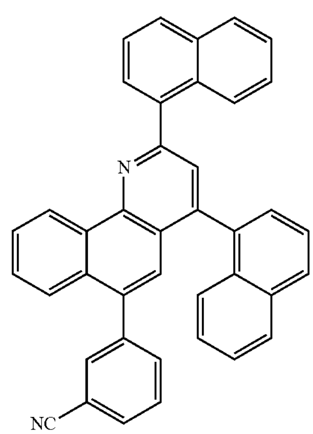

[Chemical Formula C162]
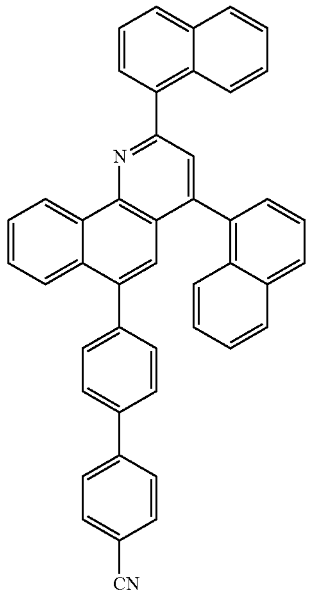
[Chemical Formula C163]
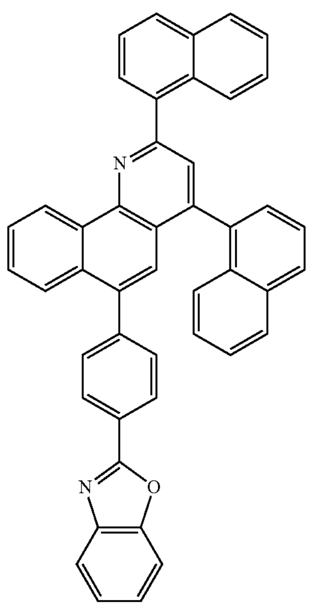
[Chemical Formula C164]
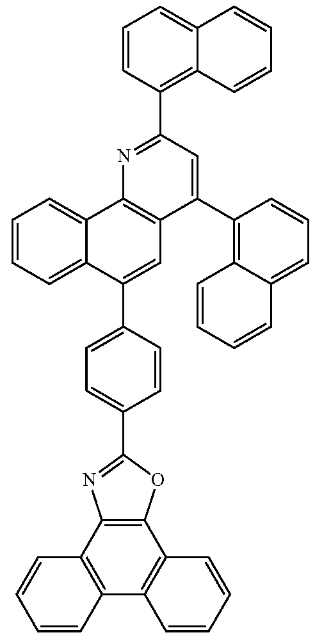
[Chemical Formula C165]
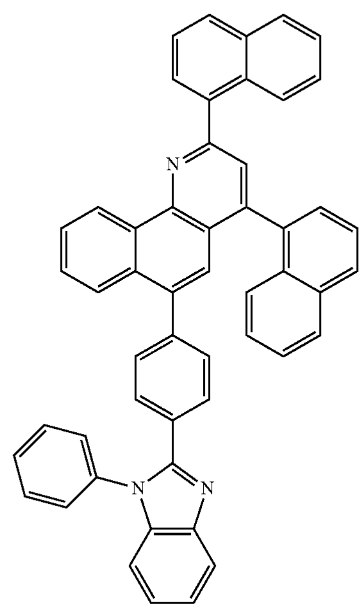

-continued
[Chemical Formula C166]
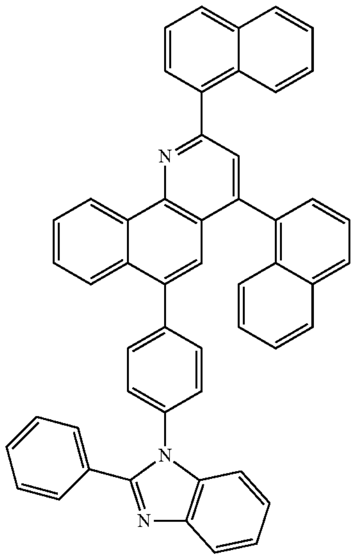
[Chemical Formula C167]
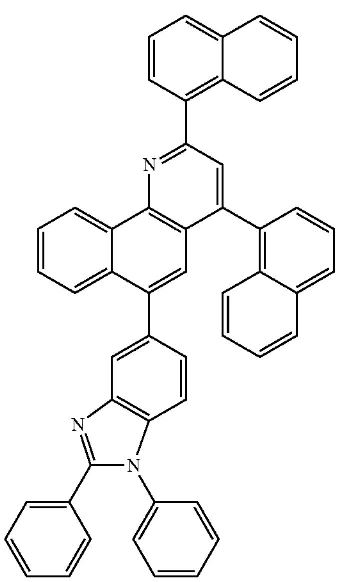
-continued
[Chemical Formula C168]
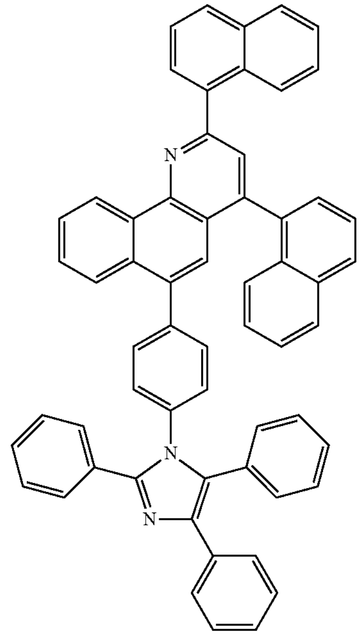
[Chemical Formula C169]
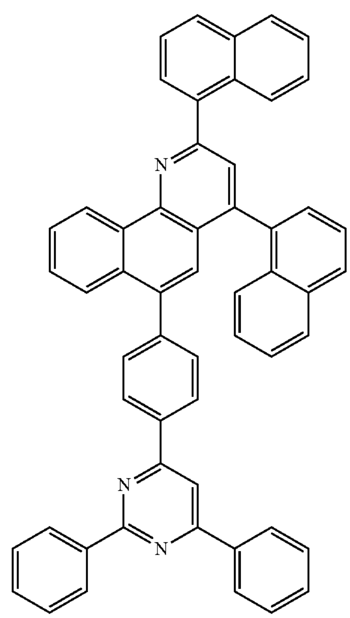

-continued

[Chemical Formula C170]

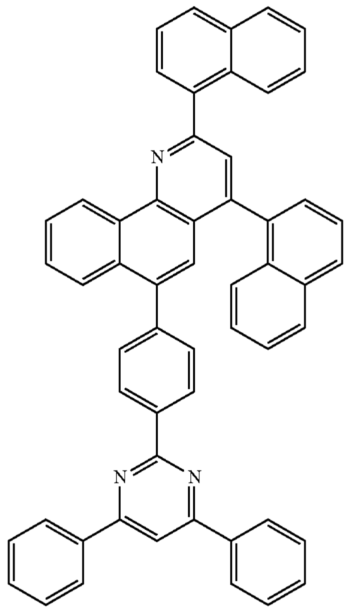

[Chemical Formula C171]

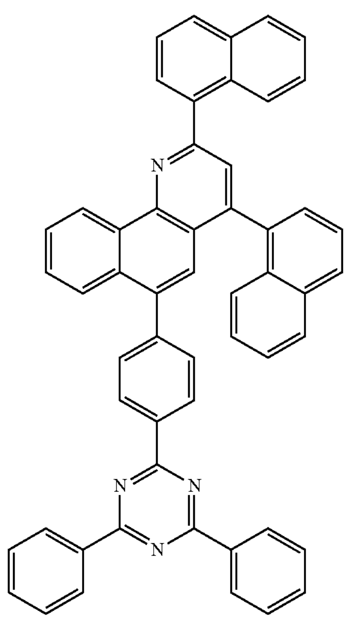

-continued

[Chemical Formula C172]

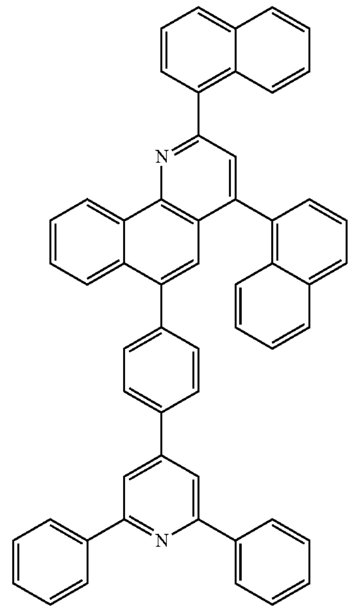

[Chemical Formula C173]

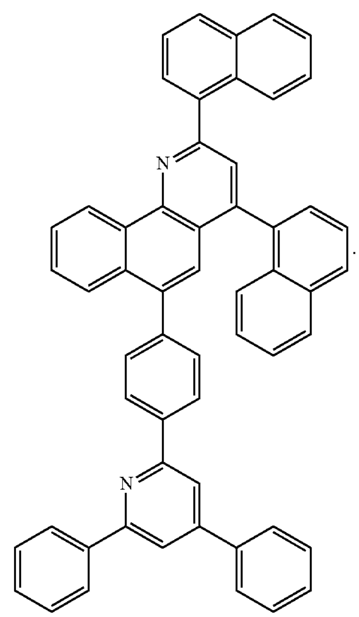

The organic optoelectronic device may be selected from the group of an organic photoelectric device, an organic light emitting diode, an organic solar cell, an organic transistor, an organic photo conductor drum, and an organic memory device.

The embodiments may also be realized by providing an organic light emitting diode including an anode, a cathode, and at least one thin layer between the anode and the cathode, wherein the at least one organic thin layer includes the compound for an organic optoelectronic device according to an embodiment.

The at least one organic thin layer may be selected from the group of an emission layer, a hole transport layer (HTL), a hole injection layer (HIL), an electron transport layer (ETL), an electron injection layer (EIL), a hole blocking layer, and a combination thereof.

The at least one organic thin layer may include an electron transport layer (ETL) or an electron injection layer (EIL), and the compound for an organic optoelectronic device may be included in the electron transport layer (ETL) or the electron injection layer (EIL).

The at least one organic thin layer may include an emission layer, and the compound for an organic optoelectronic device may be included in the emission layer.

The at least one organic thin layer may include an emission layer, and the compound for an organic optoelectronic device may be a phosphorescent or fluorescent host material in the emission layer.

The at least one organic thin layer may include an emission layer, and the compound for an organic optoelectronic device may be a fluorescent blue dopant material in the emission layer.

The embodiments may also be realized by providing a display device including the organic light emitting diode according to an embodiment.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
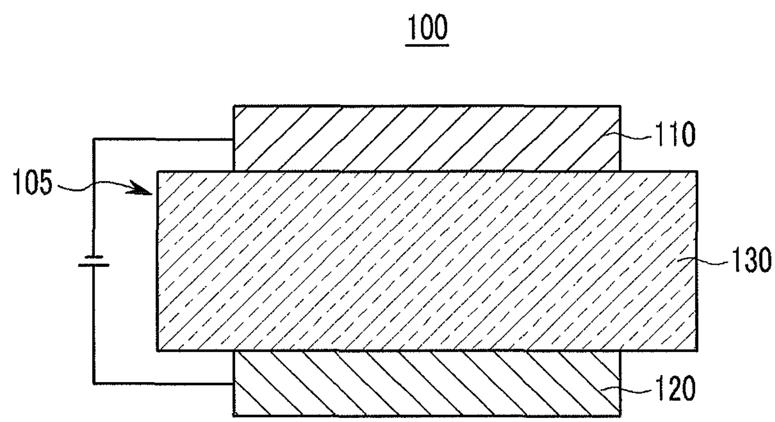
FIGS. 1 to 5 illustrate cross-sectional views showing organic optoelectronic devices according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "substituted" refers to one substituted with a C1 to C30 alkyl group, a C1 to C10 alkylsilyl group, a C3 to C30 cycloalkyl group, a C6 to C30 aryl group, a C1 to C10 alkoxy group, a fluoro group, a C1 to C10 trifluoro alkyl group such as trifluoromethyl group, or a cyano group.

As used herein, when specific definition is not otherwise provided, the term "hetero" refers to one including 1 to 3 hetero atoms selected from the group of N, O, S, and P, and remaining carbons in one functional group.

As used herein, when a definition is not otherwise provided, the term "combination thereof" refers to at least two substituents bound to each other by a linker, or at least two substituents condensed to each other.

As used herein, when a definition is not otherwise provided, the term "alkyl" refers to an aliphatic hydrocarbon group. The alkyl group may be a "saturated alkyl group" that does not include a double bond or a triple bond.

The alkyl group may be an "unsaturated alkyl group" including at least one alkenyl group or alkynyl group. Regardless of being saturated or unsaturated, the alkyl may be branched, linear, or cyclic.

The alkyl group may be a C1 to C20 alkyl group. The alkyl group may be a C1 to C10 medium-sized alkyl group. The alkyl group may be a C1 to C6 lower alkyl group.

For example, a C1 to C4 alkyl group may have 1 to 4 carbon atoms and may be selected from the group consisting of methyl, ethyl, propyl, iso-propyl, n-butyl, iso-butyl, sec-butyl, and t-butyl.

Examples of an alkyl group may be selected from the group of a methyl group, an ethyl group, a propyl group, an isopropyl group, a butyl group, an isobutyl group, a t-butyl group, a pentyl group, a hexyl group, an ethenyl group, a propenyl group, a butenyl group, a cyclopropyl group, a cyclobutyl group, a cyclopentyl group, a cyclohexyl group, and the like.

The term "aromatic group" may refer a functional group including a cyclic structure where all elements have p-orbitals which form conjugation. Specific examples include an aryl group and a heteroaryl group.

The term "aryl" may refer to a monocyclic or fused ring-containing polycyclic (i.e., rings sharing adjacent pairs of carbon atoms) groups.

The "heteroaryl group" may refer to one including 1 to 3 heteroatoms selected from the group of N, O, S, and P in an aryl group, and remaining carbons.

The term "spiro structure" refers to a cyclic structure having a contact point of one carbon. Further, the spiro structure may be used as a compound including the spiro structure or a substituent including the Spiro structure.

According to an embodiment, a compound for an organic optoelectronic device represented by the following Chemical Formula 1 is provided.

[Chemical Formula 1]

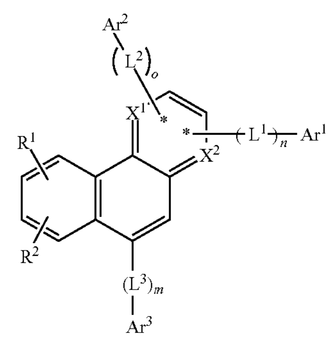

In Chemical Formula 1, $X^1$ and $X^2$ may each independently be —N— or —CR'—. R' may be a sigma bond with one of the *, or may be hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof. $R^1$ and $R^2$ may each independently be hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof. $Ar^1$ to $Ar^3$ may each independently be a substituted or unsubstituted C6 to C30 aryl group or a substituted or unsubstituted C3 to C30 heteroaryl group. $L^1$ to $L^3$ may each independently be a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof. n, m, and may each independently be 0 or 1.

In an implementation, the compound for an organic optoelectronic device represented by the above Chemical Formula 1 may include a fused ring core including a nitrogen atom and three substituted or unsubstituted aryl groups or substituted or unsubstituted heteroaryl groups.

In an implementation, the compound represented by the above Chemical Formula 1 may be a compound represented by the following Chemical Formula 2.

[Chemical Formula 2]

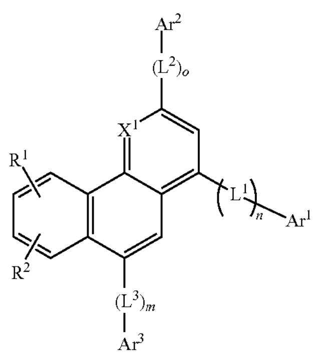

In Chemical Formula 2, $X^1$ may be —N— or —CR'—. R' may be hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof. $R^1$ and $R^2$ may each independently be hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof. $Ar^1$ to $Ar^3$ may each independently be a substituted or unsubstituted C6 to C30 aryl group or a substituted or unsubstituted C3 to C30 heteroaryl group. $L^1$ to $L^3$ may each independently be a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof n, m, and o may each independently be 0 or 1.

The compound represented by Chemical Formula 2 may be easily synthesized, may have an asymmetric structure that is not easily crystallized in a device, and may have high thermal stability due to a bulk core.

In an implementation, the fused ring core may include at least one nitrogen atom. In an implementation, the fused ring core may include one or two nitrogen atoms. For example, in Chemical Formula 2, $X^1$ may be N.

Characteristics of the compound may be controlled or determined by introducing appropriate substituents to the core structure having excellent electron characteristics.

The compound for an organic optoelectronic device may have various energy band gaps by introducing the various other substituents to the core part and the substituent substituted in the core part. Accordingly, the compound may be applied to an electron injection layer (EIL) and/or electron transport layer and may also be applied to an emission layer.

By applying the compound having an appropriate energy level according to the substituent of the compound to the organic photoelectric device, electron transport properties may be enforced to provide excellent effects on the efficiency and the driving voltage. Electrochemical and thermal stability may also be excellent, thereby helping to improve life-span characteristics during driving an organic photoelectric device.

The electron characteristic refers to a characteristic in which an electron formed in the negative electrode is easily injected into the emission layer and transported in the emission layer due to conductive characteristics according to a LUMO level.

The hole characteristic refers to a characteristic in which a hole formed in the positive electrode is easily injected into the emission layer and transported in the emission layer due to conductive characteristic according to a HOMO level.

In Chemical Formula 2, $Ar^1$ to $Ar^3$ may each independently be a substituted or unsubstituted C6 to C30 aryl group or a substituted or unsubstituted C3 to C30 heteroaryl group.

In an implementation, the compound may have an asymmetric structure. The asymmetric structure may have bipolar characteristics and may be provided by appropriately combining the substituents. The asymmetric structure having bipolar characteristics may help improve the electron transport property, and may help improve the luminous efficiency and performance of device using the same.

In Chemical Formula 2, the substituted or unsubstituted C3 to C30 heteroaryl group may include, e.g., a substituted or unsubstituted imidazolyl group, a substituted or unsubstituted triazolyl group, a substituted or unsubstituted tetrazolyl group, a substituted or unsubstituted carbazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphpyridinyl group, a substituted or unsubstituted quinoxalinyl group, a substituted or unsubstituted quinazolinyl group, a substituted or unsubstituted acridinyl group, a substituted or unsubstituted phenanthrolinyl group, a substituted or unsubstituted phenazinyl group, or the like. A combination thereof may be also included.

In Chemical Formula 2, the substituted or unsubstituted C6 to C30 aryl group may include, e.g., a substituted or unsubstituted phenyl group, a substituted or unsubstituted naphthyl group, a substituted or unsubstituted triperylenyl group, a substituted or unsubstituted fluorenyl group, a substituted or unsubstituted spirofluorenyl group, a substituted or unsubstituted biphenyl group, a substituted or unsubstituted terphenyl group, a substituted or unsubstituted pyrenyl group, a substituted or unsubstituted perylenyl group, a substituted or unsubstituted phenanthrenyl group, a substituted or unsubstituted anthracenyl group, or the like. A combination thereof may be also included.

In an implementation, at least one of $Ar^1$ or $Ar^2$ may be a substituted or unsubstituted C3 to C30 heteroaryl group. In this case, the electron characteristic of the entire compound may be further enforced by the electron characteristics of the heteroaryl groups.

In an implementation, $Ar^1$ may be a substituted or unsubstituted C3 to C30 heteroaryl group, and $Ar^2$ and $Ar^3$ may each independently be a substituted or unsubstituted C6 to C30 aryl group. Thus, the molecule polarity may be controlled to help improve electron injection and transport capability.

Ar2 may be a substituted or unsubstituted C3 to C30 heteroaryl group, and Ar1 and Ar3 may each independently be a substituted or unsubstituted C6 to C30 aryl group. By polarizing the molecular polarity when having the structure, electron injecting and transporting properties may be improved.

By appropriately combining the substituent, the compound may have excellent thermal stability and excellent resistance to oxidation.

$L^1$ to $L^3$ may each independently be, e.g., a substituted or unsubstituted ethenylene, a substituted or unsubstituted ethynylene, a substituted or unsubstituted phenylene, a substituted or unsubstituted biphenylene, a substituted or unsubstituted naphthalene, a substituted or unsubstituted pyridinylene, a substituted or unsubstituted pyrimidinylene, a substituted or unsubstituted triazinylene, or the like.

For example, $L^1$ to $L^3$ may have a π-bond. Thus, a triplet energy bandgap may be increased by controlling a total π-conjugation length of the compound, so as to be very usefully applied to the emission layer of an organic photoelectric device as phosphorescent host. In an implementation, the linking groups $L^1$ to $L^3$ may be not present, e.g., m, n, and/or o may be 0.

In an implementation, $R^1$ and $R^2$ may each independently be hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof.

The entire compound may have a bulk structure by controlling the substituents, so the crystallinity may be decreased. When the crystallinity of the entire compound is decreased, the life-span of organic photoelectric device using the same may be prolonged.

In an implementation, the compound for an organic optoelectronic device may be represented by one of the following Chemical Formulae A1 to A189.

[Chemical Formula A1]

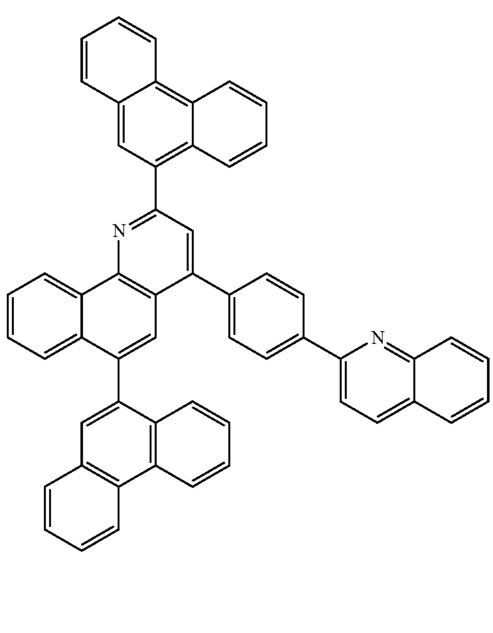

-continued

[Chemical Formula A2]

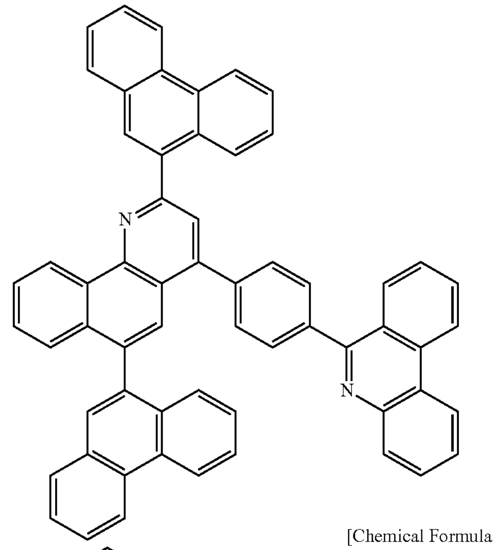

[Chemical Formula A3]

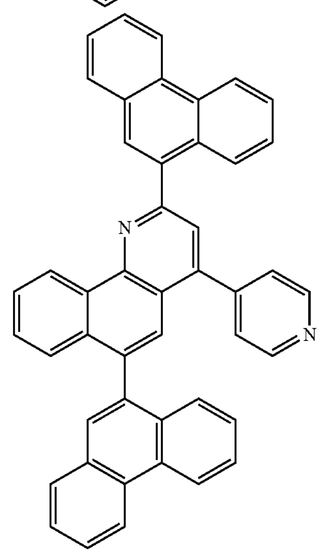

[Chemical Formula A4]

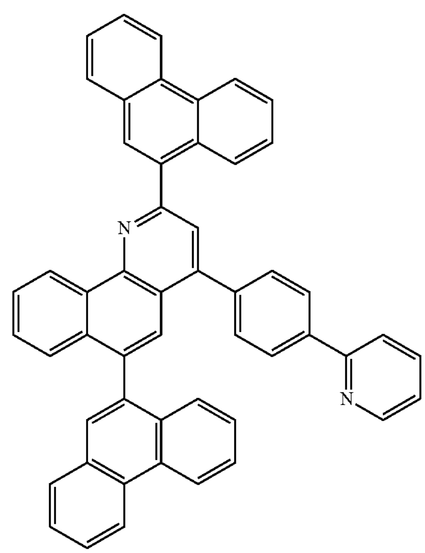

-continued
[Chemical Formula A5]
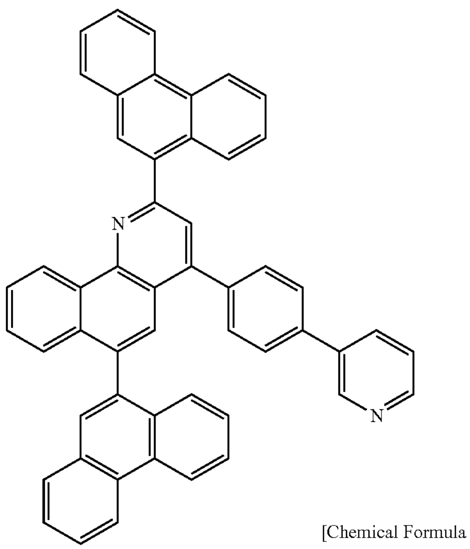
[Chemical Formula A6]
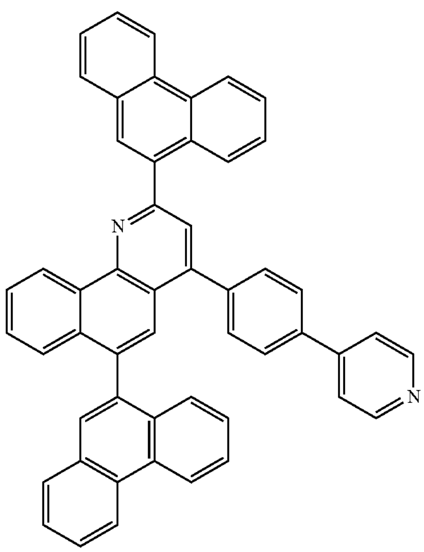
[Chemical Formula A7]
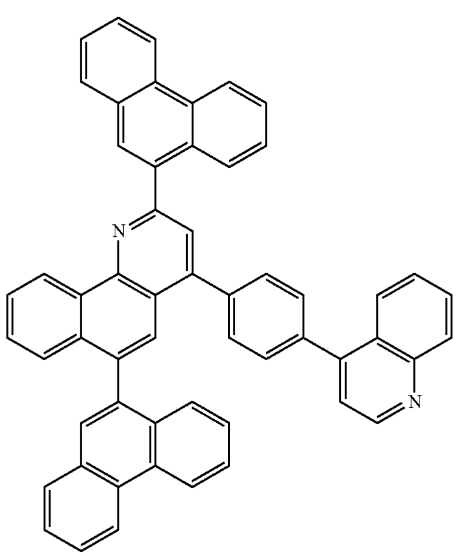
-continued
[Chemical Formula A8]
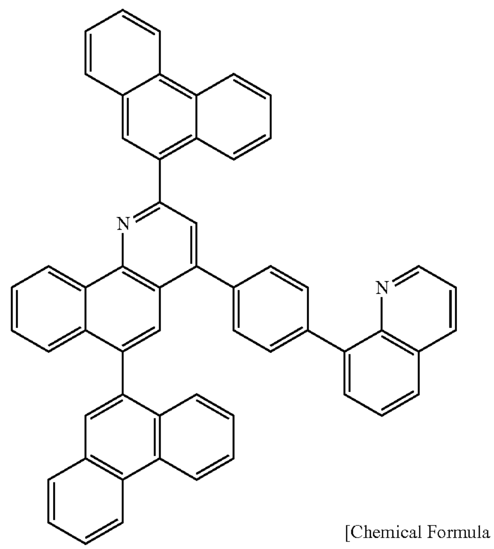
[Chemical Formula A9]
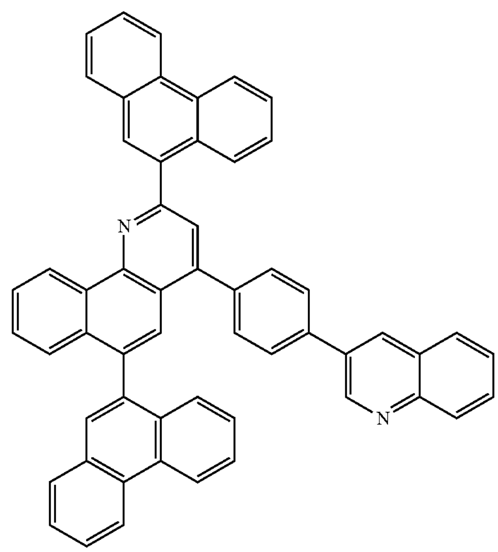
[Chemical Formula A10]
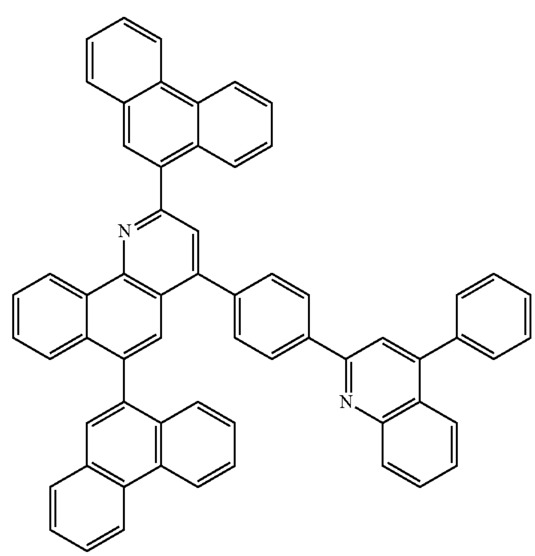

-continued
[Chemical Formula A11]
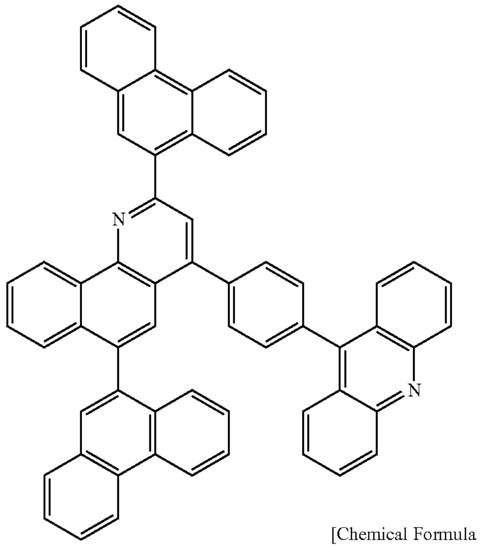
[Chemical Formula A12]
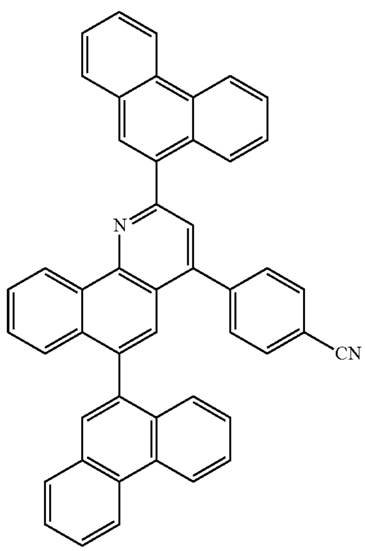
[Chemical Formula A13]
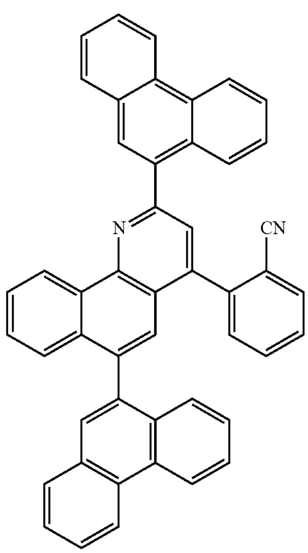
-continued
[Chemical Formula A14]
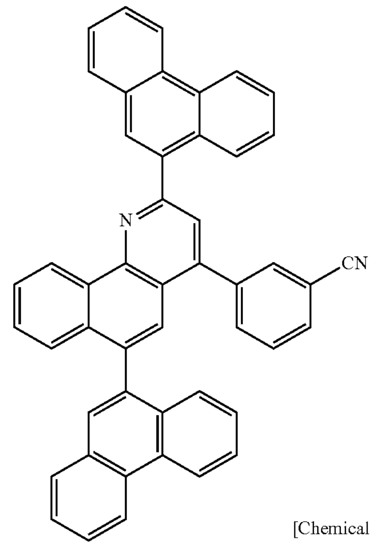
[Chemical Formula A15]
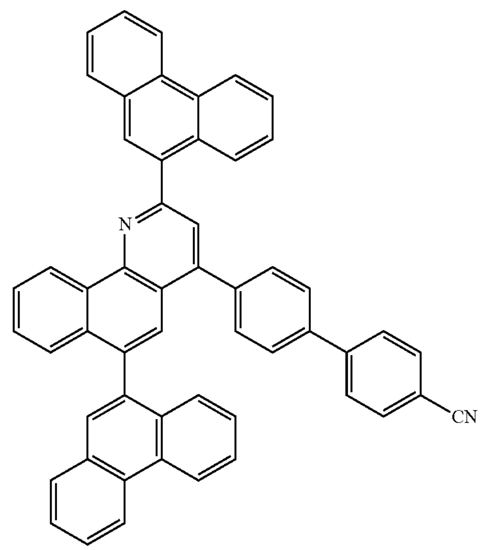
[Chemical Formula A16]
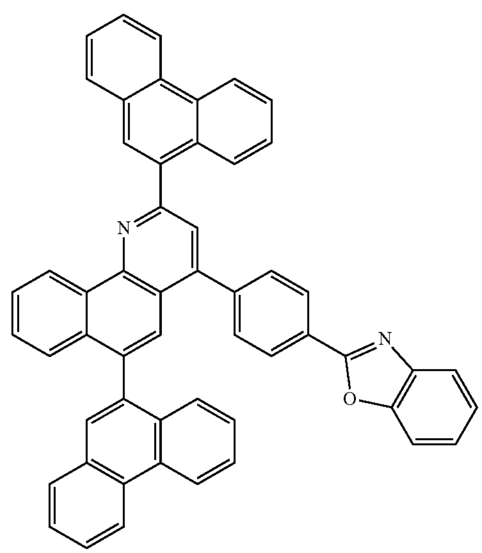

-continued
[Chemical Formula A17]
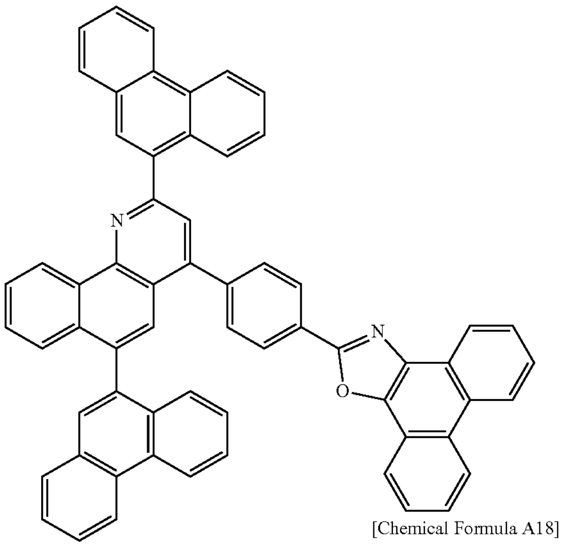
[Chemical Formula A18]
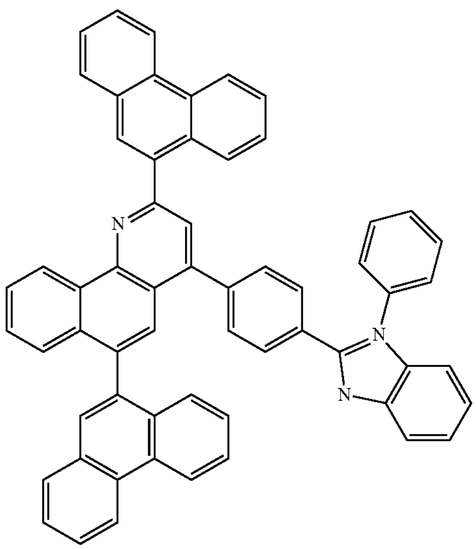
[Chemical Formula A19]
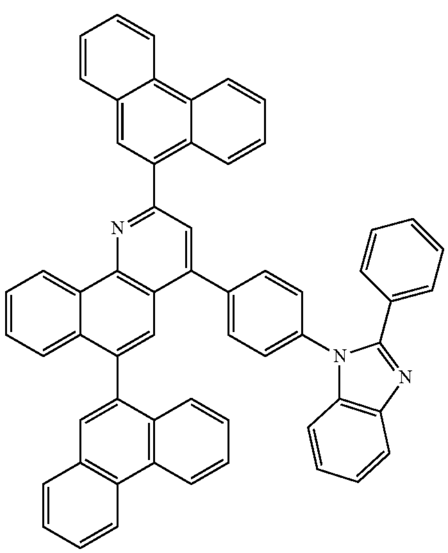
-continued
[Chemical Formula A20]
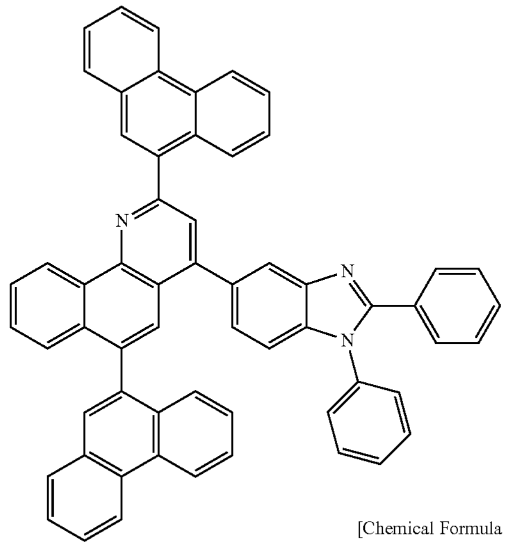
[Chemical Formula A21]
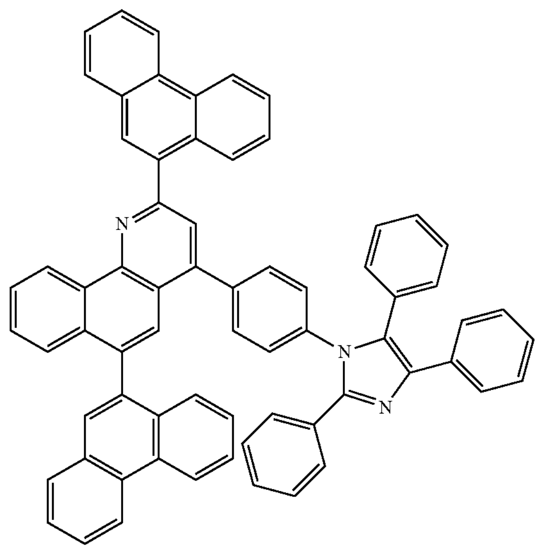
[Chemical Formula A22]
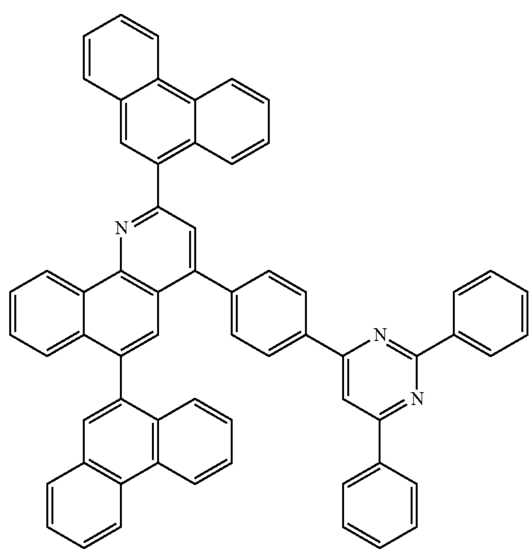

-continued
[Chemical Formula A23]
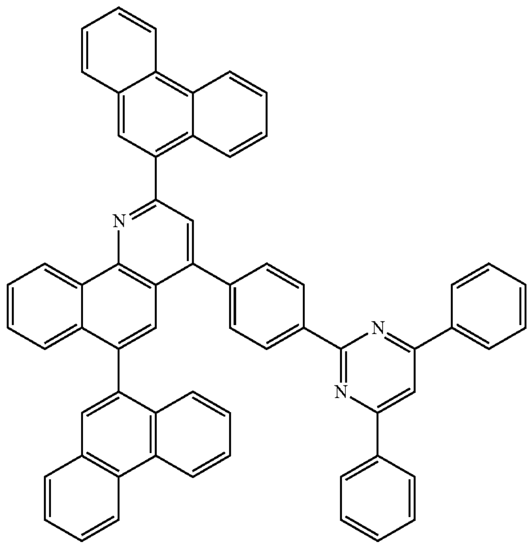
[Chemical Formula A24]
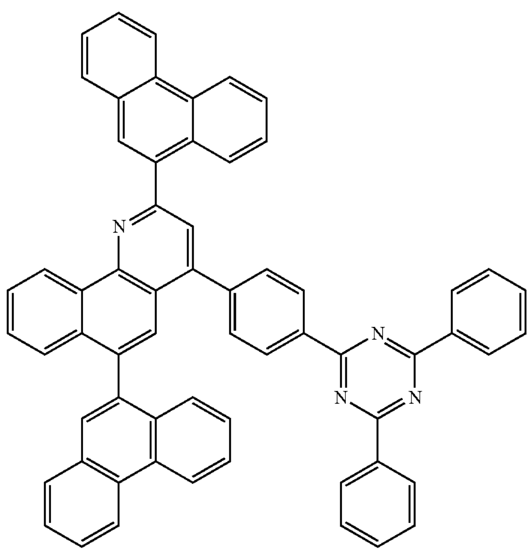
[Chemical Formula A25]
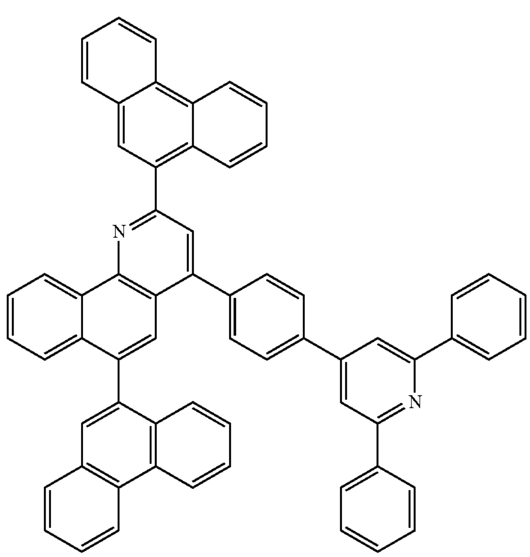
-continued
[Chemical Formula A26]
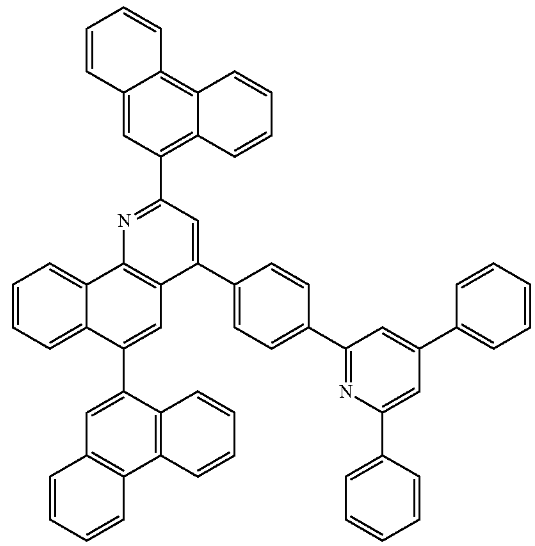
[Chemical Formula A27]
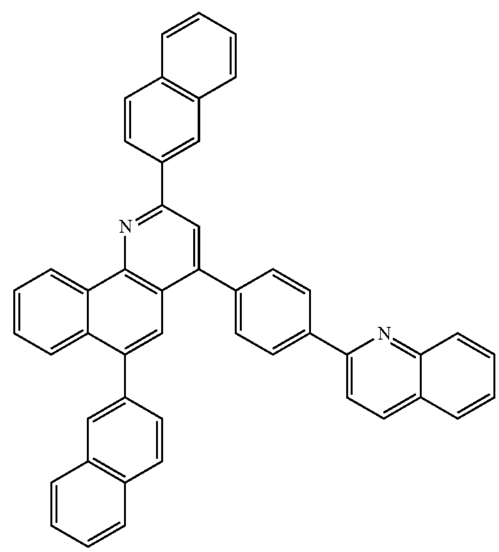
[Chemical Formula A28]
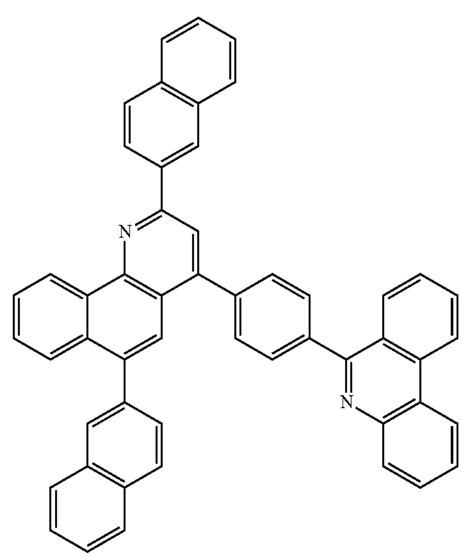

-continued
[Chemical Formula A29]
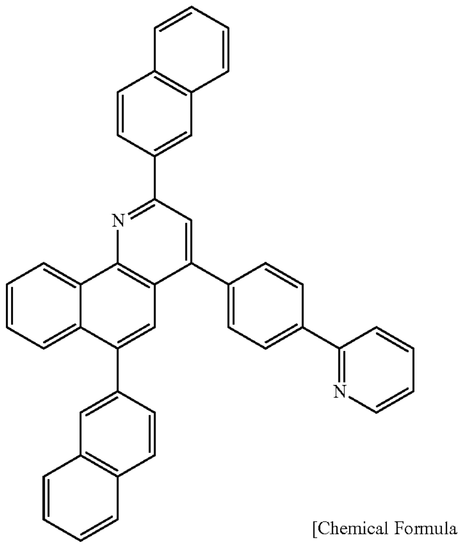
[Chemical Formula A30]
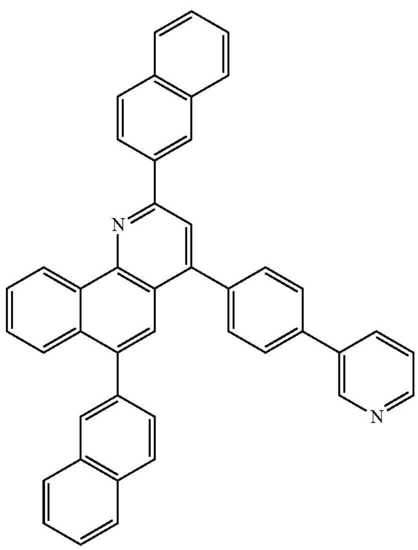
[Chemical Formula A31]
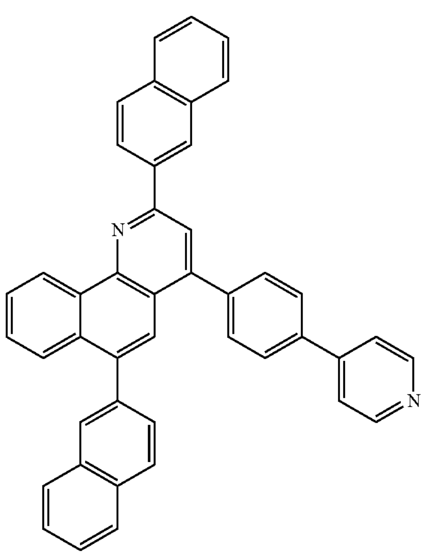
-continued
[Chemical Formula A32]
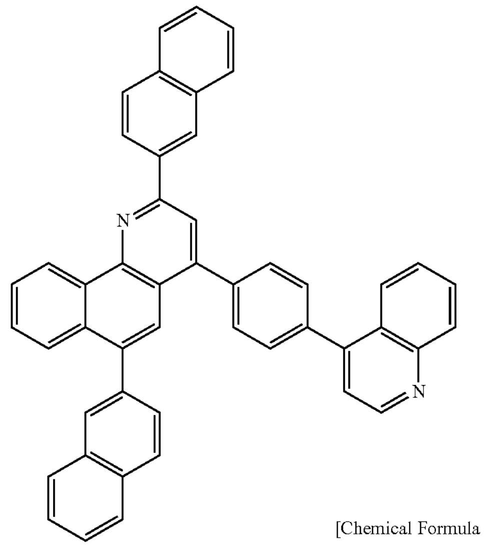
[Chemical Formula A33]
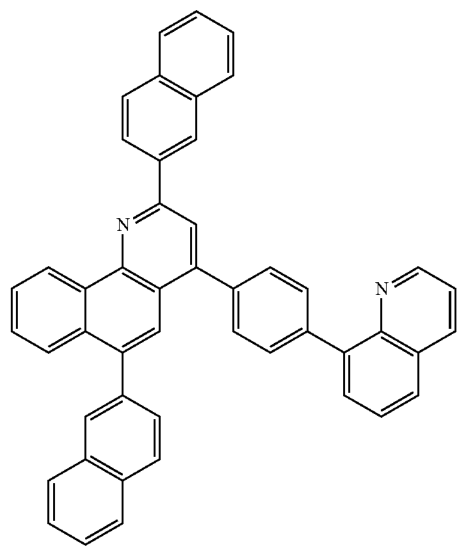
[Chemical Formula A34]
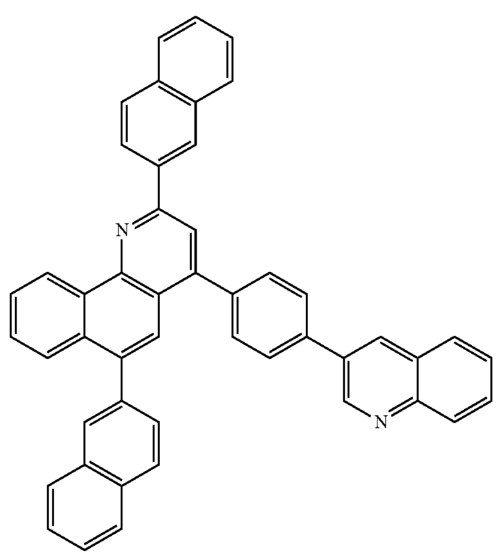

[Chemical Formula A35]
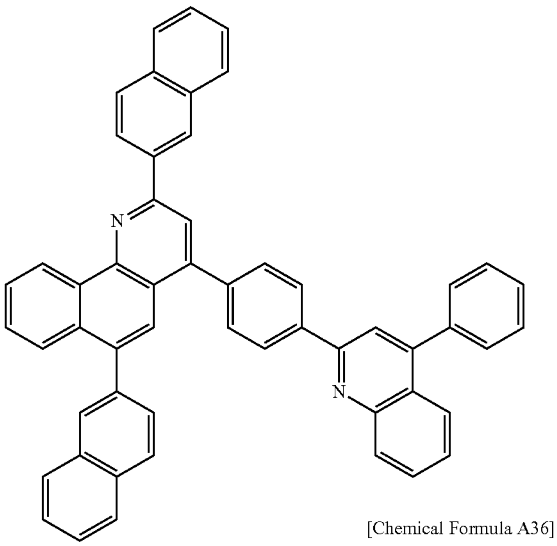
[Chemical Formula A36]
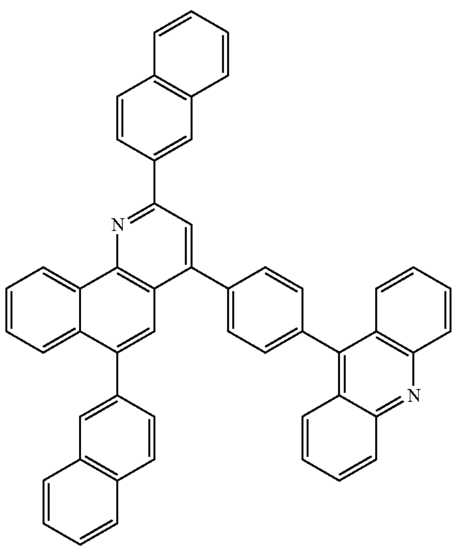
[Chemical Formula A37]
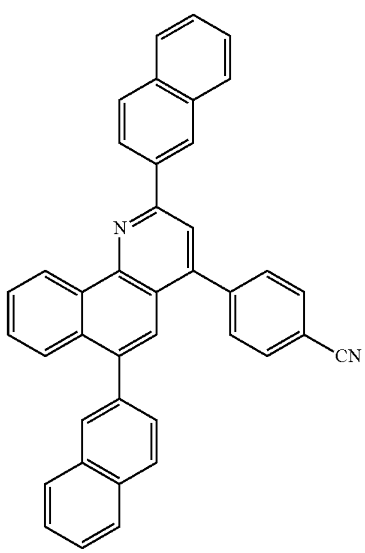
[Chemical Formula A38]
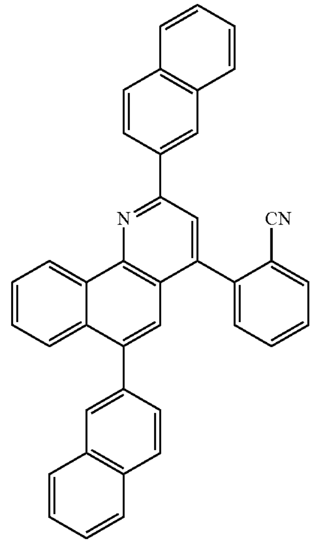
[Chemical Formula A39]
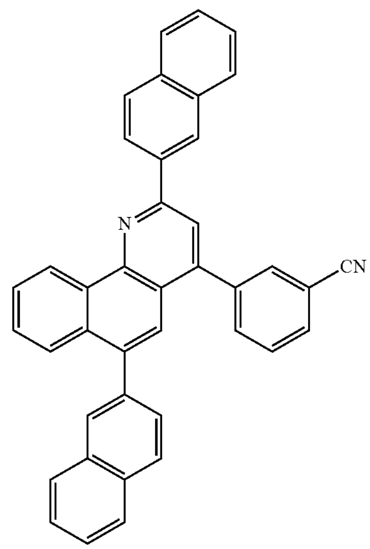
[Chemical Formula A40]
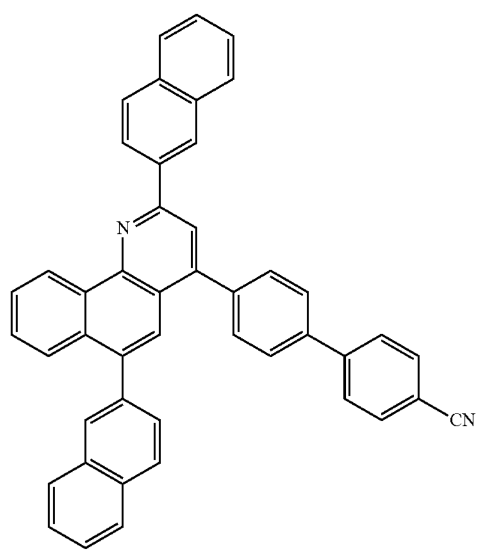

[Chemical Formula A41]
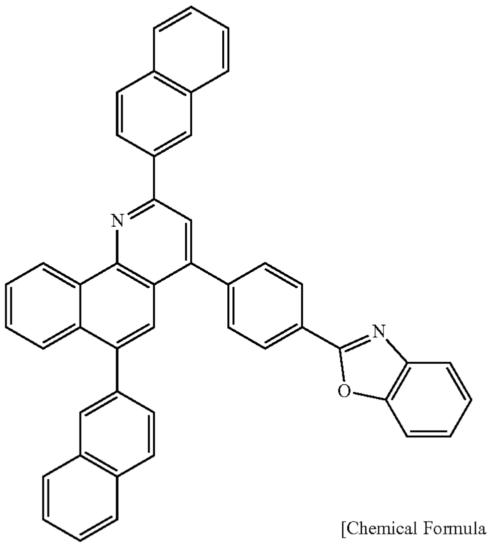
[Chemical Formula A42]
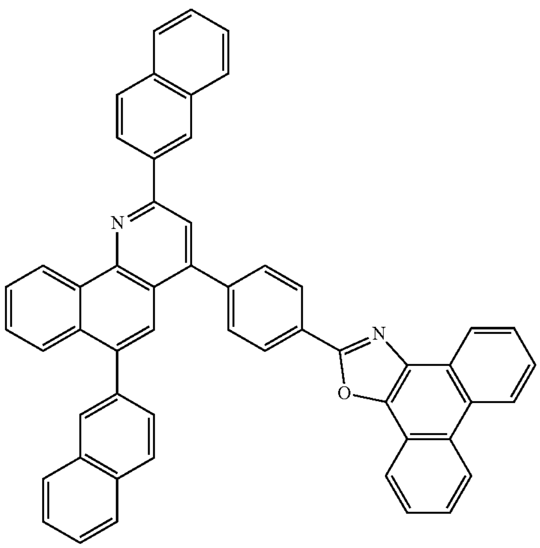
[Chemical Formula A43]
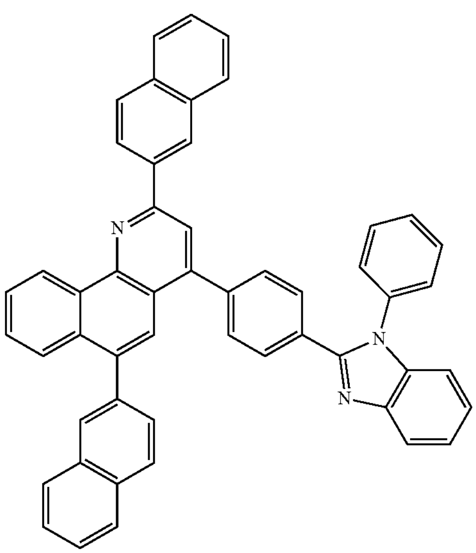
-continued
[Chemical Formula A44]
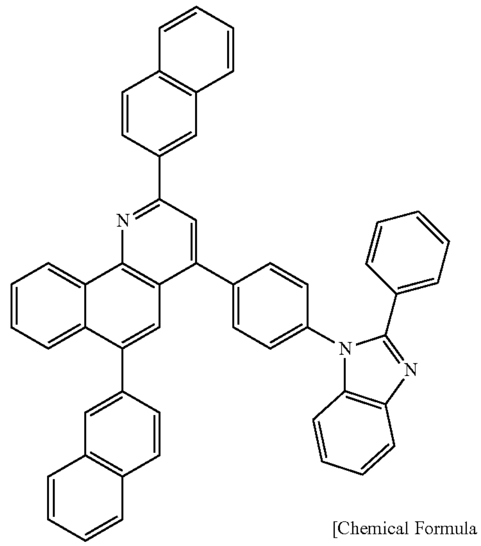
[Chemical Formula A45]
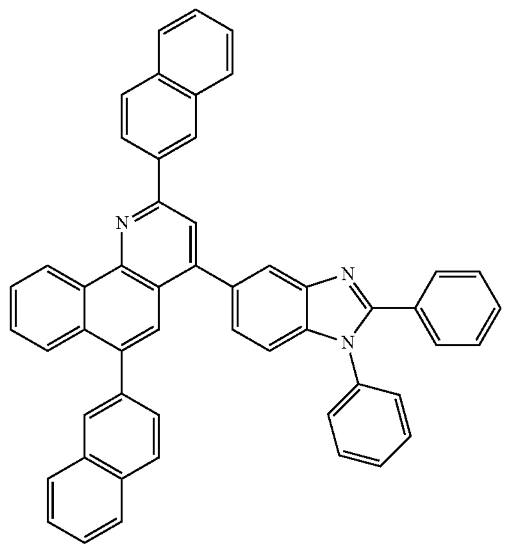
[Chemical Formula A46]
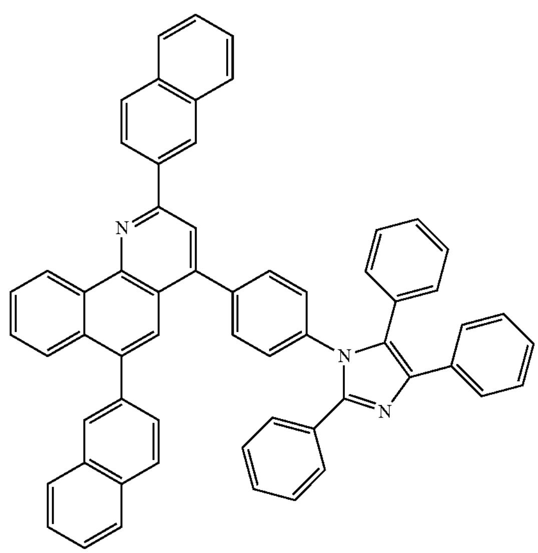

-continued
[Chemical Formula A47]
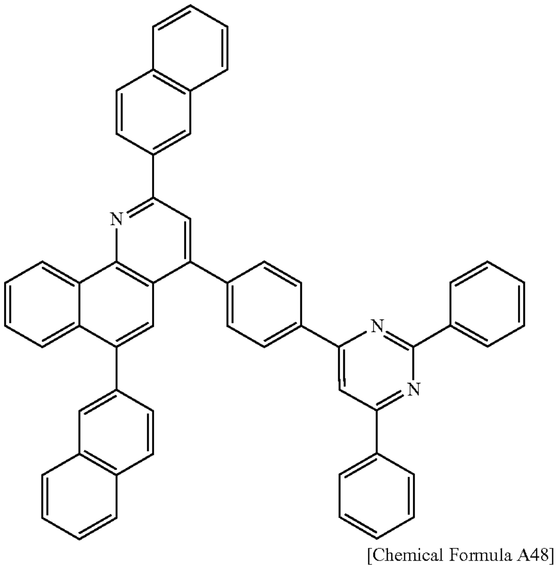
[Chemical Formula A48]
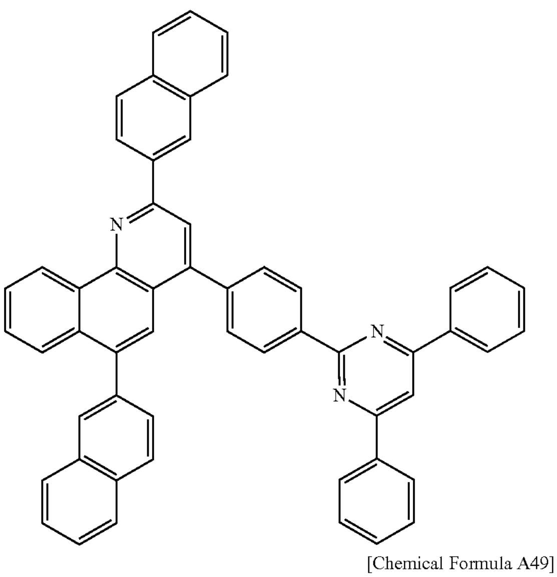
[Chemical Formula A49]
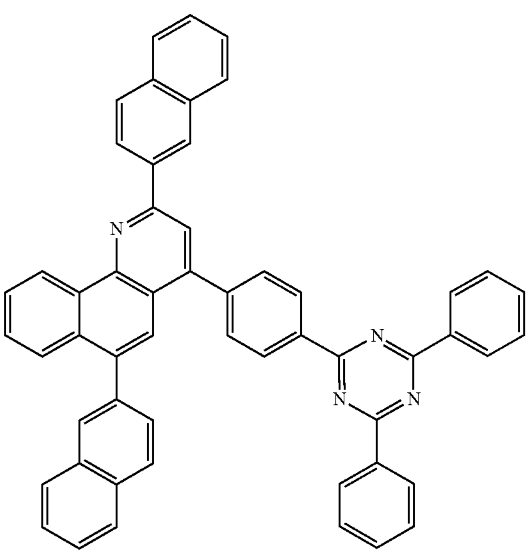
-continued
[Chemical Formula A50]
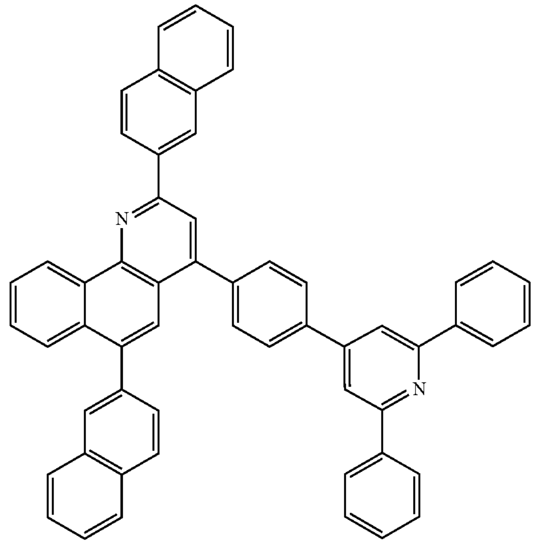
[Chemical Formula A51]
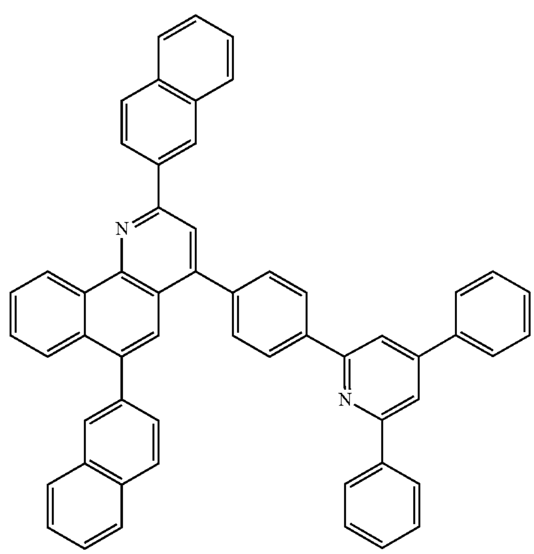

[Chemical Formula A52]
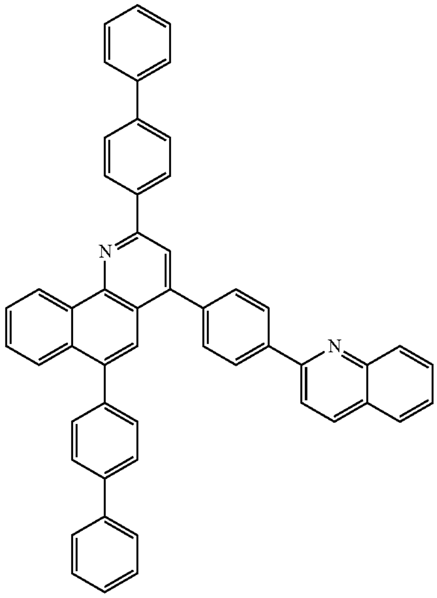
[Chemical Formula A53]
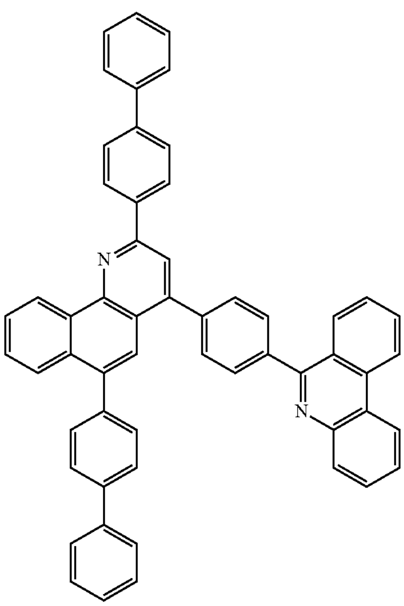
[Chemical Formula A54]
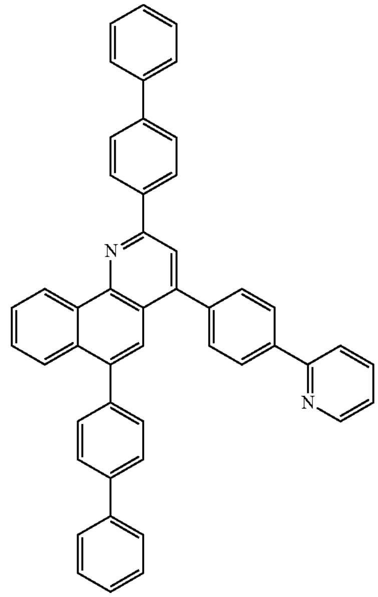
[Chemical Formula A55]
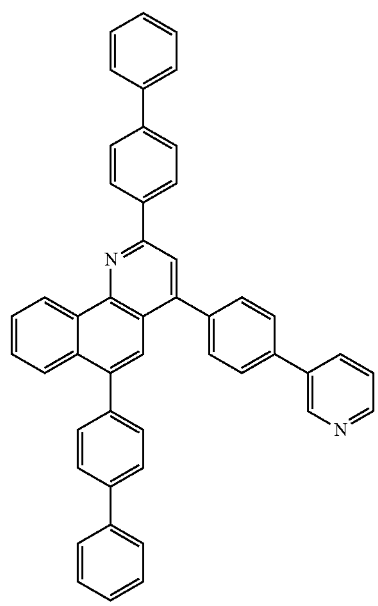

-continued
[Chemical Formula A56]
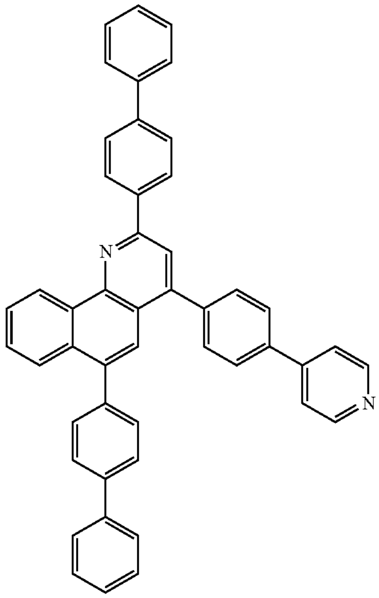
[Chemical Formula A57]
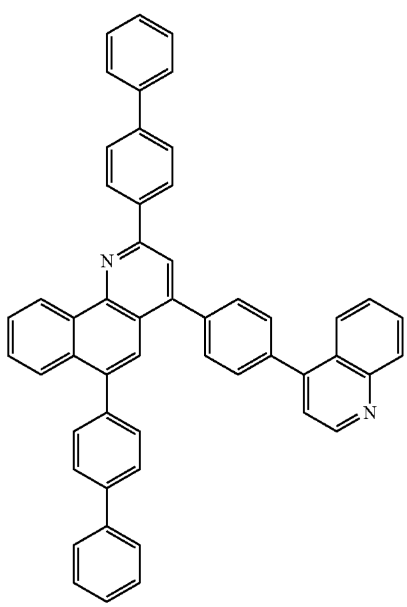
-continued
[Chemical Formula A58]
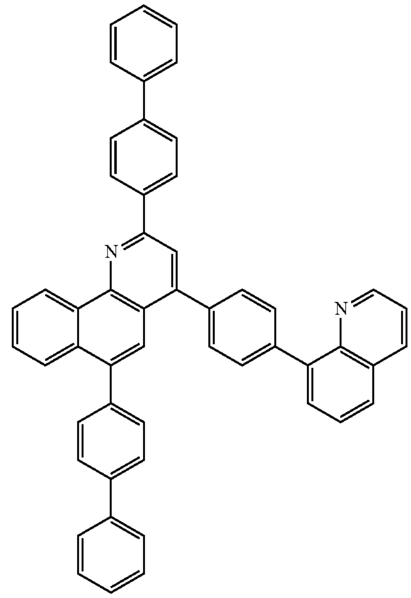
[Chemical Formula A59]
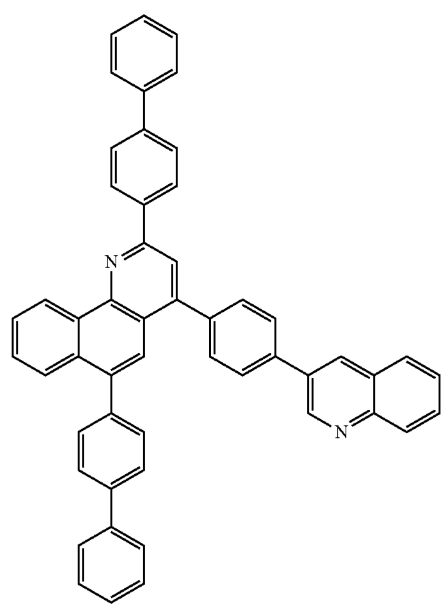

-continued
[Chemical Formula A60]
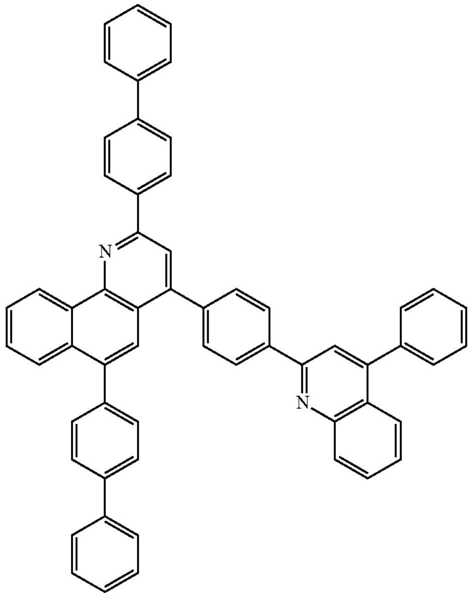
[Chemical Formula A61]
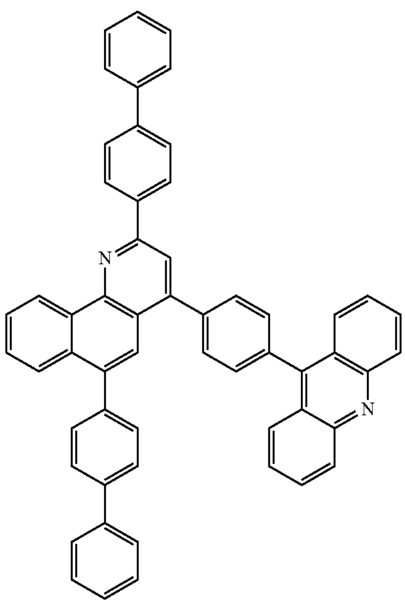
-continued
[Chemical Formula A62]
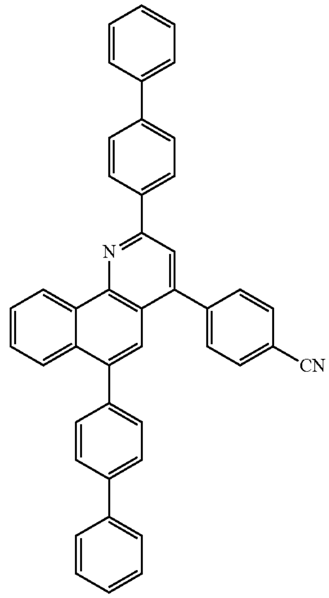
[Chemical Formula A63]
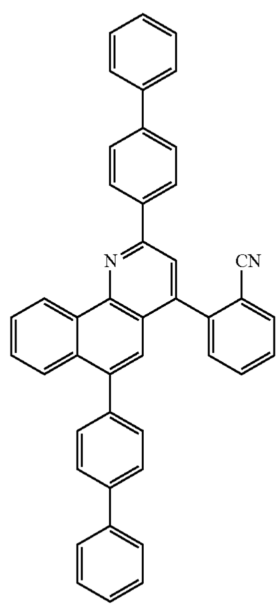

-continued
[Chemical Formula A64]
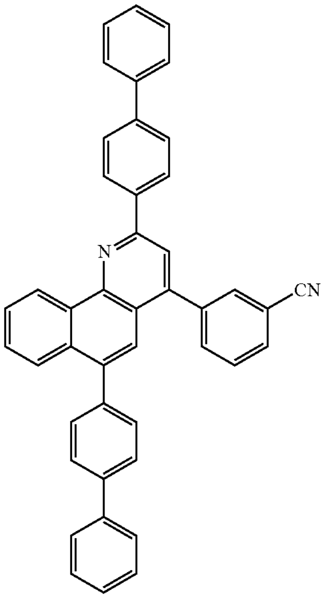
[Chemical Formula A65]
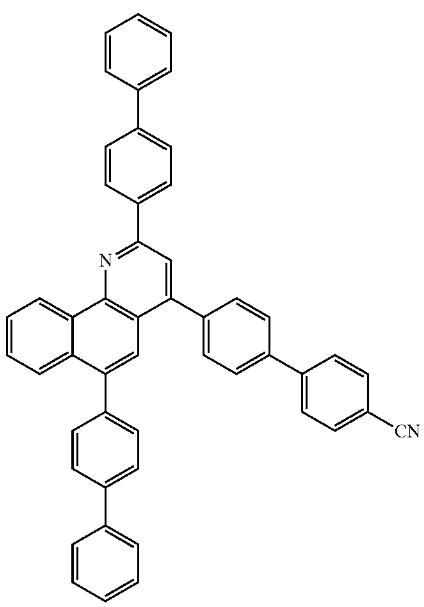
-continued
[Chemical Formula A66]
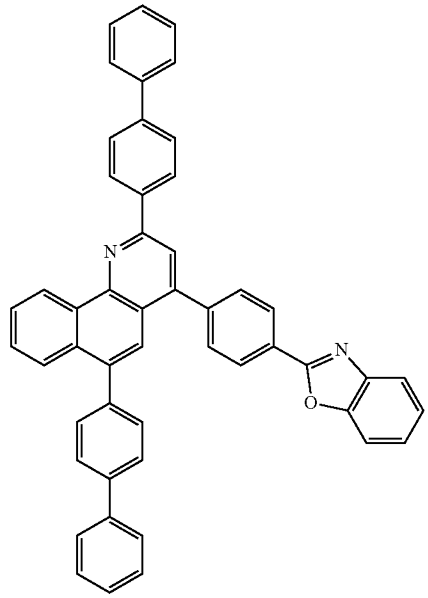
[Chemical Formula A67]
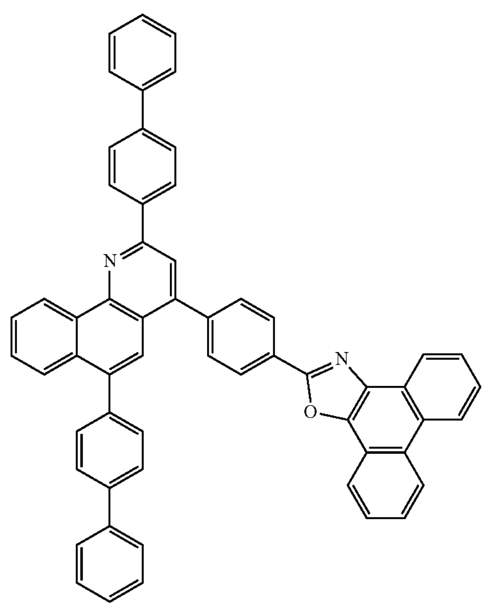

-continued
[Chemical Formula A68]
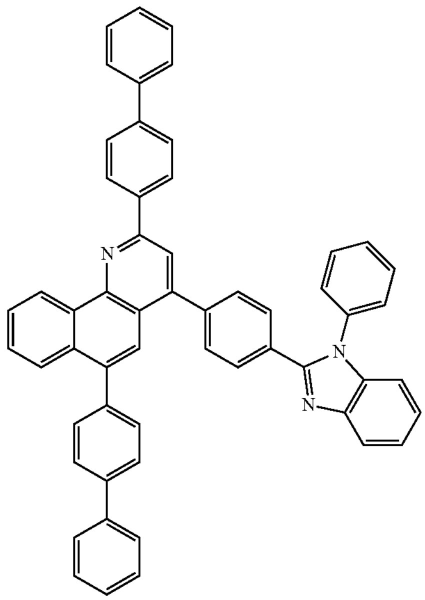
[Chemical Formula A69]
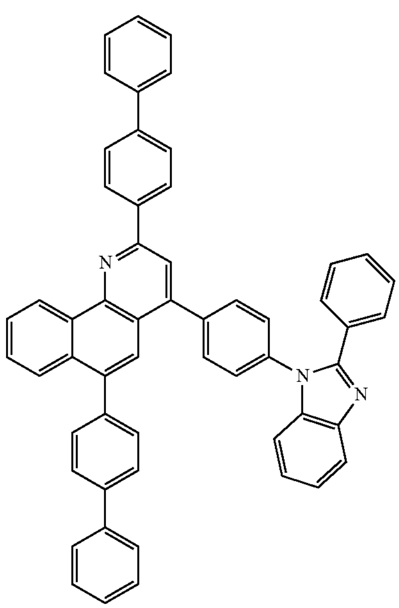
-continued
[Chemical Formula A70]
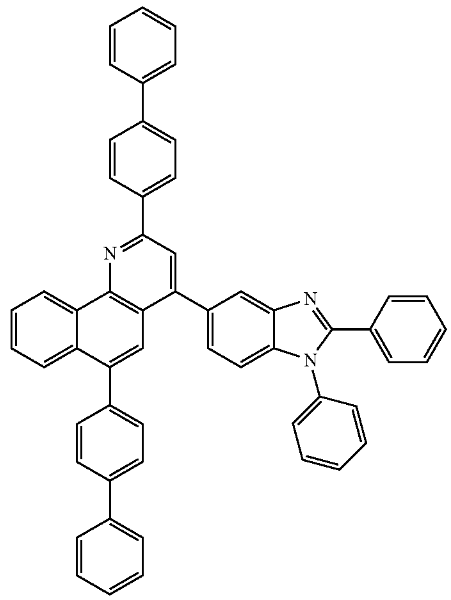
[Chemical Formula A71]
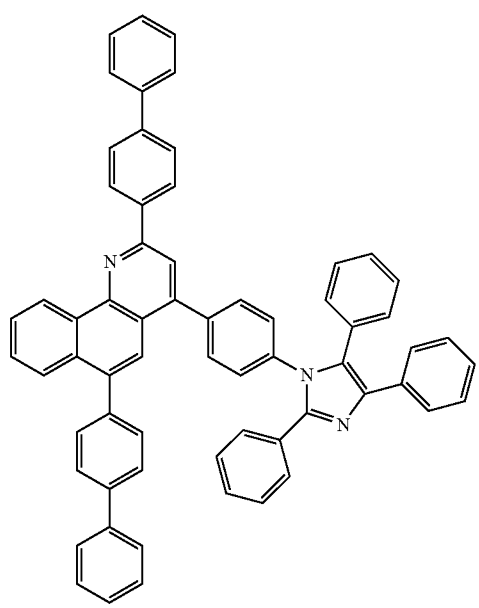

[Chemical Formula A72]
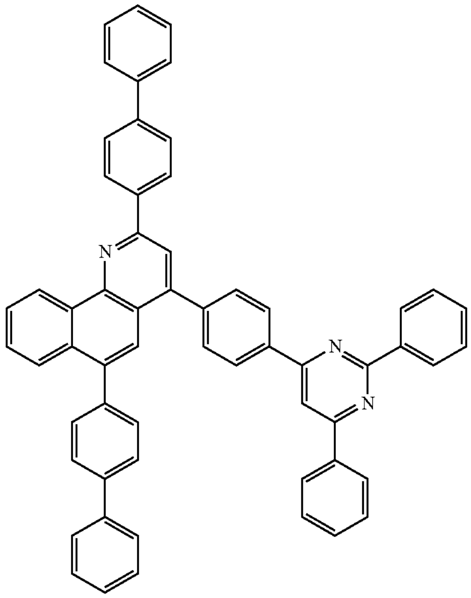
[Chemical Formula A73]
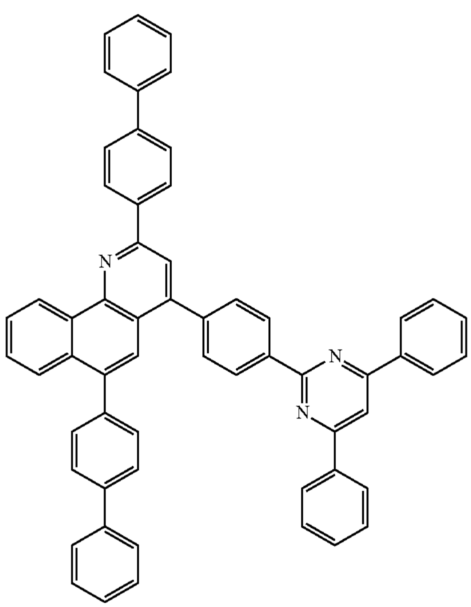
[Chemical Formula A74]
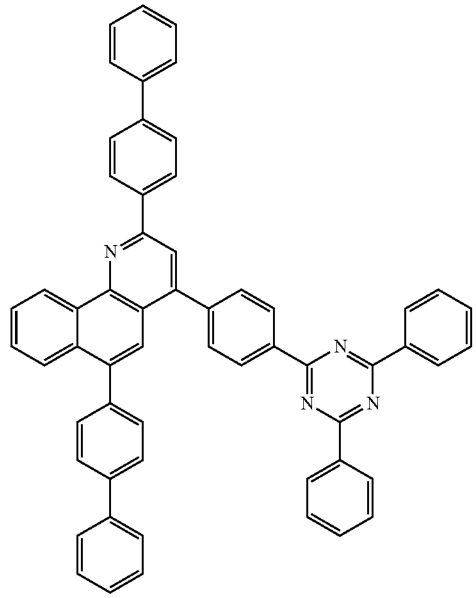
[Chemical Formula A75]
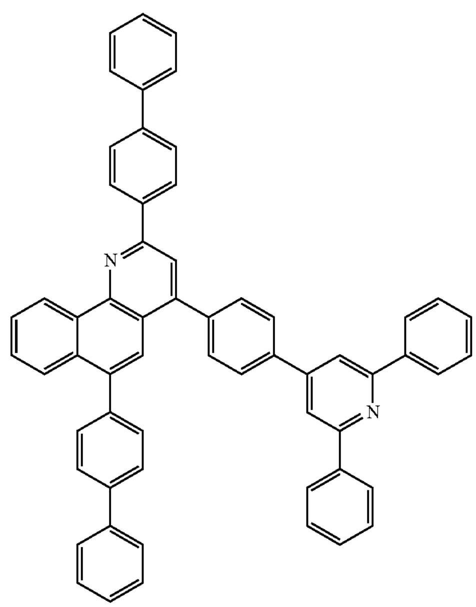

[Chemical Formula A76]
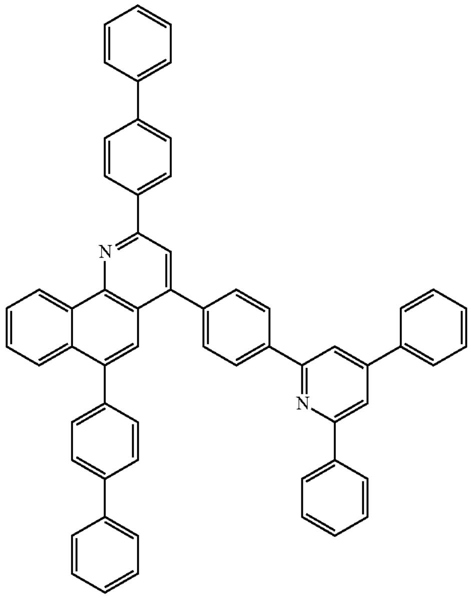
[Chemical Formula A77]
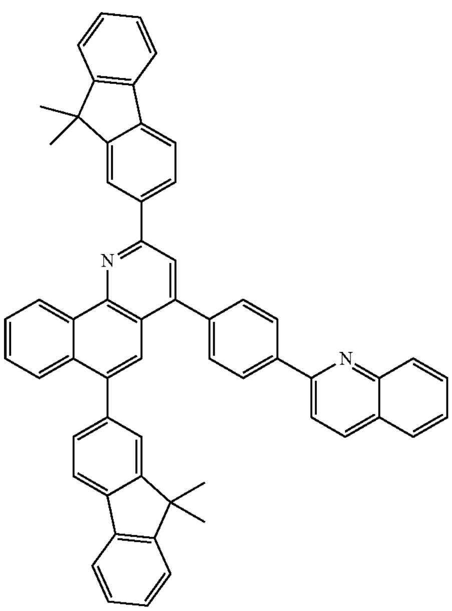
[Chemical Formula A78]
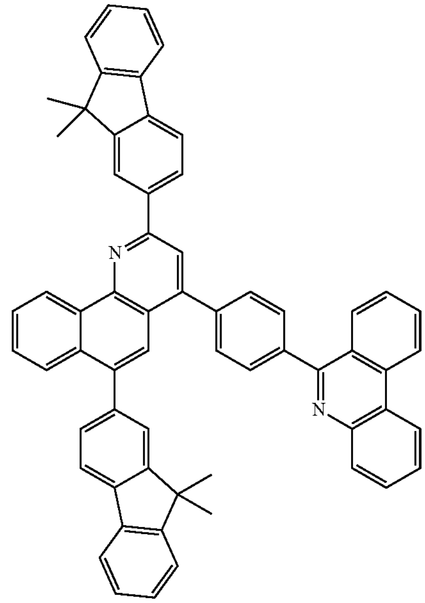
[Chemical Formula A79]
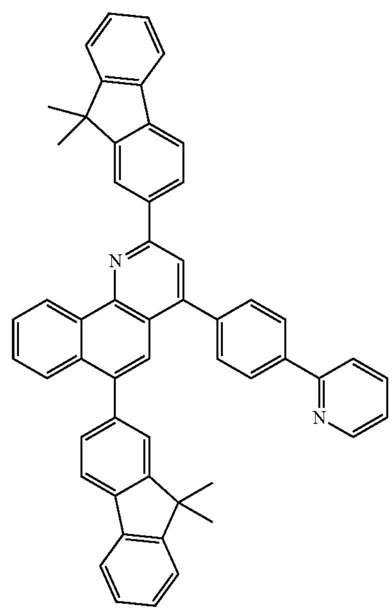

[Chemical Formula A80]
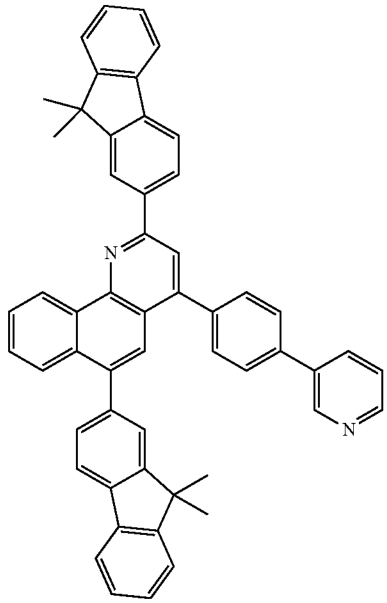
[Chemical Formula A81]
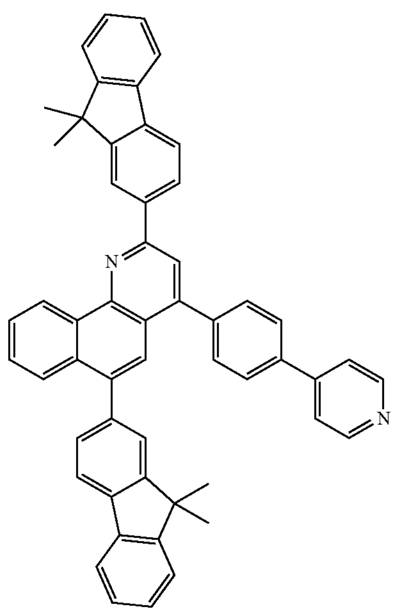
[Chemical Formula A82]
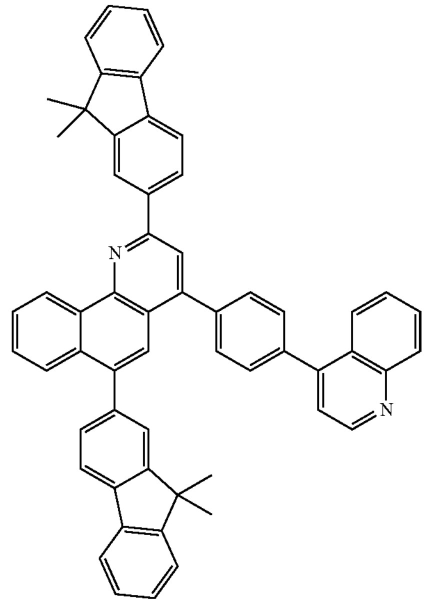
[Chemical Formula A83]
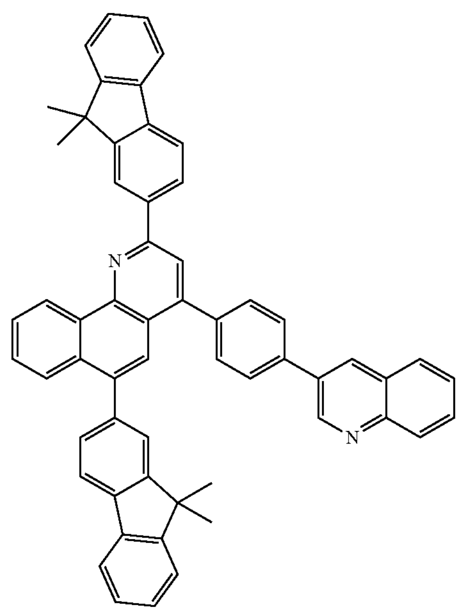

-continued
[Chemical Formula A84]
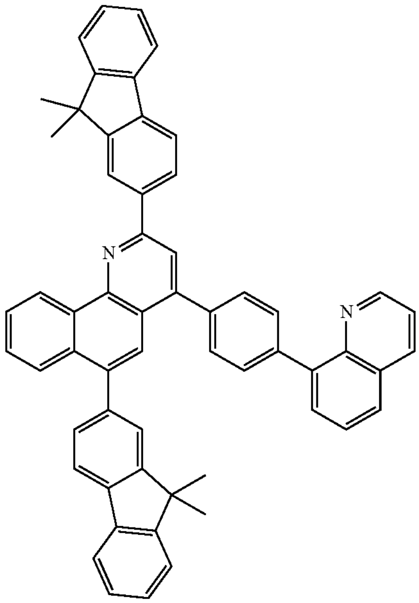
[Chemical Formula A85]
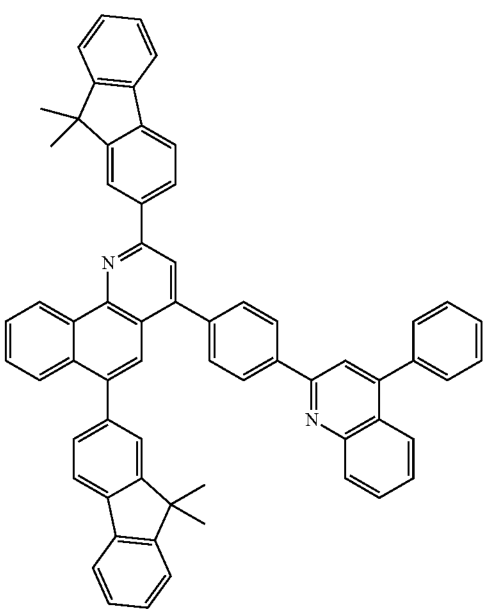
-continued
[Chemical Formula A86]
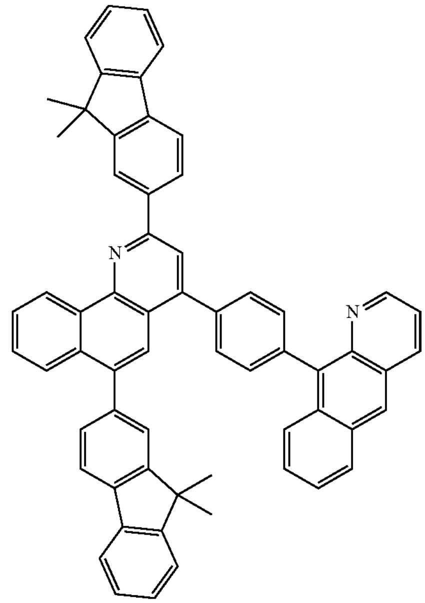
[Chemical Formula A87]
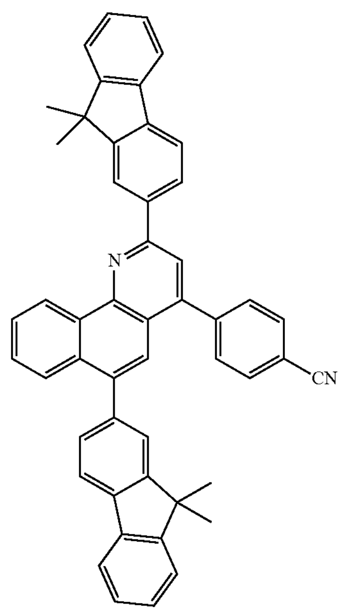

[Chemical Formula A88]
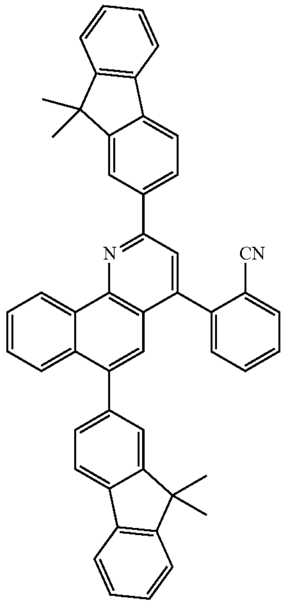
[Chemical Formula A89]
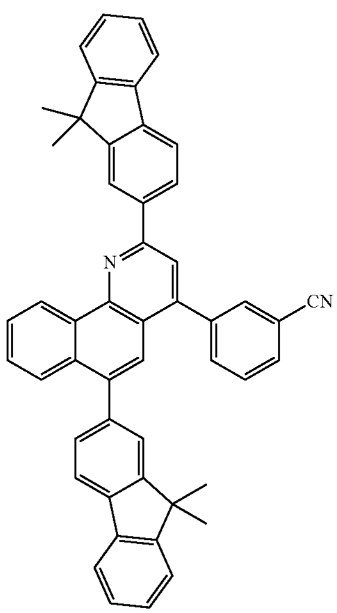
[Chemical Formula A90]
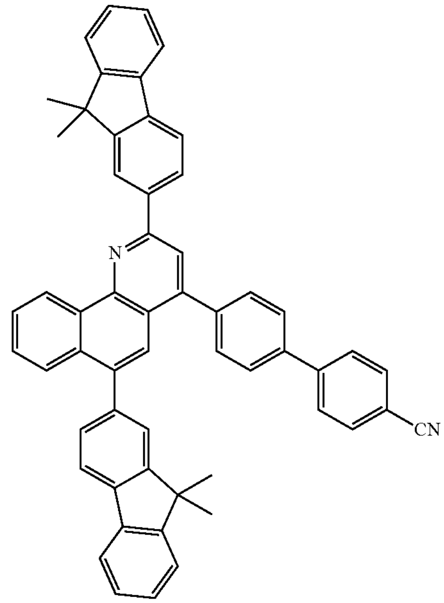
[Chemical Formula A91]
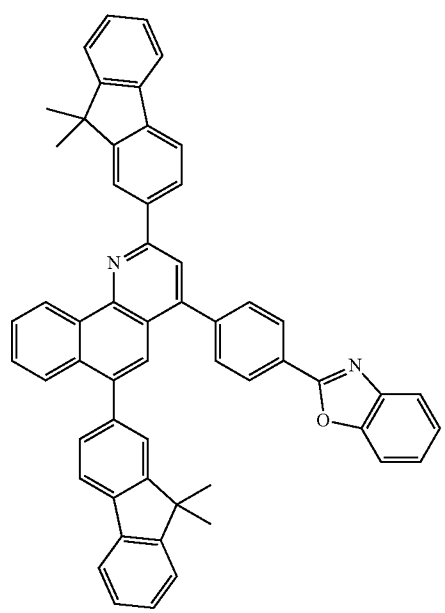

-continued
[Chemical Formula A92]
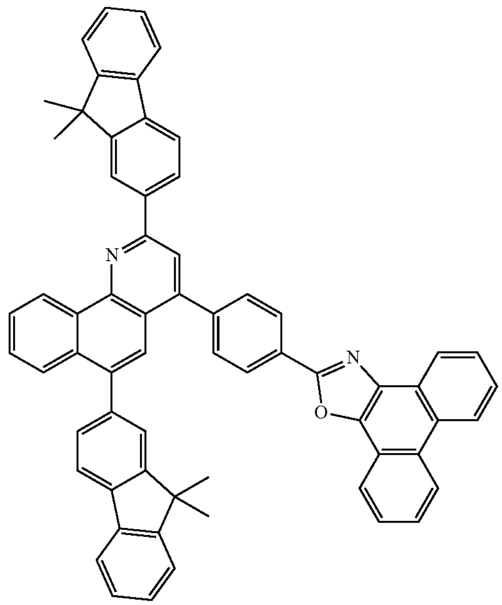
[Chemical Formula A93]
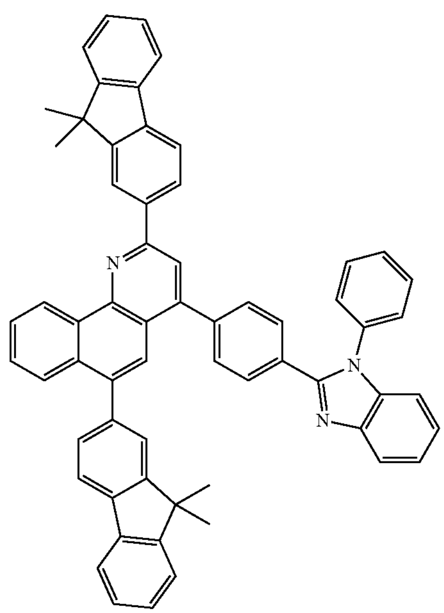
-continued
[Chemical Formula A94]
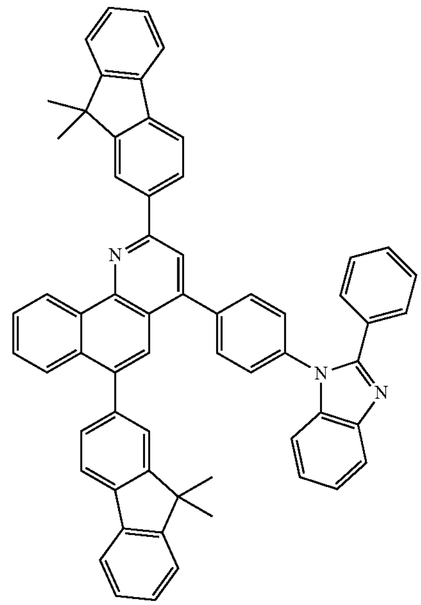
[Chemical Formula A95]
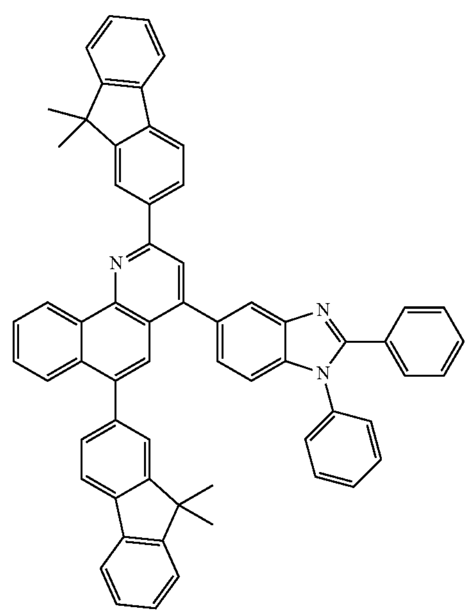

[Chemical Formula A96]
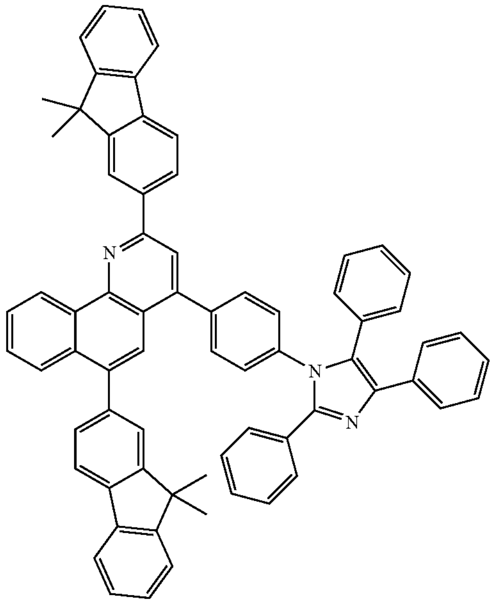
[Chemical Formula A97]
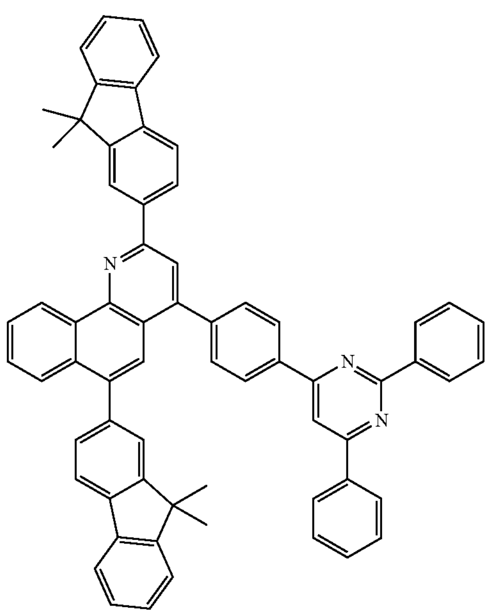
[Chemical Formula A98]
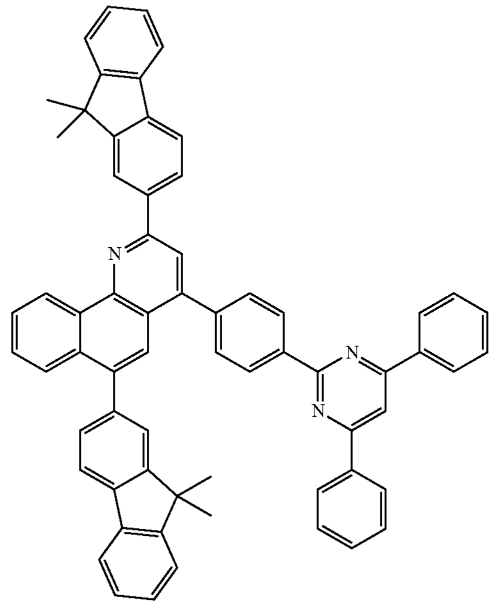
[Chemical Formula A99]
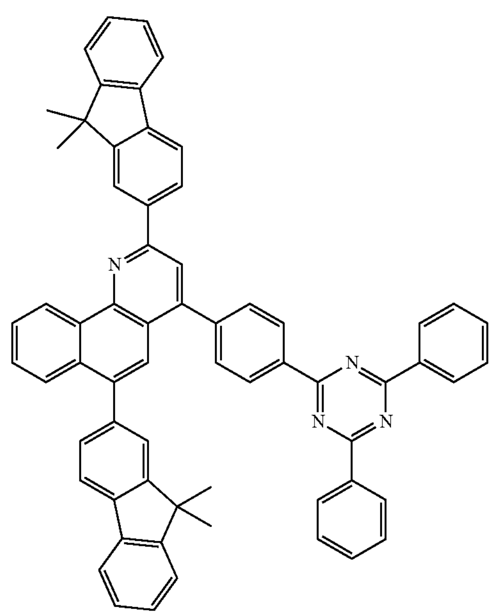

-continued
[Chemical Formula A100]
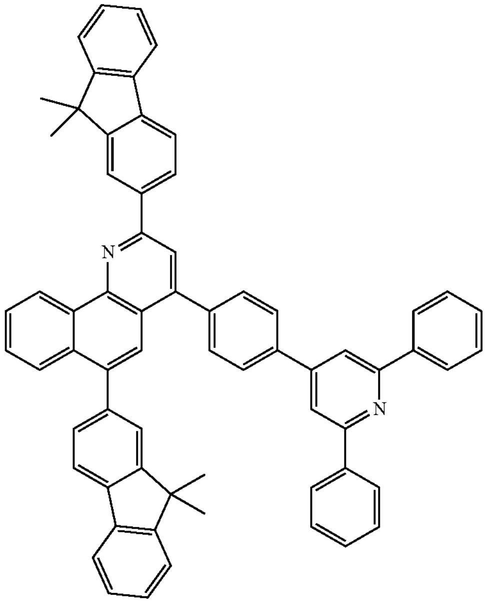
[Chemical Formula A101]
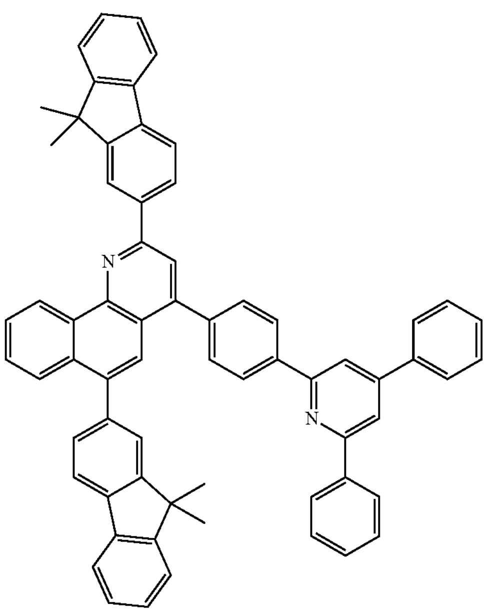
-continued
[Chemical Formula A102]
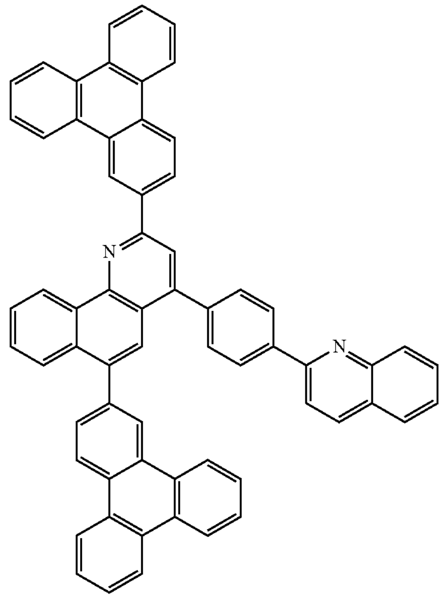
[Chemical Formula A103]
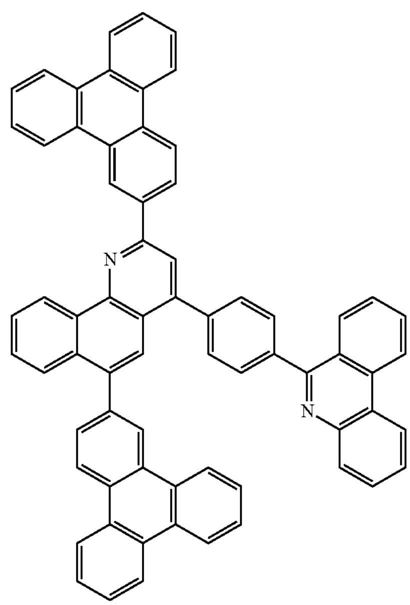

-continued
[Chemical Formula A014]
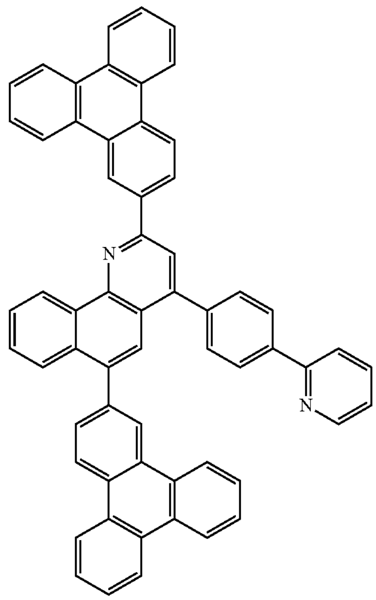
[Chemical Formula A105]
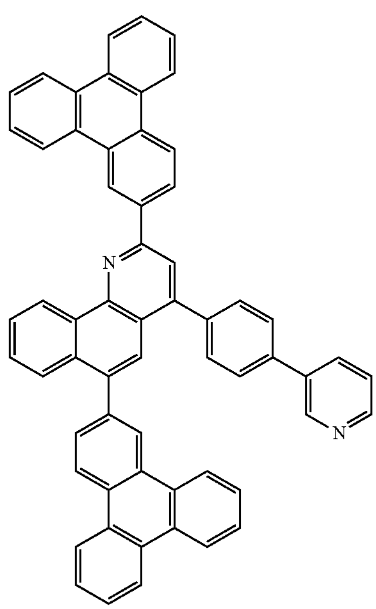
-continued
[Chemical Formula A106]
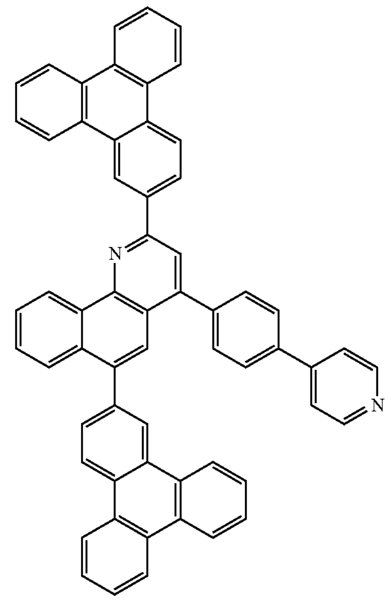
[Chemical Formula A017]
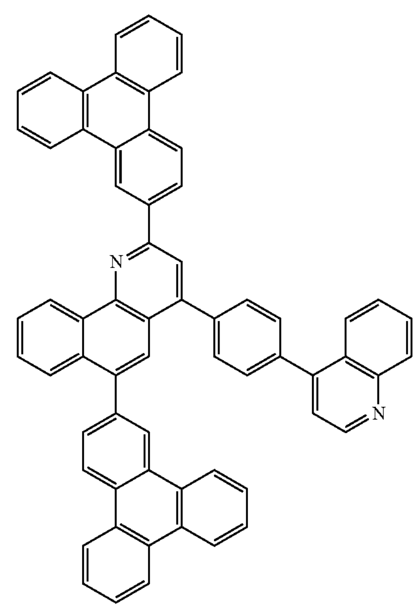

-continued
[Chemical Formula A108]
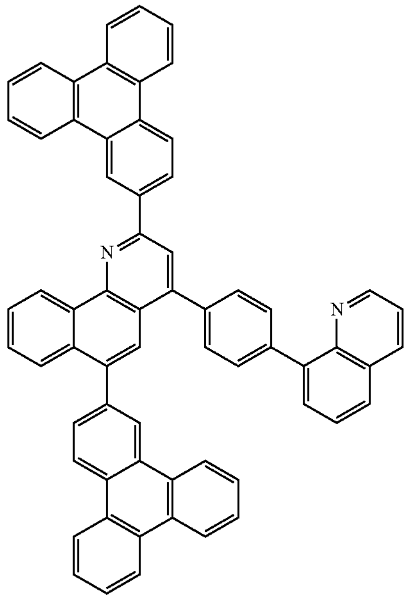
[Chemical Formula A109]
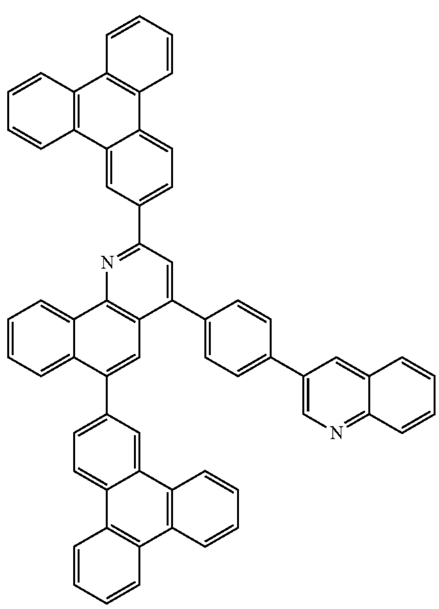
-continued
[Chemical Formula A110]
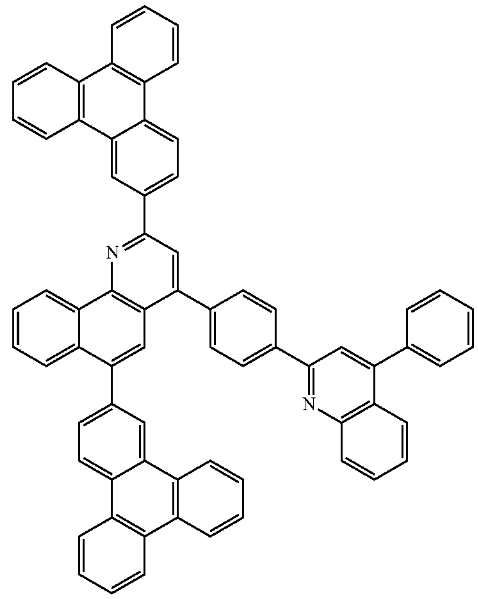
[Chemical Formula A111]
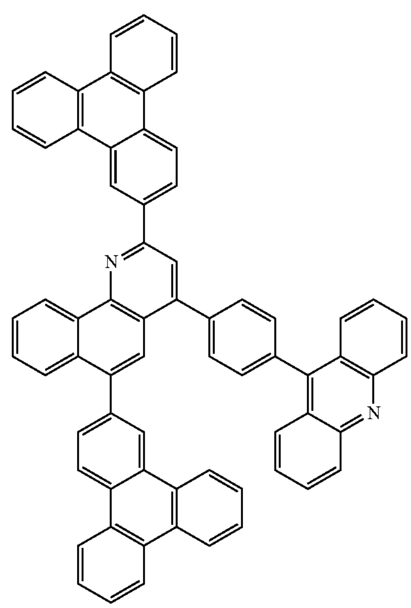

-continued
[Chemical Formula A112]
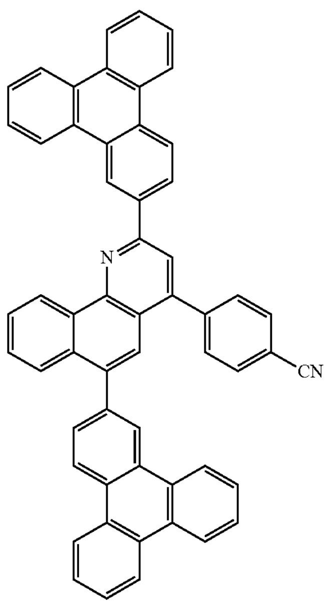
[Chemical Formula A113]
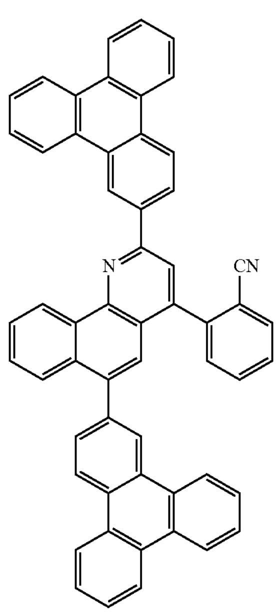
-continued
[Chemical Formula A114]
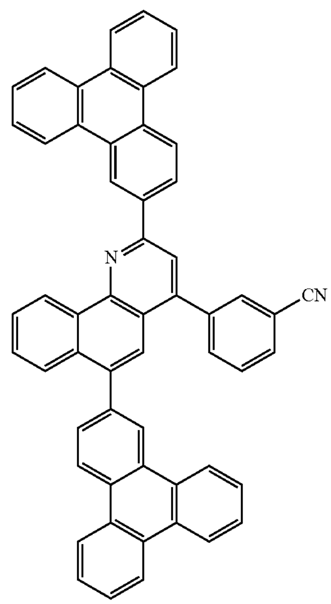
[Chemical Formula A115]
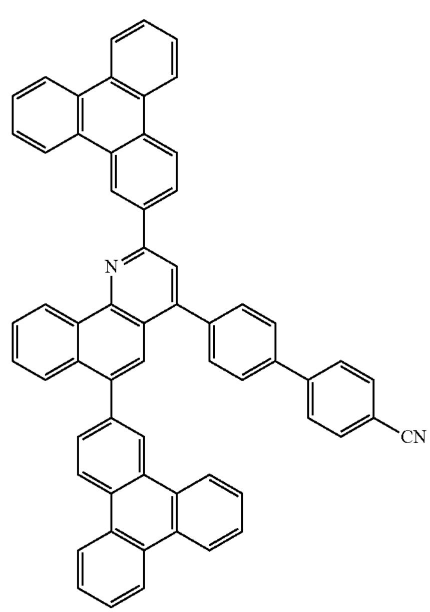

[Chemical Formula A116]
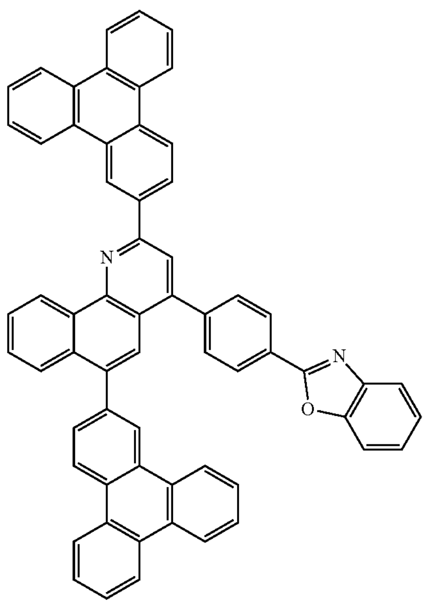
[Chemical Formula A117]
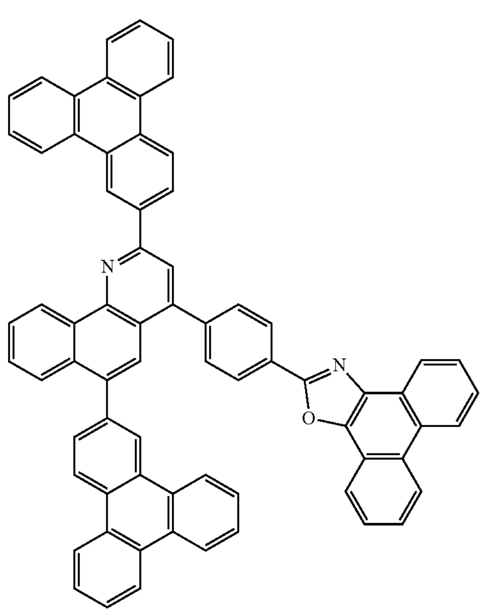
[Chemical Formula A118]
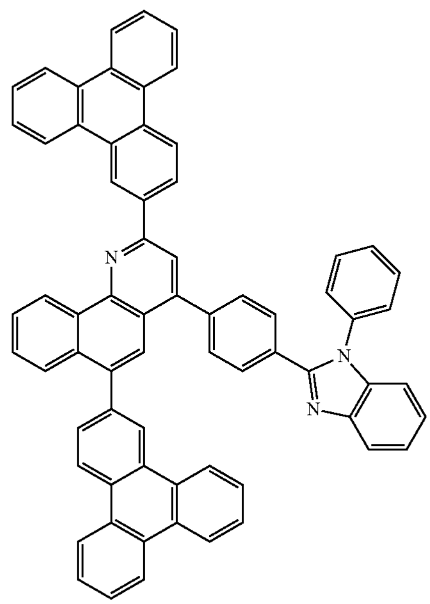
[Chemical Formula A119]
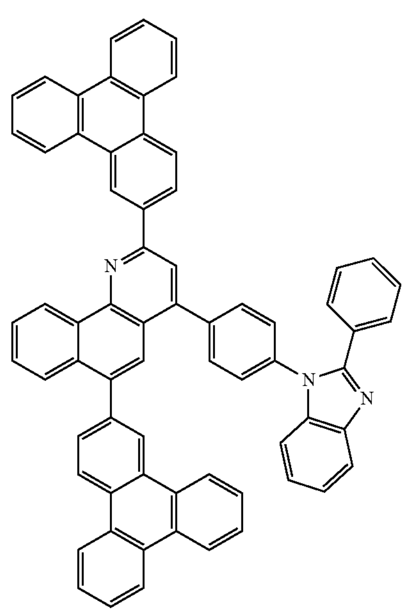

-continued
[Chemical Formula A120]
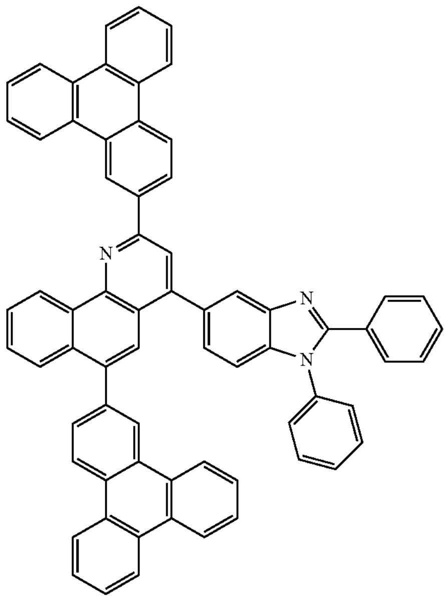
[Chemical Formula A121]
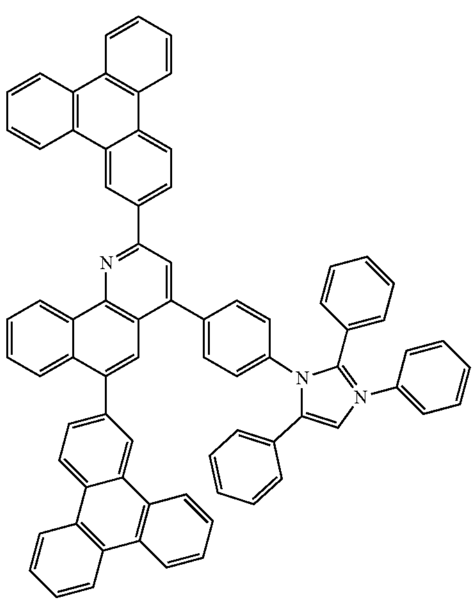
-continued
[Chemical Formula A122]
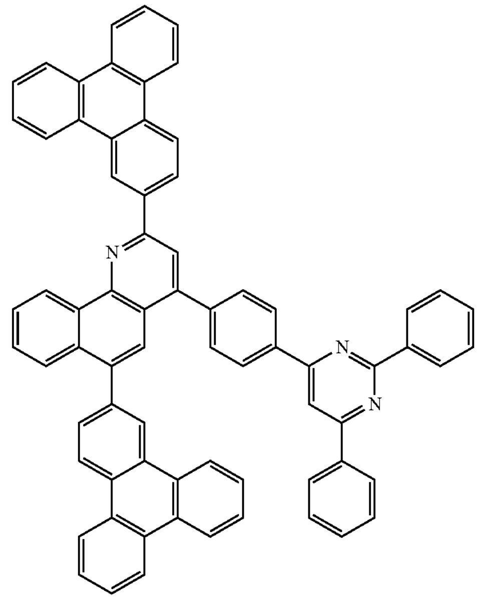
[Chemical Formula A123]
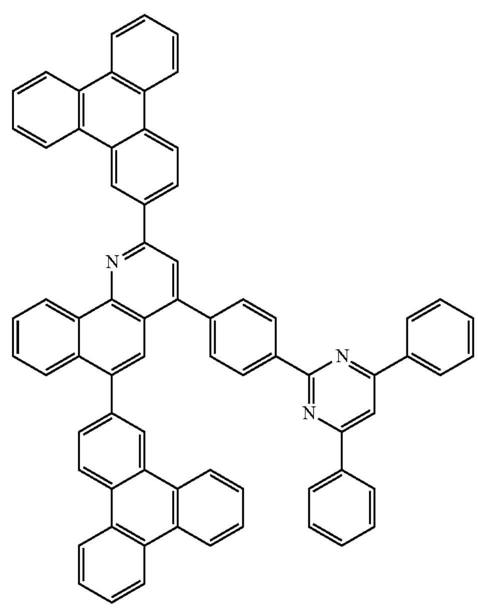

-continued
[Chemical Formula A124]
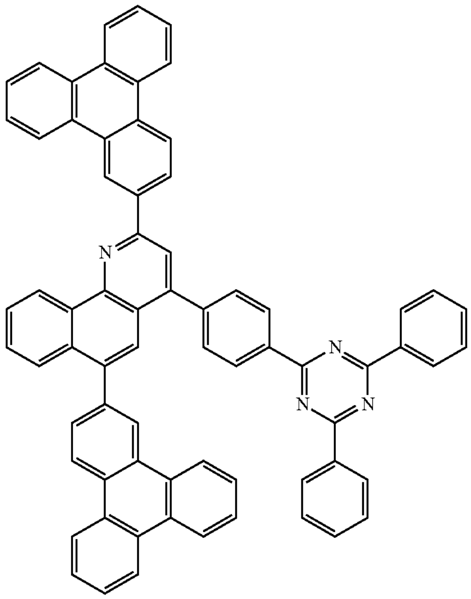
[Chemical Formula A125]
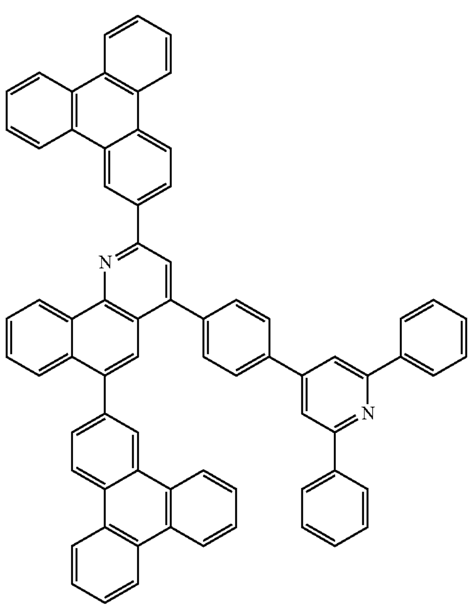
-continued
[Chemical Formula A126]
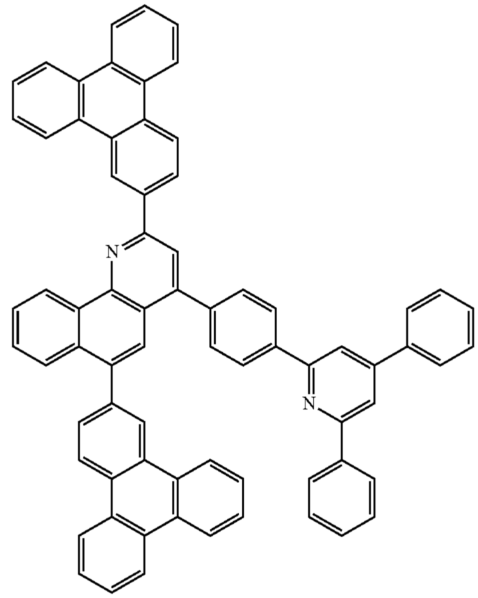
[Chemical Formula A127]
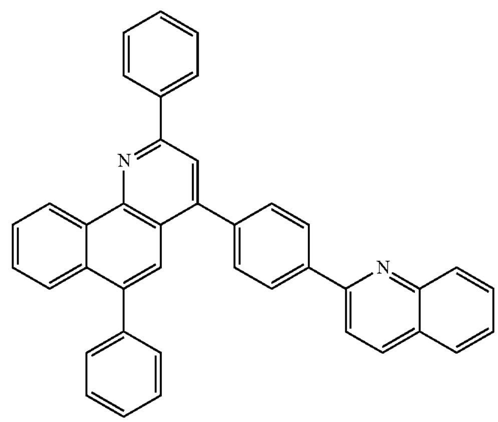
[Chemical Formula A128]
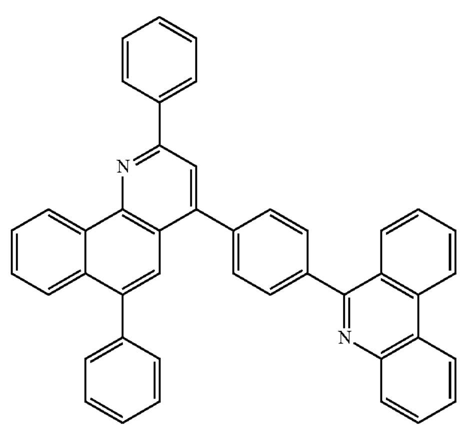

-continued
[Chemical Formula A129]
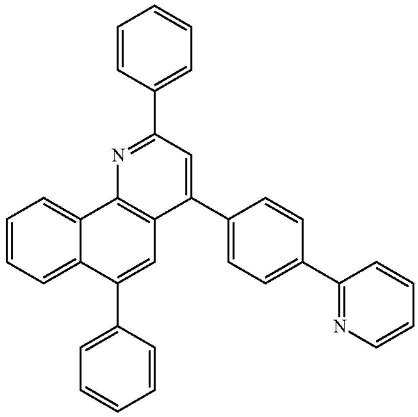
[Chemical Formula 130]
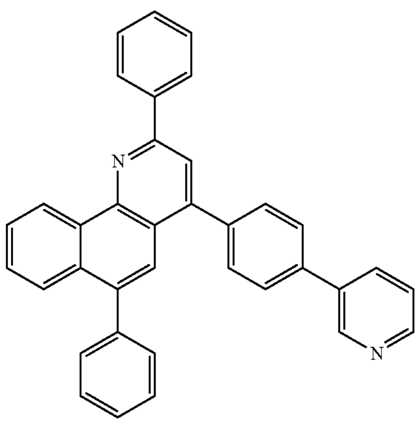
[Chemical Formula A131]
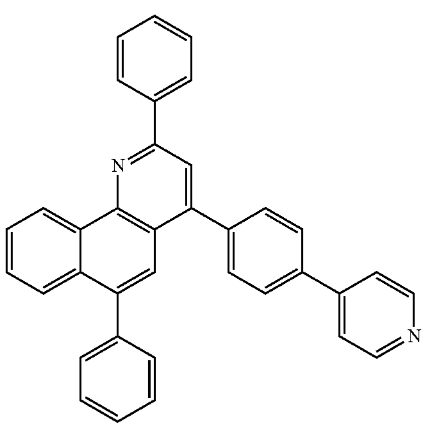
-continued
[Chemical Formula A132]
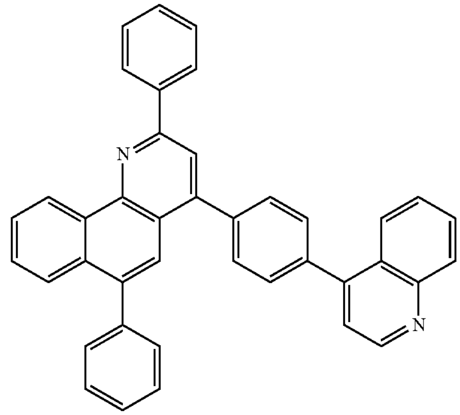
[Chemical Formula A133]
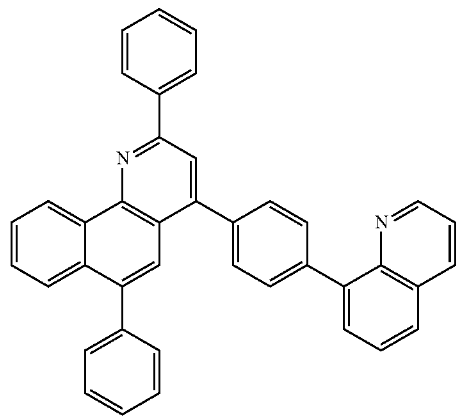
[Chemical Formula A134]
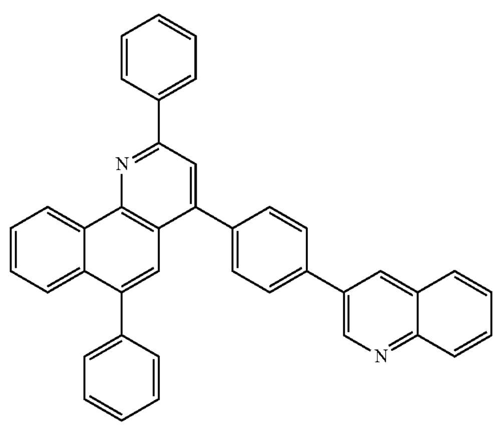

[Chemical Formula A135]
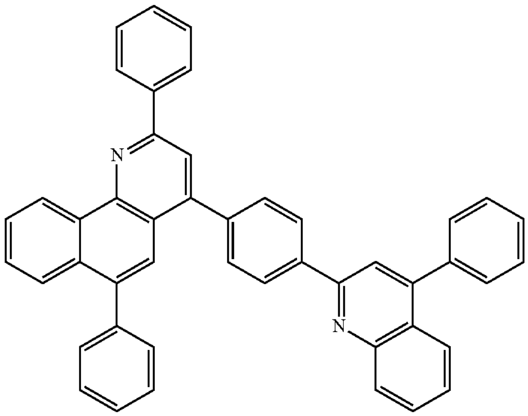
[Chemical Formula A136]
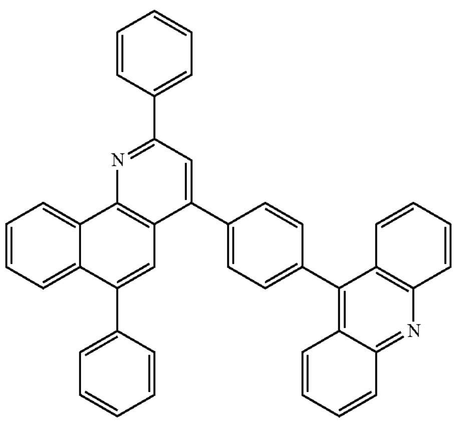
[Chemical Formula A137]
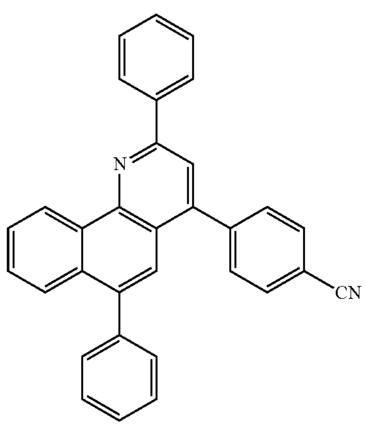
-continued
[Chemical Formula A138]
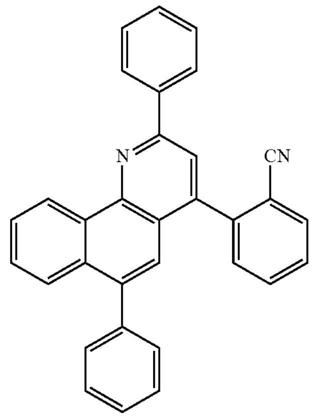
[Chemical Formula A139]
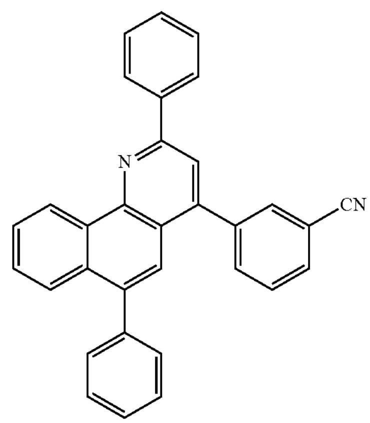
[Chemical Formula A140]
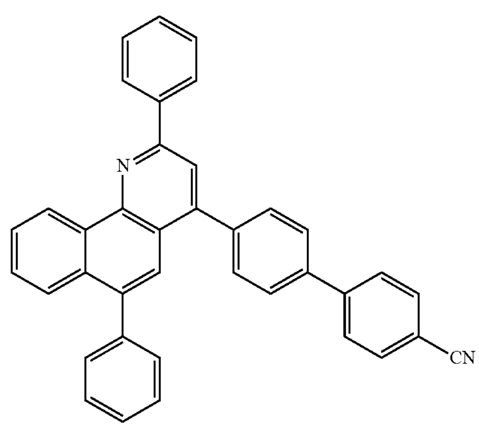

(Chemical Formula A141]
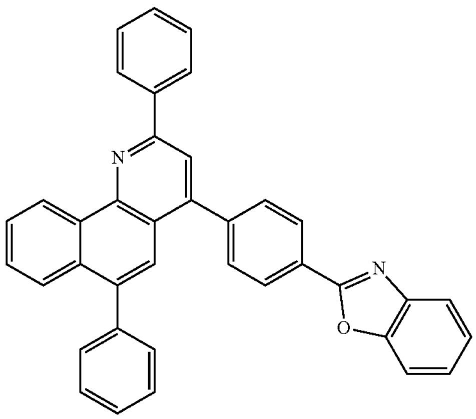
[Chemical Formula A142]
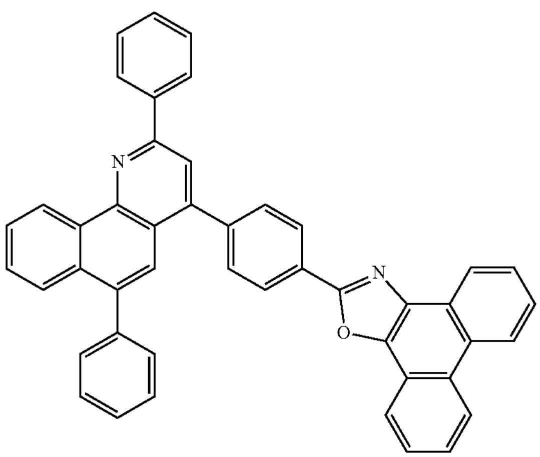
[Chemical Formula A142]
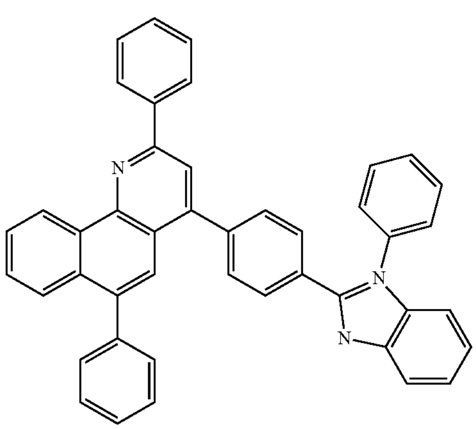
[Chemical Formula A144]
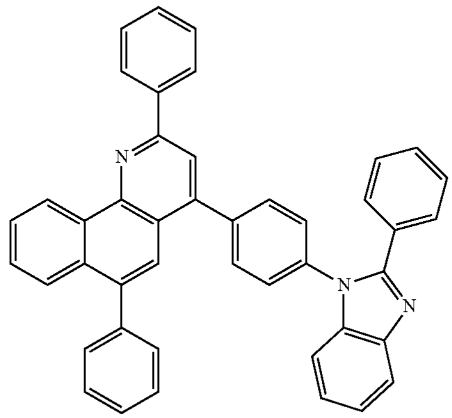
[Chemical Formula 145]
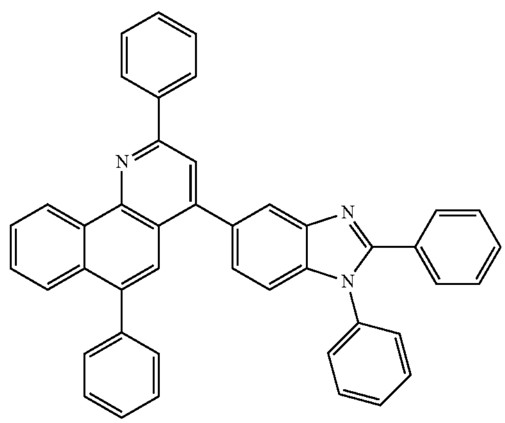
[Chemical Formula A146]
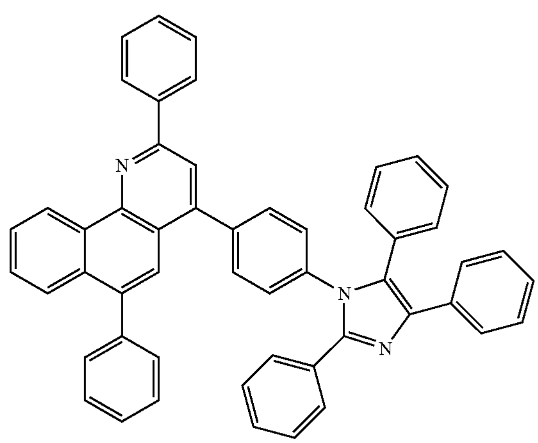

-continued
[Chemical Formula A147]
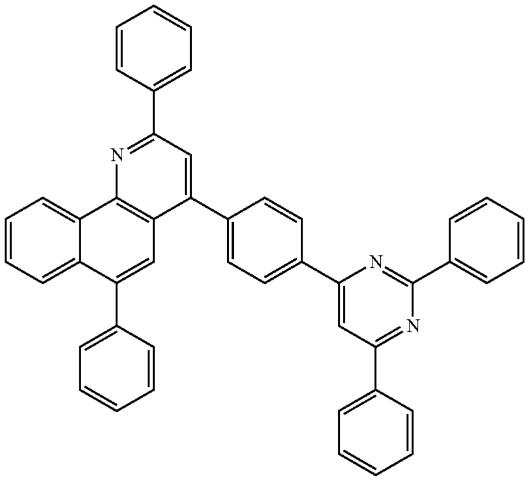
[Chemical Formula A148]
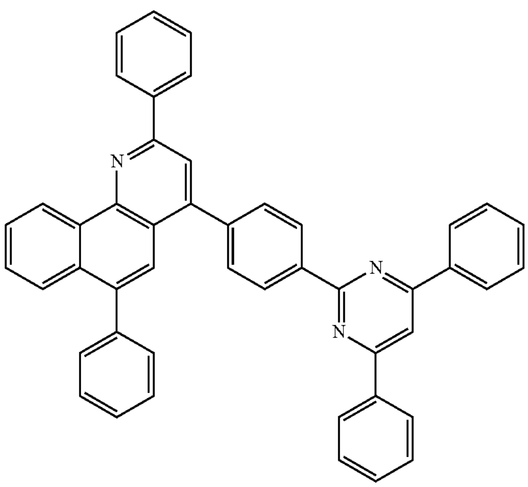
[Chemical Formula A149]
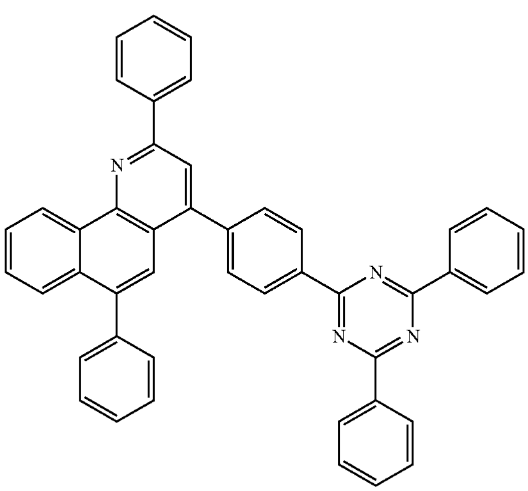
-continued
[Chemical Formula A150]
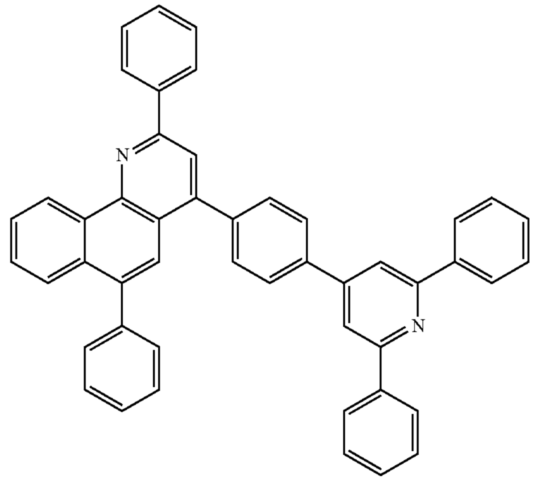
[Chemical Formula A151]
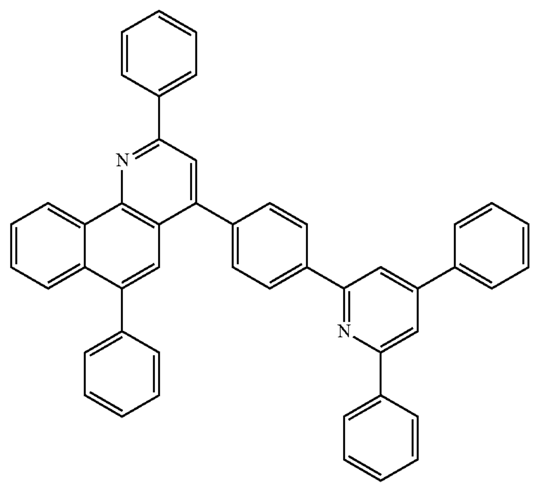
[Chemical Formula A152]
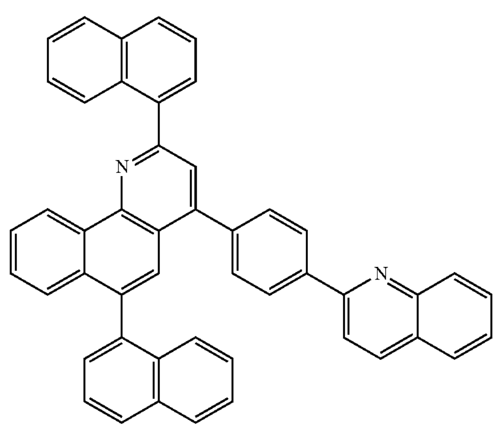

[Chemical Formula A153]
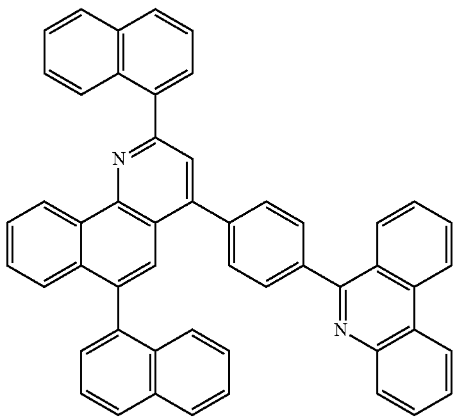
[Chemical Formula A154]
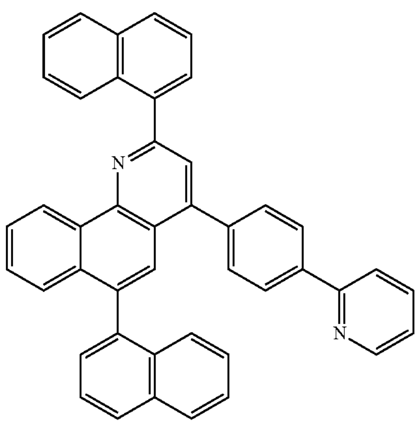
[Chemical Formula A155]
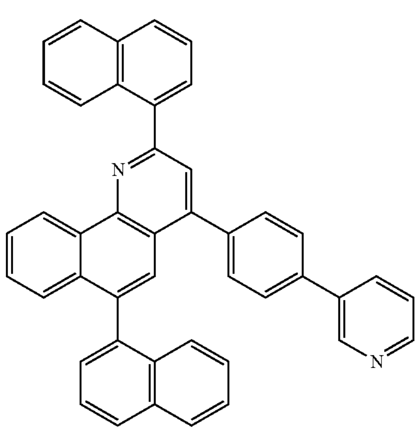
[Chemical Formula A156]
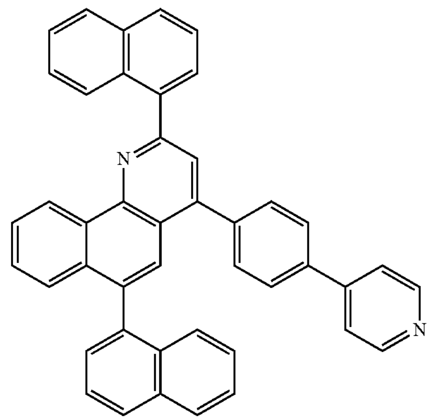
[Chemical Formula A157]
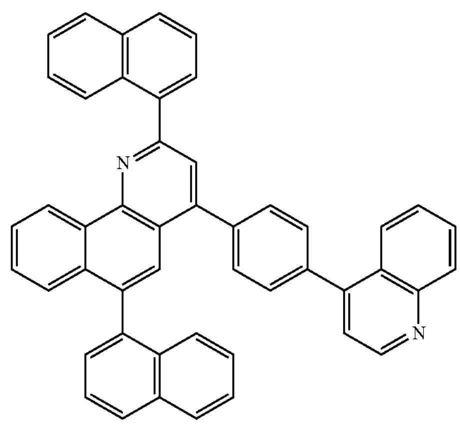
[Chemical Formula A158]
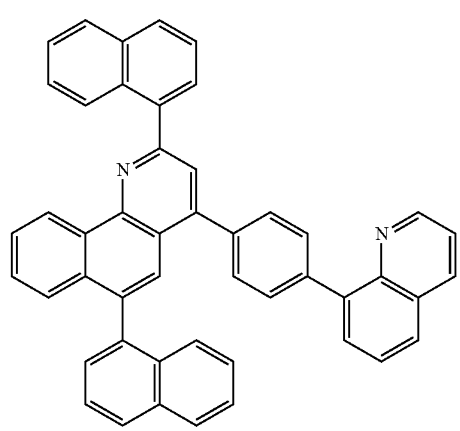

-continued
[Chemical Formula A159]
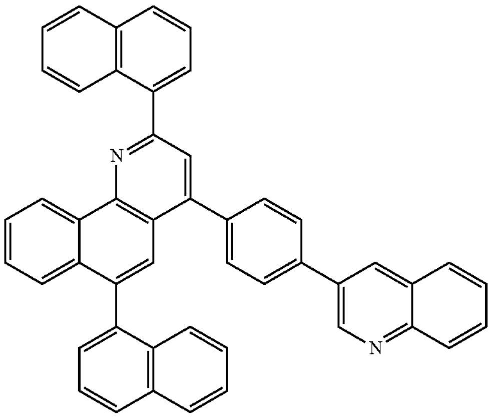
[Chemical Formula A160]
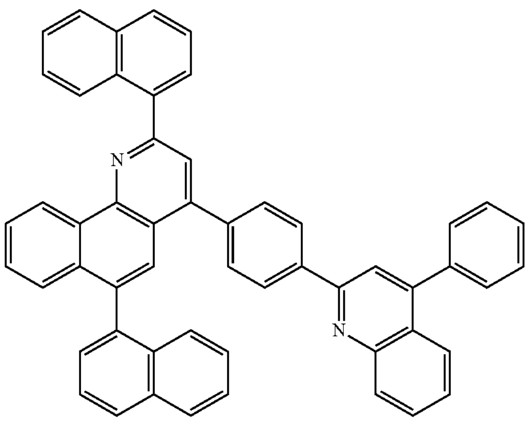
[Chemical Formula A161]
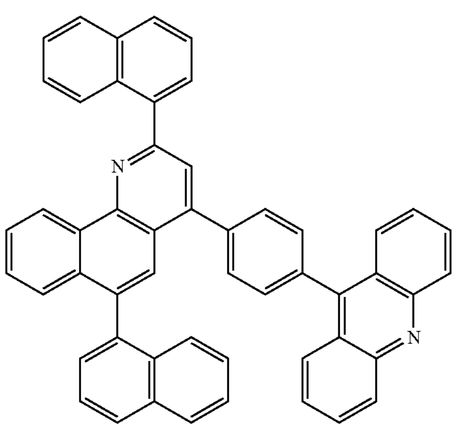
-continued
[Chemical Formula A162]
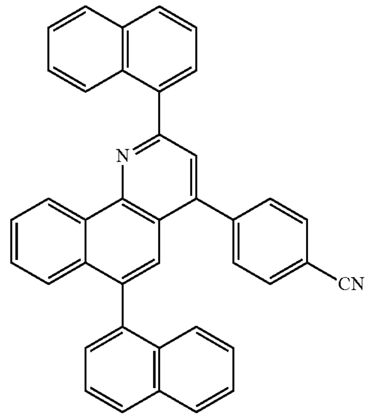
[Chemical Formula A163]
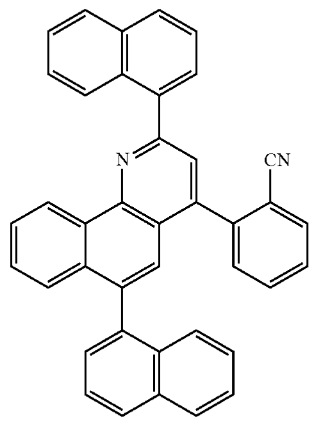
[Chemical Formula A164]
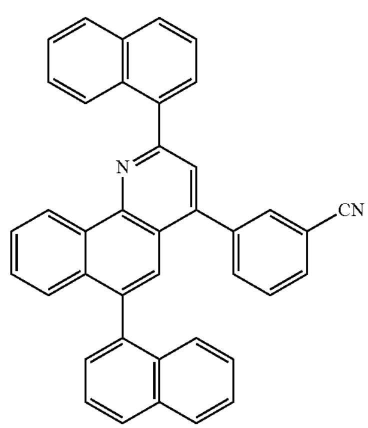

[Chemical Formula A165]
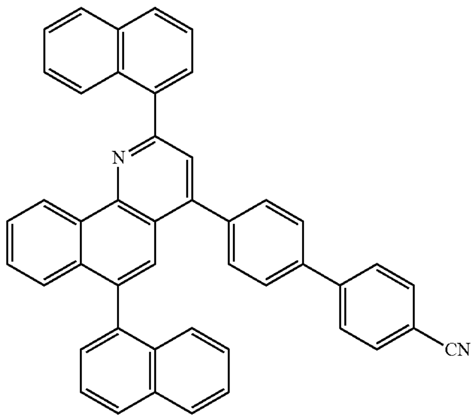
[Chemical Formula A166]
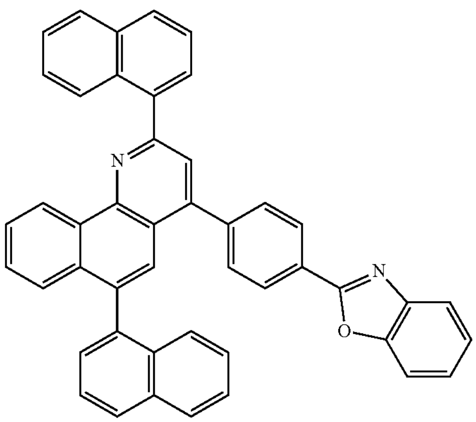
[Chemical Formula A167]
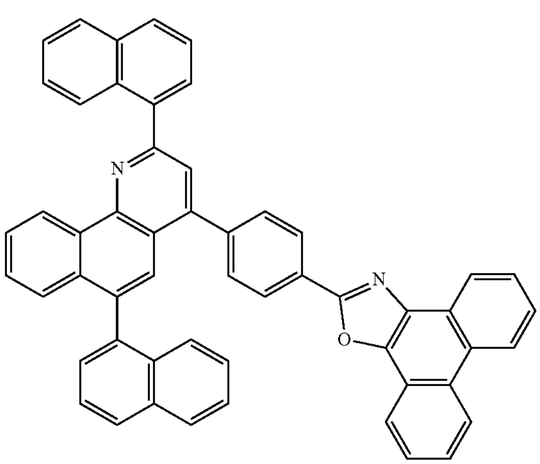
[Chemical Formula A168]
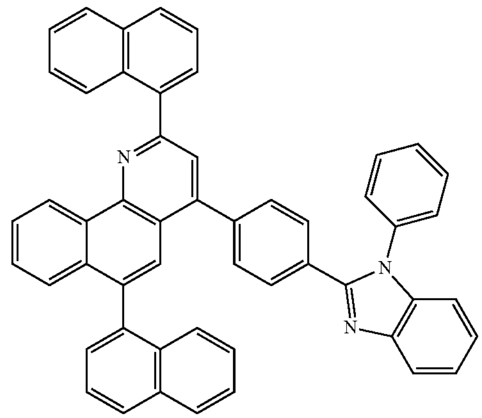
[Chemical Formula A169]
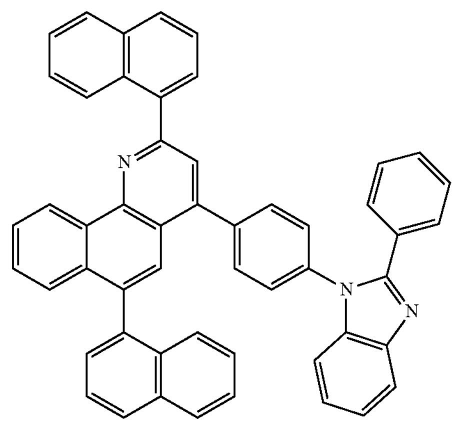
[Chemical Formula A170]
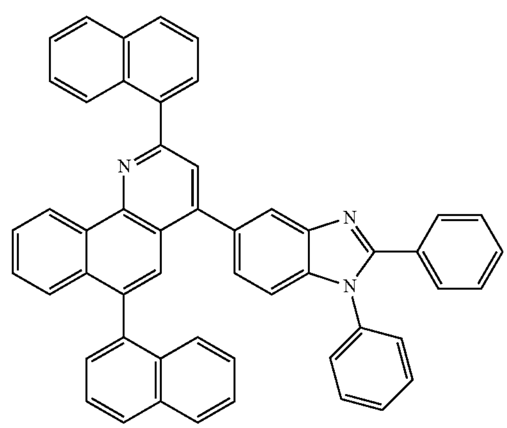

-continued
[Chemical Formula A171]
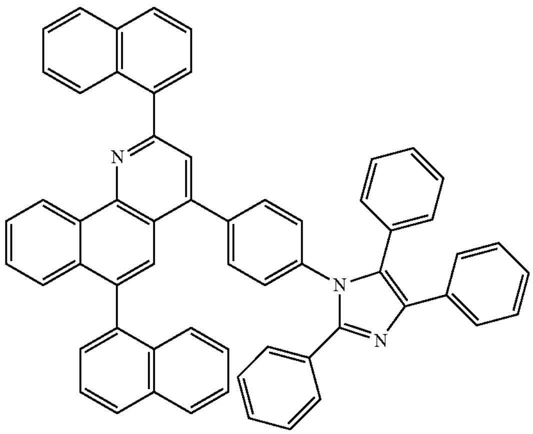
[Chemical Formula A172]
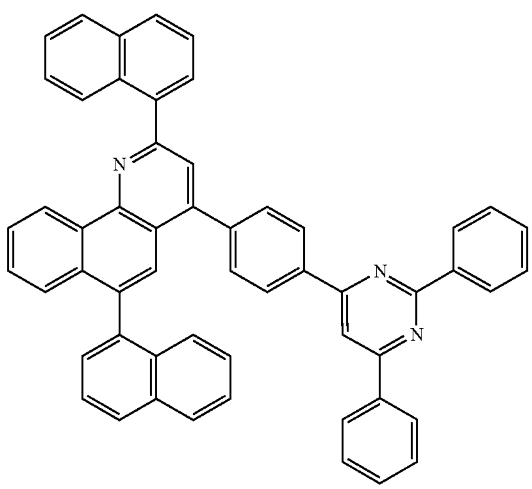
[Chemical Formula A173]
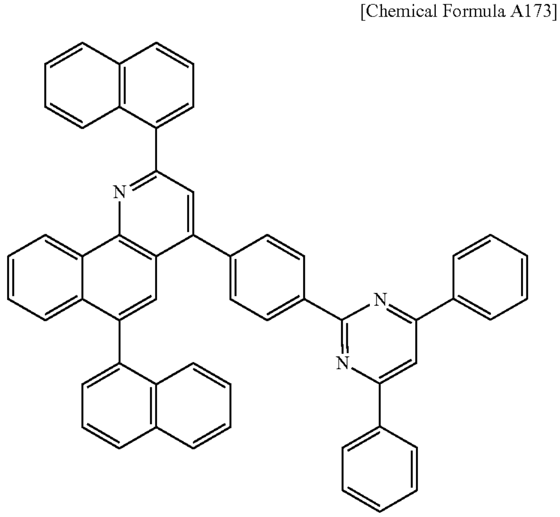
-continued
[Chemical Formula A174]
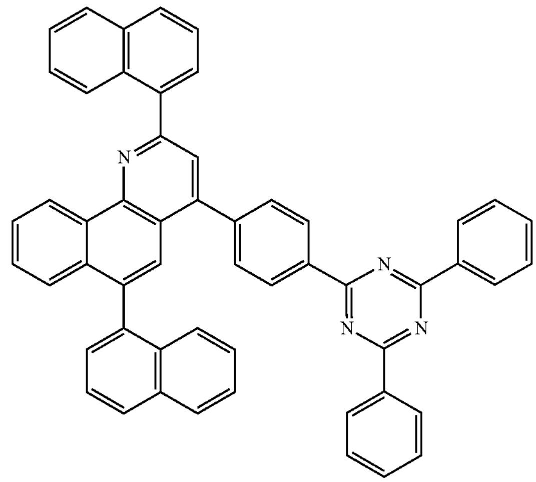
[Chemical Formula A175]
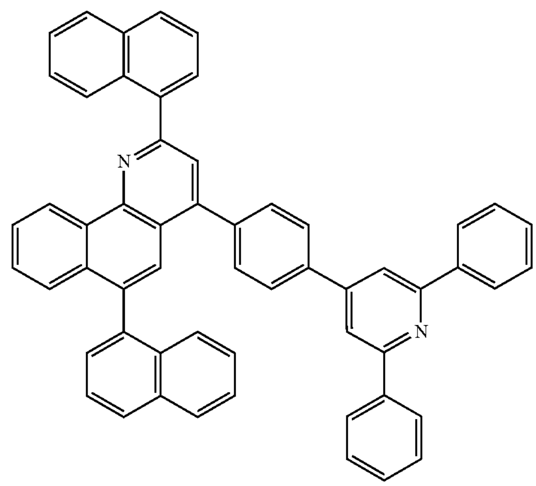
[Chemical Formula A176]
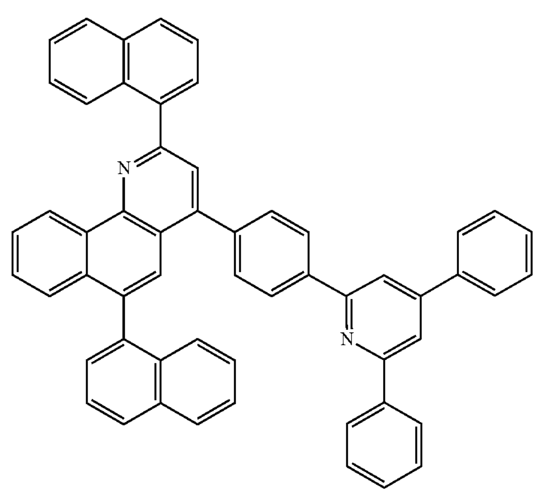

-continued
[Chemical Formula A177]
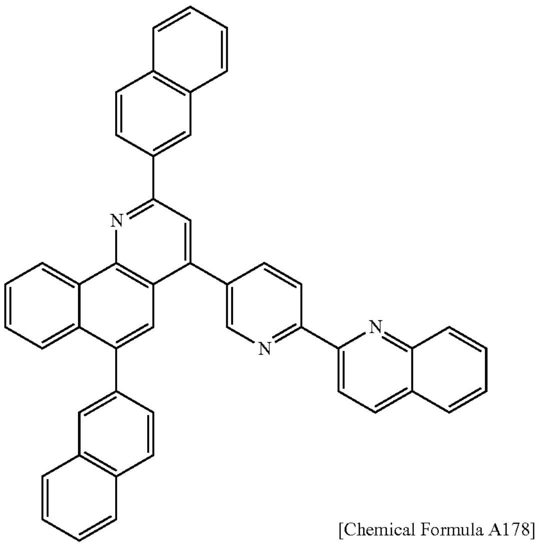
[Chemical Formula A178]
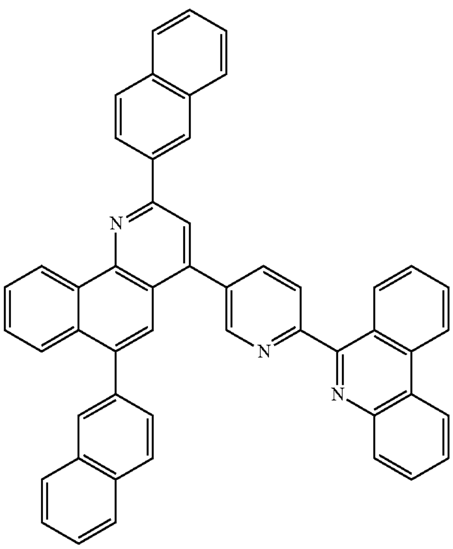
[Chemical Formula A179]
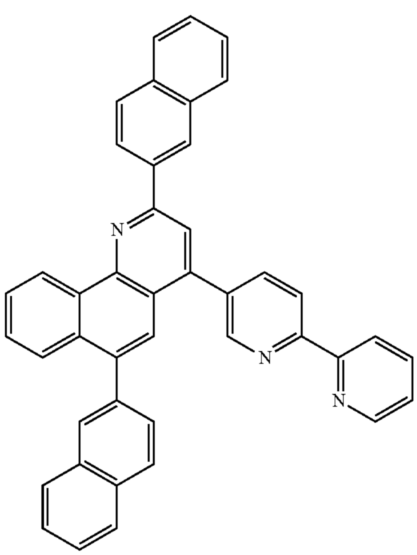
-continued
[Chemical Formula A180]
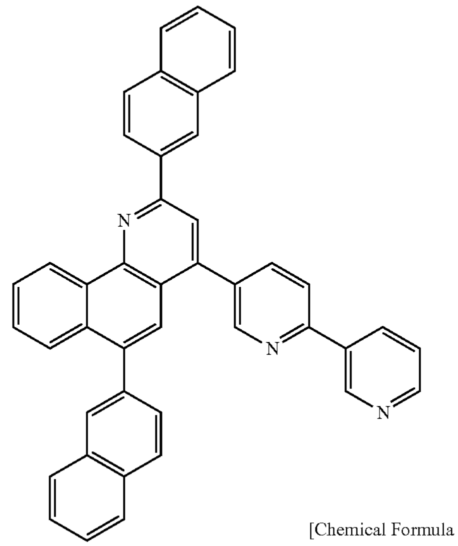
[Chemical Formula A181]
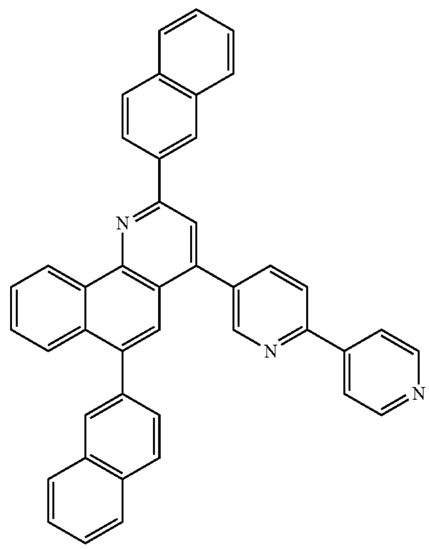
[Chemical Formula A182]
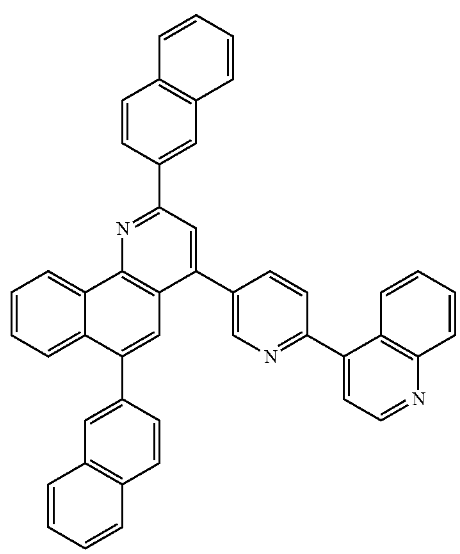

-continued
[Chemical Formula A183]
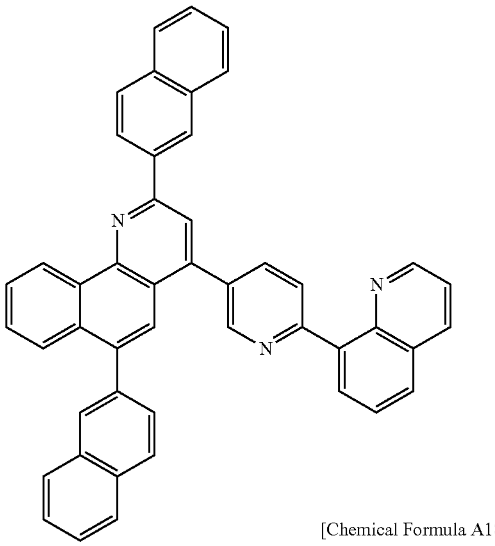
[Chemical Formula A184]
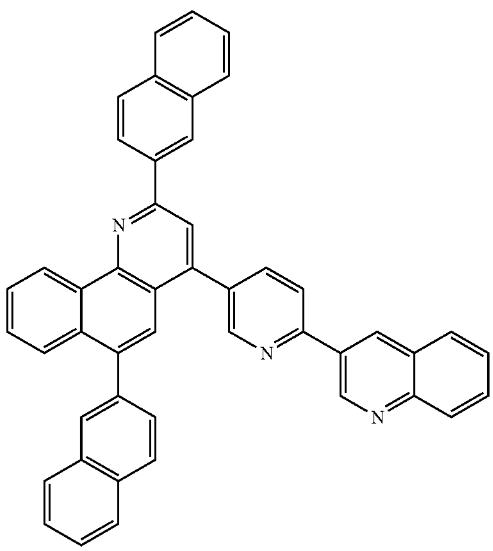
[Chemical Formula A185]
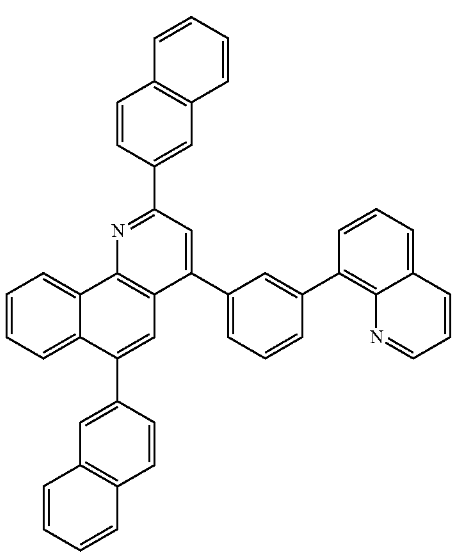
-continued
[Chemical Formula A186]
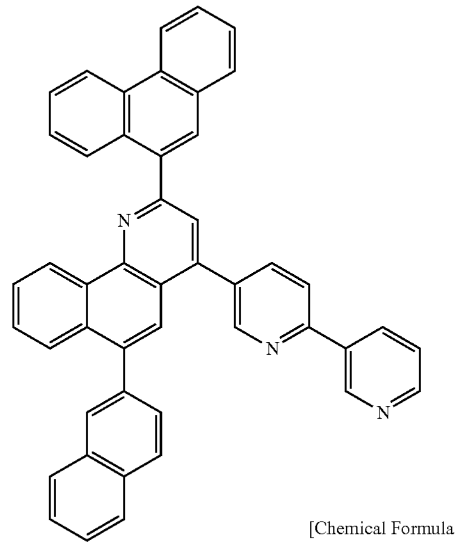
[Chemical Formula A187]
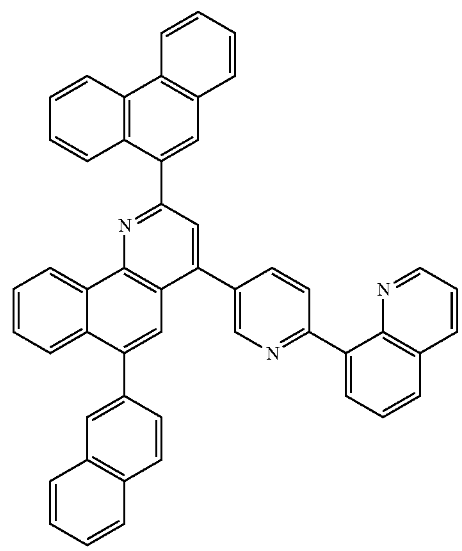
[Chemical Formula A188]
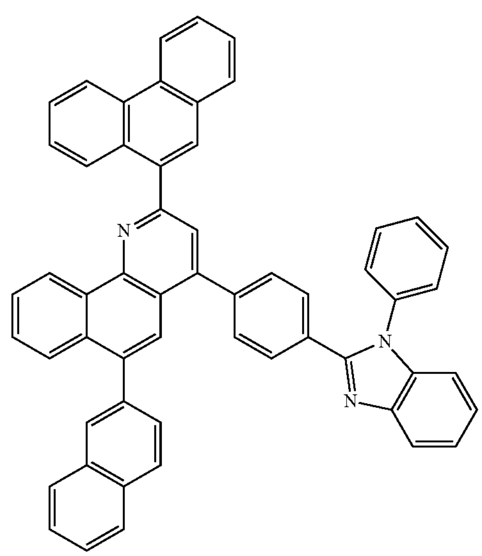

-continued
[Chemical Formula A189]
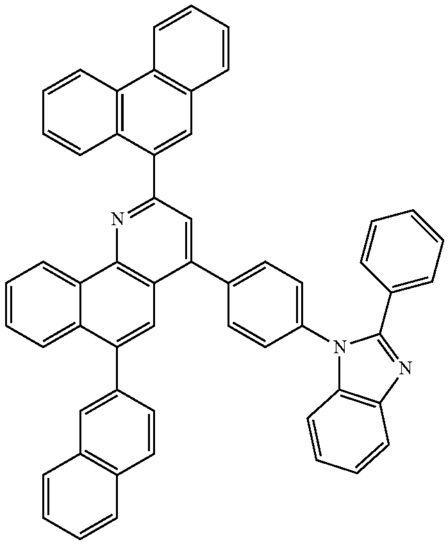
In an implementation, the compound for an organic opto-electronic device may be represented by one of the following Chemical Formulae B1 to B 175.
[Chemical Formula B1]
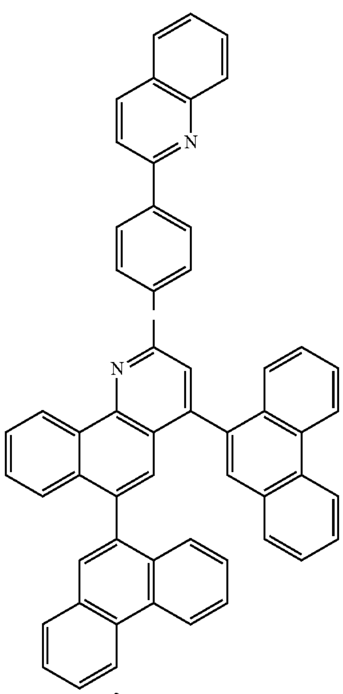
[Chemical Formula B2]
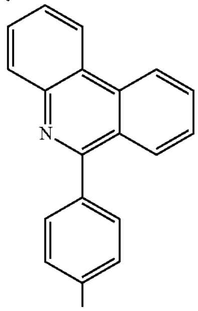
-continued
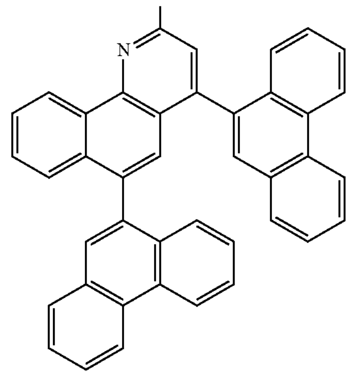
[Chemical Formula B3]
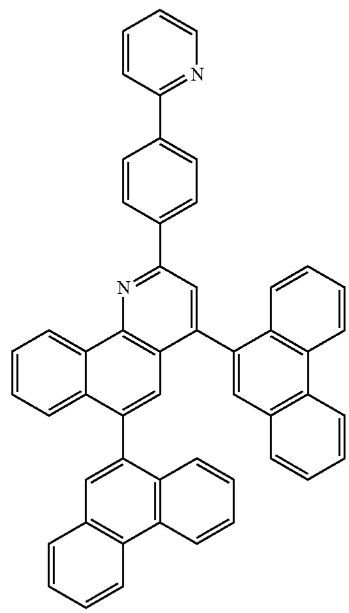 [SMILES: c1ccc(-c2ccc(-c3cc(-c4cc5ccccc5c5ccccc45)c4cc(-c5cc6ccccc6c6ccccc56)c5ccccc5c4n3)cc2)nc1]
[Chemical Formula B4]
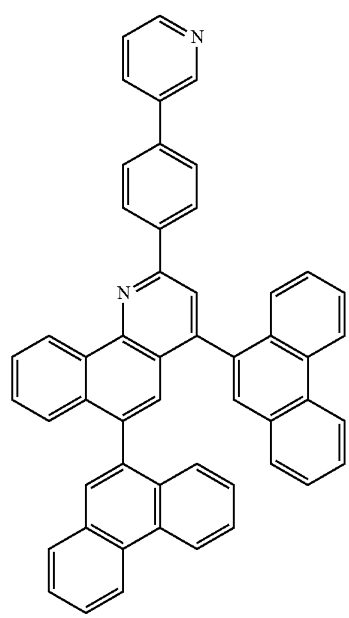

-continued
[Chemical Formula B5]
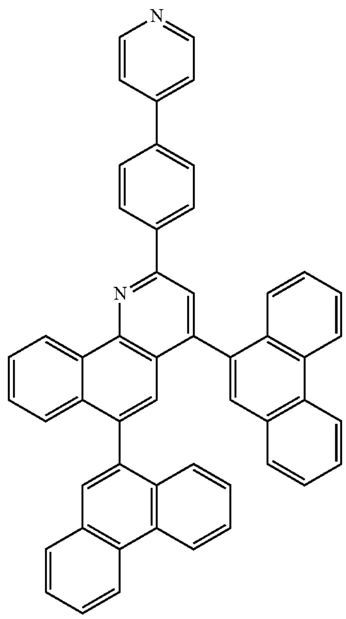
[Chemical Formula B6]
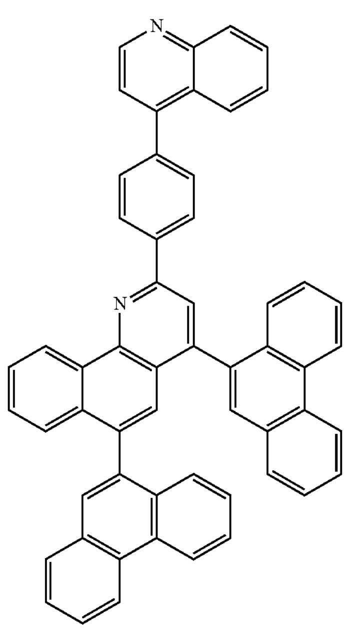
-continued
[Chemical Formula B7]
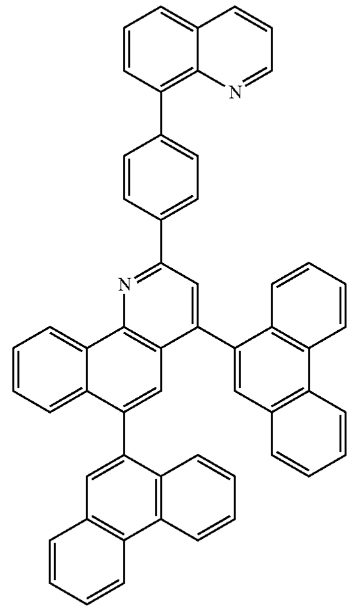
[Chemical Formula B8]
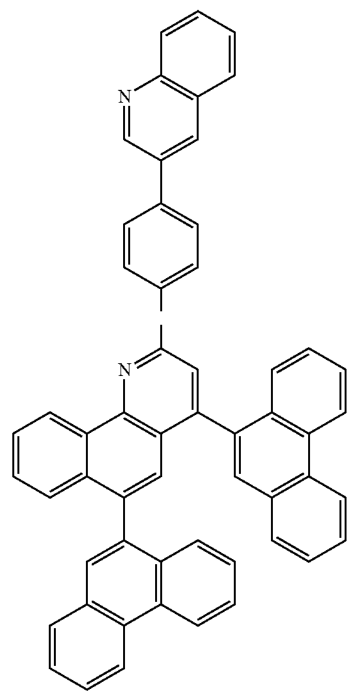
[Chemical Formula B9]
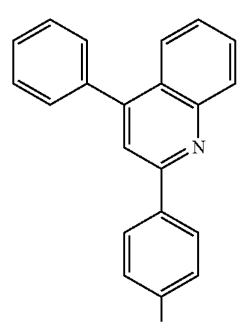

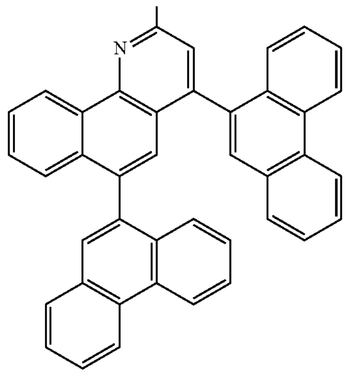
[Chemical Formula B10]
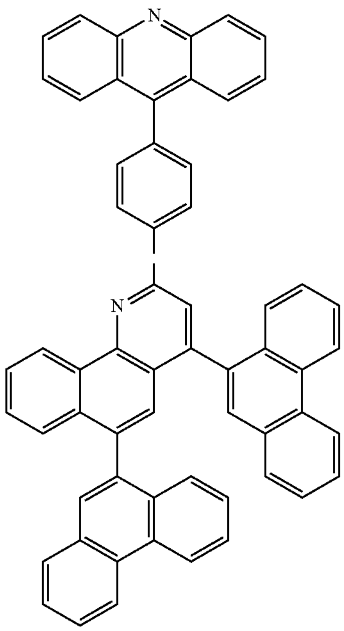
[Chemical Formula B11]
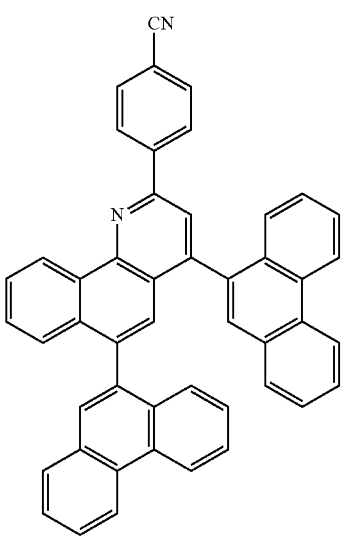
[Chemical Formula B12]
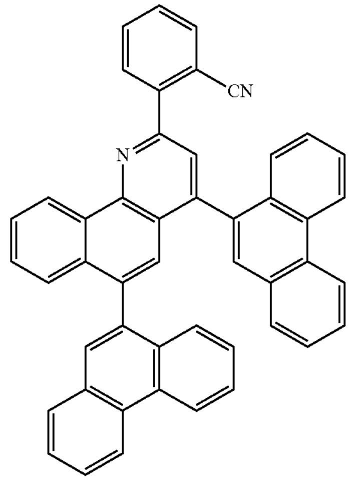
[Chemical Formula B13]
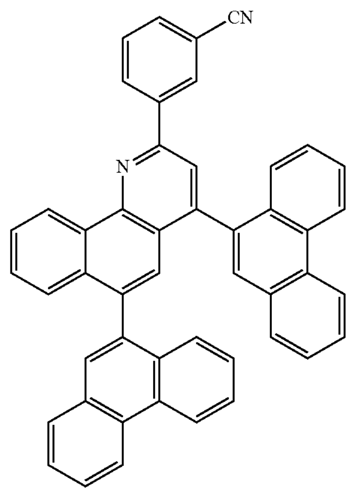
[Chemical Formula B14]
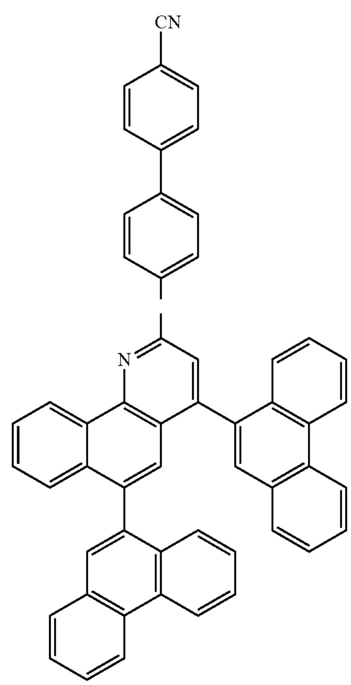

-continued
[Chemical Formula B15]
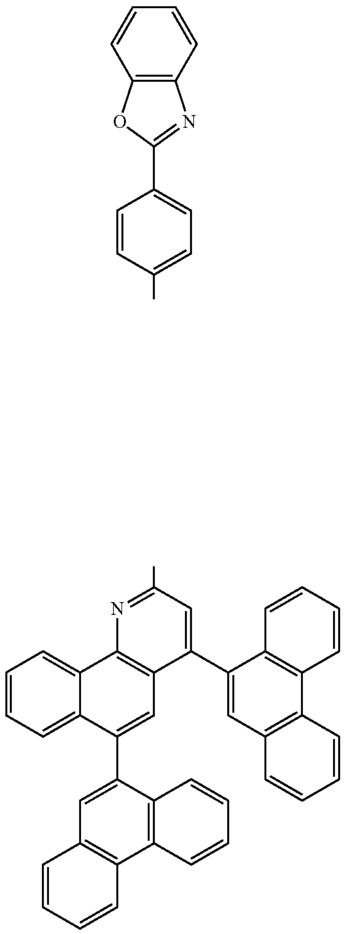
[Chemical Formula B16]
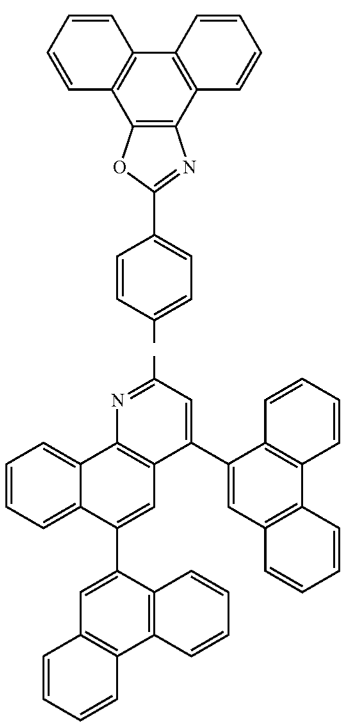
-continued
[Chemical Formula B17]
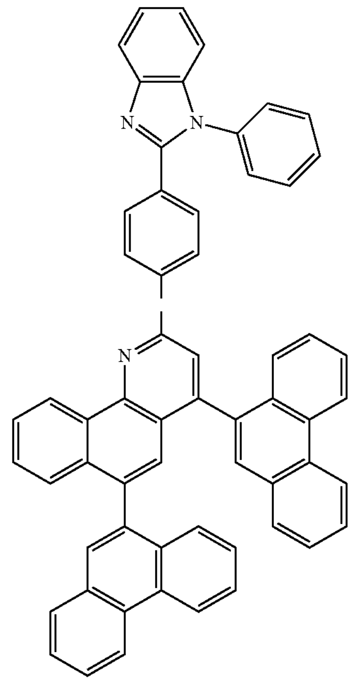
[Chemical Formula B18]
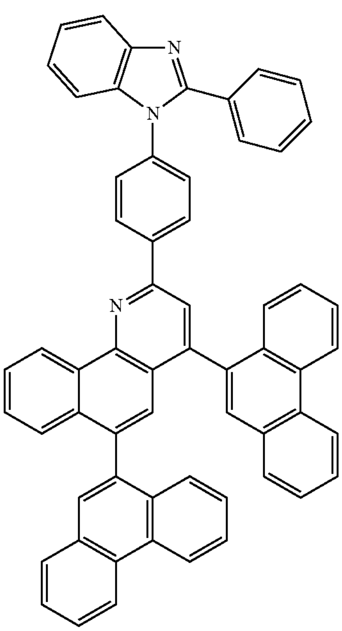

-continued
[Chemical Formula B19]
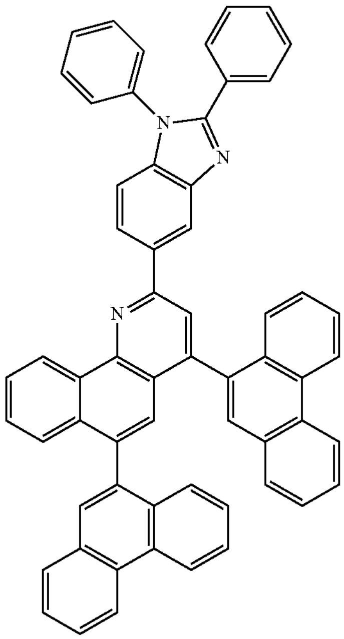
[Chemical Formula B20]
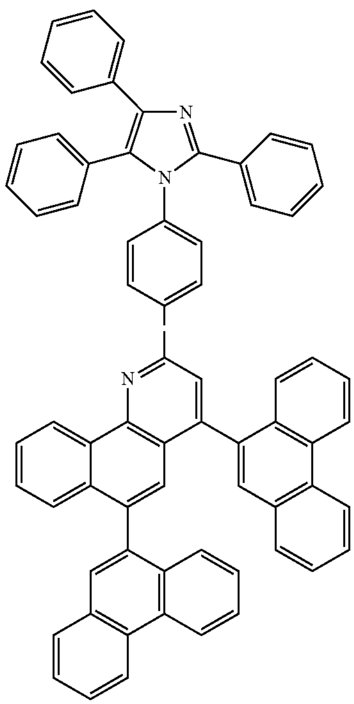
[Chemical Formula B21]
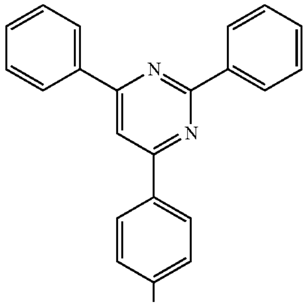
-continued
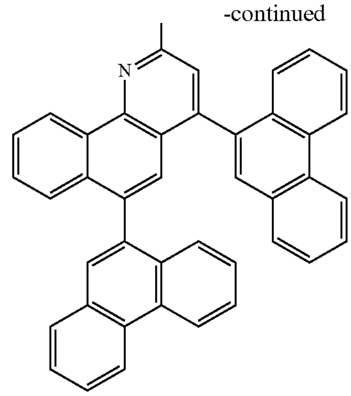
[Chemical Formula B22]
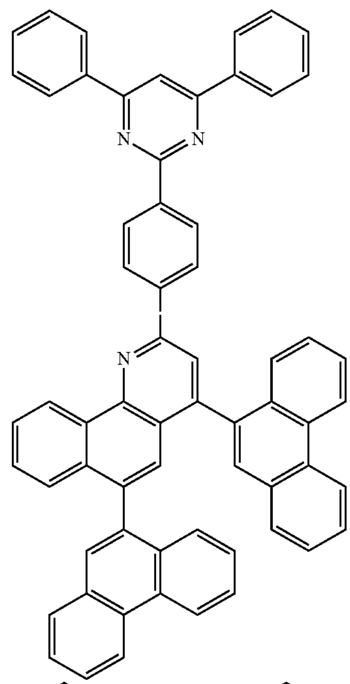
[Chemical Formula B23]
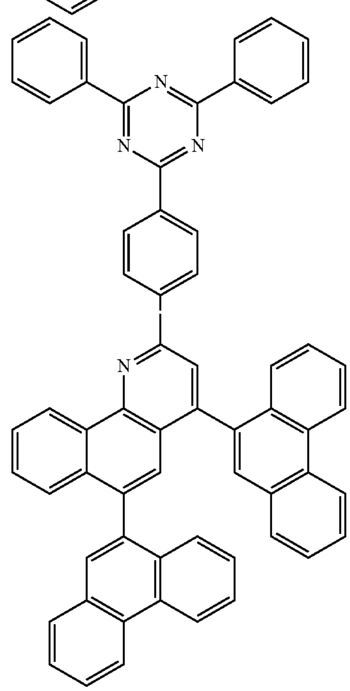

-continued
[Chemical Formula B24]
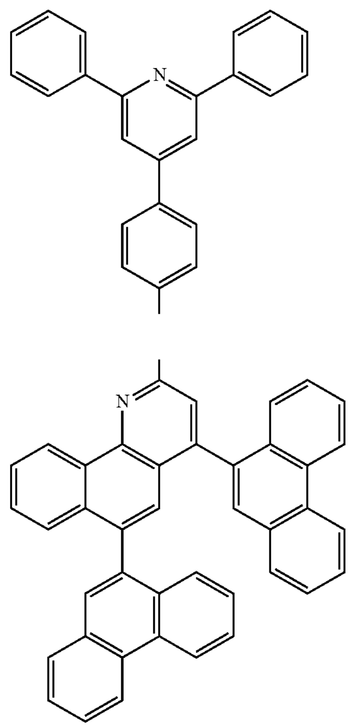
[Chemical Formula B25]
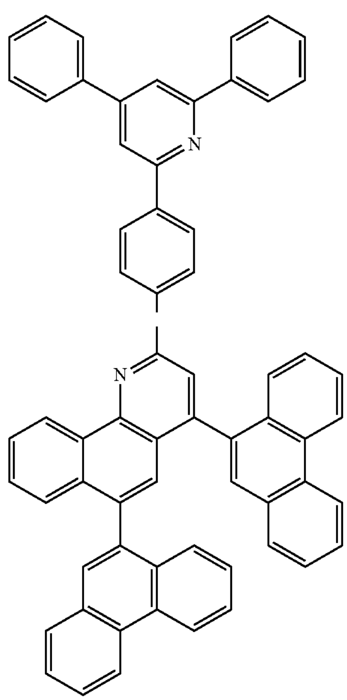
-continued
[Chemical Formula B26]
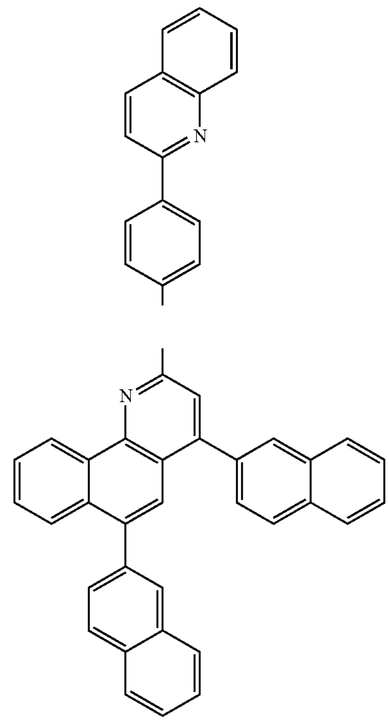
[Chemical Formula B27]
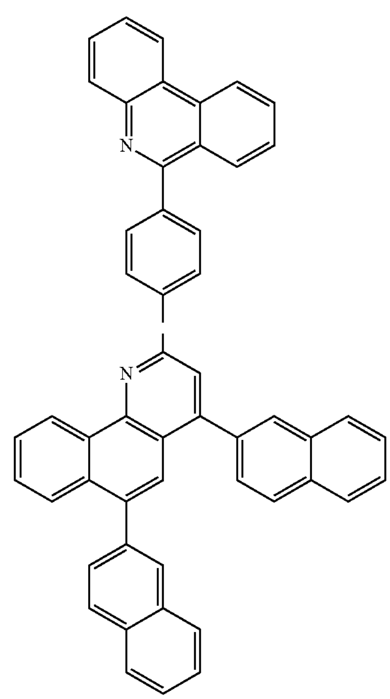

-continued
[Chemical Formula B28]
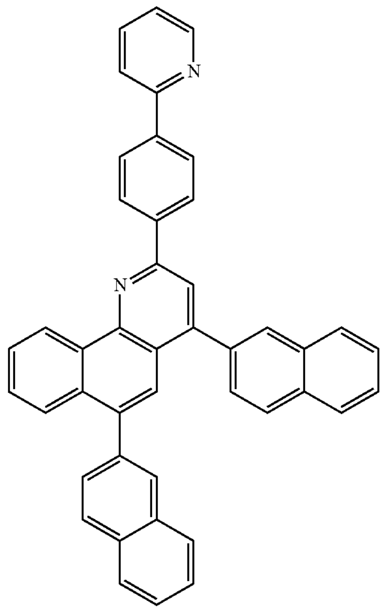
[Chemical Formula B29]
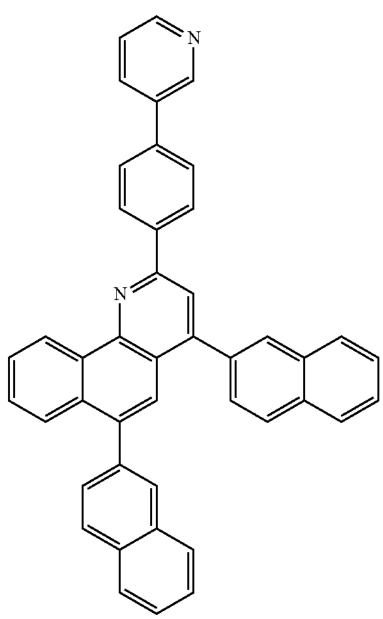
-continued
[Chemical Formula B30]
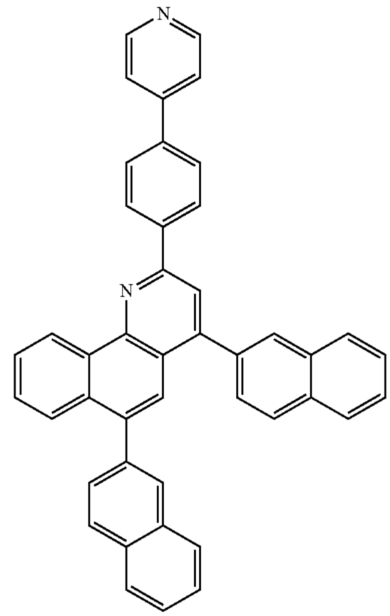
[Chemical Formula B31]
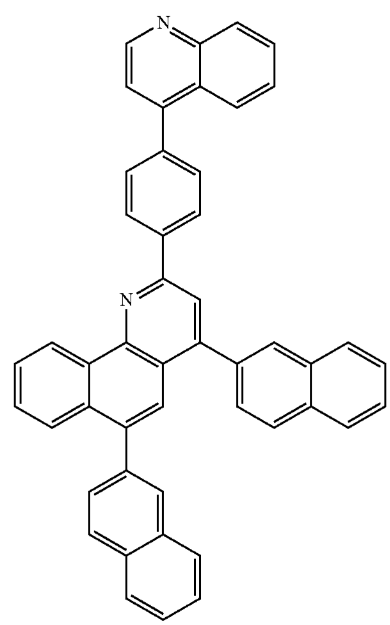

[Chemical Formula B32]
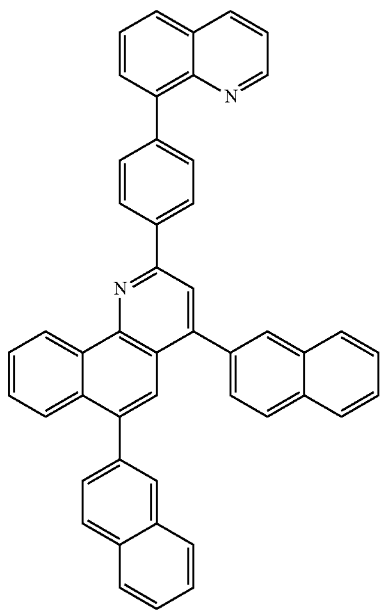
[Chemical Formula B33]
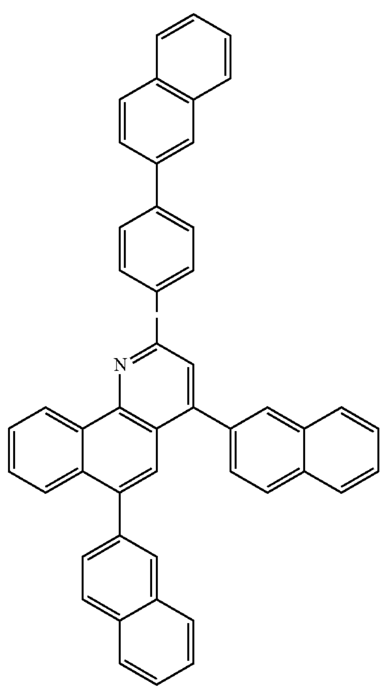
[Chemical Formula B34]
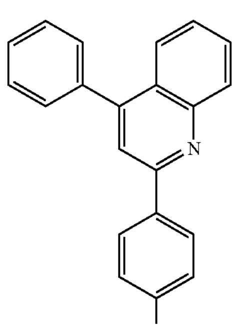
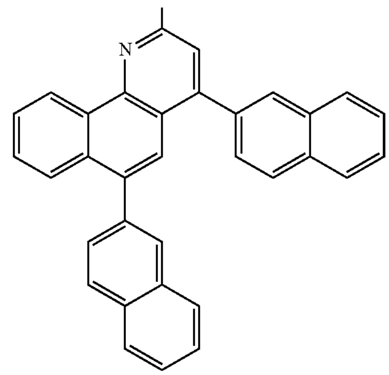
[Chemical Formula B35]
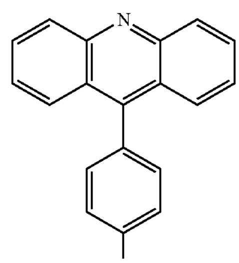
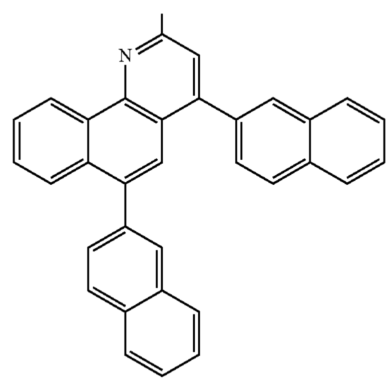
[Chemical Formula B36]
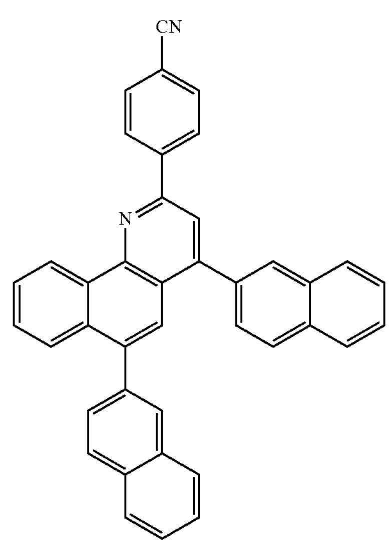

-continued
[Chemical Formula B37]
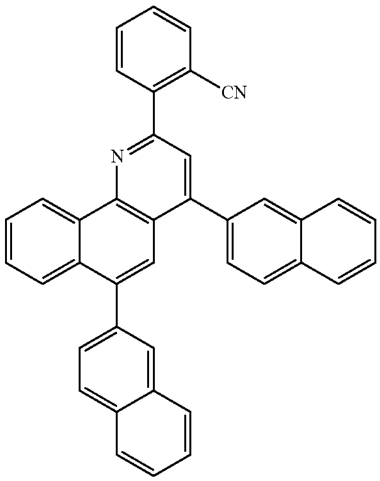
[Chemical Formula B38]
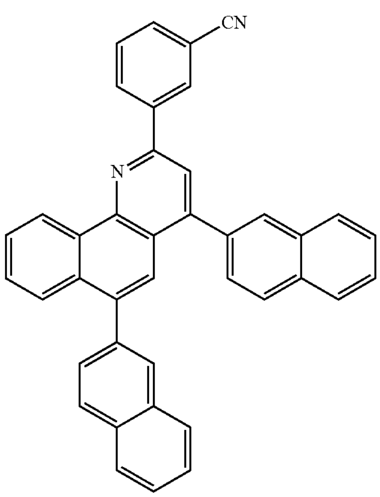
[Chemical Formula B39]
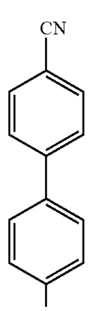
-continued
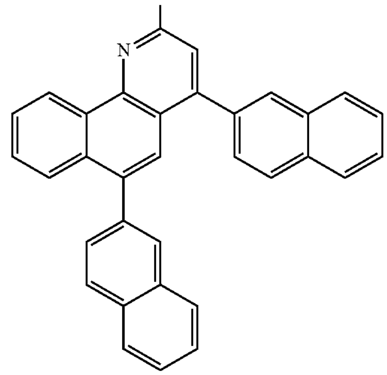
[Chemical Formula B40]
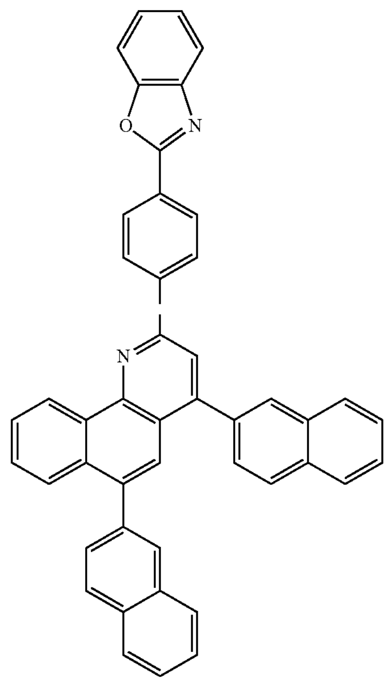
[Chemical Formula B41]
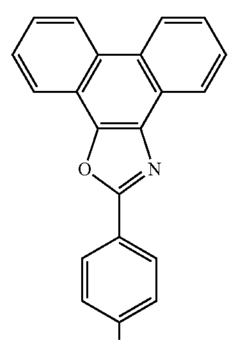

-continued
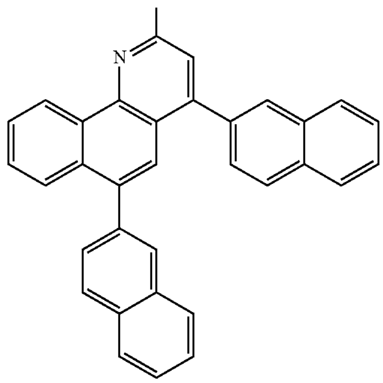
[Chemical Formula B42]
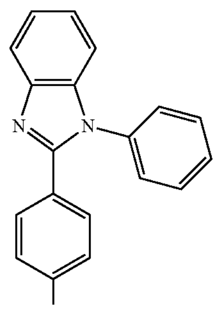
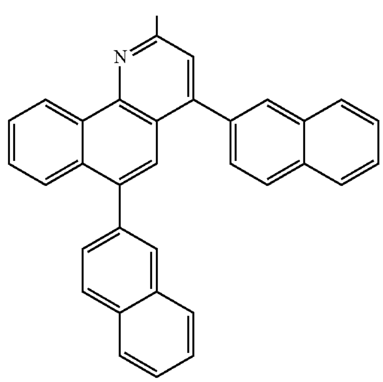
[Chemical Formula B43]
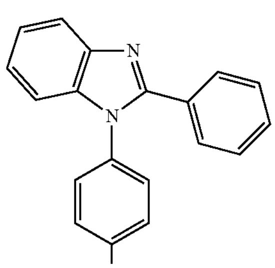
-continued
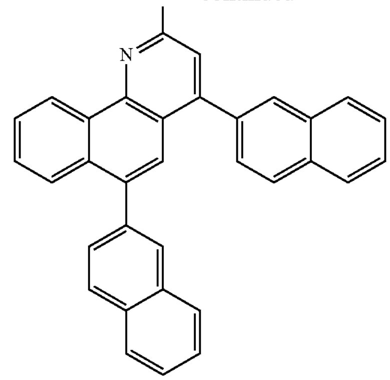
[Chemical Formula B44]
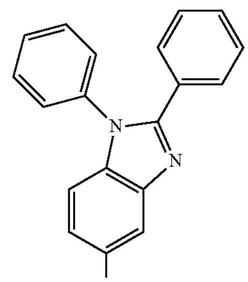
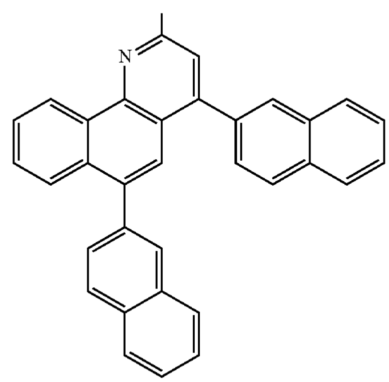
[Chemical Formula B45]
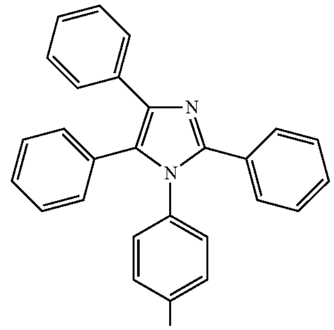

-continued
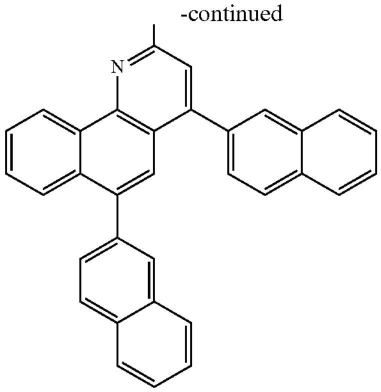
[Chemical Formula B46]
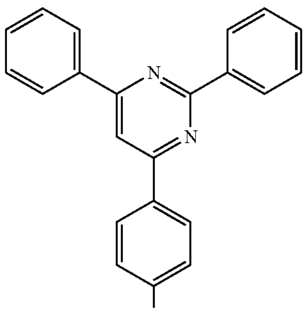
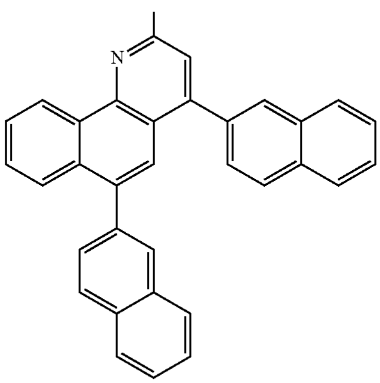
[Chemical Formula B47]
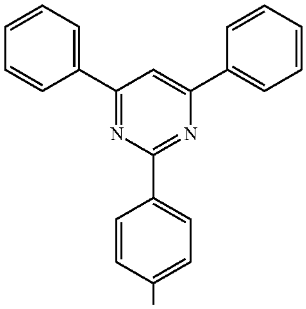
-continued
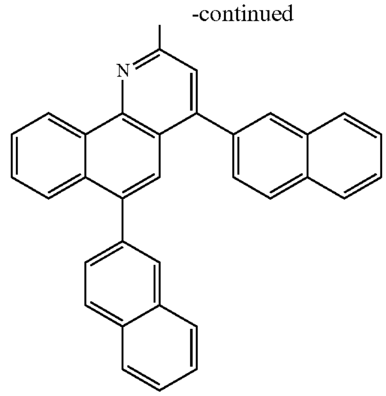
[Chemical Formula B48]
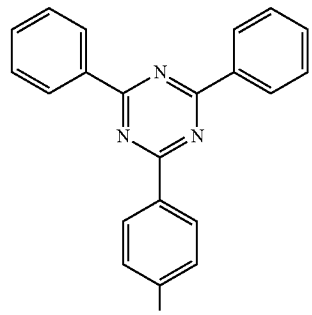
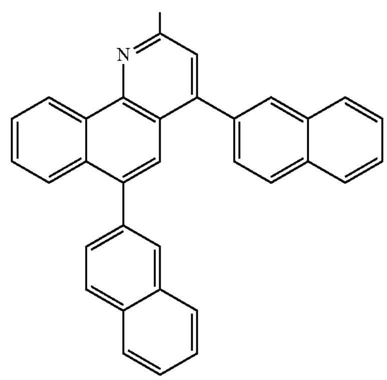
[Chemical Formula B49]
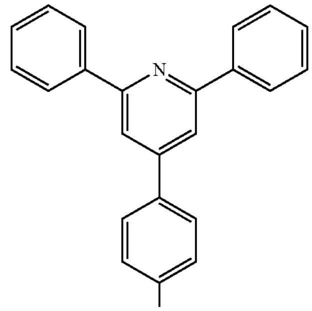

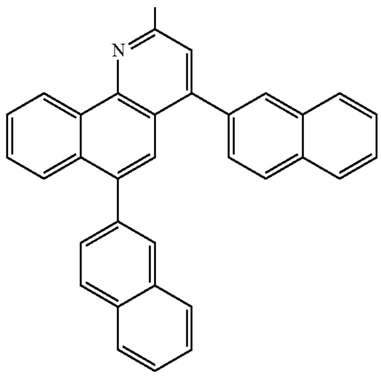
[Chemical Formula B50]
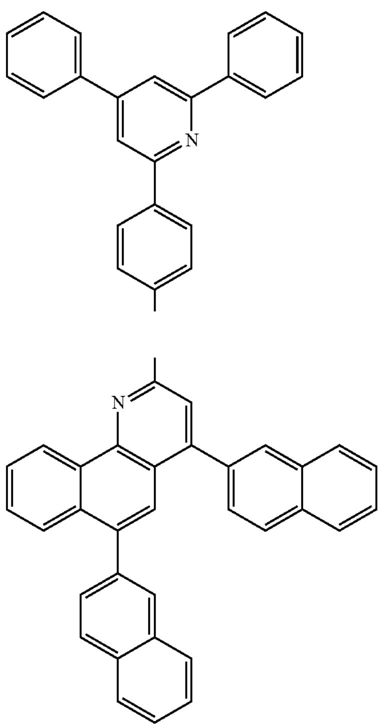
[Chemical Formula B51]
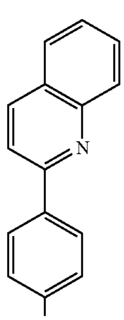
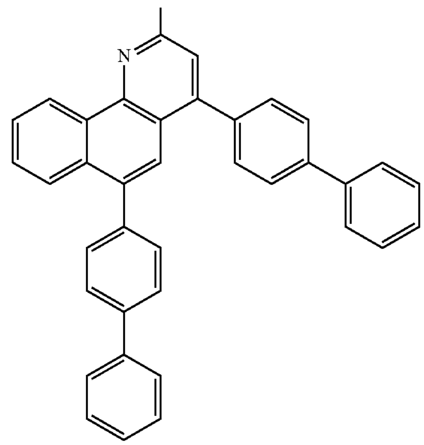
[Chemical Formula B52]
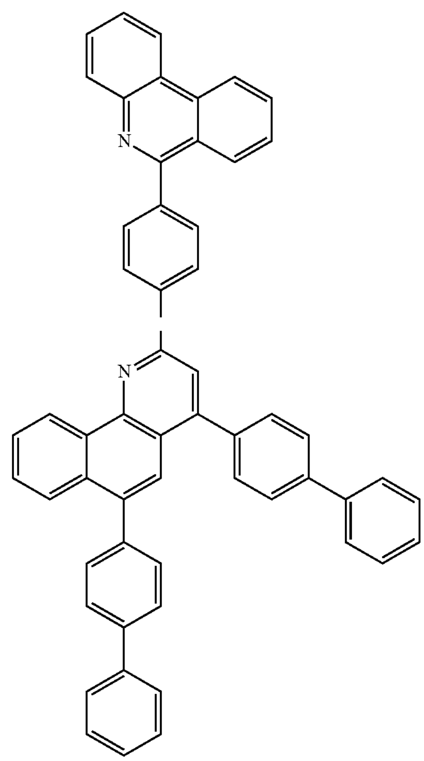
[Chemical Formula B53]
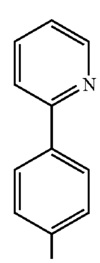

-continued
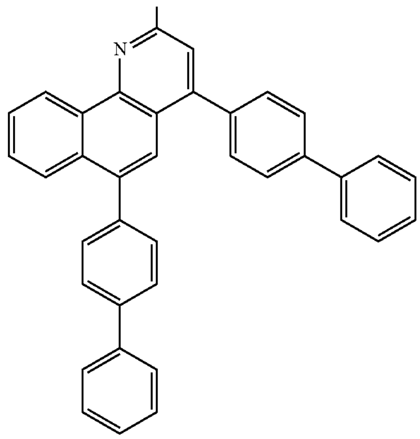
[Chemical Formula B54]
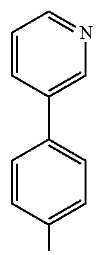
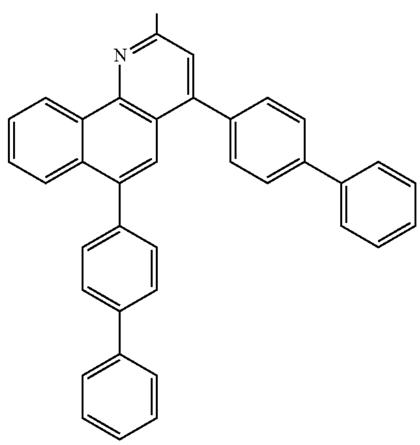
[Chemical Formula B55]
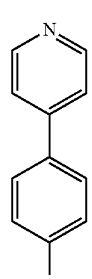
-continued
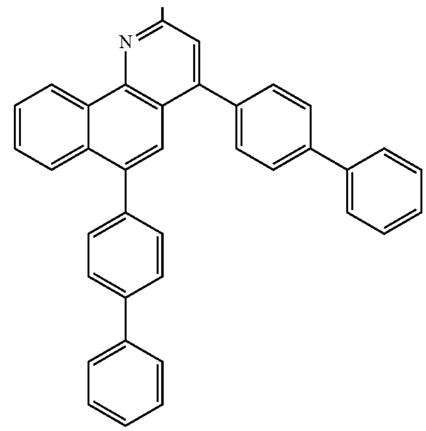
[Chemical Formula B56]
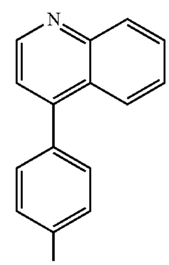
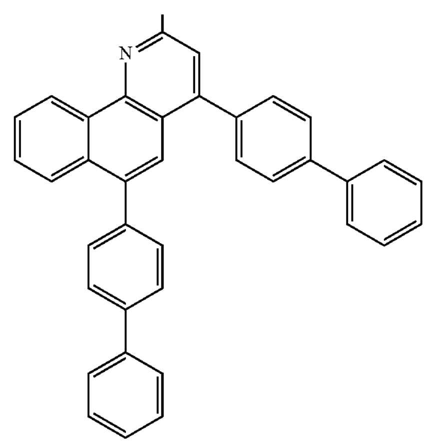
[Chemical Formula B57]
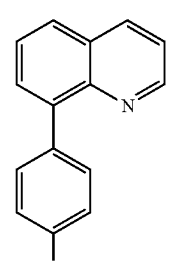

-continued
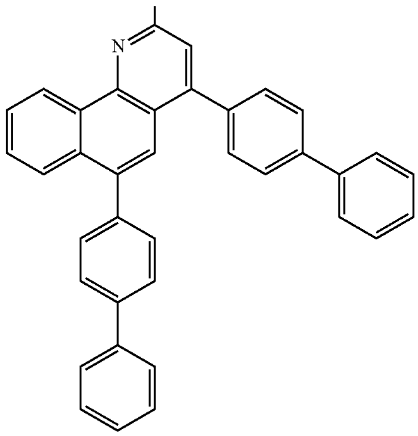
[Chemical Formula B58]
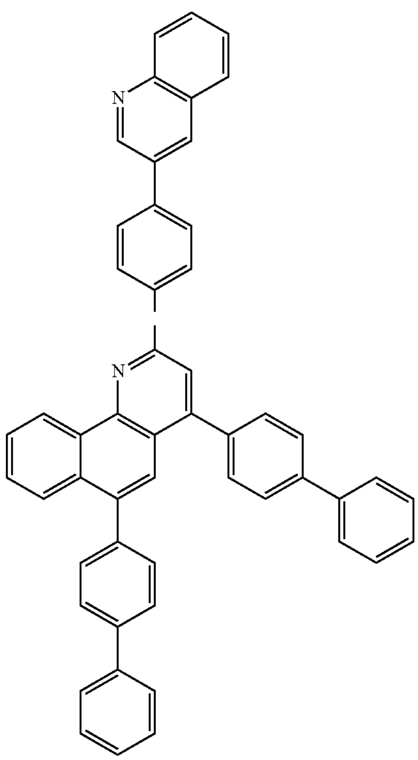
[Chemical Formula B59]
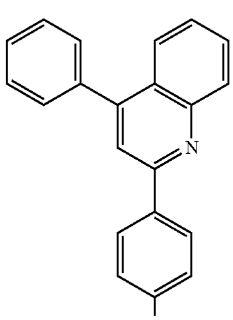
-continued
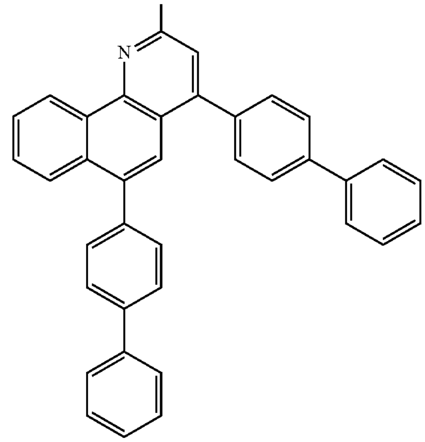
[Chemical Formula B60]
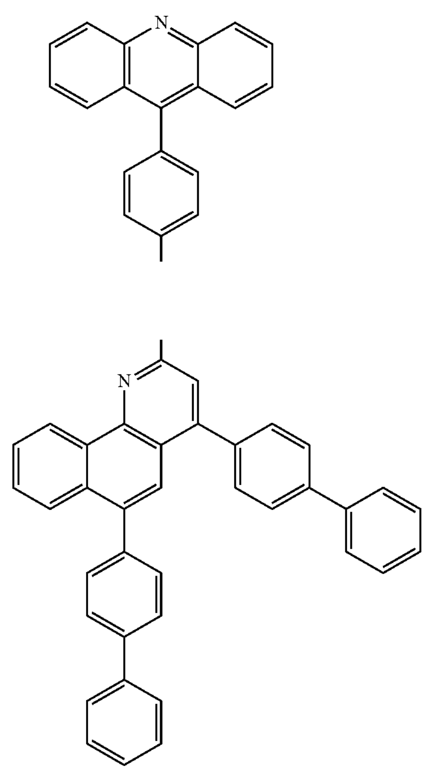

-continued
[Chemical Formula B61]
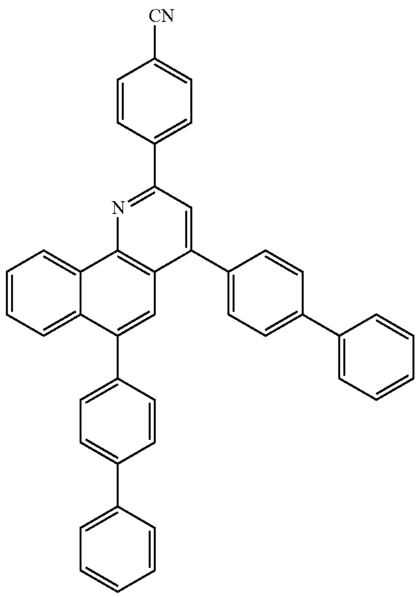
[Chemical Formula B62]
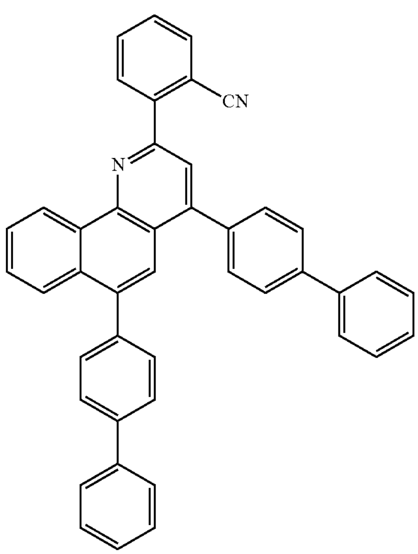
-continued
[Chemical Formula B63]
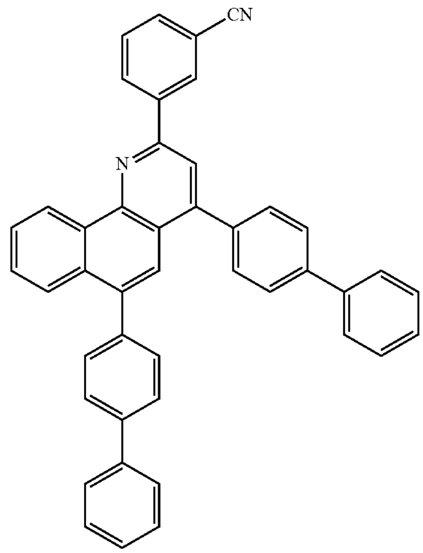
[Chemical Formula B64]
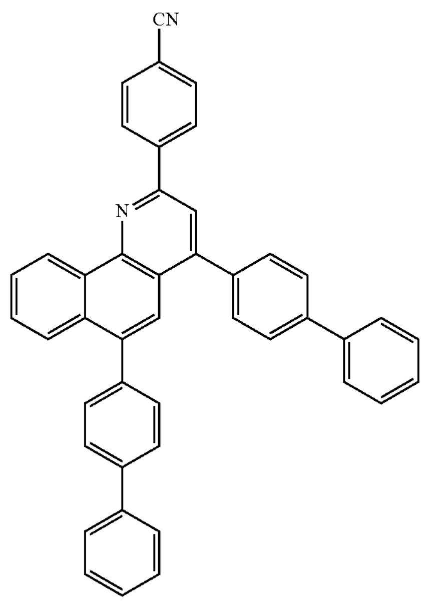
[Chemical Formula B65]
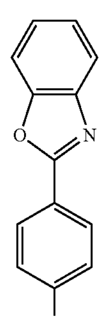

-continued
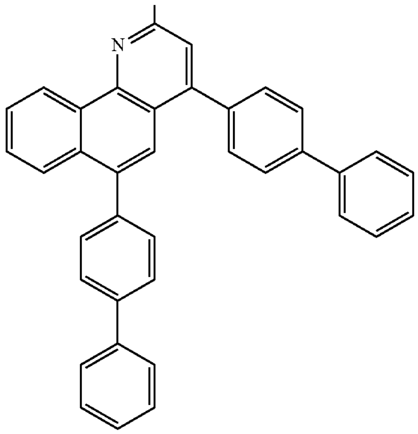
[Chemical Formula B66]
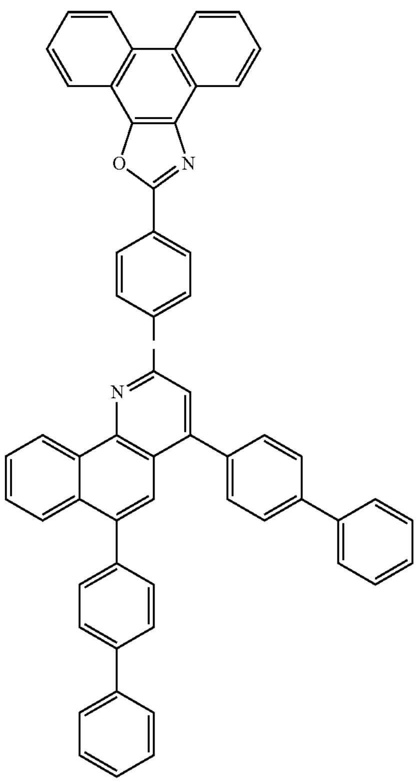
[Chemical Formula B67]
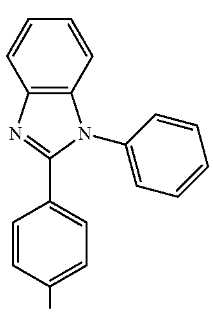
-continued
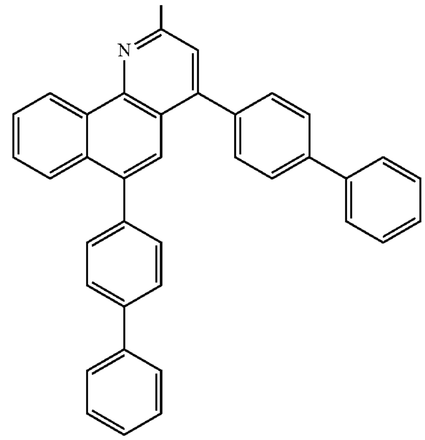
[Chemical Formula B68]
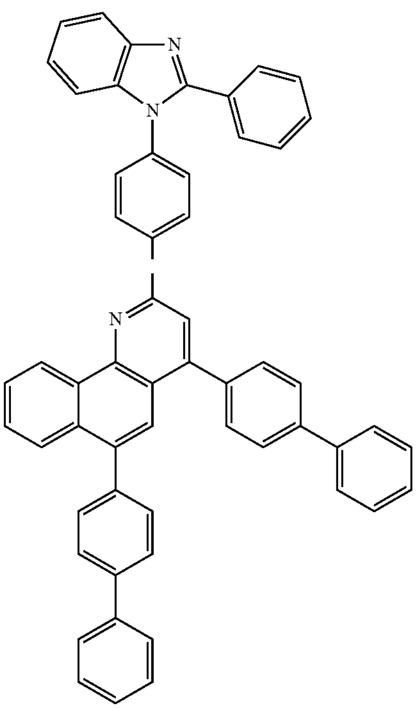
[Chemical Formula B69]
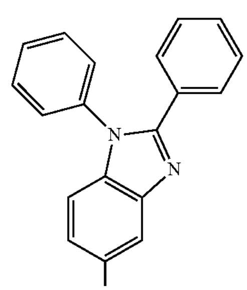

-continued
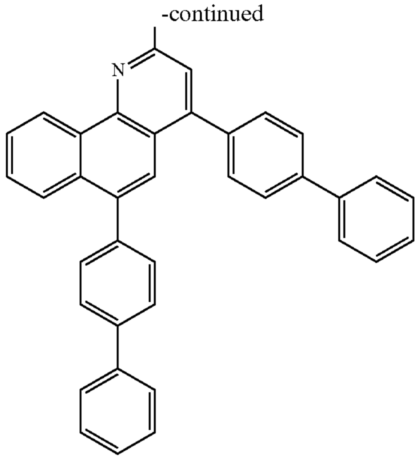
[Chemical Formula B70]
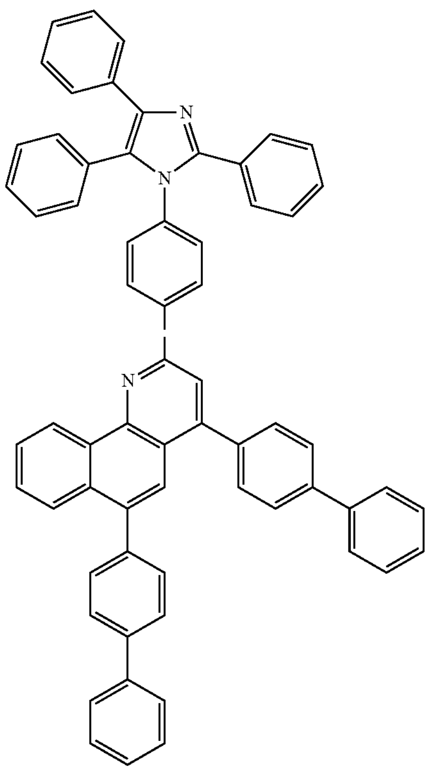
[Chemical Formula B71]
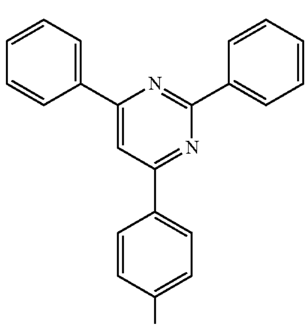
-continued
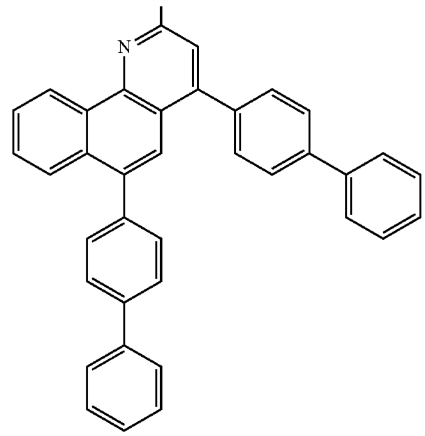
[Chemical Formula B72]
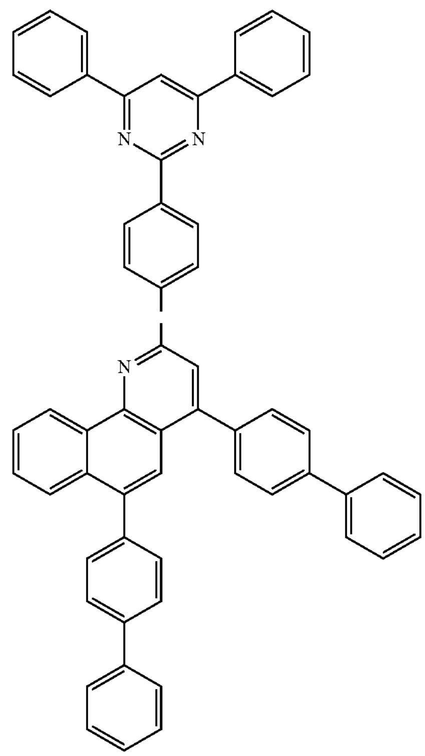
[Chemical Formula B73]
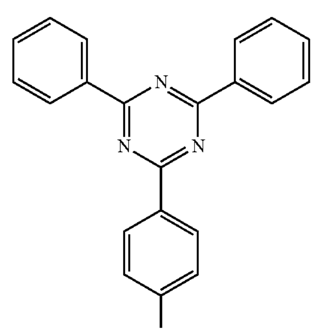

-continued
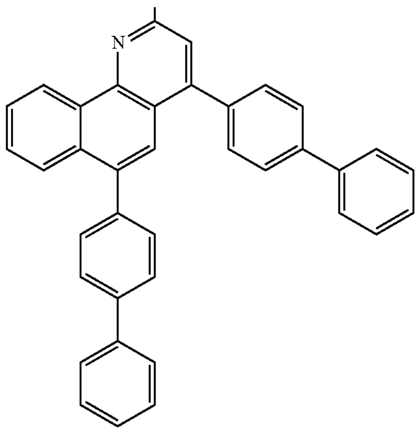
[Chemical Formula B74]
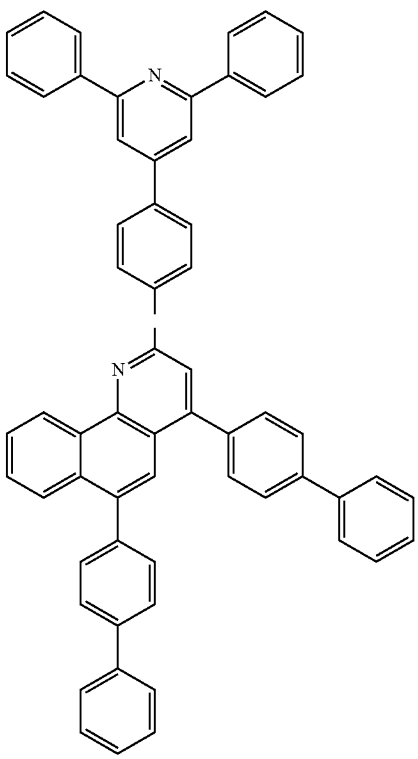
[Chemical Formula B75]
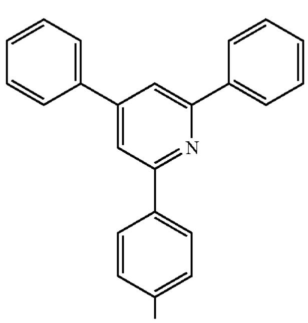
-continued
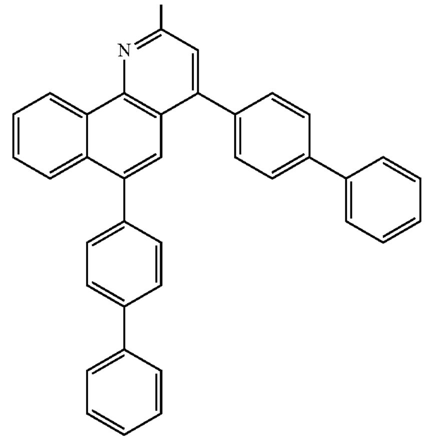
[Chemical Formula B76]
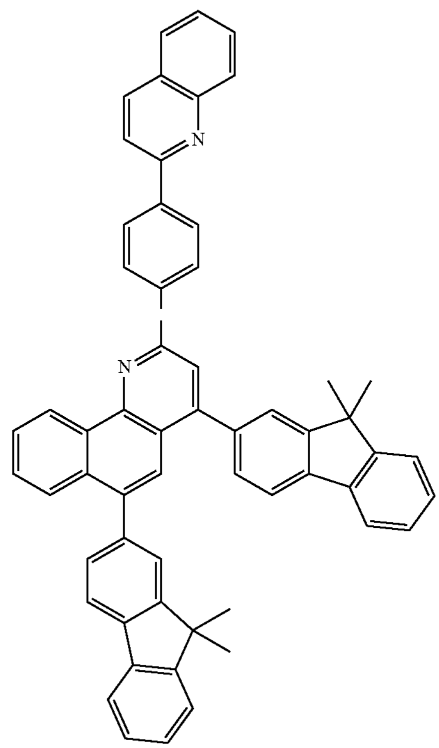
[Chemical Formula B77]
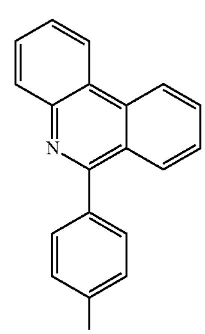

-continued
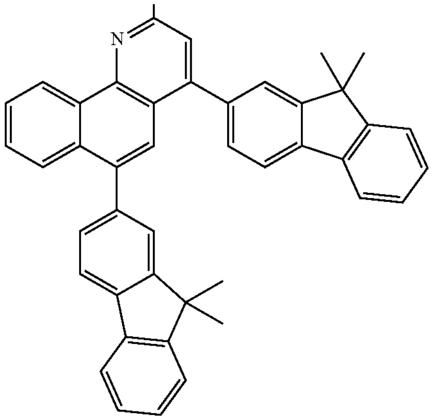
[Chemical Formula B78]
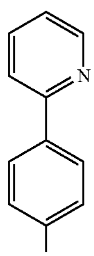
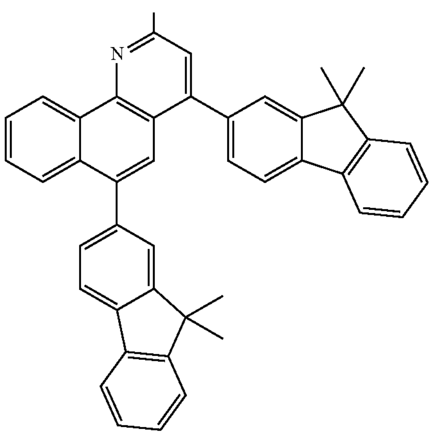
[Chemical Formula B79]
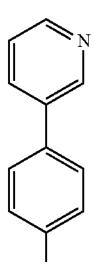
-continued
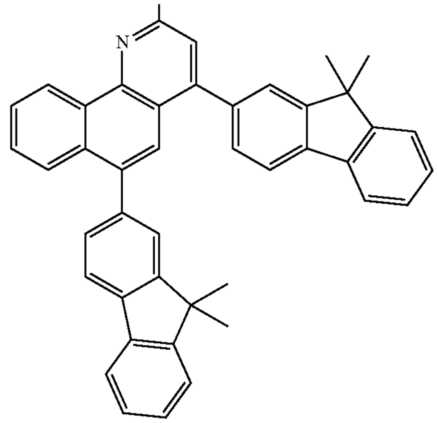
[Chemical Formula B80]
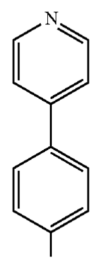
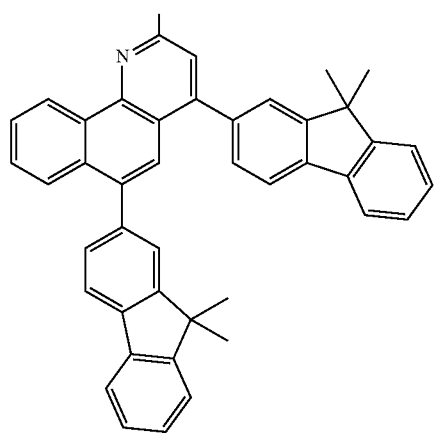
[Chemical Formula B81]
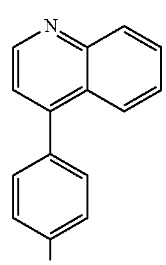

-continued
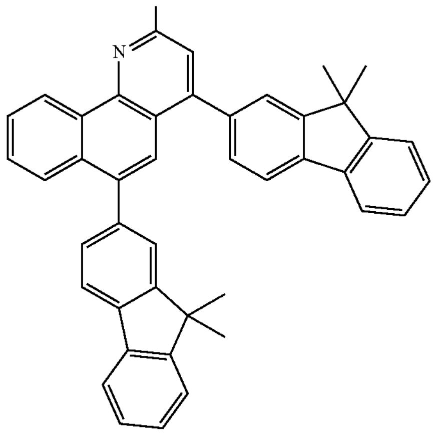
[Chemical Formula B82]
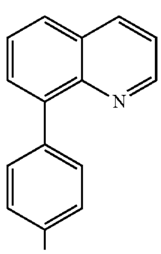
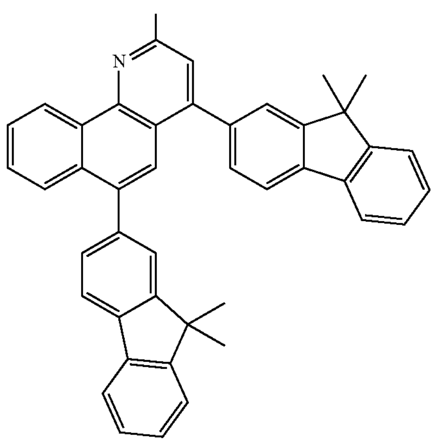
[Chemical Formula B83]
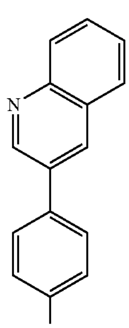
-continued
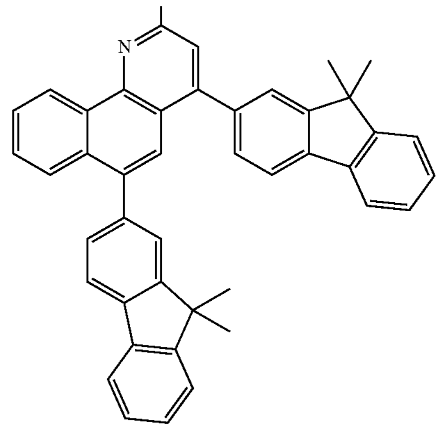
[Chemical Formula B84]
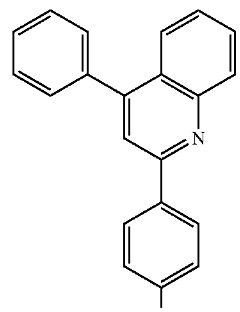
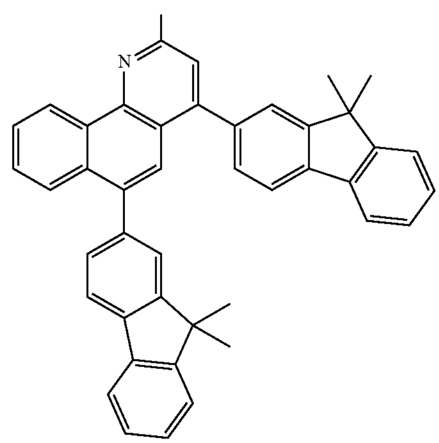
[Chemical Formula B85]
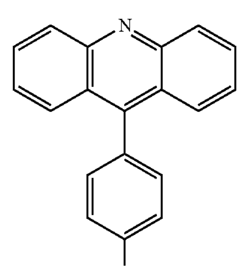

-continued
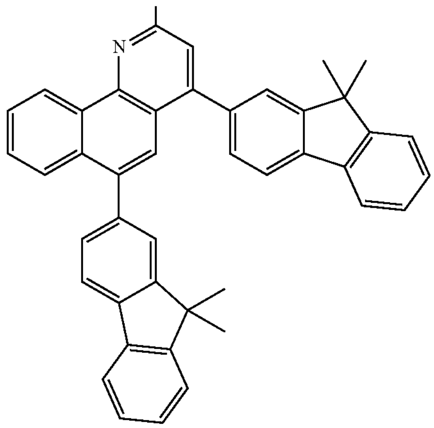
[Chemical Formula B86]
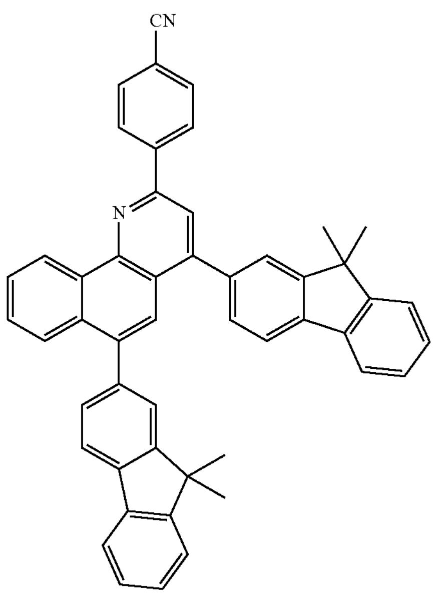
[Chemical Formula B87]
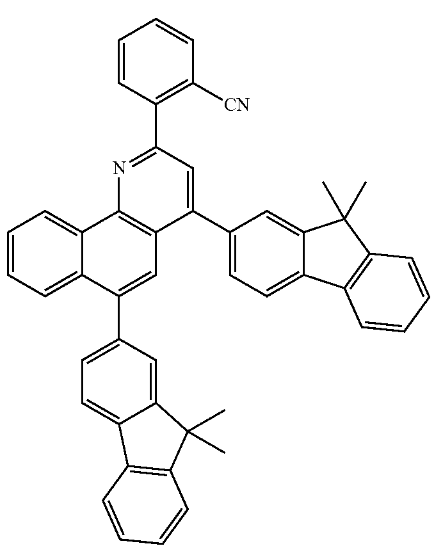
-continued
[Chemical Formula B88]
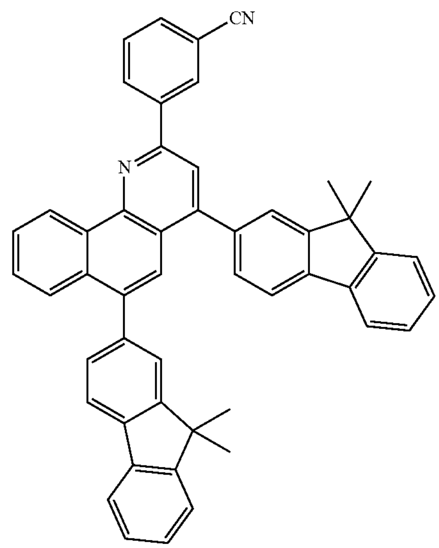
[Chemical Formula B89]
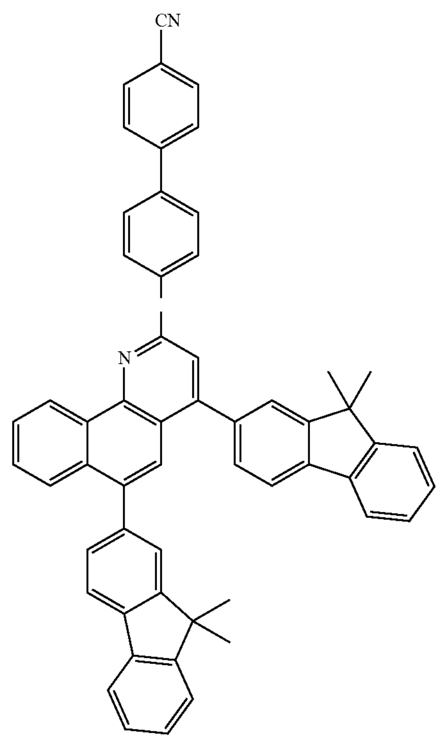
[Chemical Formula B90]
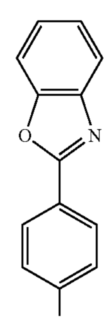

-continued
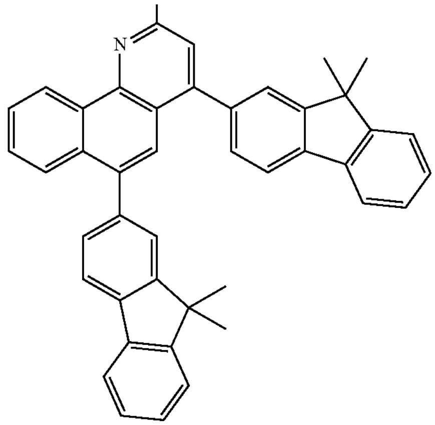
[Chemical Formula B91]
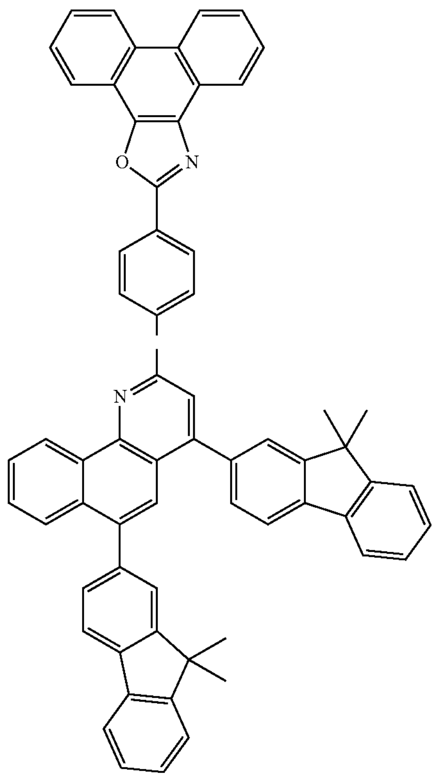
[Chemical Formula B92]
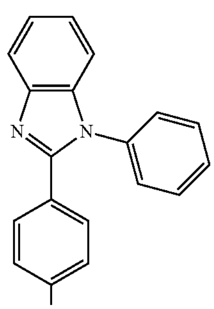
-continued
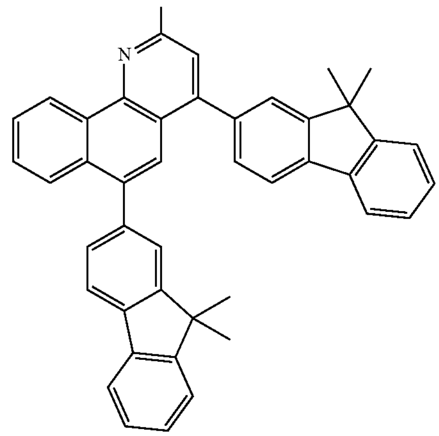
[Chemical Formula B93]
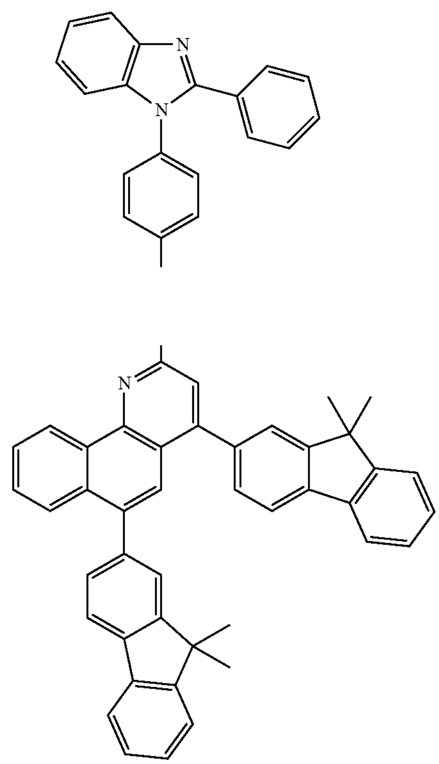
[Chemical Formula B94]
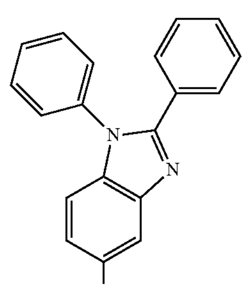

-continued
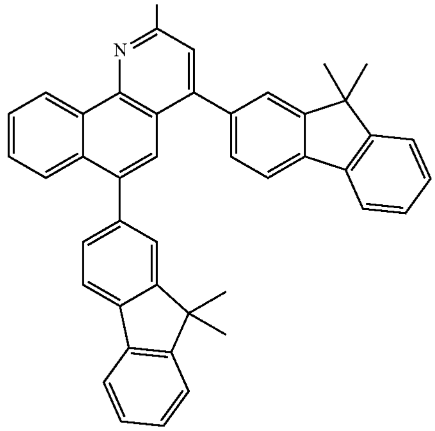
[Chemical Formula B95]
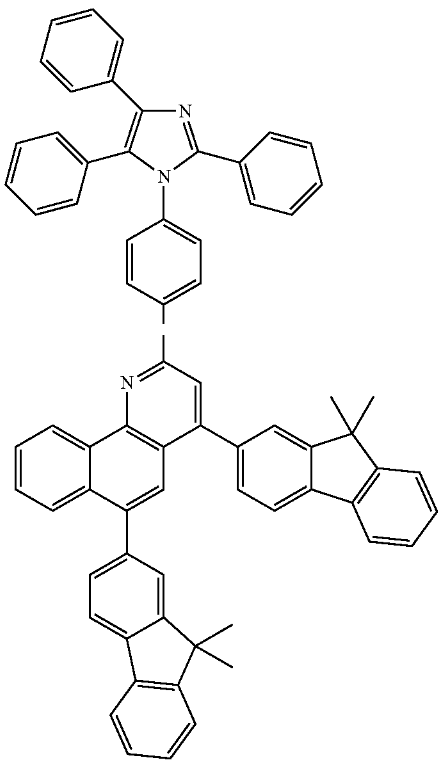
[Chemical Formula B96]
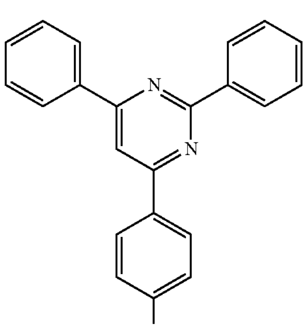
-continued
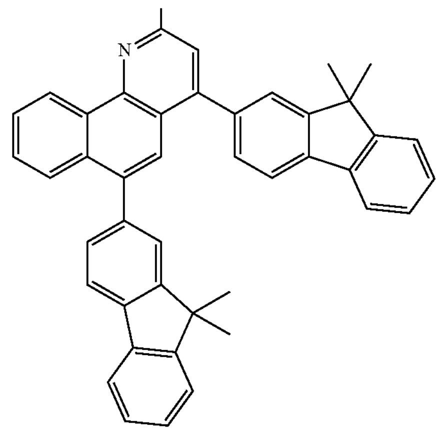
[Chemical Formula B97]
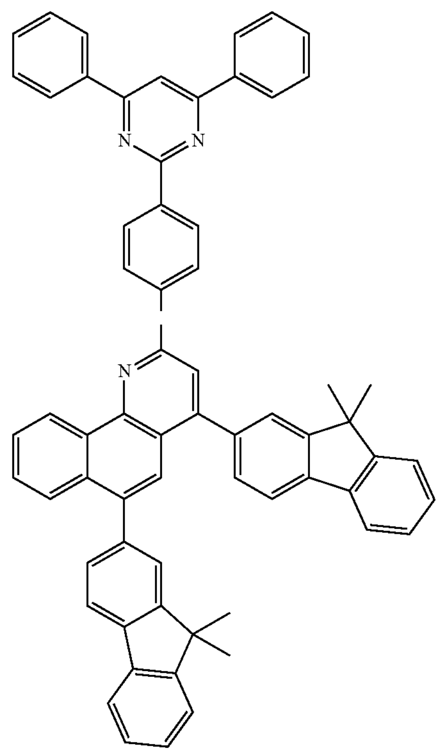
[Chemical Formula B98]
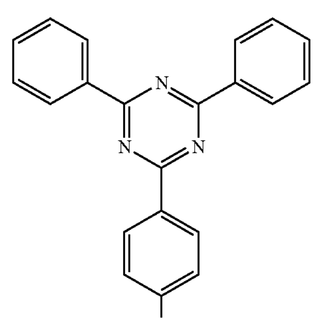

-continued
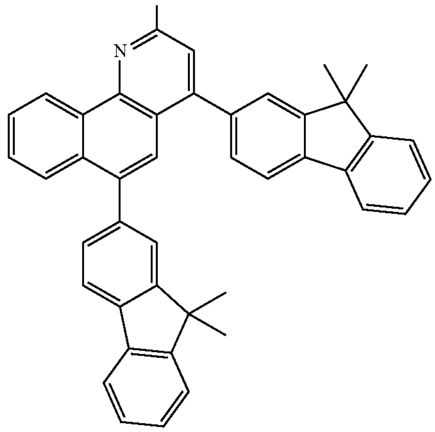
[Chemical Formula B99]
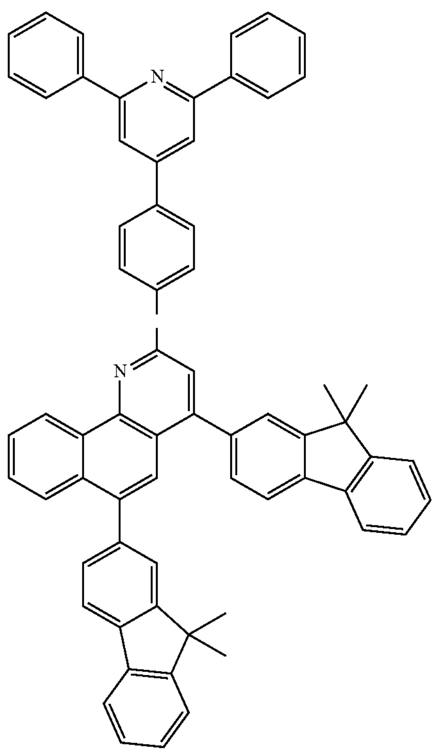
[Chemical Formula B100]
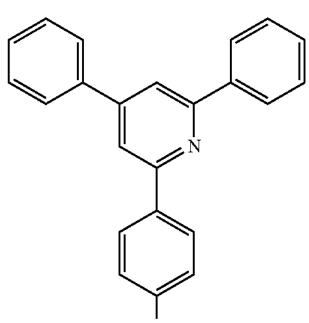
-continued
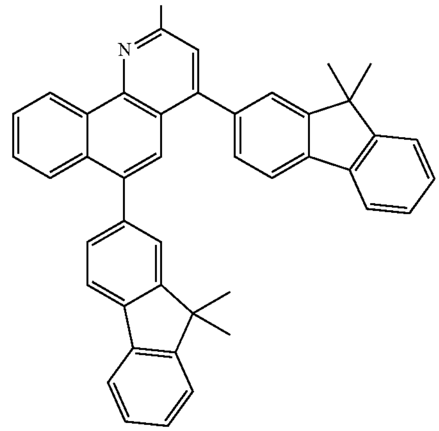
[Chemical Formula B101]
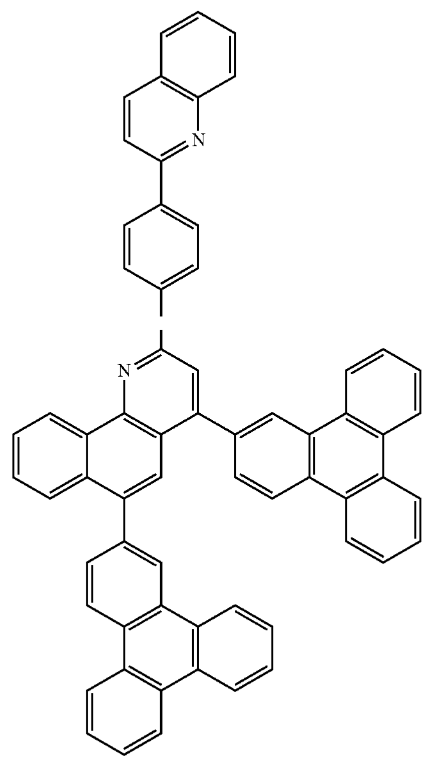
[Chemical Formula B102]
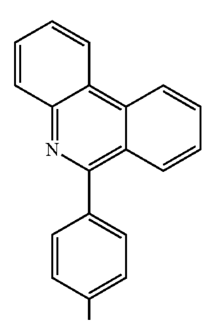

-continued
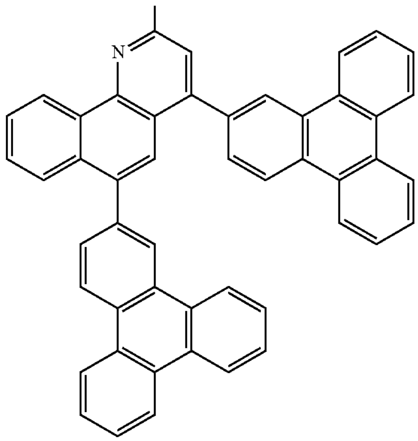
[Chemical Formula B103]
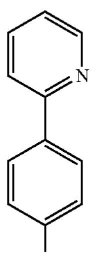
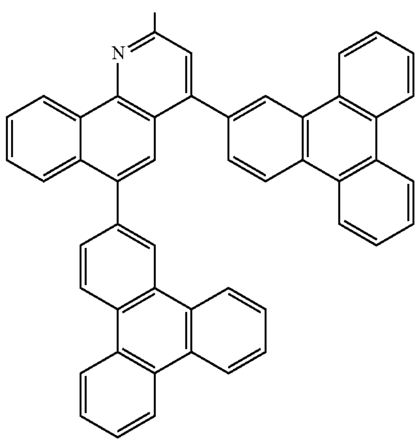
[Chemical Formula B104]
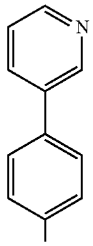
-continued
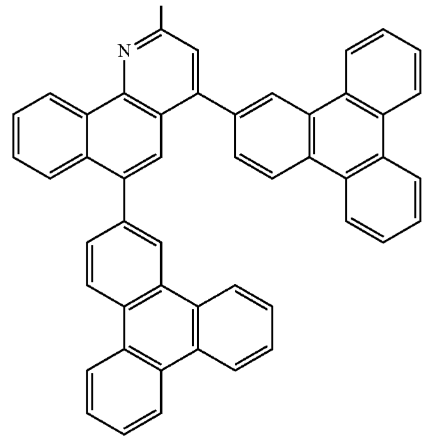
[Chemical Formula B105]
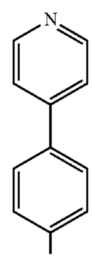
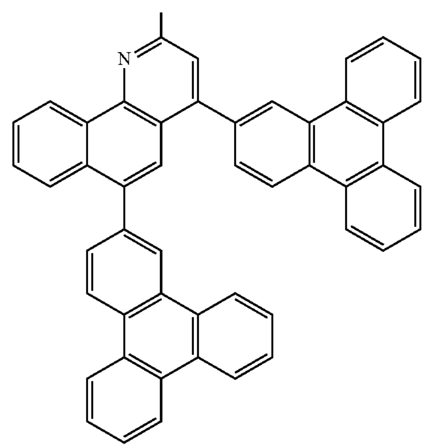
[Chemical Formula B106]
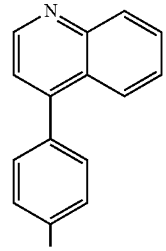

-continued
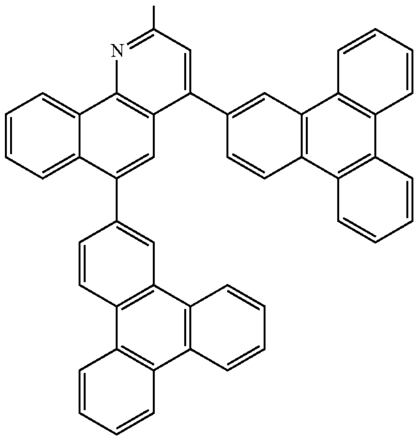
[Chemical Formula B107]
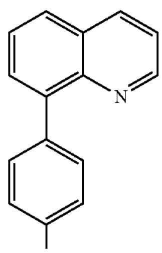
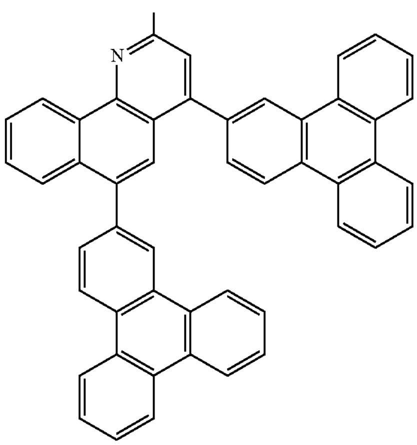
[Chemical Formula B108]
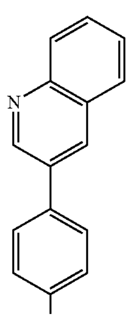
-continued
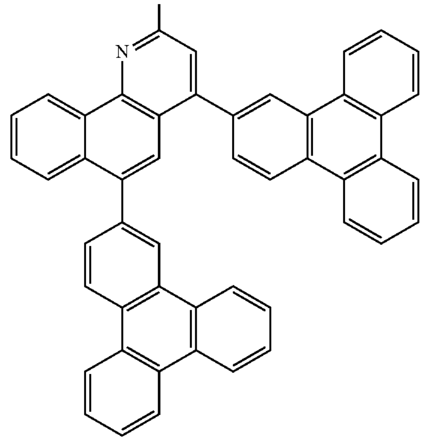
[Chemical Formula B109]
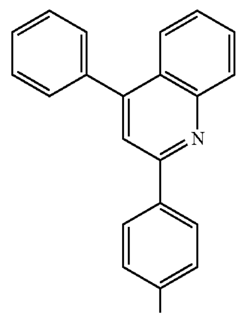
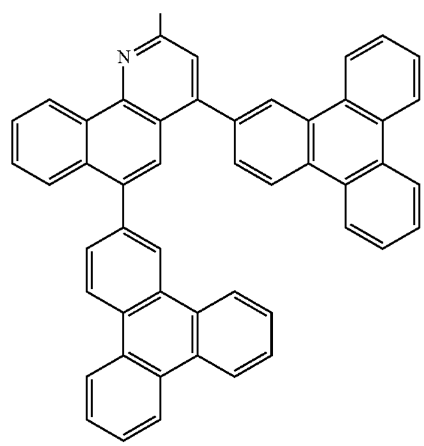
[Chemical Formula B110]
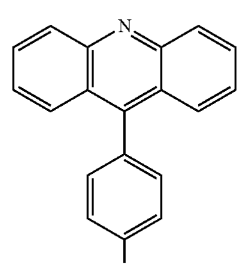

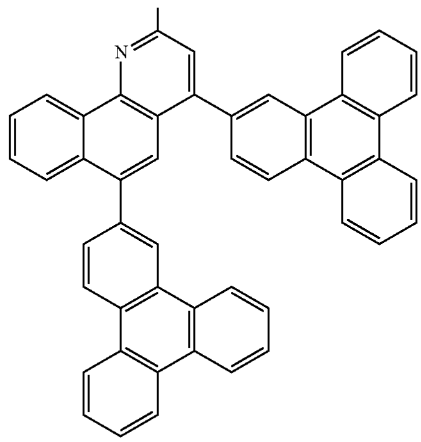
[Chemical Formula B111]
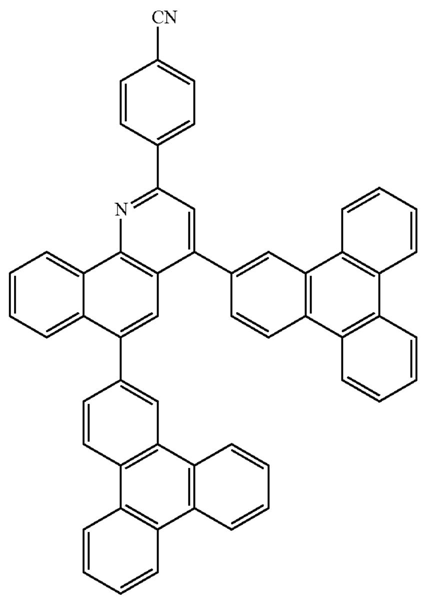
[Chemical Formula B112]
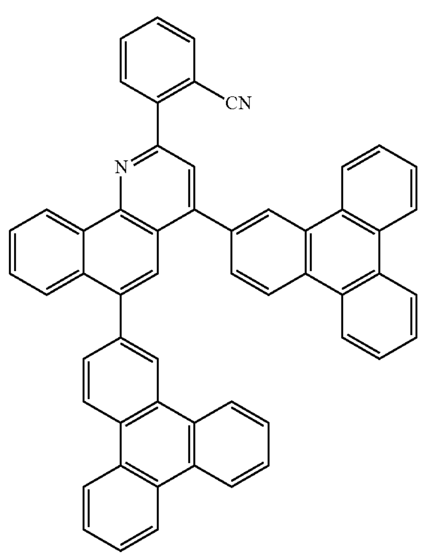
[Chemical Formula B113]
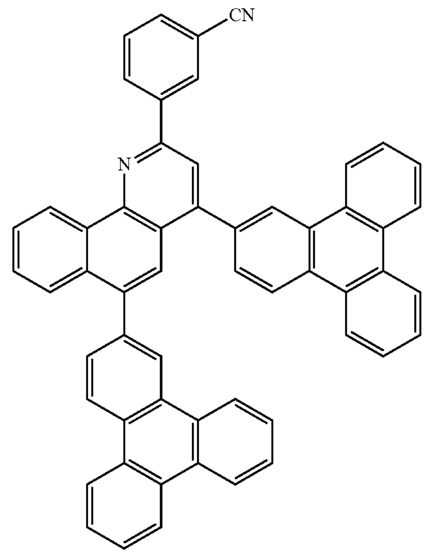
[Chemical Formula B114]
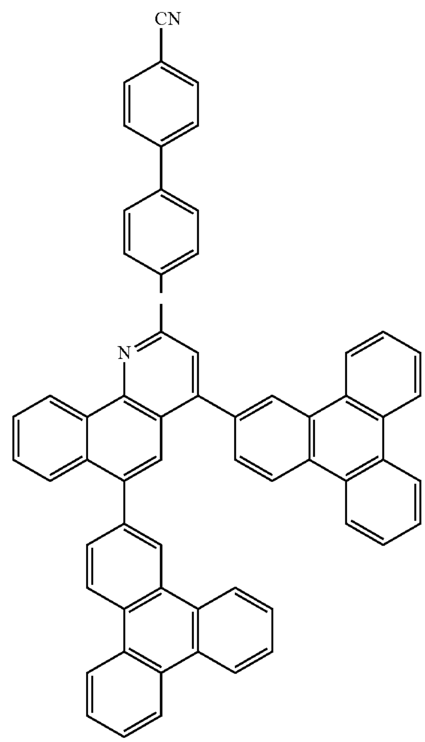
[Chemical Formula B115]
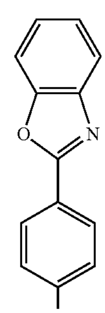

-continued
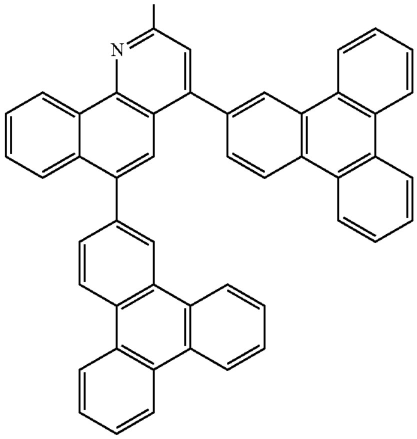
[Chemical Formula B116]
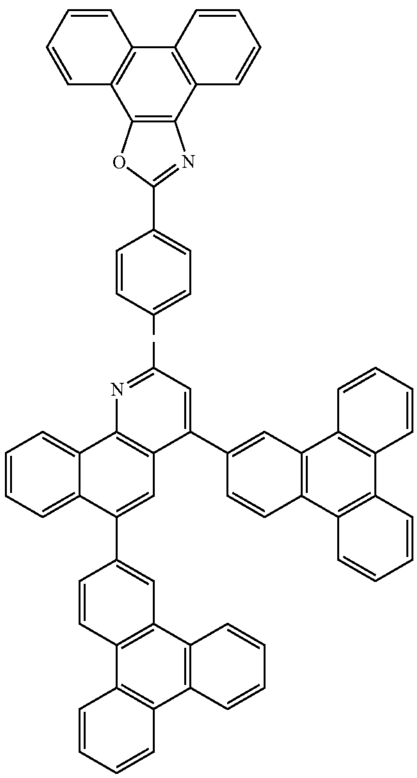
[Chemical Formula B117]
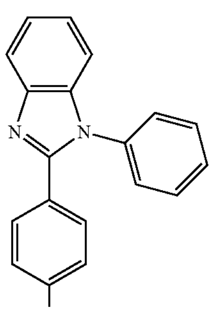
-continued
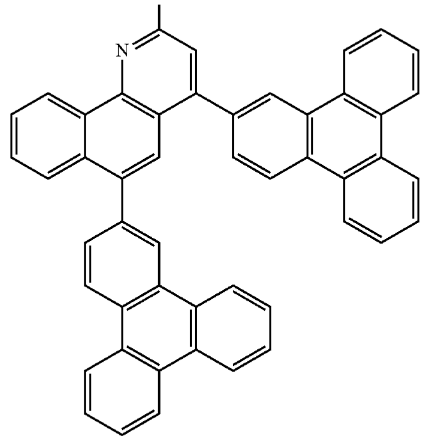
[Chemical Formula B118]
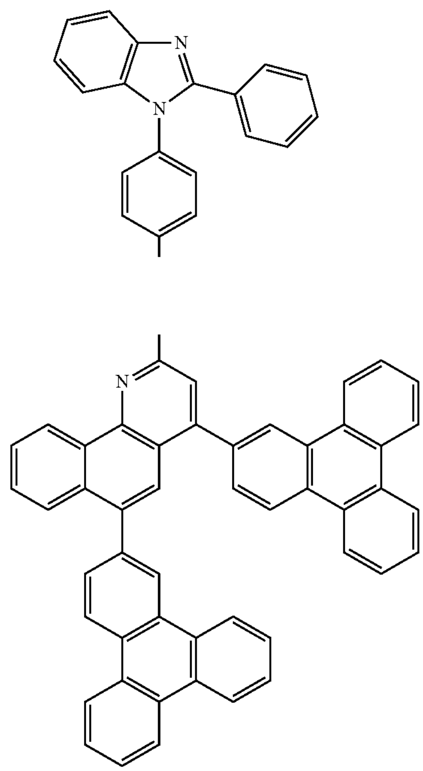
[Chemical Formula B119]
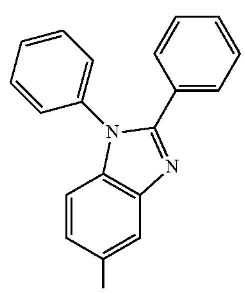

-continued
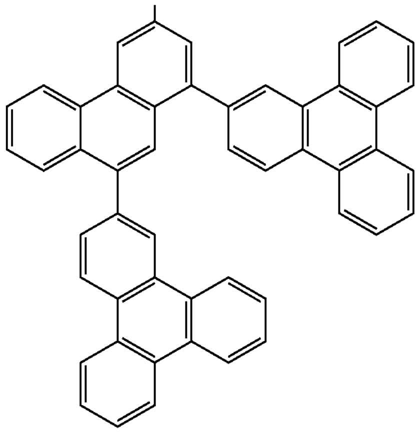
[Chemical Formula B120]
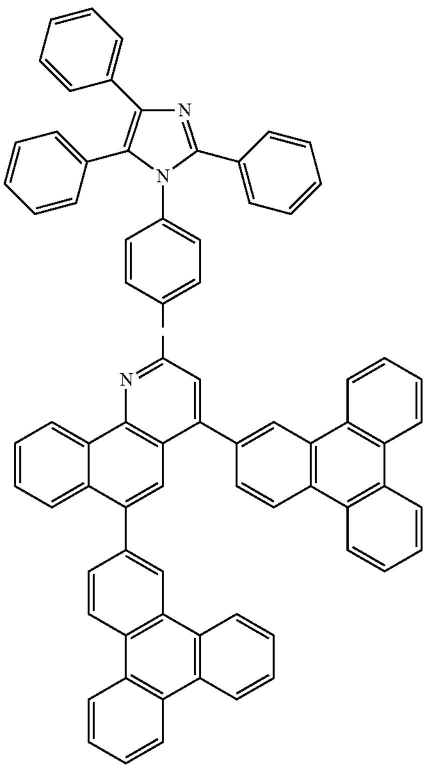
[Chemical Formula B121]
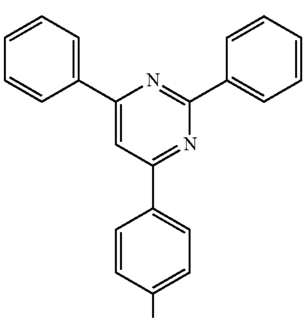
-continued
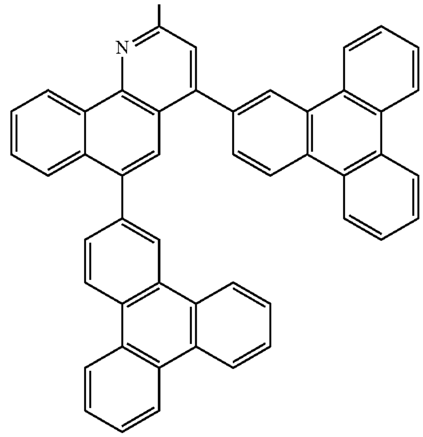
[Chemical Formula B122]
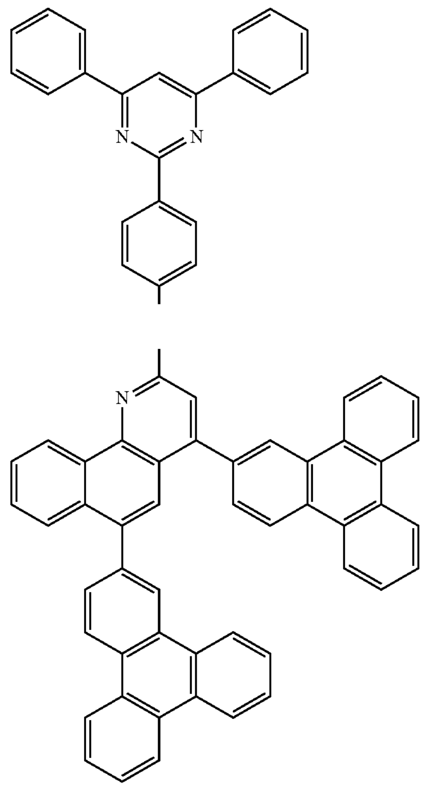
[Chemical Formula B123]
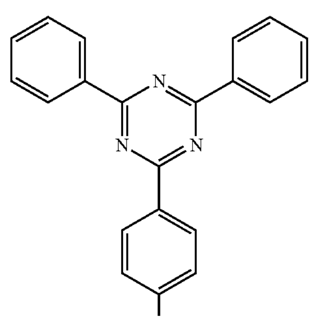

-continued
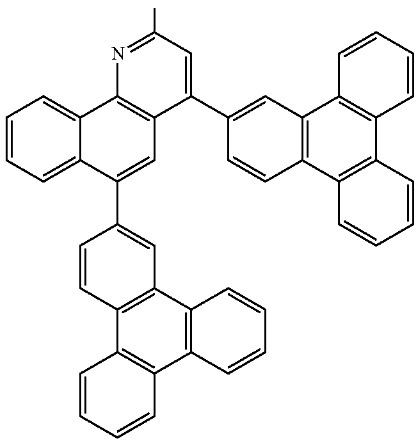
[Chemical Formula B124]
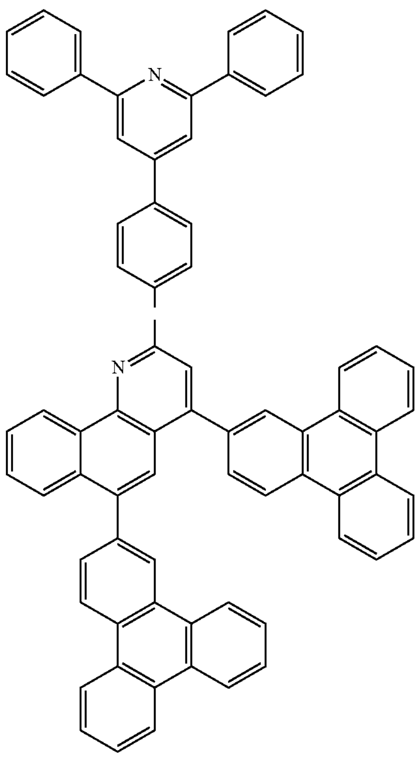
[Chemical Formula B125]
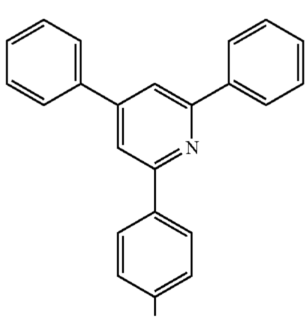
-continued
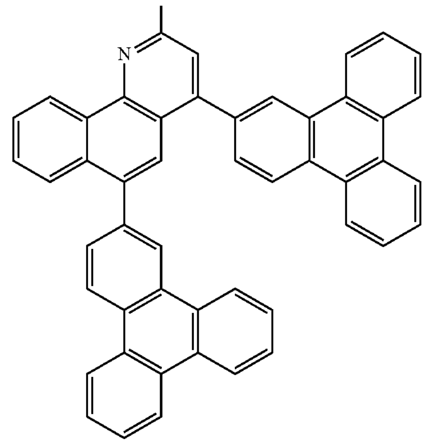
[Chemical Formula B126]
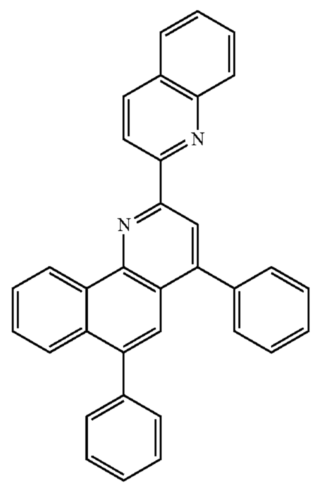
[Chemical Formula B127]
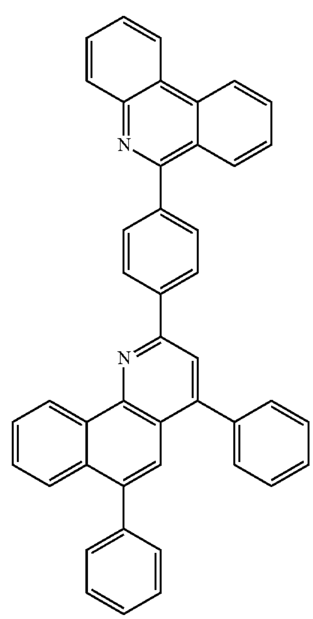

-continued
[Chemical Formula B128]
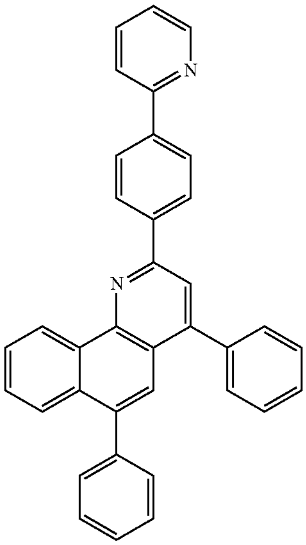
[Chemical Formula B129]
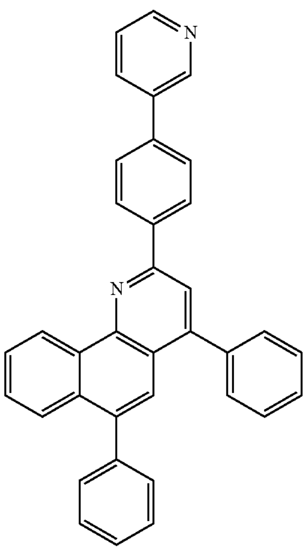
[Chemical Formula B130]
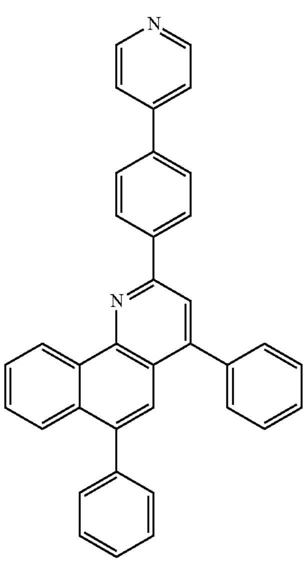
-continued
[Chemical Formula B131]
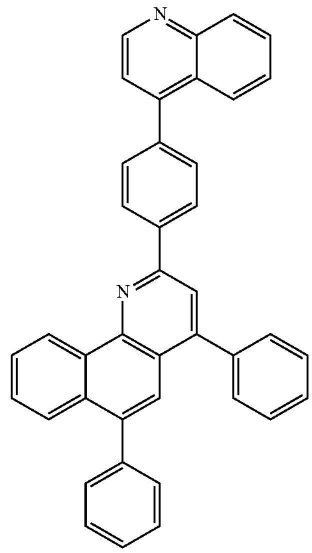
[Chemical Formula B132]
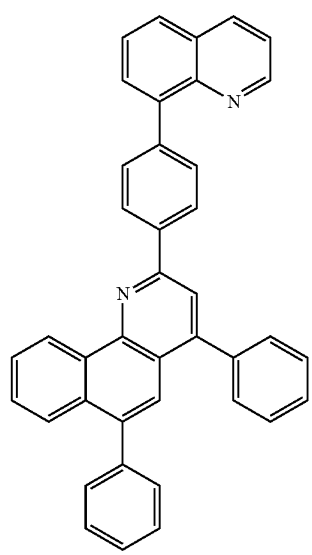

-continued
[Chemical Formula B133]
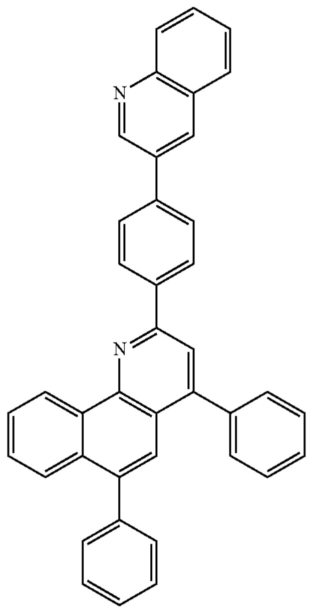
[Chemical Formula B134]
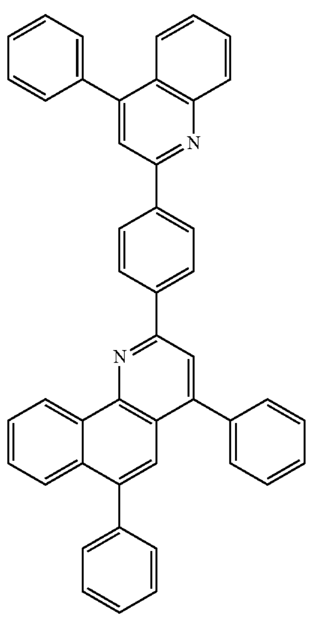
-continued
[Chemical Formula B135]
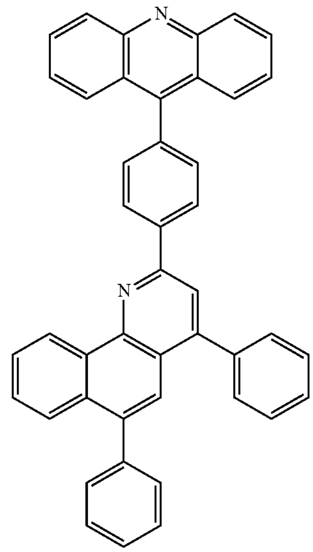
[Chemical Formula B136]
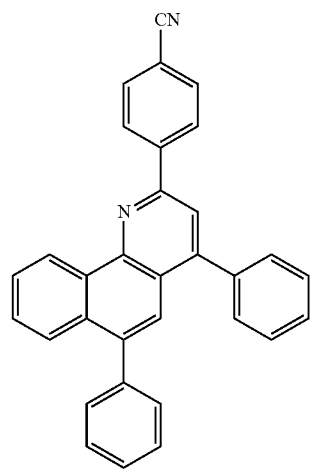
[Chemical Formula B137]
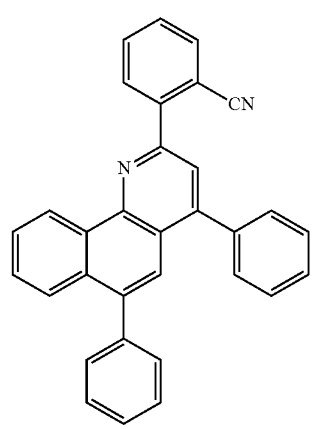

[Chemical Formula B138]
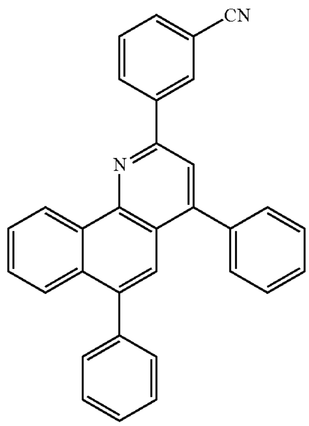
[Chemical Formula B139]
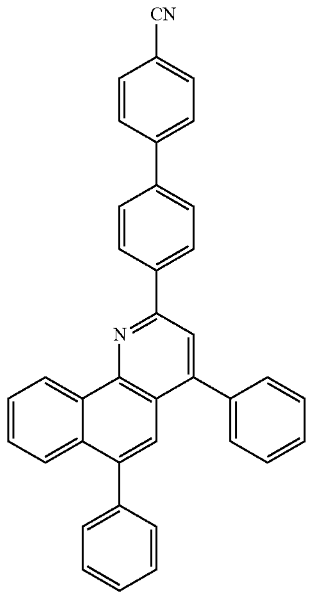
[Chemical Formula B140]
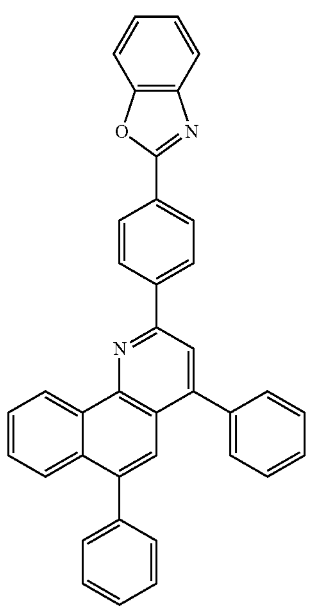
[Chemical Formula B141]
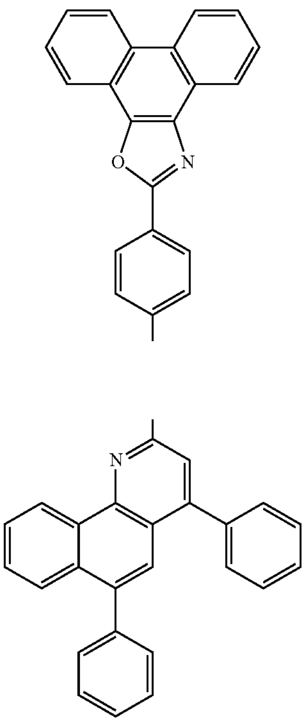
[Chemical Formula B142]
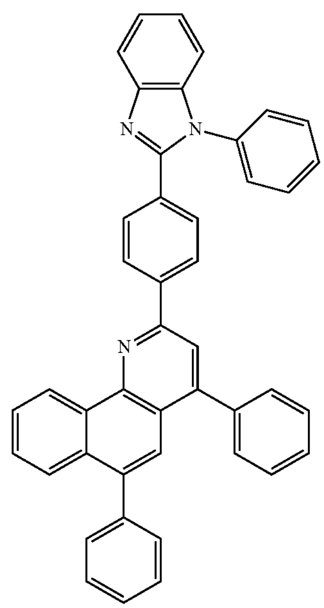

-continued
[Chemical Formula B143]
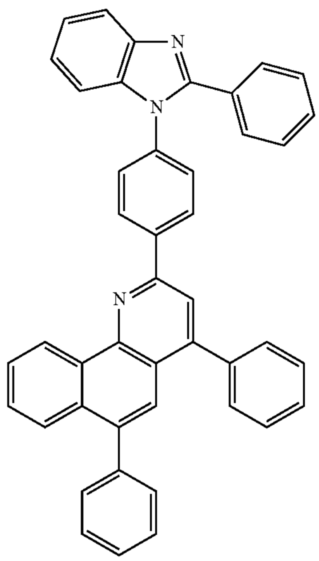
[Chemical Formula B144]
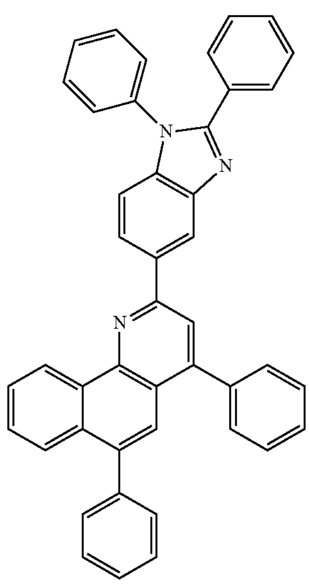
-continued
[Chemical Formula B145]
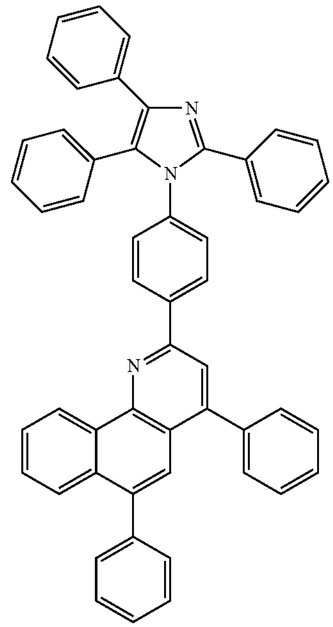
[Chemical Formula B146]
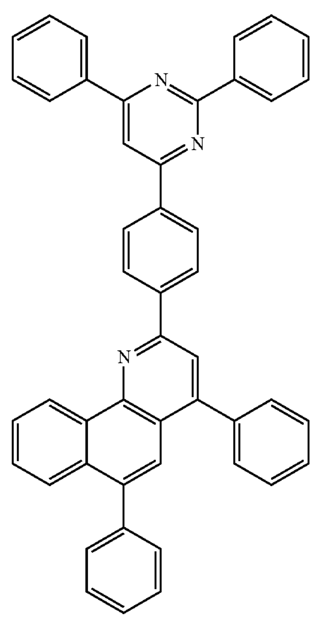

-continued
[Chemical Formula B147]
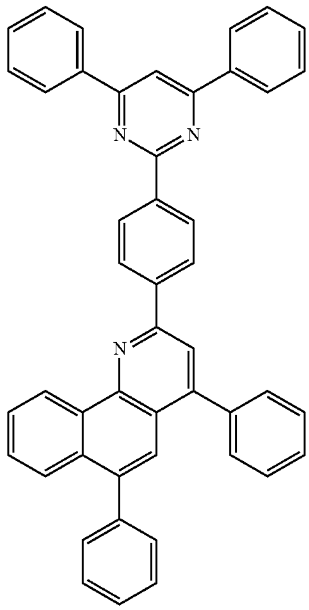
[Chemical Formula B148]
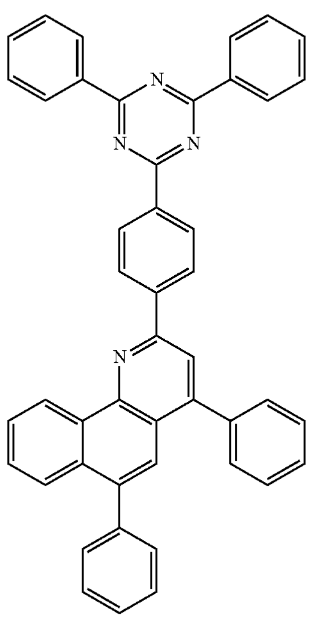
-continued
[Chemical Formula B149]
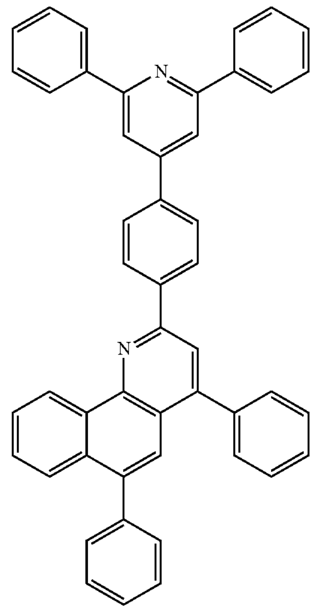
[Chemical Formula B150]
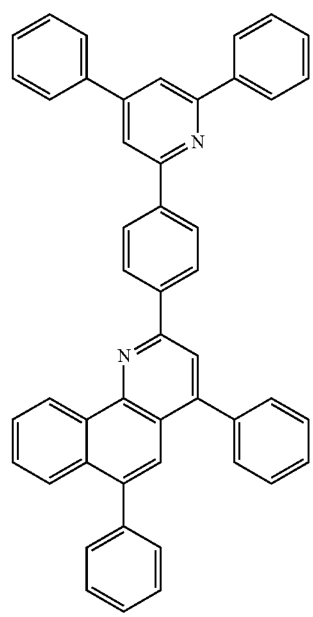

-continued
[Chemical Formula B151]
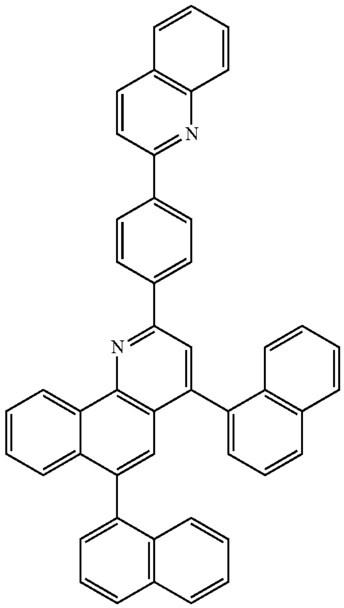
[Chemical Formula B152]
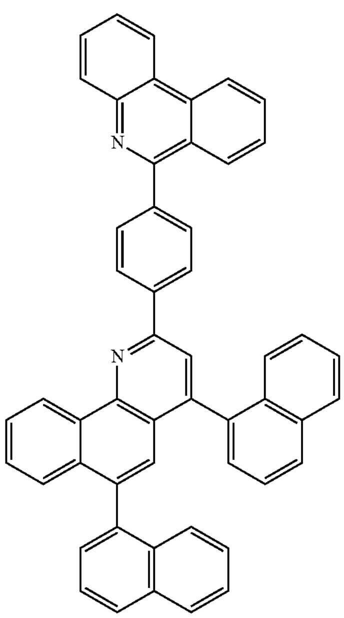
-continued
[Chemical Formula B153]
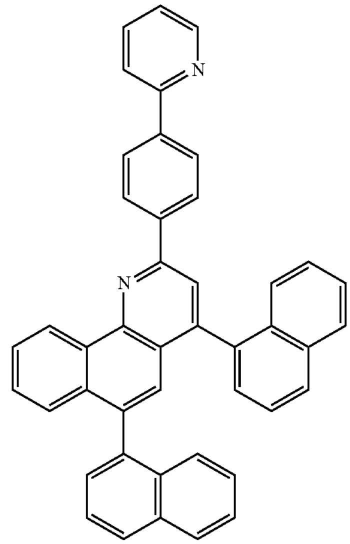
[Chemical Formula B154]
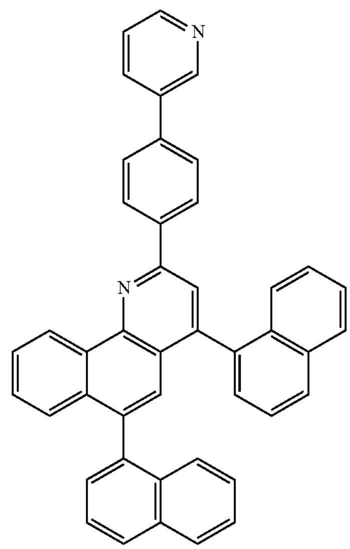
[Chemical Formula B155]
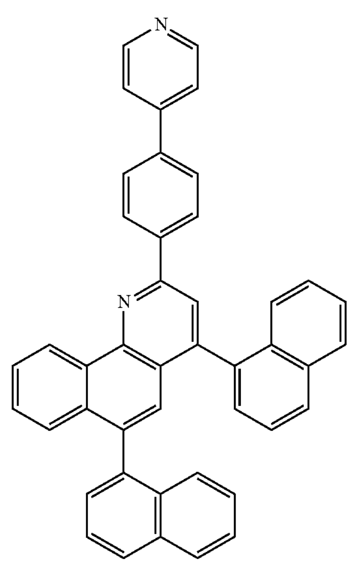

[Chemical Formula B156]
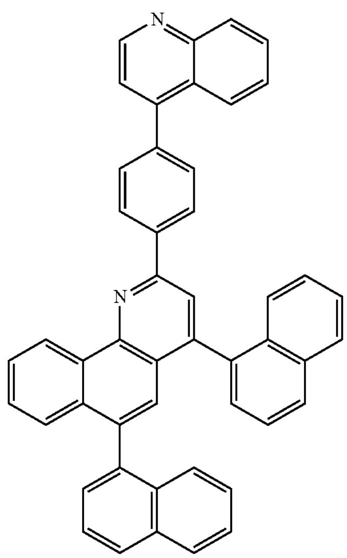
[Chemical Formula B157]
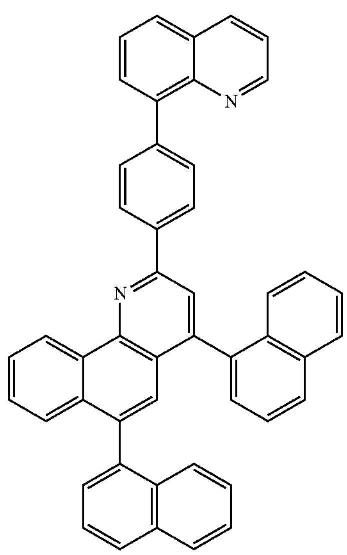
[Chemical Formula B158]
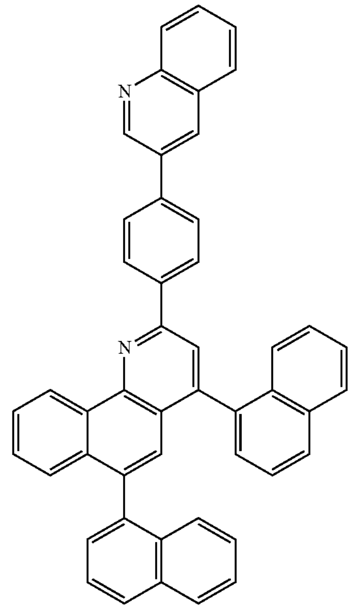
[Chemical Formula B159]
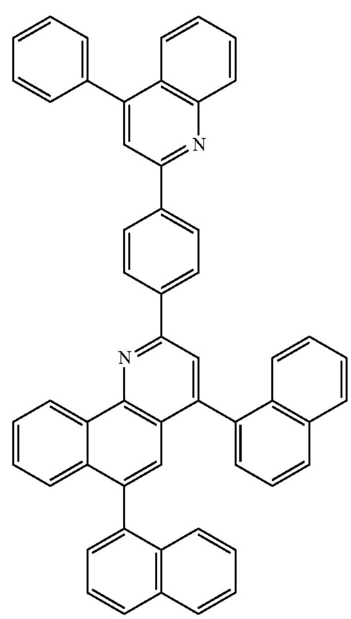

-continued
[Chemical Formula B160]
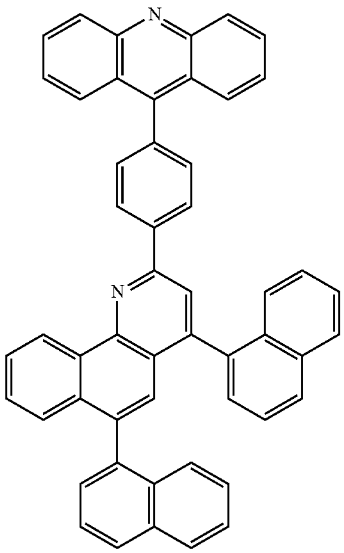
[Chemical Formula B161]
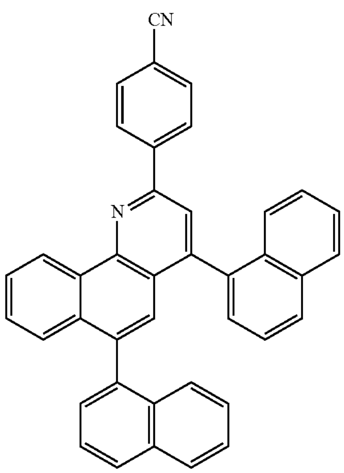
[Chemical Formula B162]
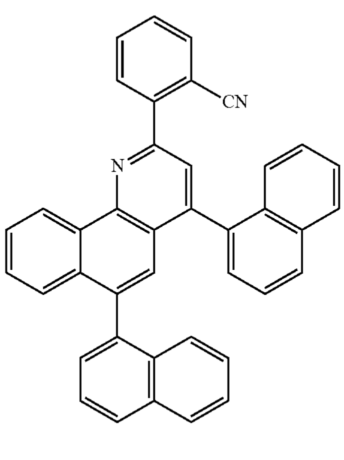
-continued
[Chemical Formula B163]
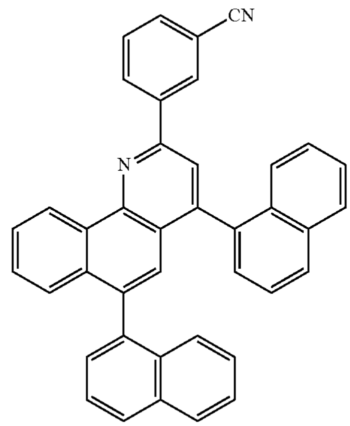
[Chemical Formula B164]
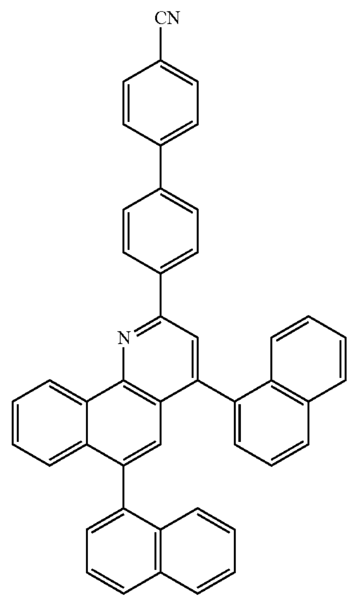
[Chemical Formula B165]
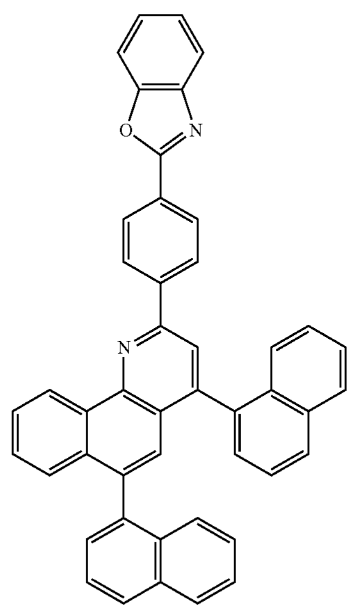

[Chemical Formula B166]
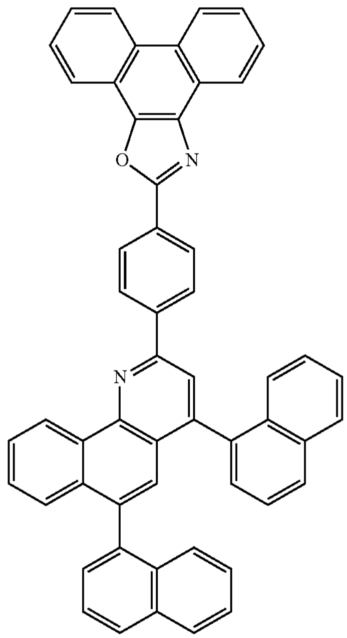
[Chemical Formula B167]
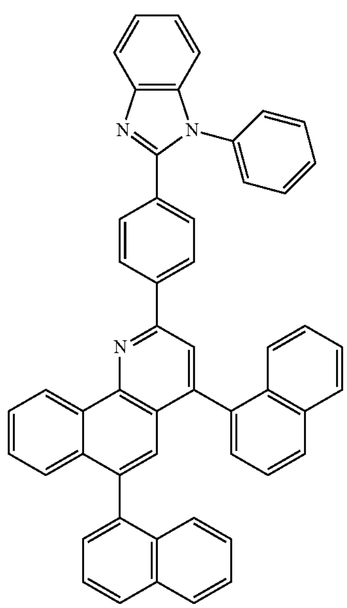
[Chemical Formula B168]
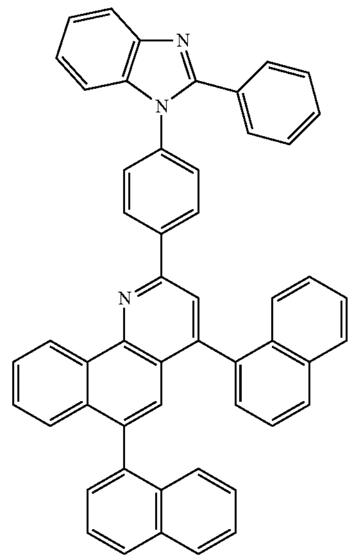
[Chemical Formula B169]
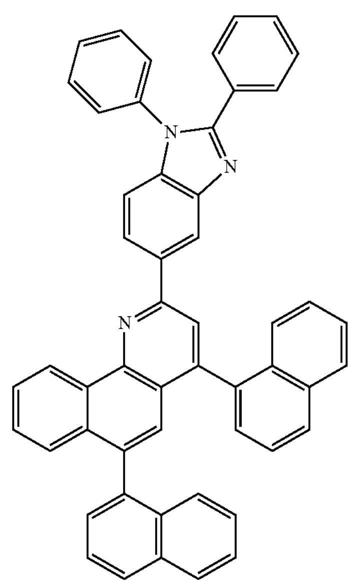

[Chemical Formula B170]
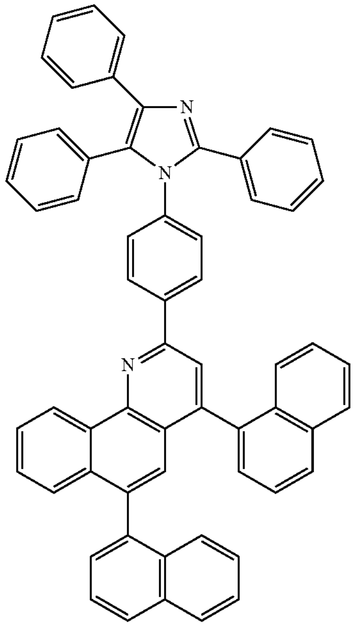
[Chemical Formula B172]
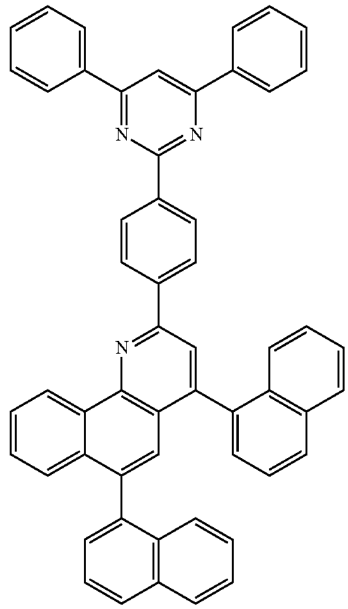
[Chemical Formula B171]
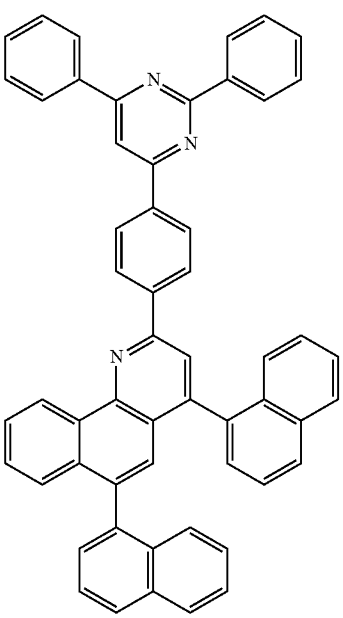
[Chemical Formula B173]
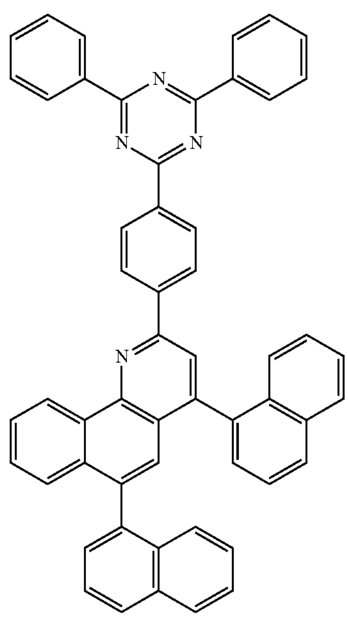

-continued
[Chemical Formula B174]
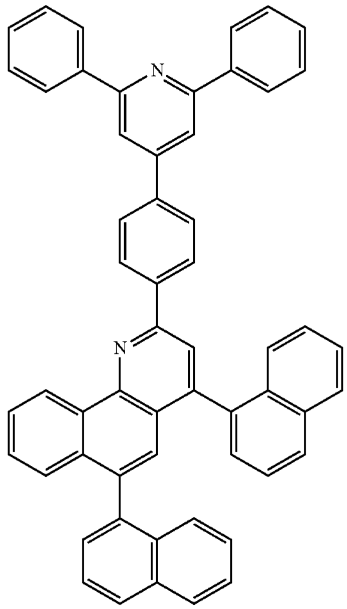
[Chemical Formula B175]
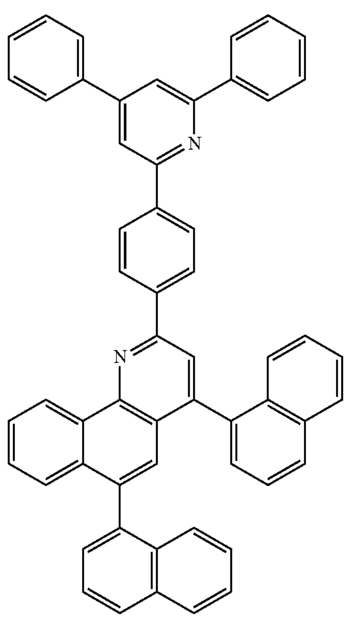
In an implementation, the compound for an organic opto-electronic device may be represented by one of the following Chemical Formulae C1 to C 173.
[Chemical Formula C1]
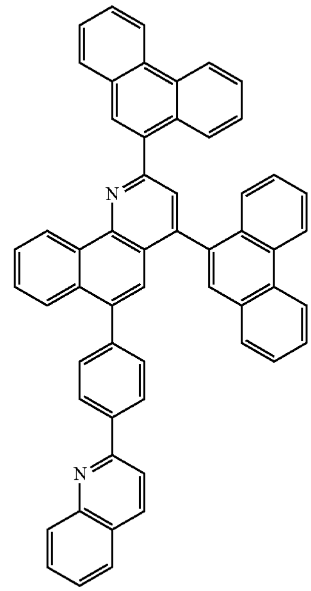
[Chemical Formula C2]
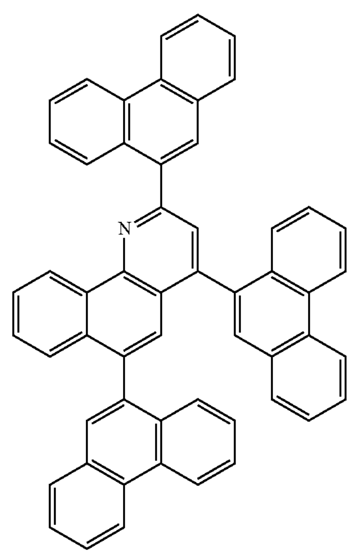

[Chemical Formula C3]
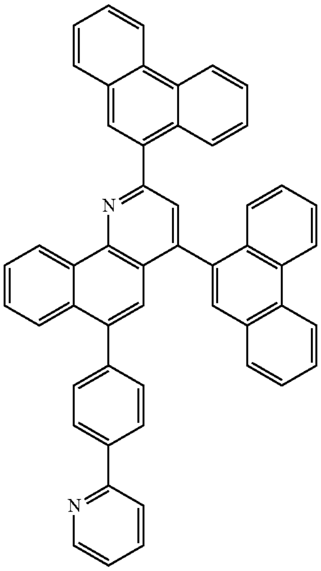
[Chemical Formula C4]
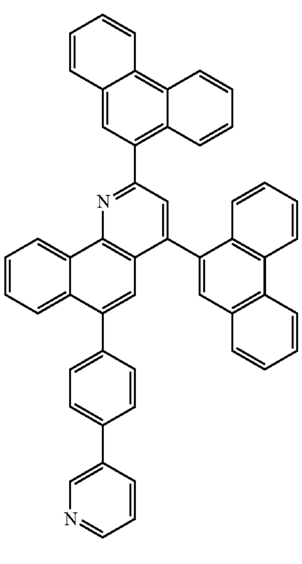
[Chemical Formula C5]
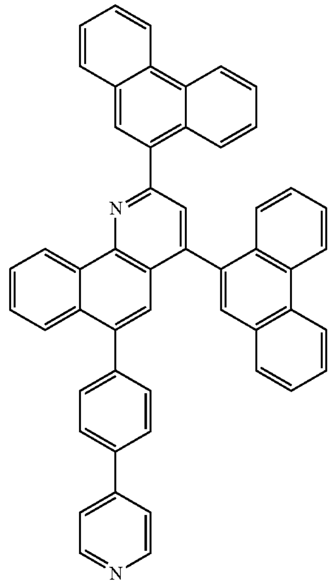
[Chemical Formula C6]
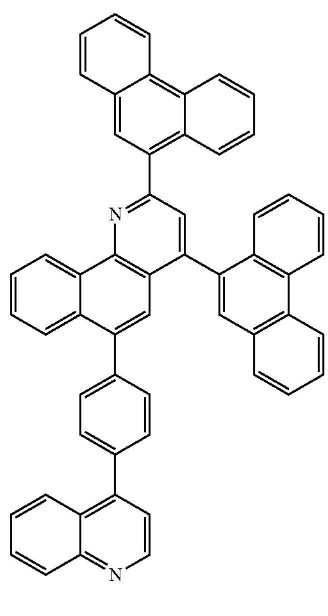

-continued
[Chemical Formula C7]
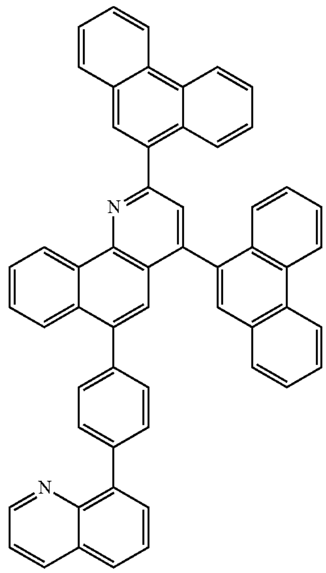
[Chemical Formula C8]
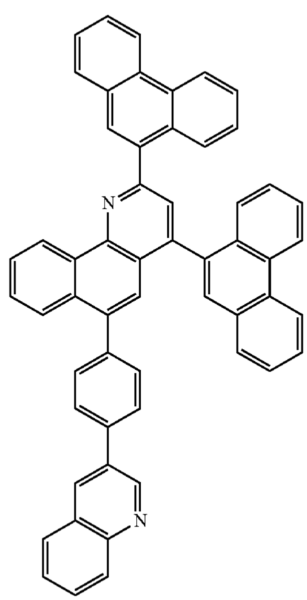
-continued
[Chemical Formula C9]
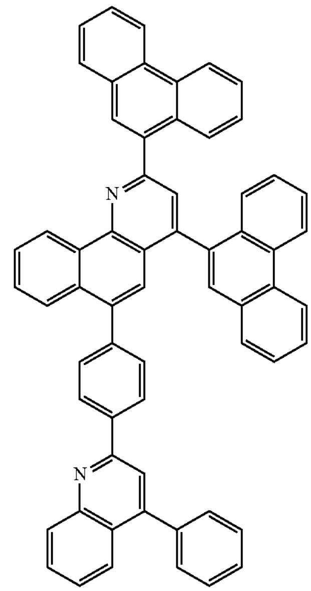
[Chemical Formula C10]
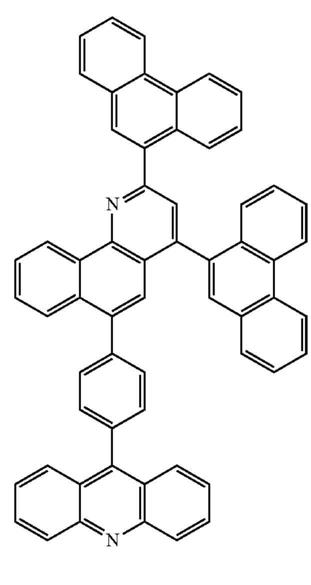

-continued
[Chemical Formula 11]
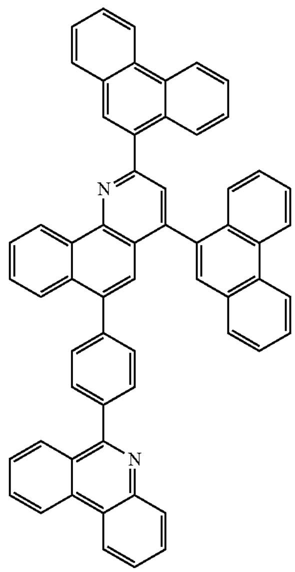
[Chemical Formula 12]
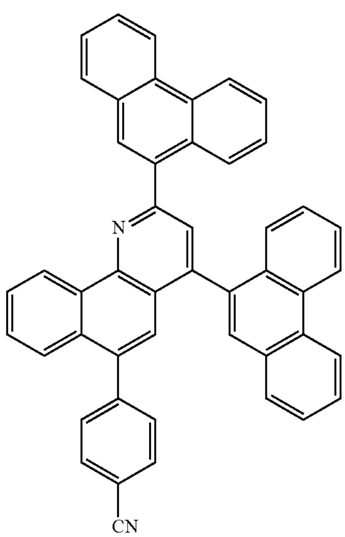
[Chemical Formula 13]
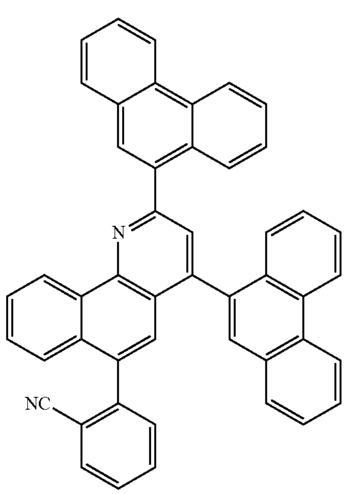
-continued
[Chemical Formula C14]
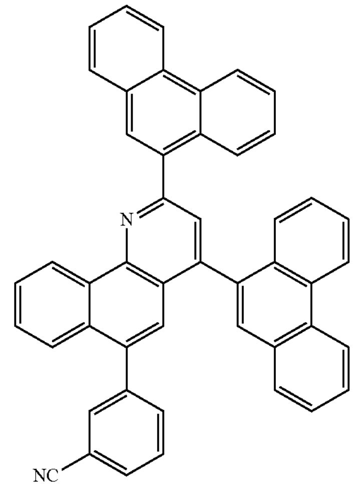
[Chemical Formula C15]
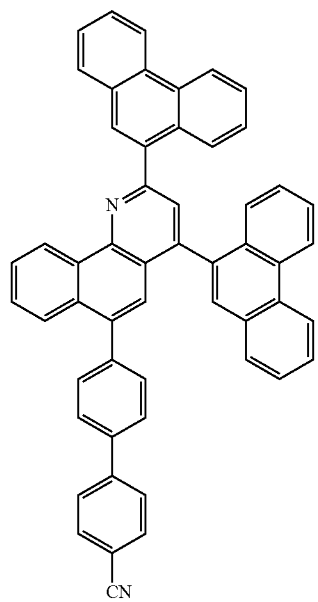
[Chemical Formula C16]
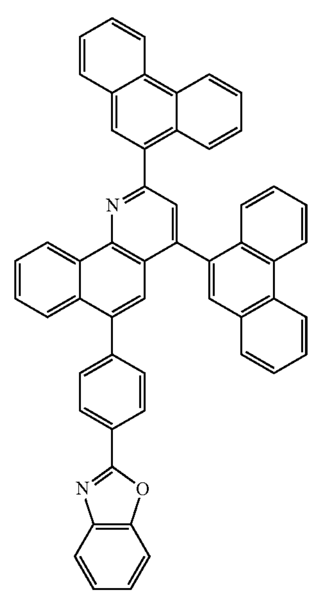

-continued
[Chemical Formula C17]
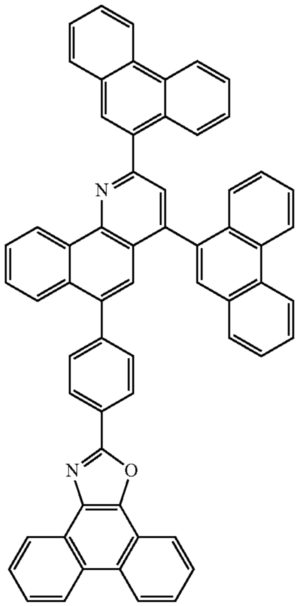
[Chemical Formula C18]
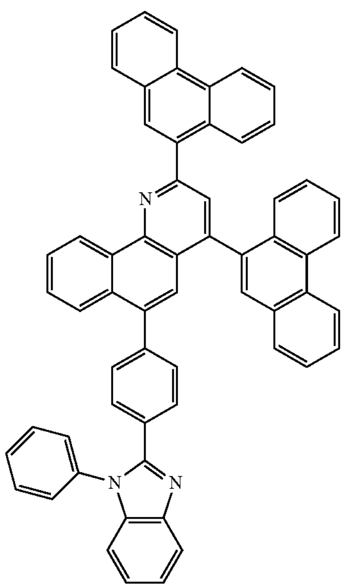
-continued
[Chemical Formula C19]
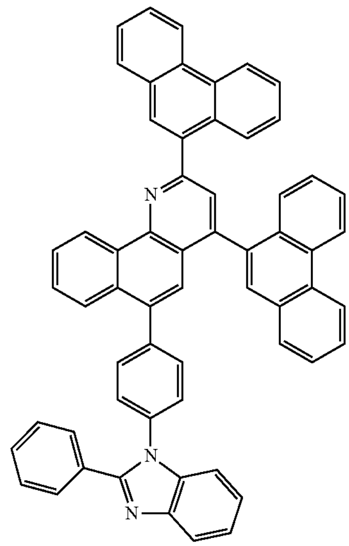
[Chemical Formula C20]
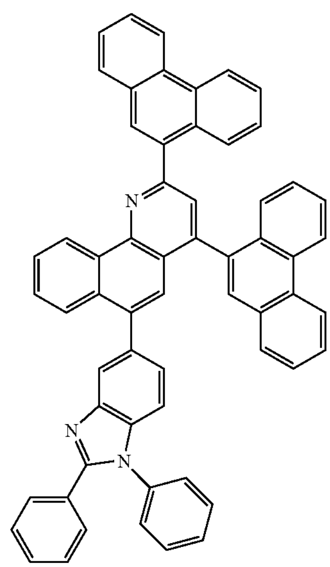

-continued
[Chemical Formula C21]
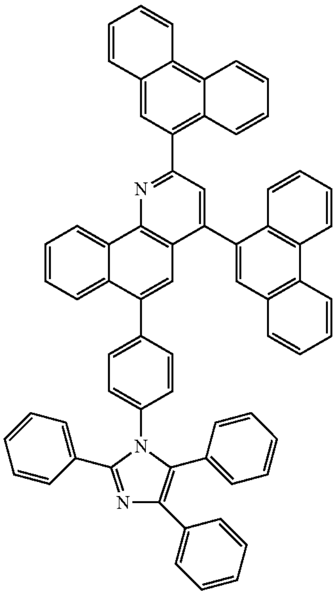
[Chemical Formula C22]
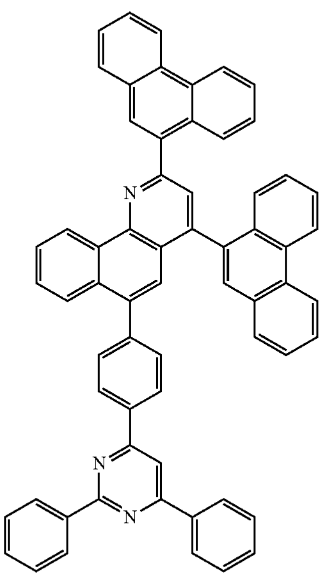
-continued
[Chemical Formula C23]
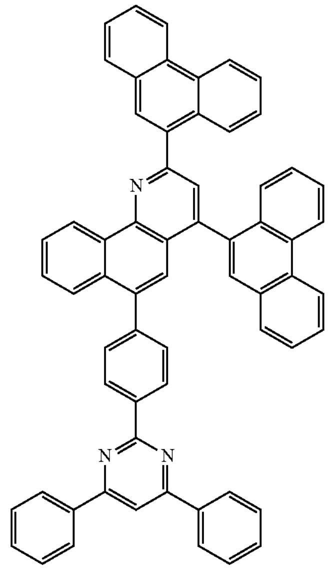
[Chemical Formula C24]
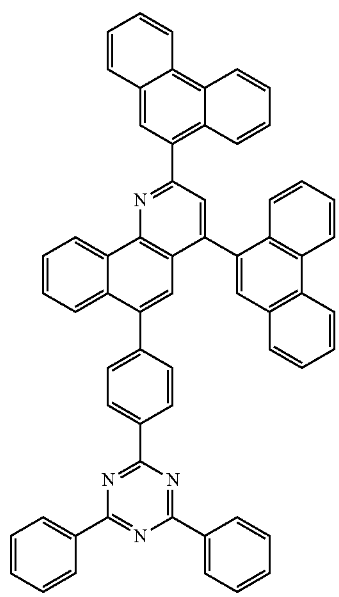

-continued
[Chemical Formula C25]
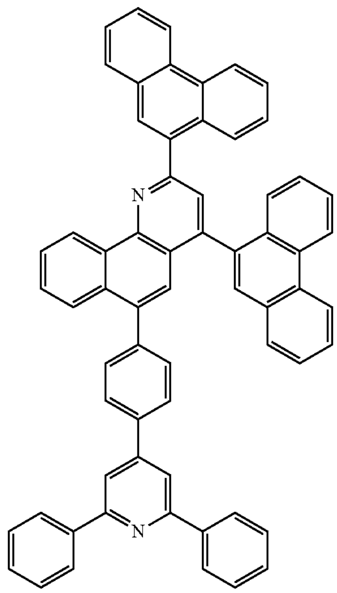
[Chemical Formula C26]
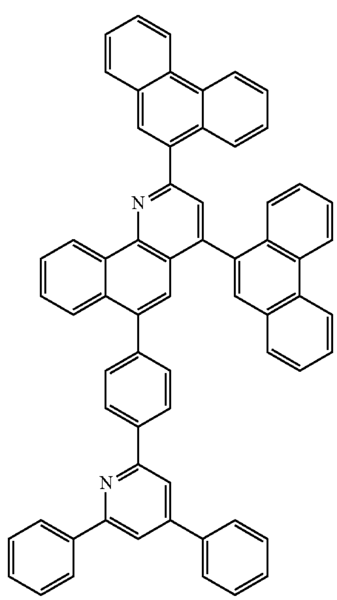
-continued
[Chemical Formula C27]
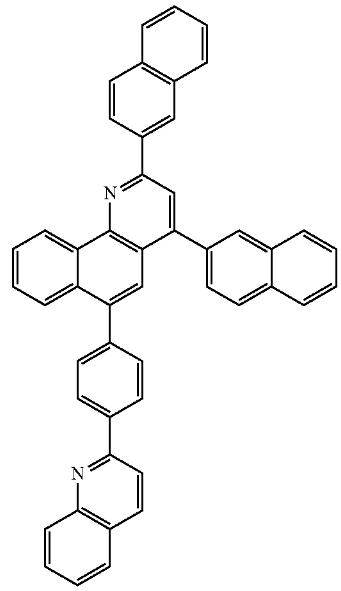
[Chemical Formula C28]
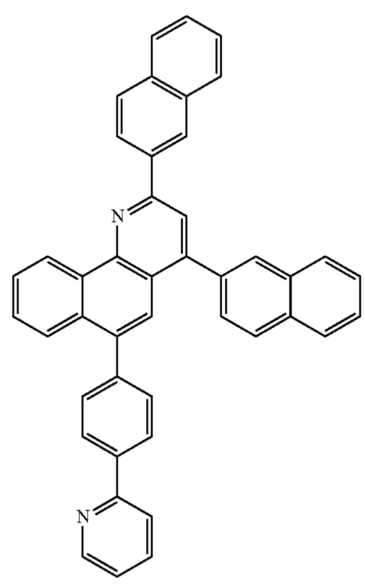

[Chemical Formula C29]
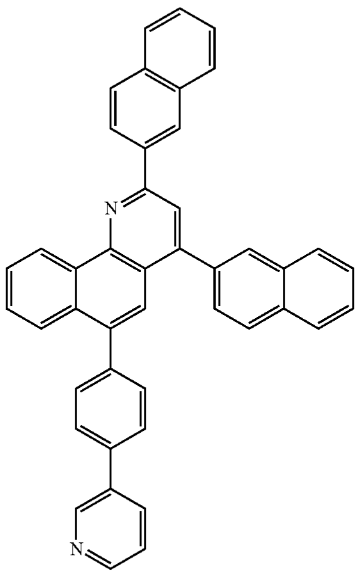
[Chemical Formula C30]
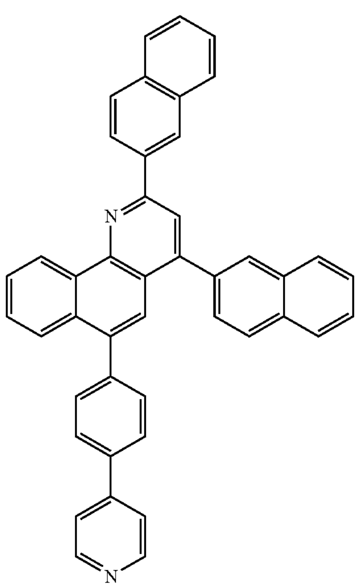
[Chemical Formula C31]
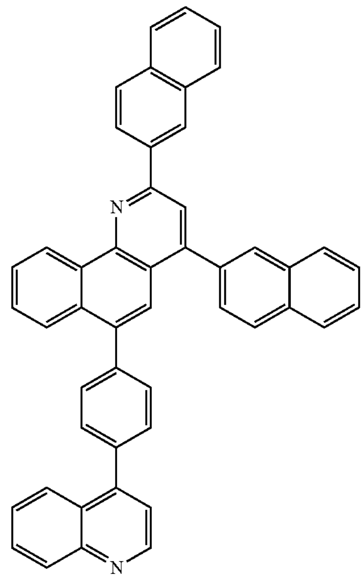
[Chemical Formula C32]
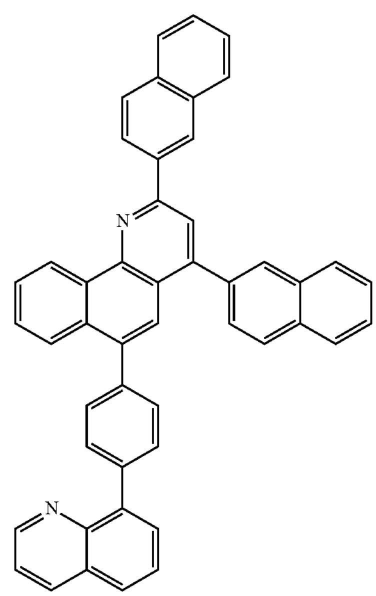

[Chemical Formula C33]
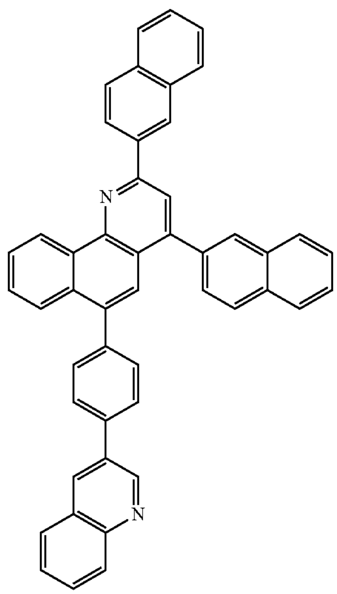
[Chemical Formula C34]
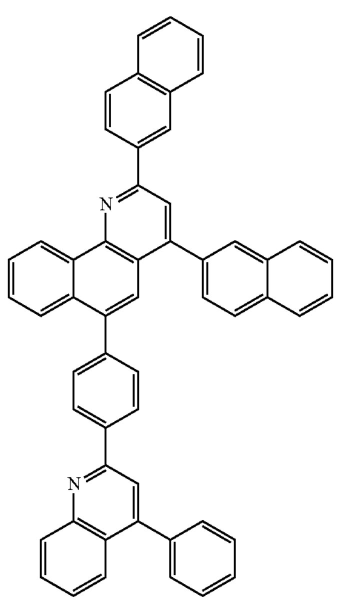
[Chemical Formula C35]
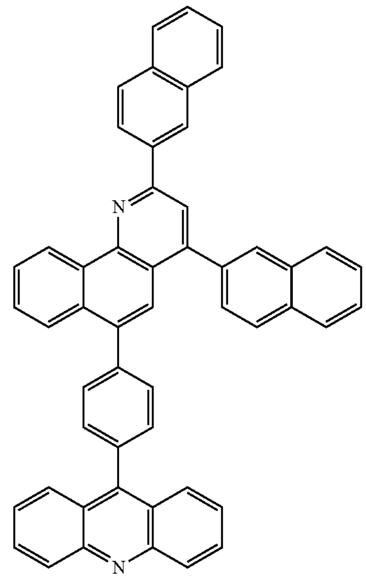
[Chemical Formula C36]
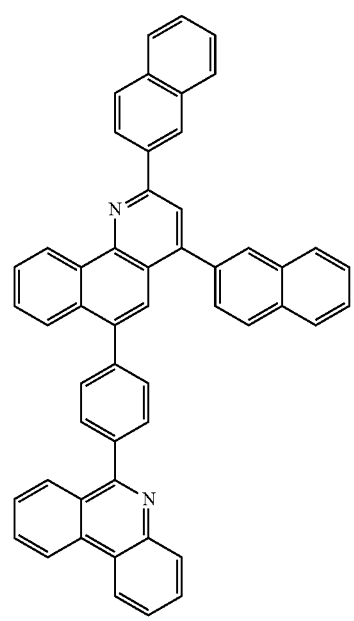

[Chemical Formula C37]
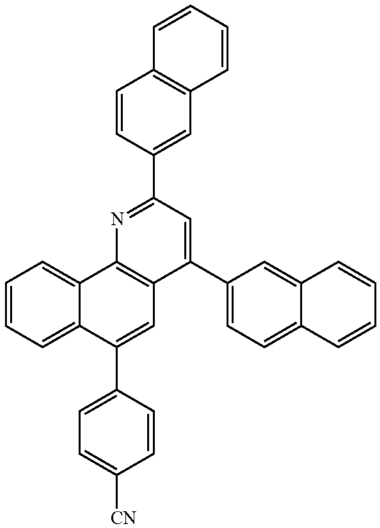
[Chemical Formula C38]
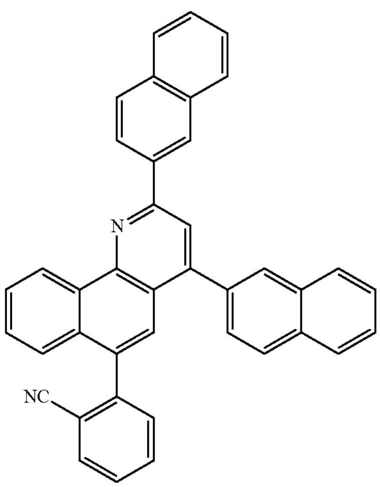
[Chemical Formula C39]
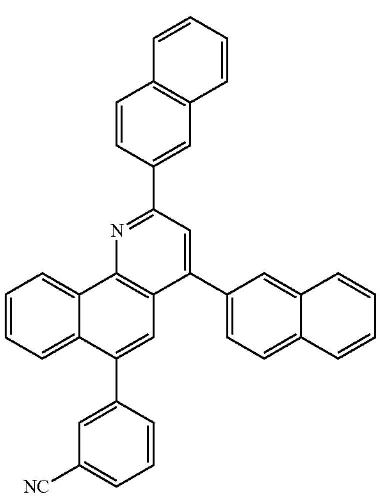
[Chemical Formula C40]
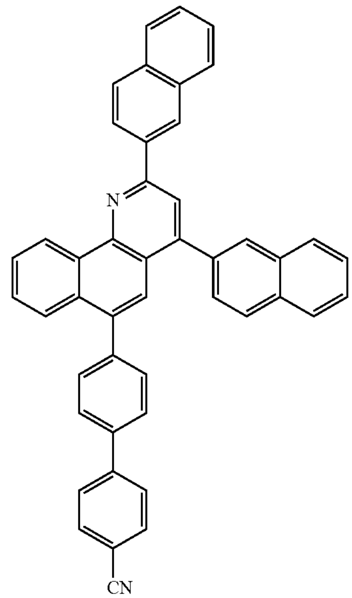
[Chemical Formula C41]
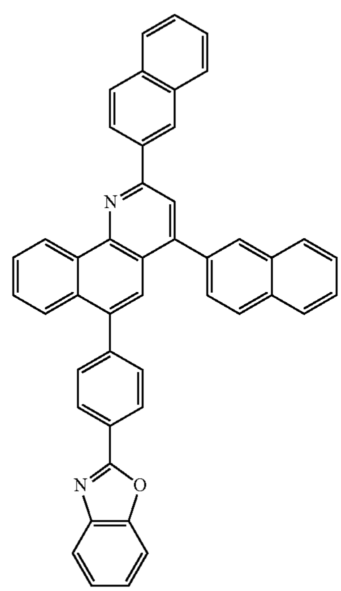

-continued
[Chemical Formula C42]
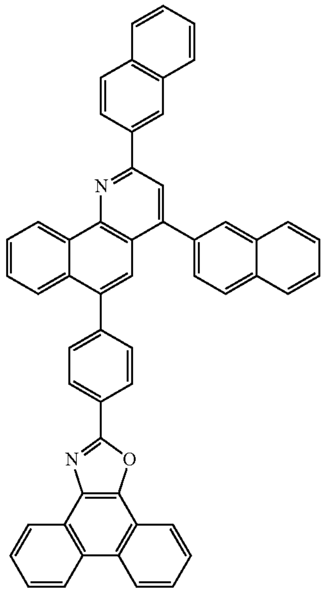
[Chemical Formula C43]
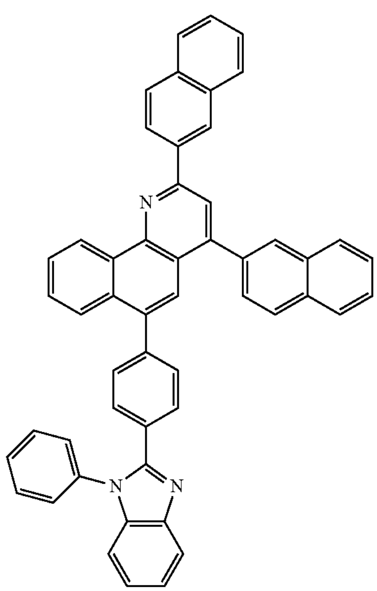
-continued
[Chemical Formula C44]
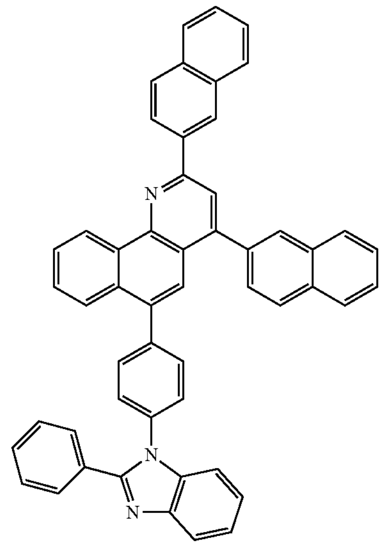
[Chemical Formula C45]
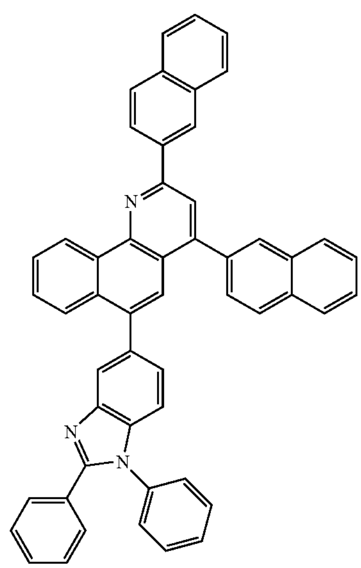

-continued
[Chemical Formula C46]
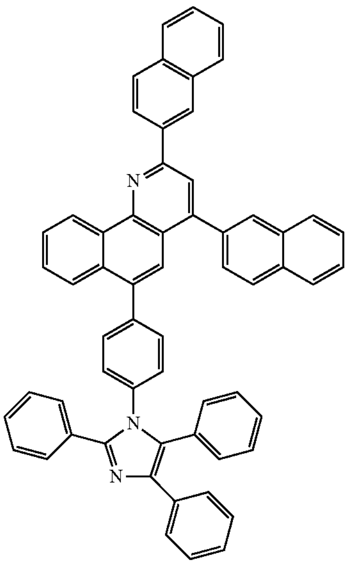
[Chemical Formula C47]
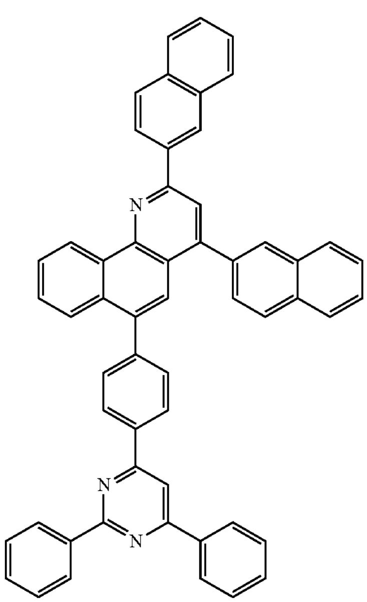
-continued
[Chemical Formula C48]
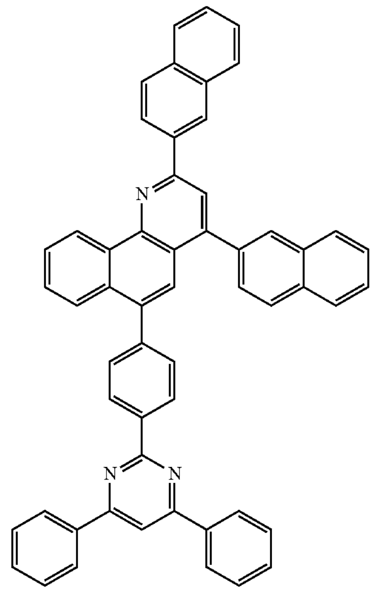
[Chemical Formula C49]
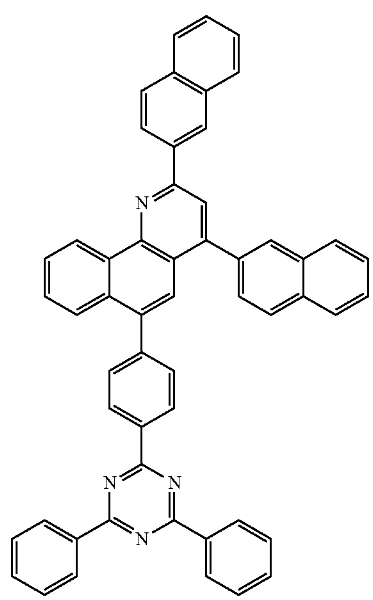

-continued
[Chemical Formula C50]
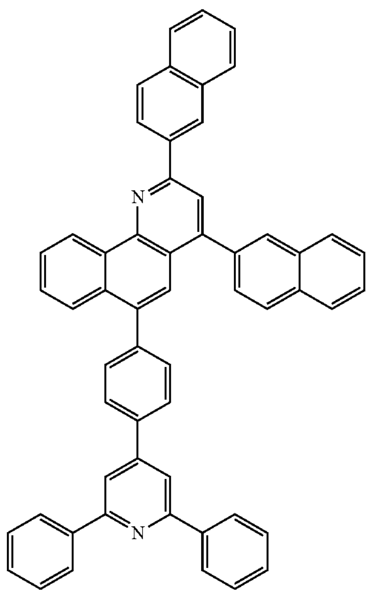
[Chemical Formula C51]
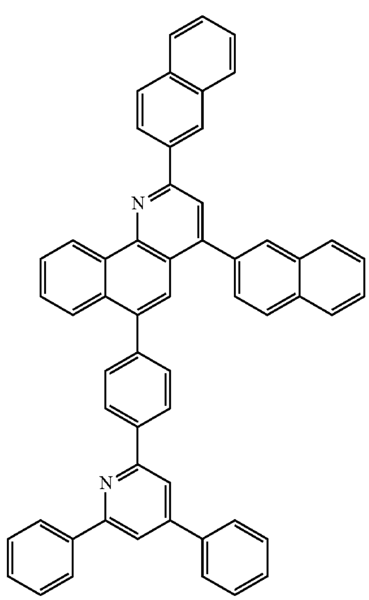
-continued
[Chemical Formula C52]
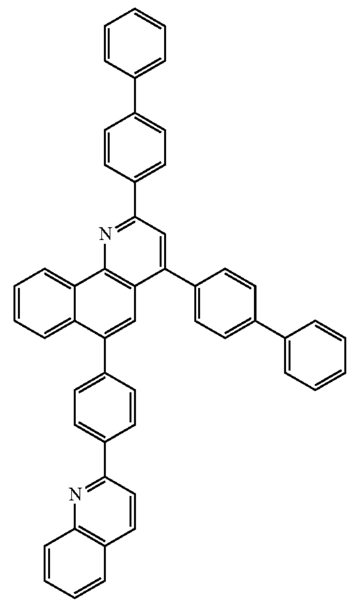
[Chemical Formula C53]
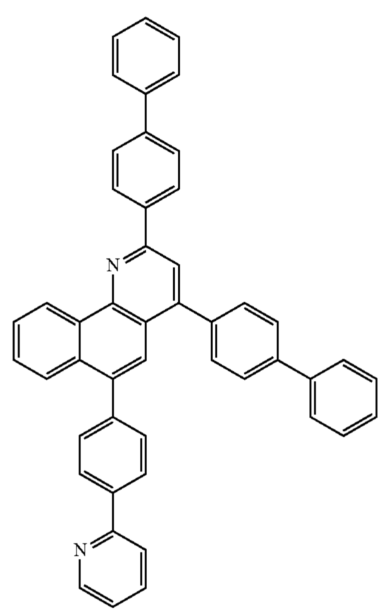

-continued
[Chemical Formula C54]
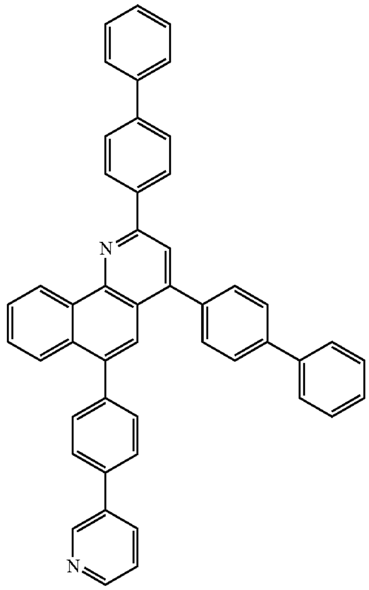
[Chemical Formula C55]
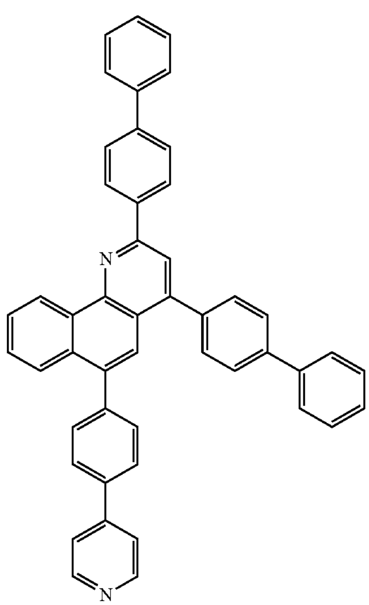
-continued
[Chemical Formula C56]
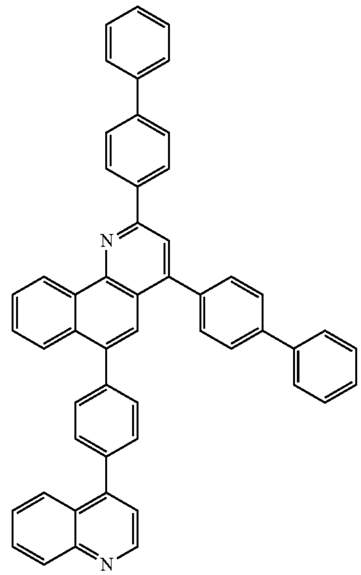
[Chemical Formula C57]
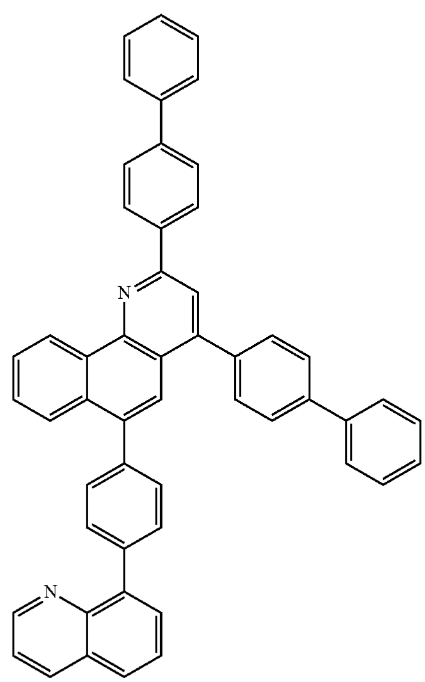

-continued
[Chemical Formula C58]
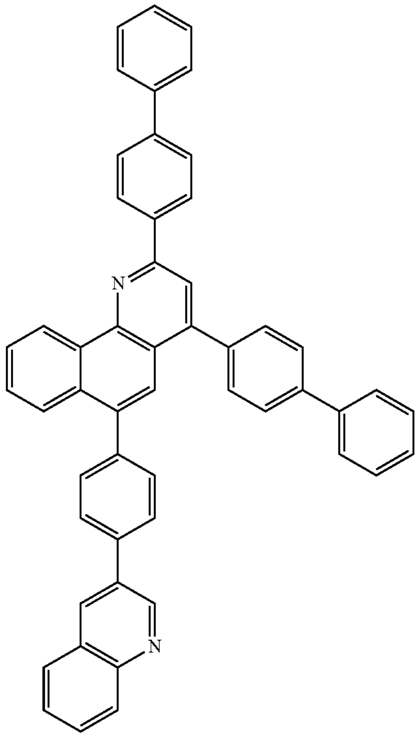
[Chemical Formula C59]
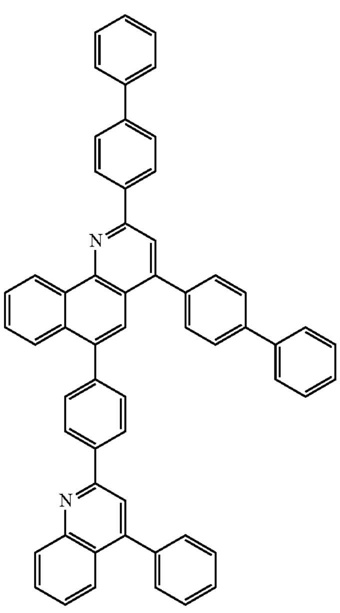
-continued
[Chemical Formula C60]
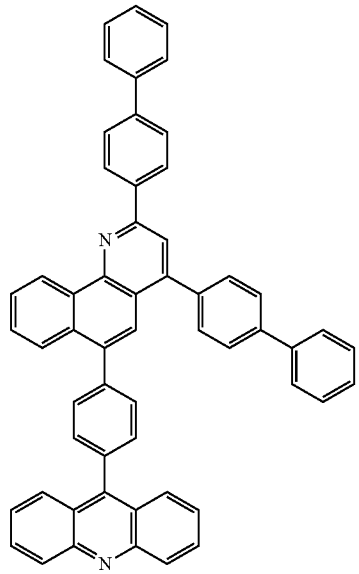
[Chemical Formula C61]
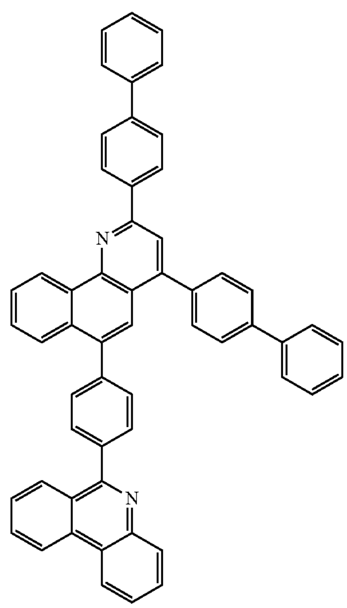

-continued
[Chemical Formula C62]
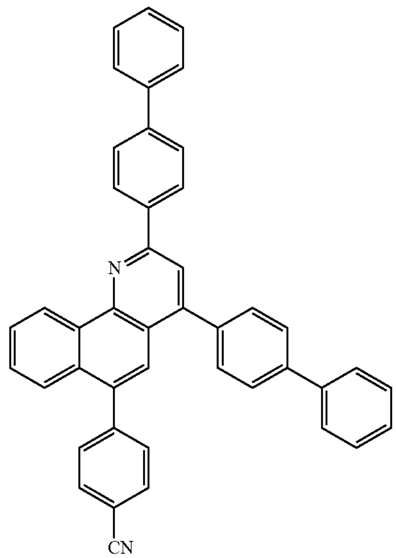
[Chemical Formula C63]
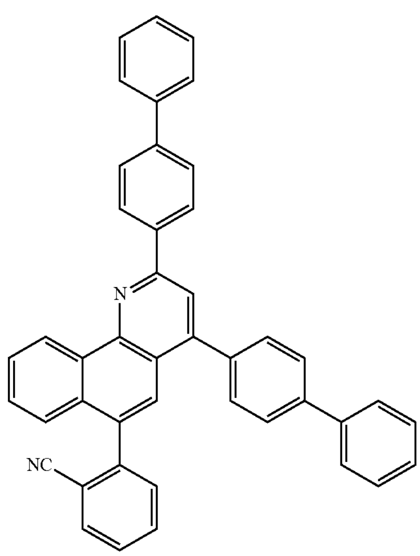
-continued
[Chemical Formula C64]
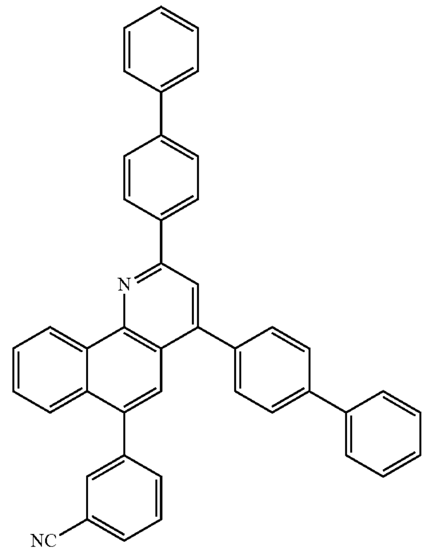
[Chemical Formula C65]
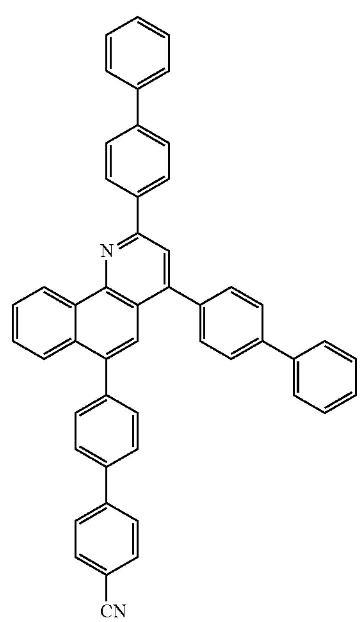

-continued
[Chemical Formula C66]
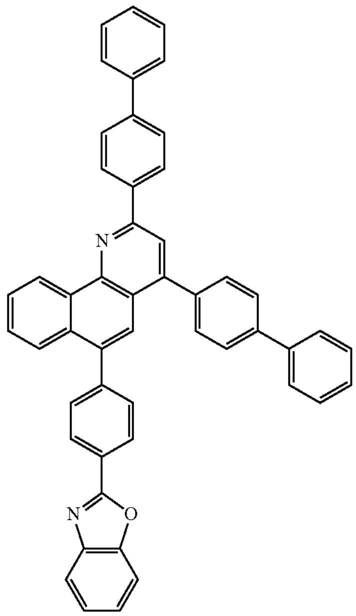
[Chemical Formula C67]
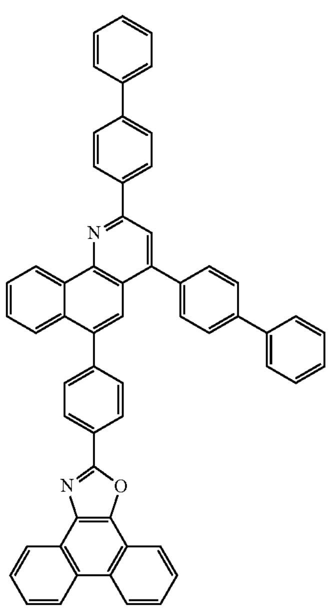
-continued
[Chemical Formula C68]
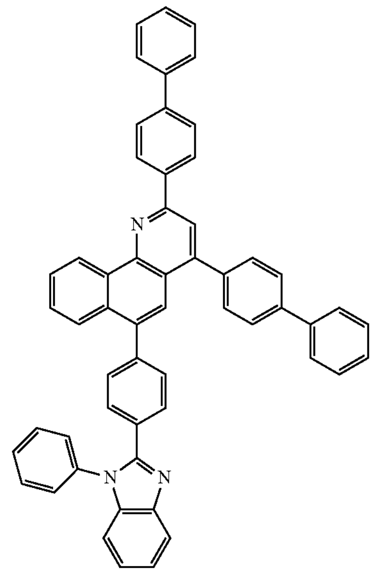
[Chemical Formula C69]
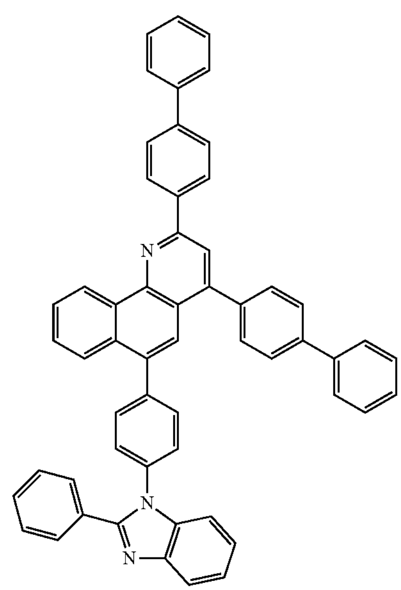

-continued
[Chemical Formula C70]
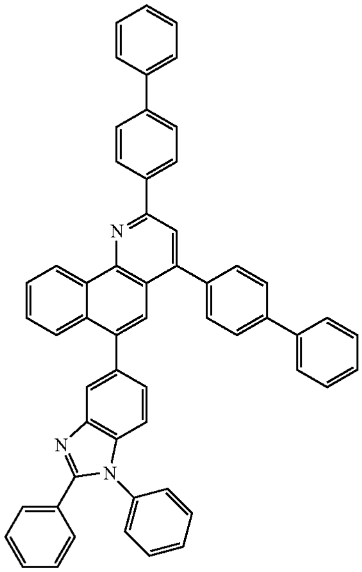
[Chemical Formula C71]
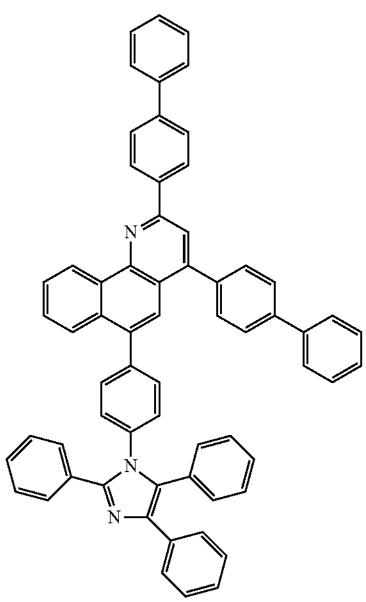
-continued
[Chemical Formula C72]
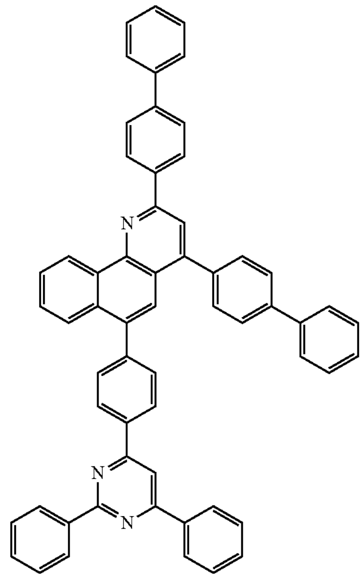
[Chemical Formula C73]
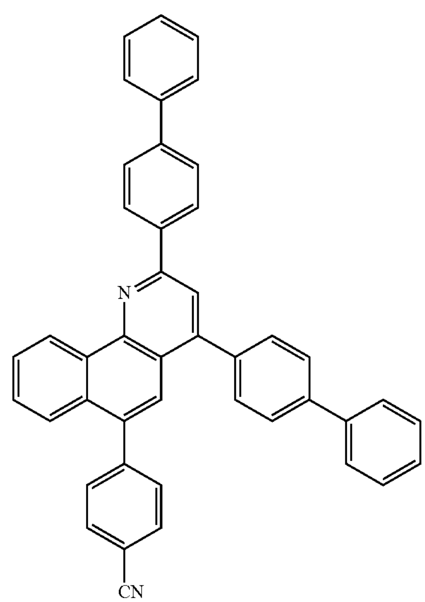

-continued
[Chemical Formula C74]
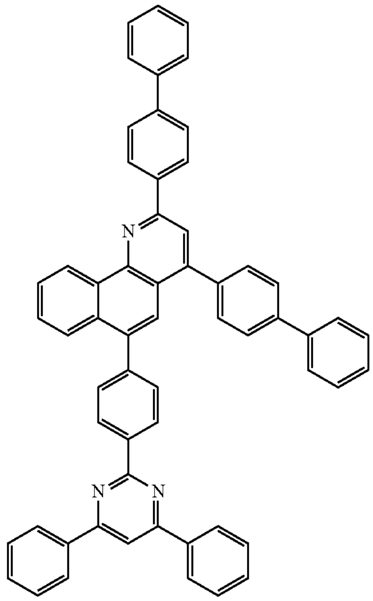
[Chemical Formula C75]
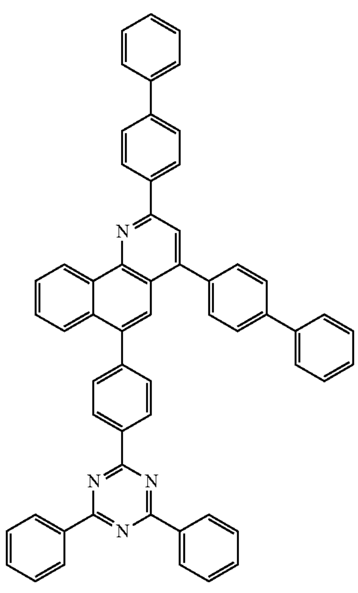
-continued
[Chemical Formula C76]
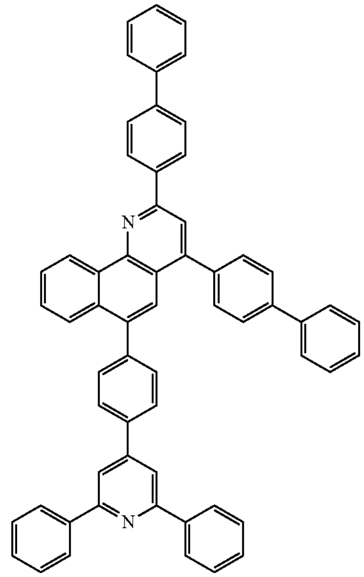
[Chemical Formula C77]
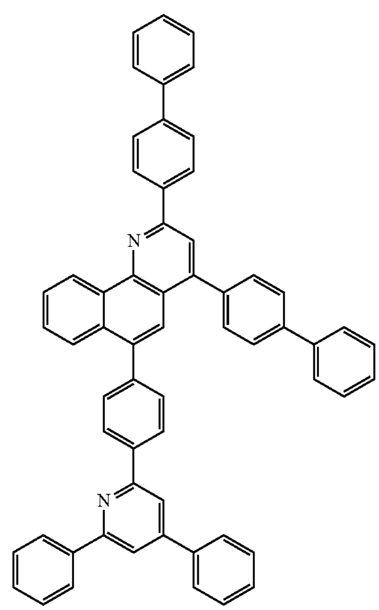

-continued
[Chemical Formula C78]
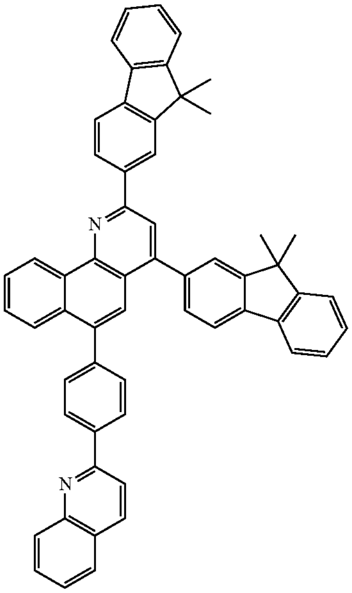
[Chemical Formula C79]
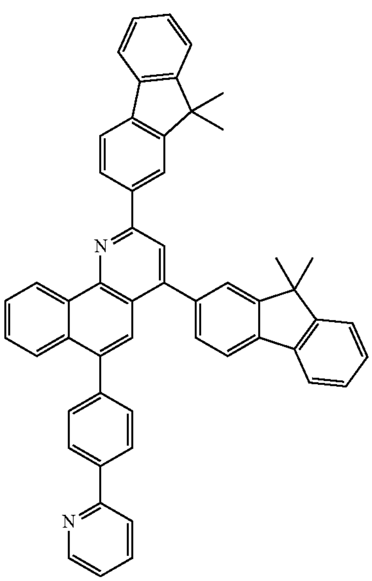
-continued
[Chemical Formula C80]
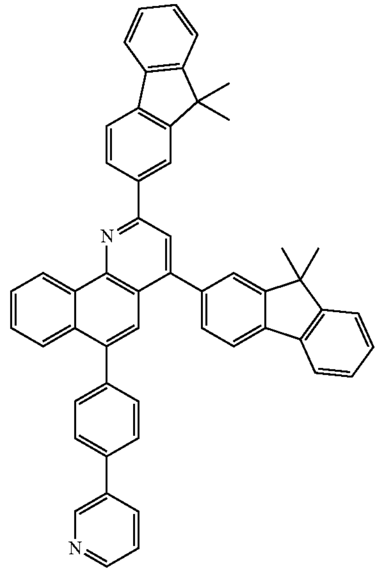
[Chemical Formula C81]
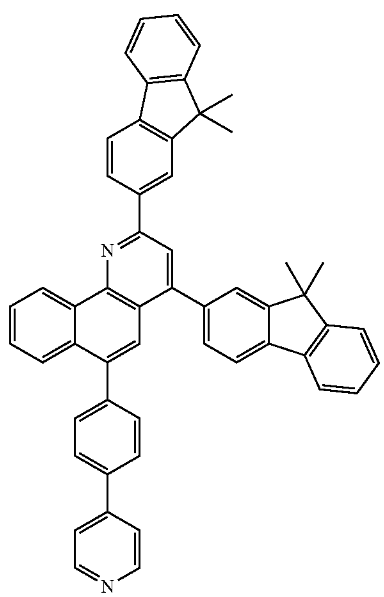

-continued
[Chemical Formula C82]
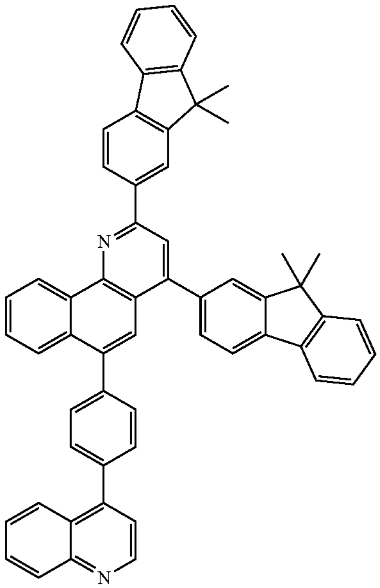
[Chemical Formula C83]
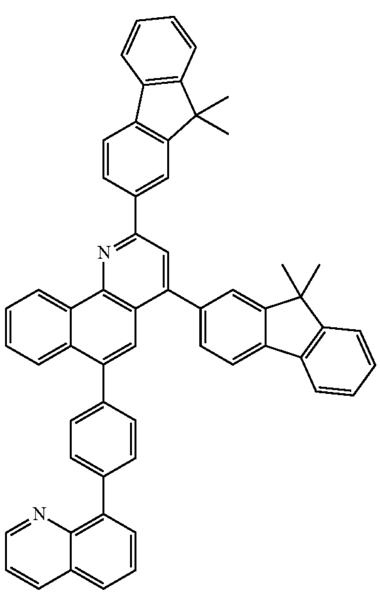
-continued
[Chemical Formula C84]
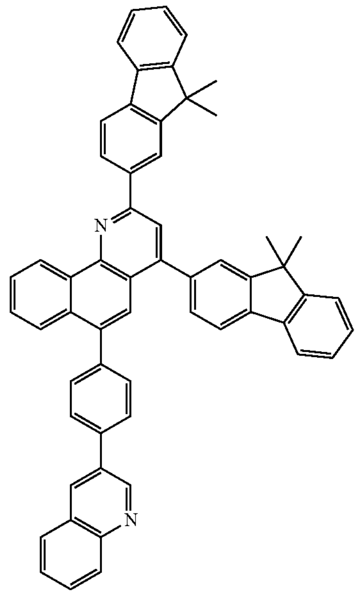
[Chemical Formula C85]
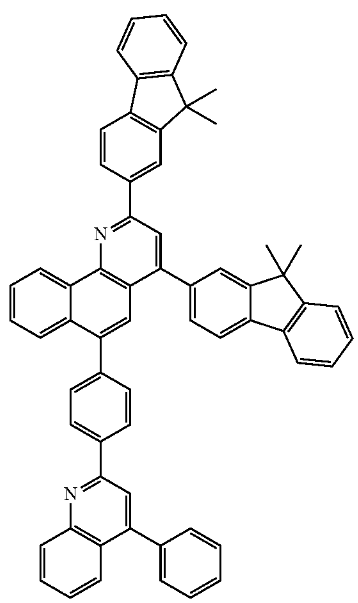

-continued
[Chemical Formula C86]
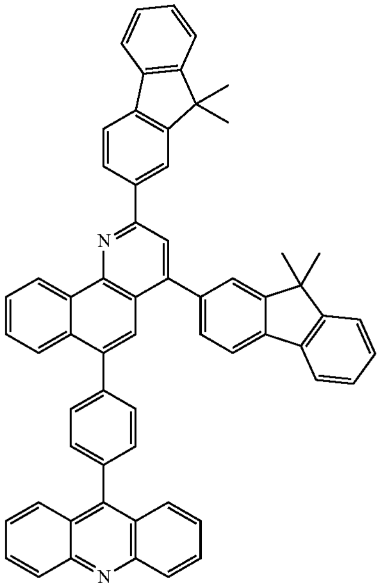
[Chemical Formula C87]
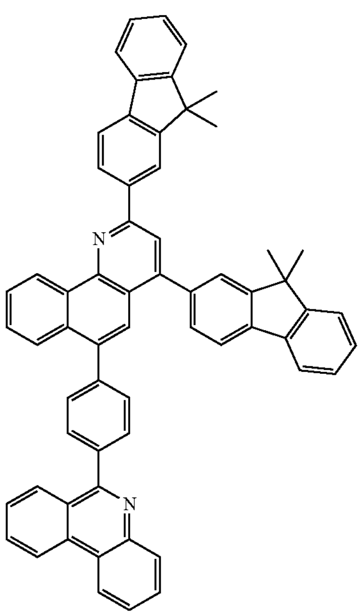
-continued
[Chemical Formula C88]
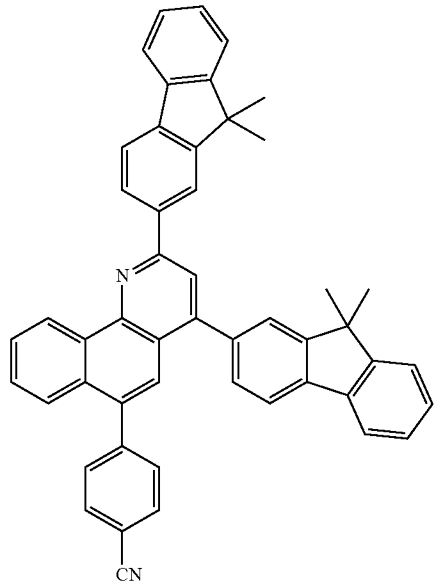
[Chemical Formula C89]
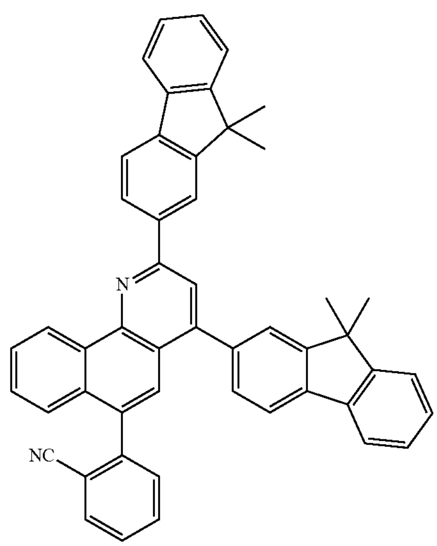

-continued
[Chemical Formula C90]
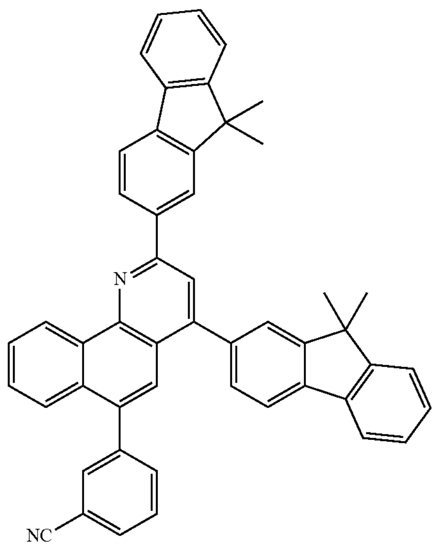
[Chemical Formula C91]
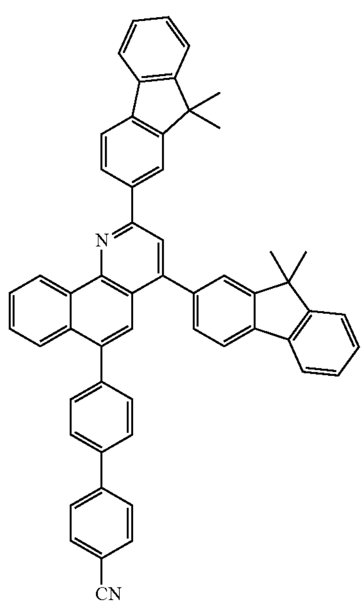
-continued
[Chemical Formula C92]
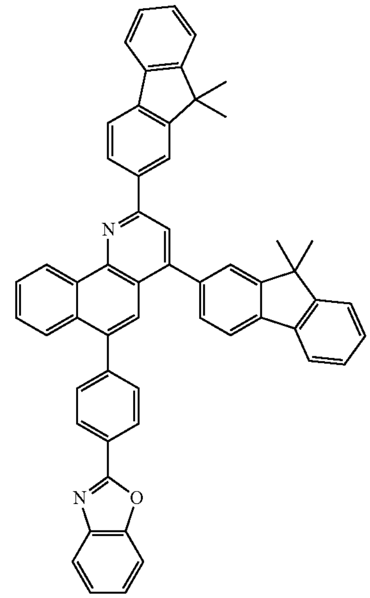
[Chemical Formula C93]
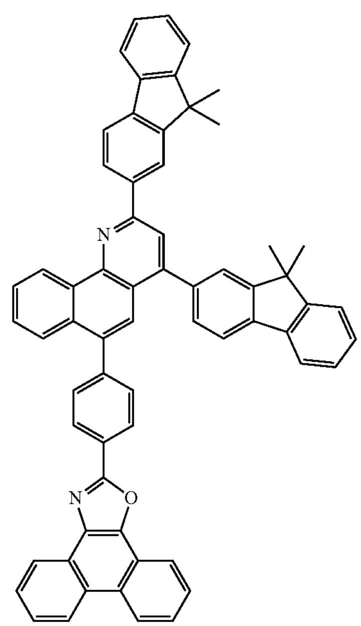

[Chemical Formula C94]
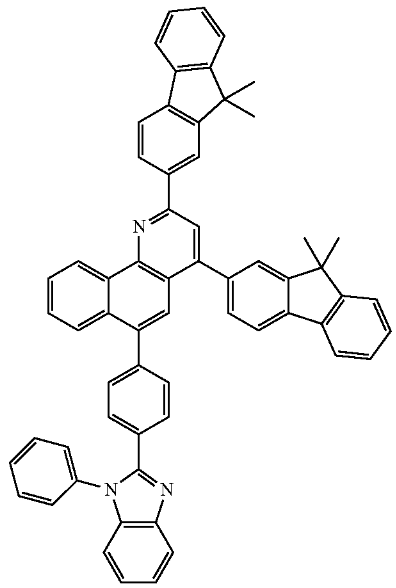
[Chemical Formula C95]
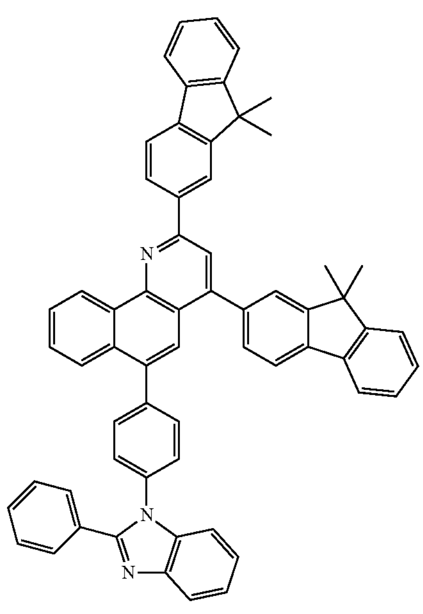
[Chemical Formula C96]
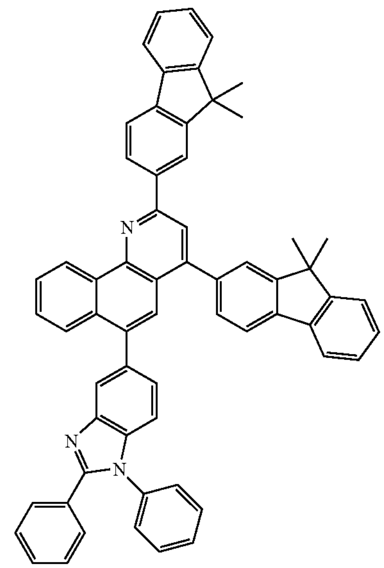
[Chemical Formula C97]
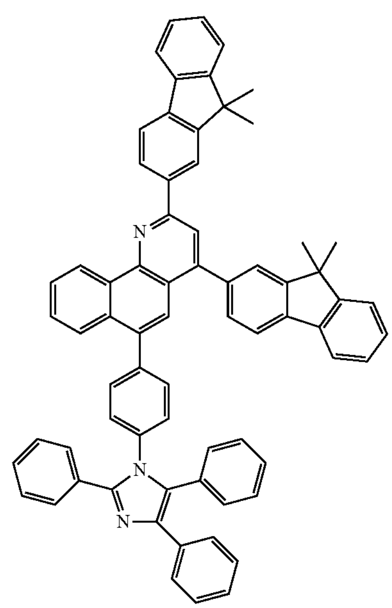

-continued
[Chemical Formula C98]
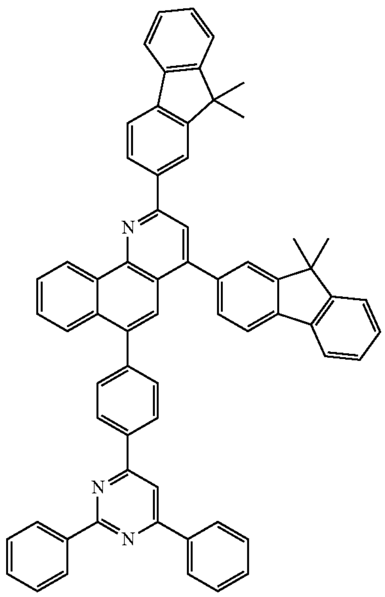
[Chemical Formula C99]
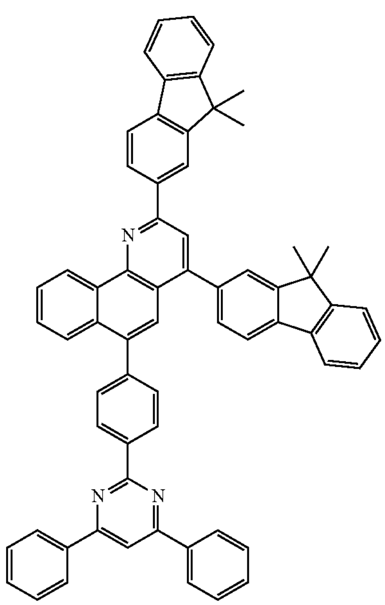
-continued
[Chemical Formula C100]
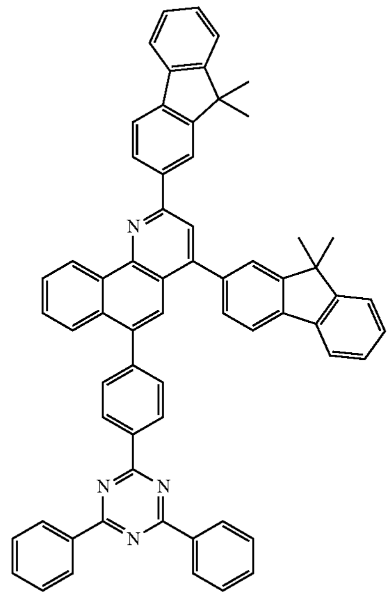
[Chemical Formula C101]
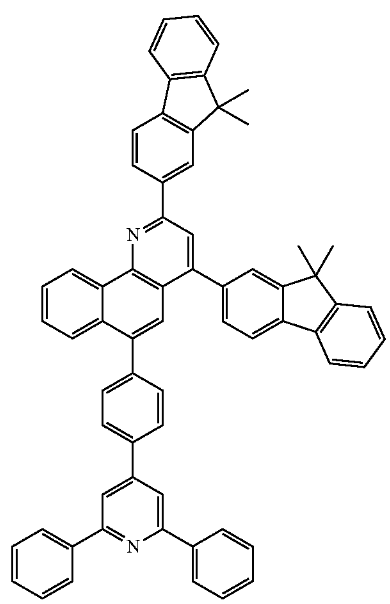

[Chemical Formula C102]
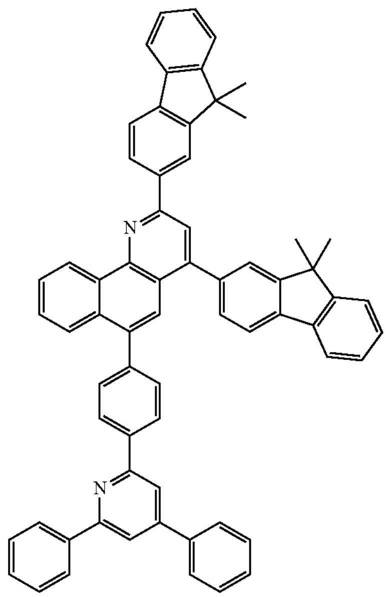
[Chemical Formula C103]
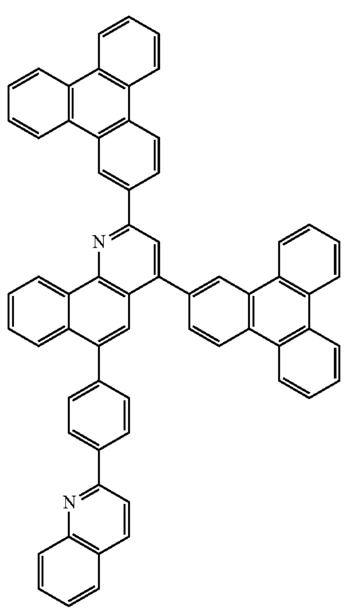
[Chemical Formula C104]
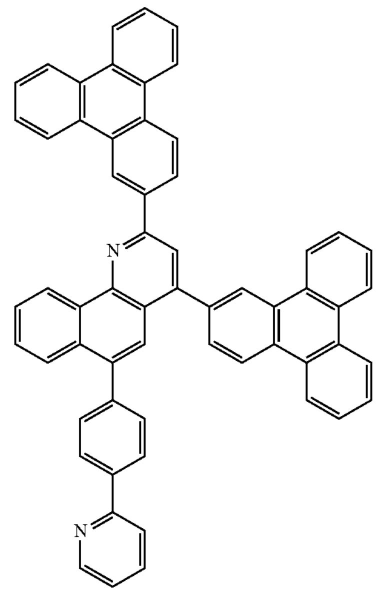
[Chemical Formula C105]
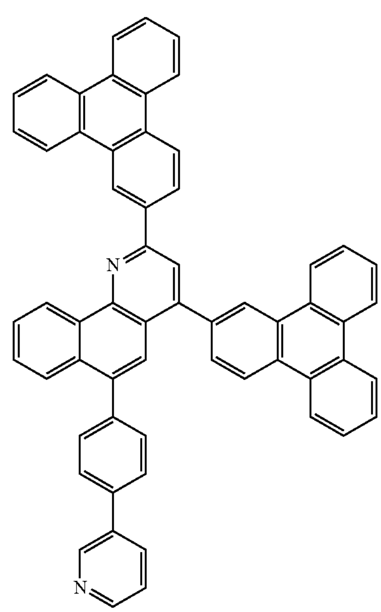

[Chemical Formula C106]
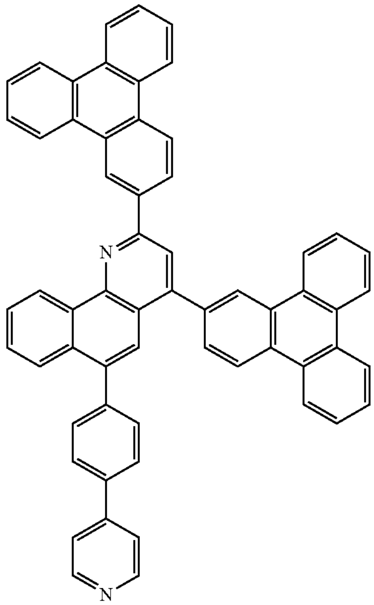
[Chemical Formula C107]
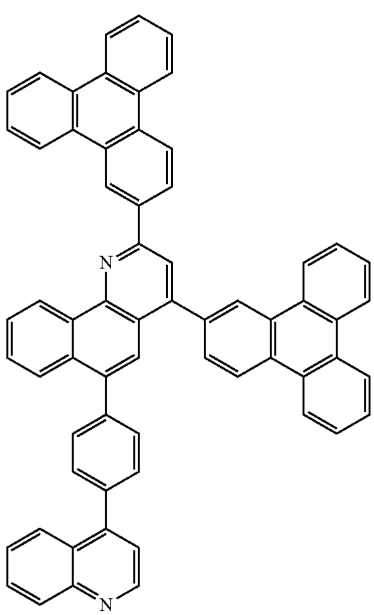
[Chemical Formula C108]
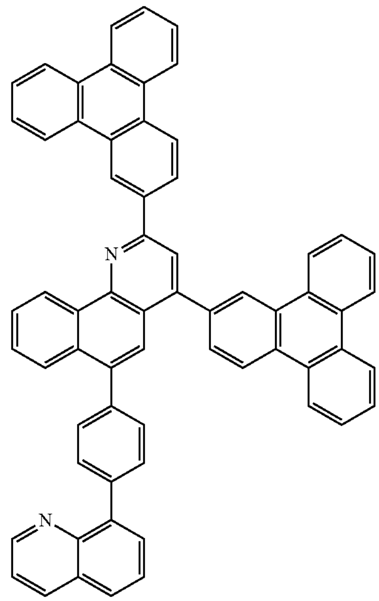
[Chemical Formula C109]
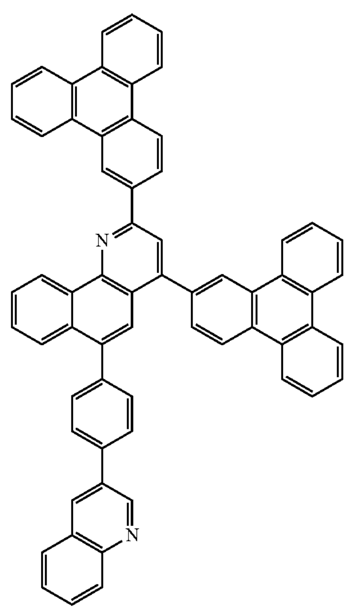

-continued
[Chemical Formula C110]
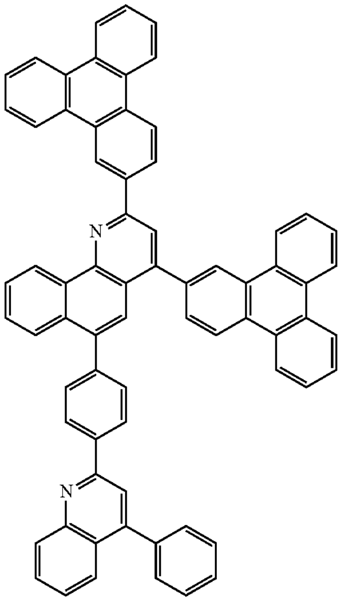
[Chemical Formula C111]
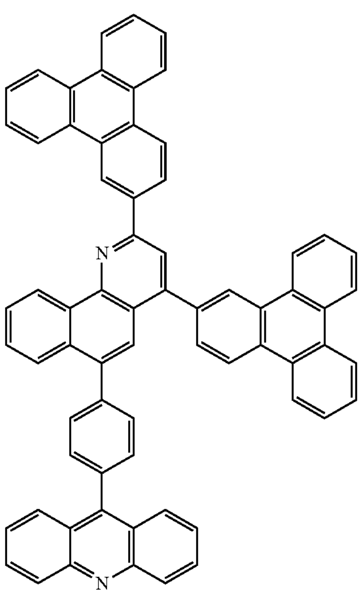
-continued
[Chemical Formula C112]
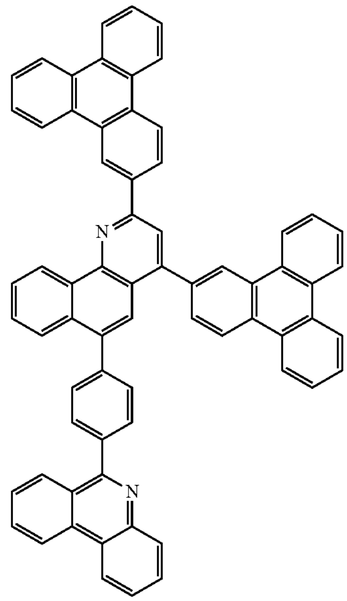
[Chemical Formula C113]
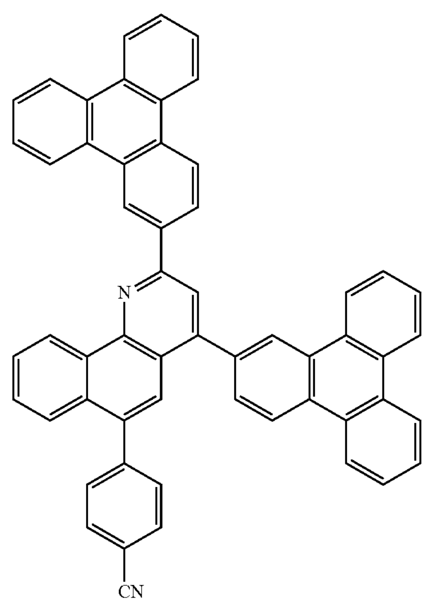

-continued
[Chemical Formula C114]
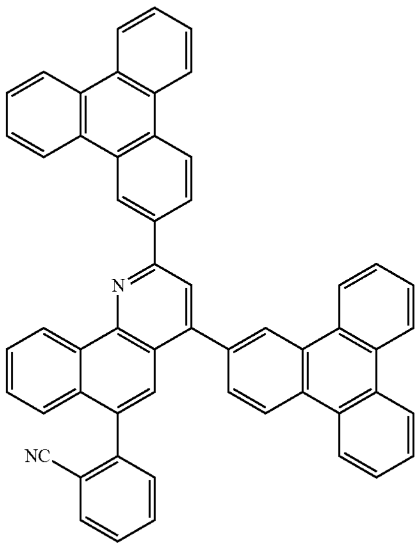
[Chemical Formual C115]
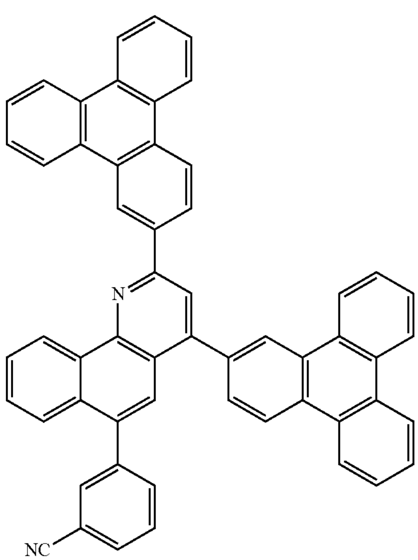
-continued
[Chemical Formula C116]
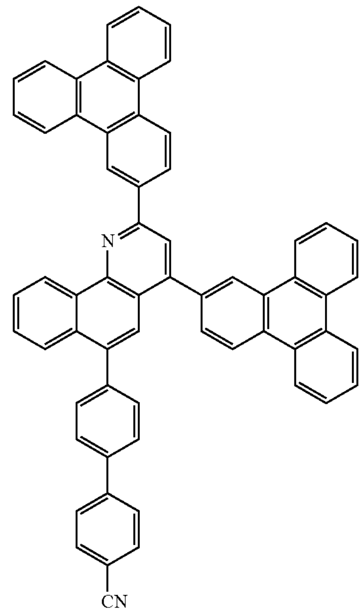
[Chemical Formula C117]
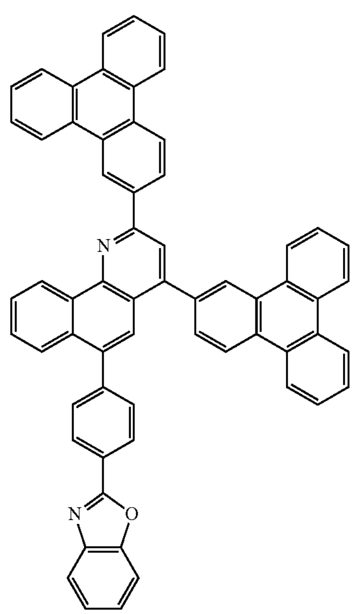

[Chemical Formula C118]
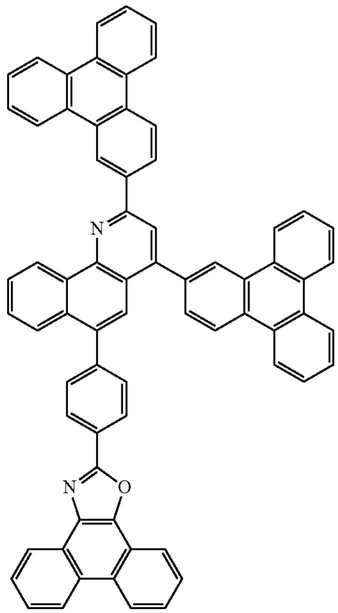
[Chemical Formula C119]
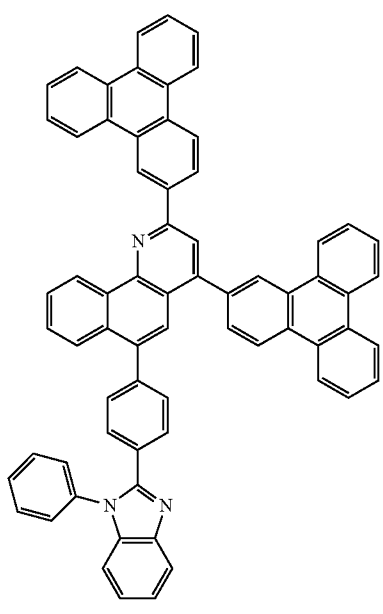
[Chemical Formula C120]
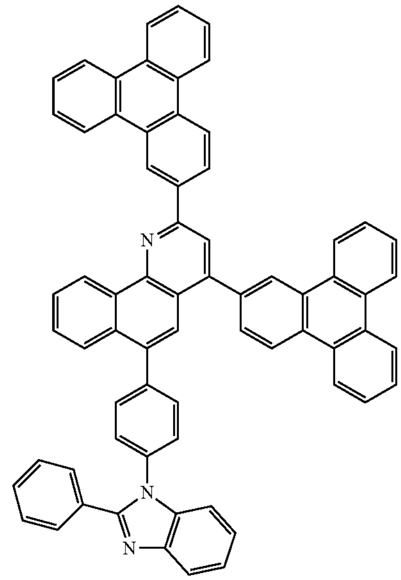
[Chemical Formula C121]
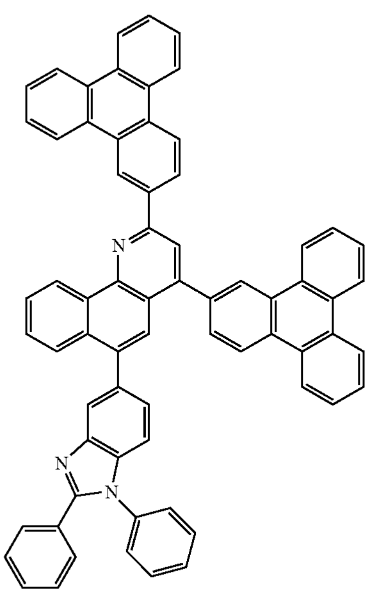

[Chemical Formula C122]
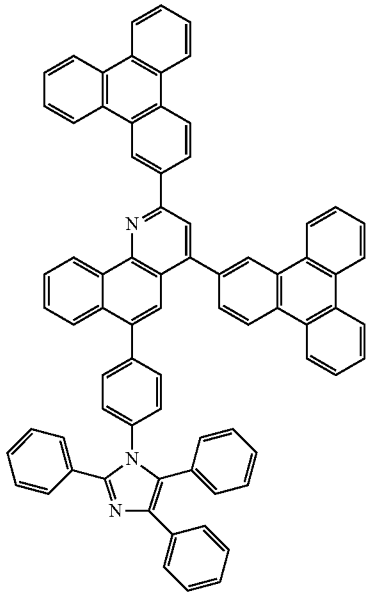
[Chemical Formula C123]
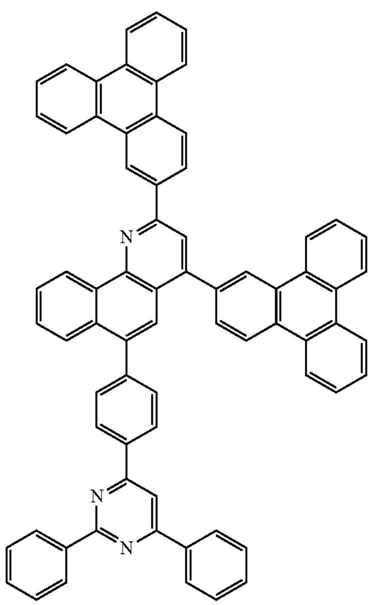
[Chemical Formula C124]
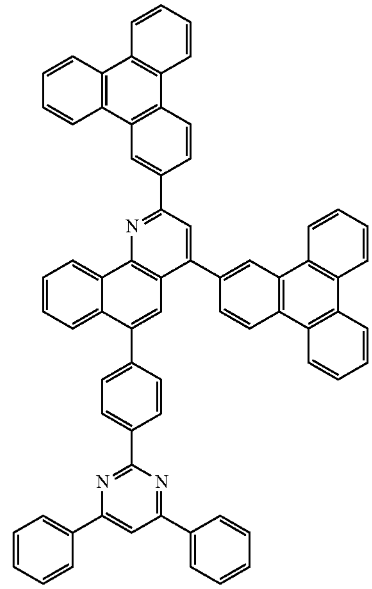
[Chemical Formula C125]
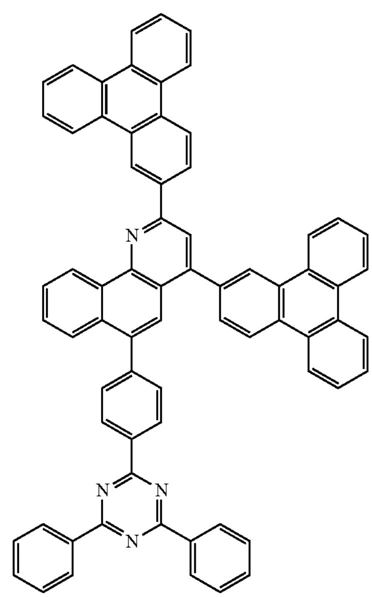

[Chemical Formula C126]
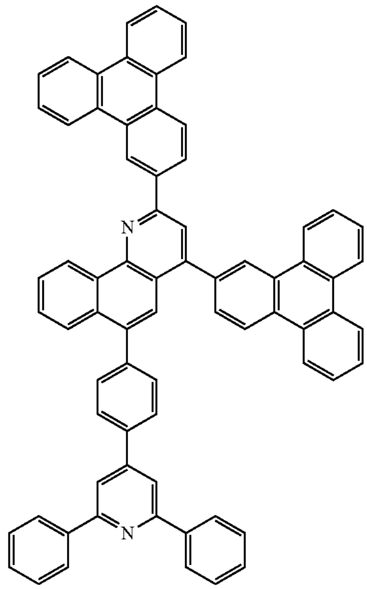
[Chemical formula C127]
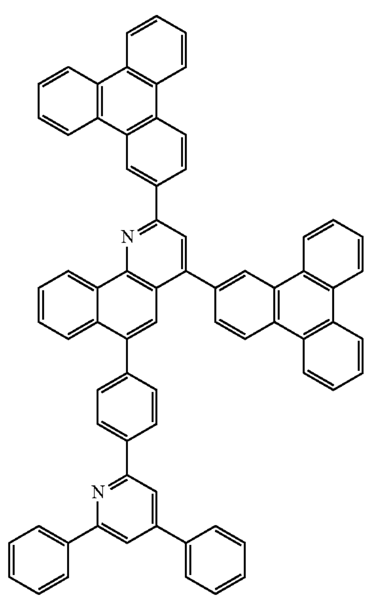
[Chemical Formula C128]
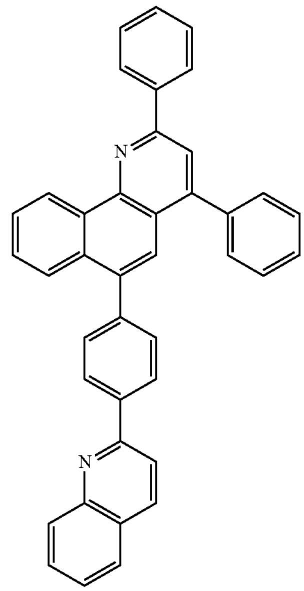
[Chemical Formula C129]
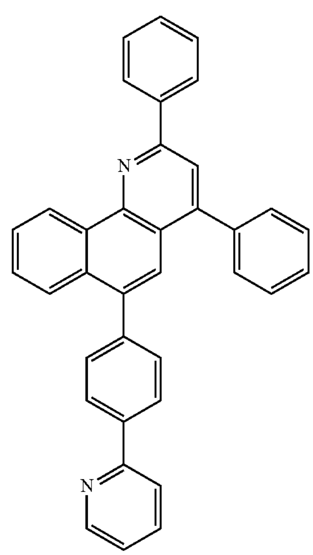

[Chemical Formula C130]
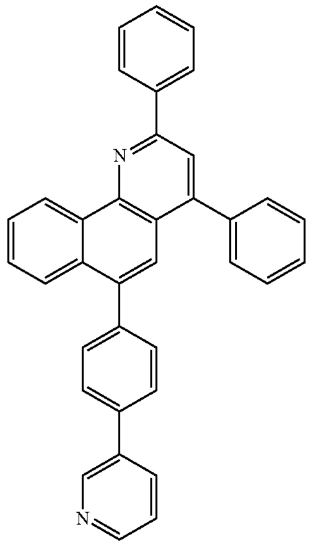
[Chemical Formula C131]
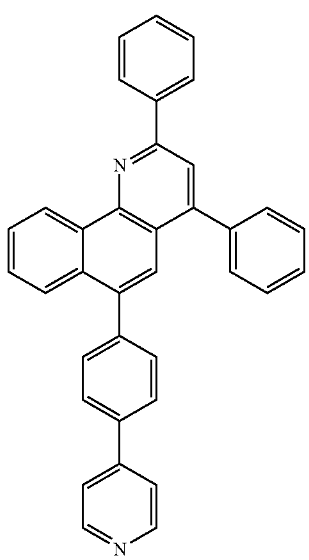
[Chemical Formula C132]
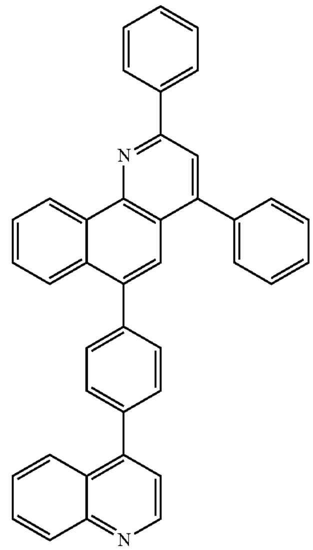
[Chemical Formula C133]
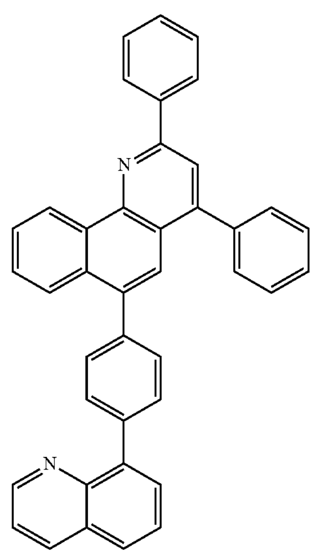

-continued
[Chemical Formula C134]
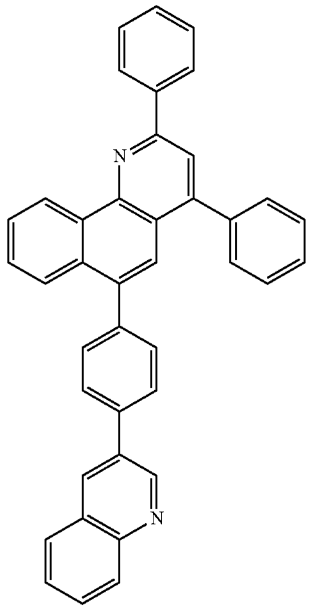
[Chemical Formula C135]
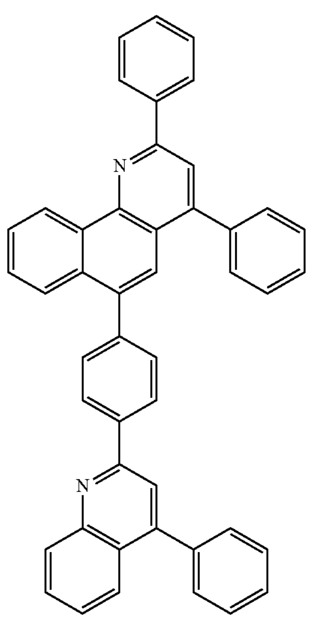
-continued
[Chemical Formula C136]
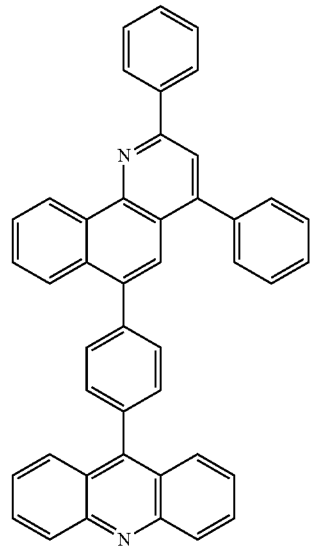
[Chemical Formula C137]
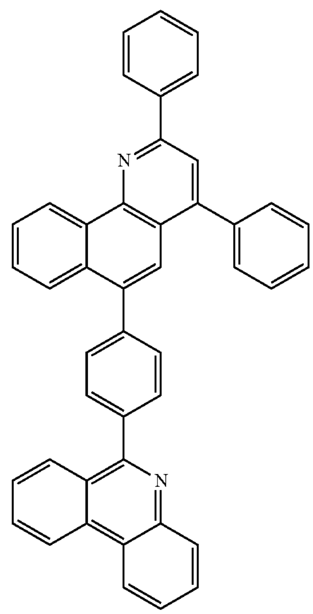
[Chemical Formula C138]
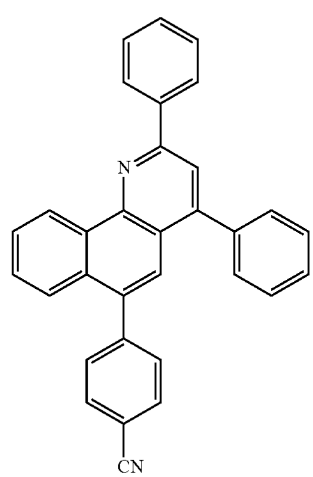

[Chemical Formula C139]
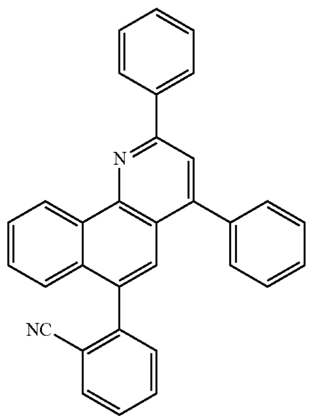
[Chemical Formula C140]
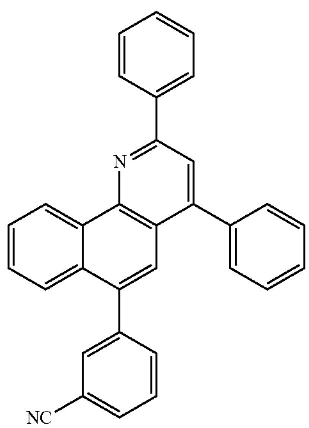
[Chemical Formula C141]
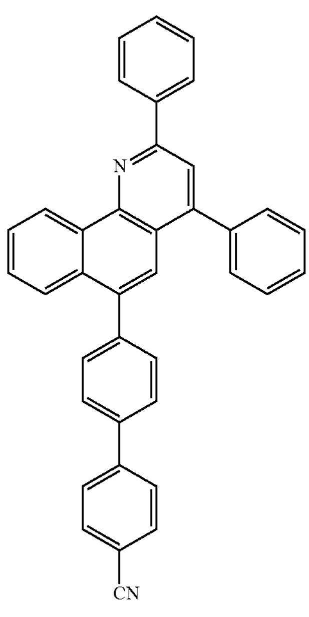
[Chemical Formula C142]
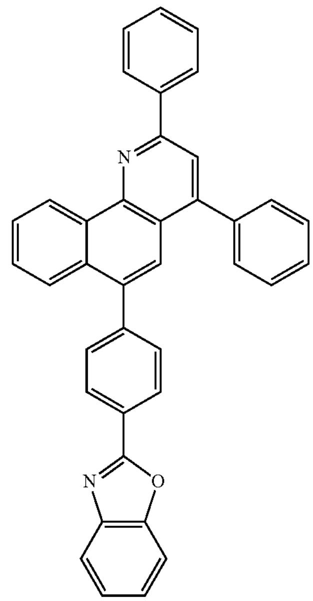
[Chemical Formula C143]
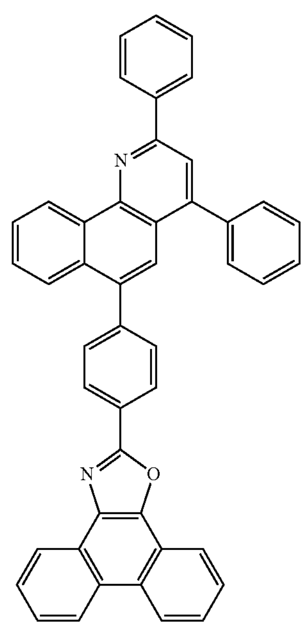

-continued
[Chemical Formula C144]
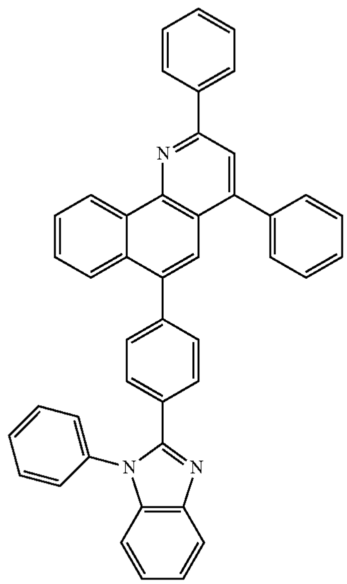
[Chemical Formula C145]
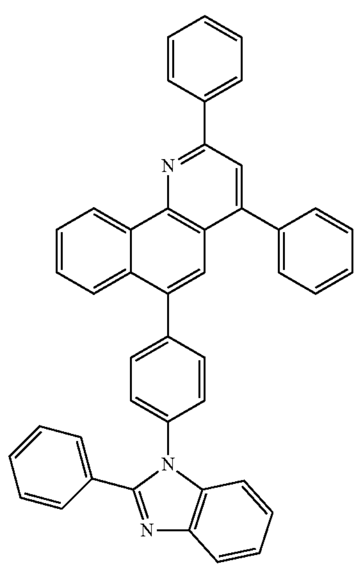
-continued
[Chemical Formula C146]
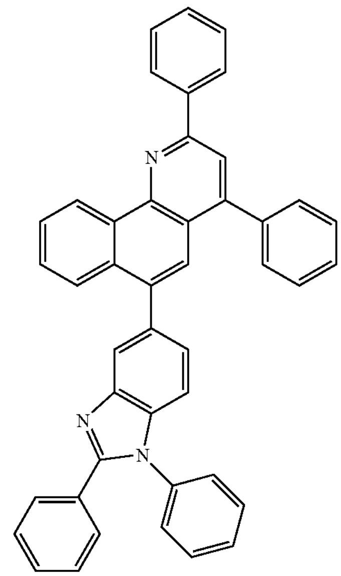
[Chemical Formula C147]
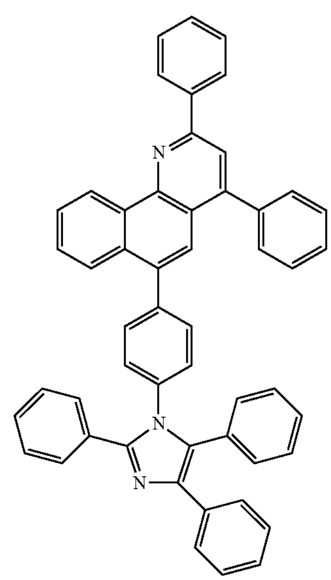

[Chemical Formula C148]
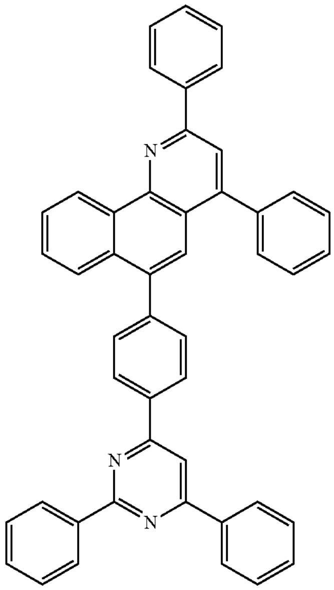
[Chemical Formula C149]
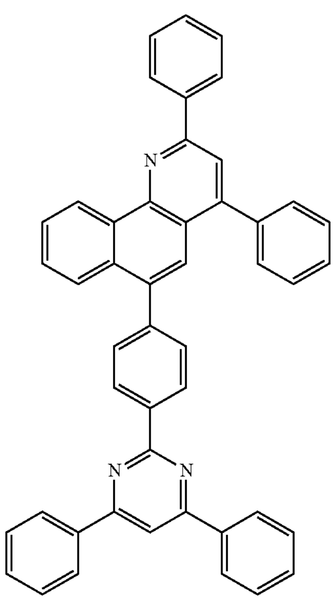
[Chemical Formula C150]
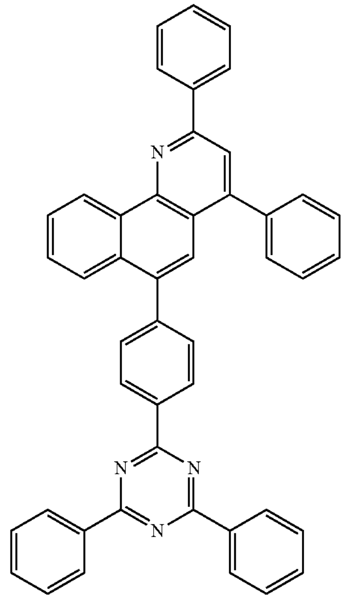
[Chemical Formula C151]
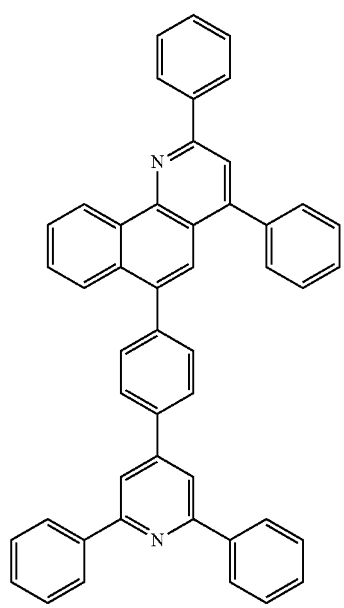

-continued
[Chemical Formula C152]
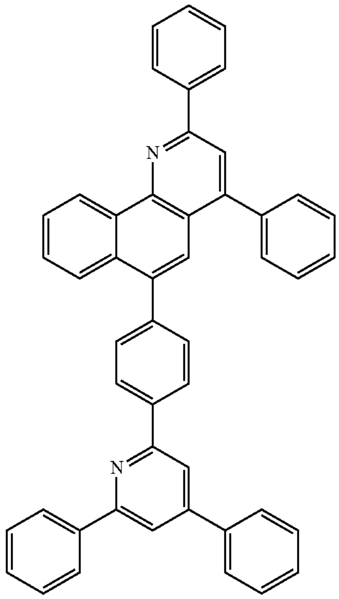
[Chemical Formula C149]
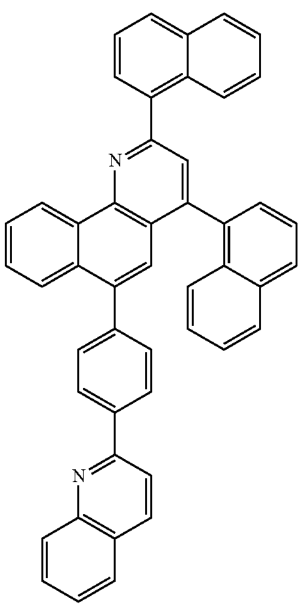
-continued
[Chemical Formula C150]
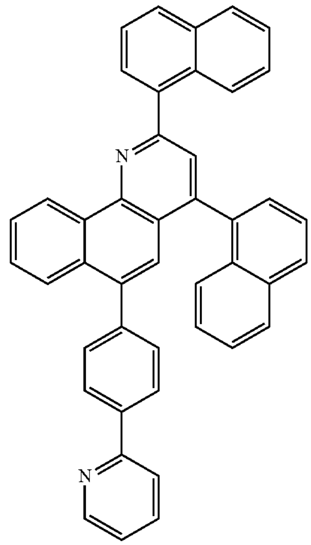
[Chemical Formula C151]
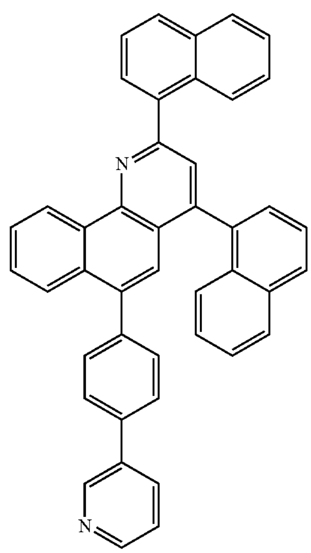

-continued
[Chemical Formula C152]
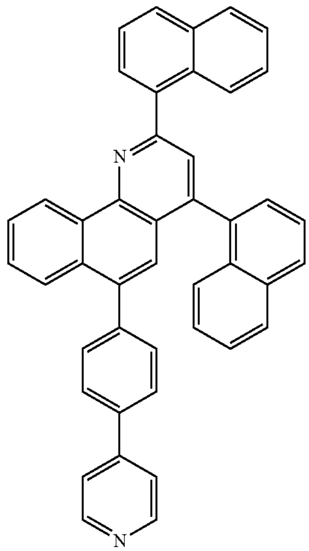
[Chemical Formula C153]
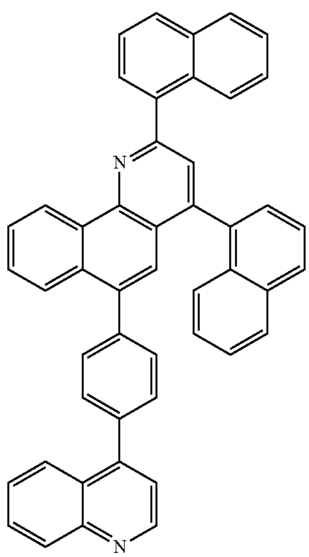
[Chemical Formula C154]
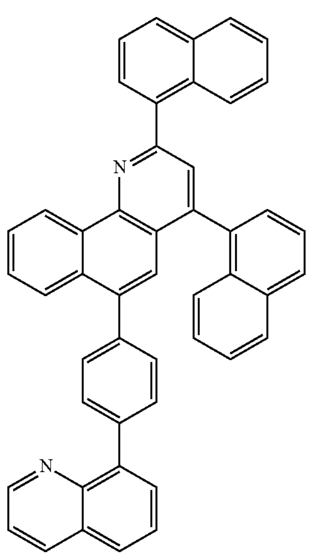
-continued
[Chemical Formula C155]
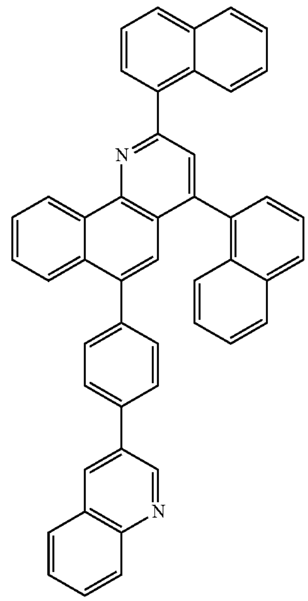
[Chemical Formula C156]
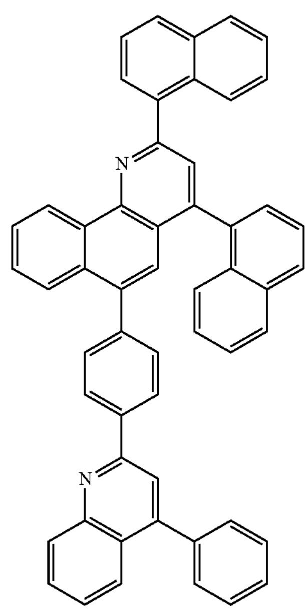

-continued
[Chemical Formula C157]
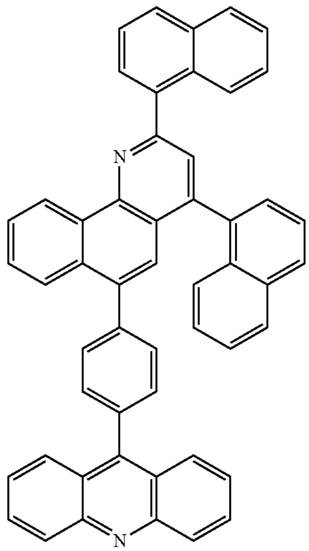
[Chemical Formula C158]
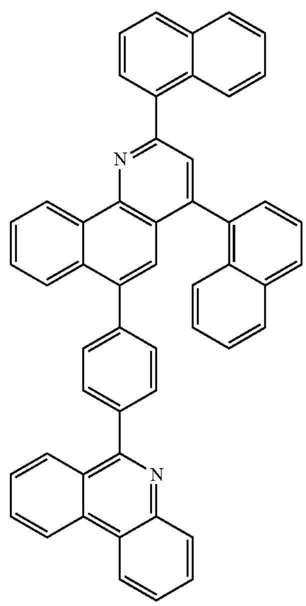
[Chemical Formula C159]
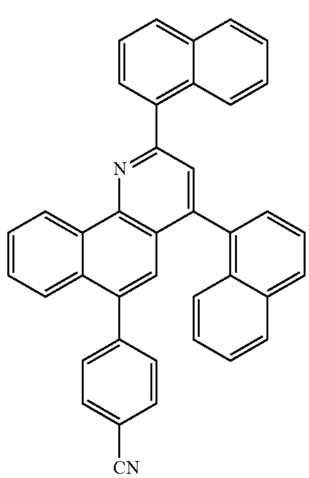
-continued
[Chemical Formula C160]
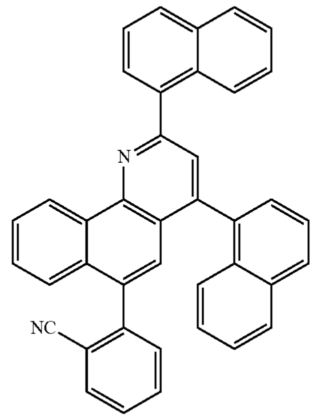
[Chemical Formula C161]
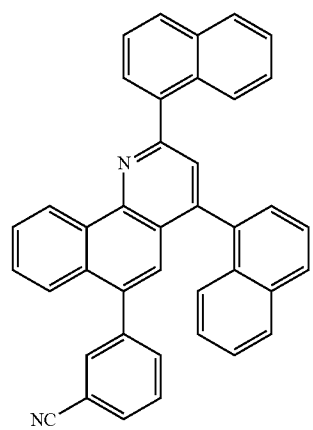
[Chemical Formula C162]
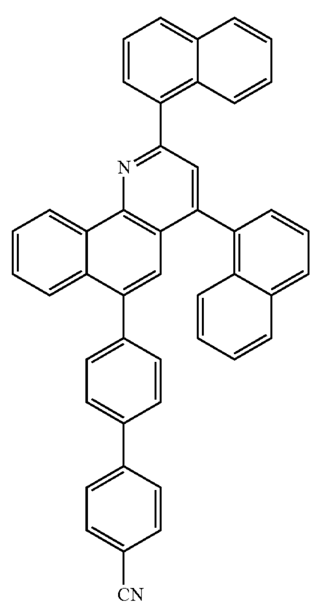

-continued
[Chemical Formula C163]
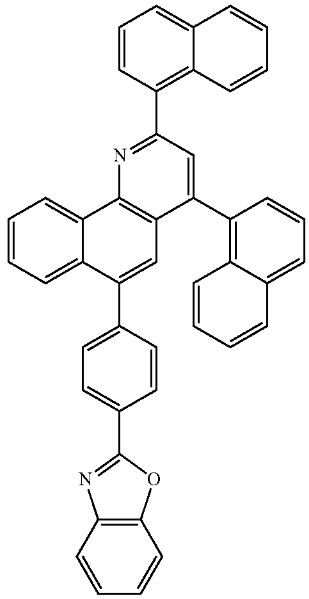
[Chemical Formula C164]
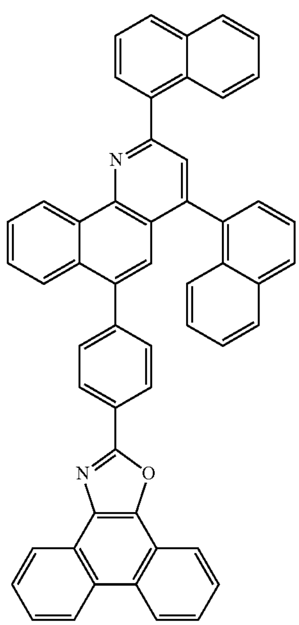
-continued
[Chemical Formula C165]
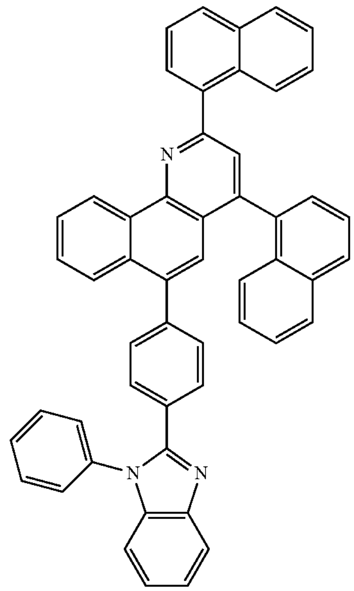
[Chemical Formula C166]
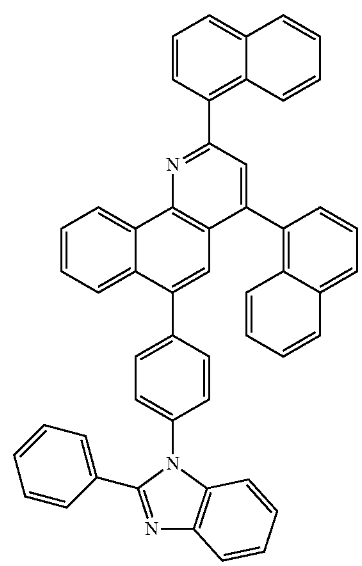

[Chemical Formula C167]
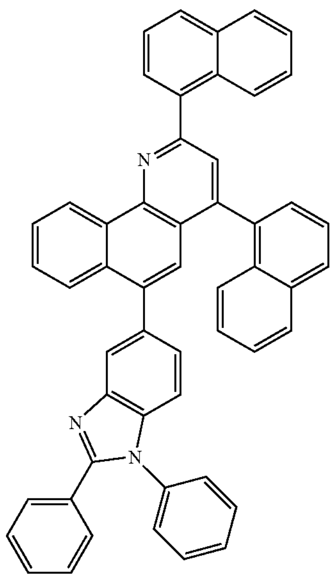
[Chemical Formula C168]
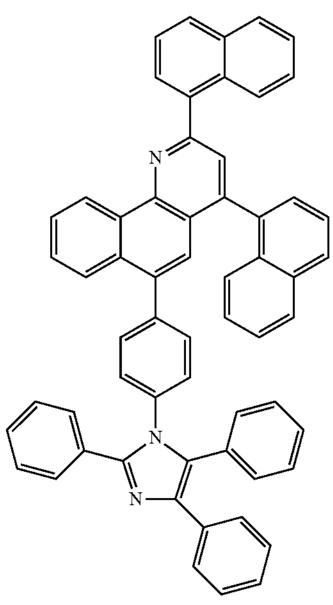
[Chemical Formula C169]
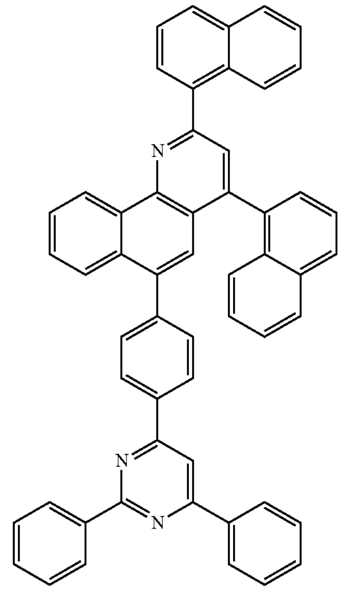
[Chemical Formula C170]
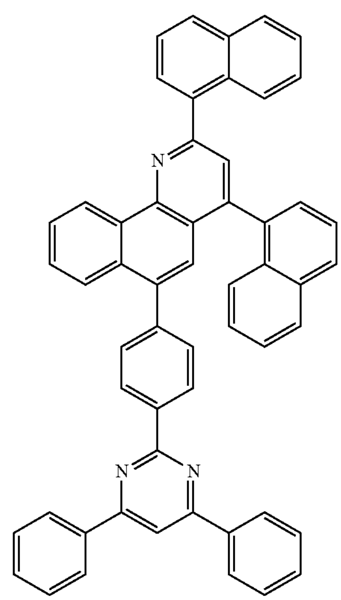

[Chemical Formula C171]

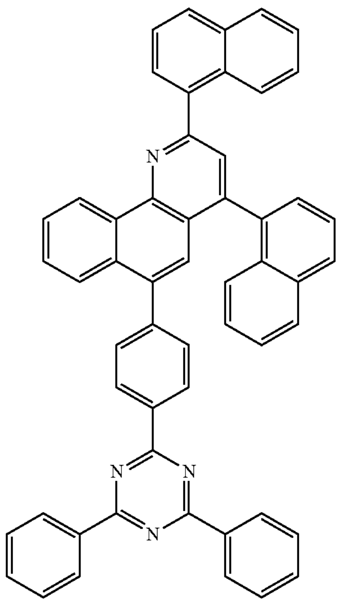

[Chemical Formula C172]

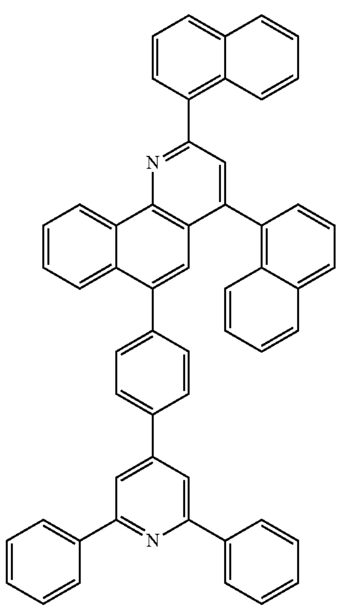

[Chemical Formula C173]

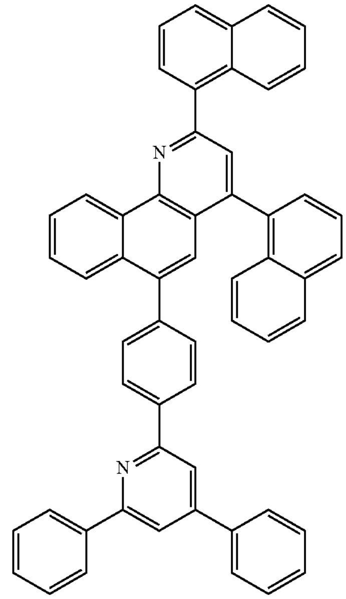

The compound for an organic optoelectronic device according to an embodiment may have a glass transition temperature of 150° C. or higher and a thermal decomposition temperature of 400° C. or higher, indicating improved thermal stability. Accordingly, the compound may be used to produce an organic optoelectronic device having a high efficiency.

The compound for an organic optoelectronic device according to an embodiment may play a role in emitting light or injecting and/or transporting electrons, and may also act as a light emitting host with an appropriate dopant. For example, the compound for an organic optoelectronic device may be used as a phosphorescent or fluorescent host material, a blue light emitting dopant material, or an electron transporting material.

The compound for an organic optoelectronic device according to an embodiment may be used for an organic thin layer. Thus, the compound may help improve the life-span characteristic, efficiency characteristic, electrochemical stability, and thermal stability of an organic photoelectric device, and may help decrease the driving voltage.

Another embodiment provides an organic optoelectronic device that includes the compound for an organic optoelectronic device. The organic optoelectronic device may include, e.g., an organic photoelectric device, an organic light emitting diode, an organic solar cell, an organic transistor, an organic photo conductor drum, an organic memory device, or the like. For example, the compound for an organic optoelectronic device according to an embodiment may be included in an electrode or an electrode buffer layer in the organic solar cell to help improve the quantum efficiency, or it may be used as an electrode material for a gate, a source-drain electrode, or the like in the organic transistor.

Hereinafter, an organic light emitting diode will be described in detail.

An organic light emitting diode including an anode, a cathode, and at least one organic thin layer between the anode and the cathode. The at least one organic thin layer may include the compound for an organic optoelectronic device according to an embodiment.

The organic thin layer that may include the compound for an organic optoelectronic device may include a layer selected from the group of an emission layer, a hole transport layer (HTL), a hole injection layer (HIL), an electron transport layer (ETL), an electron injection layer (EIL), a hole blocking layer, and a combination thereof. The at least one layer may include the compound for an organic optoelectronic device according to an embodiment. For example, the compound for an organic optoelectronic device according to an embodiment may be included in an electron transport layer (ETL) or an electron injection layer (EIL). In an implementation, when the compound for an organic optoelectronic device is included in the emission layer, the compound for an organic optoelectronic device may be included as a phosphorescent or fluorescent host, e.g., as a fluorescent blue dopant material.

FIGS. 1 to 5 illustrate cross-sectional views showing organic photoelectric devices including the compound for an organic optoelectronic device according to an embodiment.

Referring to FIGS. 1 to 5, organic photoelectric devices 100, 200, 300, 400, and 500 according to an embodiment may include at least one organic thin layer 105 interposed between an anode 120 and a cathode 110.

The anode 120 may include an anode material laving a large work function to facilitate hole injection into an organic thin layer. The anode material may include: a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or $SnO_2$:Sb; or a conductive polymer such as poly(3-methylthiophene), poly[3,4-(ethylene-1,2-dioxy)thiophene] (PEDT), polypyrrole, and polyaniline, but is not limited thereto. In an implementation, the anode may include a transparent electrode including indium tin oxide (ITO).

The cathode 110 may include a cathode material having a small work function to facilitate electron injection into an organic thin layer. The cathode material may include: a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, $LiO_2$/Al, LiF/Ca, LiF/Al, and $BaF_2$/Ca, but is not limited thereto. The cathode may include a metal electrode including aluminum as a cathode.

Referring to FIG. 1, the organic photoelectric device 100 may include an organic thin layer 105 including only an emission layer 130.

Figure 2:
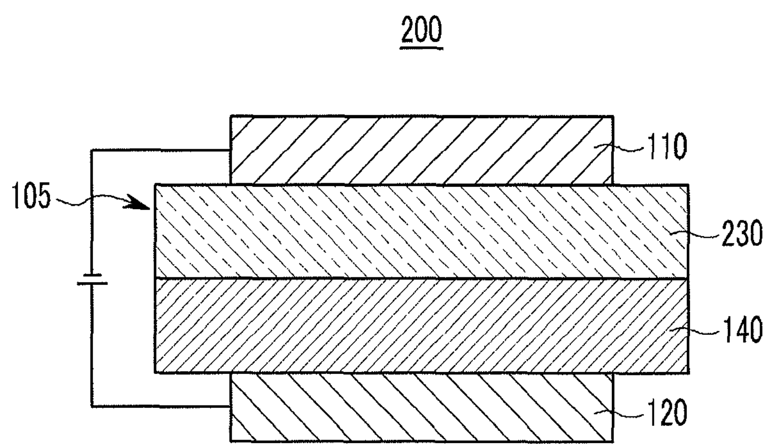

Referring to FIG. 2, a double-layered organic photoelectric device 200 may include an organic thin layer 105 including an emission layer 230 (including an electron transport layer (ETL)) and a hole transport layer (HTL) 140. As shown in FIG. 2, the organic thin layer 105 may include a double layer of the emission layer 230 and hole transport layer (HTL) 140. The emission layer 130 may also function as an electron transport layer (ETL), and the hole transport layer (HTL) 140 layer may have an excellent binding property with a transparent electrode such as ITO and/or an excellent hole transporting property.

Figure 3:
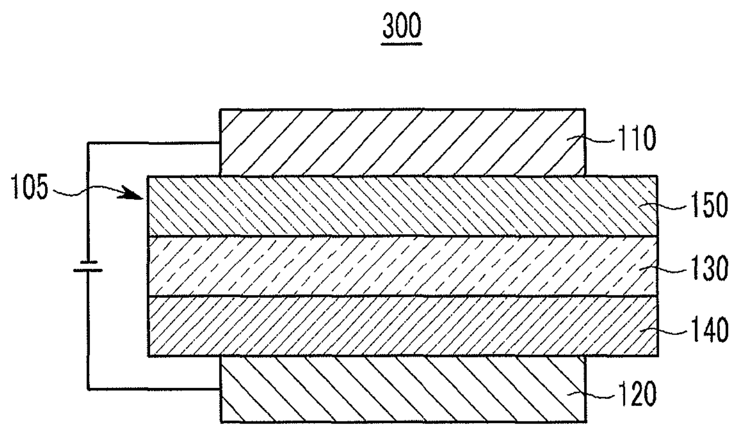

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed, and layers having an excellent electron transporting property or an excellent hole transporting property may be separately stacked.

Figure 4:
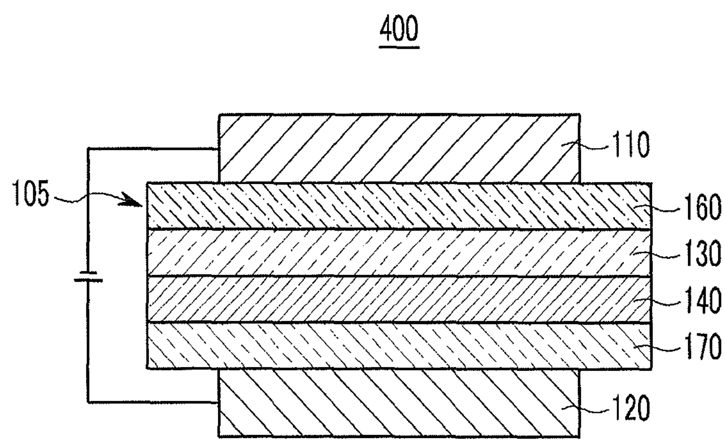

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 (for adherence with the anode of ITO).

Figure 5:
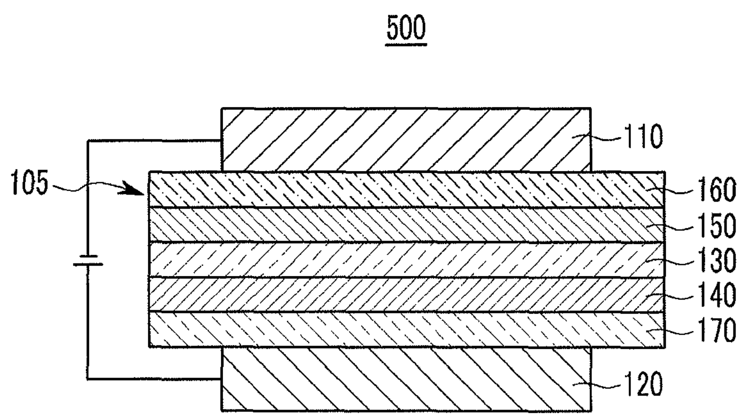

As shown in FIG. 5, a five layered organic photoelectric device 500 may include an organic thin layer 105 including an electron transport layer (ETL) 150, an emission layer 130, a hole transport layer (HTL) 140, and a hole injection layer (HIL) 170, and may further include an electron injection layer (EIL) 160 to achieve a low voltage.

In FIGS. 1 to 5, the organic thin layer 105 including at least one selected from the group of an electron transport layer (ETL) 150, an electron injection layer (EIL) 160, emission layers 130 and 230, a hole transport layer (HTL) 140, a hole injection layer (HIL) 170, and combinations thereof may include a compound for an organic optoelectronic device. The compound for an organic optoelectronic device may be used for an electron transport layer (ETL) 150 including the electron transport layer (ETL) 150 or electron injection layer (EIL) 160. When it is used for the electron transport layer (ETL), it is possible to provide an organic photoelectric device having a simplified structure because an additional hole blocking layer (not shown) may be omitted.

Furthermore, when the compound for an organic optoelectronic device is included in the emission layers 130 and 230, the material for the organic photoelectric device may be included as a phosphorescent or fluorescent host or a fluorescent blue dopant.

The organic light emitting diode may be fabricated by: forming an anode on a substrate; forming an organic thin layer in accordance with a dry coating method such as evaporation, sputtering, plasma plating, and ion plating or a wet coating method such as spin coating, dipping, and flow coating; and providing a cathode thereon.

Another embodiment provides a display device including the organic photoelectric device according to the above embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

(Preparation of Compound for an Organic Optoelectronic Device)

EXAMPLE 1

Synthesis of Compound Represented by Chemical Formula A1

As an example of the compound for an organic optoelectronic device, the compound represented by the above Chemical Formula A1 was synthesized through 4 step processes in accordance with the following Reaction Scheme 1.

[Reaction Scheme 1]
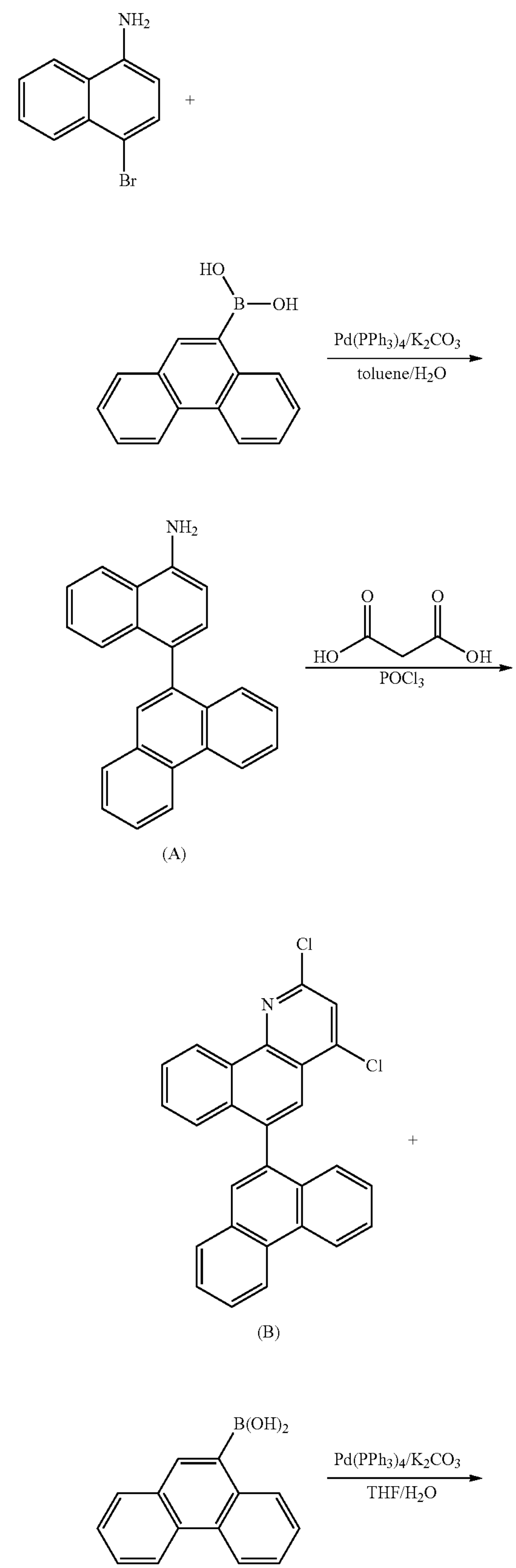
-continued
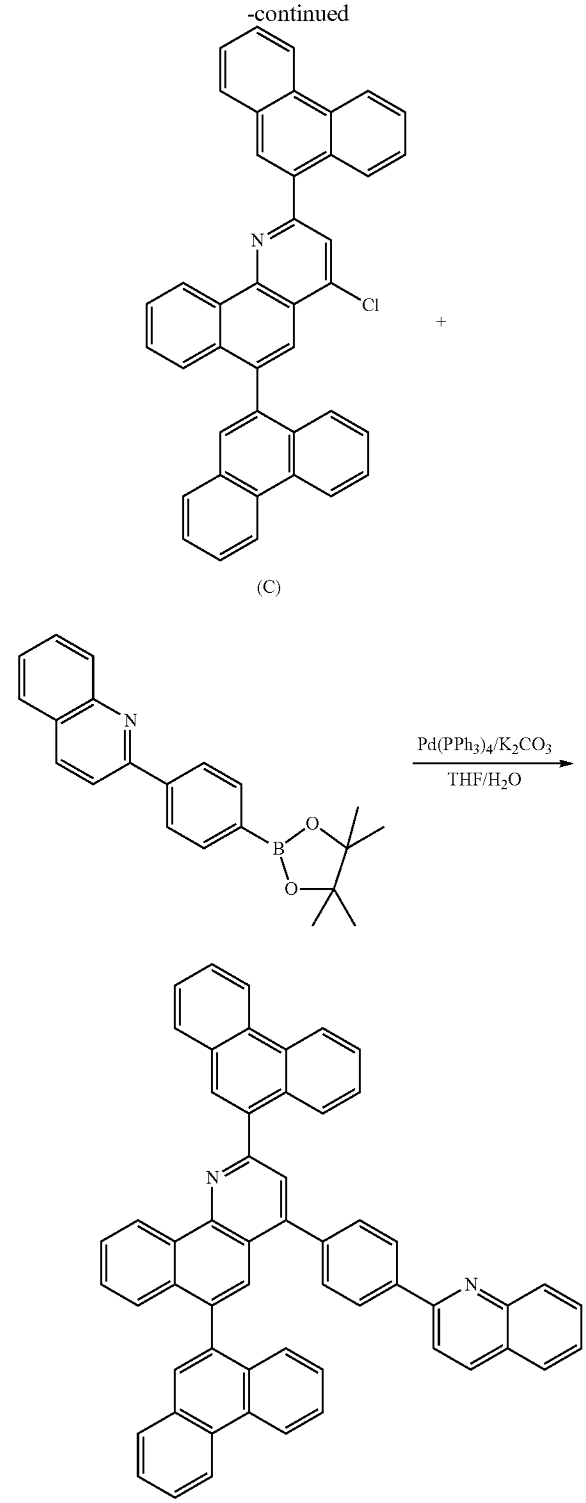
First Step: Synthesis of Intermediate Product (A)
25.0 g (112.6 mmol) of 1-amino-4-bromonaphthalene, 30.0 g (135.1 mmol) of 9-phenanthrene boronic acid, and 3.3 g (2.8 mmol) of tetrakis(triphenylphosphine)palladium [Pd $(PPh_3)_4$] were dissolved in 750 mL of a toluene solvent. A solution in which 31.1 g (225.1 mmol) of potassium carbonate ($K_2CO_3$) was dissolved in 250 ml of water was added thereto, and then reacted at 85° C. for 12 hours. The aqueous layer of the reaction was removed, the solvent was removed under reduced pressure, and the reaction product was rinsed with water and methanol. The obtained solid mixture was separated by a column and dried to provide a yellow solid of an intermediate product (A) in 31.0 g (yield: 86%).

Second Step: Synthesis of Intermediate Product (B)

20.0 g (62.6 mmol) of the intermediate product (A) and 9.8 g (93.9 mmol) of malonic acid were dissolved in a 58 mL of phosphorus oxychloride ($POCl_3$) solvent and reacted at 140° C. for 4 hours. The obtained reaction products were poured into ice water and filtered. The formed solid was rinsed with water and a sodium hydrogen carbonate saturated aqueous solution. The obtained solid mixture was rinsed with methanol and dried to provide a pale yellow solid of an intermediate product (B) in 13.0 g (yield: 49%).

Third Step: Synthesis of Intermediate Product (C)

14.0 g (33.0 mmol) of intermediate product (B), 8.1 g (36.3 mmol) of 9-phenanthrene boronic acid, and 1.2 g (1.0 mmol) of tetrakis(triphenylphosphine)palladium [$Pd(PPh_3)_4$] were dissolved in 280 mL of a tetrahydrofuran (THF) solvent. A solution in which 9.1 g (66.0 mmol) of potassium carbonate ($K_2CO_3$) was dissolved in 140 ml of water was added thereto, and then they were reacted at 80° C. for 12 hours. The solvent was removed under a reduced pressure, and the reaction product was rinsed with water and methanol. The residue was recrystallized with toluene, and the precipitated crystal was separated by a filter and rinsed with toluene and dried to provide a white solid of an intermediate compound (C) in 14.9 g (yield: 51%).

Fourth Step: Synthesis of Compound Represented by Chemical Formula A1

10.0 g (17.7 mmol) of intermediate product (C), 7.0 g (21.2 mmol) of 8-(4-(4,4,5,5-tetramethyl-1,3,2-dioxaborolan-2-yl)phenyl)quinoline, and 0.6 g (0.5 mmol) of tetrakis(triphenylphosphine)palladium [$Pd(PPh_3)_4$] were dissolved in 200 mL of a tetrahydrofuran (THF) solvent. A solution in which 4.9 g (35.3 mmol) of potassium carbonate ($K_2CO_3$) was dissolved in 100 ml of water was added thereto, and then they were reacted at 90° C. for 12 hours. The solvent was removed under a reduced pressure, and the reaction product was rinsed with water and methanol. The residue was recrystallized with toluene, and the precipitated crystal was separated by a filter and rinsed with toluene and dried to provide a white solid of a compound in 11.0 g (yield: 85%). (calculation value: 734.88, measurement value: MS[M+1] 735.18)

EXAMPLE 2

Synthesis of Compound Represented by Chemical Formula B1

As an example of the compound for an organic optoelectronic device, the compound represented by the above Chemical Formula B1 was synthesized through 2 step processes in accordance with the following Reaction Scheme 2.

[Reaction Scheme 2]

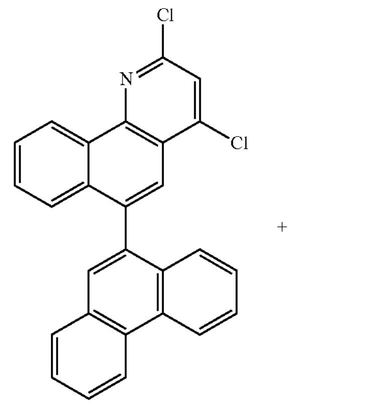

(B)

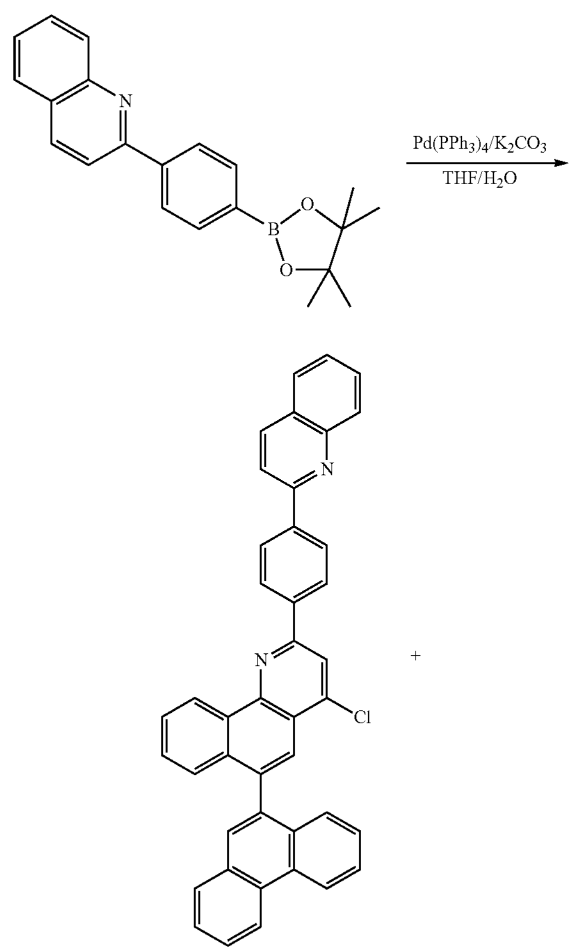

(D)

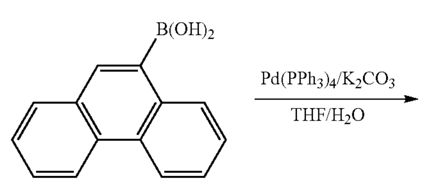

-continued

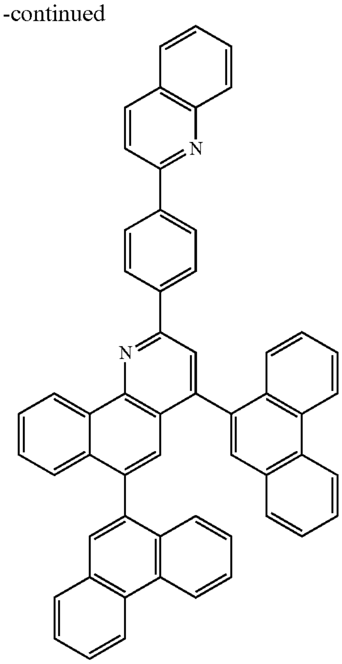

First Step: Synthesis of Intermediate Product (D)

5.2 g (12.3 mmol) of the intermediate product (B), 4.5 g (13.5 mmol) of 8-(4-(4,4,5,5-tetramethyl-1,3,2-dioxaborolan-2-yl)phenyl)quinoline, and 0.4 g (0.4 mmol) of tetrakis (triphenylphosphine)palladium [$Pd(PPh_3)_4$] were dissolved in a 100 mL of a tetrahydrofuran (THF) solvent. A solution in which 3.4 g (24.5 mmol) of potassium carbonate ($K_2CO_3$) was dissolved in 50 ml of water was added thereto, and then they were reacted at 80° C. for 12 hours. The solvent was removed under a reduced pressure, and the reaction product was rinsed with water and methanol. The residue was recrystallized with toluene, and the precipitated crystal was separated by a filter and rinsed with toluene and dried to provide a white solid of an intermediate product (C) in 5.0 g (yield: 69%).

Second Step: Synthesis of Compound Represented by Chemical Formula B1

5.0 g (8.4 mmol) of intermediate product (D), 2.3 g (10.1 mmol) of 9-phenanthrene boroic acid, and 0.3 g (0.3 mmol) of tetrakis(triphenylphosphine)palladium [$Pd(PPh_3)_4$] were dissolved in 100 mL of a tetrahydrofuran (THF) solvent. A solution in which 2.3 g (16.9 mmol) of potassium carbonate ($K_2CO_3$) was dissolved in 50 ml of water was added thereto, and then they were reacted at 90° C. for 12 hours. The solvent was removed under a reduced pressure, and the reaction product was rinsed with water and methanol. The residue was recrystallized with toluene, and the precipitated crystal was separated by a filter and rinsed with toluene and dried to provide a white solid of a compound in 4.2 g (yield: 68%). (calculation value: 734.88, measurement value: MS[M+1] 735.18)

EXAMPLE 3

Synthesis of Compound Represented by Chemical Formula C1

As an example of the compound for an organic optoelectronic device, the compound represented by the above Chemical Formula C1 was synthesized through 3 step processes in accordance with the following Reaction Scheme 3.

[Reaction Scheme 3]

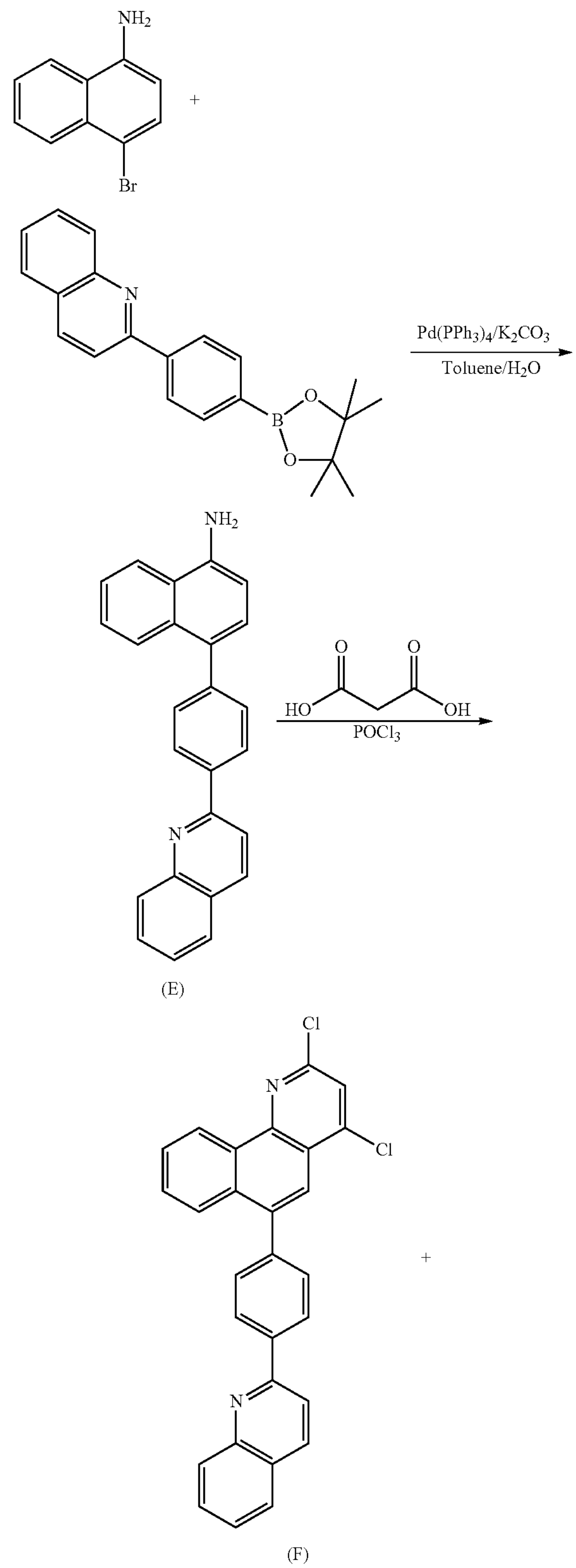

-continued

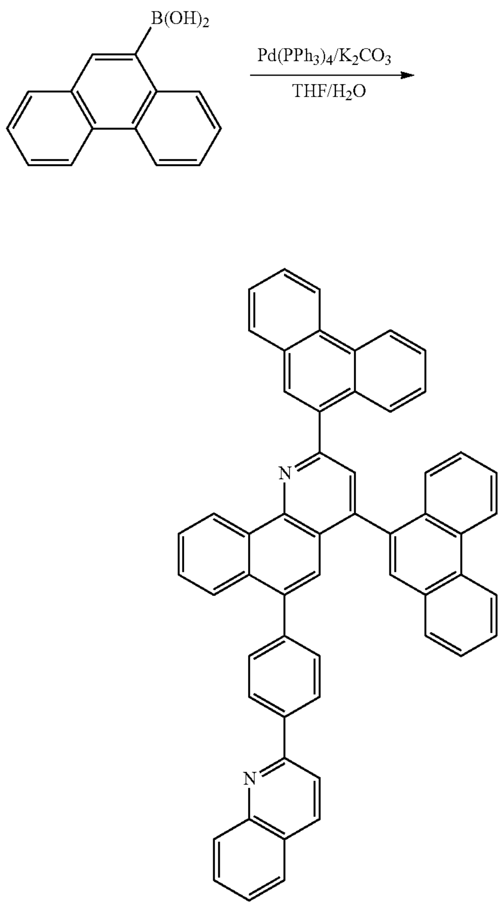

First Step: Synthesis of Intermediate Product (E)

15.0 g (67.5 mmol) of 1-amino-4-bromonaphthalene, 24.6 g (74.3 mmol) of 8-(4-(4,4,5,5-tetramethyl-1,3,2-dioxaborolan-2-yl)phenyl)quinoline, and 2.0 g (1.7 mmol) of tetrakis (triphenylphosphine)palladium [$Pd(PPh_3)_4$] were dissolved in 450 mL of a toluene solvent. A solution in which 18.7 g (135.1 mmol) of potassium carbonate ($K_2CO_3$) was dissolved in 150 ml of water was added thereto, and then they were reacted at 85° C. for 12 hours. The aqueous layer of the reaction was removed, the solvent was removed under a reduced pressure, and the reaction product was rinsed with water and methanol. The obtained solid mixture was separated by a column and dried to provide a yellow solid of an intermediate product (E) in 15.5 g (yield: 66%).

Second Step: Synthesis of Intermediate Product (F)

15.5 g (44.7 mmol) of intermediate product (E), and 7.0 g (67.1 mmol) of malonic acid were dissolved in 41 mL of phosphorus oxychloride ($POCl_3$) solvent and reacted at 140° C. for 4 hours. The obtained reactant was poured into ice water and filtered. The formed solid was rinsed with sodium hydrogen carbonate saturated aqueous solution. The obtained solid mixture was rinsed with methanol and dried to provide a pale yellow solid of an intermediate product (F) in 5.0 g (yield: 25%).

Third Step: Synthesis of Compound Represented by Chemical Formula C1

2.2 g (4.9 mmol) of intermediate product (F), 2.4 g (10.7 mmol) of 9-phenanthrene boronic acid, and 0.3 g (0.2 mmol) of tetrakis(triphenylphosphine)palladium [$Pd(PPh_3)_4$] were dissolved in 60 mL of a tetrahydrofuran (THF) solvent. A solution in which 2.7 g (19.5 mmol) of potassium carbonate ($K_2CO_3$) was dissolved in 20 ml of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 2.8 g (yield: 78%). (calculation value: 734.88, measurement value: MS[M+1] 735.18)

EXAMPLE 4

Synthesis of Compound Represented by Chemical Formula A2

As an example of the compound for an organic optoelectronic device, the compound represented by the above Chemical Formula A2 was synthesized in accordance with the following Reaction Scheme 4.

[Reaction Scheme 4]

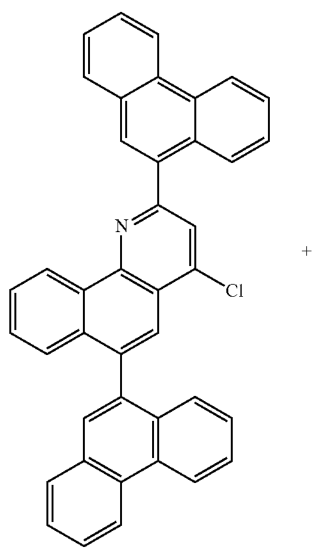

(C)

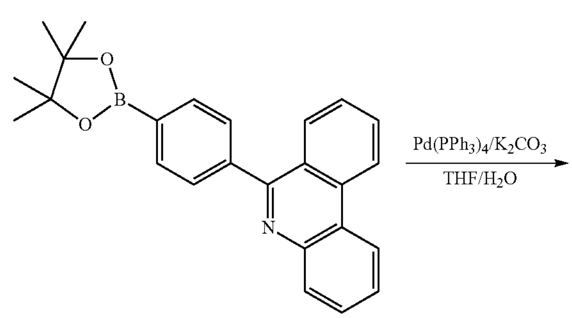

-continued

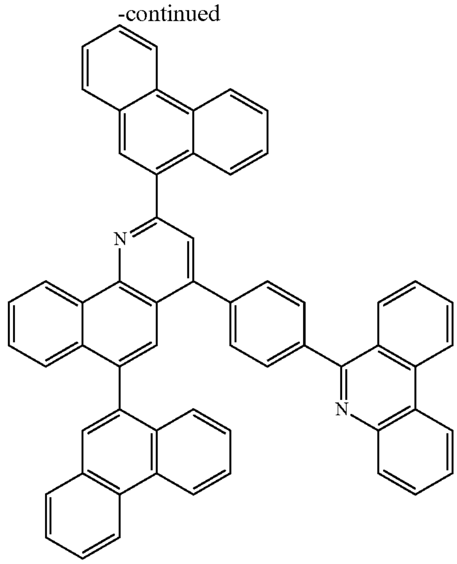

10 g (17.7 mmol) of intermediate product (C), 8.1 g (21.2 mmol) of 6-(4-(4,4,5,5-tetramethyl-1,3,2-dioxaborolan-2-yl)phenyl)phenantridine, and 0.6 g (0.5 mmol) of tetrakis(triphenylphosphine)palladium [$Pd(PPh_3)_4$] were dissolved in 200 mL of a tetrahydrofuran (THF) solvent. A solution in which 4.9 g (35.3 mmol) of potassium carbonate ($K_2CO_3$) was dissolved in 100 ml of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 11.0 g (yield: 79%). (calculation value: 784.94, measurement value: MS[M+1] 785.29)

EXAMPLE 5

Synthesis of Compound Represented by Chemical Formula B2

As an example of the compound for an organic optoelectronic device, the compound represented by the above Chemical Formula B2 was synthesized in accordance with the following Reaction Scheme 5.

[Reaction Scheme 5]

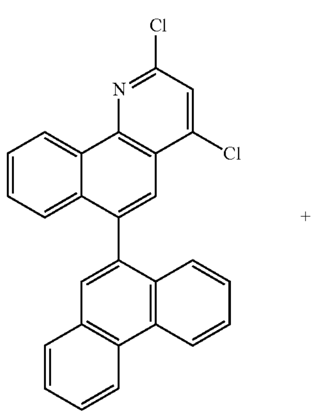

(B)

-continued

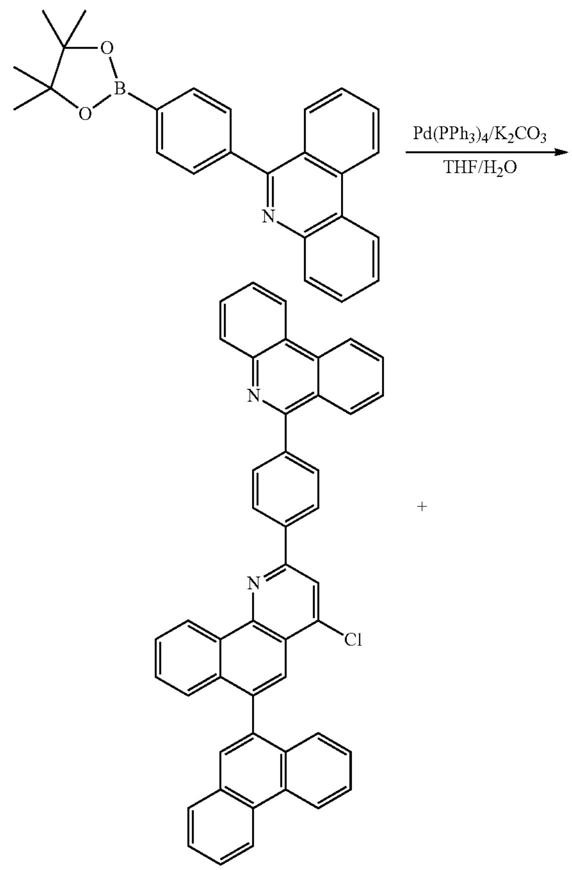

(G)

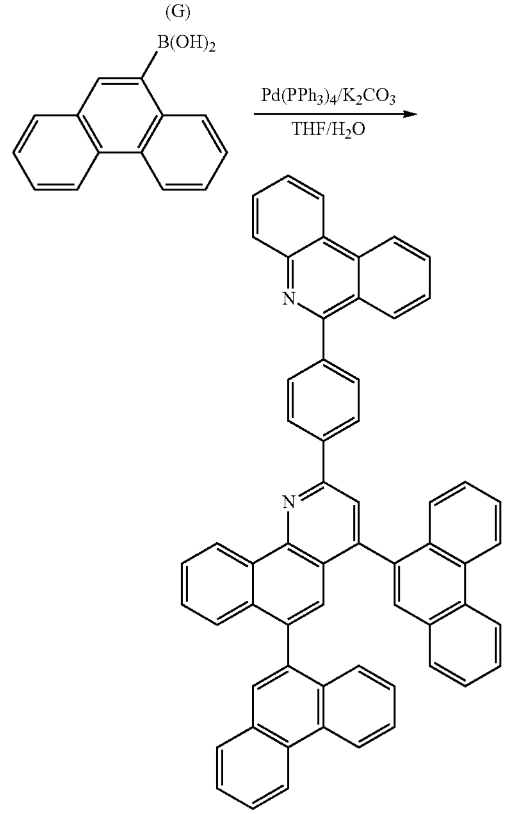

First Step: Synthesis of Intermediate Product (G)

11.0 g (25.9 mmol) of intermediate product (C), 10.9 g (28.5 mmol) of 6-(4-(4,4,5,5-tetramethyl-1,3,2-dioxaborolan-2-yl)phenyl)phenantridine, and 0.9 g (0.8 mmol) of tetrakis(triphenylphosphine)palladium [$Pd(PPh_3)_4$] were dissolved in 220 ml of a tetrahydrofuran (THF) solvent. A solution in which 7.2 g (51.9 mmol) of potassium carbonate ($K_2CO_3$) was added into 110 ml of water was added thereto, and then they were reacted at 80° C. for 12 hours. The aqueous layer of the reaction was removed, the solvent was removed under reduced pressure, and the reaction product was rinsed with water and methanol. The residue was recrystallized with toluene, and the precipitated crystal was separated by a filter and rinsed with toluene and dried to provide a pale yellow solid of intermediate product (G) in 13.69 g (yield: 82%).

Second Step: Synthesis of Compound Represented by Chemical Formula B2

13.0 g (20.2 mmol) of intermediate product (G), 5.4 g (24.3 mmol) of 9-phenanthrene boronic acid, and 0.7 g (0.6 mmol) of tetrakis(triphenylphosphine)palladium [$Pd(PPh_3)_4$] were dissolved with a solvent of 390 mL of toluene and 260 mL of tetrahydrofuran (THF). A solution in which 5.6 g (40.4 mmol) of potassium carbonate ($K_2CO_3$) was dissolved in 20 mL of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 13.1 g (yield: 83%). (calculation value: 784.94, measurement value: MS[M+1] 785.29)

EXAMPLE 6

Synthesis of Compound Represented by Chemical Formula A3

As an example of the compound for an organic optoelectronic device, the compound represented by the above Chemical Formula A3 was synthesized through one step process in accordance with the following Reaction Scheme 6.

[Reaction Scheme 6]

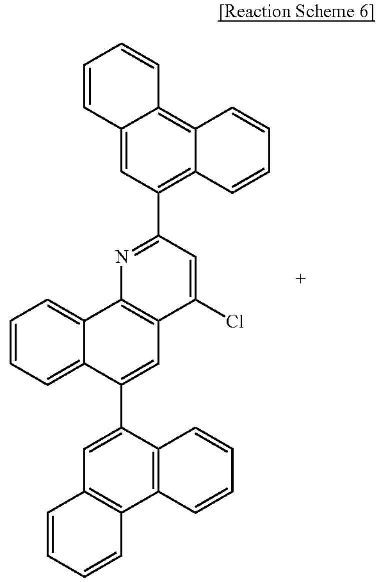

(C)

-continued

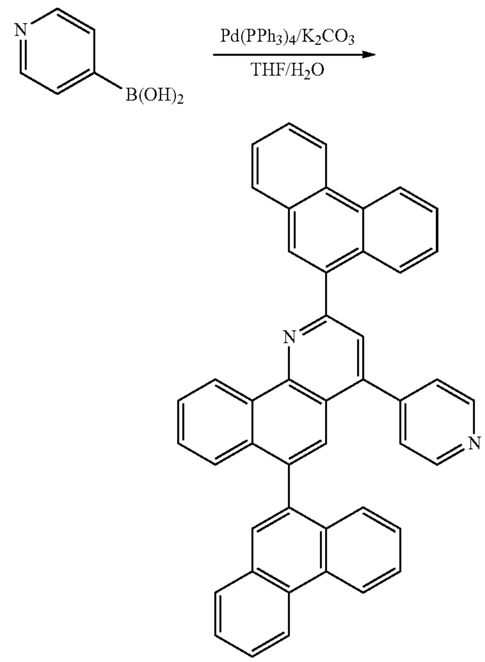

16.0 g (28.3 mmol) of intermediate product (C), 4.2 g (33.9 mmol) of 4-pyridine boronic acid, and 1.0 g (0.9 mmol) of tetrakis(triphenylphosphine)palladium [$Pd(PPh_3)_4$] were dissolved in 320 mL of a tetrahydrofuran (THF) solvent. A solution in which 7.8 g (56.5 mmol) of potassium carbonate ($K_2CO_3$) was dissolved in 160 ml of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 13.0 g (yield: 75%). (calculation value: 608.73, measurement value: MS[M+1] 609.23)

EXAMPLE 7

Synthesis of Compound Represented by Chemical Formula C2

As an example of the compound for an organic optoelectronic device, the compound represented by the above Chemical Formula C2 was synthesized through two step processes in accordance with the following Reaction Scheme 7.

[Reaction Scheme 7]

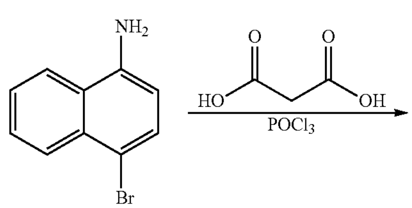

-continued

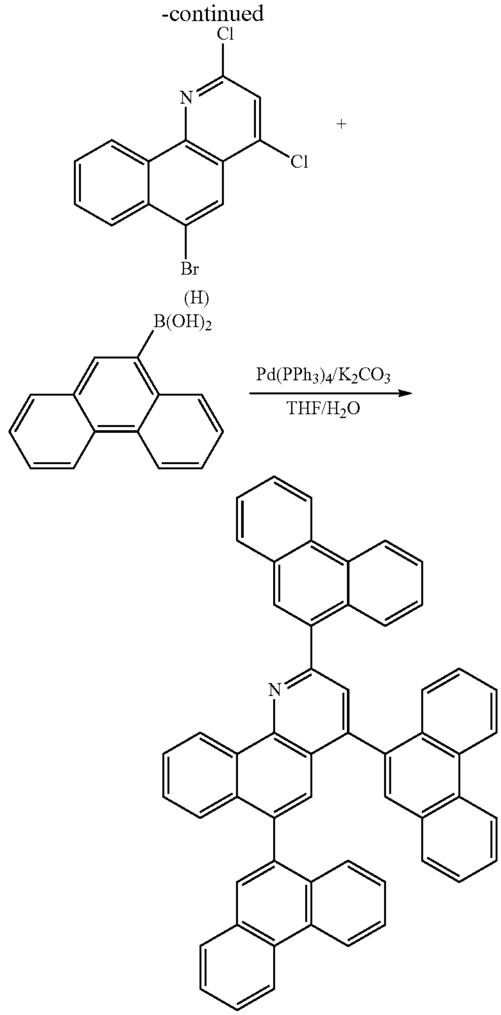

First Step: Synthesis of Intermediate Product (H)

50.0 g (225.1 mmol) of 1-amino-4-bromonaphthalene, and 35.1 g (337.7 mmol) of malonic acid were dissolved in 345 ml of phosphorus oxychloride ($POCl_3$) and reacted at 140° C. for 4 hours. The obtained reactant was poured into ice water and filtered. The formed solid was rinsed with sodium hydrogen carbonate saturated aqueous solution. The obtained solid mixture was rinsed with methanol and dried to provide a pale yellow solid of an intermediate product (H) in 16.6 g (yield: 23%).

Second Step: Synthesis of Compound Represented by Chemical Formula C2

8.0 g (24.5 mmol) of intermediate product (H), 19.6 g (88.1 mmol) of 9-phenanthrene boronic acid, and 2.1 g (1.8 mmol) of tetrakis(triphenylphosphine)palladium [$Pd(PPh_3)_4$] were dissolved in 240 mL of tetrahydrofuran (THF). A solution in which 20.3 g (146.8 mmol) of potassium carbonate ($K_2CO_3$) was dissolved in 120 ml of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 12.0 g (yield: 69%). (calculation value: 707.86, measurement value: MS[M+1] 708.26)

EXAMPLE 8

Synthesis of compound Represented by Chemical Formula C3

As an example of the compound for an organic optoelectronic device, the compound represented by the above Chemical Formula C3 was synthesized through three step processes in accordance with the following Reaction Scheme 8.

[Reaction Scheme 8]

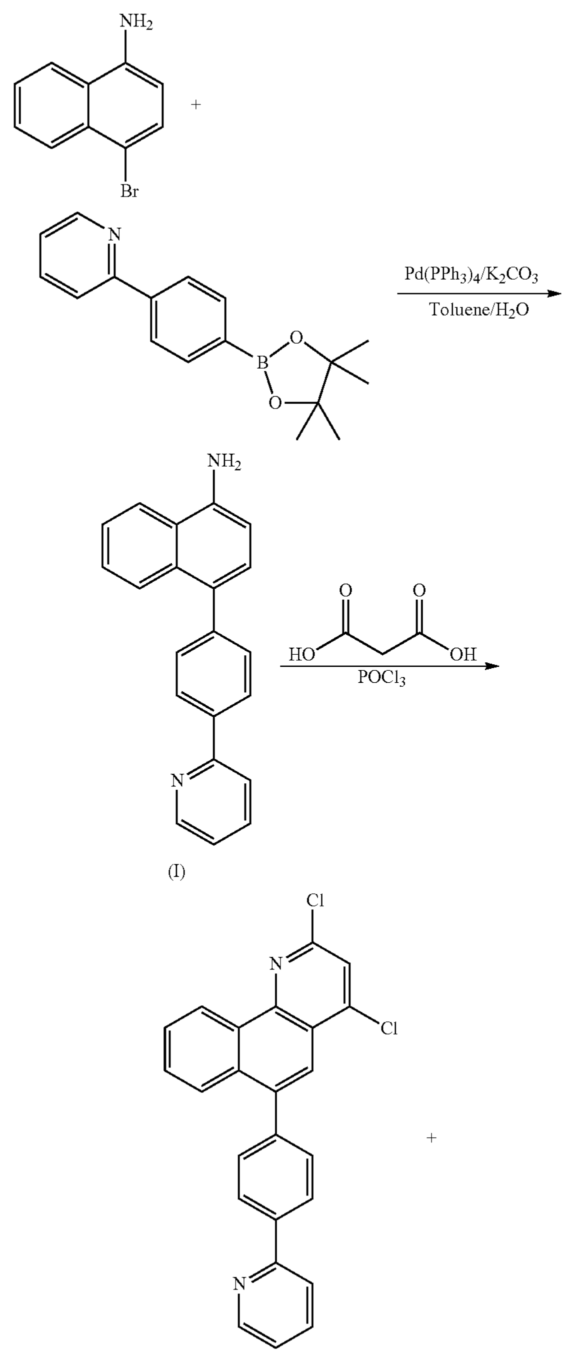

-continued

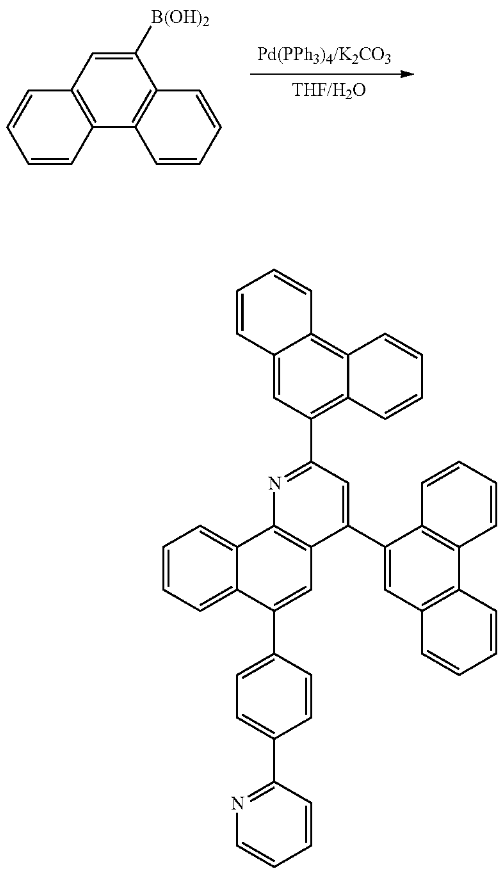

First Step: Synthesis of Intermediate Product (I)

30.0 g (135.1 mmol) of 1-amino-4-bromonaphthalene, 41.8 g (148.6 mmol) of 2-(4-(4,4,5,5-tetramethyl-1,3,2-dioxaborolan-2-yl)phenyl)pyridine, and 3.9 g (3.4 mmol) of tetrakis(triphenylphosphine)palladium [$Pd(PPh_3)_4$] were dissolved in 900 ml of a toluene solvent. A solution in which 37.3 g (270.2 mmol) of potassium carbonate ($K_2CO_3$) was dissolved in 300 ml of water was added thereto, and then they were reacted at 85° C. for 12 hours. The aqueous layer of the reaction was removed, the solvent was removed under reduced pressure, and the reaction product was rinsed with water and methanol. The obtained solid mixture was separated by a column and dried to provide a yellow solid of an intermediate product (I) in 24.9 g (yield: 62%).

Second Step: Synthesis of Intermediate Product (J)

24.9 g (84.1 mmol) of intermediate product (I), and 13.1 g (126.2 mmol) of malonic acid were dissolved in 38 mL of phosphorus oxychloride ($POCl_3$) solvent and reacted at 140° C. for 4 hours. The obtained reactant was poured into ice water and filtered. The formed solid was rinsed with sodium hydrogen carbonate saturated aqueous solution. The obtained solid mixture was rinsed with methanol and dried to provide a pale yellow solid of an intermediate product (J) in 5.6 g (yield: 17%).

Third Step: Synthesis of Compound Represented by Chemical Formula C3

5.5 g (13.7 mmol) of intermediate product (J), 6.7 g (30.2 mmol) of 9-phenanthrene boronic acid, and 0.8 g (0.1 mmol) of tetrakis(triphenylphosphine)palladium [$Pd(PPh_3)_4$] were dissolved in 110 mL of a tetrahydrofuran (THF) solvent. A solution in which 7.6 g (54.8 mmol) of potassium carbonate ($K_2CO_3$) was dissolved in 55 ml of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 6.0 g (yield: 64%). (calculation value: 684.82, measurement value: MS[M+1] 685.25)

EXAMPLE 9

Synthesis of Compound Represented by Chemical Formula A4

As an example of the compound for an organic optoelectronic device, the compound represented by the above Chemical Formula A4 was synthesized in accordance with the following Reaction Scheme 9.

[Reaction Scheme 9]

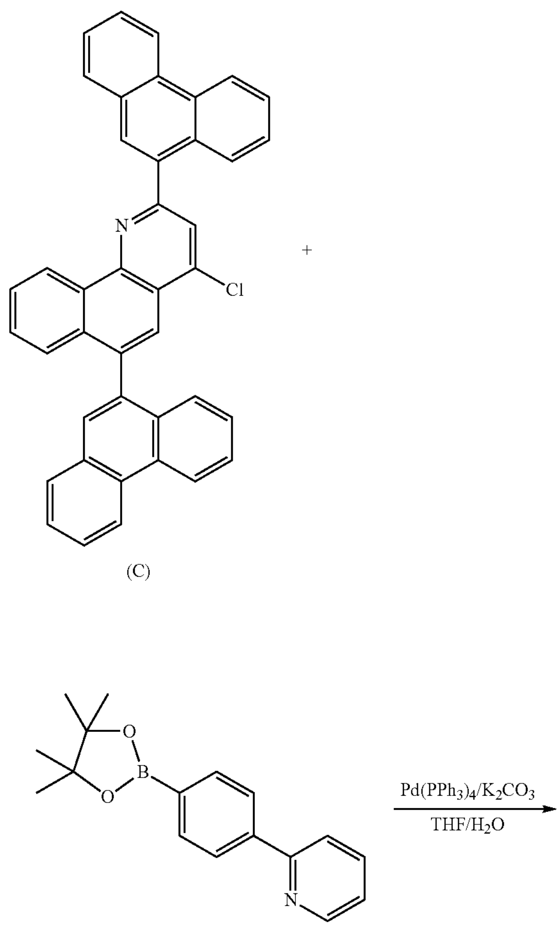

-continued

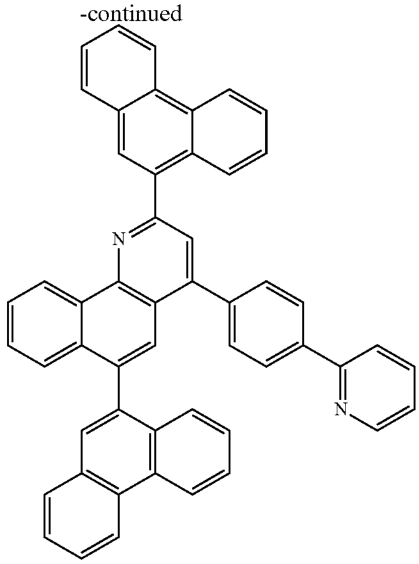

14.9 g (26.3 mmol) of intermediate product (C), 8.9 g (31.6 mmol) of 6-(4-(4,4,5,5-tetramethyl-1,3,2-dioxaborolan-2-yl)phenyl)pyridine, and 0.9 g (0.8 mmol) of tetrakis(triphenylphosphine)palladium [$Pd(PPh_3)_4$] were dissolved in 300 mL of a tetrahydrofuran (THF) solvent. A solution in which 7.3 g (52.6 mmol) of potassium carbonate ($K_2CO_3$) was dissolved in 150 ml of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 13.9 g (yield: 77%). (calculation value: 684.82, measurement value: MS[M+1] 685.25)

EXAMPLE 10

Synthesis of Compound Represented by Chemical Formula B3

As an example of the compound for an organic optoelectronic device, the compound represented by the above Chemical Formula B3 was synthesized through two step processes in accordance with the following Reaction Scheme 10.

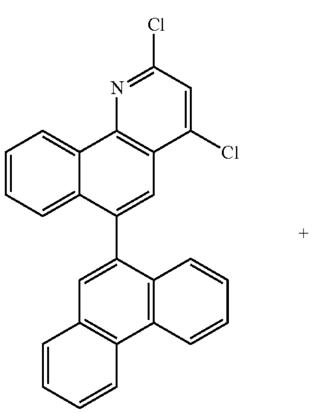

(B)

-continued

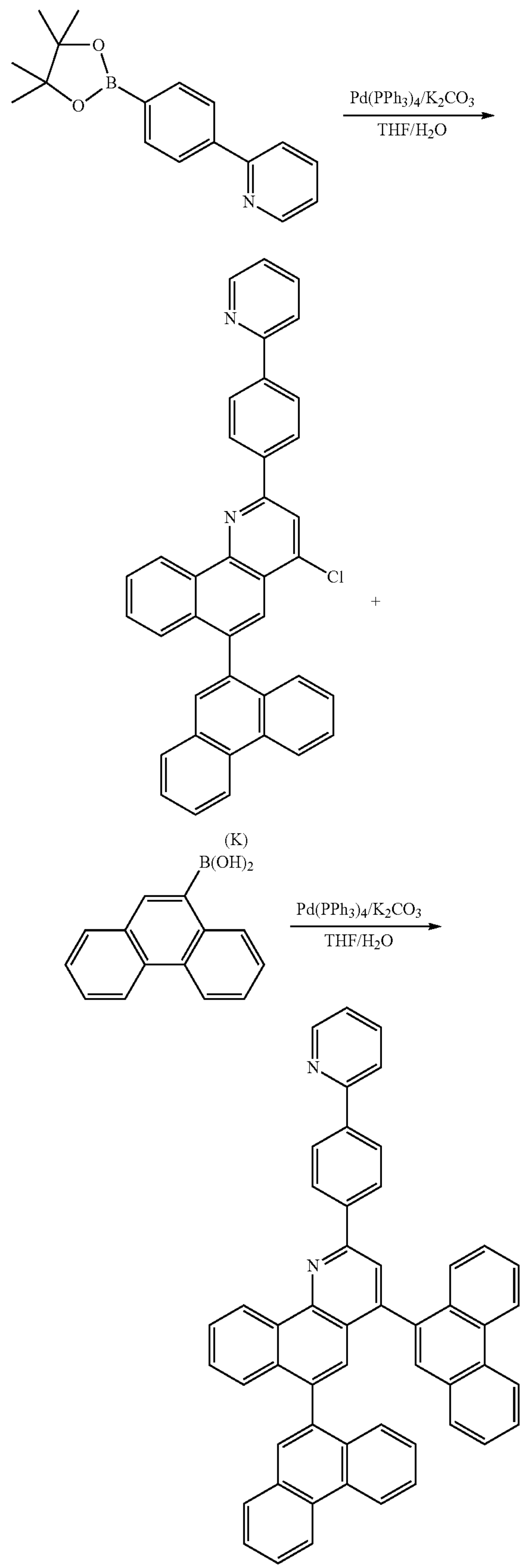

First Step: Synthesis of Intermediate Product (K)

14.0 g (32.9 mmol) of intermediate product (C), 10.2 g (36.3 mmol) of 6-(4-(4,4,5,5-tetramethyl-1,3,2-dioxaborolan-2-yl)phenyl)pyridine, and 1.1 g (1.0 mmol) of tetrakis (triphenylphosphine)palladium [$Pd(PPh_3)_4$] were dissolved in 280 ml of a tetrahydrofuran (THF) solvent. http://www.splashdivecenter.com/ 9.1 g (66.0 mmol) of potassium carbonate ($K_2CO_3$) was dissolved in 140 ml of water was added thereto, and then they were reacted at 80° C. for 12 hours. The aqueous layer of the reaction was removed, the solvent was removed under reduced pressure, and the reaction product was rinsed with water and methanol. The residue was recrystallized with toluene, and the precipitated crystal was separated by a filter and rinsed with toluene and dried to provide a pale yellow solid of intermediate product (K) in 9.7 g (yield: 54%).

Second Step: Synthesis of Compound Represented by Chemical Formula B3

9.7 g (17.8 mmol) of intermediate product (K), 5.4 g (21.4 mmol) of 9-phenanthrene boronic acid, and 0.6 g (0.5 mmol) of tetrakis(triphenylphosphine)palladium [$Pd(PPh_3)_4$] were dissolved in 380 mL of a tetrahydrofuran (THF) solvent. A solution in which 4.9 g (35.6 mmol) of potassium carbonate ($K_2CO_3$) was dissolved in 95 mL of water was added thereto, and then they were reacted at 90° C. for 12 hours. The solvent was removed under reduced pressure, and the reaction product was rinsed with water and methanol. The residue was recrystallized with toluene, and the precipitated crystal was separated by a filter and rinsed with toluene and dried to provide a white solid of a compound in 10.0 g (yield: 82%). (calculation value: 684.82, measurement value: MS[M+1] 685.25)

EXAMPLE A-1

Synthesis of Compound Represented by Chemical Formula A27

As an example of the compound for an organic optoelectronic device, the compound represented by the above Chemical Formula A27 was synthesized through 4 step processes in accordance with the following Reaction Scheme 11.

[Reaction Scheme 11]

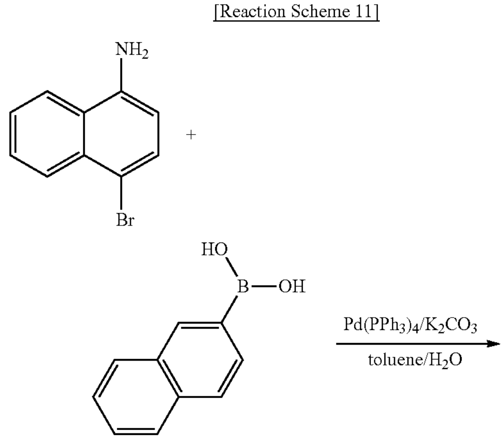

-continued

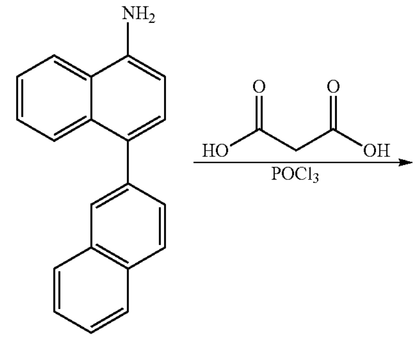

(L)

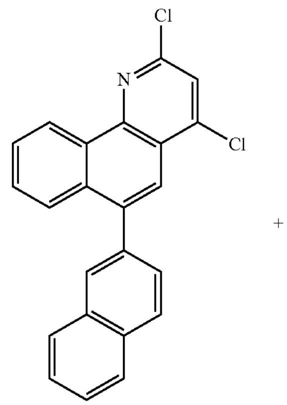

(M)

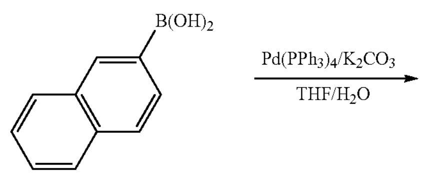

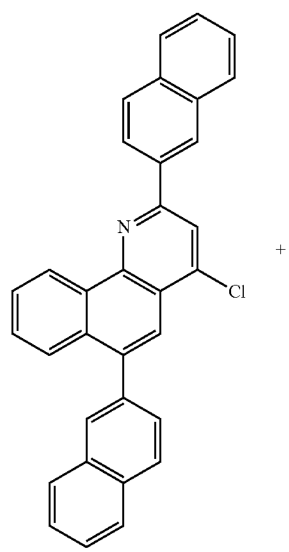

(N)

-continued

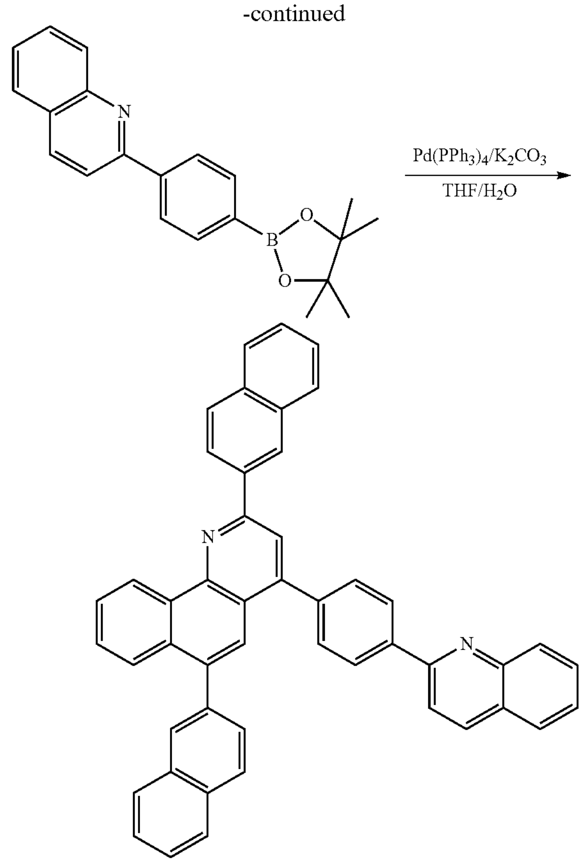

First Step: Synthesis of Intermediate Product (L)

100.0 g (450.3 mmol) of 1-amino-4-bromonaphthalene, 92.9 g (540.4 mmol) of 2-naphthaleneboronic acid, and 13.4 g (11.3 mmol) of tetrakis(triphenylphosphine)palladium [Pd $(PPh_3)_4$] were dissolved in 3000 ml of a toluene solvent. A solution in which 124.5 g (900.6 mmol) of potassium carbonate ($K_2CO_3$) was dissolved in 1,000 ml of water was added thereto, and then they were reacted at 100° C. for 12 hours. The aqueous layer of the reaction was removed, the solvent was removed under reduced pressure, and the reaction product was rinsed with water and methanol. The obtained solid mixture was rinsed with hexane two times to provide a yellow solid of intermediate product (L) in 105.5 g (yield: 87%).

Second Step: Synthesis of Intermediate Product (M)

105.5 g (391.7 mmol) of the intermediate product (L) and 61.1 g (587.6 mmol) of malonic acid were dissolved in a 358 mL of phosphorus oxychloride ($POCl_3$) solvent and reacted at 140° C. for 4 hours. The obtained reactant was poured into ice water and filtered. The formed solid was rinsed with water and sodium hydrogen carbonate saturated aqueous solution. The obtained solid mixture was dissolved in 3,000 ml of toluene by filtering and concentrated using a rotary evaporator. 1,000 ml of hexane was added, followed by recrystallizing and drying to provide a pale yellow solid of an intermediate product (M) in 82.0 g (yield: 56%).

Third Step: Synthesis of Intermediate Product (N)

80.0 g (213.8 mmol) of the intermediate product (M), 36.8 g (213.8 mmol) of 2-naphthaleneboronic acid, and 7.4 g (6.4 mmol) of tetrakis(triphenylphosphine)palladium $[Pd(PPh_3)_4]$ were dissolved in 1600 mL of a tetrahydrofuran (THF) solvent. A solution in which 59.1 g (427.5 mmol) of potassium carbonate ($K_2CO_3$) was dissolved in 800 ml of water was added thereto, and then they were reacted at 70° C. for 12 hours. The solvent was removed under a reduced pressure, and the reaction product was rinsed with water and methanol. The residues were recrystallized with monochlorobenzene, precipitated crystals were separated by a filter, rinsed with monochlorobenzene, and dried to provide a white solid of an intermediate product (N) in 82.1 g (yield: 82%).

Fourth Step: Synthesis of Compound Represented by Chemical Formula A27

11.0 g (23.6 mmol) of the intermediate product (N), 9.4 g (28.3 mmol) of 2-(4-(4,4,5,5-tetramethyl-1,3,2-dioxaborolan-2-yl)phenyl)quinoline and 0.8 g (0.7 mmol) of tetrakis (triphenylphosphine)palladium $[Pd(PPh_3)_4]$ were dissolved in a 330 mL of a tetrahydrofuran (THF) solvent. A solution in which 6.5 g (47.2 mmol) of potassium carbonate ($K_2CO_3$) was dissolved in 110 ml of water was added thereto, and they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of the compound in 14.0 g (yield: 93%). (calculation value: 634.77, measurement value: MS[M+1] 635.08)

EXAMPLE A-2

Synthesis of Compound Represented by Chemical Formula A29

As an example of the compound for an organic optoelectronic device, the compound represented by the above Chemical Formula A29 was synthesized in accordance with the following Reaction Scheme 12.

[Reaction Scheme 12]

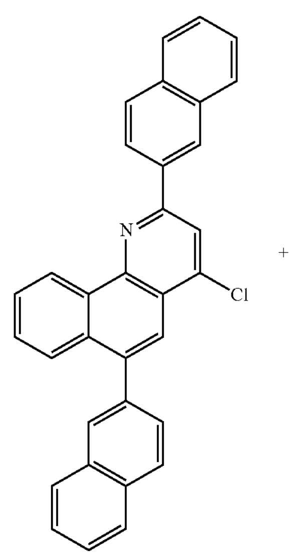

(N)

-continued

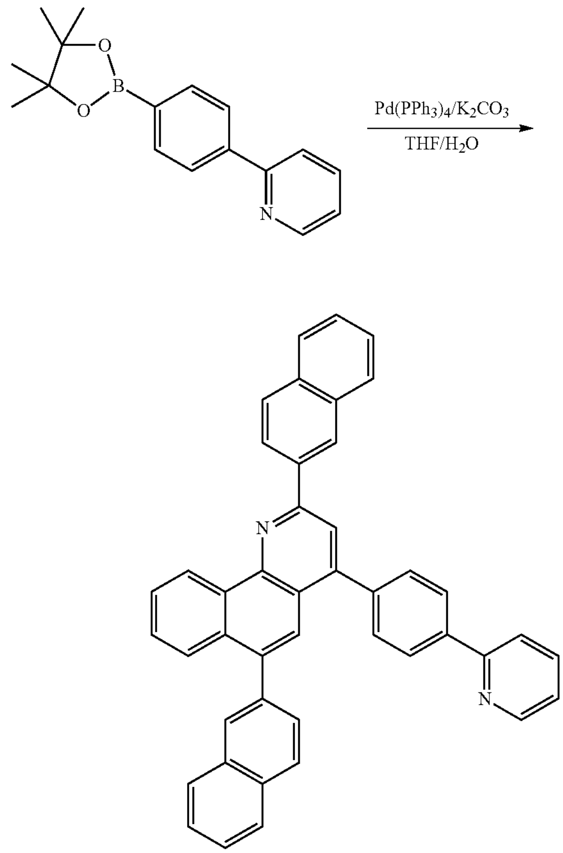

15.0 g (32.2 mmol) of the intermediate product (N), 10.9 g (38.6 mmol) of 2-(4-(4,4,5,5-tetramethyl-1,3,2-dioxaborolan-2-yl)phenyl)pyridine, and 1.1 g (1.0 mmol) of tetrakis (triphenylphosphine)palladium [$Pd(PPh_3)_4$] were dissolved in 300 mL of a tetrahydrofuran (THF) solvent. A solution in which 8.9 g (64.4 mmol) of potassium carbonate ($K_2CO_3$) was dissolved in 100 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 16.5 g (yield: 88%). (calculation value: 584.71, measurement value: MS[M+1] 585.01)

EXAMPLE A-3

Synthesis of Compound Represented by Chemical Formula A30

As an example of the compound for an organic optoelectronic device, the compound represented by the above Chemical Formula A30 was synthesized in accordance with the following Reaction Scheme 13.

[Reaction Scheme 13]

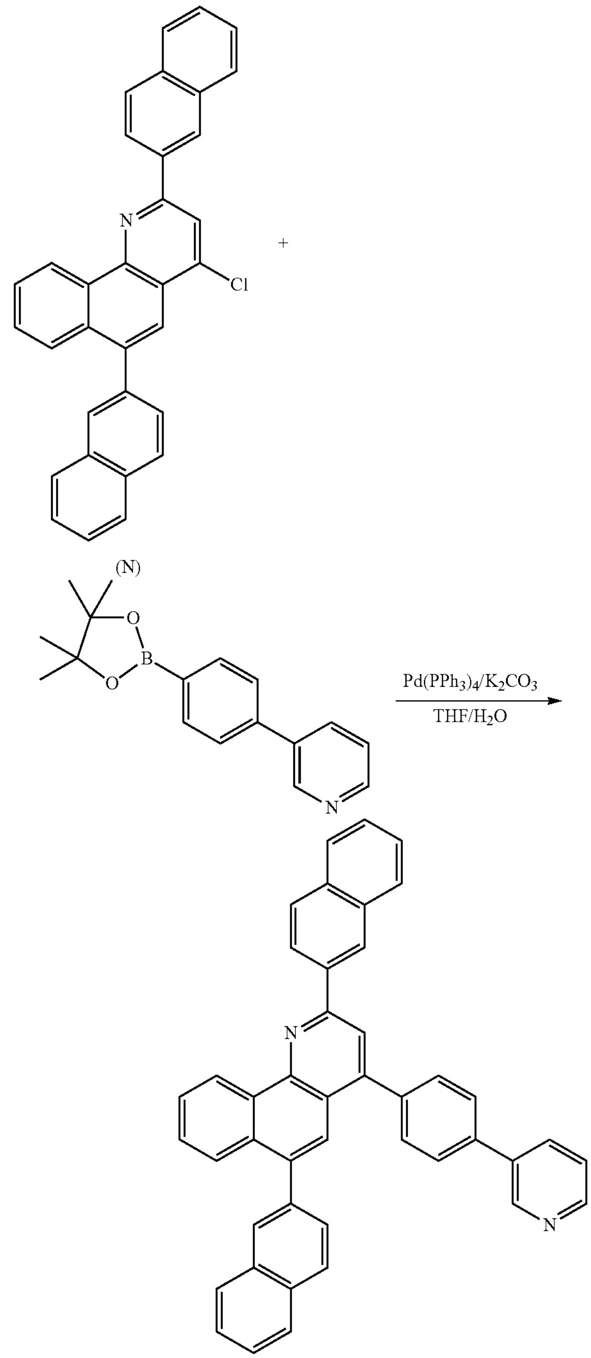

15.0 g (32.2 mmol) of the intermediate product (N), 10.9 g (38.6 mmol) of 3-(4-(4,4,5,5-tetramethyl-1,3,2-dioxaborolan-2-yl)phenyl)pyridine, and 1.1 g (1.0 mmol) of tetrakis (triphenylphosphine)palladium [$Pd(PPh_3)_4$] were dissolved in 300 mL of a tetrahydrofuran (THF) solvent. A solution in which 8.9 g (64.4 mmol) of potassium carbonate ($K_2CO_3$) was dissolved in 100 ml of water was added thereto, and they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 17.2 g (yield: 91%). (calculation value: 584.71, measurement value: MS[M+1] 585.01)

EXAMPLE A-4

Synthesis of Compound Represented by Chemical Formula A31

As an example of the compound for an organic optoelectronic device, the compound represented by the above Chemical Formula A31 was synthesized in accordance with the following Reaction Scheme 14.

[Reaction Scheme 14]

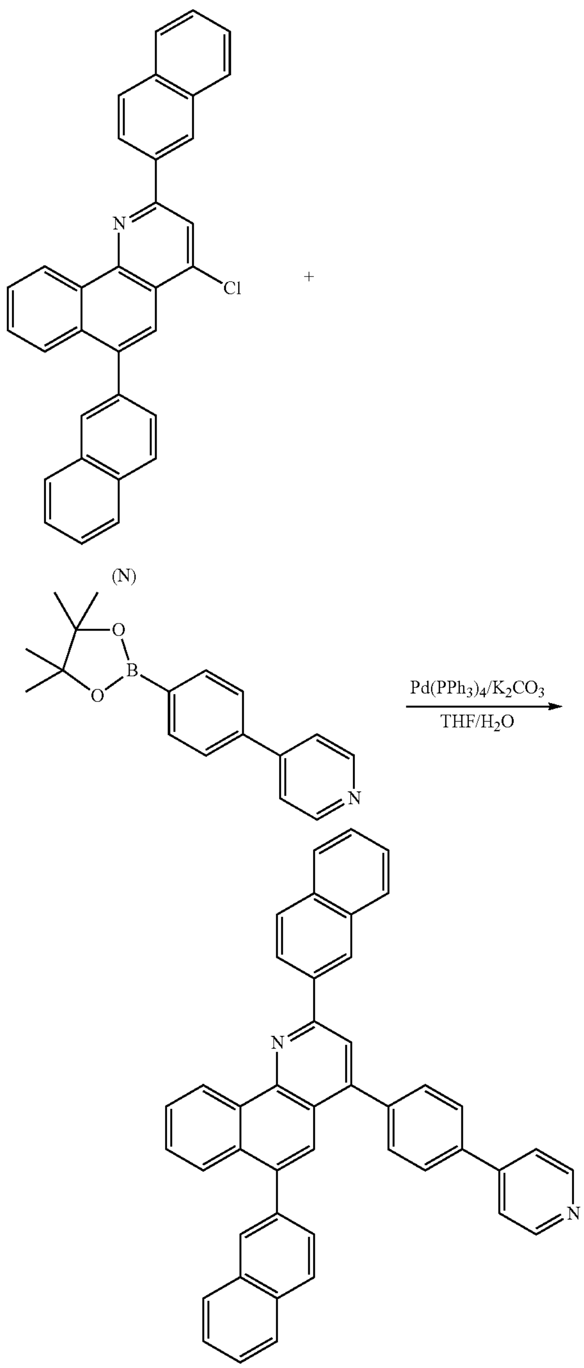

15.0 g (32.2 mmol) of the intermediate product (N), 10.9 g (38.6 mmol) of 4-(4-(4,4,5,5-tetramethyl-1,3,2-dioxaborolan-2-yl)phenyl)pyridine, and 1.1 g (1.0 mmol) of tetrakis (triphenylphosphine)palladium [$Pd(PPh_3)_4$] were dissolved in 300 mL of a tetrahydrofuran (THF) solvent. A solution in which 8.9 g (64.4 mmol) of potassium carbonate ($K_2CO_3$) was dissolved in 100 ml of water was added thereto, and they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 17.0 g (yield: 90%). (calculation value: 584.71, measurement value: MS[M+1] 585.01)

EXAMPLE A-5

Synthesis of Compound Represented by Chemical Formula A33

As an example of the compound for an organic optoelectronic device, the compound represented by the above Chemical Formula A33 was synthesized in accordance with the following Reaction Scheme 15.

[Reaction Scheme 15]

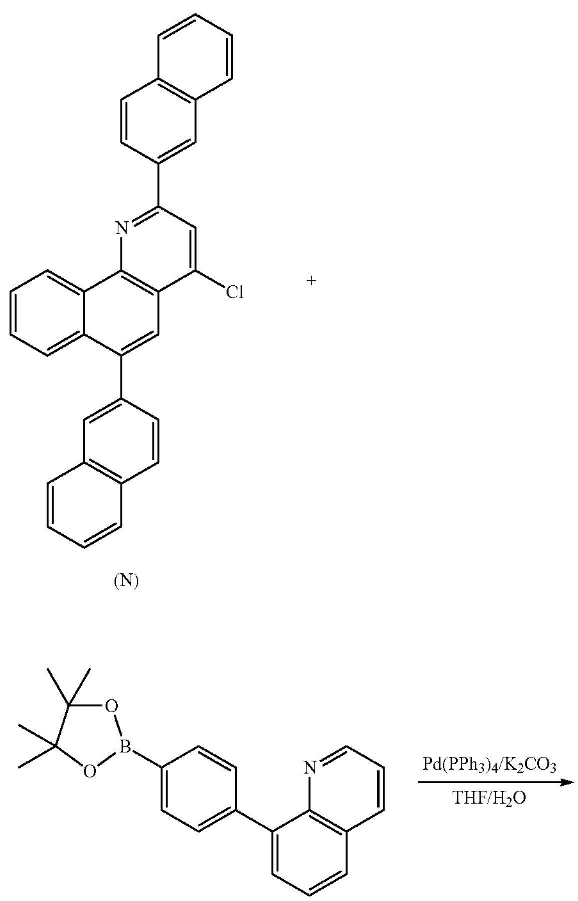

-continued

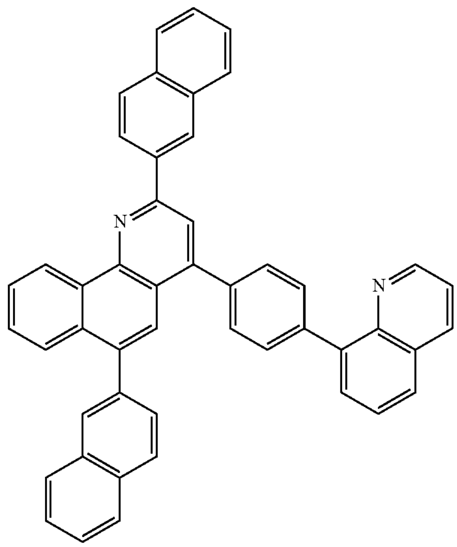

16.0 g (34.3 mmol) of the intermediate product (N), 13.6 g (41.2 mmol) of 8-(4-(4,4,5,5-tetramethyl-1,3,2-dioxaborolan-2-yl)phenyl)quinolinem, and 1.2 g (1.0 mmol) of tetrakis (triphenylphosphine)palladium [$Pd(PPh_3)_4$] were dissolved in 320 mL of a tetrahydrofuran (THF) solvent. A solution in which 9.5 g (68.7 mmol) of potassium carbonate ($K_2CO_3$) was dissolved in 180 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 20.0 g (yield: 83%). (calculation value: 634.77, measurement value: MS[M+1] 635.07)

EXAMPLE A-6

Synthesis of Compound Represented by Chemical Formula A43

As an example of the compound for an organic optoelectronic device, the compound represented by the above Chemical Formula A43 was synthesized in accordance with the following Reaction Scheme 16.

[Reaction Scheme 16]

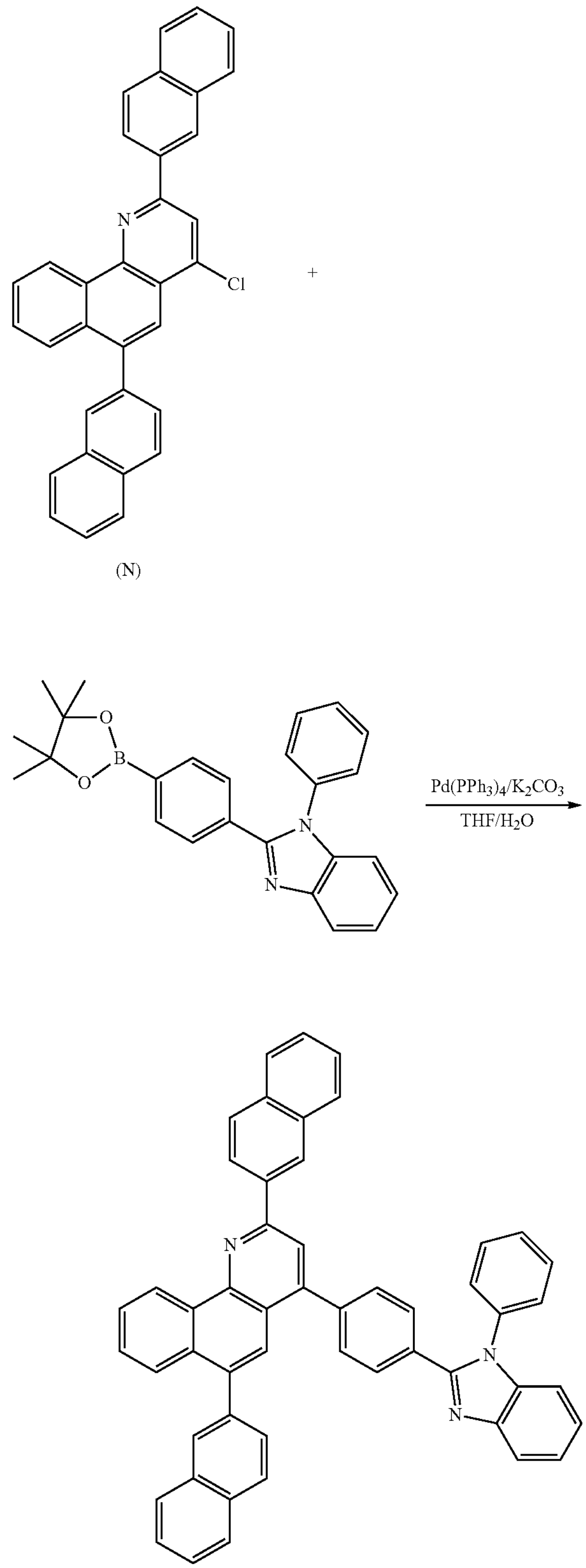

16.0 g (34.3 mmol) of the intermediate product (N), 16.3 g (41.2 mmol) of 1-phenyl-2-(4-(4,4,5,5-tetramethyl-1,3,2-dioxaborolan-2-yl)phenyl)-1H-benzoimidazole, and 1.2 g (1.0 mmol) of tetrakis(triphenylphosphine)palladium [Pd $(PPh_3)_4$] were dissolved in 320 mL of a tetrahydrofuran (THF) solvent. A solution in which 9.5 g (68.7 mmol) of potassium carbonate ($K_2CO$) was dissolved in 160 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 16.6 g (yield: 69%). (calculation value: 699.84, measurement value: MS[M+1] 700.14)

EXAMPLE A-7

Synthesis of Compound Represented by Chemical Formula A44

As an example of the compound for an organic optoelectronic device, the compound represented by the above Chemical Formula A44 was synthesized in accordance with the following Reaction Scheme 17.

[Reaction Scheme 17]

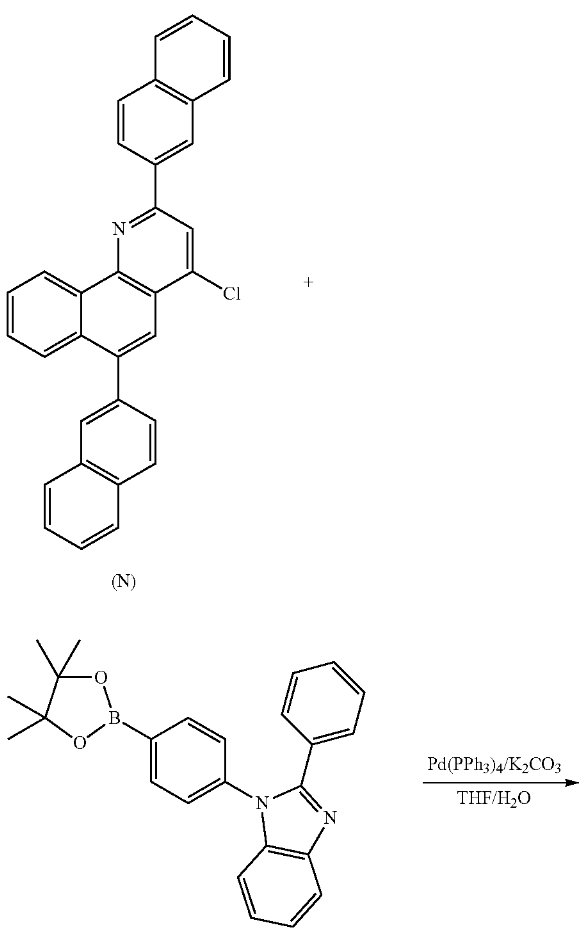

-continued

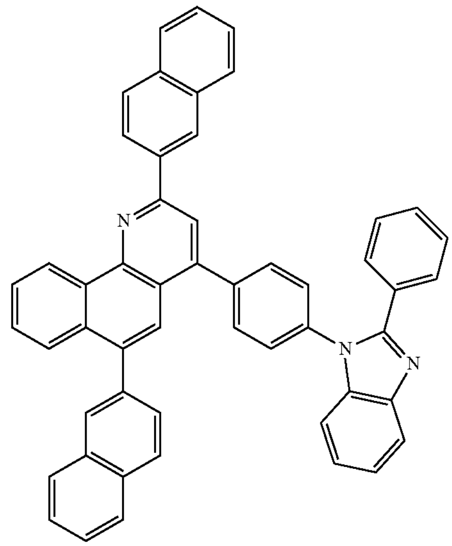

16.0 g (34.3 mmol) of the intermediate product (N), 16.3 g (41.2 mmol) of 2-phenyl-1-(4-(4,4,5,5-tetramethyl-1,3,2-dioxaborolan-2-yl)phenyl)-1H-benzoimidazole, and 1.2 g (1.0 mmol) of tetrakis(triphenylphosphine)palladium [Pd $(PPh_3)_4$] were dissolved in 320 mL of a tetrahydrofuran (THF) solvent. A solution in which 9.5 g (68.7 mmol) of potassium carbonate ($K_2CO_3$) was dissolved in 160 ml of water was added thereto, and they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 23.0 g (yield: 96%). (calculation value: 699.84, measurement value: MS [M+1] 700.14)

EXAMPLE A-8

Synthesis of Compound Represented by Chemical Formula A142

As an example of the compound for an organic optoelectronic device, the compound represented by the above Chemical Formula A142 was synthesized through 4 step processes in accordance with the following Reaction Scheme 18.

[Reaction Scheme 18]

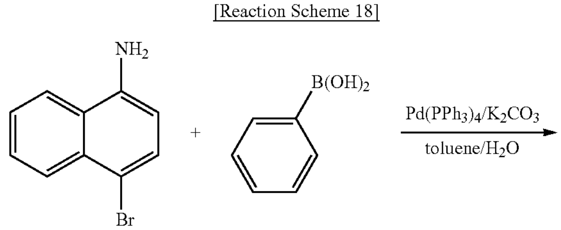

-continued

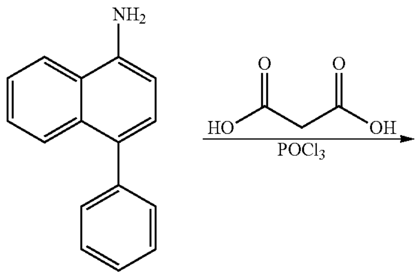

(O)

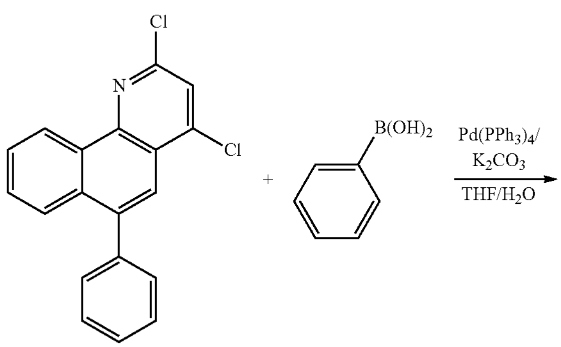

(P)

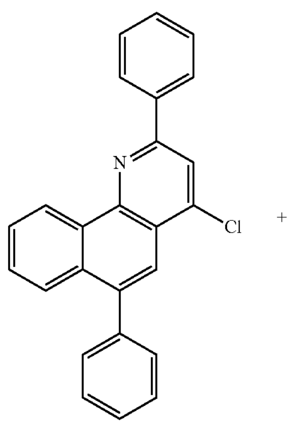

(Q)

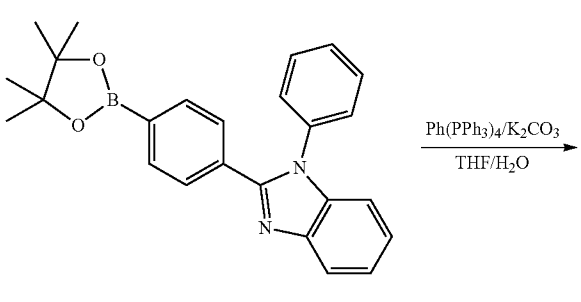

-continued

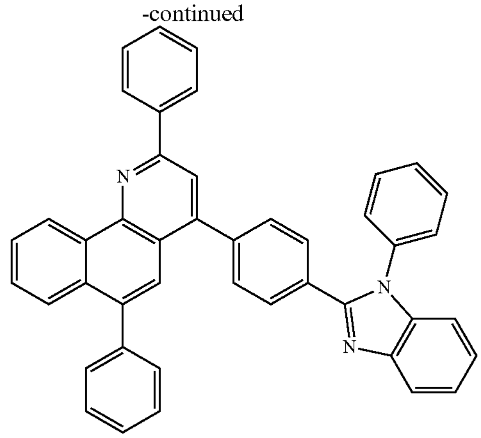

First Step: Synthesis of Intermediate Product (O)

100.0 g (450.3 mmol) of 1-amino-4-bromonaphthalene, 56.9 g (540.4 mmol) of phenylboronic acid, and 13.0 g (11.3 mmol) of tetrakis(triphenylphosphine)palladium [Pd $(PPh_3)_4$] were dissolved in 3,000 mL of a toluene solvent. A solution in which 124.5 g (900.6 mmol) of potassium carbonate ($K_2CO_3$) was dissolved in 1,000 ml of water was added thereto, and then they were reacted at 100° C. for 12 hours. The aqueous layer of the reaction was removed, the solvent was removed under reduced pressure, and the reaction product was rinsed with water and methanol. The obtained solid mixture was rinsed with hexane two times to provide a yellow solid of an intermediate product (O) in 72.0 g (yield: 73%).

Second Step: Synthesis of Intermediate Product (P)

72.0 g (328.4 mmol) of the intermediate product (O), and 51.3 g (492.4 mmol) of malonic acid were dissolved in 300 ml of phosphorus oxychloride ($POCl_3$) and reacted at 140° C. for 4 hours. The obtained reactant was poured into ice water and filtered. The formed solid was rinsed with water and sodium hydrogen carbonate saturated aqueous solution. The obtained solid mixture was dissolved in 3,000 ml of toluene followed by filtering and then concentrated using a rotary evaporator. 1,000 ml of hexane was added, followed by recrystallizing and drying to provide a pale yellow solid of an intermediate product (P) in 56.6 g (yield: 53%).

Third Step: Synthesis of Intermediate Product (O)

55.0 g (169.7 mmol) of the intermediate product (P), 20.7 g (169.7 mmol) of phenylboronic acid, and 5.9 g (5.1 mmol) of tetrakis(triphenylphosphine)palladium [$Pd(PPh_3)_4$] were dissolved in 1,100 ml of a tetrahydrofuran (THF) solvent. A solution in which 46.9 g (339.3 mmol) of potassium carbonate ($K_2CO_3$) was dissolved in 550 ml of water was added thereto, and then they were reacted at 70° C. for 12 hours. The solvent was removed under a reduced pressure, and the reaction product was rinsed with water and methanol. The obtained solid mixture was rinsed with hexane two times to provide a yellow solid of an intermediate product (O) in 52.2 g (yield: 84%).

Fourth Step: Synthesis of Compound Represented by Chemical Formula A142

16.0 g (43.7 mmol) of the intermediate product (O), 20.8 g (52.5 mmol) of 1-phenyl-2-(4-(4,4,5,5-tetramethyl-1,3,2-dioxaborolan-2-yl)phenyl)-1H-benzoimidazole, and 1.5 g (1.3 mmol) of tetrakis(triphenylphosphine)palladium [Pd $(PPh_3)_4$] were dissolved in 320 ml of a tetrahydrofuran (THF) solvent. A solution in which 24.2 g (174.9 mmol) of potassium carbonate ($K_2CO_3$) was dissolved in 160 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 24.0 g (yield: 91%). (calculation value: 599.72, measurement value: MS[M+1] 600.02)

EXAMPLE A-9

Synthesis of Compound Represented by Chemical Formula A144

As an example of the compound for an organic optoelectronic device, the compound represented by the above Chemical Formula A144 was synthesized in accordance with the following Reaction Scheme 19.

[Reaction Scheme 19]

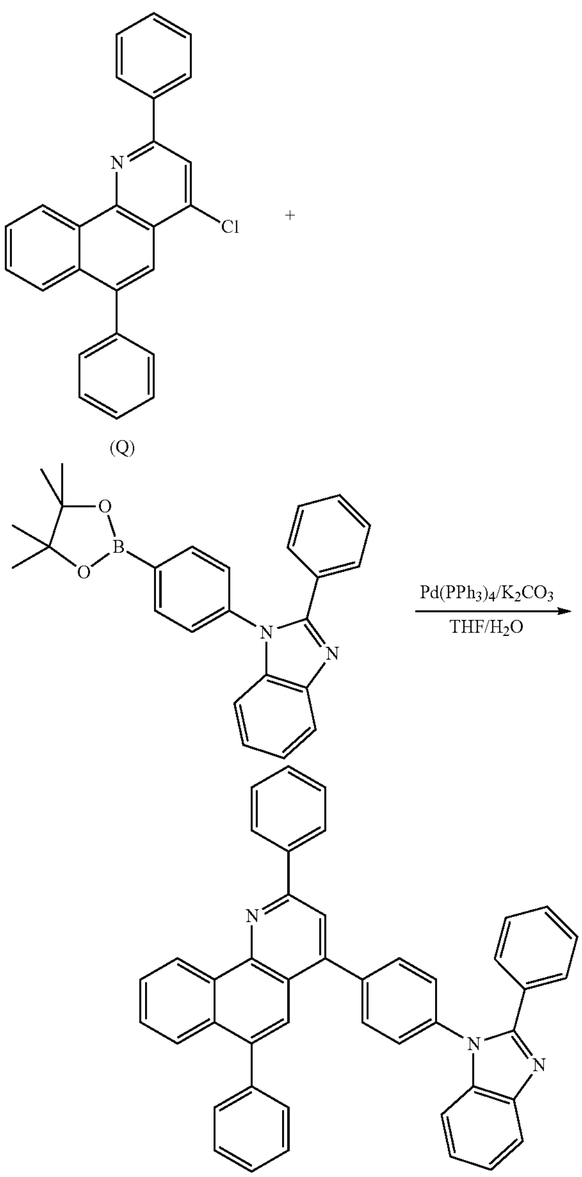

16.0 g (43.7 mmol) of the intermediate product (O), 20.8 g (52.5 mmol) of 2-phenyl-1-(4-(4,4,5,5-tetramethyl-1,3,2-dioxaborolan-2-yl)phenyl)-1H-benzoimidazole, and 1.5 g (1.3 mmol) of tetrakis(triphenylphosphine)palladium[Pd(PPh$_3$)$_4$] were dissolved in 320 mL of a tetrahydrofuran (THF) solvent. A solution in which 24.2 g (174.9 mmol) of potassium carbonate ($K_2CO_3$) was dissolved in 160 ml of water was added thereto, and then they were reacted at 90° C. for 12 hours. The solvent was removed under a reduced pressure, and the reaction product was rinsed with water and methanol. The residues were recrystallized with monochlorobenzene, precipitated crystals were separated by a filter, rinsed with monochlorobenzene, and dried to provide a white solid of a compound in 21.7 g (yield: 83%). (calculation value: 599.72, measurement value: MS[M+1] 600.02)

EXAMPLE A-10

Synthesis of Compound Represented by Chemical Formula A156

As an example of the compound for an organic optoelectronic device, the compound represented by the above Chemical Formula A156 was synthesized through 4 step processes in accordance with the following Reaction Scheme 20.

[Reaction Scheme 20]

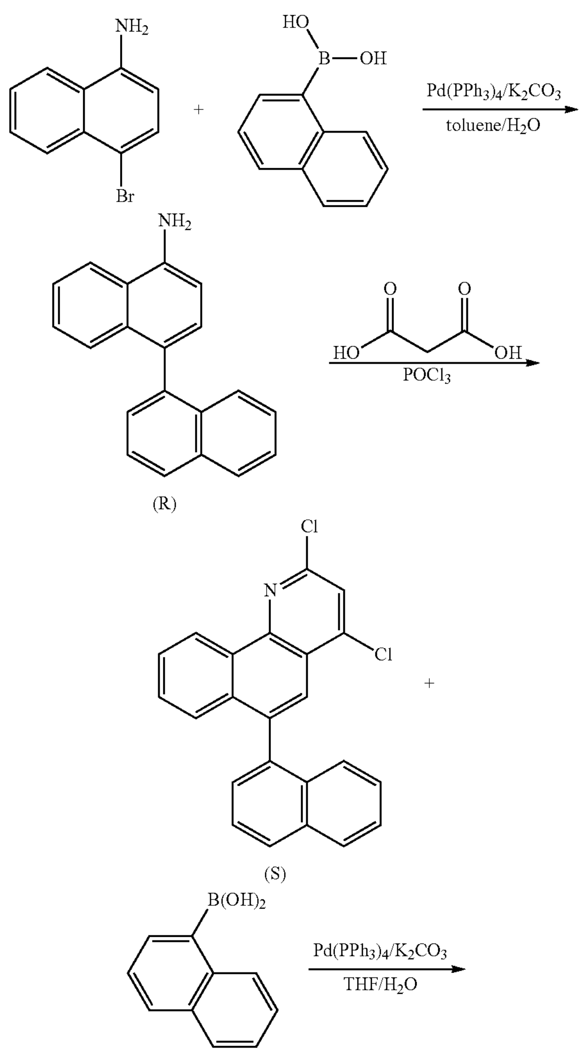

-continued

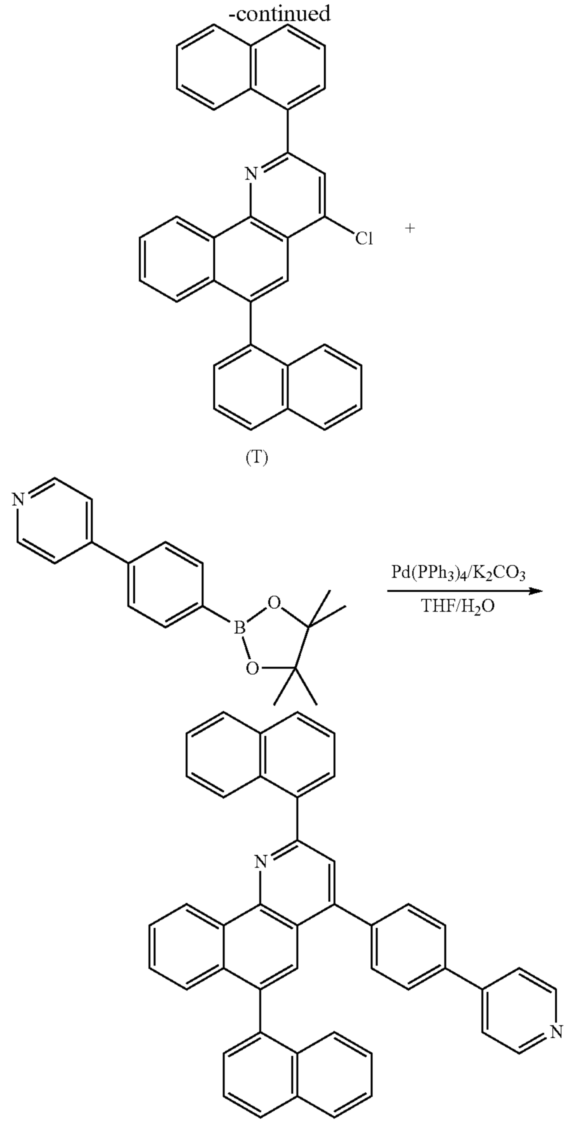

First Step: Synthesis of Intermediate Product (R)

100.0 g (450.3 mmol) of 1-amino-4-bromonaphthalene, 92.9 g (540.4 mmol) of 1-naphthaleneboroic acid, and 13.4 g (11.3 mmol) of tetrakis(triphenylphosphine)palladium [Pd $(PPh_3)_4$] were dissolved in 3,000 mL of a toluene solvent. A solution in which 124.5 g (900.6 mmol) of potassium carbonate ($K_2CO_3$) was dissolved in 1,000 ml of water was added thereto, and then they were reacted at 100° C. for 12 hours. The aqueous layer of the reaction was removed, the solvent was removed under reduced pressure, and the reaction product was rinsed with water and methanol. The obtained solid mixture was rinsed with hexane two times to provide a yellow solid of an intermediate product (L) in 100.0 g (yield: 82%).

Second Step: Synthesis of Intermediate Product (S)

102.0 g (378.7 mmol) of the intermediate product (R) and 59.1 g (568.1 mmol) of malonic acid were dissolved in 346 ml of phosphorus oxychloride ($POCl_3$) and reacted at 140° C. for 4 hours. The obtained reactant was poured into ice water and filtered. The formed solid was rinsed with water and sodium hydrogen carbonate saturated aqueous solution. The obtained solid mixture was dissolved in 3,000 ml of toluene followed by filtering and then concentrated using a rotary evaporator. 1,000 ml of hexane was added followed by recrystallizing and drying to provide a pale yellow solid of an intermediate product (S) in 51.5 g (yield: 36%).

Third Step: Synthesis of Intermediate Product (T)

50.0 g (133.6 mmol) of the intermediate product (S), 23.0 g (133.6 mmol) of 1-naphthaleneboroic acid, and 4.6 g (4.0 mmol) of tetrakis(triphenylphosphine)palladium [Pd $(PPh_3)_4$] were dissolved in 1,000 ml of a tetrahydrofuran (THF) solvent. A solution in which 36.9 g (267.2 mmol) of potassium carbonate ($K_2CO_3$) was dissolved in 500 ml of water was added thereto, and then they were reacted at 70° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of an intermediate product (T) in 49.8 g (yield: 80%).

Fourth Step: Synthesis of Compound Represented by Chemical Formula A156

20.0 g (23.6 mmol) of the intermediate product (N), 18.1 g (64.4 mmol) of 4-(4-(4,4,5,5-tetramethyl-1,3,2-dioxaborolan-2-yl)phenyl)pyridine, and 1.5 g (1.3 mmol) of tetrakis (triphenylphosphine)palladium [$Pd(PPh_3)_4$] were dissolved in 400 ml of a tetrahydrofuran (THF) solvent. A solution in which 11.9 g (85.8 mmol) of potassium carbonate ($K_2CO_3$) was dissolved in 200 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 16.0 g (yield: 64%). (calculation value: 584.71, measurement value: MS[M+1] 585.01)

EXAMPLE A-11

Synthesis of Compound Represented by Chemical Formula A158

As an example of the compound for an organic optoelectronic device, the compound represented by the above Chemical Formula A158 was synthesized in accordance with the following Reaction Scheme 21.

[Reaction Scheme 21]

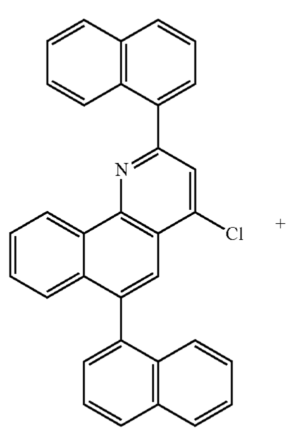

(T)

-continued

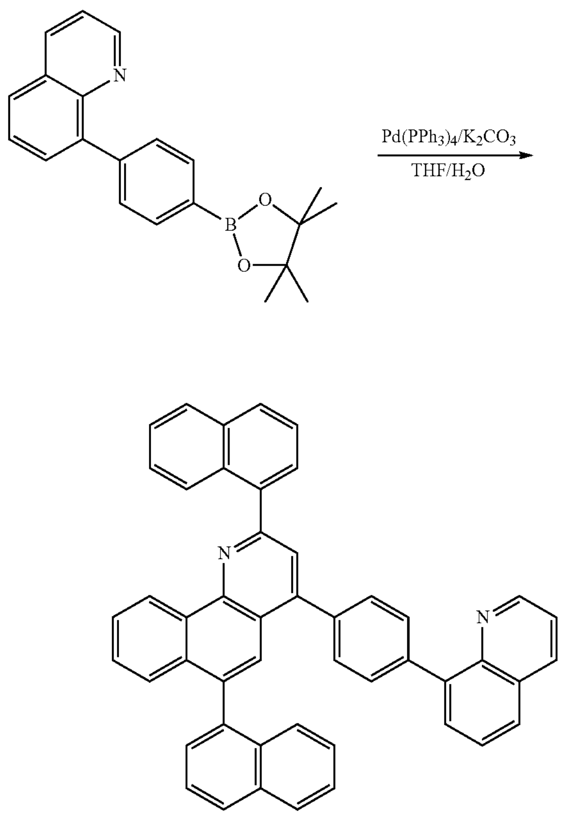

15.0 g (32.2 mmol) of the intermediate product (T), 8.9 g (48.3 mmol) of 8-(4-(4,4,5,5-tetramethyl-1,3,2-dioxaborolan-2-yl)-phenyl)quinoline, and 1.1 g (1.0 mmol) of tetrakis (triphenylphosphine)palladium [Pd($PPh_3$)$_4$] were dissolved in 300 mL of a tetrahydrofuran (THF) solvent. A solution in which 8.9 g (64.4 mmol) of potassium carbonate ($K_2CO_3$) was dissolved in 150 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 15.5 g (yield: 76%). (calculation value: 634.77, measurement value: MS[M+1] 635.07)

EXAMPLE A-12

Synthesis of Compound Represented by Chemical Formula A185

As an example of the compound for an organic optoelectronic device, the compound represented by the above Chemical Formula A185 was synthesized in accordance with the following Reaction Scheme 22.

[Reaction Scheme 22]

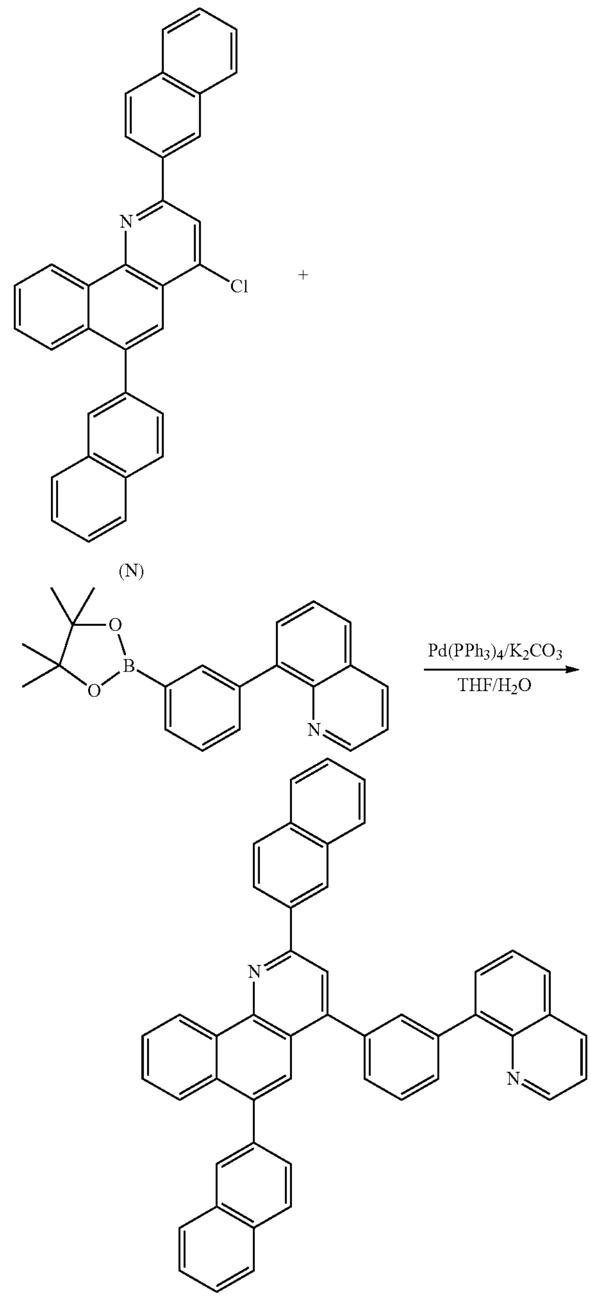

15.0 g (32.2 mmol) of the intermediate product (N), 8-(3-(4,4,5,5-tetramethyl-1,3,2-dioxaborolan-2-yl)phenyl)quinoline 12.8 g (38.6 mmol) and tetrakis(triphenylphosphine)palladium[Pd $PPh_{34}$] 1.9 g (1.6 mmol) were dissolved in 300 mL of a tetrahydrofuran (THF) solvent. A solution in which 17.8 g (128.8 mmol) of potassium carbonate ($K_2CO_3$) was dissolved in 150 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 18.2 g (yield: 89%). (calculation value: 634.77, measurement value: MS[M+1] 635.07)

EXAMPLE A-13

Synthesis of Compound Represented by Chemical Formula A182

As an example of the compound for an organic optoelectronic device, the compound represented by the above Chemical Formula A182 was synthesized in accordance with the following Reaction Scheme 23.

[Reaction Scheme 23]

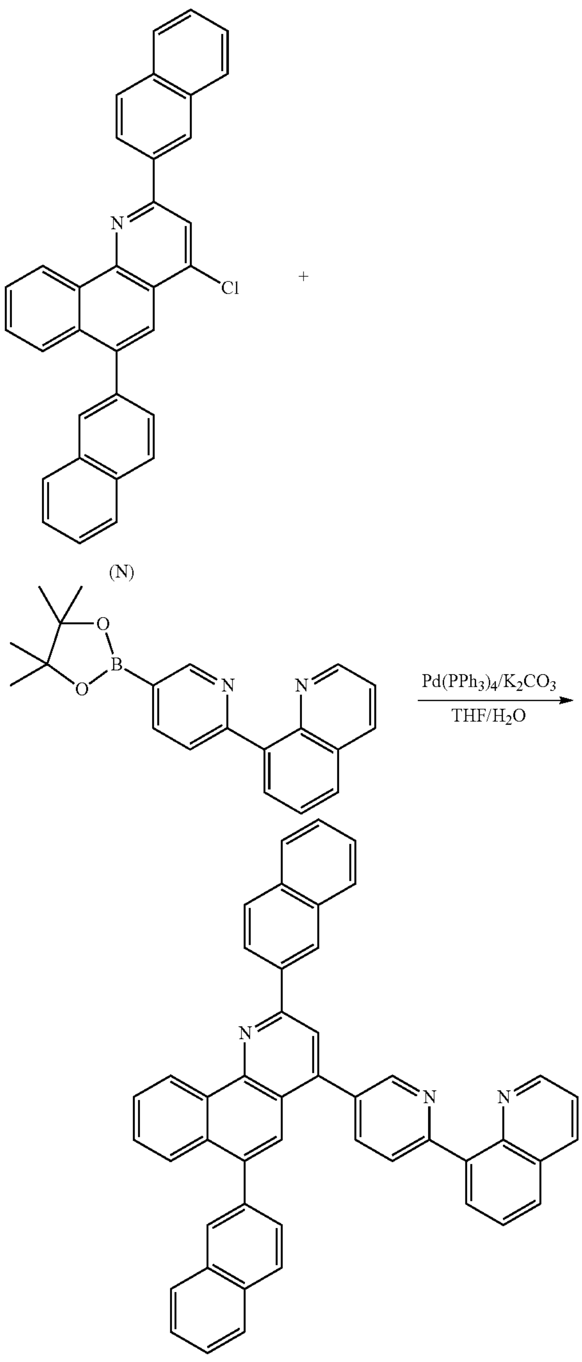

10.0 g (21.5 mmol) of the intermediate product (N), 8.6 g (25.8 mmol) of 8-(5-(4,4,5,5-tetramethyl-1,3,2-dioxaborolan-2-yl)-pyridin-2-yl)quinoline, and 1.2 g (1.1 mmol) of tetrakis(triphenylphosphine)palladium [$Pd(PPh_3)_4$] were dissolved in 200 ml of a tetrahydrofuran (THF) solvent. A solution in which 11.9 g (85.8 mmol) of potassium carbonate ($K_2CO_3$) was dissolved in 100 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 11.3 g (yield: 83%). (calculation value: 635.75, measurement value: MS[M+1] 636.05)

EXAMPLE A-14

Synthesis of Compound Represented by Chemical Formula A41

As an example of the compound for an organic optoelectronic device, the compound represented by the above Chemical Formula A41 was synthesized in accordance with the following Reaction Scheme 24.

[Reaction Scheme 24]

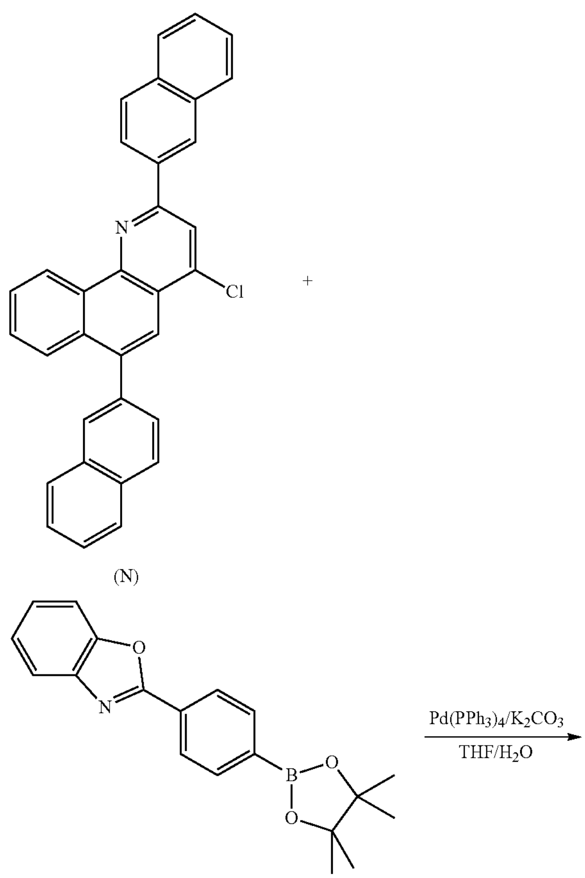

-continued

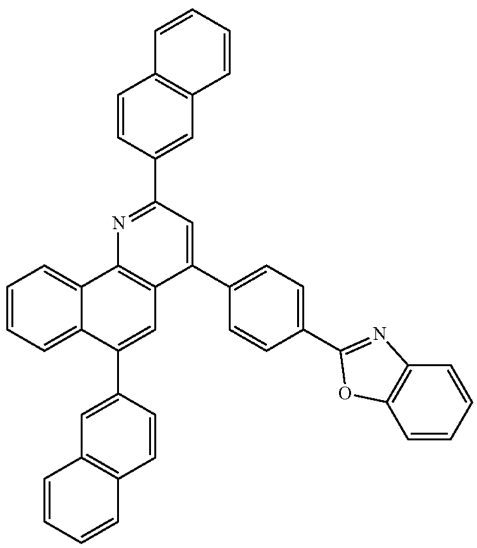

18.0 g (38.6 mmol) of the intermediate product (N), 14.9 g (46.4 mmol) of 2-(4-(4,4,5,5-tetramethyl-1,3,2-dioxaborolan-2-yl)-phenyl)benzooxazole, and 1.3 g (1.2 mmol) of tetrakis(triphenylphosphine)palladium [$Pd(PPh_3)_4$] were dissolved in 360 ml of a tetrahydrofuran (THF) solvent. A solution in which 21.4 g (154.5 mmol) of potassium carbonate ($K_2CO_3$) was dissolved in 180 ml of water was added thereto, and then they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 21.0 g (yield: 87%). (calculation value: 624.73, measurement value: MS[M+1] 625.03)

EXAMPLE A-15

Synthesis of Compound Represented by Chemical Formula A180

As an example of the compound for an organic optoelectronic device, the compound represented by the above Chemical Formula A180 was synthesized in accordance with the following Reaction Scheme 25.

[Reaction Scheme 25]

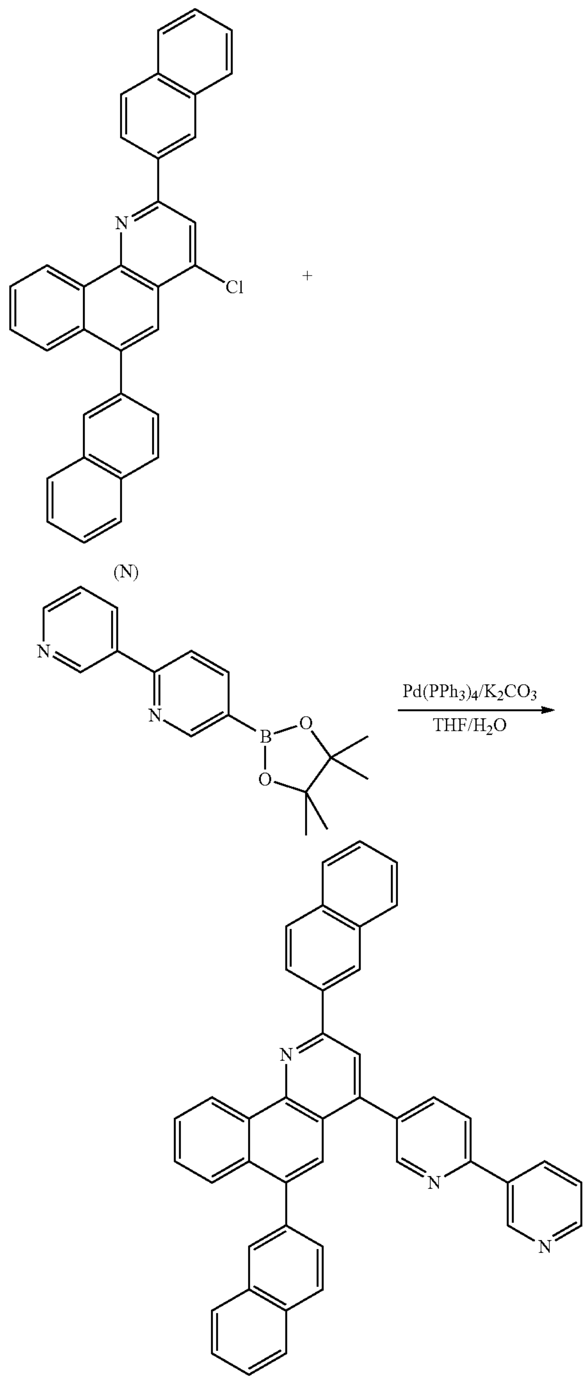

18.0 g (38.6 mmol) of the intermediate product (N), 13.1 g (46.4 mmol) of 3-(5-(4,4,5,5-tetramethyl-1,3,2-dioxaborolan-2-yl)-pyridin-2-yl)pyridine, and 1.3 g (1.2 mmol) of tetrakis(triphenylphosphine)palladium [$Pd(PPh_3)_4$] were dissolved in 360 ml of a tetrahydrofuran (THF) solvent. A solution in which 21.4 g (154.5 mmol) of potassium carbonate ($K_2CO_3$) was dissolved in 180 ml of water was added thereto, and then they were reacted at 90° C. for 12 hours. The solvent was removed under a reduced pressure, and the reaction product rinsed with water and methanol. The residues were recrystallized with toluene, precipitated crystals were separated by a filter, rinsed with toluene, and dried to provide a white solid of a compound in 21.0 g (yield: 93%). (calculation value: 585.69, measurement value: MS[M+1] 585.99)

EXAMPLE A-16

Synthesis of Compound Represented by Chemical Formula A188

As an example of the compound for an organic optoelectronic device, the compound represented by the above Chemical Formula A188 was synthesized through 2 step processes in accordance with the following Reaction Scheme 26.

[Reaction Scheme 26]

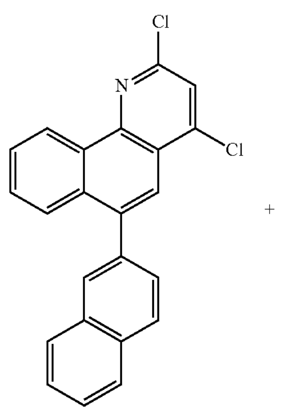

(M)

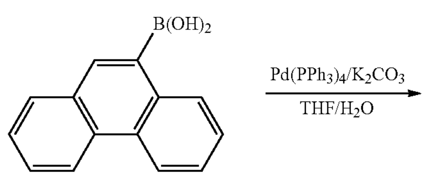

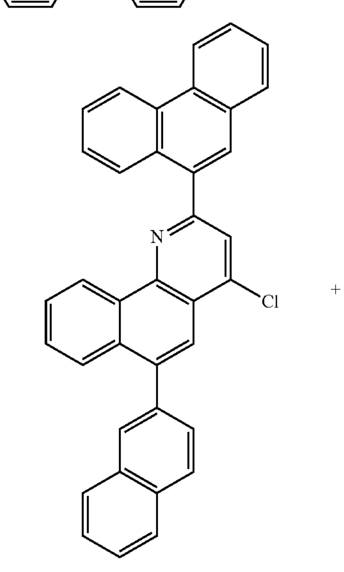

(U)

-continued

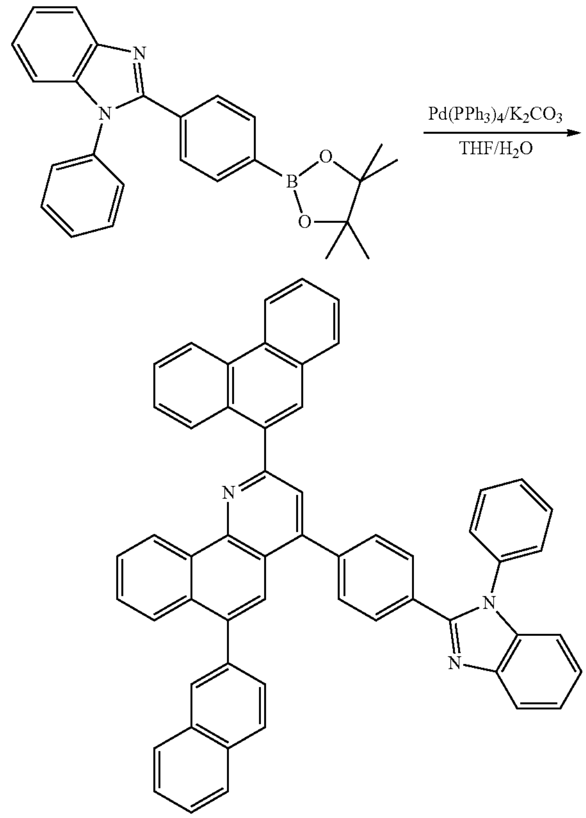

First Step: Synthesis of Intermediate Product (U)

50.0 g (133.6 mmol) of the intermediate product (M), 29.7 g (133.6 mmol) of 9-phenanthreneboroic acid, and 4.6 g (4.0 mmol) of tetrakis(triphenylphosphine)palladium [Pd $(PPh_3)_4$] were dissolved in 1000 ml of a tetrahydrofuran (THF) solvent. A solution in which 36.9 g (267.2 mmol) of potassium carbonate ($K_2CO_3$) was dissolved in 500 ml of water was added thereto, and then they were reacted at 70° C. for 12 hours. The solvent was removed under a reduced pressure, and the reaction product was rinsed with water and methanol. The residues were recrystallized with monochlorobenzene, precipitated crystals were separated by a filter, rinsed with monochlorobenzene, and dried to provide a white solid of an intermediate product (U) in 55.8 g (yield: 81%).

Second Step: Synthesis of Compound Represented by Chemical Formula A188

18.0 g (34.9 mmol) of the intermediate product (U), 16.6 g (41.9 mmol) of 1-phenyl-2-(4-(4,4,5,5-tetramethyl-1,3,2-dioxaborolan-2-yl)phenyl)-1H-benzoimidazole, and 1.2 g (1.1 mmol) of tetrakis(triphenylphosphine)palladium [Pd $(PPh_3)_4$] were dissolved in 360 ml of a tetrahydrofuran (THF) solvent. A solution in which 19.3 g (139.5 mmol) of potassium carbonate ($K_2CO_3$) was dissolved in 180 ml of water was added thereto, and then they were reacted at 90° C. for 12 hours. The solvent was removed under a reduced pressure, and the reaction product was rinsed with water and methanol. The residues were recrystallized with monochlorobenzene, precipitated crystals were separated by a filter, rinsed with monochlorobenzene, and dried to provide a white solid of a compound in 21.0 g (yield: 80%). (calculation value: 749.90, measurement value: MS[M+1] 750.20)

EXAMPLE A-17

Synthesis of Compound Represented by Chemical Formula A189

As an example of the compound for an organic optoelectronic device, the compound represented by the above Chemical Formula A189 was synthesized in accordance with the following Reaction Scheme 27.

[Reaction Scheme 27]

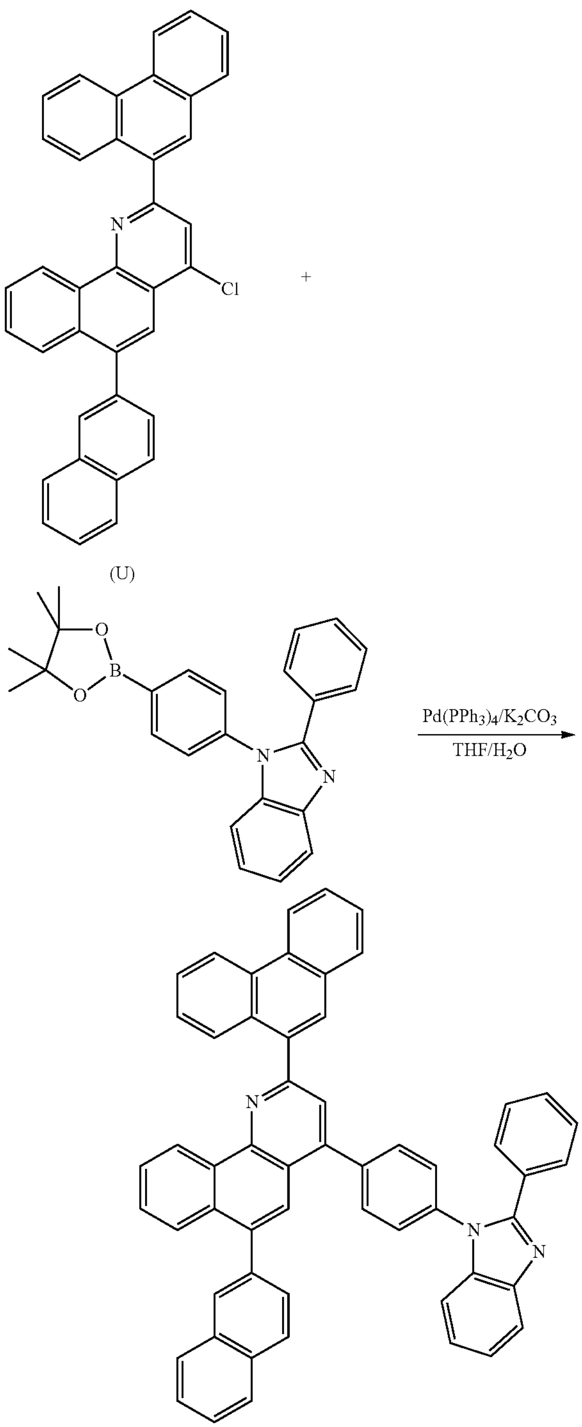

18.0 g (34.9 mmol) of the intermediate product (U), 16.6 g (41.9 mmol) of 2-phenyl-1-(4-(4,4,5,5-tetramethyl-1,3,2-dioxaborolan-2-yl)phenyl)-1H-benzoimidazole, and 1.2 g (1.1 mmol) of tetrakis(triphenylphosphine)palladium [$Pd(PPh_3)_4$] were dissolved in 320 mL of a tetrahydrofuran (THF) solvent. A solution in which 19.3 g (139.5 mmol) of potassium carbonate ($K_2CO_3$) was dissolved in 180 ml of water was added thereto, and they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 21.6 g (yield: 83%). (calculation value: 749.90, measurement value: MS[M+1] 750.20)

EXAMPLE A-18

Synthesis of Compound Represented by Chemical Formula A187

As an example of the compound for an organic optoelectronic device, the compound represented by the above Chemical Formula A187 was synthesized in accordance with the following Reaction Scheme 28.

[Reaction Scheme 28]

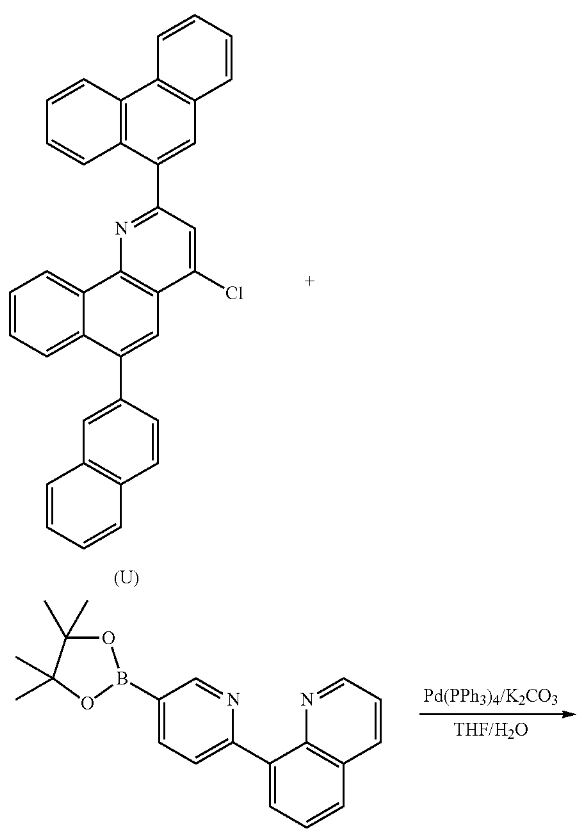

-continued

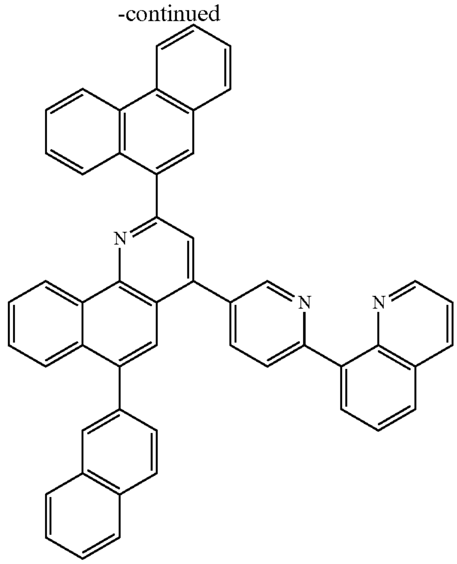

18.0 g (34.9 mmol) of the intermediate product (U), 13.9 g (41.9 mmol) of 8-(5-(4,4,5,5-tetramethyl-1,3,2-dioxaborolan-2-yl)-pyridin-2-yl)quinoline, and 1.2 g (1.1 mmol) of tetrakis(triphenylphosphine)palladium [$Pd(PPh_3)_4$] were dissolved in a 360 mL of a tetrahydrofuran (THF) solvent. A solution in which 19.3 g (139.5 mmol) of potassium carbonate ($K_2CO_3$) was dissolved in 180 ml of water was added thereto, and they were reacted at 90° C. for 12 hours. The solvent was removed under a reduced pressure, and the reaction product was rinsed with water and methanol. The residues were recrystallized with toluene, precipitated crystals were separated by a filter, rinsed with toluene, and dried to provide a white solid of a compound in 23.0 g (yield: 96%). (calculation value: 685.81, measurement value: MS[M+1] 686.11)

(Fabrication of Organic Light Emitting Diode)

EXAMPLE 11

As an anode, ITO having a thickness of 1,000 Å was used. As a cathode, aluminum (Al) having a thickness of 1,000 Å was used.

Specifically, organic light emitting diodes were fabricated as follows: an ITO glass substrate having sheet resistance of 15 Ω/cm$^2$ was cut to a size of 50 mm×50 mm×0.7 mm and was ultrasonic wave cleaned in acetone, isopropylalcohol, and pure water for 5 minutes each, and UV ozone cleaned for 30 minutes to provide an anode.

N1,N1'-(biphenyl-4,4'-diyl)bis(N1-(naphthalen-2-yl)-N4,N4-diphenylbenzene-1,4-diamine) was deposited on the glass substrate to a thickness of 10 nm, and N,N'-di(1-naphthyl)-N,N'-diphenylbenzidine was sequentially deposited to form a 40 nm-thick hole injection layer (HIL).

4 wt % of N,N,N',N'-tetrakis(3,4-dimethylphenyechrysene-6,12-diamine and 96 wt % of 9-(3-(naphthalen-1-yl)phenyl)-10-(naphthalen-2-yl)anthracene were deposited to provide a 25 nm-thick emission layer.

Subsequently, the compound synthesized in Example 1 was deposited to provide a 30 nm-thick electron transport layer (ETL).

Liq was vacuum-deposited on the electron transport layer (ETL) to provide a 0.5 nm-thick electron injection layer (EIL), and Al was vacuum-deposited to form a 100 nm-thick Liq/Al electrode.

EXAMPLE 12

An organic light emitting diode was fabricated in accordance with the same procedure as in Example 11, except that the compound synthesized in Example 3 was used for the electron transport layer (ETL), instead of using the compound synthesized from Example 1.

EXAMPLE 13

An organic light emitting diode was fabricated in accordance with the same procedure as in Example 11, except that the compound synthesized in Example 5 was used for the electron transport layer (ETL) instead of using the compound synthesized from Example 1.

EXAMPLE 14

An organic light emitting diode was fabricated in accordance with the same procedure as in Example 11, except that the compound synthesized in Example 7 was used for the electron transport layer (ETL) instead of using the compound synthesized from Example 1.

EXAMPLE 15

An organic light emitting diode was fabricated in accordance with the same procedure as in Example 11, except that the compound synthesized in Example 8 was used for the electron transport layer (ETL) instead of using the compound synthesized from Example 1.

EXAMPLE 16

An organic light emitting diode was fabricated in accordance with the same procedure as in Example 11, except that the compound synthesized in Example 9 was used for the electron transport layer (ETL) instead of using the compound synthesized from Example 1.

EXAMPLE 17

An organic light emitting diode was fabricated in accordance with the same procedure as in Example 11, except that the compound synthesized in Example 10 was used for the electron transport layer (ETL) instead of using the compound synthesized from Example 1.

EXAMPLE 18

An organic light emitting diode was fabricated in accordance with the same procedure as in Example 11, except that the compound synthesized in Example 1 and Liq at 1:1 (a ratio of weight) were deposited for the electron transport layer (ETL).

EXAMPLE 19

An organic light emitting diode was fabricated in accordance with the same procedure as in Example 11, except that the compound synthesized in Example 3 and Liq at 1:1 were deposited for the electron transport layer (ETL).

EXAMPLE 20

An organic light emitting diode was fabricated in accordance with the same procedure as in Example 11, except that the compound synthesized in Example 5 and Liq at 1:1 were deposited for the electron transport layer (ETL).

EXAMPLE 21

An organic light emitting diode was fabricated in accordance with the same procedure as in Example 11, except that the compound synthesized in Example 7 and Liq at 1:1 were deposited for the electron transport layer (ETL).

EXAMPLE 22

An organic light emitting diode was fabricated in accordance with the same procedure as in Example 11, except that the compound synthesized in Example 8 and Liq at 1:1 were deposited for the electron transport layer (ETL).

EXAMPLE 23

An organic light emitting diode was fabricated in accordance with the same procedure as in Example 11, except that the compound synthesized in Example 9 and Liq at 1:1 were deposited for the electron transport layer (ETL).

EXAMPLE 24

An organic light emitting diode was fabricated in accordance with the same procedure as in Example 11, except that the compound synthesized in Example 10 and Liq at 1:1 were deposited for the electron transport layer (ETL).

EXAMPLE A-19

An organic light emitting diode was fabricated in accordance with the same procedure as in Example 11, except that the compound synthesized in Example A-1 was used for the electron transport layer (ETL) instead of using the compound synthesized from Example 1.

EXAMPLE A-20

An organic light emitting diode was fabricated in accordance with the same procedure as in Example 11, except that the compound synthesized in Example A-2 was used for the electron transport layer (ETL) instead of using the compound synthesized from Example 1.

EXAMPLE A-21

An organic light emitting diode was fabricated in accordance with the same procedure as in Example 11, except that the compound synthesized in Example A-3 was used for the electron transport layer (ETL) instead of using the compound synthesized from Example 1.

EXAMPLE A-22

An organic light emitting diode was fabricated in accordance with the same procedure as in Example 11, except that the compound synthesized in Example A-4 was used for the electron transport layer (ETL) instead of using the compound synthesized from Example 1.

EXAMPLE A-23

An organic light emitting diode was fabricated in accordance with the same procedure as in Example 11, except that the compound synthesized in Example A-5 was used for the electron transport layer (ETL) instead of using the compound synthesized from Example 1.

EXAMPLE A-24

An organic light emitting diode was fabricated in accordance with the same procedure as in Example 11, except that the compound synthesized in Example A-6 was used for the electron transport layer (ETL) instead of using the compound synthesized from Example 1.

EXAMPLE A-25

An organic light emitting diode was fabricated in accordance with the same procedure as in Example 11, except that the compound synthesized in Example A-7 was used for the electron transport layer (ETL) instead of using the compound synthesized from Example 1.

EXAMPLE A-26

An organic light emitting diode was fabricated in accordance with the same procedure as in Example 11, except that the compound synthesized in Example A-8 was used for the electron transport layer (ETL) instead of using the compound synthesized from Example 1.

EXAMPLE A-27

An organic light emitting diode was fabricated in accordance with the same procedure as in Example 11, except that the compound synthesized in Example A-9 was used for the electron transport layer (ETL) instead of using the compound synthesized from Example 1.

EXAMPLE A-28

An organic light emitting diode was fabricated in accordance with the same procedure as in Example 11, except that the compound synthesized in Example A-10 was used for the electron transport layer (ETL) instead of using the compound synthesized from Example 1.

EXAMPLE A-29

An organic light emitting diode was fabricated in accordance with the same procedure as in Example 11, except that the compound synthesized in Example A-11 was used for the electron transport layer (ETL) instead of using the compound synthesized from Example 1.

EXAMPLE A-30

An organic light emitting diode was fabricated in accordance with the same procedure as in Example 11, except that the compound synthesized in Example A-12 was used for the electron transport layer (ETL) instead of using the compound synthesized from Example 1.

EXAMPLE A-31

An organic light emitting diode was fabricated in accordance with the same procedure as in Example 11, except that the compound synthesized in Example A-13 was used for the electron transport layer (ETL) instead of using the compound synthesized from Example 1.

EXAMPLE A-32

An organic light emitting diode was fabricated in accordance with the same procedure as in Example 11, except that the compound synthesized in Example A-17 was used for the electron transport layer (ETL) instead of using the compound synthesized from Example 1.

EXAMPLE A-33

An organic light emitting diode was fabricated in accordance with the same procedure as in Example 11, except that the compound synthesized in Example A-1 and Liq at 1:1 were deposited for the electron transport layer (ETL).

EXAMPLE A-34

An organic light emitting diode was fabricated in accordance with the same procedure as in Example 11, except that the compound synthesized in Example A-3 and Liq at 1:1 were deposited for the electron transport layer (ETL).

EXAMPLE A-35

An organic light emitting diode was fabricated in accordance with the same procedure as in Example 11, except that the compound synthesized in Example A-6 and Liq at 1:1 were deposited for the electron transport layer (ETL).

EXAMPLE A-36

An organic light emitting diode was fabricated in accordance with the same procedure as in Example 11, except that the compound synthesized in Example A-7 and Liq at 1:1 were deposited for the electron transport layer (ETL).

EXAMPLE A-37

An organic light emitting diode was fabricated in accordance with the same procedure as in Example 11, except that the compound synthesized in Example A-9 and Liq at 1:1 were deposited for the electron transport layer (ETL).

EXAMPLE A-38

An organic light emitting diode was fabricated in accordance with the same procedure as in Example 11, except that the compound synthesized in Example A-10 and Liq at 1:1 were deposited for the electron transport layer (ETL).

EXAMPLE A-39

An organic light emitting diode was fabricated in accordance with the same procedure as in Example 11, except that the compound synthesized in Example A-12 and Liq at 1:1 were deposited for the electron transport layer (ETL).

EXAMPLE A-40

An organic light emitting diode was fabricated in accordance with the same procedure as in Example 11, except that the compound synthesized in Example A-17 and Liq at 1:1 were deposited for the electron transport layer (ETL).

COMPARATIVE EXAMPLE 1

An organic light emitting diode was fabricated in accordance with the same procedure as in Example 11, except that the compound represented by the following Chemical Formula 3 was used for the electron transport layer (ETL) instead of using the compound synthesized from Example 1.

[Chemical Formula 3]

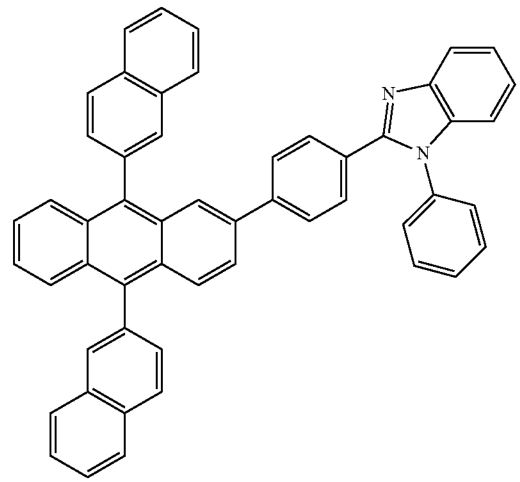

COMPARATIVE EXAMPLE 2

An organic light emitting diode was fabricated in accordance with the same procedure as in Example 18, except that the compound represented by the above Chemical Formula 3 was used for the electron transport layer (ETL) instead of using the compound synthesized from Example 1.

(Measurement of Performance of Organic Light Emitting Diode)

EXPERIMENTAL EXAMPLES

Each organic light emitting diode according to the Examples and Comparative Examples was measured for current density change depending upon the voltage, luminance change, and luminous efficiency. Specific measurement methods were as follows and the results are shown in the following Tables 1 and 2.

(1) Measurement of Current Density Change Depending on Voltage Change

The fabricated organic light emitting diodes were measured for current value flowing in the unit device while increasing the voltage from 0V to 10V using a current-voltage meter (Keithley 2400), and the measured current value was divided by area to provide the result.

(2) Measurement of Luminance Change Depending on Voltage Change

The fabricated organic light emitting diodes were measured for luminance while increasing the voltage from 0 V to 10 V using a luminance meter (Minolta Cs-1000A).

(3) Measurement of Luminous Efficiency

Current efficiency (cd/A) and electric power efficiency (lm/W) at the same luminance (1000 cd/m2) were calculated by using luminance and current density from the item (1) and (2) and voltage.

TABLE 1

| | Luminance at 500 cd/m2 | | | | |
|---|---|---|---|---|---|
| | Driving voltage | Luminous efficiency | Electric power efficiency | CIE chromaticity | |
| | (V) | (cd/A) | (lm/W) | x | y |
| Example 13 | 4.4 | 7.4 | 5.3 | 0.14 | 0.05 |
| Example 15 | 3.9 | 5.4 | 4.3 | 0.14 | 0.05 |
| Example 16 | 4.5 | 7.6 | 5.4 | 0.14 | 0.05 |
| Example 17 | 4.2 | 6.2 | 4.6 | 0.14 | 0.05 |
| Comparative Example 1 | 5.1 | 3.7 | 2.3 | 0.14 | 0.05 |
| Example 20 | 3.8 | 7.5 | 6.2 | 0.14 | 0.04 |
| Example 23 | 3.8 | 8.2 | 6.9 | 0.14 | 0.05 |
| Comparative Example 2 | 4.2 | 5.4 | 4.1 | 0.14 | 0.05 |

As shown in Table 1, it may be seen that the organic light emitting diodes according to Examples 13, 15, 16, and 17 had lower driving voltages and improved luminous efficiency and electric power efficiency, compared with those of Comparative Example 1.

In addition, it may also be seen that the organic light emitting diodes according to Examples 20 and 23 had lower driving voltage and improved luminous efficiency and electric power efficiency, compared with those of Comparative Example 2.

TABLE 2

| | Luminance at 500 cd/m2 | | | | |
|---|---|---|---|---|---|
| | Driving voltage | Luminous efficiency | Electric power efficiency | CIE chromaticity | |
| | (V) | (cd/A) | (lm/W) | x | y |
| Example A-19 | 5.0 | 4.9 | 3.1 | 0.14 | 0.05 |
| Example A-20 | 3.6 | 6.4 | 4.6 | 0.14 | 0.05 |
| Example A-21 | 3.7 | 5.7 | 5.0 | 0.14 | 0.05 |
| Example A-22 | 4.1 | 5.1 | 4.0 | 0.14 | 0.05 |
| Example A-23 | 3.5 | 6.7 | 6.0 | 0.14 | 0.05 |
| Example A-24 | 4.9 | 4.0 | 2.6 | 0.14 | 0.05 |
| Example A-25 | 3.7 | 6.5 | 5.6 | 0.14 | 0.06 |
| Example A-26 | 4.7 | 4.3 | 2.9 | 0.14 | 0.05 |
| Example A-27 | 3.5 | 6.6 | 5.9 | 0.14 | 0.05 |
| Example A-28 | 4.2 | 6.1 | 4.6 | 0.14 | 0.05 |
| Example A-29 | 3.8 | 5.0 | 4.1 | 0.14 | 0.05 |
| Example A-30 | 3.7 | 7.4 | 6.3 | 0.14 | 0.06 |
| Example A-31 | 4.2 | 4.4 | 3.3 | 0.14 | 0.05 |
| Example A-32 | 4.2 | 6.7 | 5.0 | 0.14 | 0.05 |
| Comparative Example 1 | 5.1 | 3.7 | 2.3 | 0.14 | 0.05 |
| Example A-33 | 3.4 | 5.5 | 5.1 | 0.14 | 0.04 |
| Example A-34 | 3.4 | 5.4 | 5.0 | 0.14 | 0.04 |
| Example A-35 | 4.1 | 5.4 | 4.2 | 0.14 | 0.05 |
| Example A-36 | 3.5 | 6.6 | 6.0 | 0.14 | 0.05 |
| Example A-37 | 3.6 | 6.1 | 5.3 | 0.14 | 0.04 |
| Example A-38 | 3.6 | 7.2 | 6.2 | 0.14 | 0.05 |
| Example A-39 | 3.7 | 6.2 | 5.3 | 0.14 | 0.04 |
| Example A-40 | 4.0 | 6.4 | 5.1 | 0.14 | 0.05 |
| Comparative Example 2 | 4.2 | 5.4 | 4.1 | 0.14 | 0.05 |

As shown in Table 2, it may be seen that the organic light emitting diodes according to Examples A-19 to A-40 had lower driving voltages and improved luminous efficiency and electric power efficiency, compared with those of Comparative Examples 1 and 2.

By way of summation and review, an organic light emitting diode may transform electrical energy into light by applying current to an organic light emitting material. The organic light emitting diode may have a structure in which a functional organic material layer is interposed between an anode and a cathode. The organic material layer may include a multi-layer including different materials, e.g., a hole injection layer (HIL), a hole transport layer (HTL), an emission layer, an electron transport layer (ETL), and/or an electron injection layer (EIL), in order to improve efficiency and stability of an organic photoelectric device.

In such an organic light emitting diode, when a voltage is applied between an anode and a cathode, holes from the anode and electrons from the cathode may be injected to an organic material layer and recombined to generate excitons having high energy. The generated excitons may generate light having certain wavelengths while shifting to a ground state.

A phosphorescent light emitting material may be used for a light emitting material of an organic light emitting diode, in addition to the fluorescent light emitting material. Such a phosphorescent material may emit lights by transiting the electrons from a ground state to an exited state, non-radiance transiting of a singlet exciton to a triplet exciton through intersystem crossing, and transiting a triplet exciton to a ground state to emit light.

As described above, in an organic light emitting diode, an organic material layer may include a light emitting material and a charge transport material, e.g., a hole injection material, a hole transport material, an electron transport material, an electron injection material, or the like.

The light emitting material may be classified as blue, green, and red light emitting materials (according to emitted colors), and yellow and orange light emitting materials to emit colors approaching natural colors.

When one material is used as a light emitting material, a maximum light emitting wavelength may be shifted to a long wavelength or color purity may decrease because of interactions between molecules, or device efficiency may decrease because of a light emitting quenching effect. Accordingly, a host/dopant system may be included as a light emitting material in order to help improve color purity and to help increase luminous efficiency and stability through energy transfer.

In order to achieve excellent performance of an organic light emitting diode, a material constituting an organic material layer, e.g., a hole injection material, a hole transport material, a light emitting material, an electron transport material, an electron injection material, and/or a light emitting material such as a host and/or a dopant, should be stable and have good efficiency.

A low molecular weight organic light emitting diode may be manufactured as a thin film in a vacuum deposition method, and may have good efficiency and life-span performance. A polymer organic light emitting diode may be manufactured in an Inkjet or spin coating method and may have an advantage of low initial cost and being large-sized.

Both low molecular weight organic light emitting and polymer organic light emitting diodes have advantages of being self-light emitting and being ultrathin, and having a high speed response, a wide viewing angle, high image quality, durability, a large driving temperature range, and the like, and therefore it is highlighted as the next generation display. In particular, they have good visibility due to the self-light emitting characteristic (compared with a conventional LCD (liquid crystal display)) and have an advantage of decreasing thickness and weight of LCD by up to a third, because a backlight may be omitted.

In addition, low molecular weight organic light emitting and polymer organic light emitting diodes may have a response speed that is 1,000 times faster per microsecond unit than an LCD. Thus, a perfect motion picture may be realized without an after-image. Therefore, recently it may be as an optimal display in compliance with multimedia generation. Based on these advantages, low molecular weight organic light emitting and polymer organic light emitting diodes have been remarkably developed to have 80 times the efficiency and more than 100 times the life-span. Recently, these diodes have been used in displays that are rapidly becoming larger, such as for a 40-inch organic light emitting diode panel.

These displays may simultaneously have improved luminous efficiency and life-span in order to be larger. In order to increase the luminous efficiency, smooth combination between holes and electrons in an emission layer is desirable. However, an organic material may have slower electron mobility than hole mobility. Thus, electron injection from a cathode and mobility using efficient electron transport layer (ETL) should be heightened and transfer of a hole is should be inhibited, in order to realize efficient recombination of a hole and an electron in an emission layer. In addition, the device may have a decreased life-span if the material therein may be crystallized due to Joule heat generated when it is driven.

The embodiments provide an organic compound having excellent electron injection and mobility and high thermal stability.

The embodiments provide a compound for an organic optoelectronic device that may act as a light emitting, material, an electron injection and/or electron transporting material, or a light emitting host (along with an appropriate dopant).

The embodiments provide an organic light emitting diode having excellent life-span, efficiency, a driving voltage, electrochemical stability, and thermal stability.

The embodiments provide an organic optoelectronic device having excellent electrochemical and thermal stability and life-span characteristics, and high luminous efficiency at a low driving voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, wherein the compound is represented by the following Chemical Formula 2:

[Chemical Formula 2]

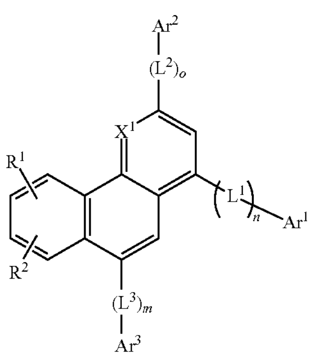

wherein, in Chemical Formula 2:

$X^1$ is —N, $R^1$ and $R^2$ are each independently hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, $Ar^1$ to $Ar^3$ are each independently a substituted or unsubstituted C6 to C30 aryl group or a substituted or unsubstituted C3 to C30 heteroaryl group, $L^1$ to $L^3$ are each independently a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof, and n, m, and o are each 1.

2. The compound for an organic optoelectronic device as claimed in claim 1, wherein at least one of $Ar^1$ or $Ar^2$ is a substituted or unsubstituted C3 to C30 heteroaryl group.

3. The compound for an organic optoelectronic device as claimed in claim 1, wherein:

$Ar^1$ is a substituted or unsubstituted C3 to C30 heteroaryl group, and $Ar^2$ and $Ar^3$ are each independently a substituted or unsubstituted C6 to C30 aryl group.

4. The compound for an organic optoelectronic device as claimed in claim 1, wherein:

$Ar^2$ is a substituted or unsubstituted C3 to C30 heteroaryl group, and $Ar^1$ and $Ar^3$ are each independently a substituted or unsubstituted C6 to C30 aryl group.

5. The compound for an organic optoelectronic device as claimed in claim 1, wherein the substituted or unsubstituted C3 to C30 heteroaryl group is a substituted or unsubstituted imidazolyl group, a substituted or unsubstituted triazolyl group, a substituted or unsubstituted tetrazolyl group, a substituted or unsubstituted carbazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphpyridinyl group, a substituted or unsubstituted quinoxalinyl group, a substituted or unsubstituted quinazolinyl group, a substituted or unsubstituted acridinyl group, a substituted or unsubstituted phenanthrolinyl group, a substituted or unsubstituted phenazinyl group, or a combination thereof.

6. The compound for an organic optoelectronic device as claimed in claim 1, wherein the substituted or unsubstituted C6 to C30 aryl group is a substituted or unsubstituted phenyl group, a substituted or unsubstituted naphthyl group, a substituted or unsubstituted triperylenyl group, a substituted or unsubstituted fluorenyl group, a substituted or unsubstituted spirofluorenyl group, a substituted or unsubstituted biphenyl group, a substituted or unsubstituted terphenyl group, a substituted or unsubstituted pyrenyl group, a substituted or unsubstituted perylenyl group, a substituted or unsubstituted phenanthrenyl group, a substituted or unsubstituted anthracenyl group, or a combination thereof.

7. The compound for an organic optoelectronic device as claimed in claim 2, wherein the organic optoelectronic device is selected from the group of an organic photoelectric device, an organic light emitting diode, an organic solar cell, an organic transistor, an organic photo conductor drum, and an organic memory device.

8. A compound for an organic optoelectronic device, the compound being represented by one of the following Chemical Formulae A1 to A189:

[Chemical Formula A1]

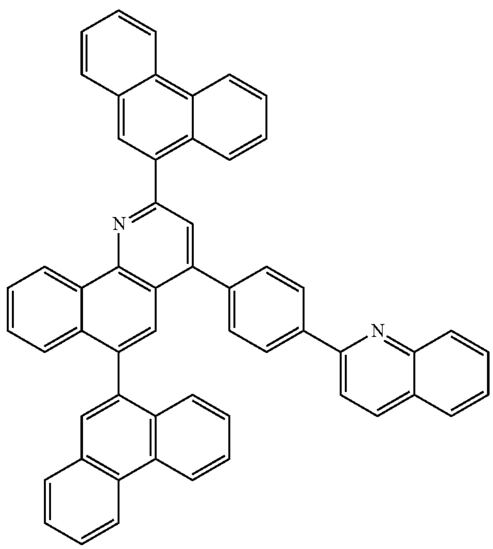

[Chemical Formula A2]

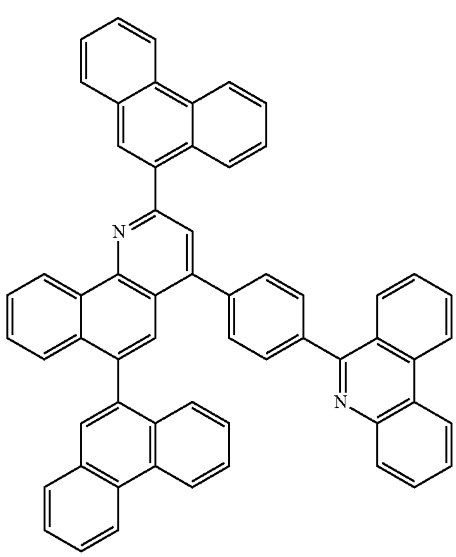

-continued

[Chemical Formula A3]

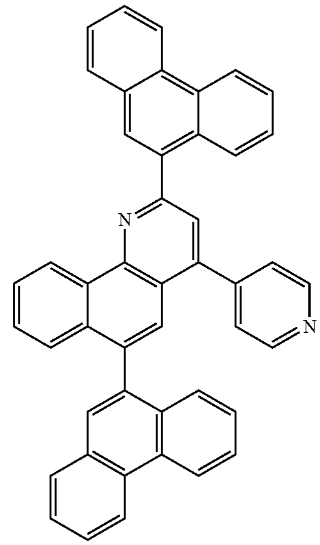

[Chemical Formula A4]

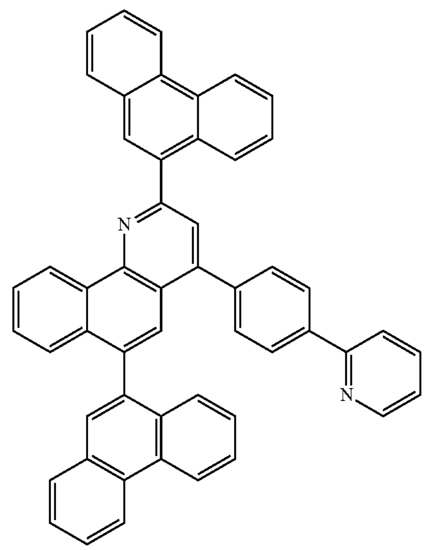

[Chemical Formula A5]

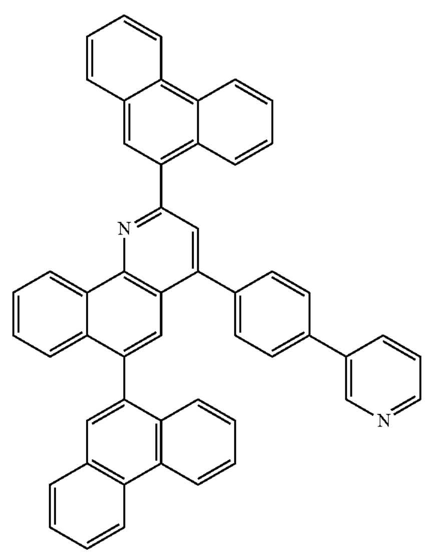

-continued
[Chemical Formula A6]
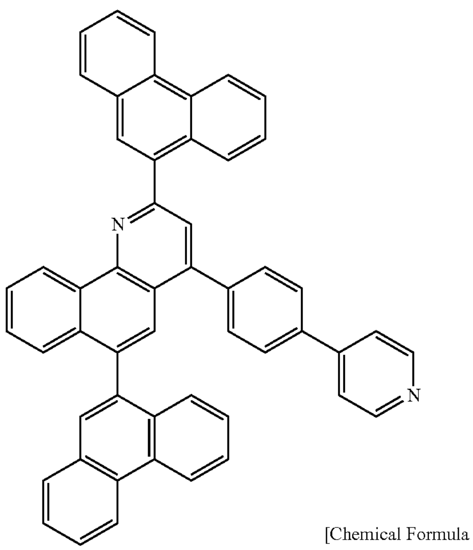
[Chemical Formula A7]
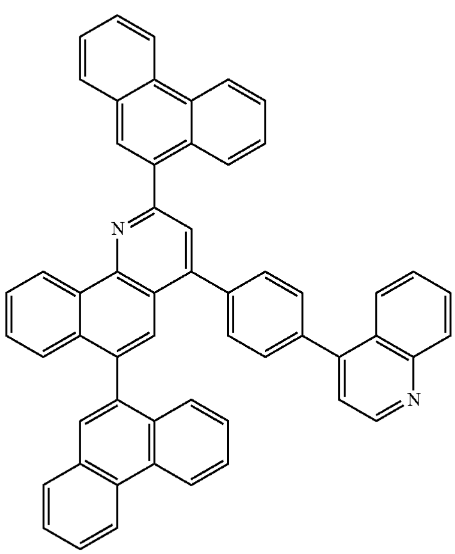
[Chemical Formula A8]
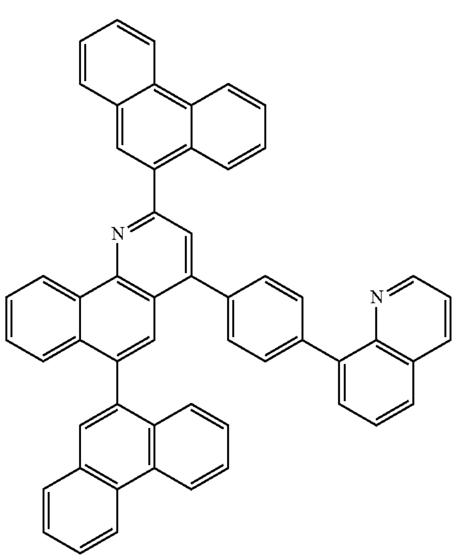
-continued
[Chemical Formula A9]
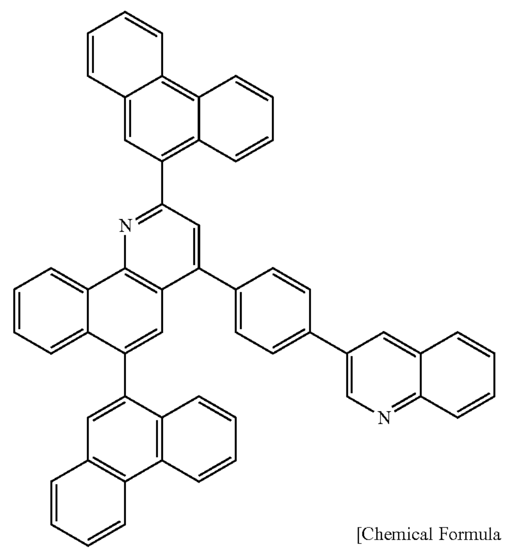
[Chemical Formula A10]
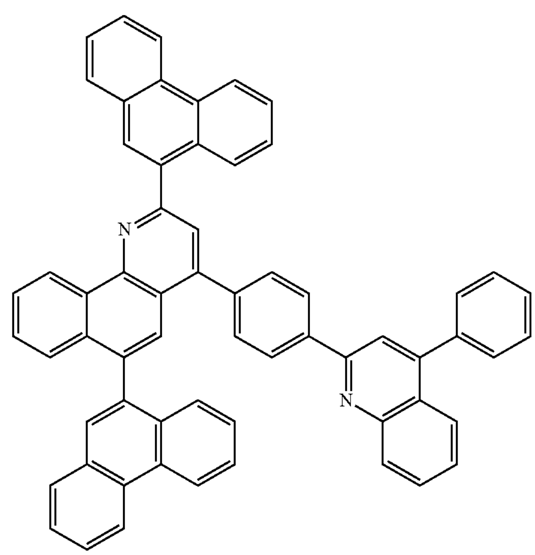
[Chemical Formula A11]
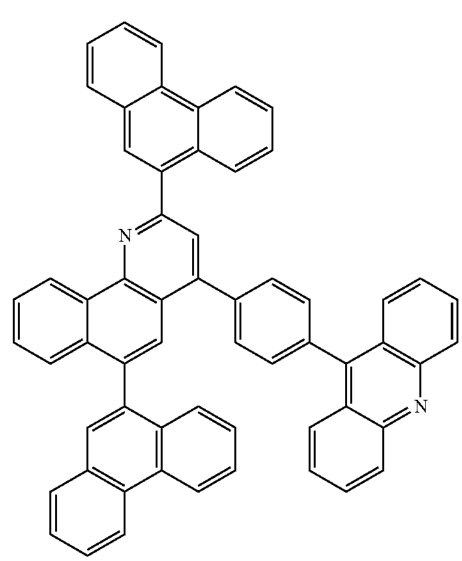

[Chemical Formula A12]
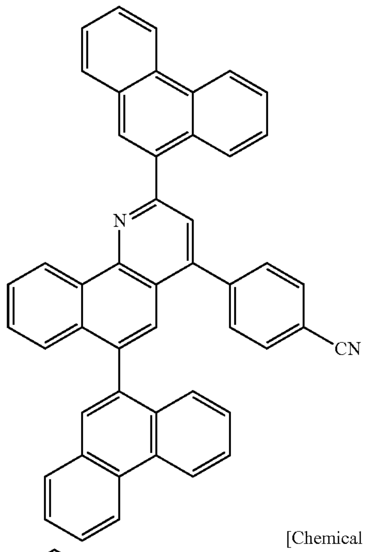
[Chemical Formula A13]
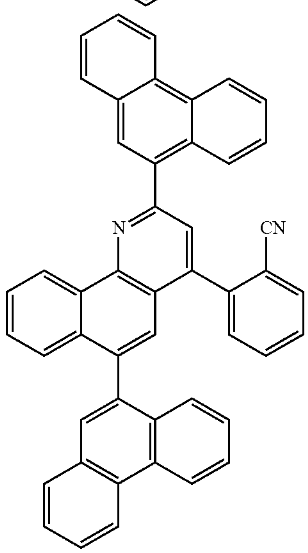
[Chemical Formula A14]
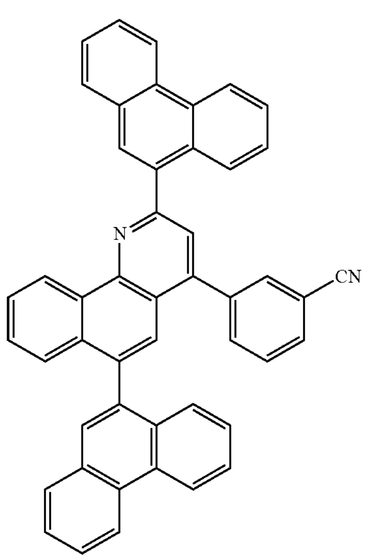
[Chemical Formula A15]
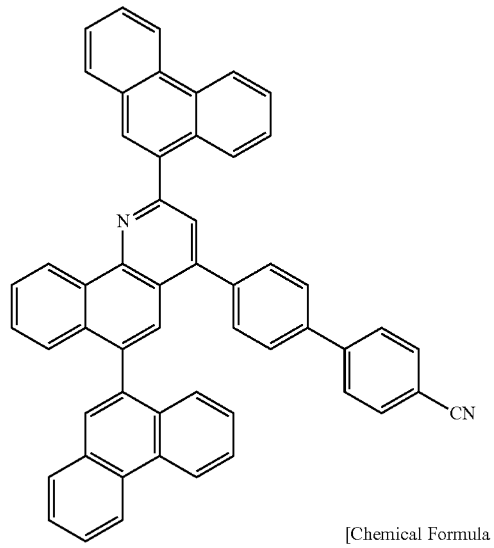
[Chemical Formula A16]
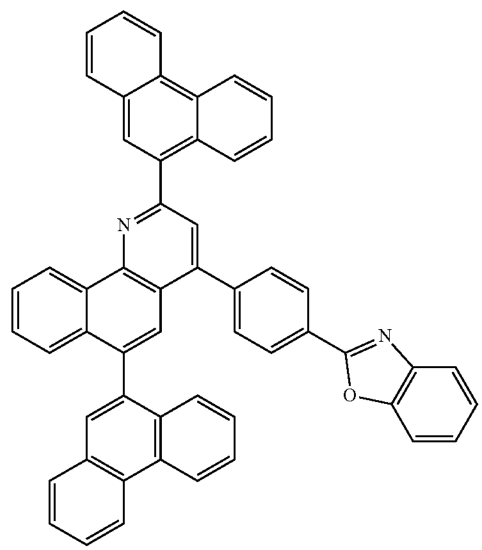
[Chemical Formula A17]
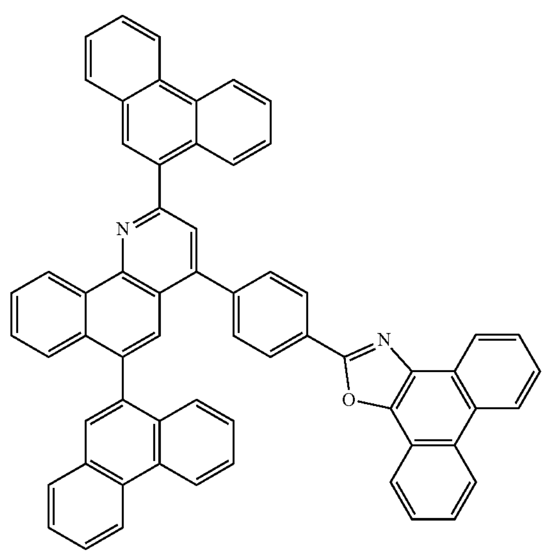

[Chemical Formula A18]
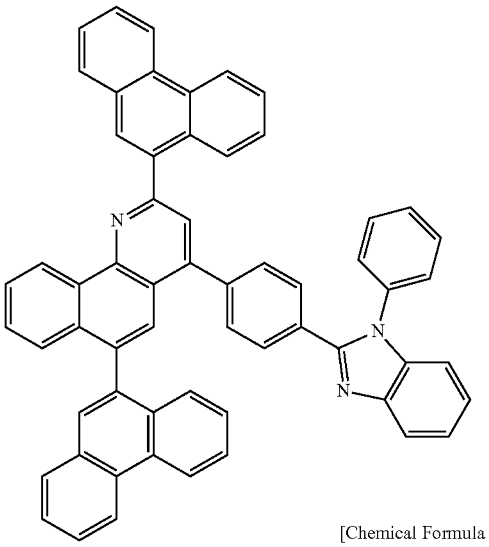
[Chemical Formula A19]
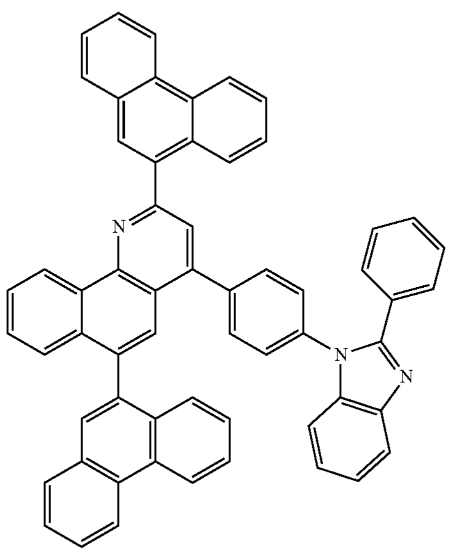
[Chemical Formula A20]
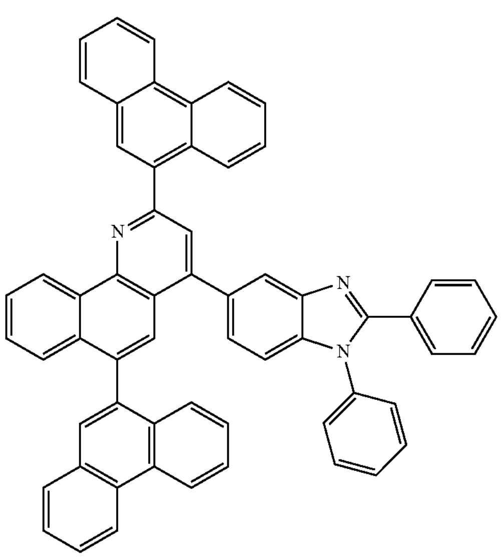
[Chemical Formula A21]
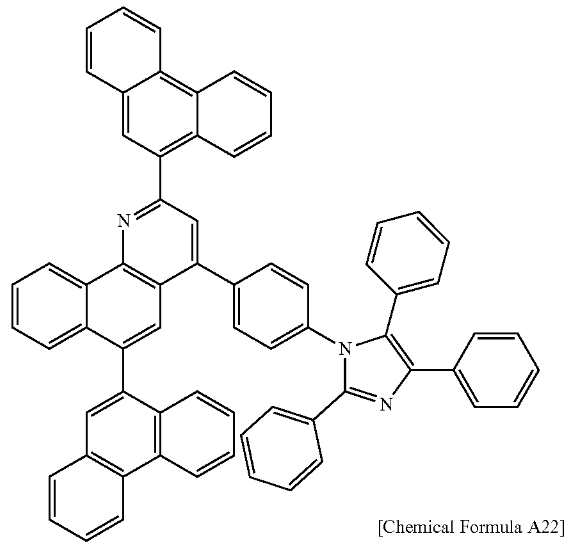
[Chemical Formula A22]
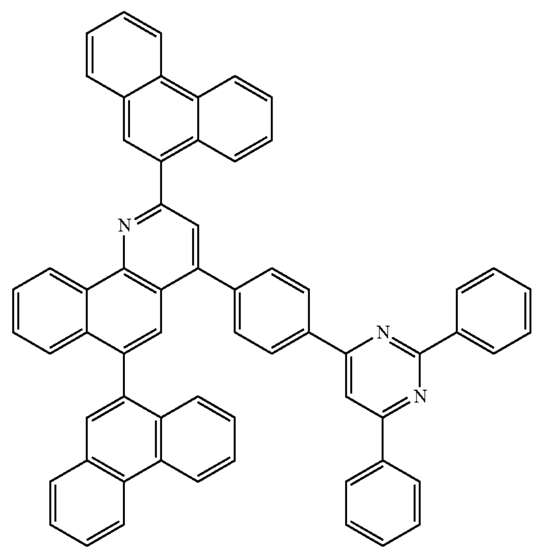
[Chemical Formula A23]
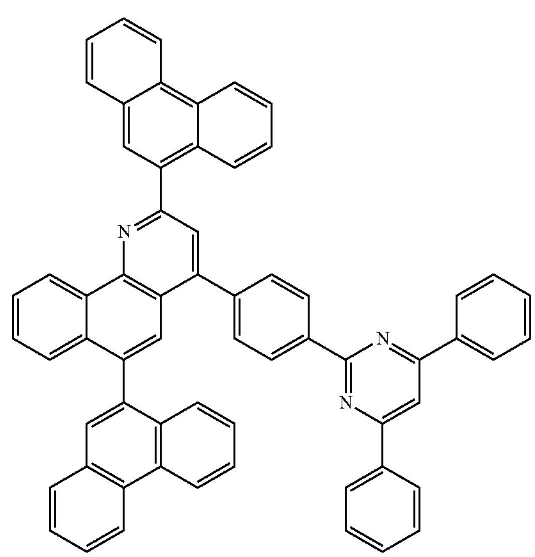

-continued
[Chemical Formula A24]
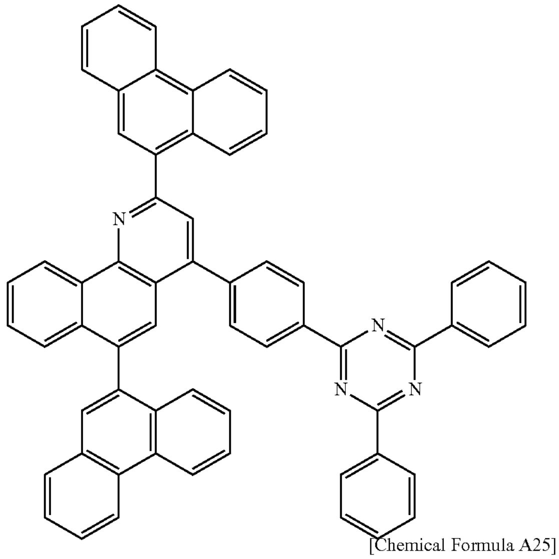
[Chemical Formula A25]
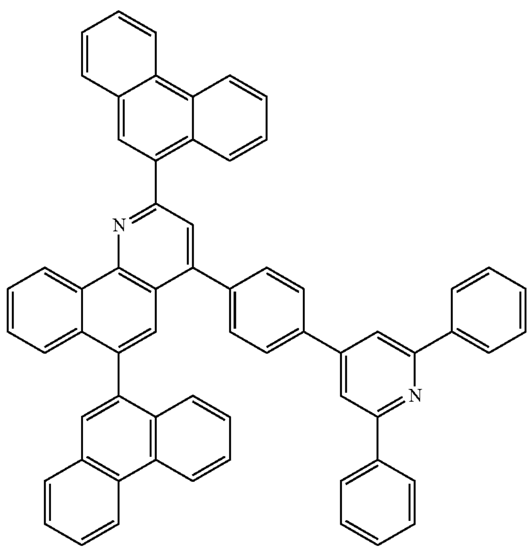
[Chemical Formula A26]
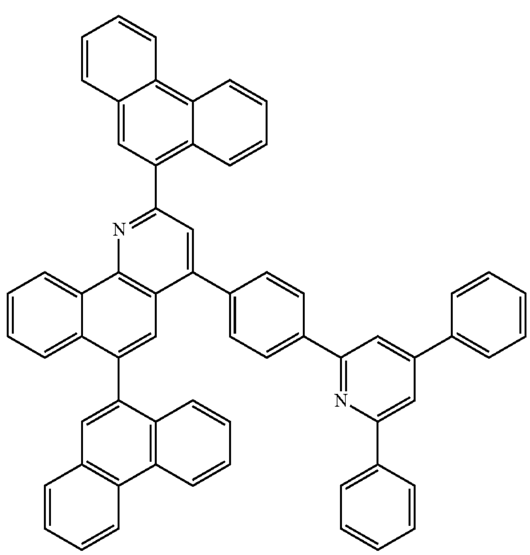
-continued
[Chemical Formula A27]
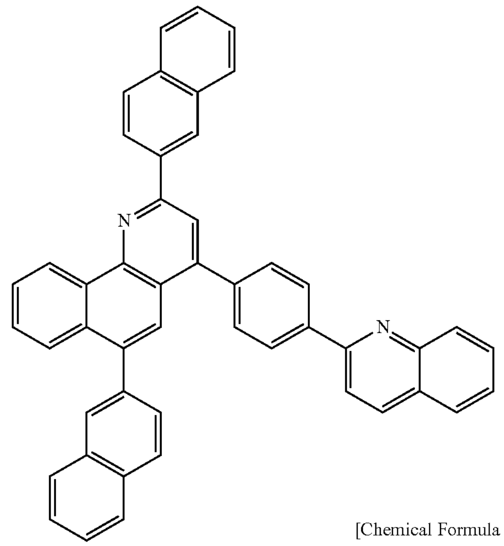
[Chemical Formula A28]
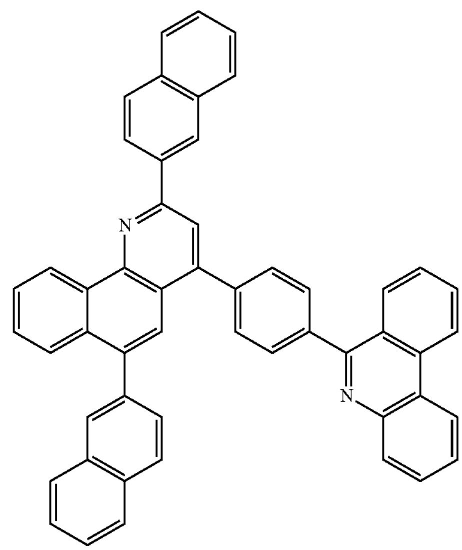
[Chemical Formula A29]
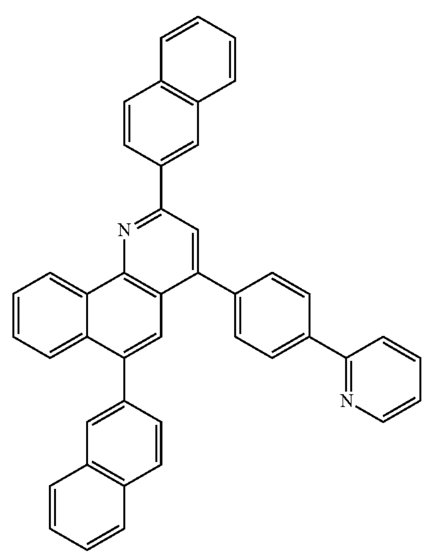

-continued
[Chemical Formula A30]
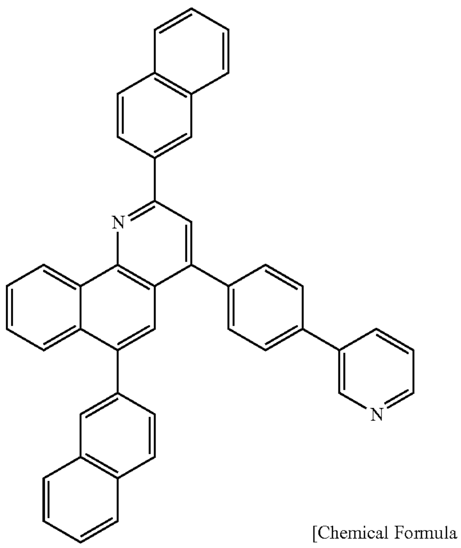
[Chemical Formula A31]
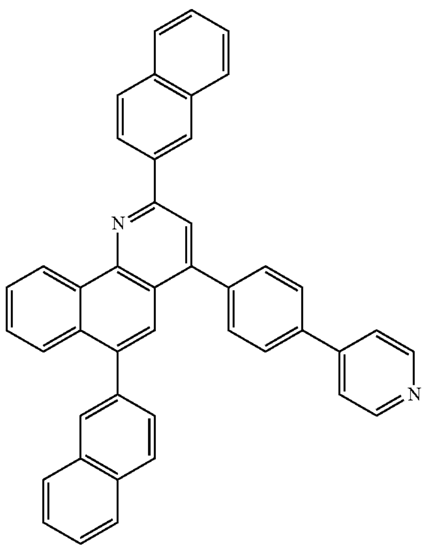
[Chemical Formula A32]
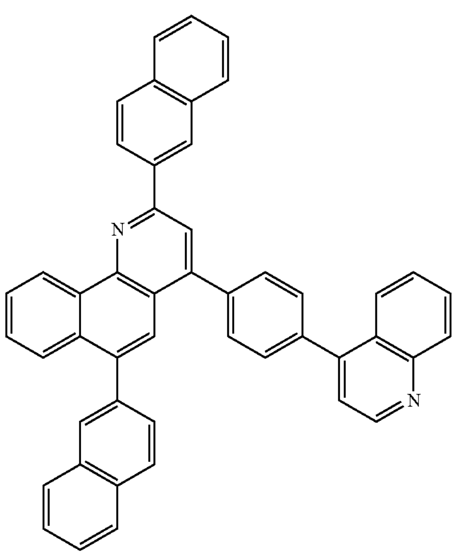
-continued
[Chemical Formula A33]
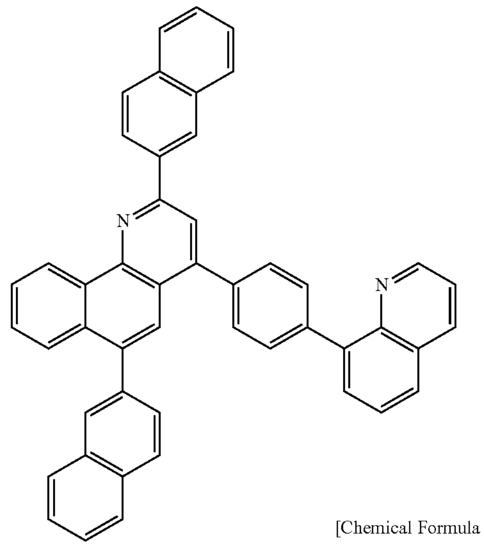
[Chemical Formula A34]
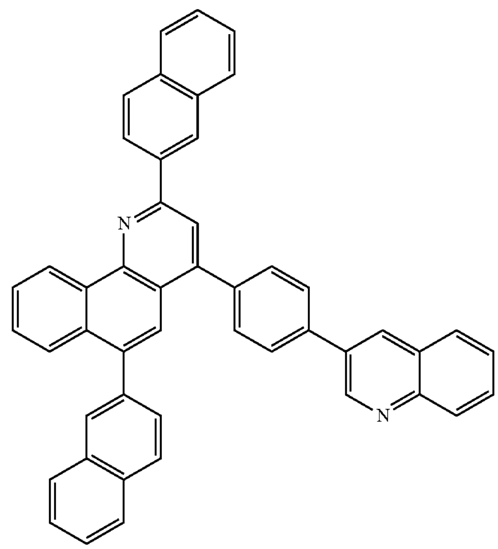
[Chemical Formula A35]
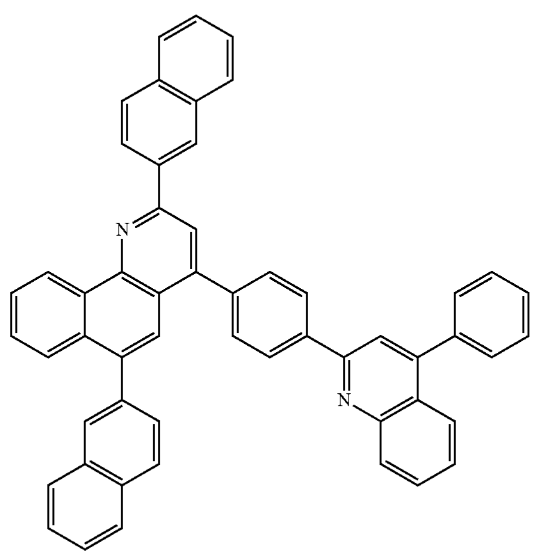

[Chemical Formula A36]
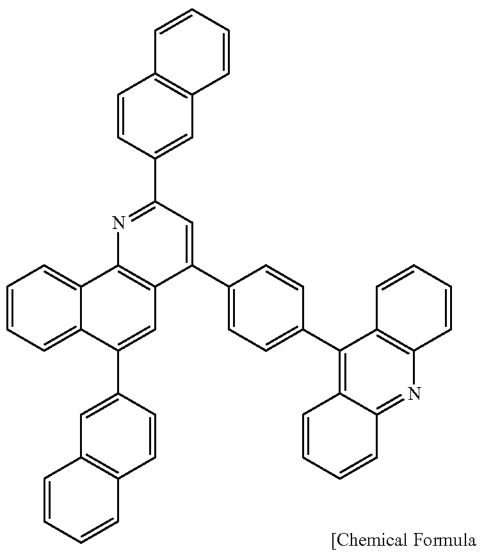
[Chemical Formula A37]
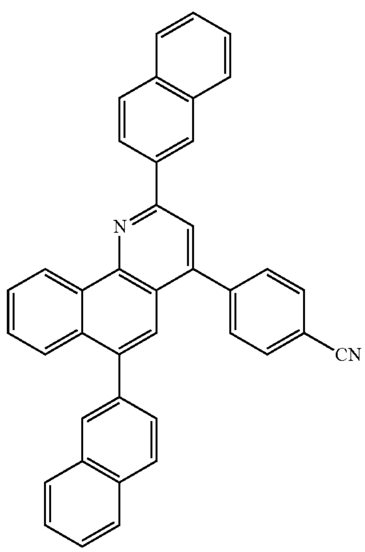
[Chemical Formula A38]
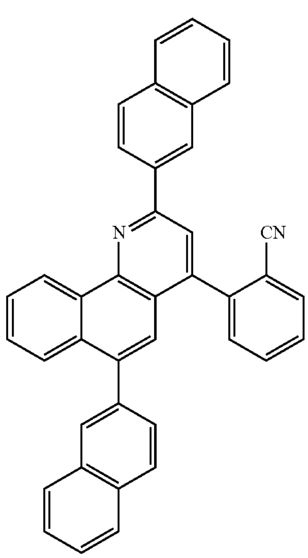
[Chemical Formula A39]
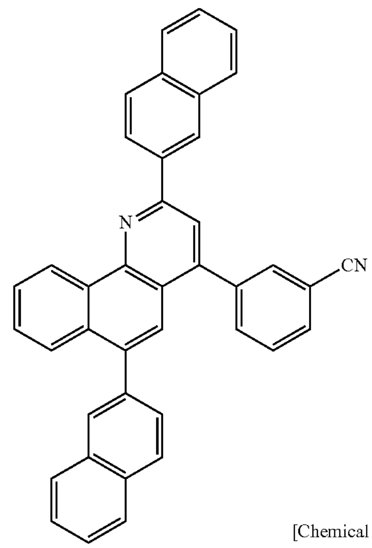
[Chemical Formula A40]
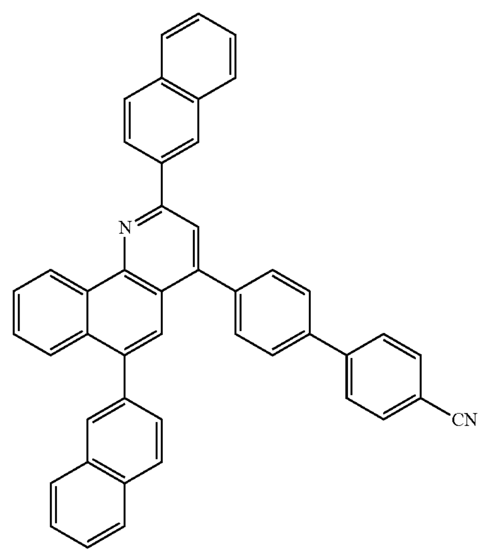
[Chemical Formula A41]
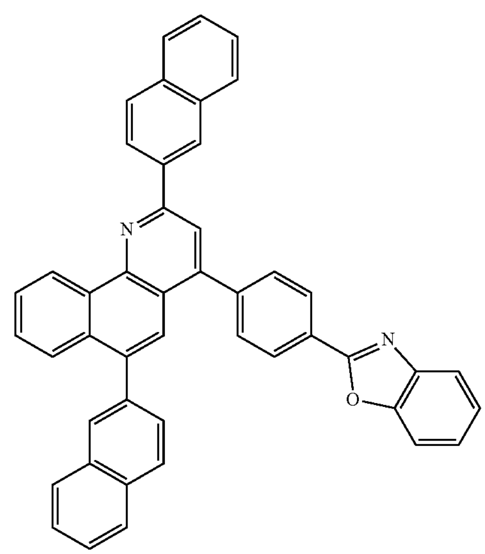

[Chemical Formula A42]
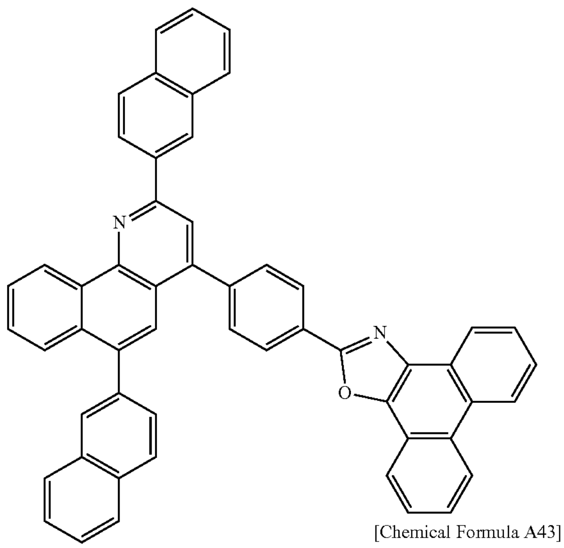
[Chemical Formula A43]
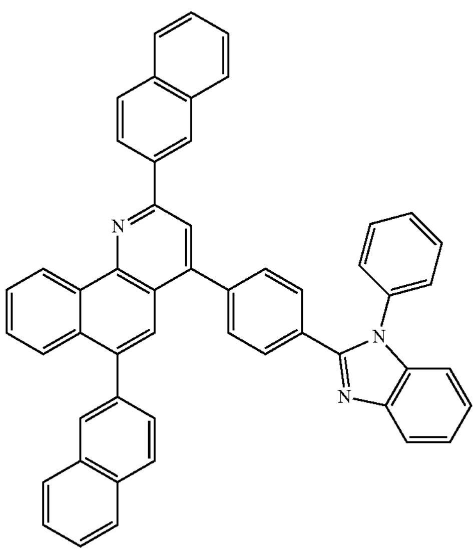
[Chemical Formula A44]
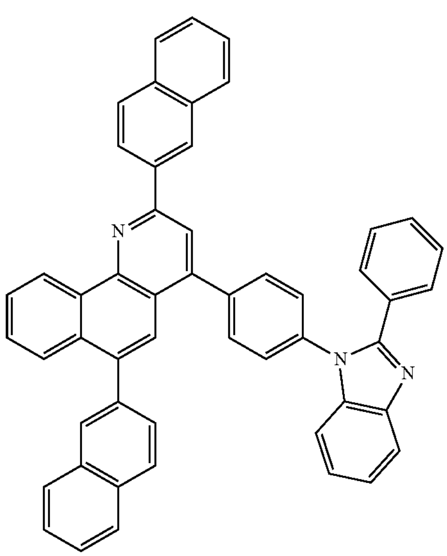
[Chemical Formula A45]
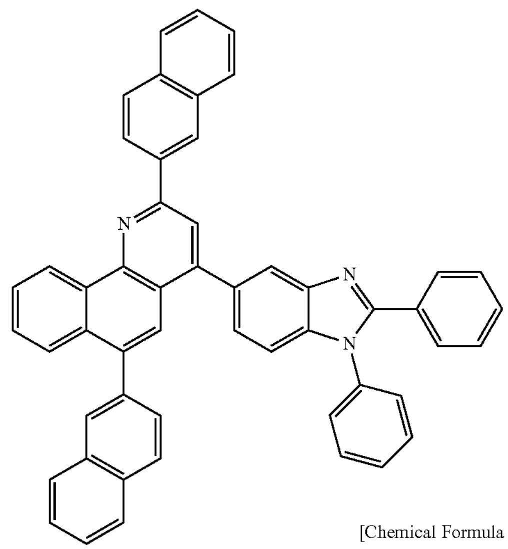
[Chemical Formula A46]
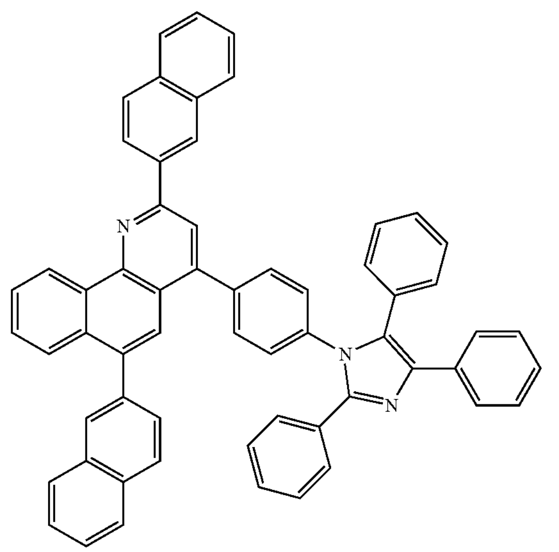
[Chemical Formula A47]
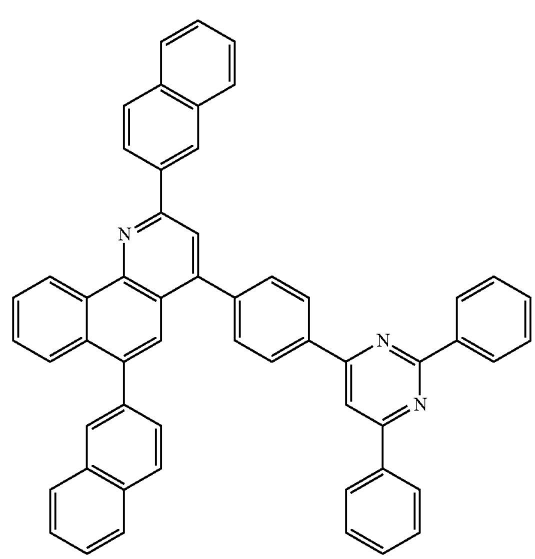

-continued
[Chemical Formula A48]
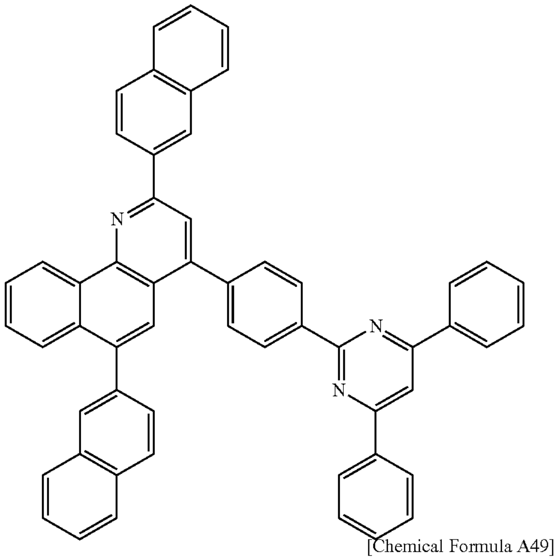
[Chemical Formula A49]
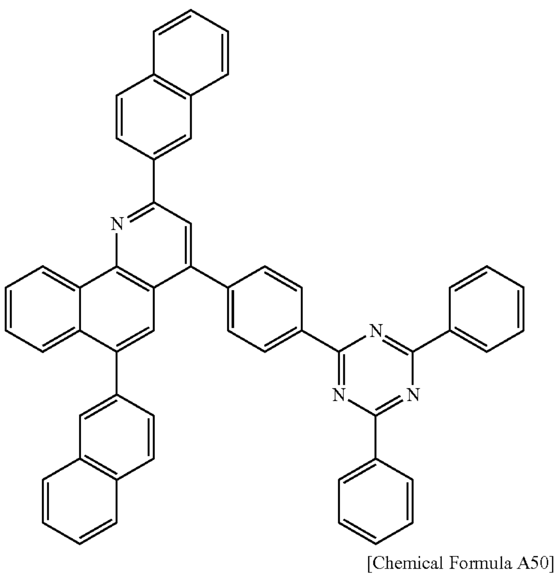
[Chemical Formula A50]
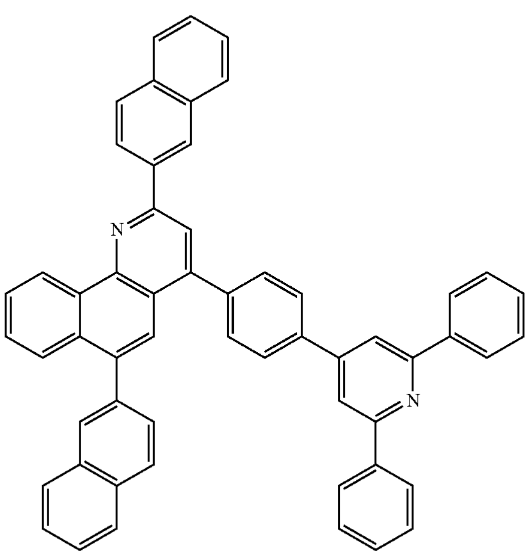
-continued
[Chemical Formula A51]
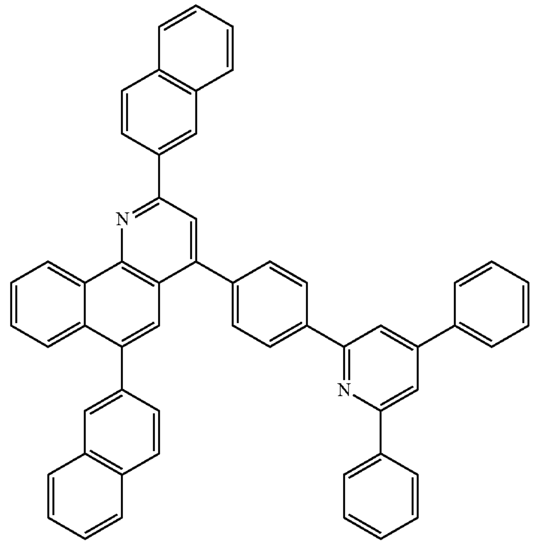
[Chemical Formula A52]
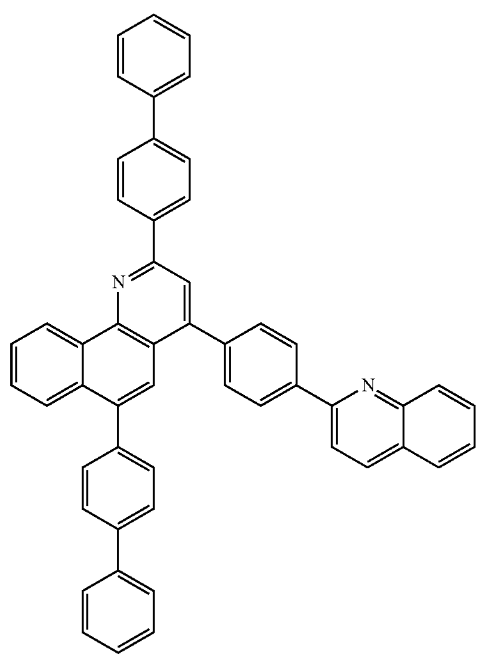

[Chemical Formula A53]
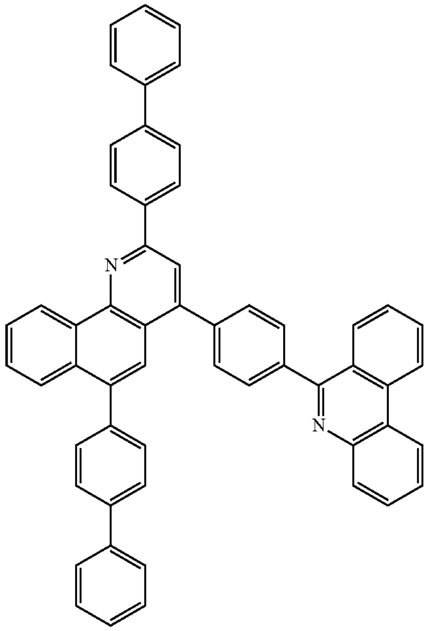
[Chemical Formula A54]
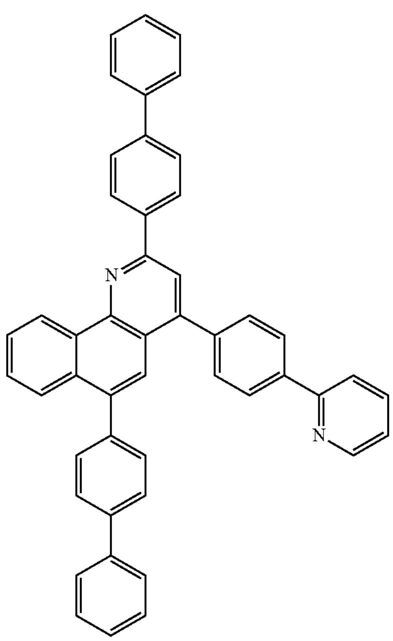
[Chemical Formula A55]
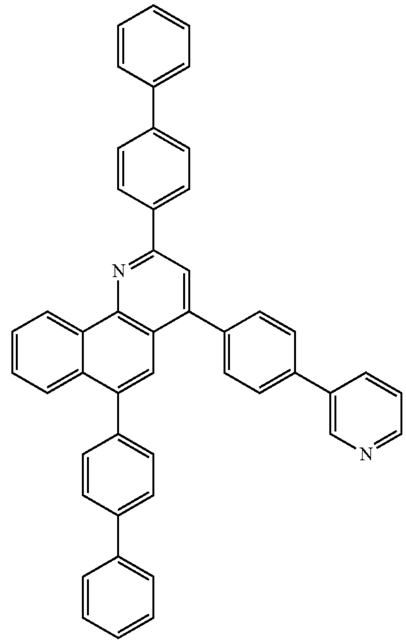
[Chemical Formula A56]
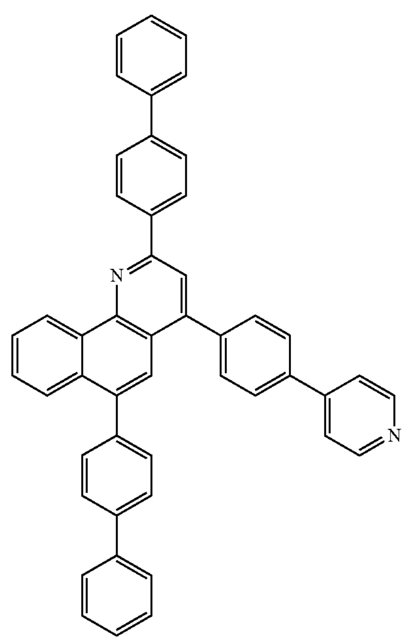

[Chemical Formula A55]
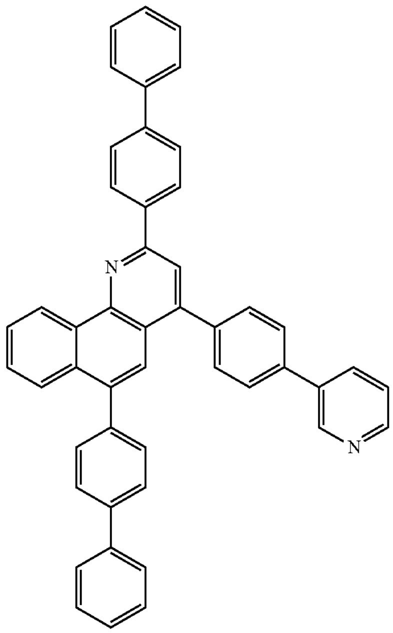
[Chemical Formula A56]
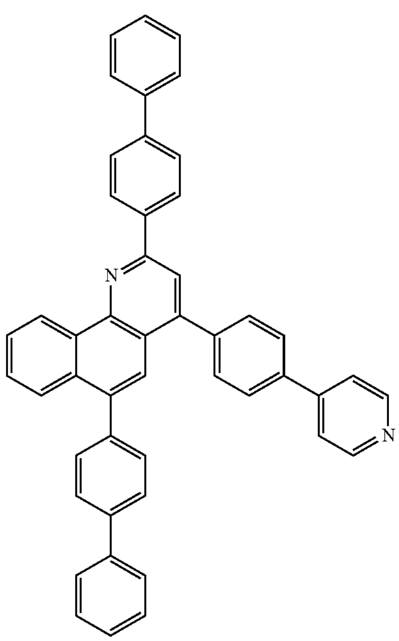
[Chemical Formula A57]
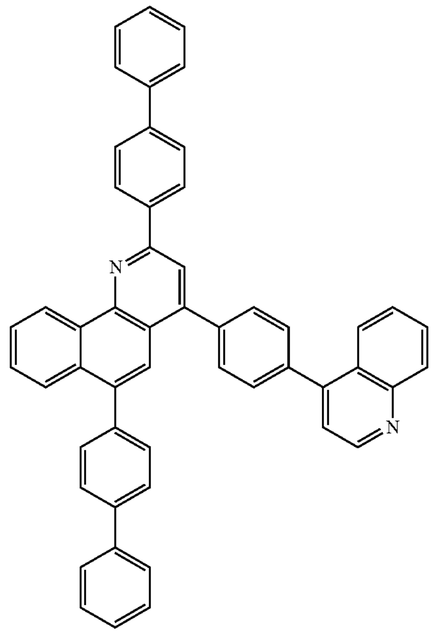
[Chemical Formula A58]
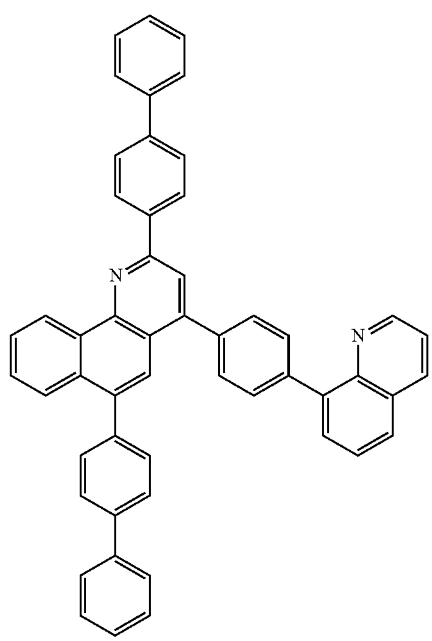

-continued
[Chemical Formula A59]
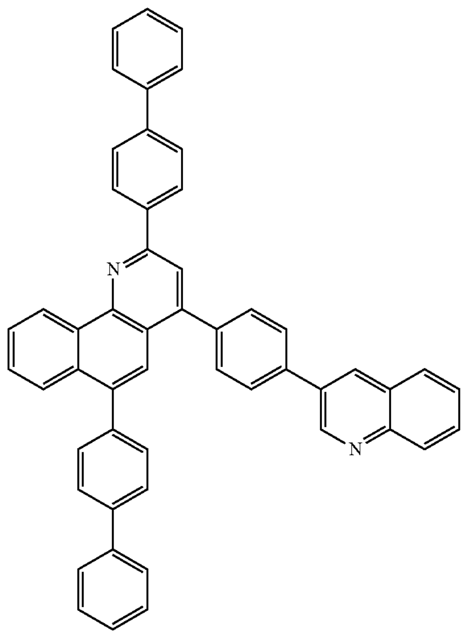
[Chemical Formula A60]
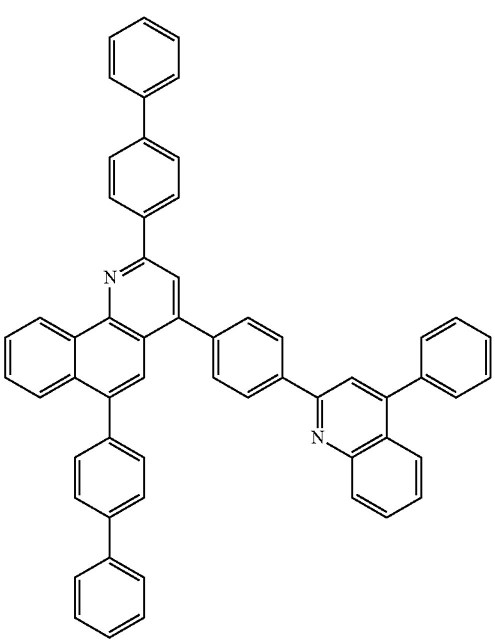
-continued
[Chemical Formula A61
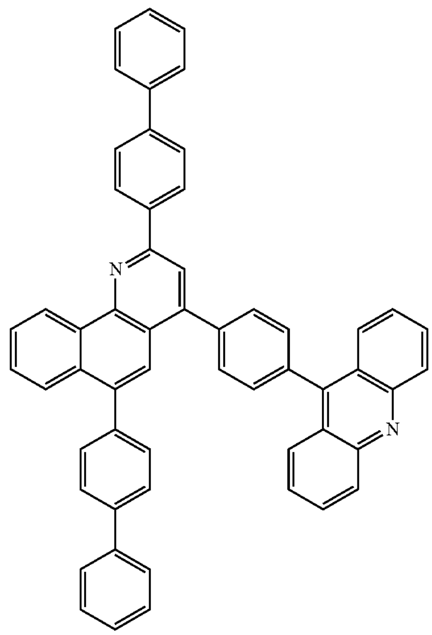
[Chemical Formula A62]
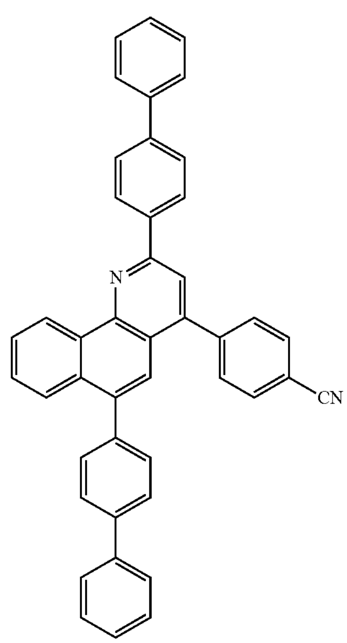

-continued
[Chemical Formula A63]
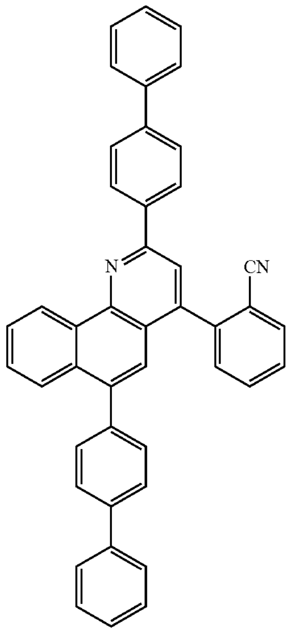
[Chemical Formula A64]
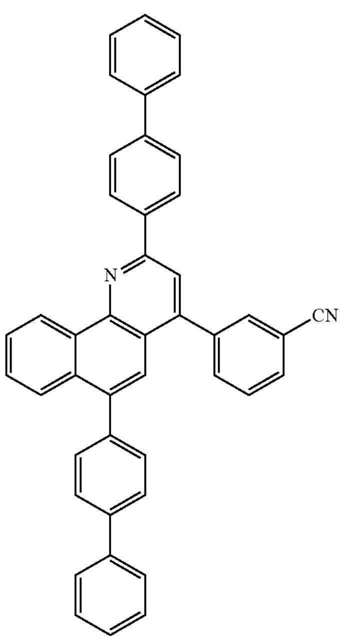
-continued
[Chemical Formula A65]
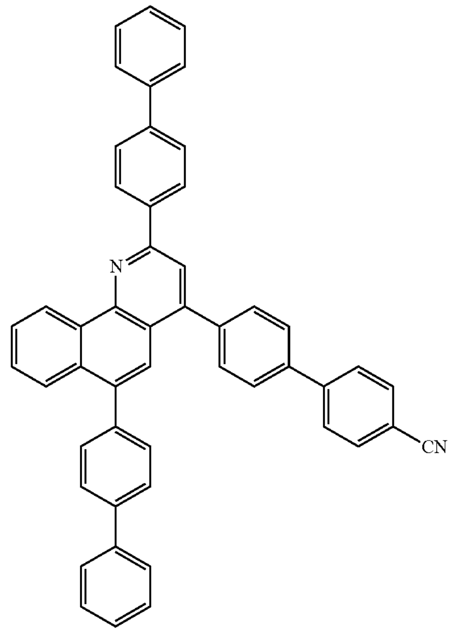
[Chemical Formula A66]
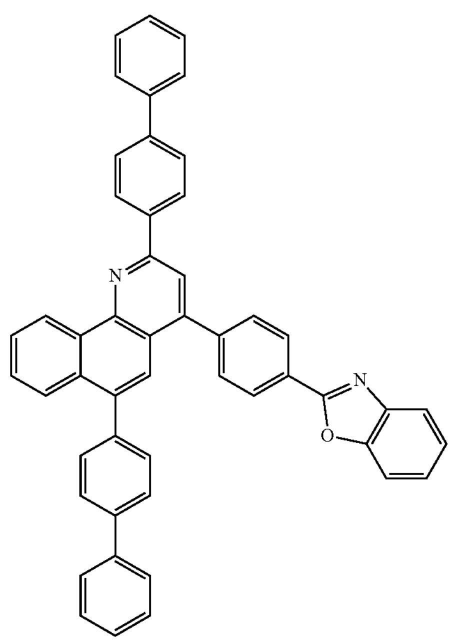

-continued
[Chemical Formula A67]
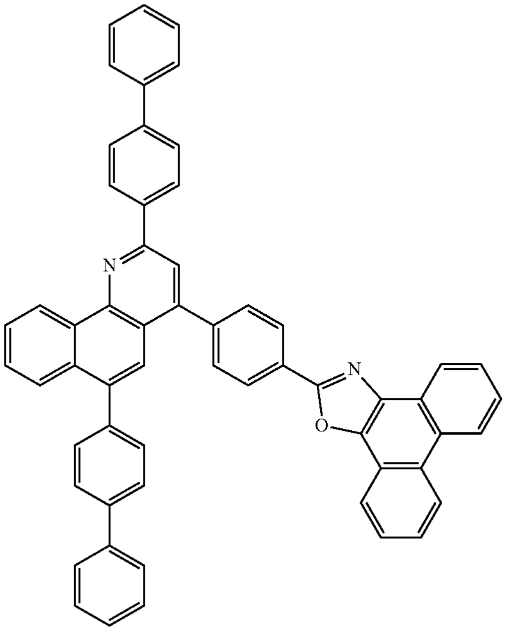
[Chemical Formula A68]
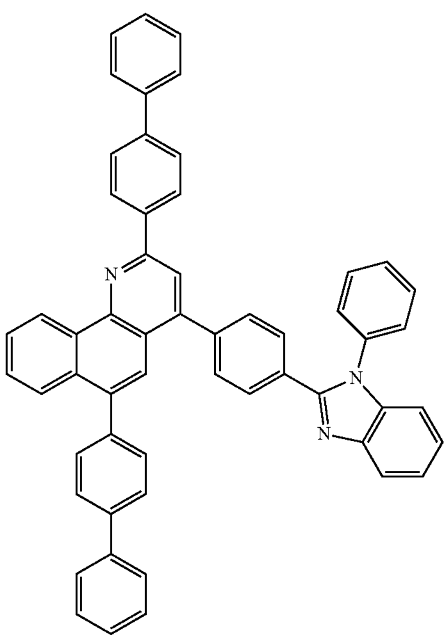
-continued
[Chemical Formula A69]
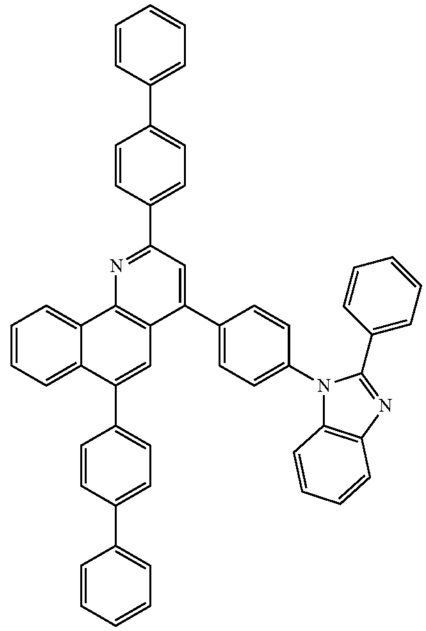
[Chemical Formula A70]
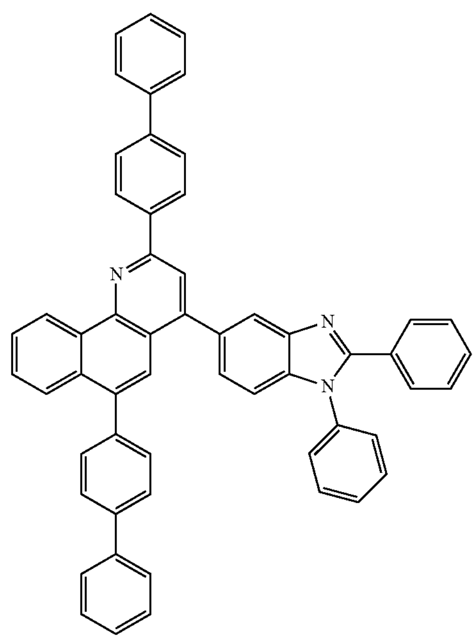

[Chemical Formula A71]
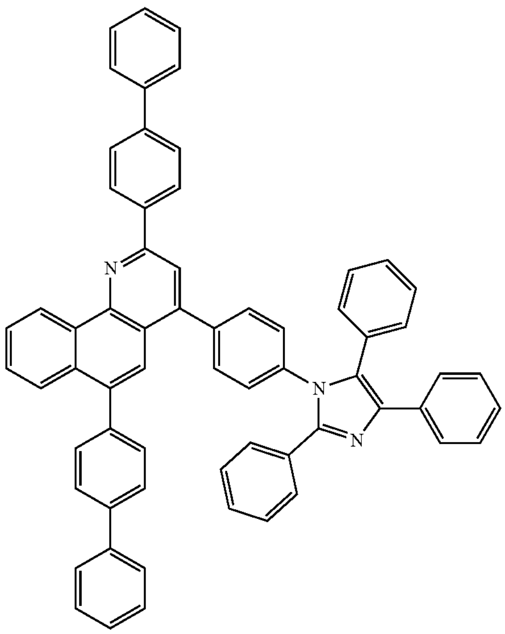
[Chemical Formula A72]
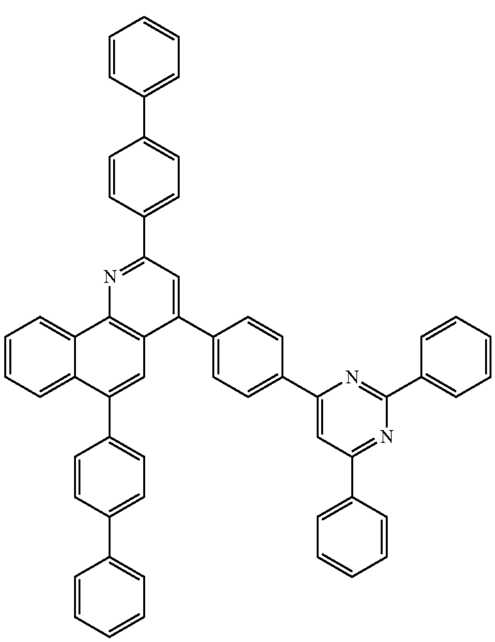
[Chemical Formula A73]
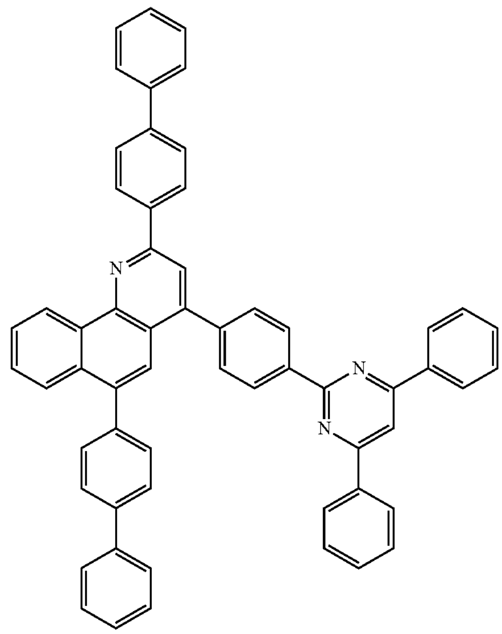
[Chemical Formula A74]
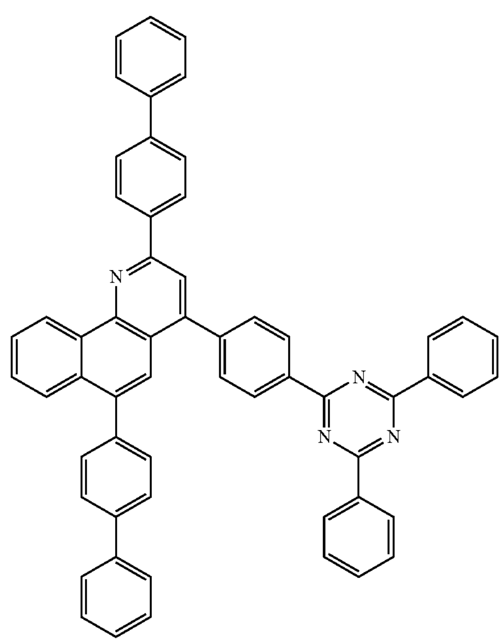

-continued
[Chemical Formula A75]
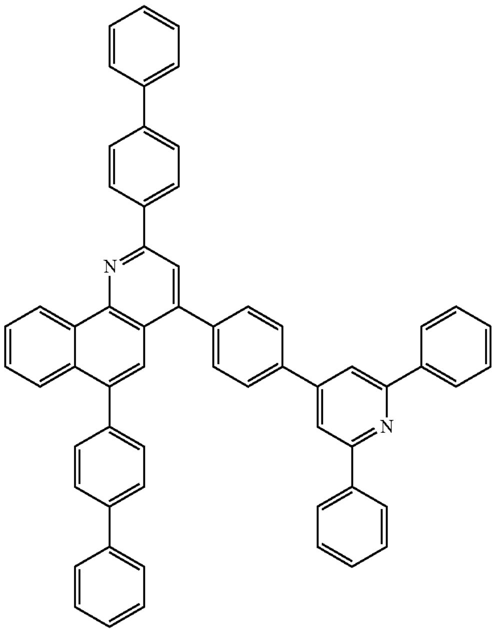
[Chemical Formula A76]
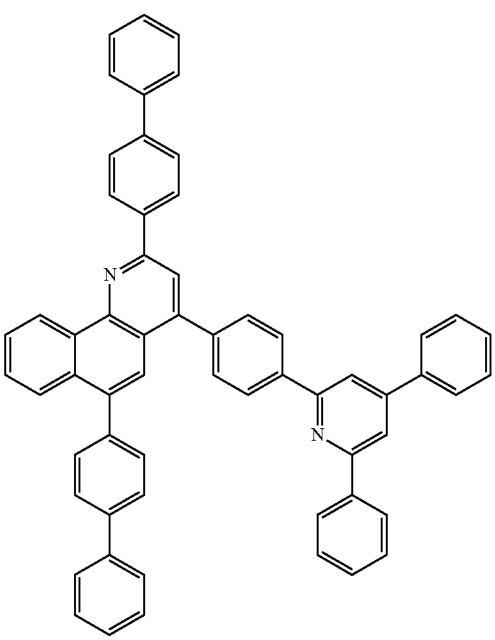
-continued
[Chemical Formula A77]
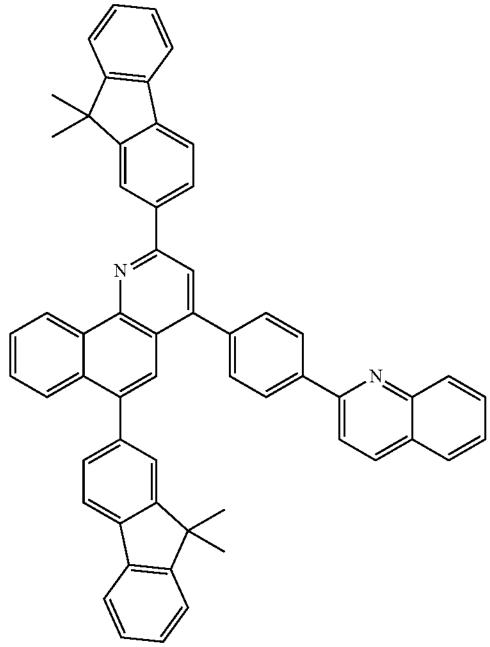
[Chemical Formula A78]
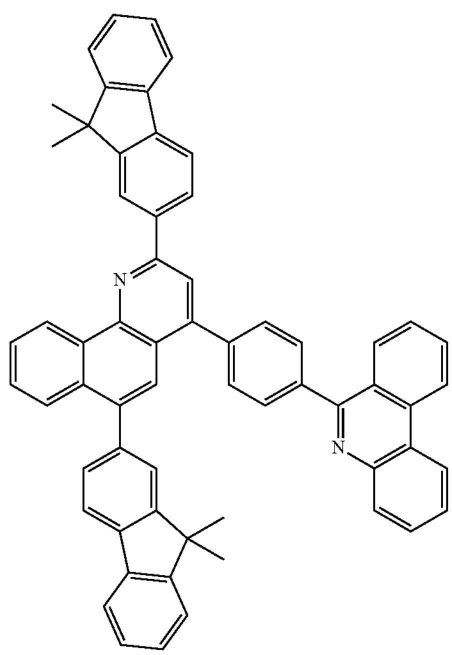

[Chemical Formula A79]
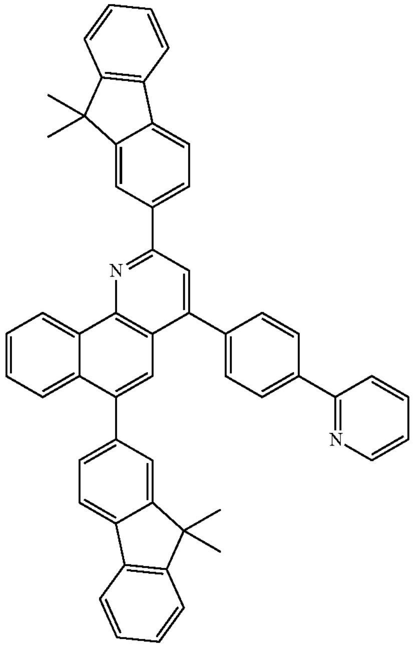
[Chemical Formula A80]
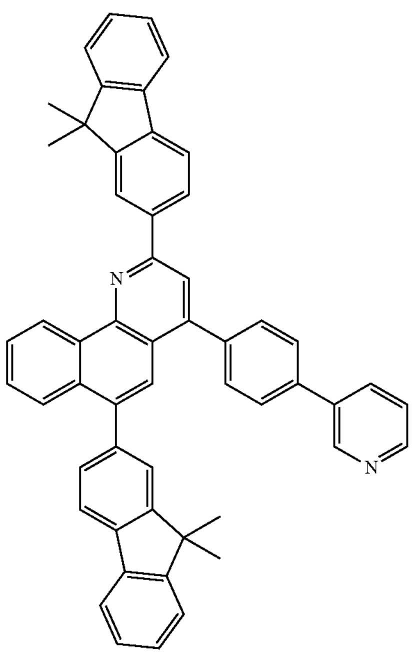
[Chemical Formula A81]
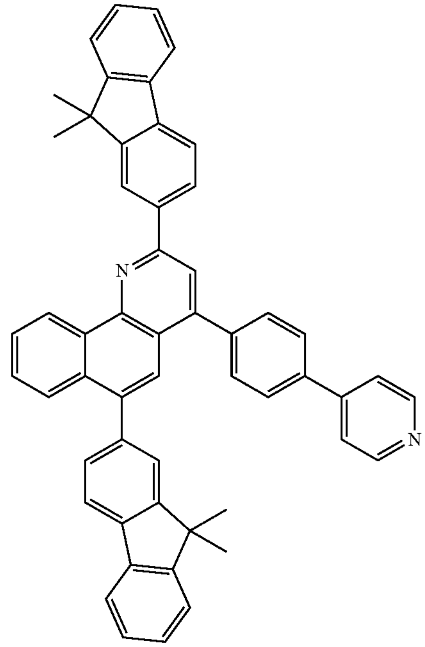
[Chemical Formula A82]
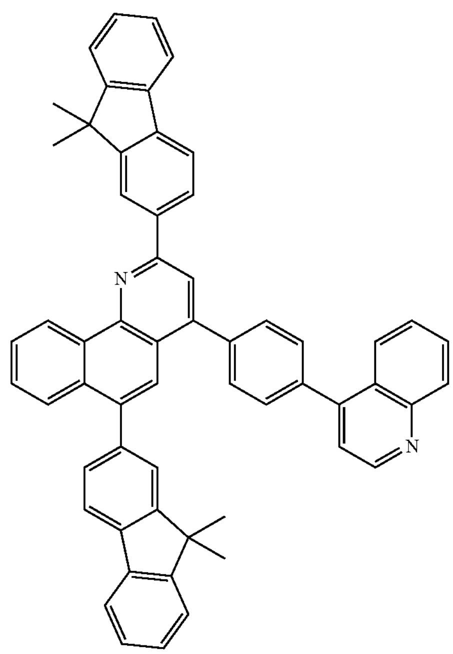

-continued
[Chemical Formula A83]
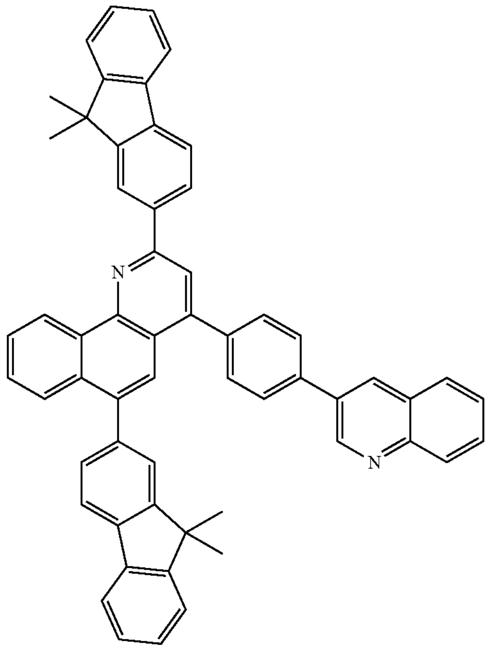
[Chemical Formula A84]
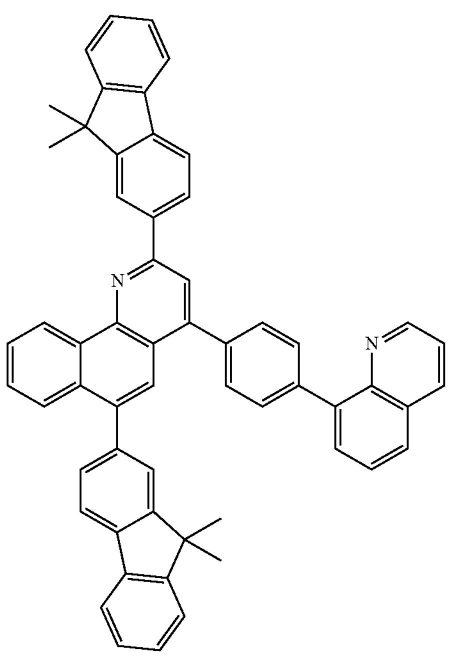
-continued
[Chemical Formula A85]
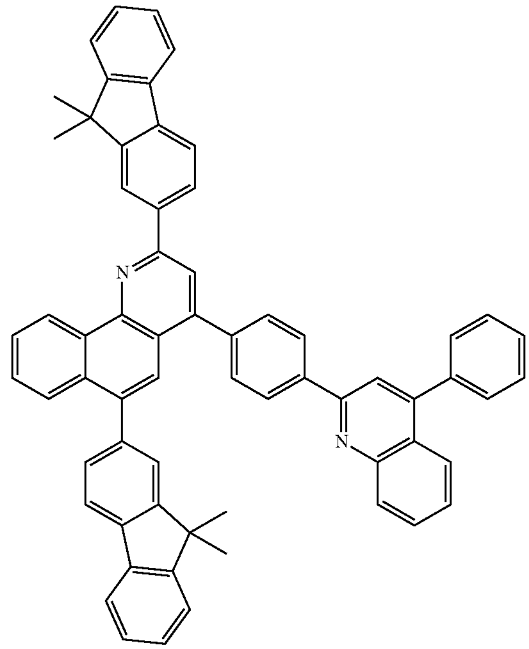
[Chemical Formula A86]
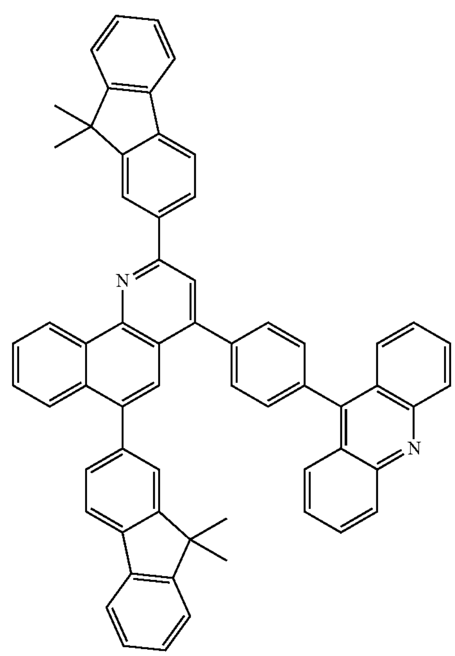

-continued
[Chemical Formula A87]
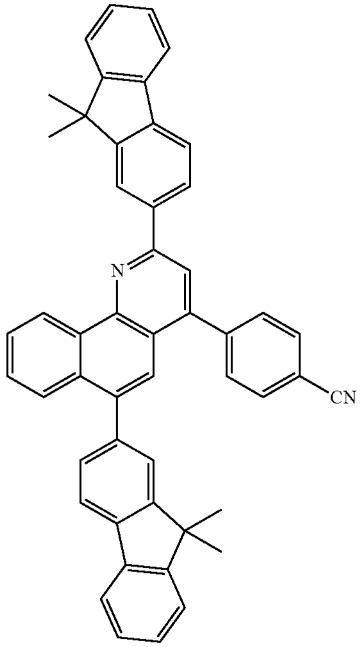
[Chemical Formula A88]
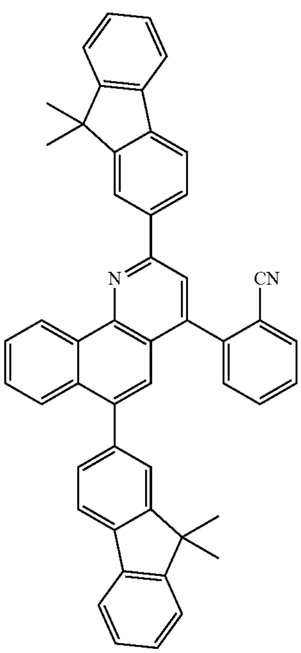
-continued
[Chemical Formula A89]
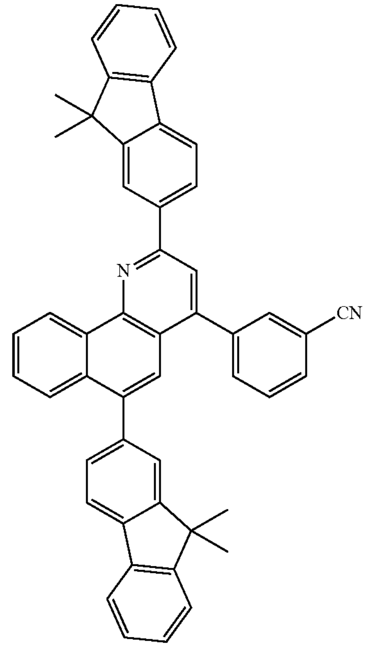
[Chemical Formula A90]
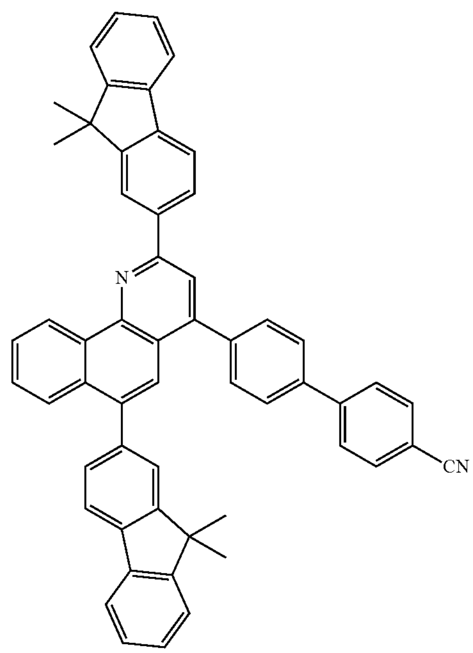

-continued
[Chemical Formula A91]
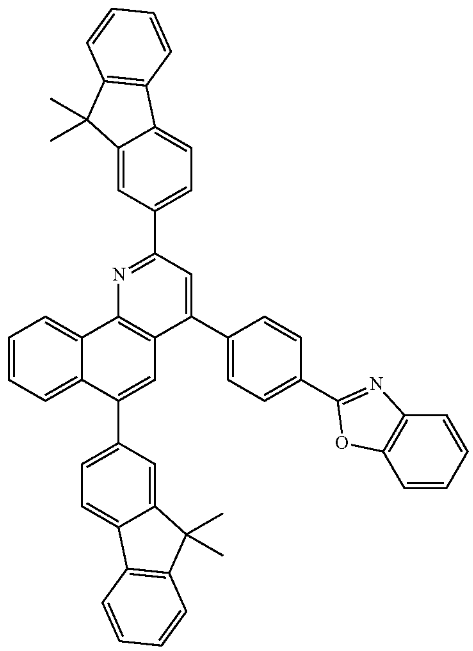
[Chemical Formula A92]
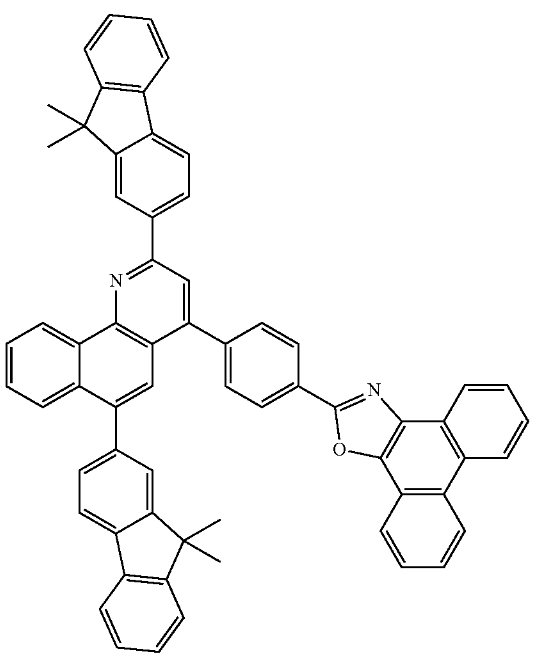
-continued
[Chemical Formula A93]
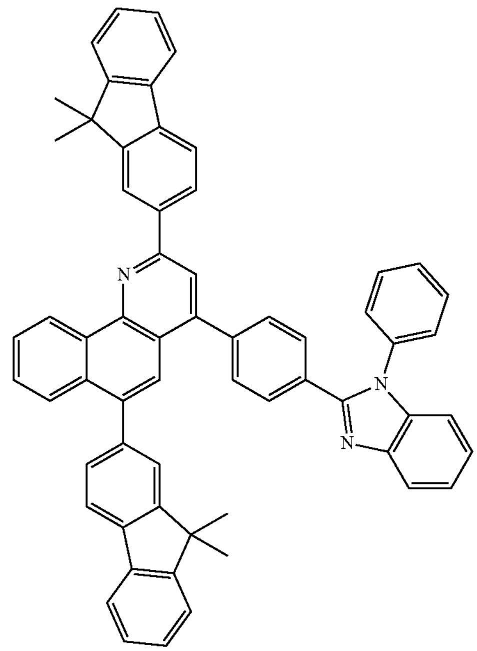
[Chemical Formula A94]
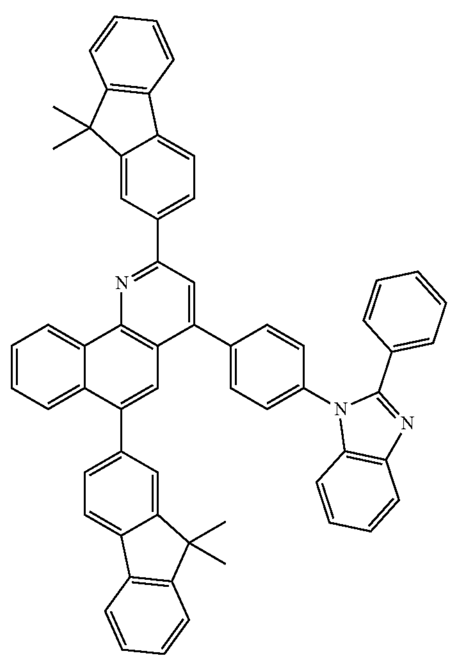

-continued
[Chemical Formula A95]
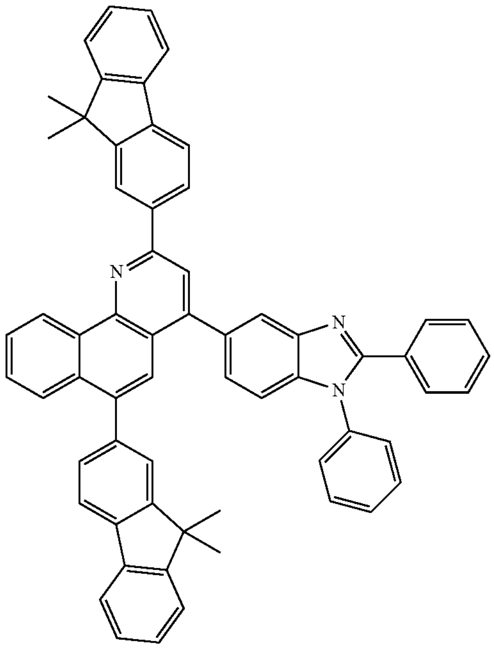
[Chemical Formula A96]
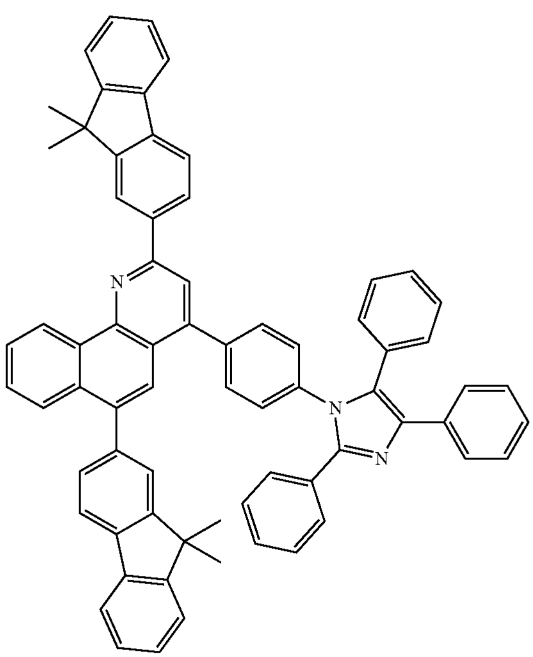
-continued
[Chemical Formula A97]
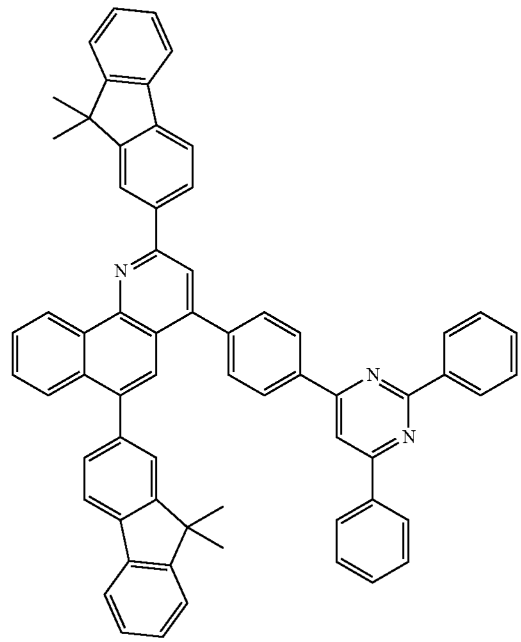
[Chemical Formula A98]
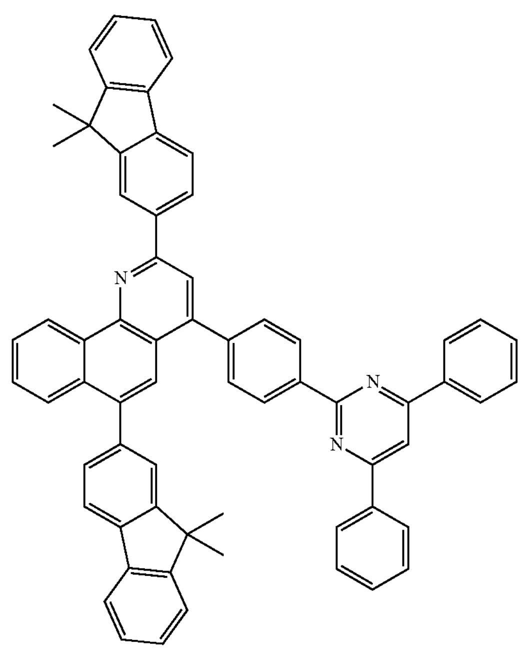

-continued
[Chemical Formula A99]
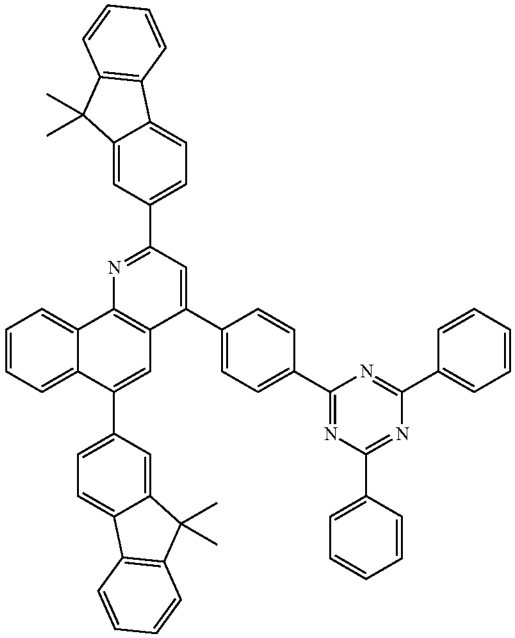
-continued
[Chemical Formula A101]
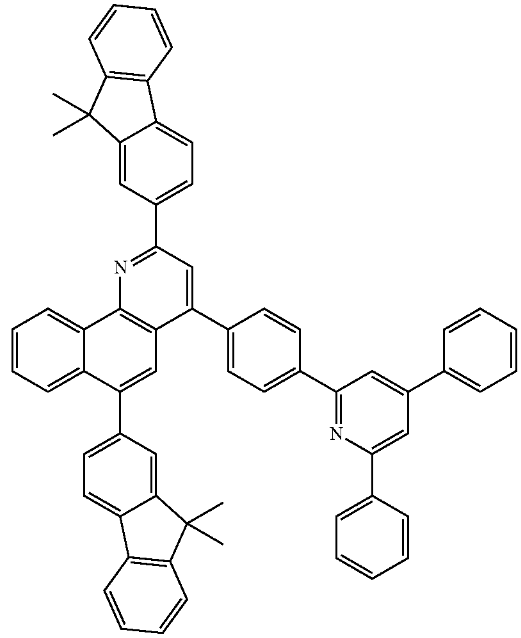
[Chemical Formula A100]
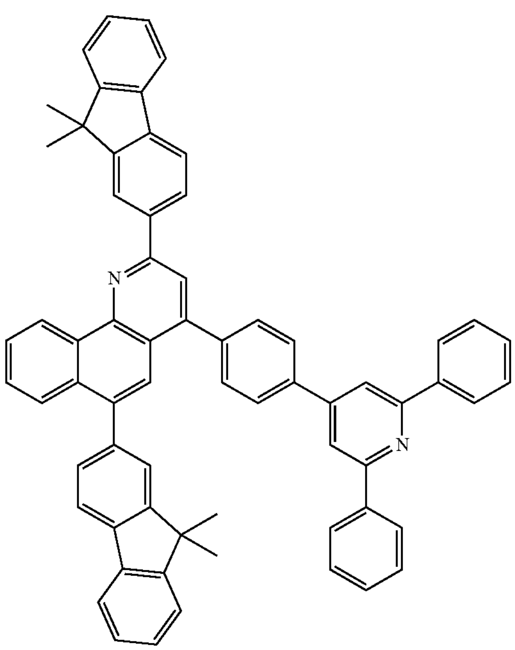
[Chemical Formula A102]
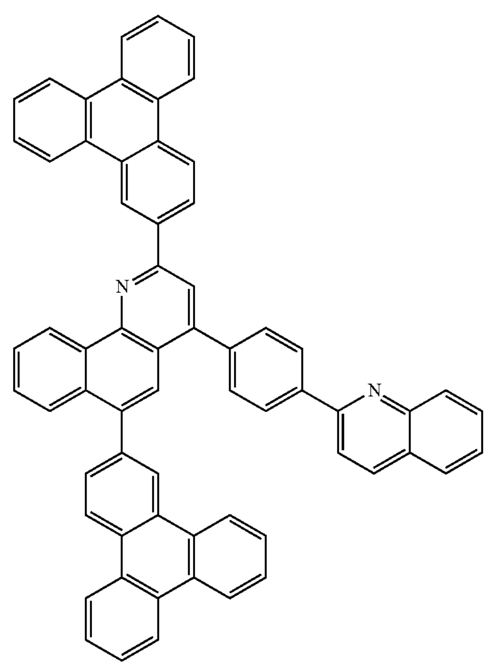

-continued
[Chemical Formula A103]
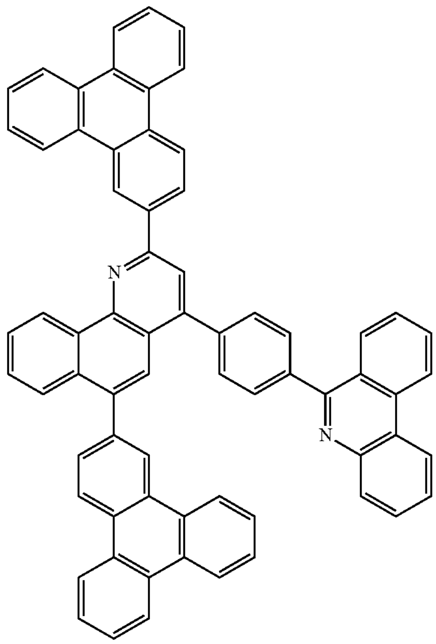
[Chemical Formula A104]
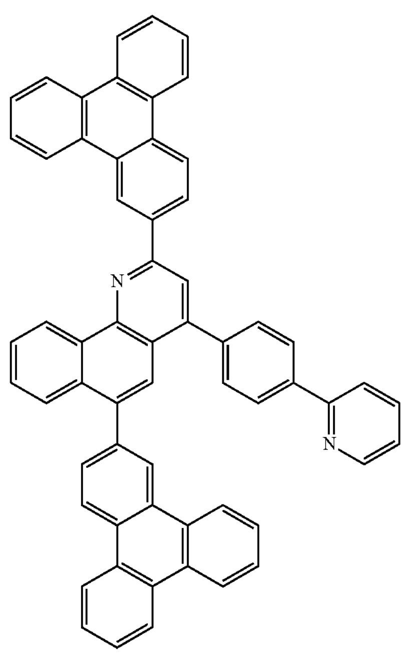
-continued
[Chemical Formula A105]
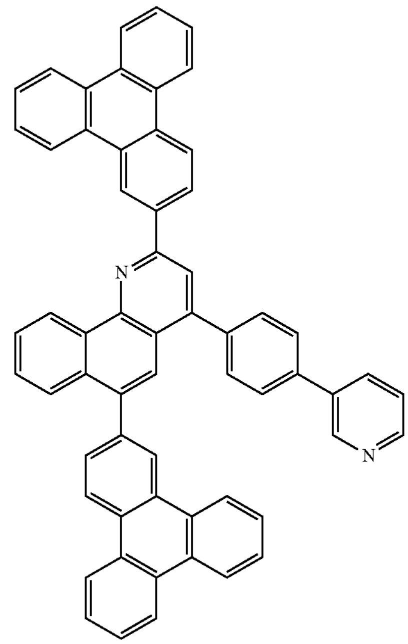
[Chemical Formula A106]
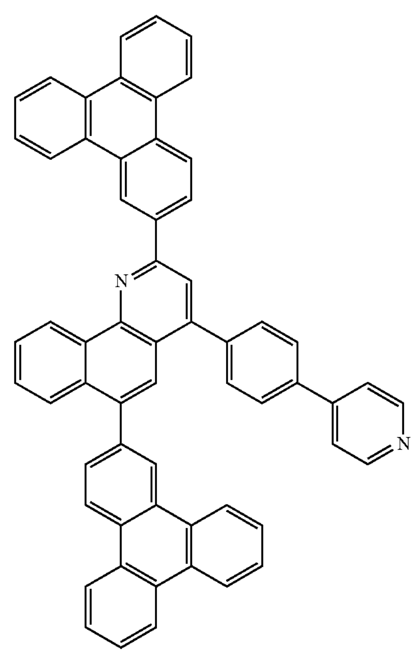

-continued
[Chemical Formula A107]
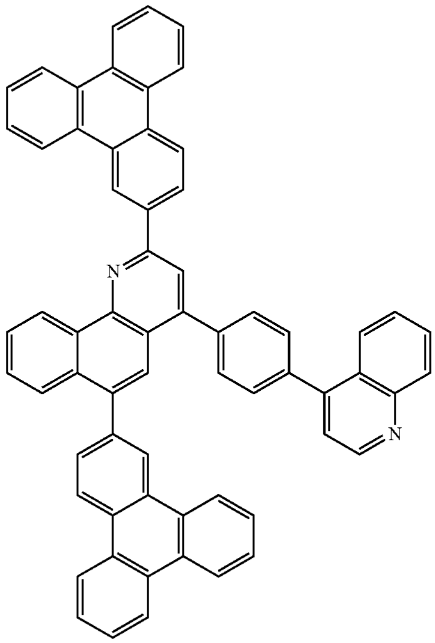
[Chemical Formula A108]
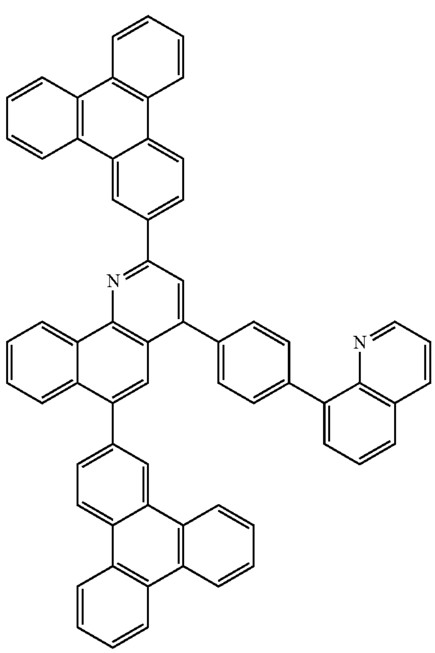
-continued
[Chemical Formula A109]
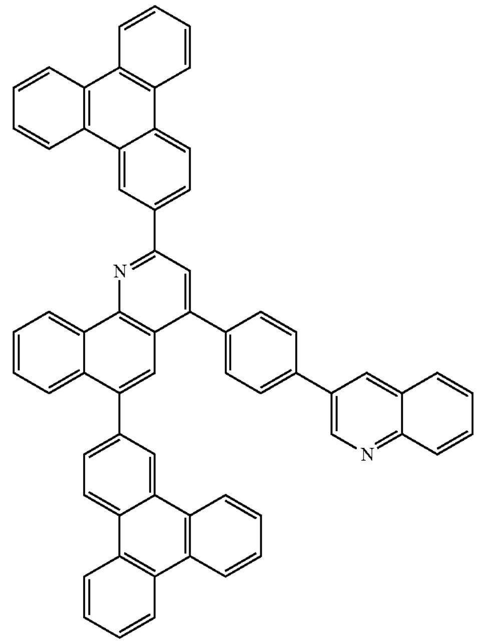
[Chemical Formula A110]
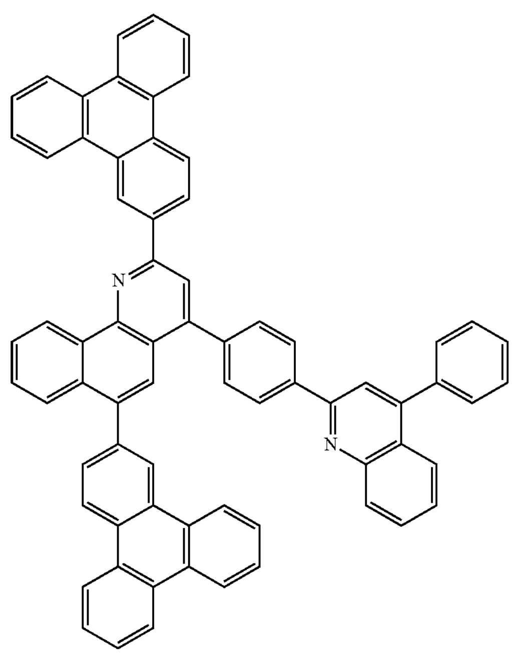

[Chemical Formula A111]
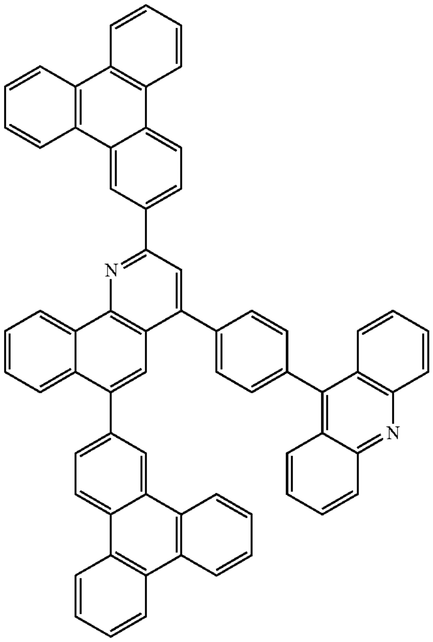
[Chemical Formula A112]
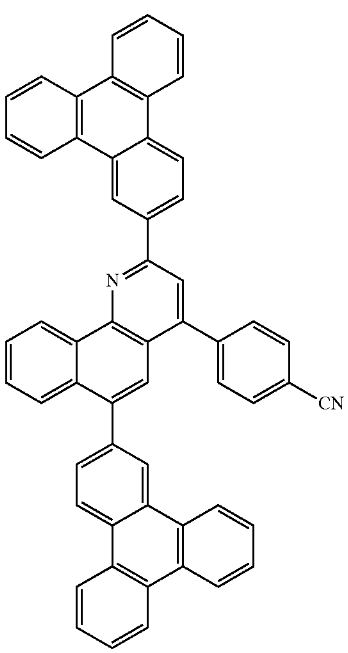
[Chemical Formula A113]
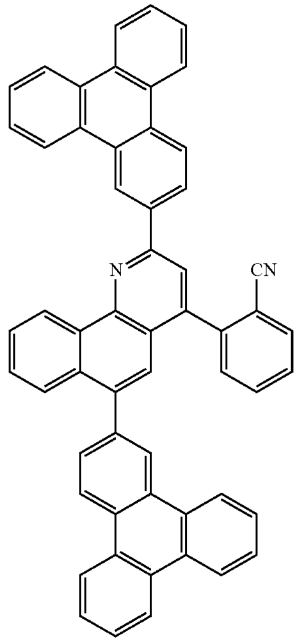
[Chemical Formula A114]
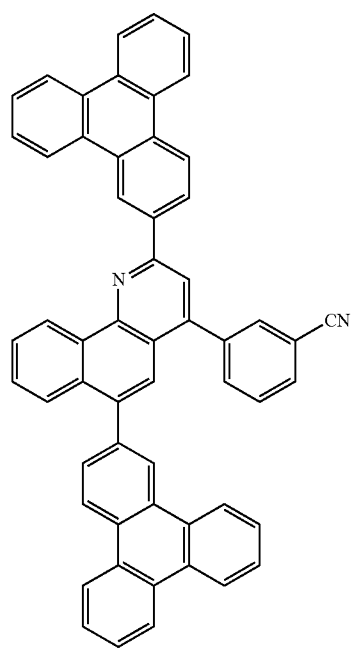

-continued
[Chemical Formula A115]
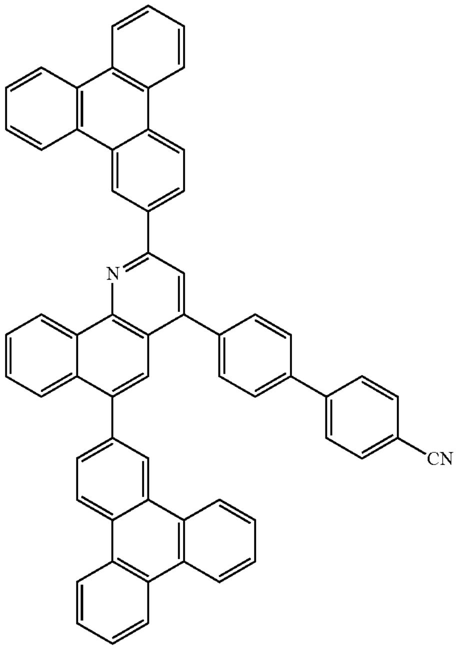
[Chemical Formula A116]
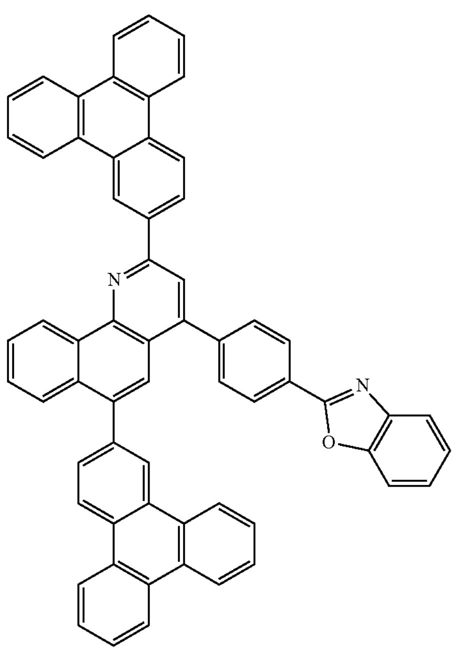
-continued
[Chemical Formula A117]
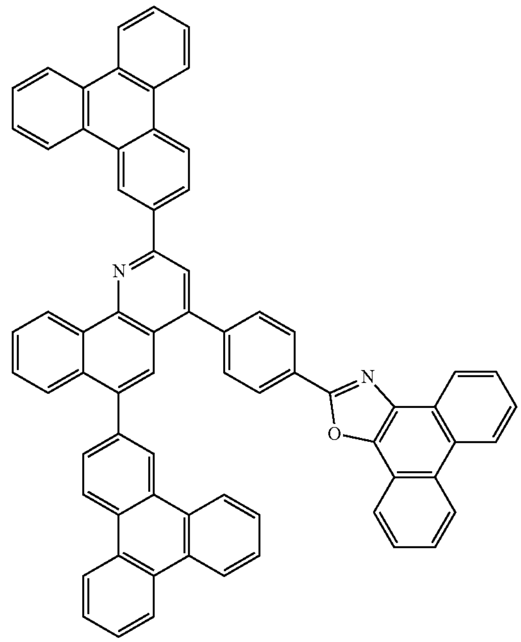
[Chemical Formula A118]
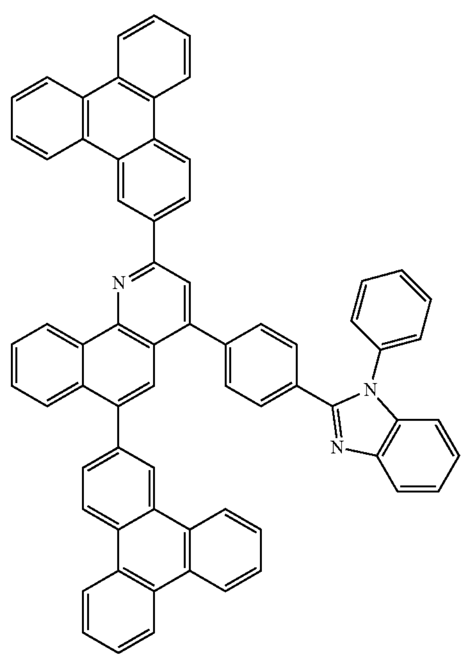

-continued
[Chemical Formula A119]
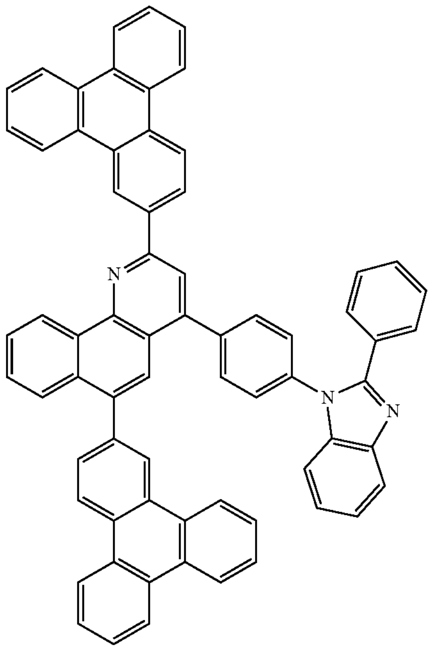
[Chemical Formula A120]
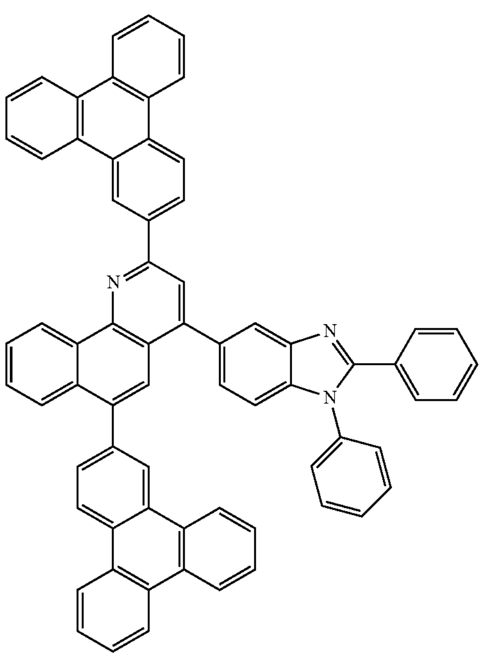
-continued
[Chemical Formula A121]
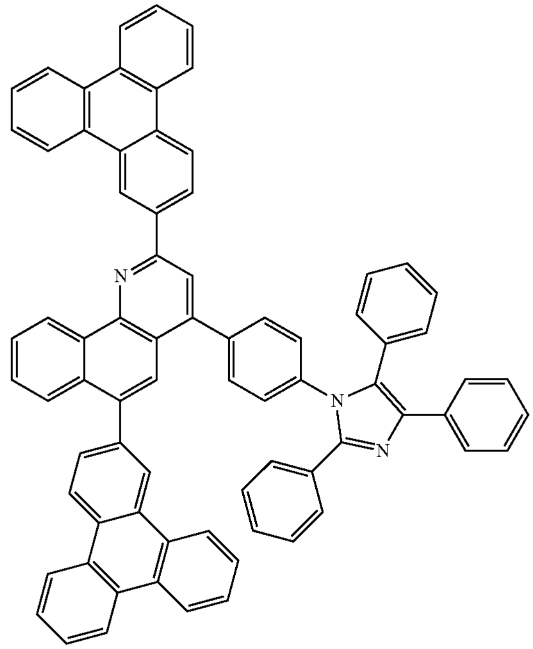
[Chemical Formula A122]
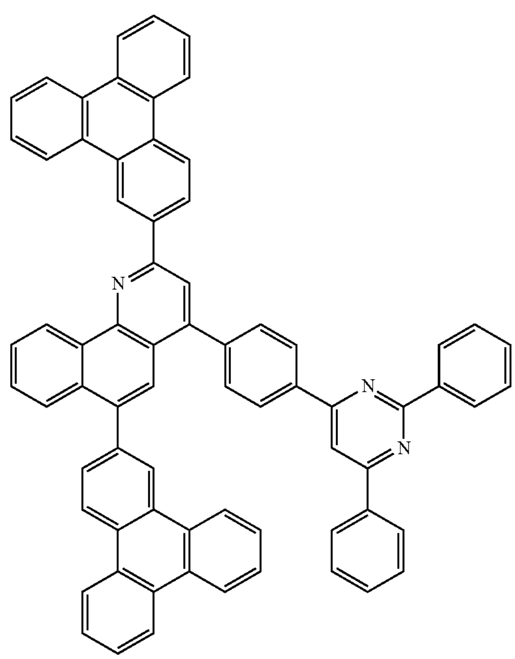

-continued
[Chemical Formula A123]
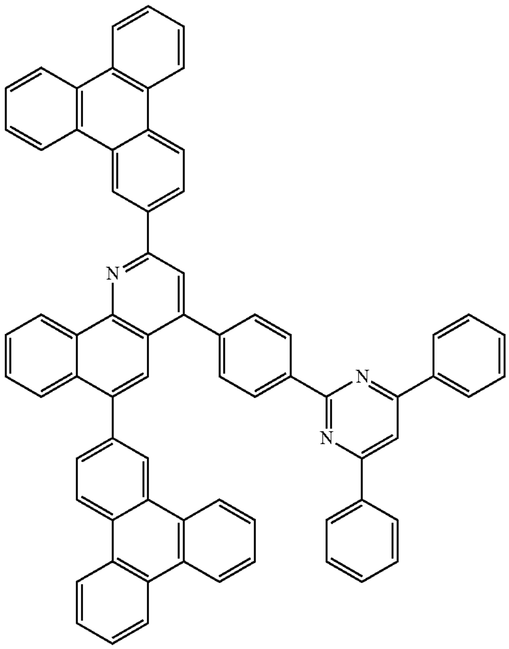
[Chemical Formula A124]
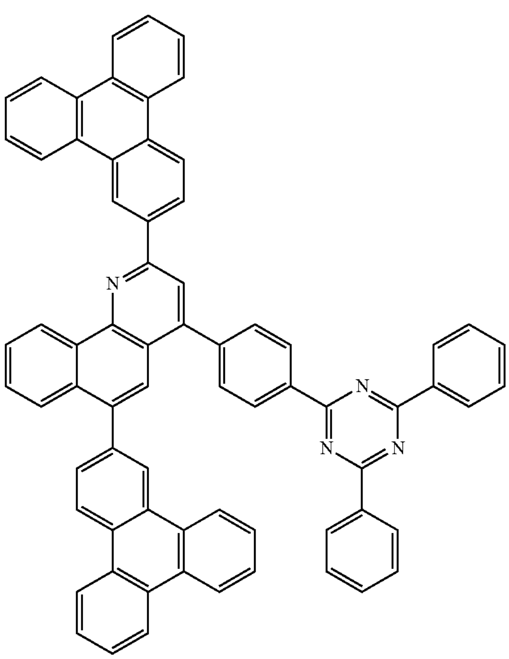
-continued
[Chemical Formula A125]
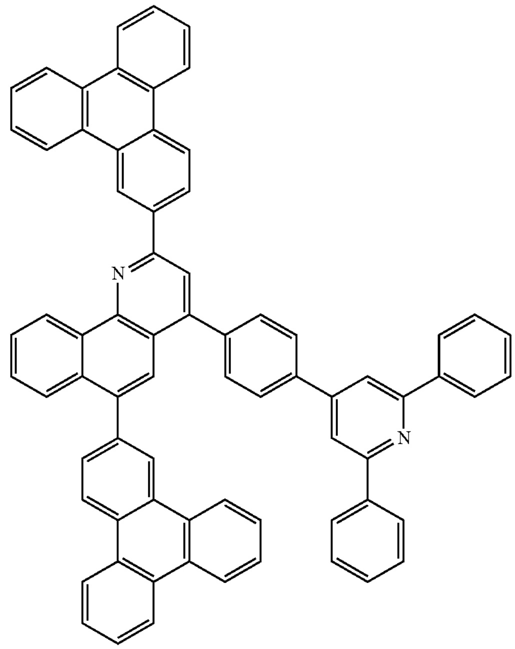
[Chemical Formula A126]
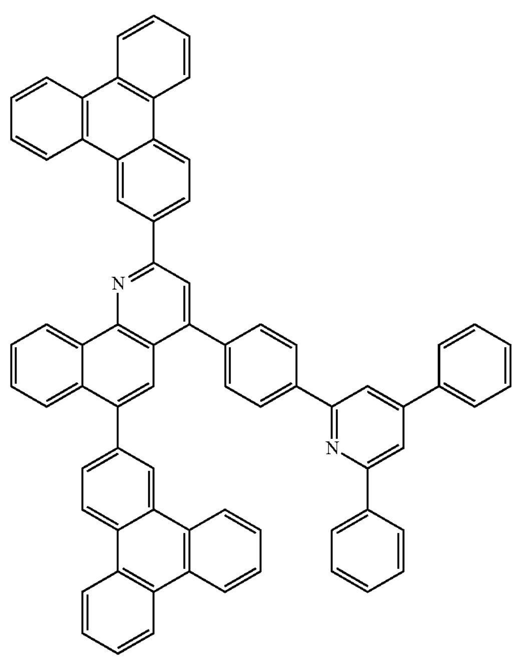

-continued
[Chemical Formula A127]
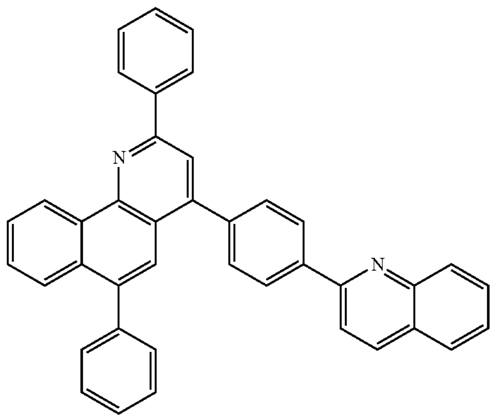
[Chemical Formula A128]
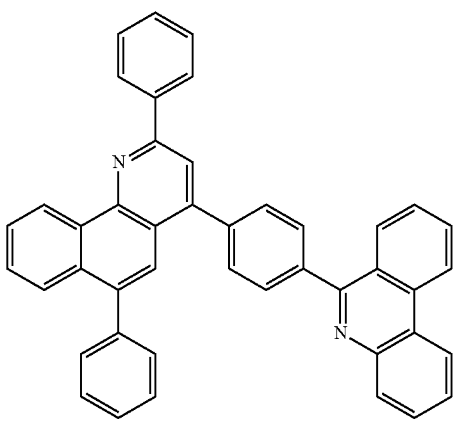
[Chemical Formula A129]
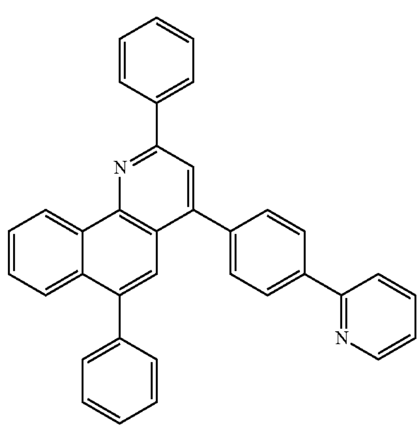
-continued
[Chemical Formula A130]
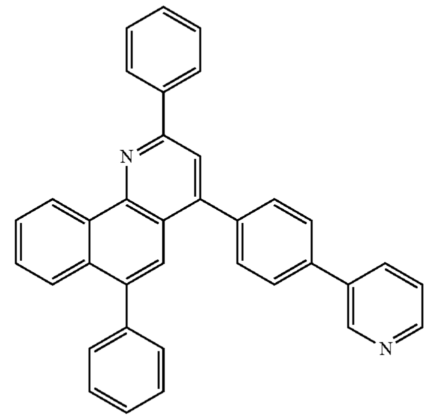
[Chemical Formula A131]
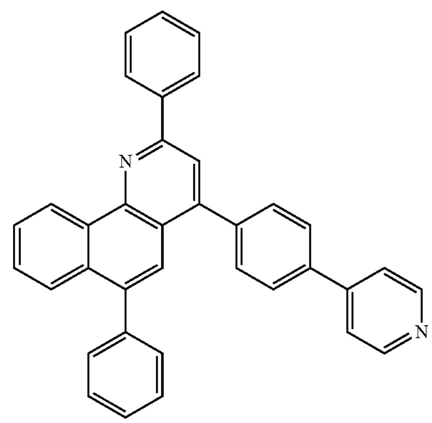
[Chemical Formula A132]
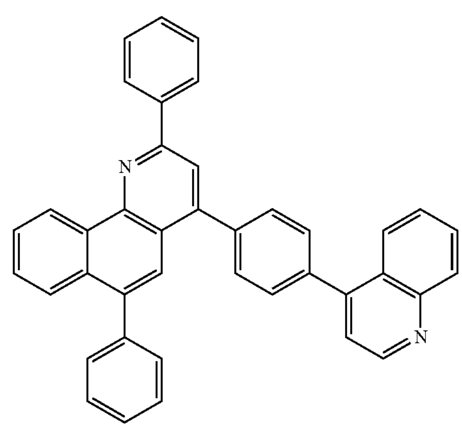

[Chemical Formula A133]
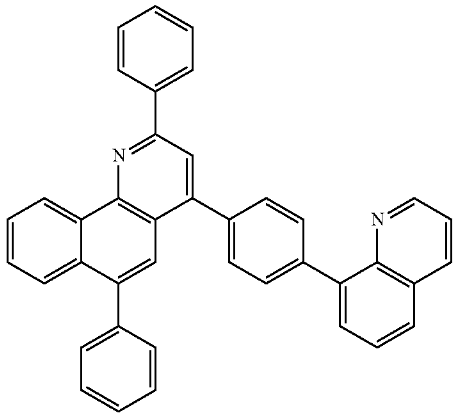
[Chemical Formula A134]
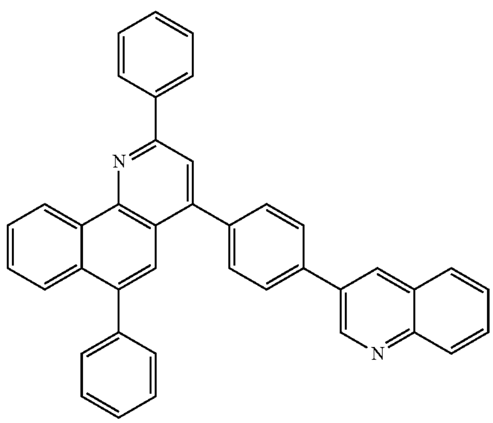
[Chemical Formula A135]
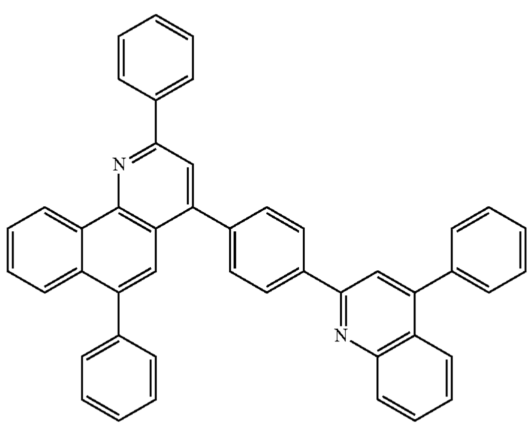
[Chemical Formula A136]
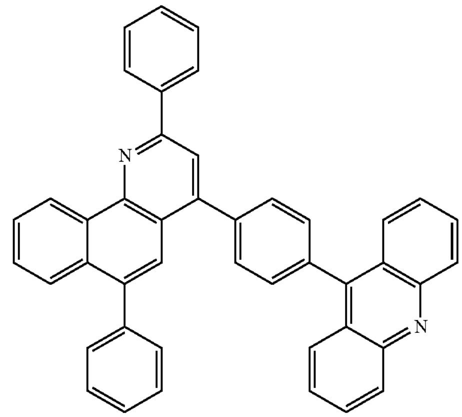
[Chemical Formula A137]
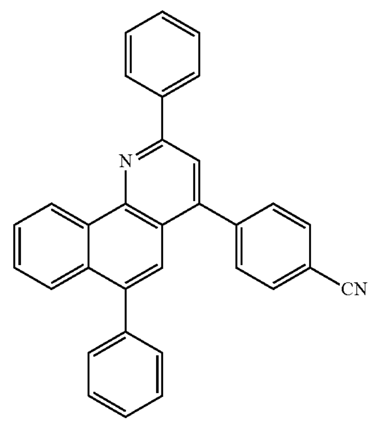
[Chemical Formula A138]
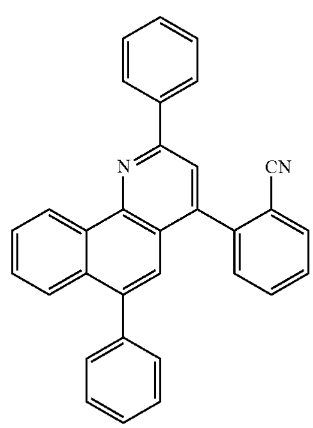

[Chemical Formula A139]
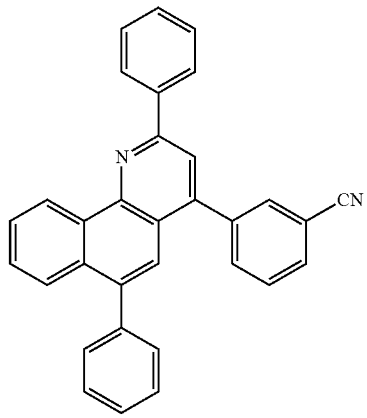
[Chemcial Formula A140]
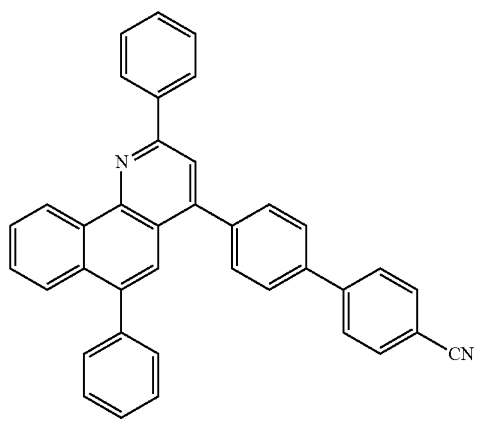
[Chemical Formula A141]
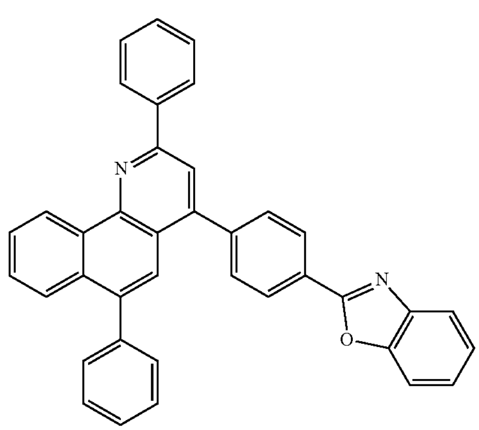
[Chemical Formula A142]
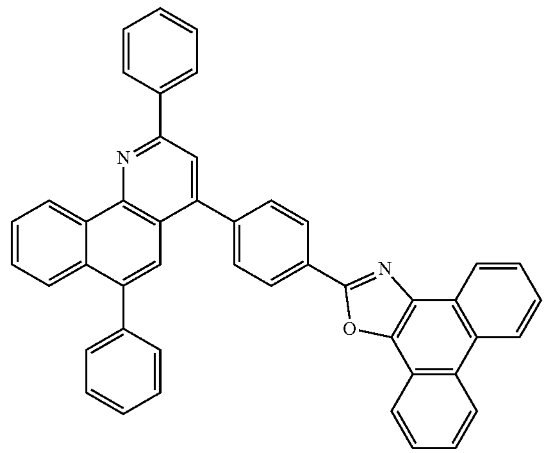
[Chemical Formula A142]
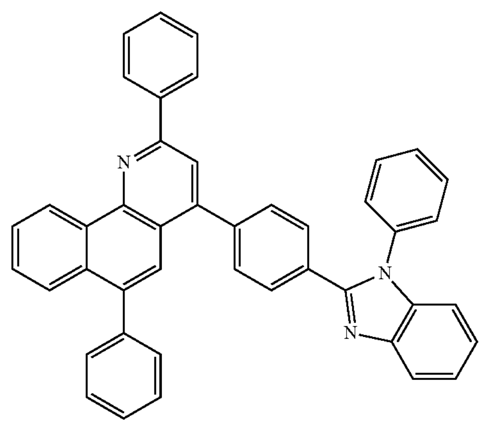 [SMILES: c1ccc(-c2cc(-c3ccc(-c4nc5ccccc5n4-c4ccccc4)cc3)c3cc(-c4ccccc4)c4ccccc4c3n2)cc1]
[Chemical Formula A144]
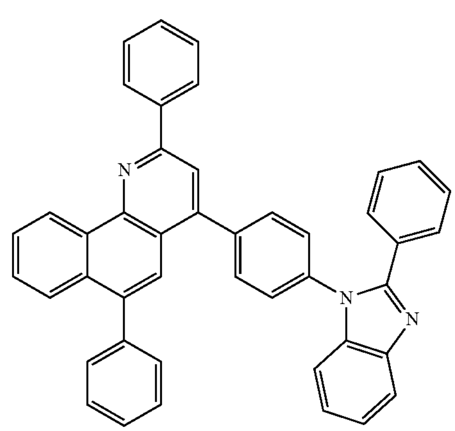

-continued
[Chemical Formula A145]
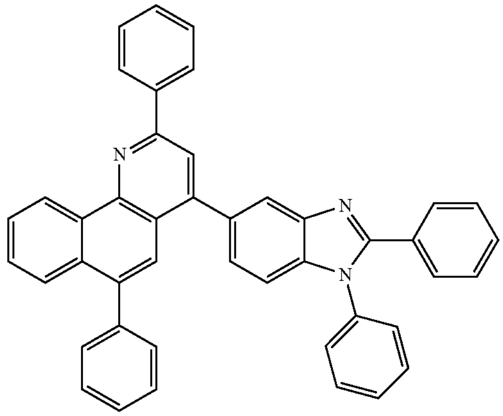
[Chemical Formula A146]
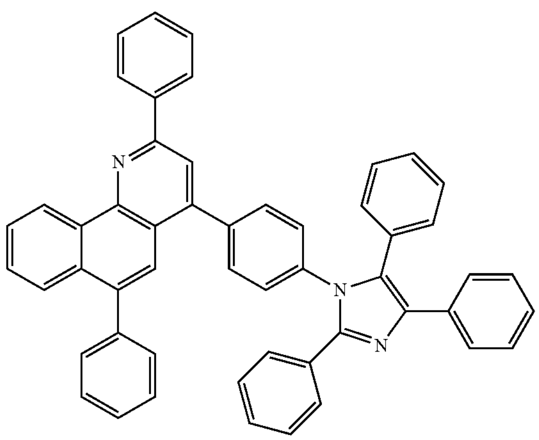
[Chemical Formula A147]
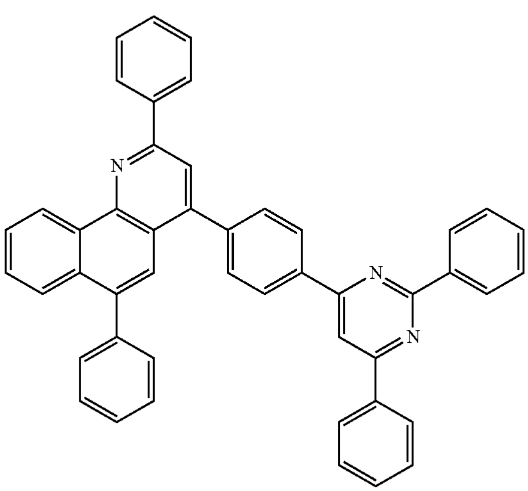
[Chemical Formula A148]
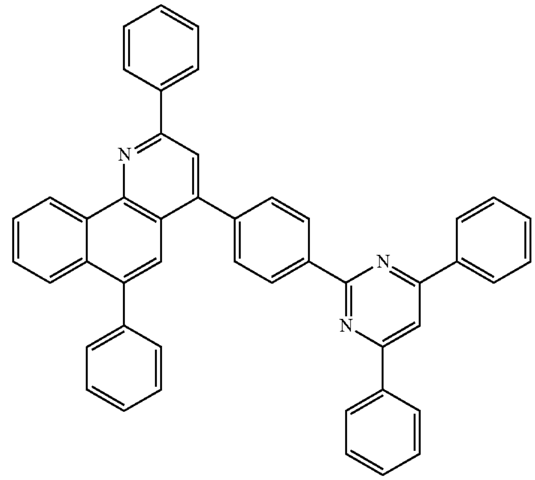
[Chemical Formula A149]
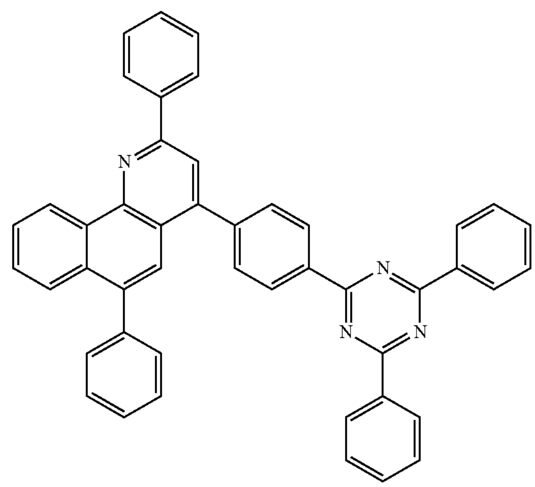
[Chemical Formula A150]
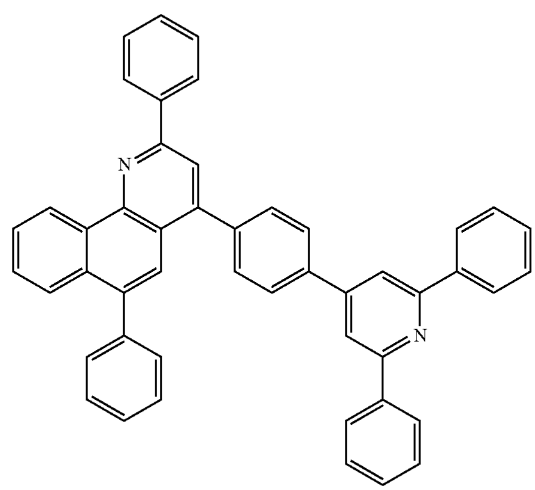

[Chemical Formula A151]
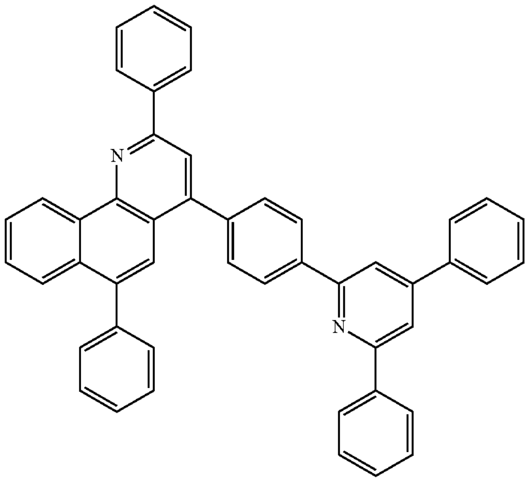
[Chemical Formula A152]
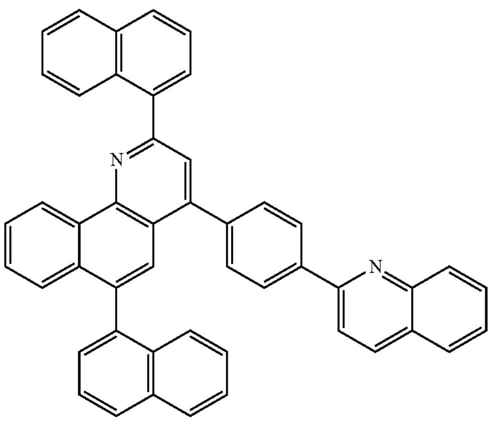
[Chemical Formula A153]
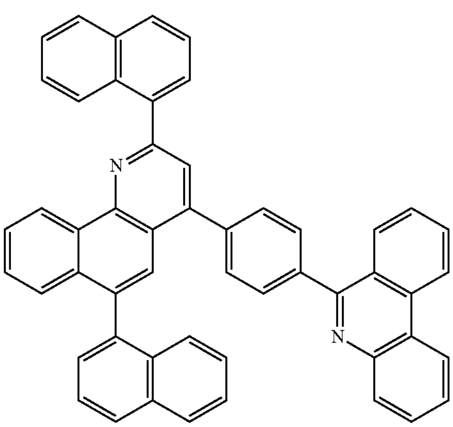
[Chemical Formula A154]
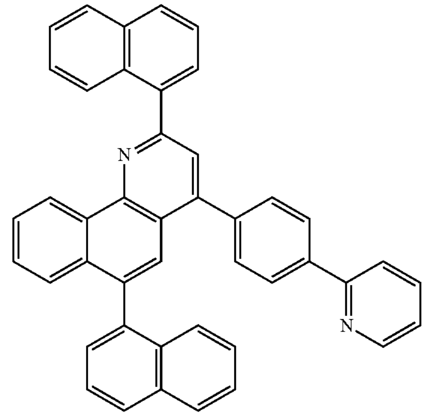
[Chemical Formula A155]
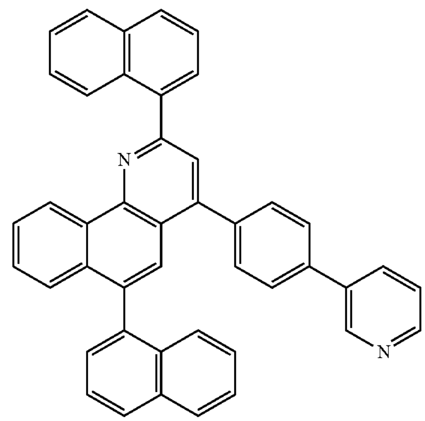
[Chemical Formula A156]
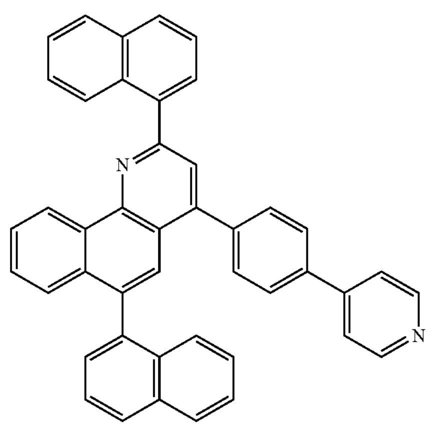

[Chemical Formula A157]
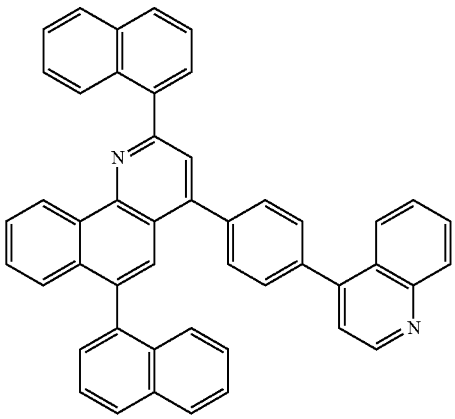
[Chemical Formula A158]
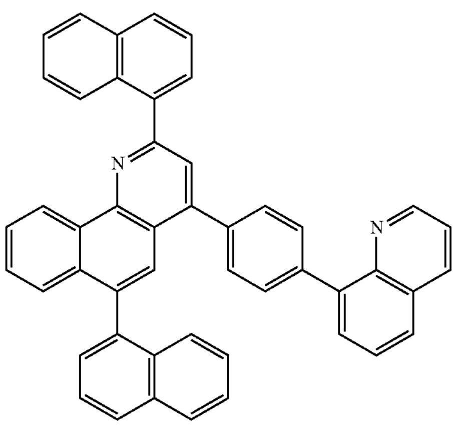
[Chemical Formula A159]
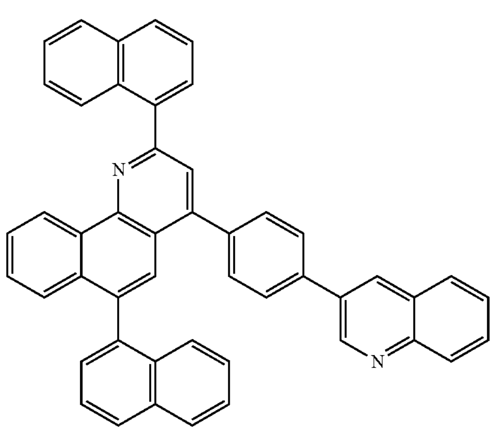
[Chemical Formula A160]
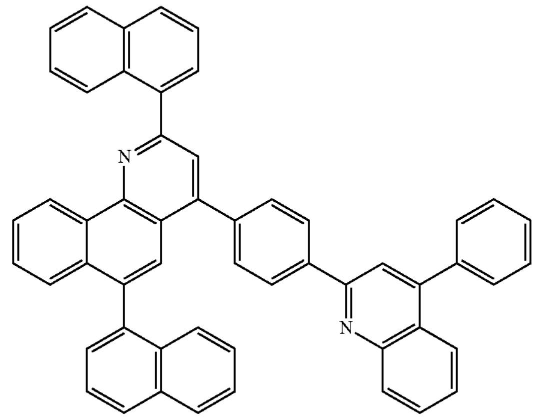
[Chemical Formula A161]
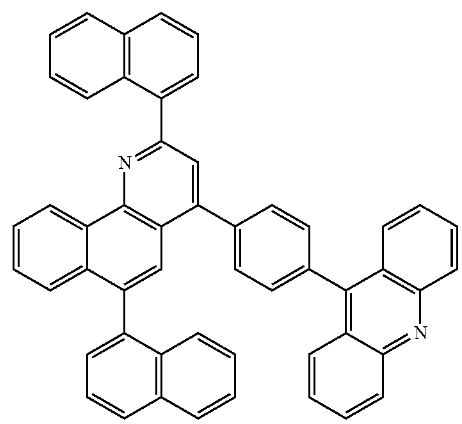
[Chemical Formula A162]
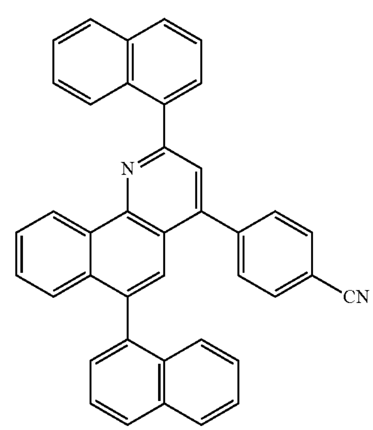

[Chemical Formula A163]
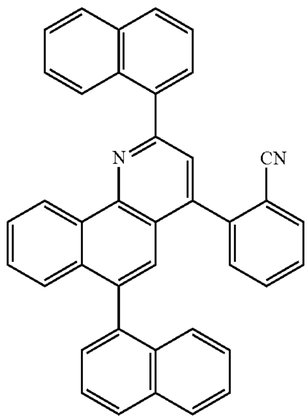
[Chemical Formula A164]
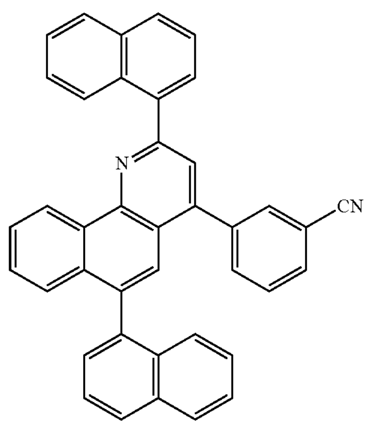
[Chemical Formula A165]
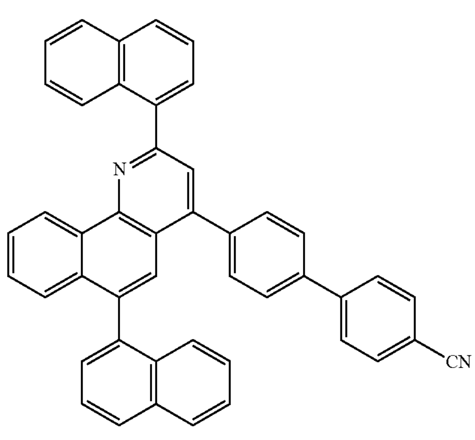
[Chemical Formula A166]
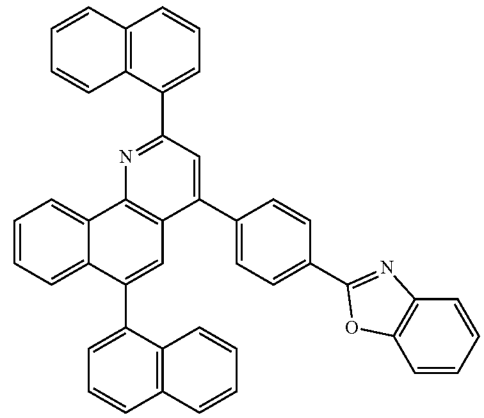
[Chemical Formula A167]
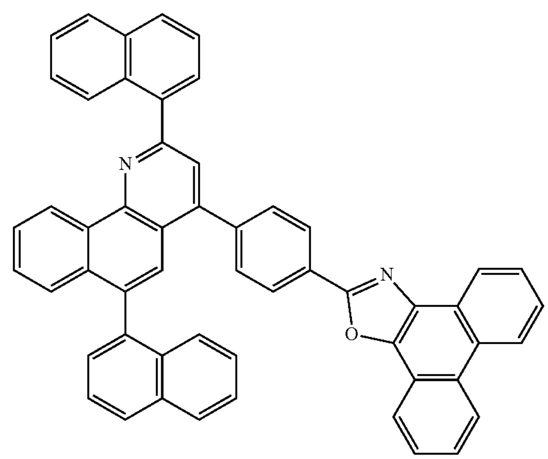
[Chemical Formula A168]
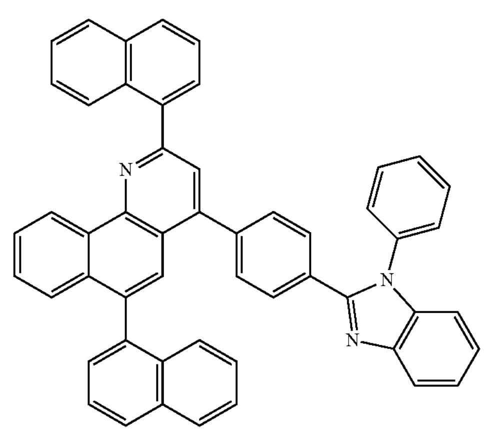

-continued
[Chemical Formula A169]
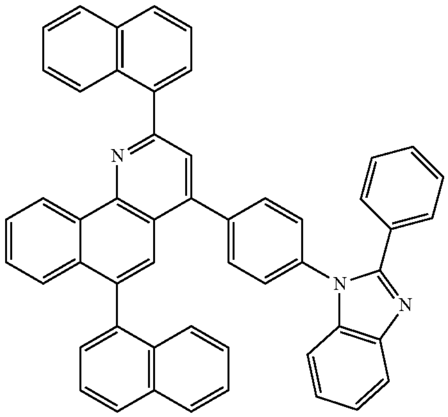
[Chemical Formula A170]
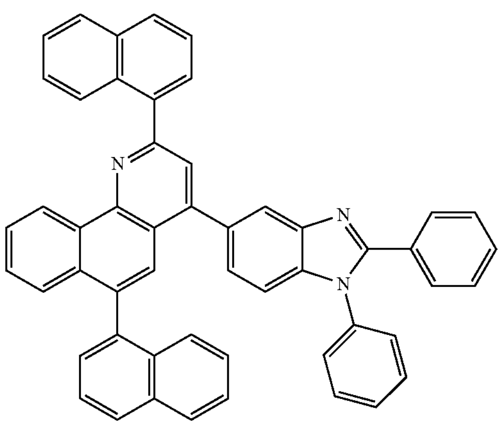
[Chemical Formula A171]
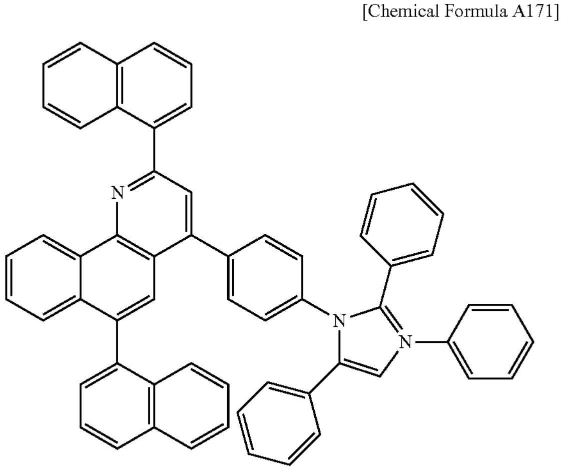
-continued
[Chemical Formula A172]
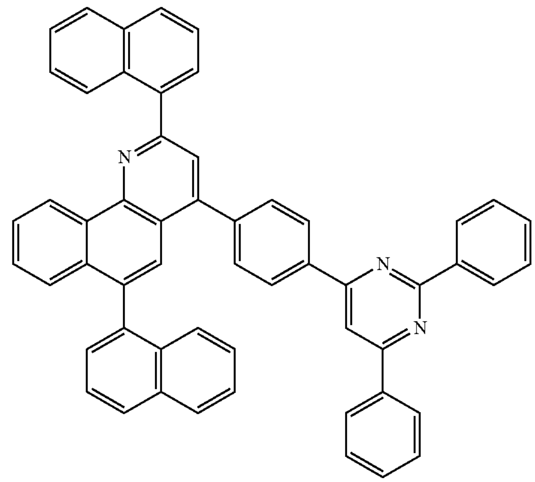
[Chemical Formula A173]
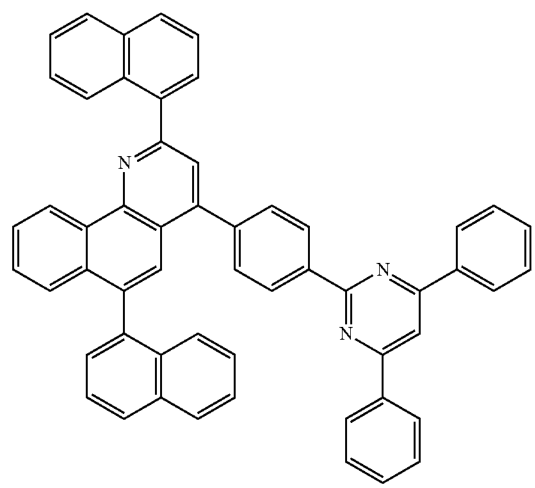
[Chemical Formula A174]
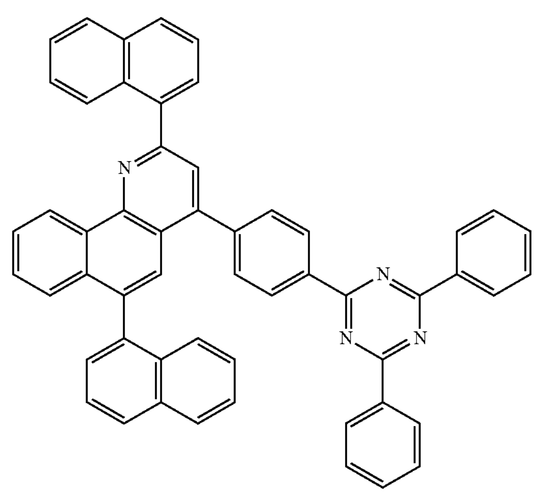

[Chemical Formula A175]
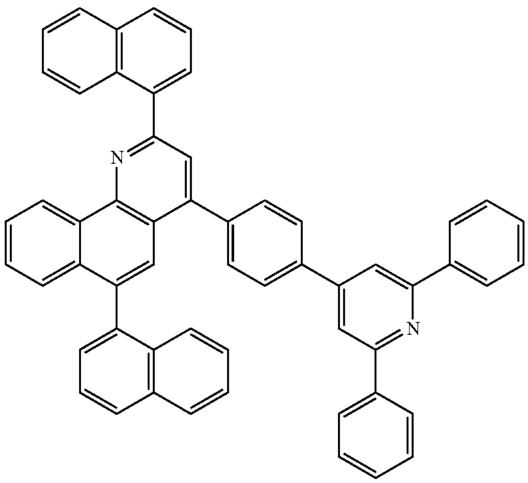
[Chemical Formula A176]
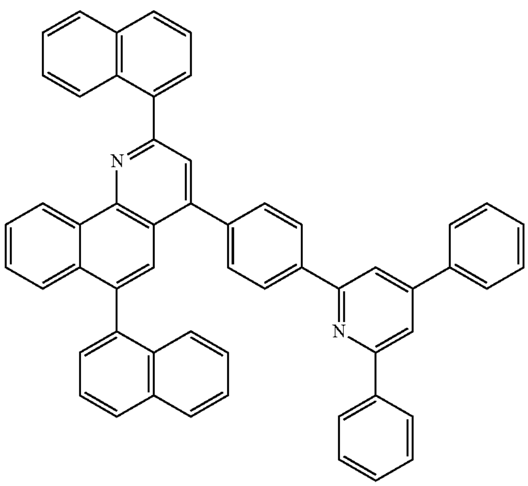
[Chemical Formula A177]
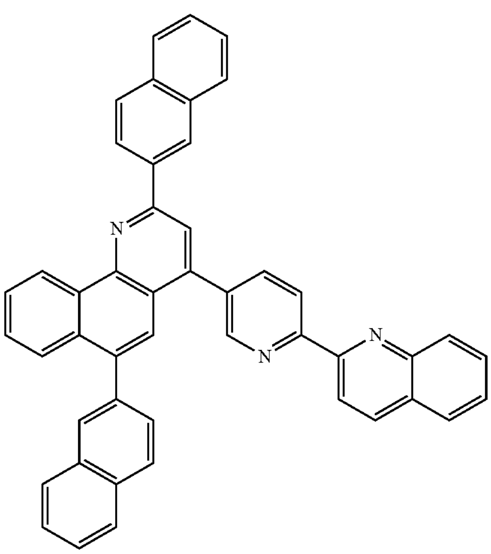
[Chemical Formula A178]
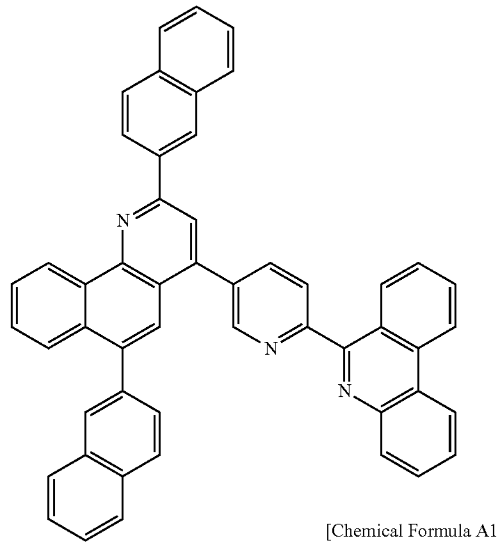
[Chemical Formula A179]
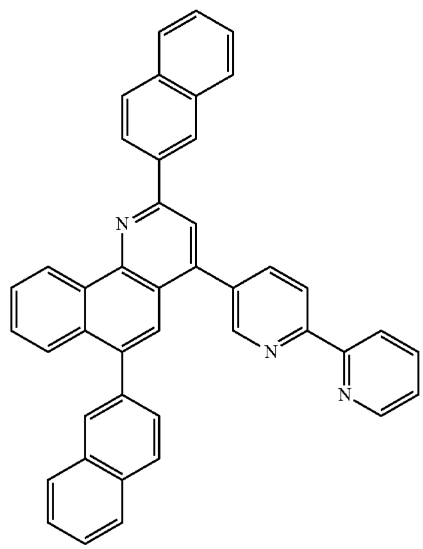
[Chemical Formula A180]
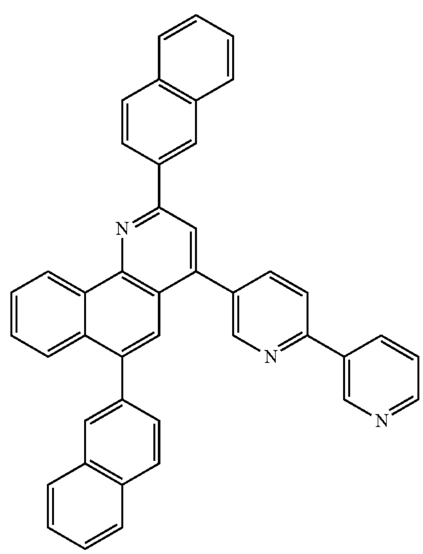

[Chemical Formula A181]
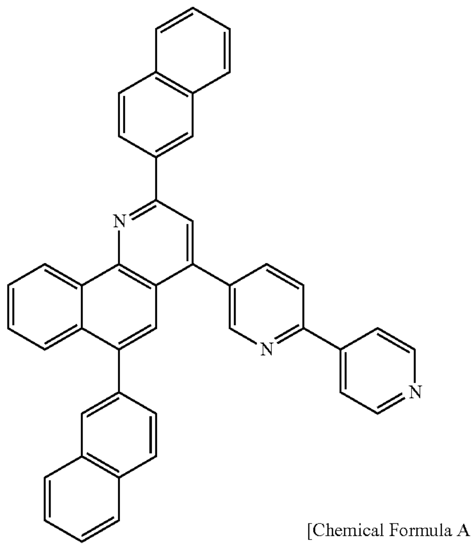
[Chemical Formula A182]
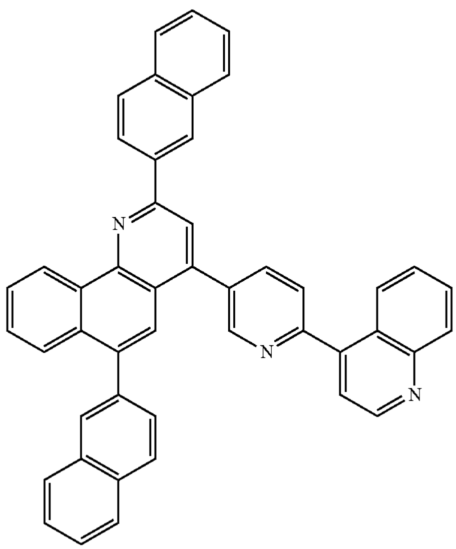
[Chemical Formula A183]
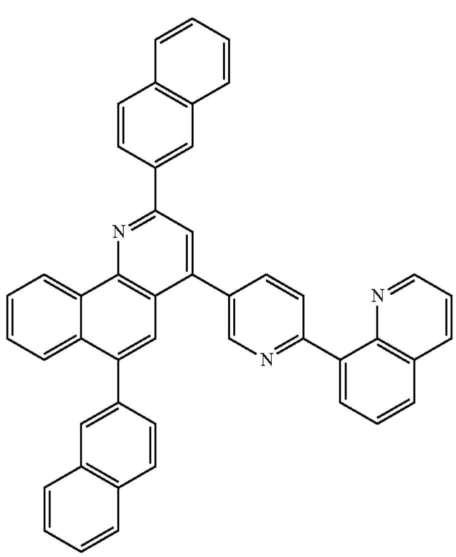
[Chemical Formula A184]
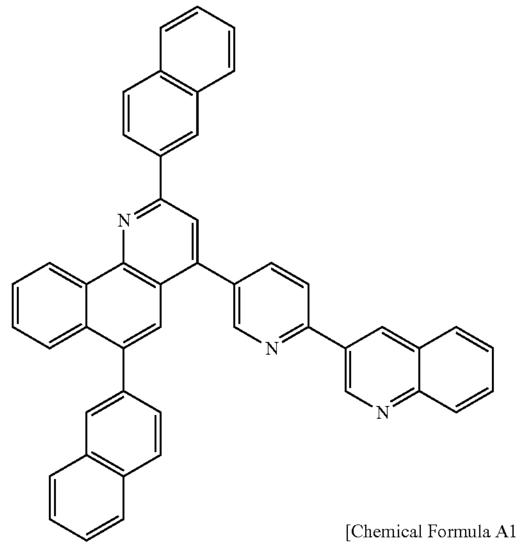
[Chemical Formula A185]
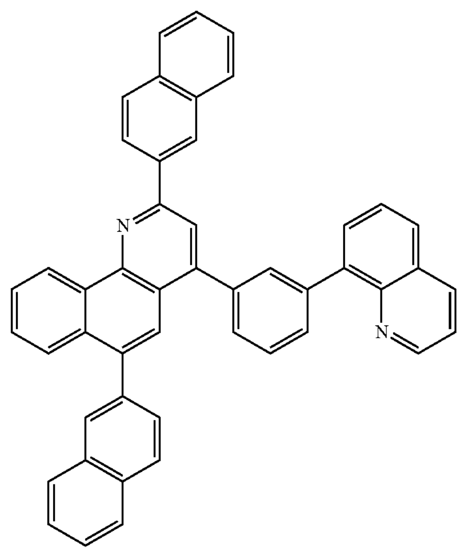
[Chemical Formula A186]
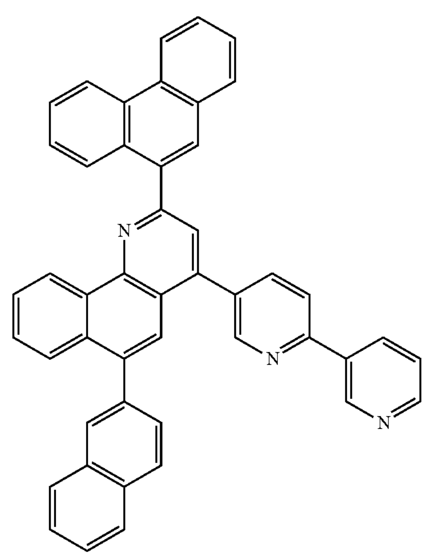

-continued
[Chemical Formula A187]
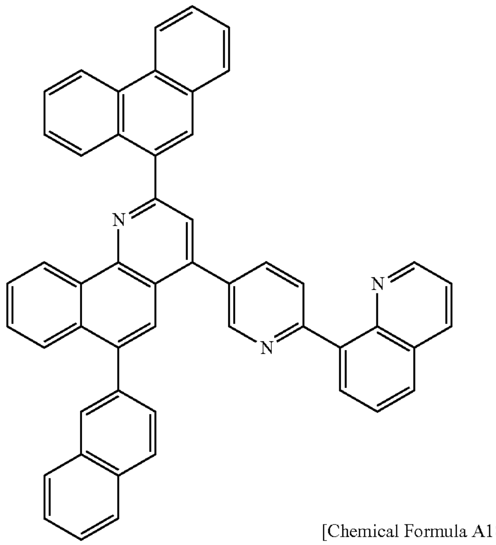
[Chemical Formula A188]
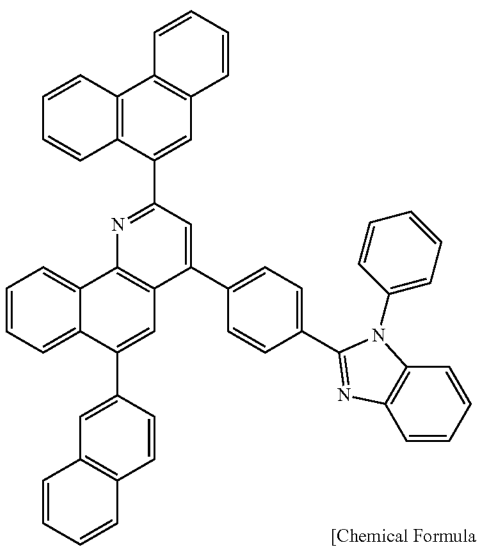
[Chemical Formula A189]
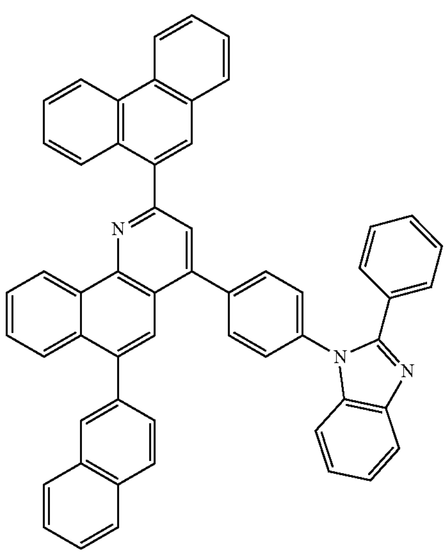
9. The compound for an organic optoelectronic device as claimed in claim 1, wherein the compound represented by Chemical Formula 2 is represented by one of the following Chemical Formulae B1 to B175 :
[Chemical Formula B1]
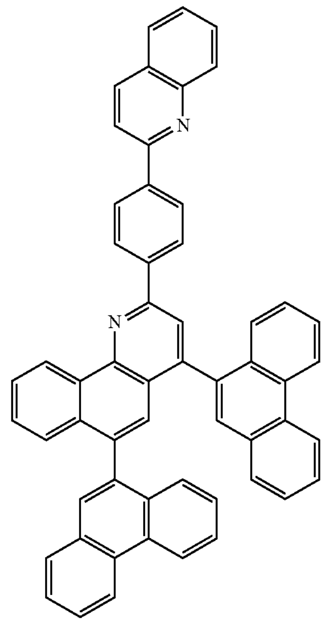
[Chemical Formula B2]
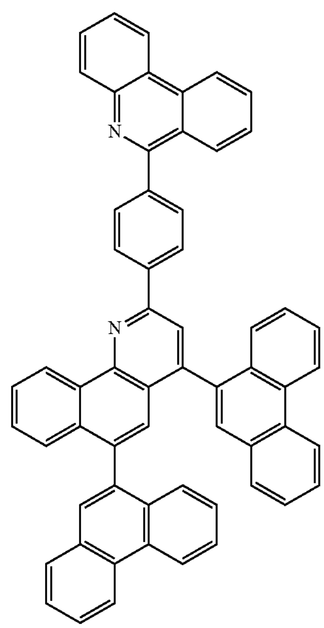

-continued
[Chemical Formula B3]
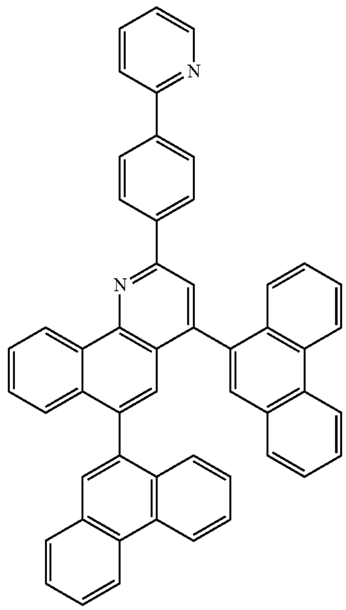
[Chemical Formula B4]
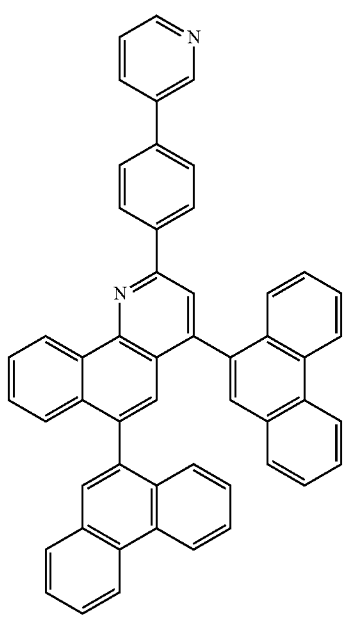
-continued
[Chemical Formula B5]
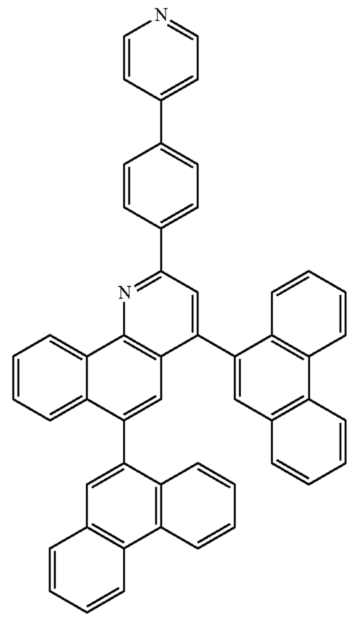
[Chemical Formula B6]
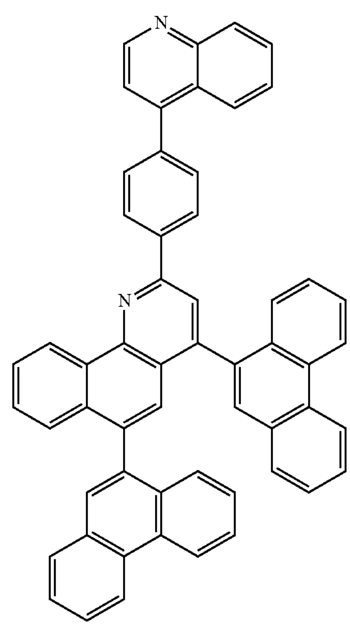

[Chemical Formula B7]
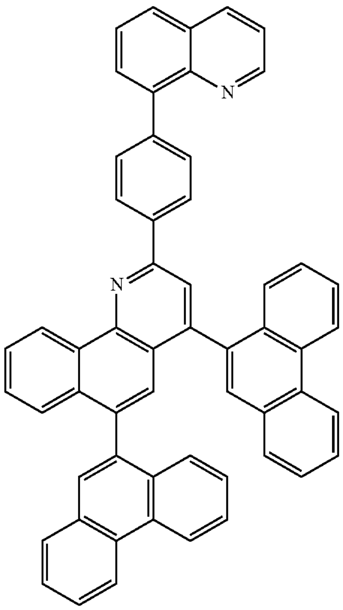
[Chemical Formula B8]
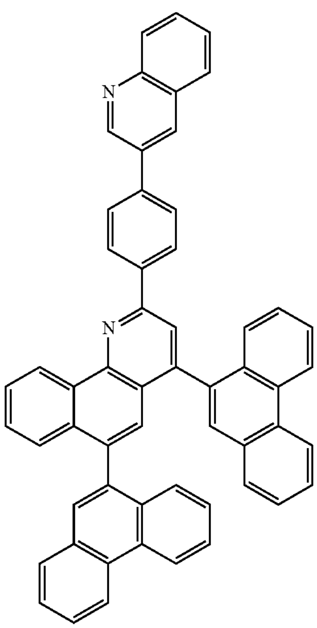
[Chemical Formula B9]
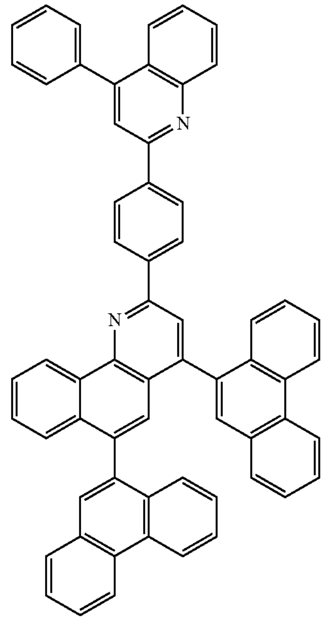
[Chemical Formula B10]
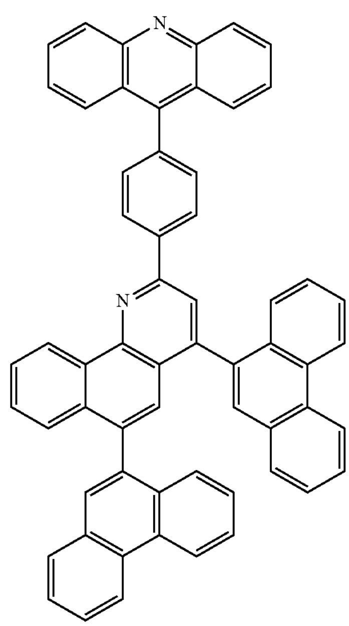

-continued
[Chemical Formula B11]
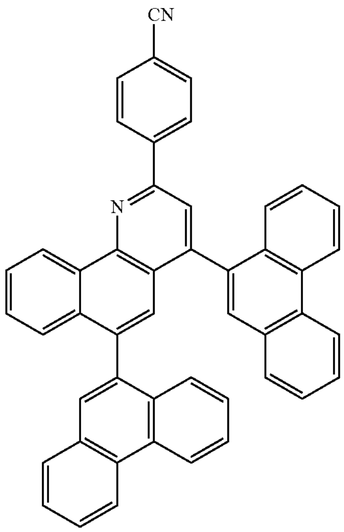
[Chemical Formula B12]
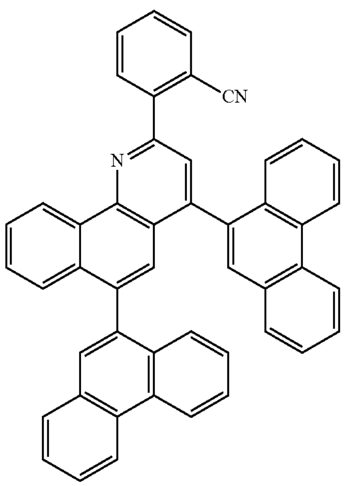
[Chemical Formula B13]
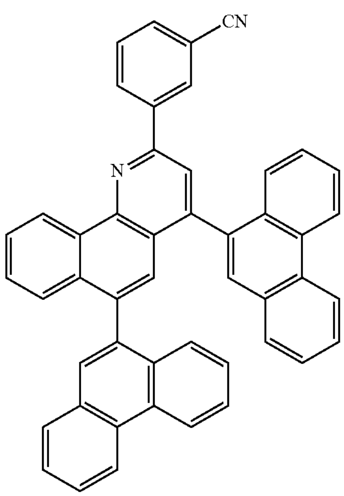
-continued
[Chemical Formula B14]
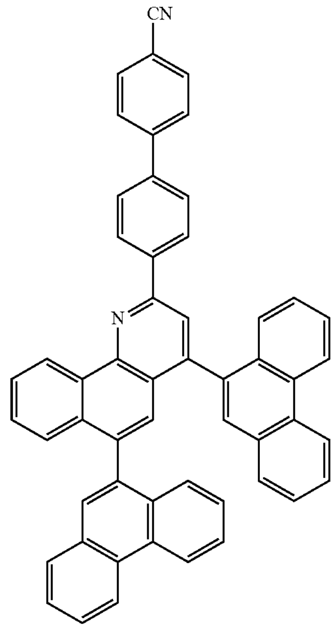
[Chemical Formula B15]
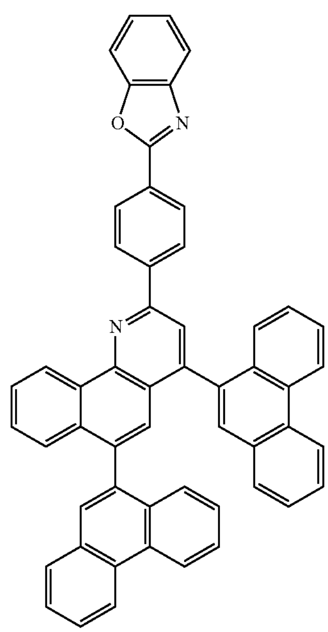

[Chemical Formula B16]
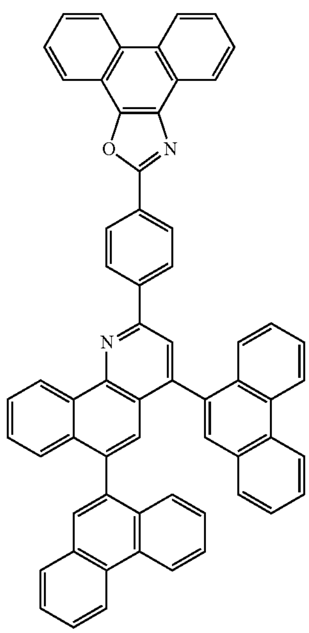
[Chemical Formula B18]
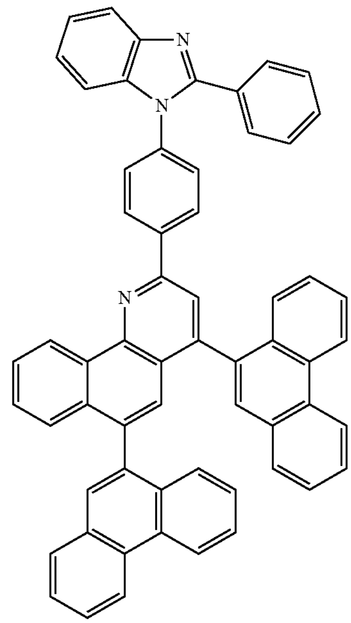
[Chemical Formula B17]
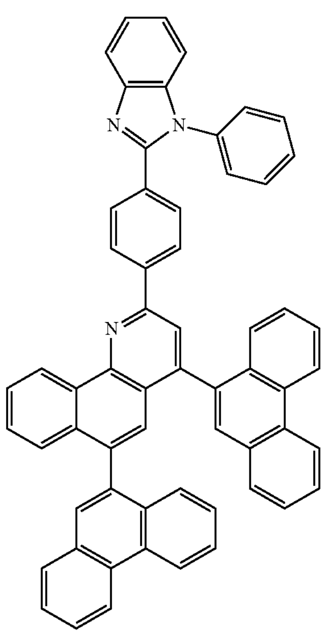
[Chemical Formula B19]
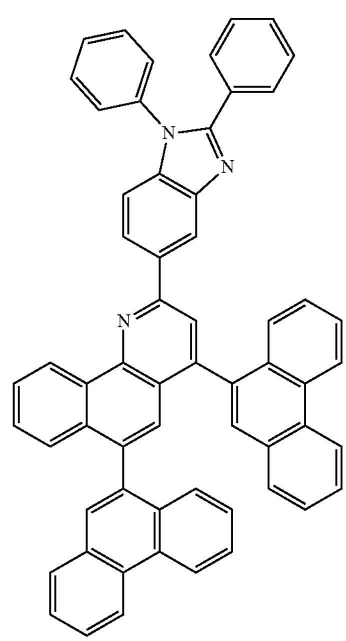

[Chemical Formula B20]
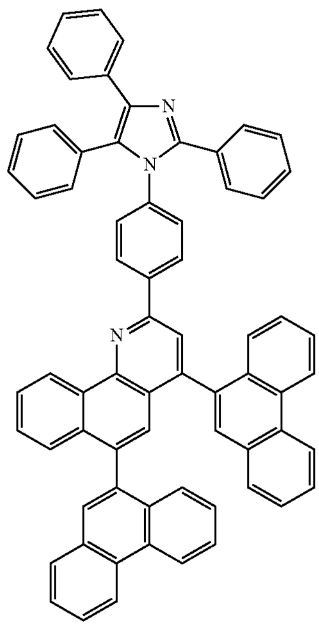
[Chemical Formula B22]
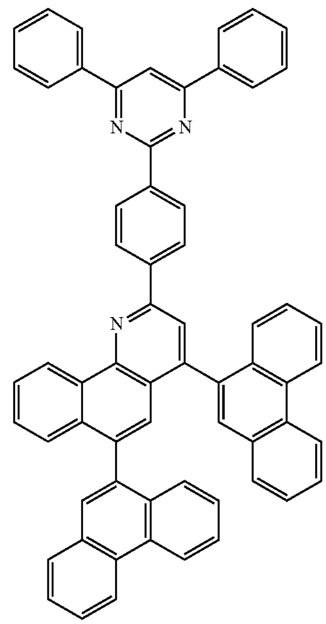
[Chemical Formula B21]
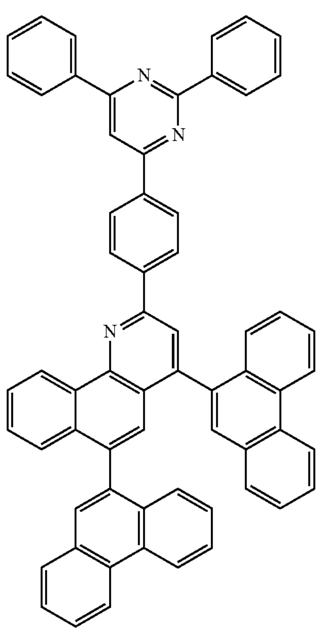
[Chemical Formula B23]
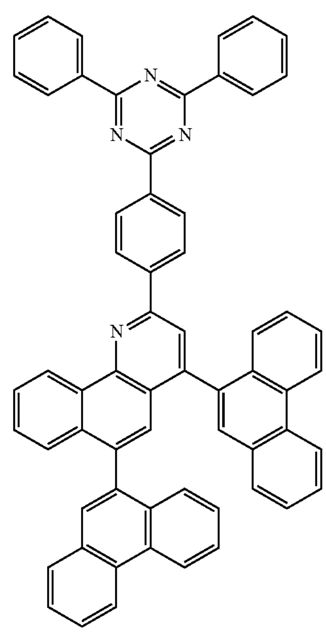

[Chemical Formula B24]
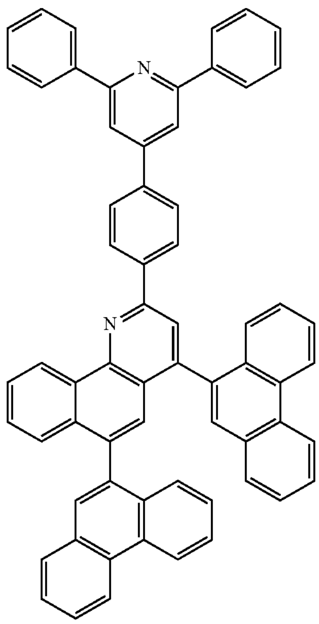
[Chemical Formula B25]
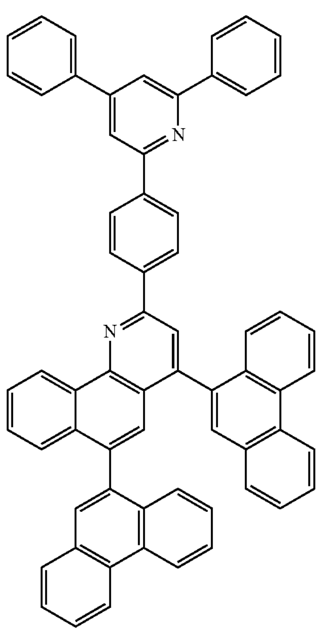
[Chemical Formula B26]
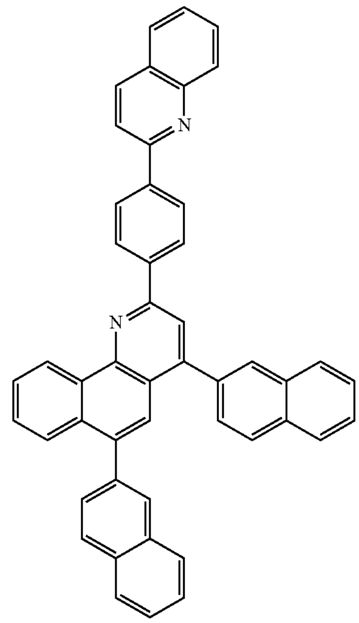
[Chemical Formula B27]
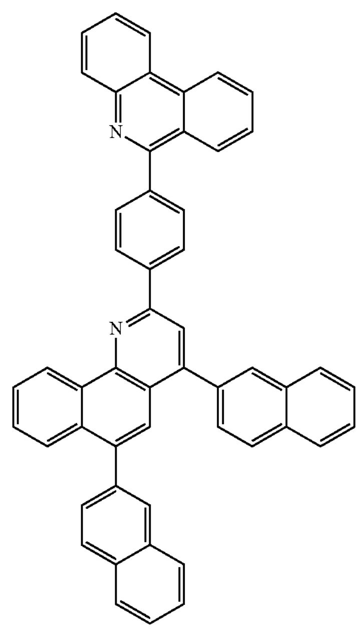

[Chemical Formula B28]
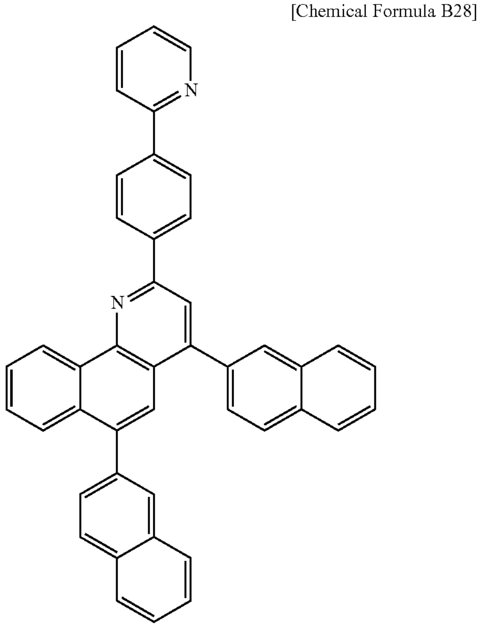
[Chemical Formula B29]
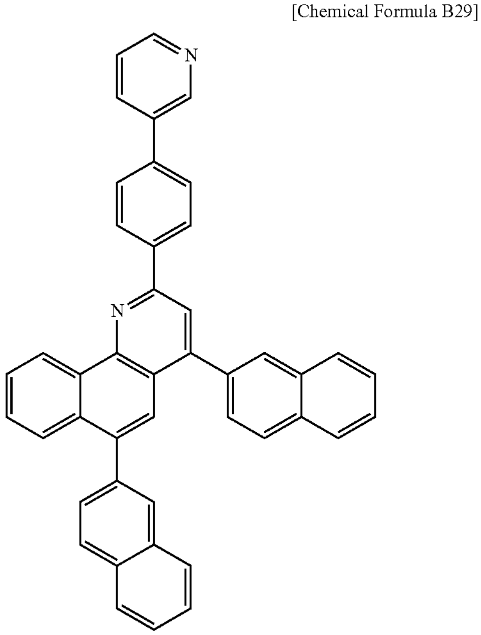
[Chemical Formula B30]
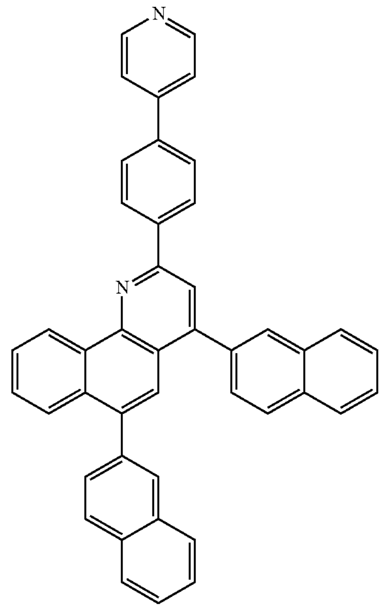
[Chemical Formula B31]
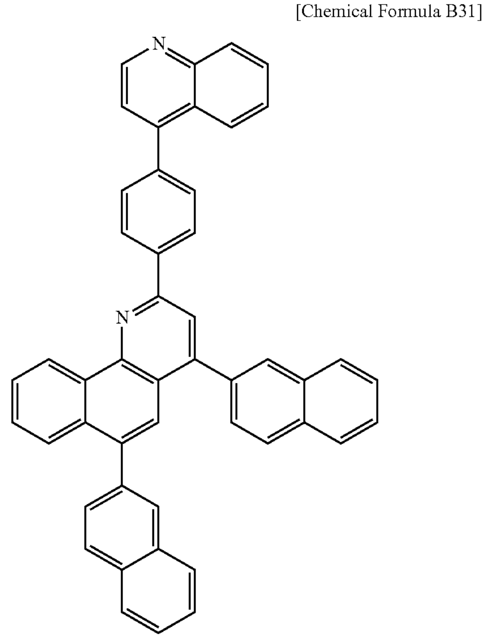

[Chemical Formula B32]
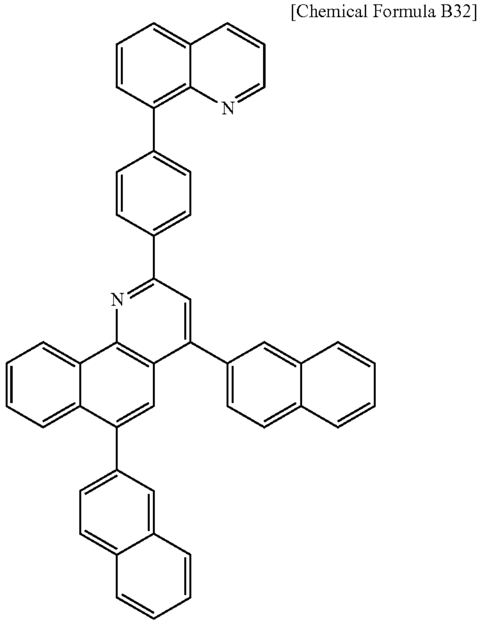
[Chemical Formula B33]
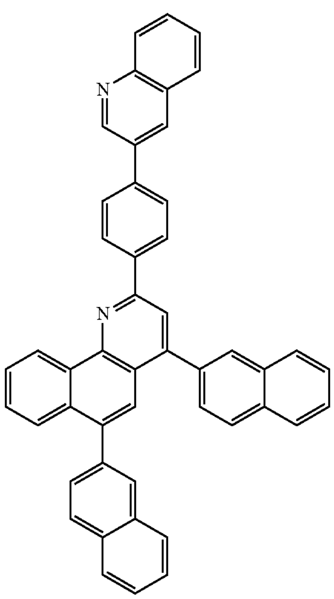
[Chemical Formula B34]
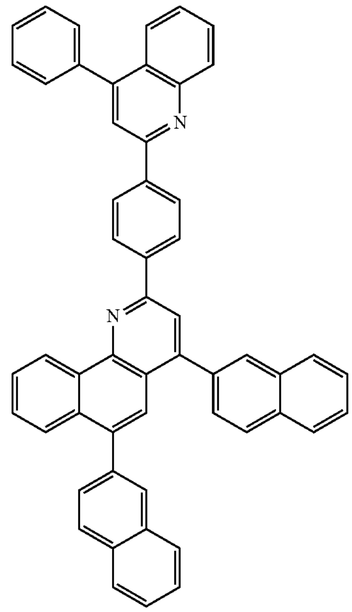
[Chemical Formula B35]
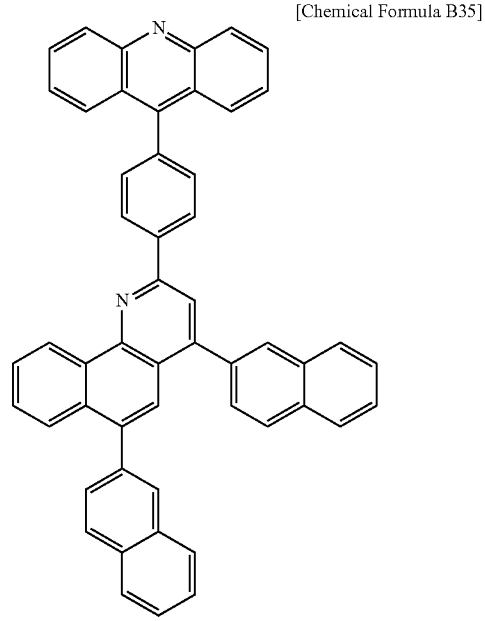

-continued
[Chemical Formula B36]
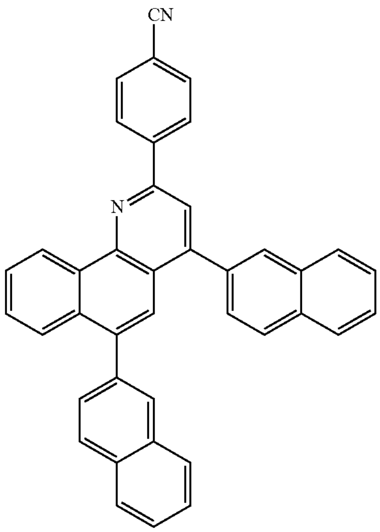
[Chemical Formula B37]
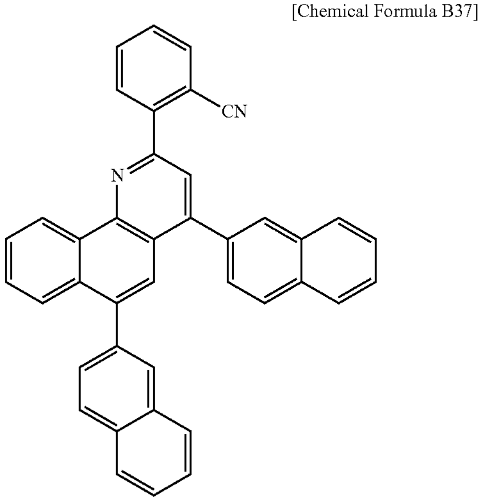
[Chemical Formula B38]
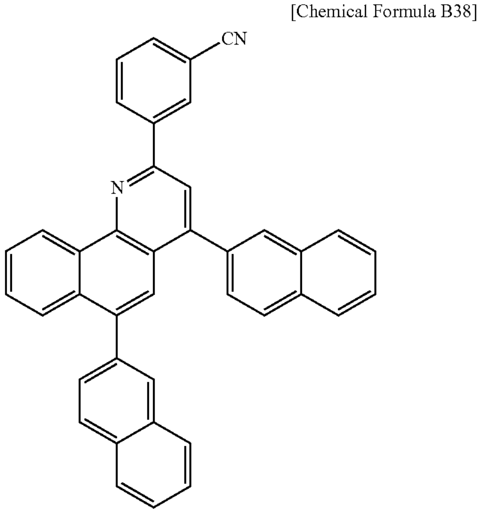
-continued
[Chemical Formula B39]
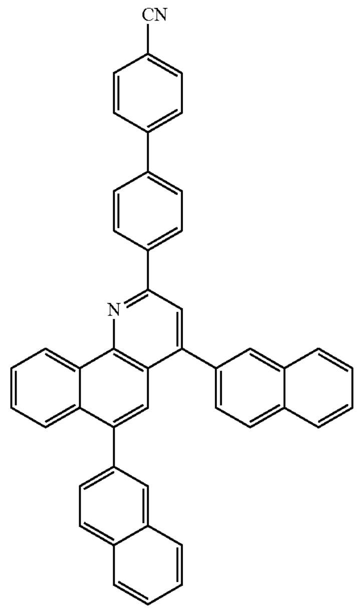
[Chemical Formula B40]
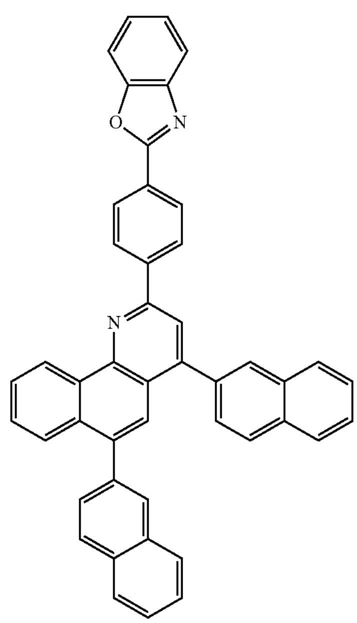

-continued
[Chemical Formula B41]
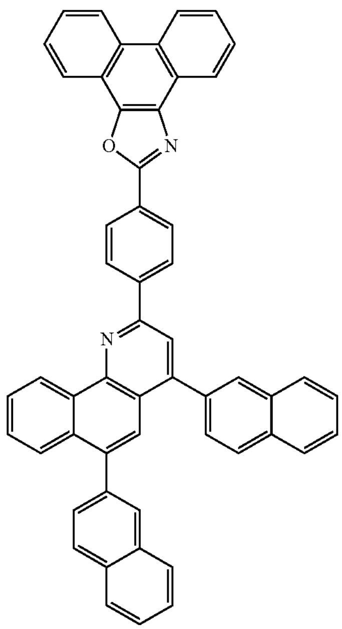
[Chemical Formula B42]
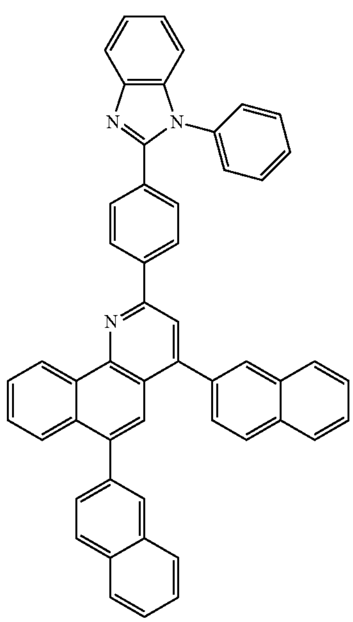
-continued
[Chemical Formula B43]
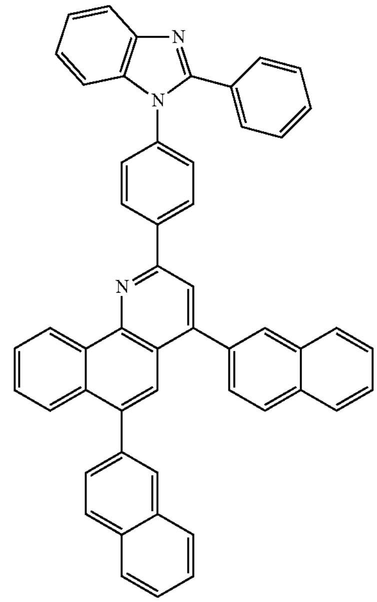
[Chemical Formula B44]
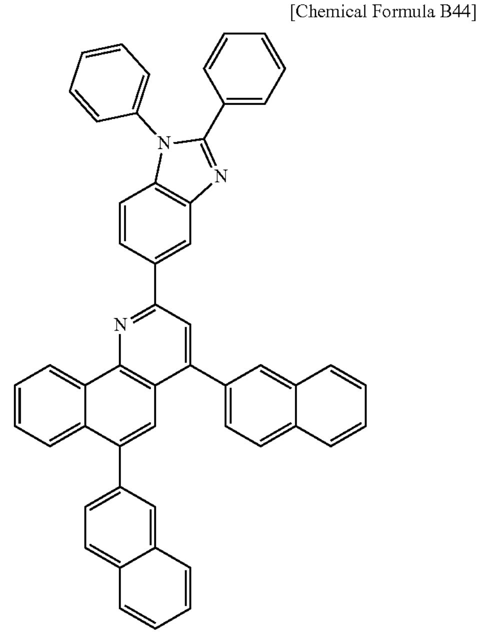

[Chemical Formula B45]
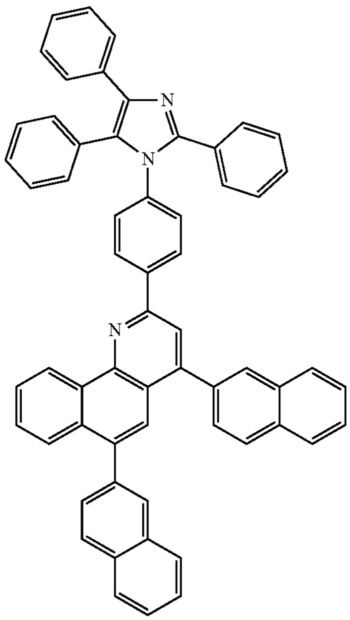
[Chemical Formula B46]
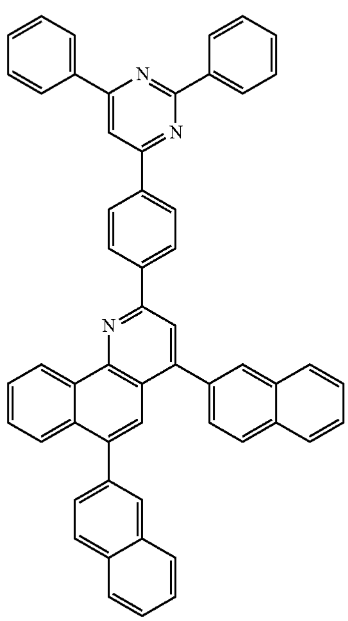
[Chemical Formula B47]
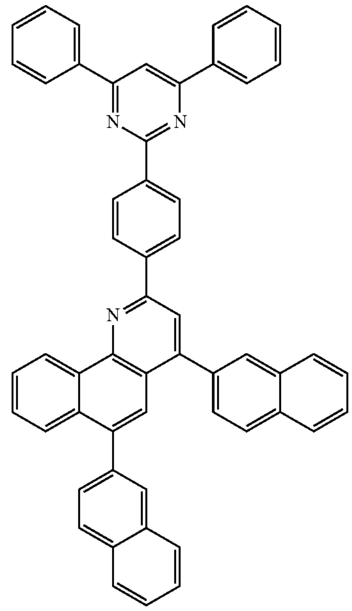
[Chemical Formula B48]
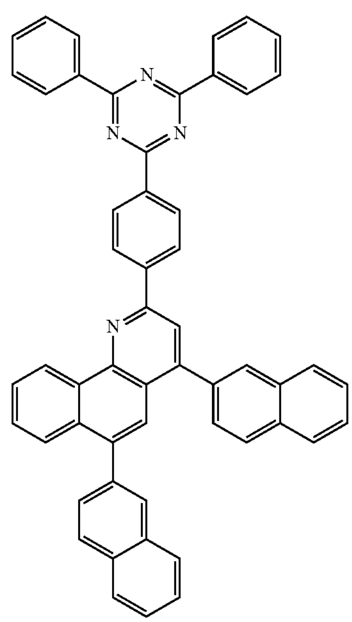

[Chemical Formula B49]
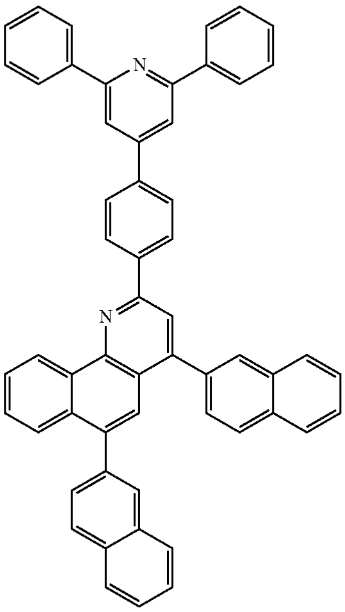
[Chemical Formula B51]
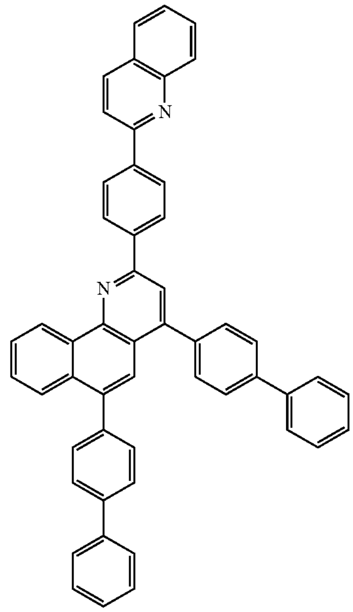
[Chemical Formula B50]
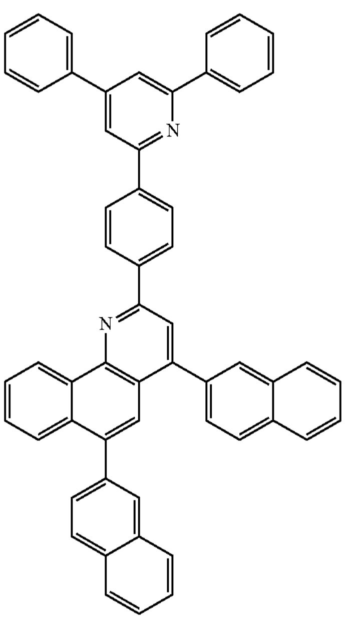
[Chemical Formula B52]
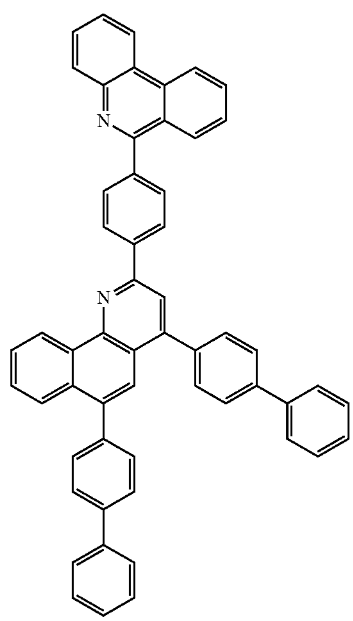

-continued
[Chemical Formula B53]
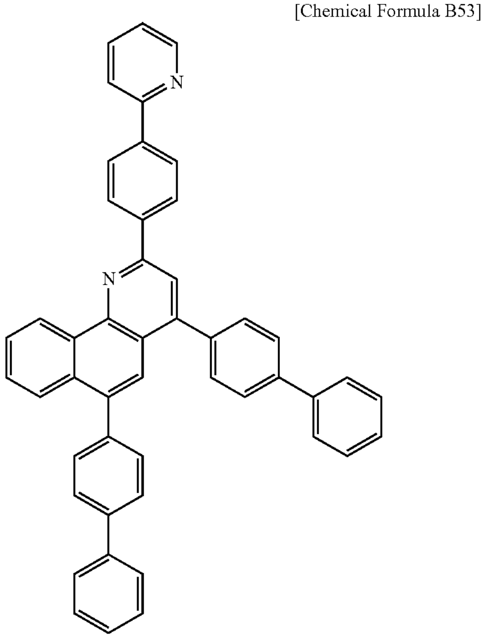
[Chemical Formula B54]
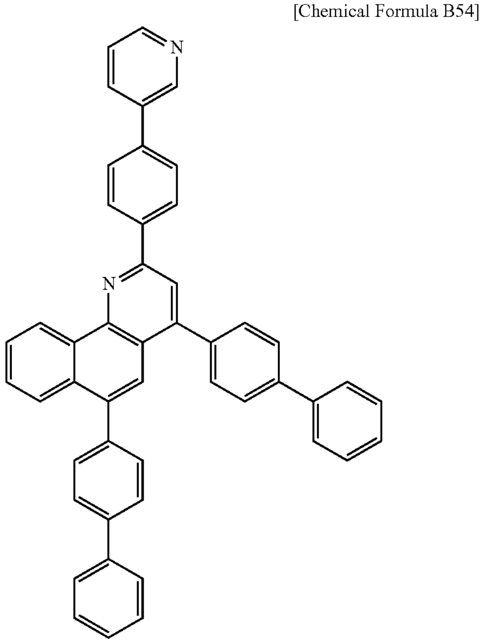
-continued
[Chemical Formula B55]
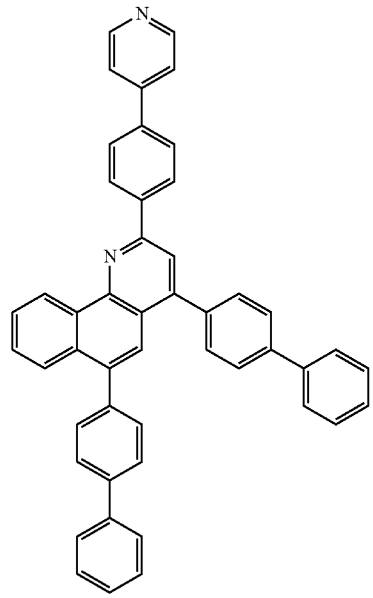
[Chemical Formula B56]
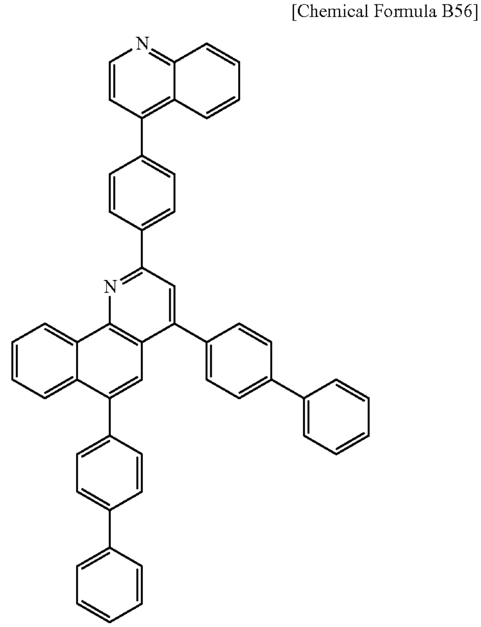

-continued
[Chemical Formula B57]
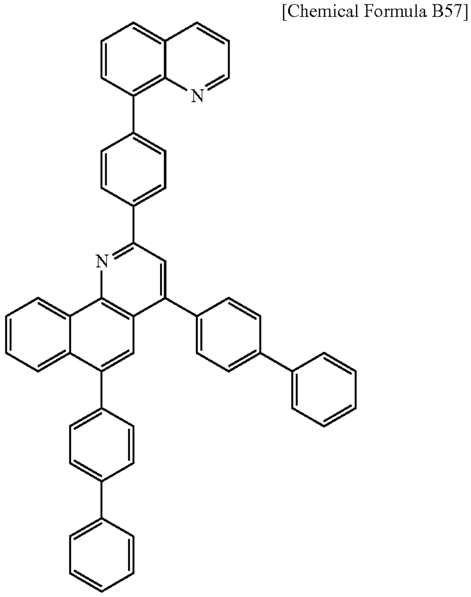
[Chemical Formula B58]
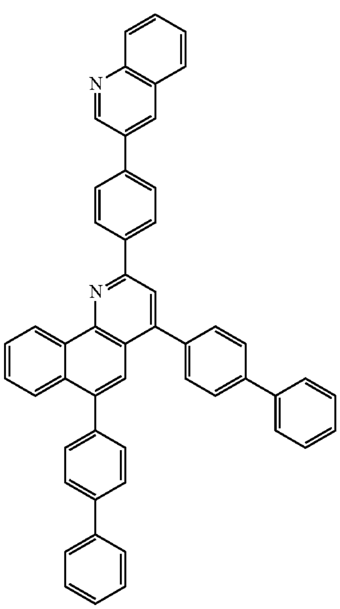
-continued
[Chemical Formula B59]
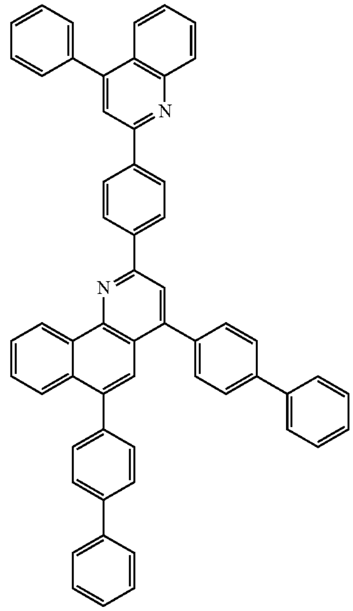
[Chemical Formula B60]
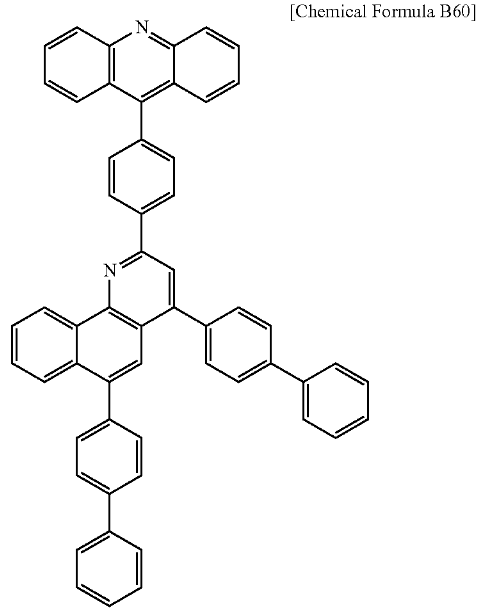

-continued
[Chemical Formula B61]
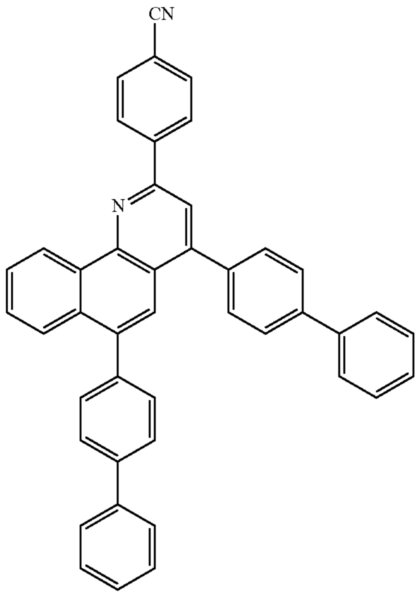
[Chemical Formula B62]
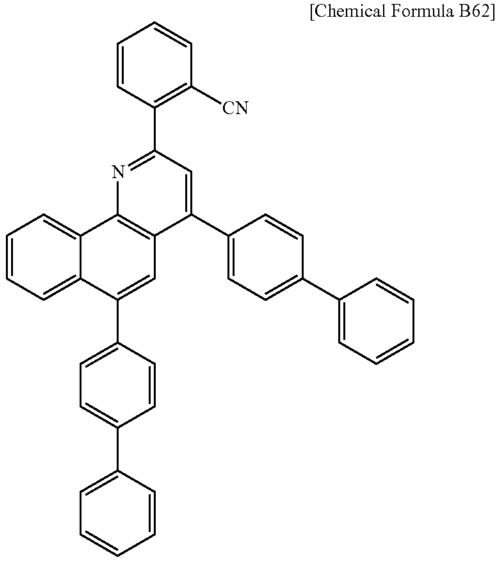
-continued
[Chemical Formula B63]
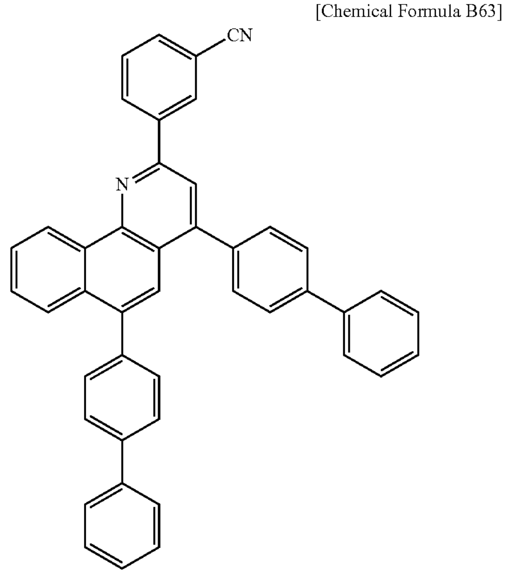
[Chemical Formula B64]
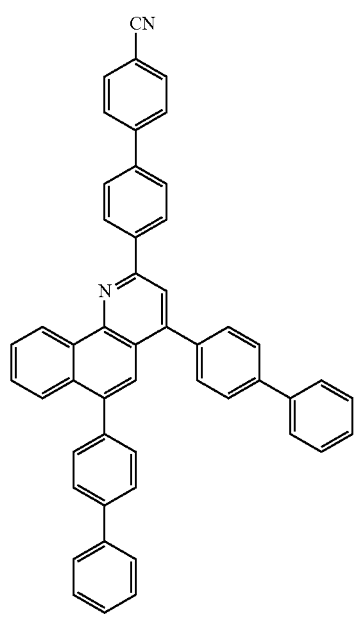

-continued
[Chemical Formula B65]
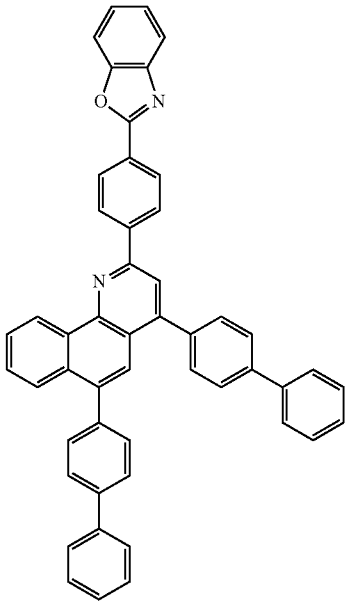
[Chemical Formula B66]
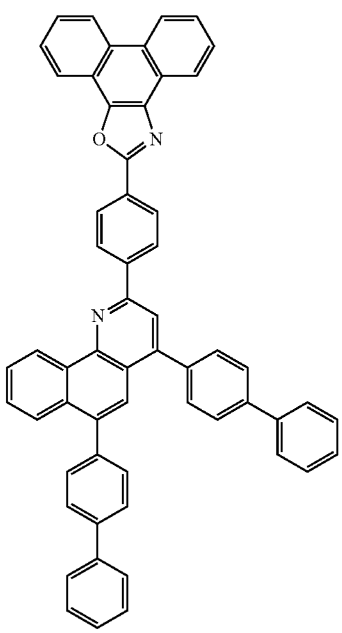
-continued
[Chemical Formula B67]
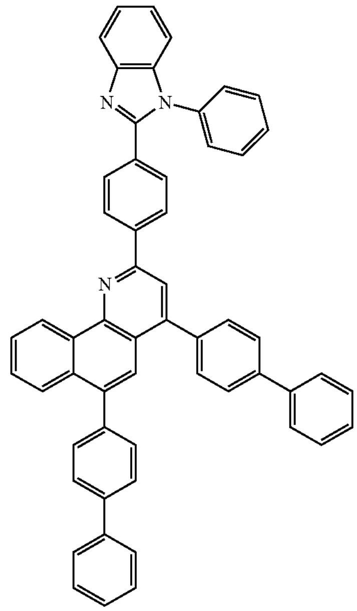
[Chemical Formula B68]
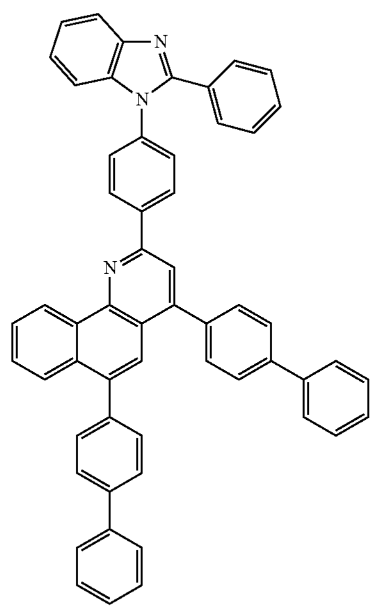

[Chemical Formula B69]
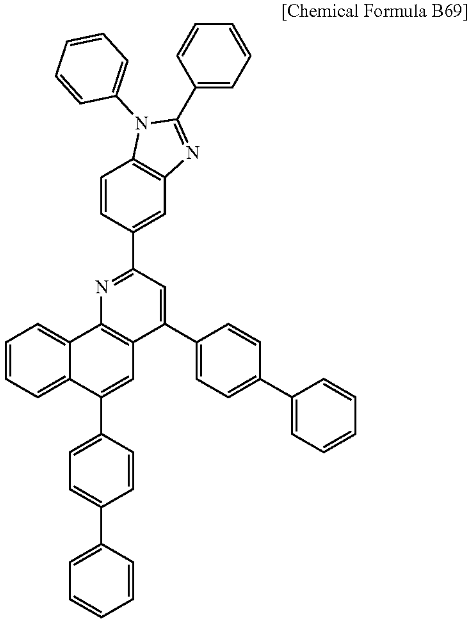
[Chemical Formula B70]
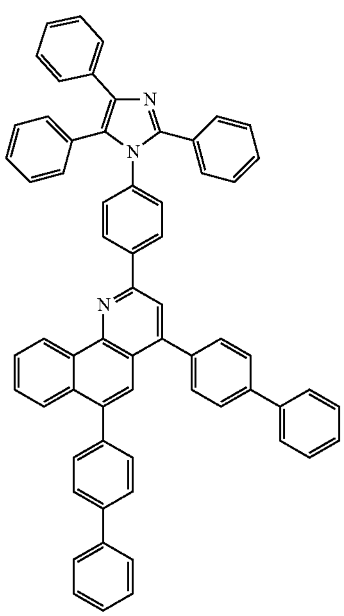
[Chemical Formula B71]
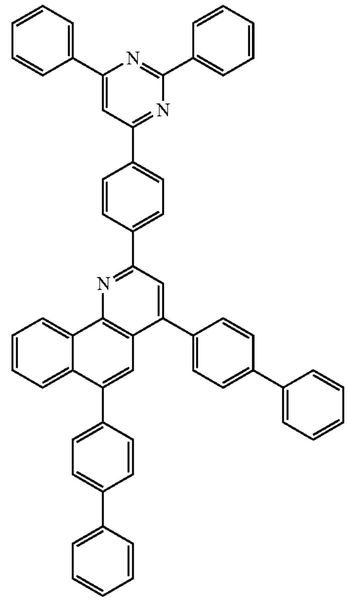
[Chemical Formula B72]
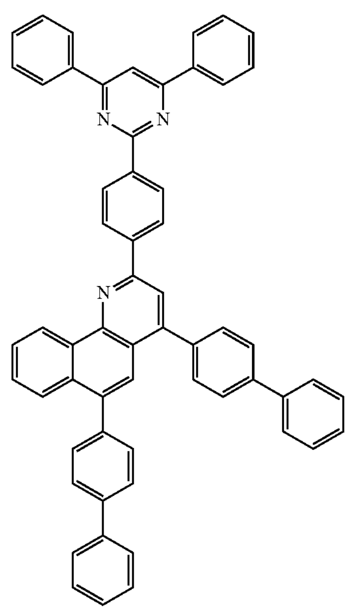

-continued
[Chemical Formula B73]
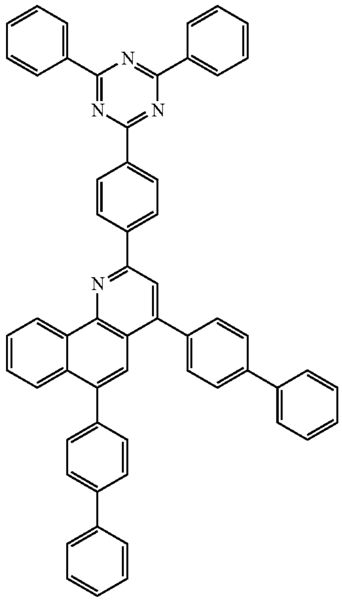
[Chemical Formula B74]
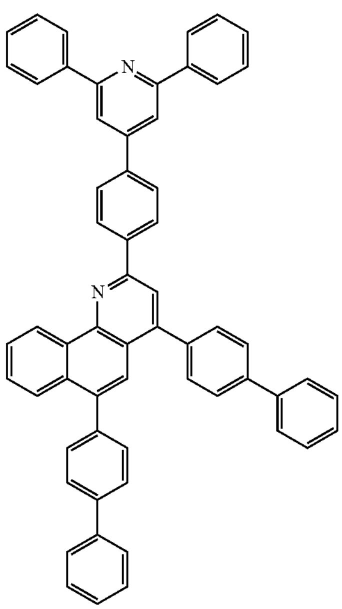
-continued
[Chemical Formula B75]
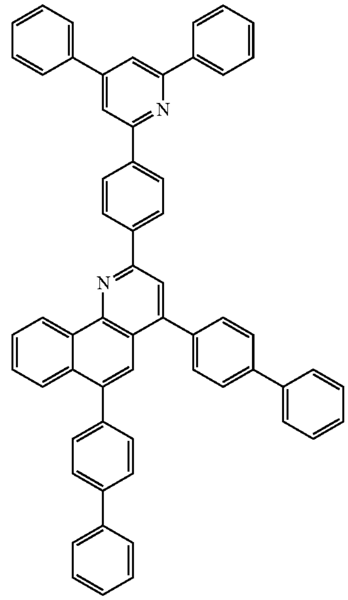
[Chemical Formula B76]
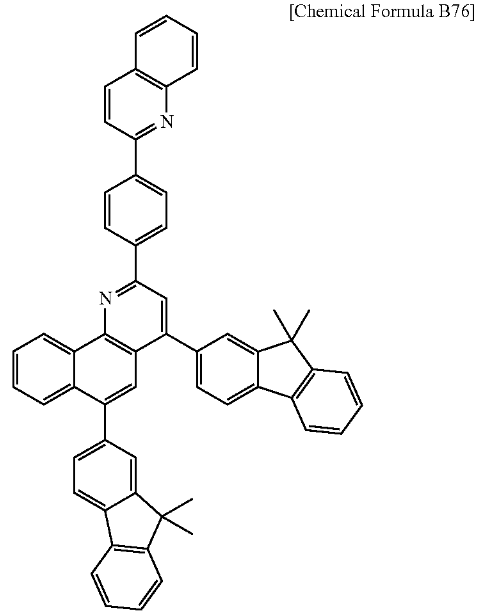

-continued
[Chemical Formula B77]
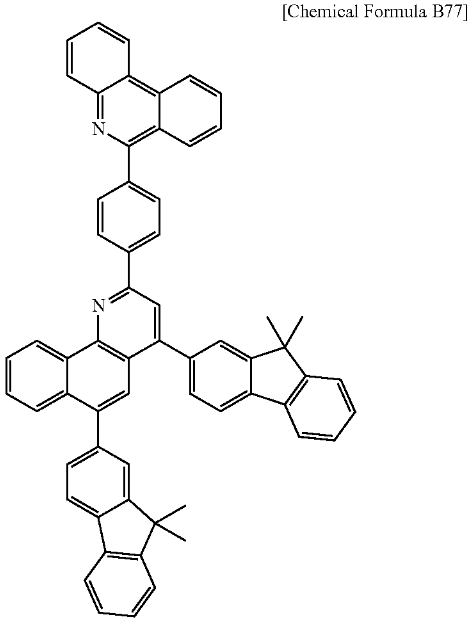
[Chemical Formula B78]
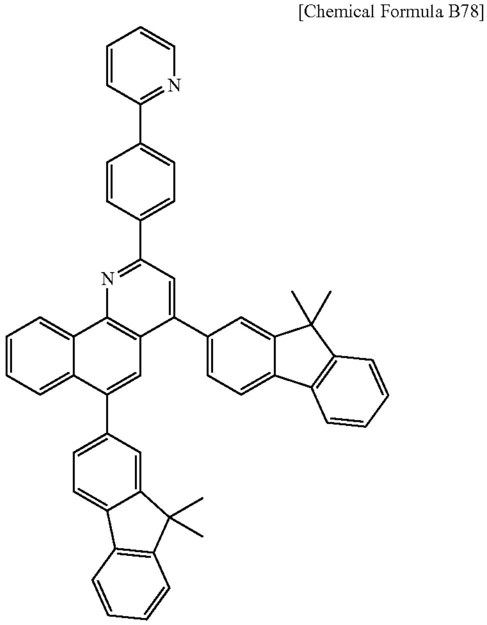
-continued
[Chemical Formula B79]
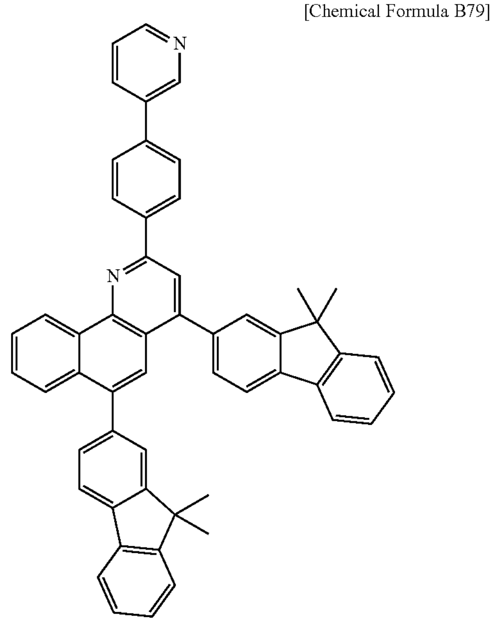
[Chemical Formula B80]
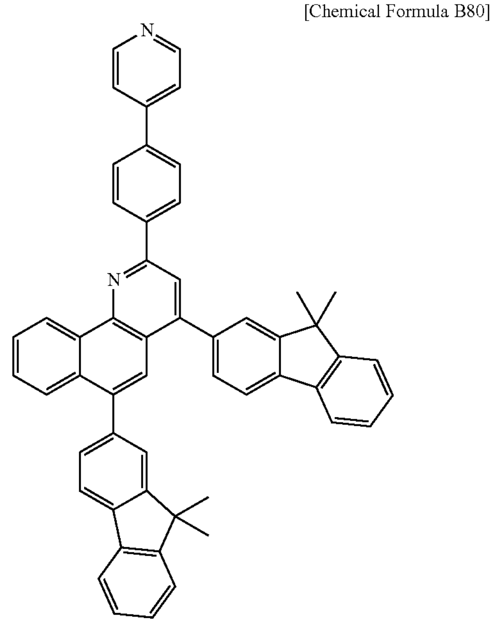

-continued
[Chemical Formula B81]
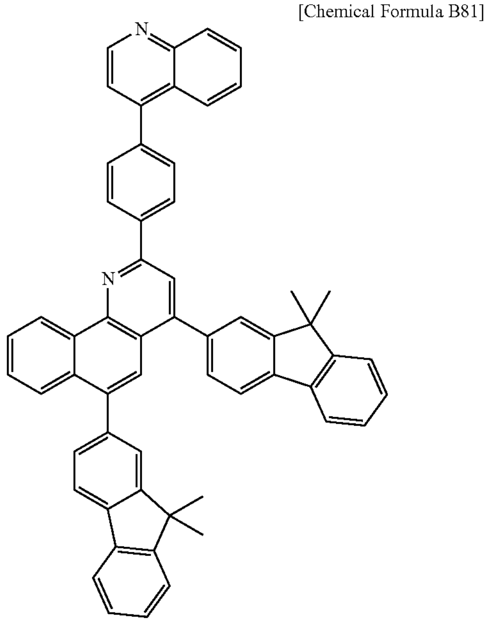
[Chemical Formula B82]
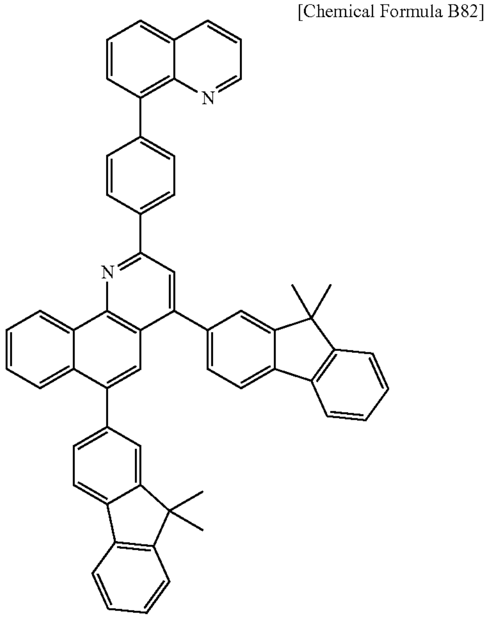
-continued
[Chemical Formula B83]
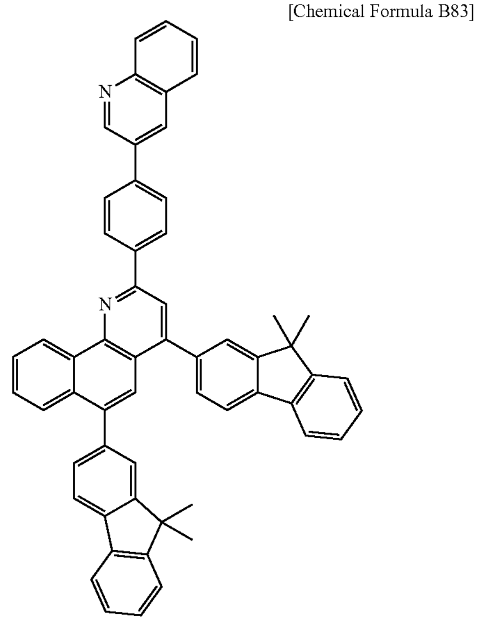
[Chemical Formula B84]
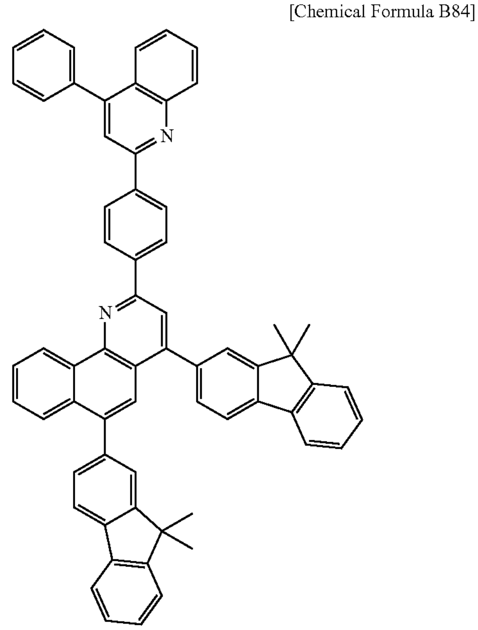

[Chemical Formula B85]
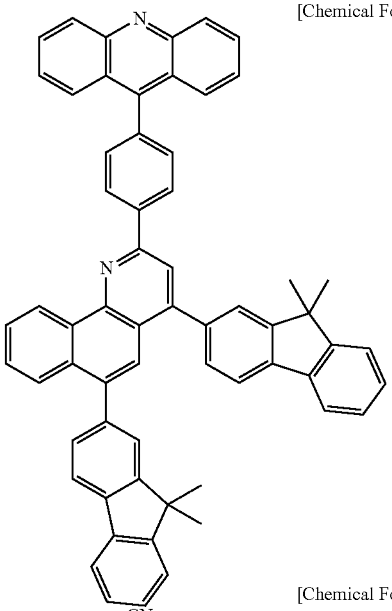
[Chemical Formula B86]
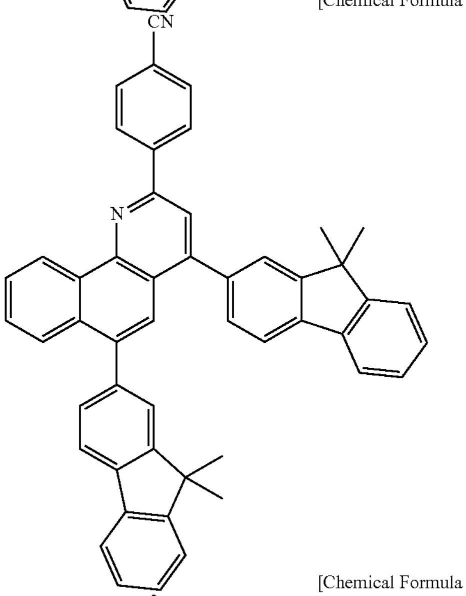
[Chemical Formula B87]
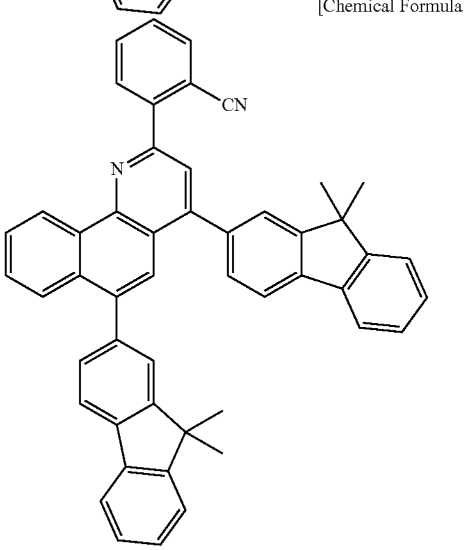
[Chemical Formula B88]
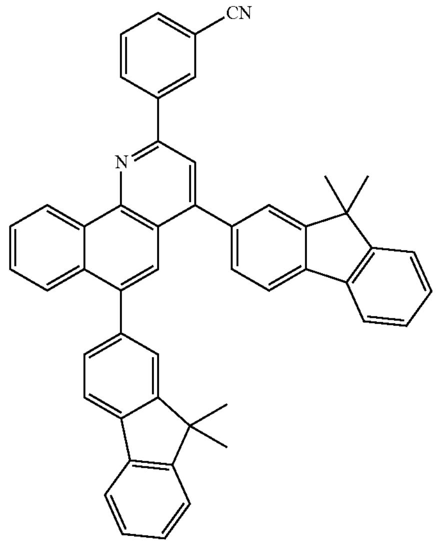
[Chemical Formula B89]
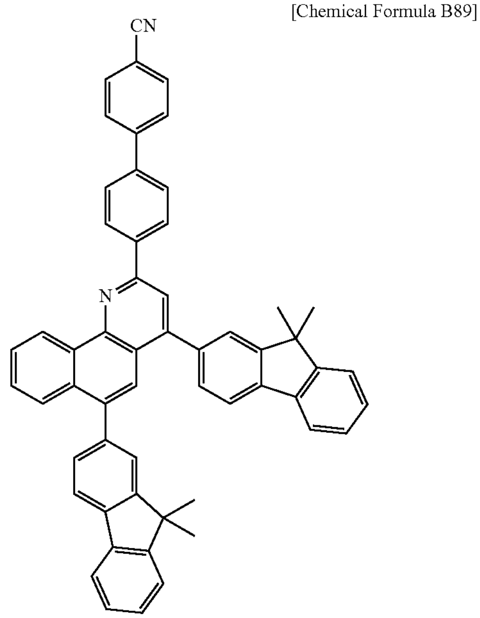

[Chemical Formula B90]
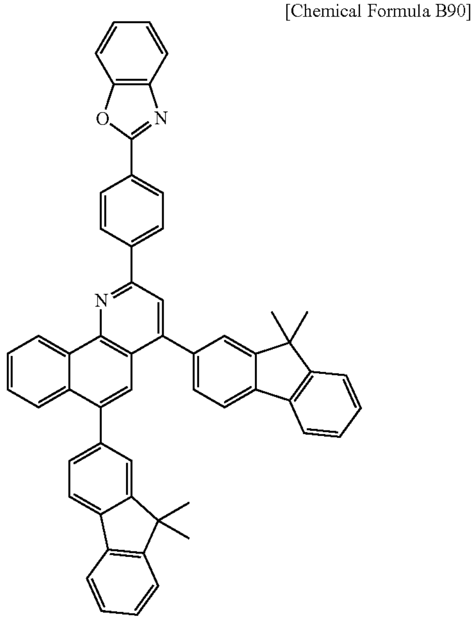
[Chemical Formula B91]
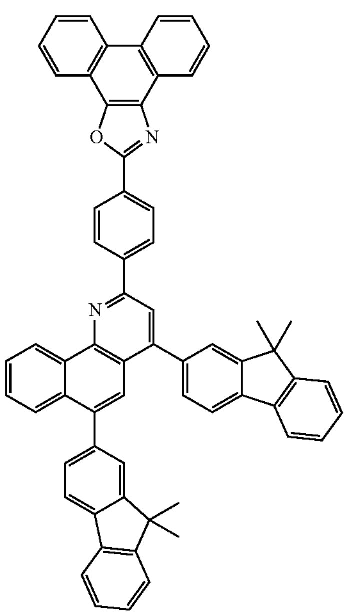
[Chemical Formula B92]
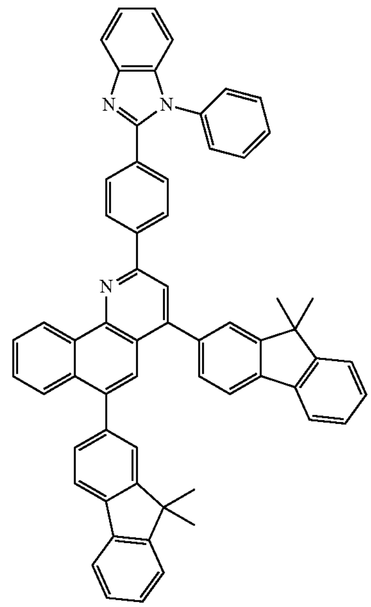
[Chemical Formula B93]
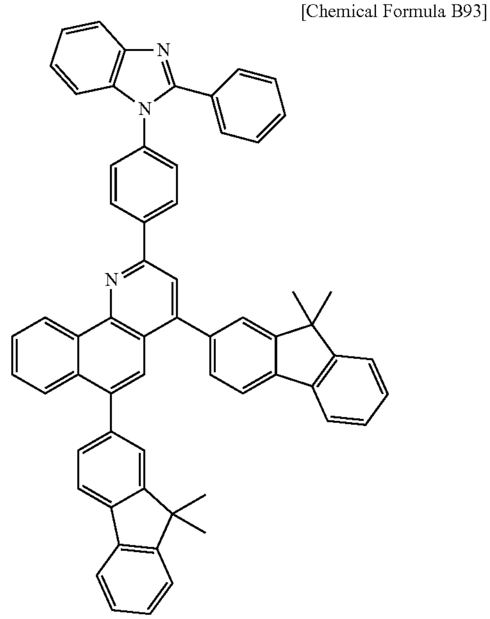

-continued
[Chemical Formula B94]
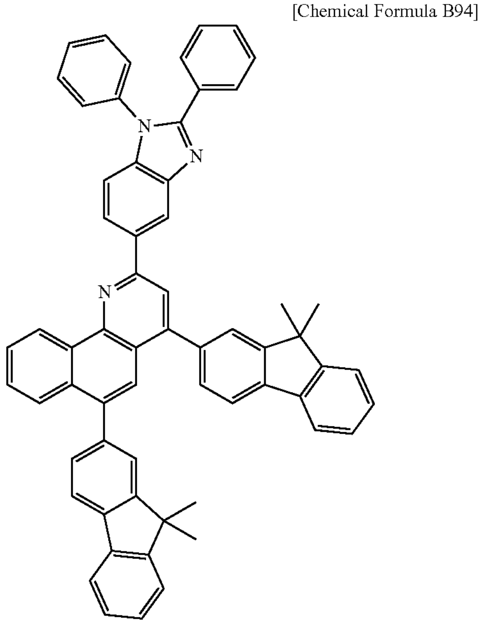
[Chemical Formula B95]
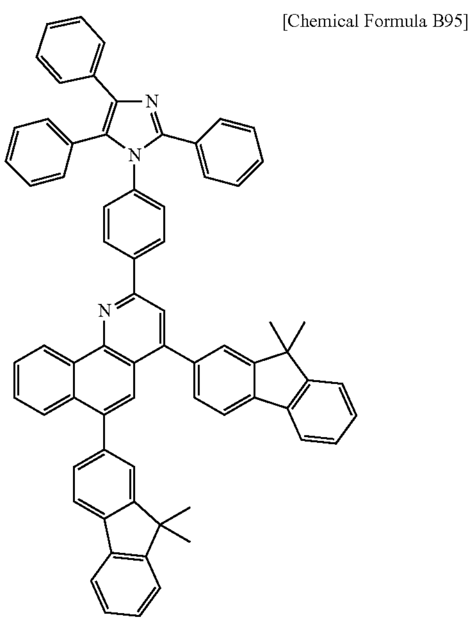
-continued
[Chemical Formula B96]
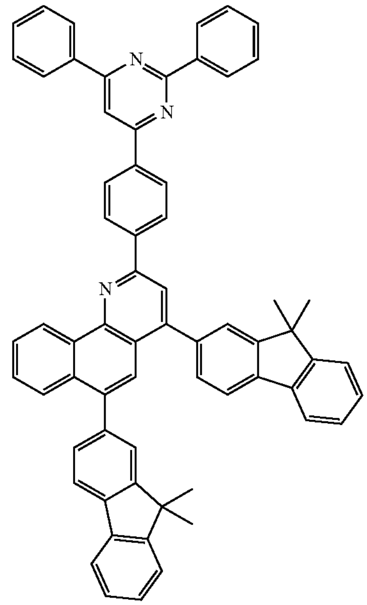
[Chemical Formula B97]
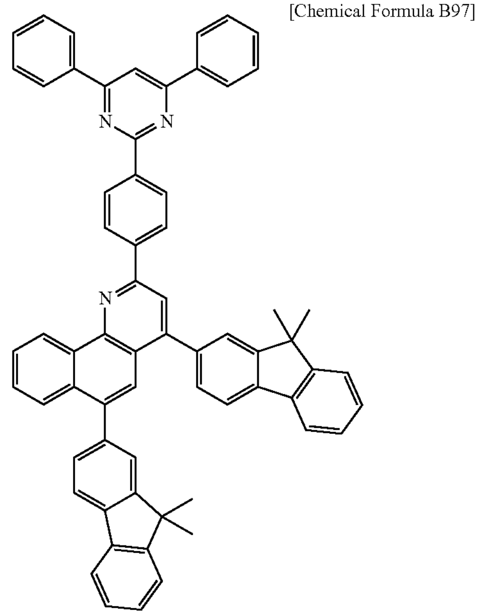

-continued
[Chemical Formula B98]
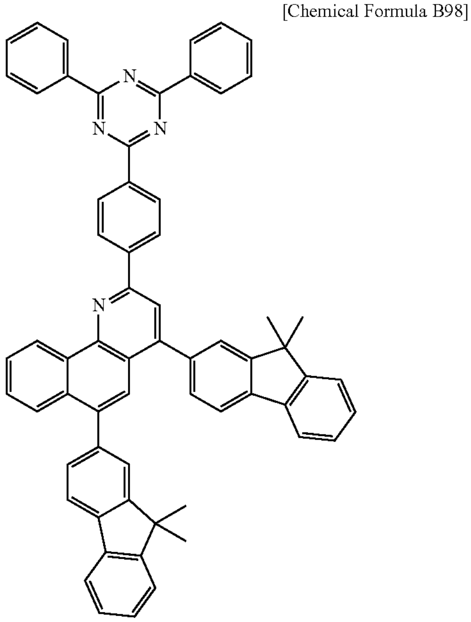
[Chemical Formula B99]
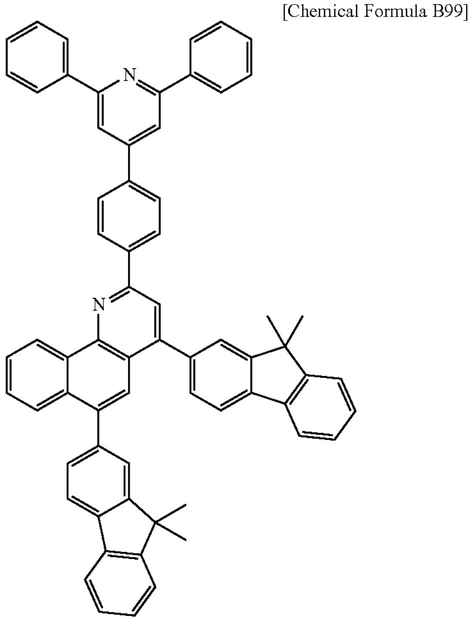
-continued
[Chemical Formula B100]
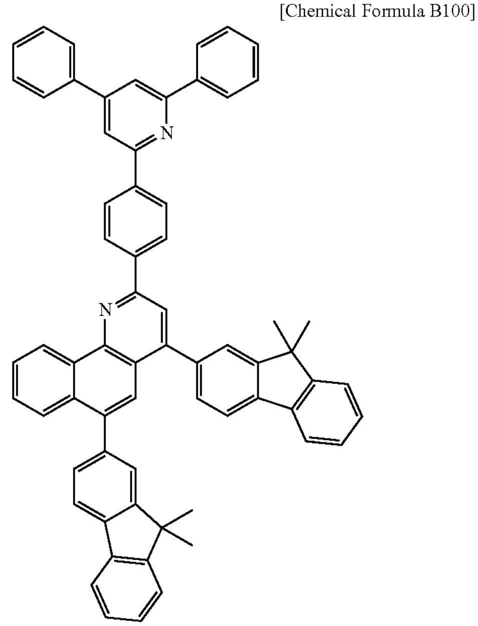
[Chemical Formula B101]
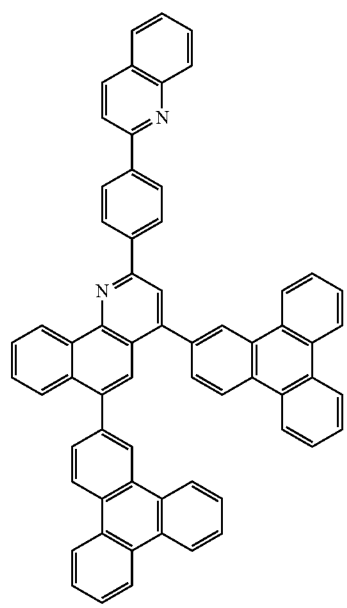

[Chemical Formula B102]
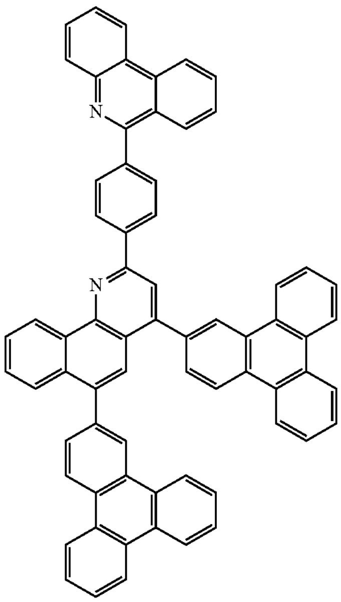
[Chemical Formula B103]
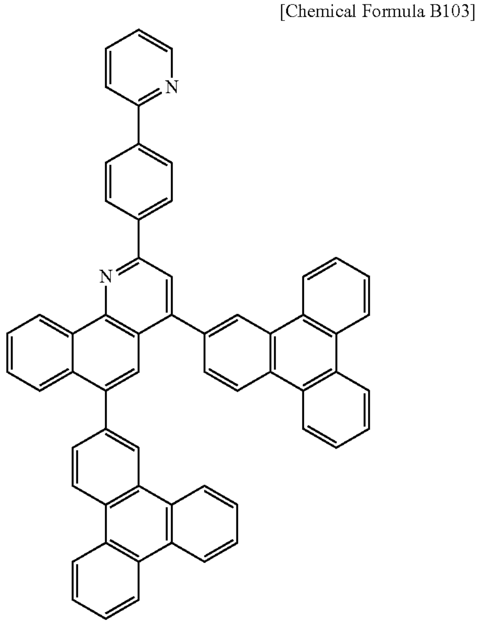
[Chemical Formula B104]
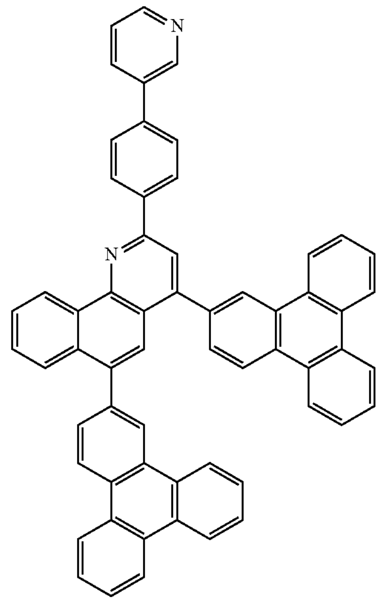
[Chemical Formula B105]
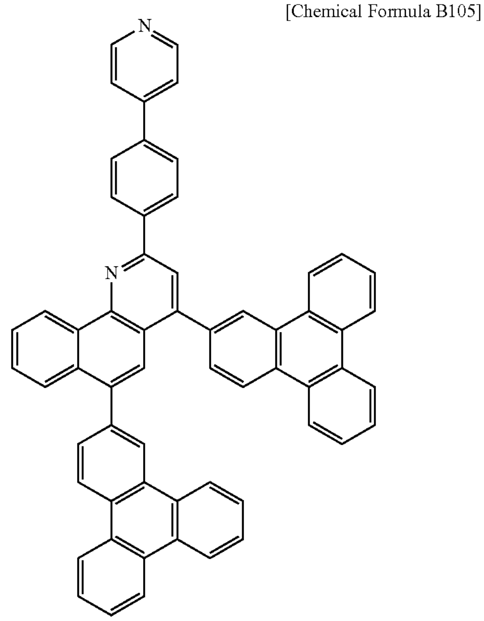

[Chemical Formula B106]
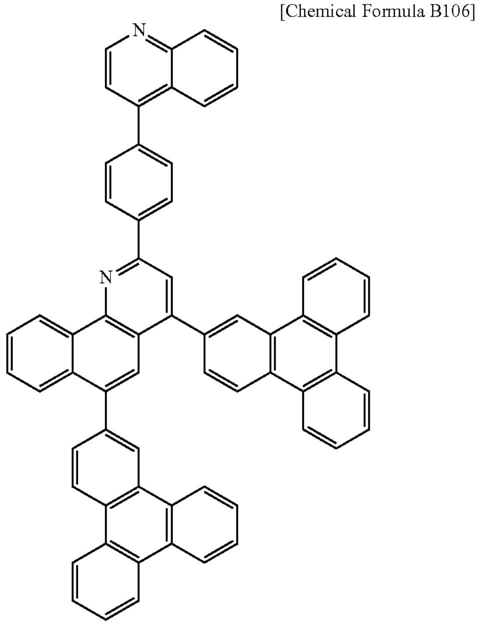
[Chemical Formula B107]
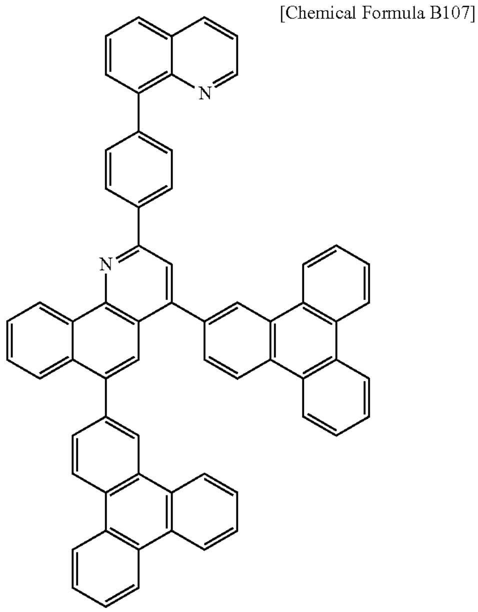
[Chemical Formula B108]
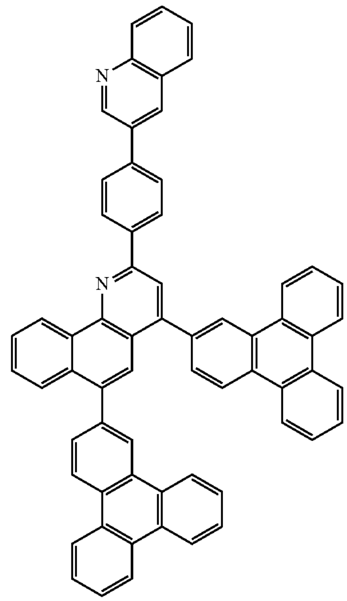
[Chemical Formula B109]
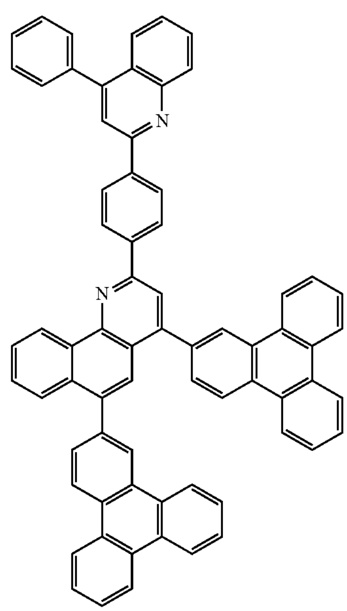

[Chemical Formula B110]
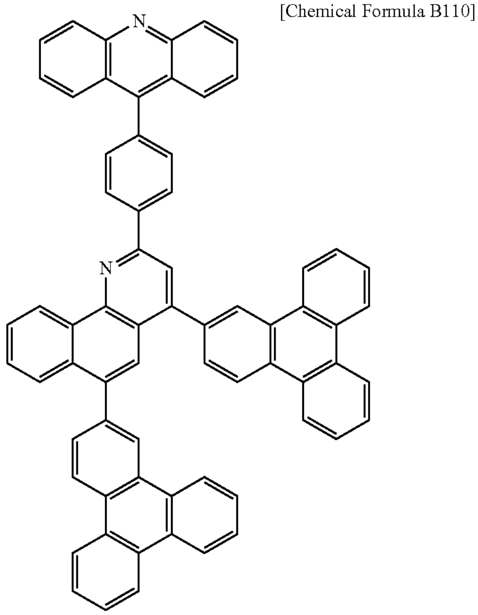
[Chemical Formula B111]
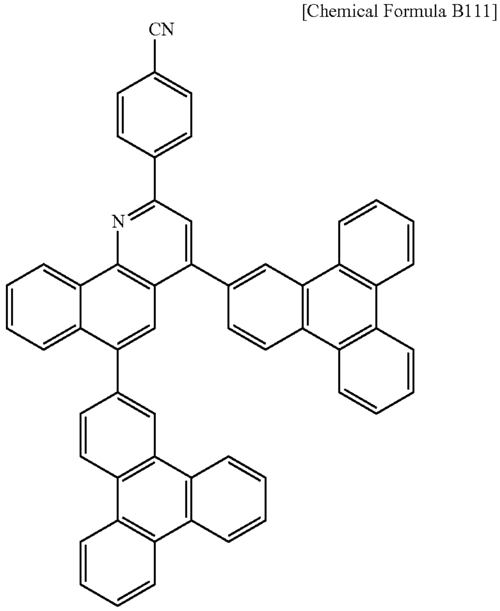
[Chemical Formula B112]
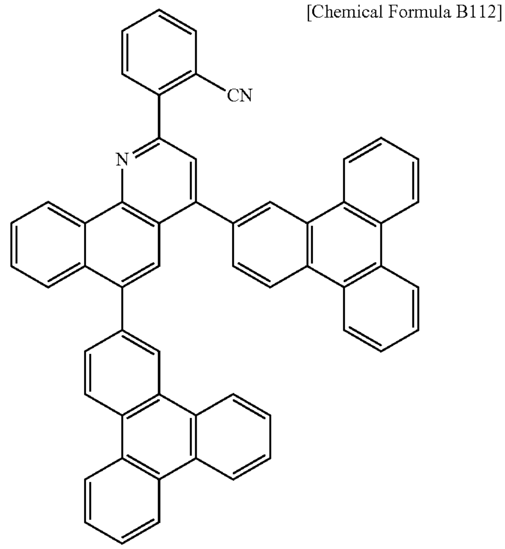
[Chemical Formula B113]
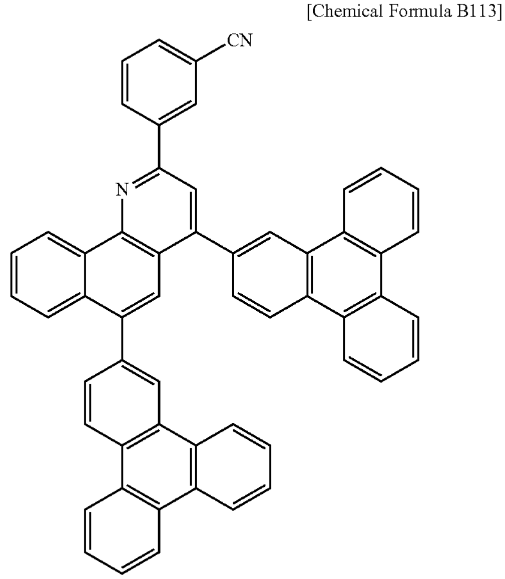

[Chemical Formula B114]
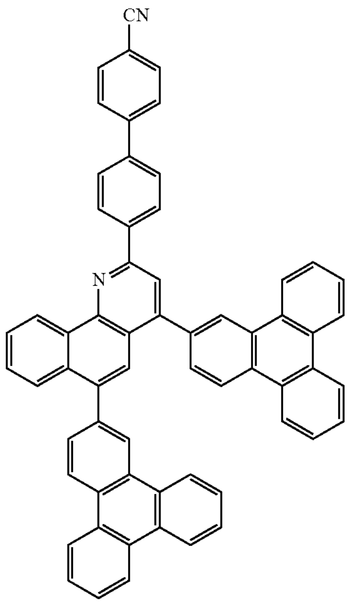
[Chemical Formula B115]
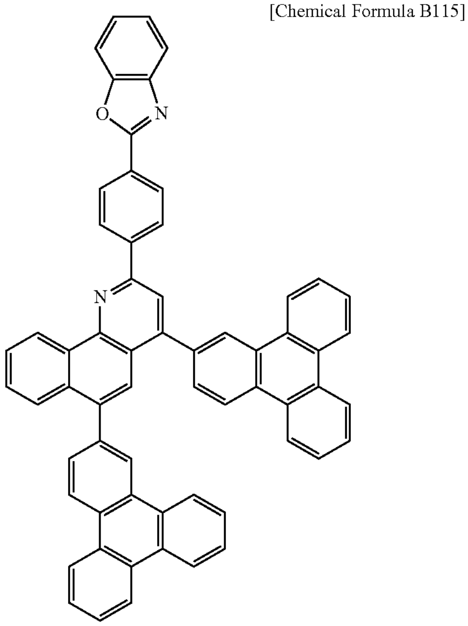
[Chemical Formula B116]
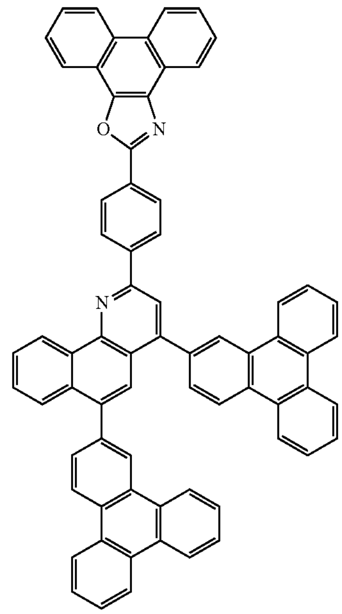
[Chemical Formula B117]
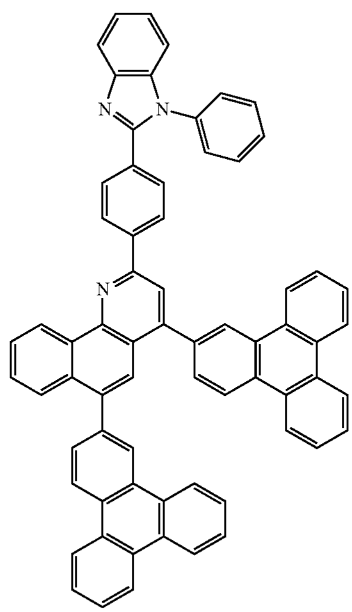

[Chemical Formula B118]
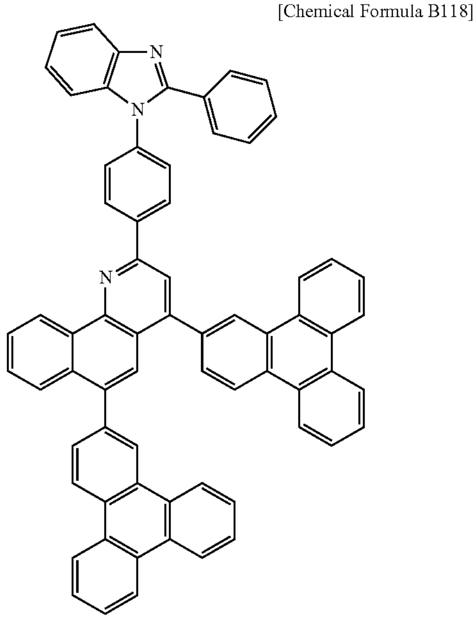
[Chemical Formula B119]
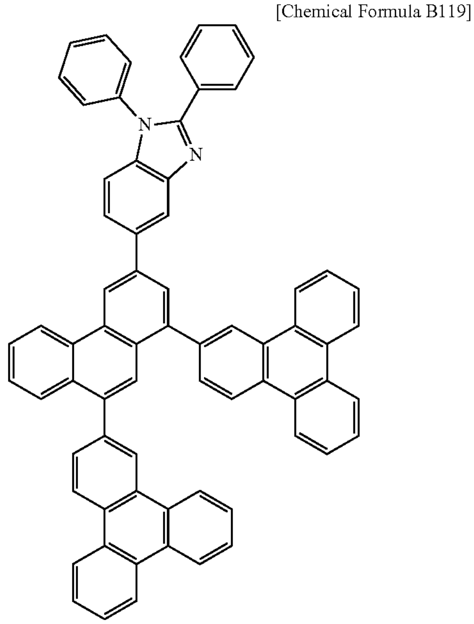
[Chemical Formula B120]
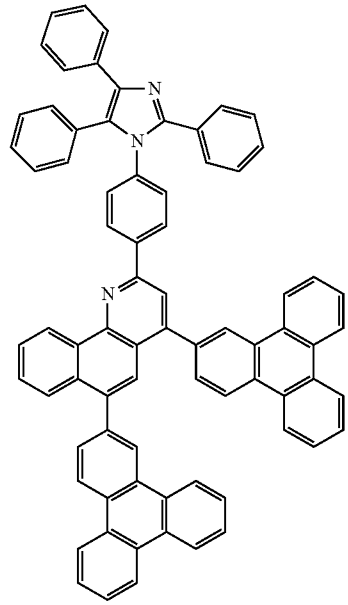
[Chemical Formula B121]
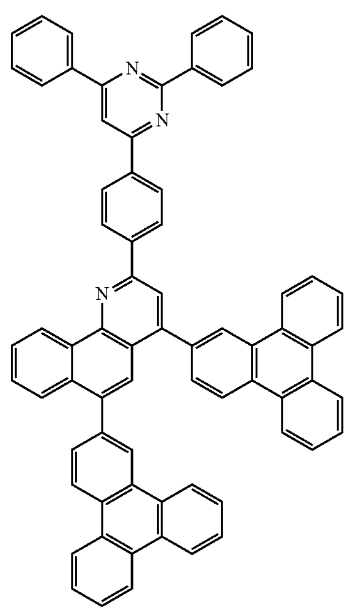

[Chemical Formula B122]
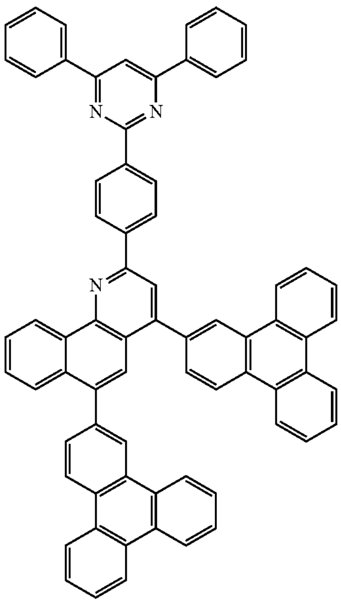
[Chemical Formula B123]
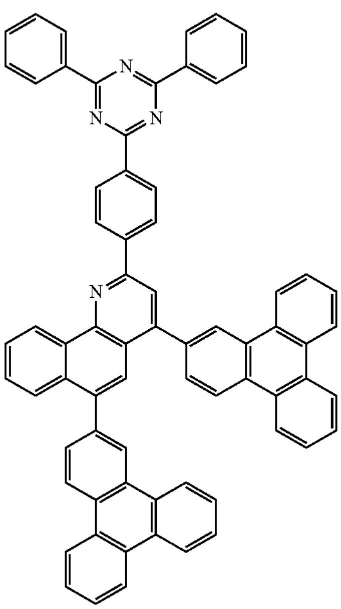
[Chemical Formula B124]
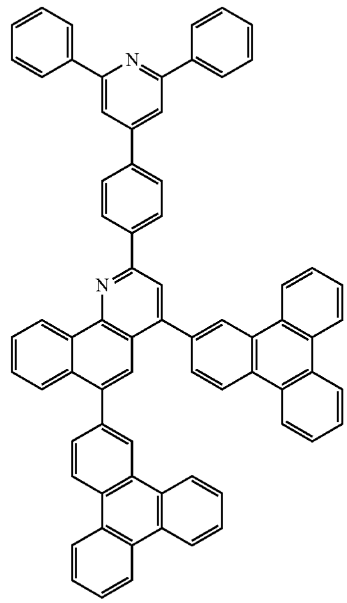
[Chemical Formula B125]
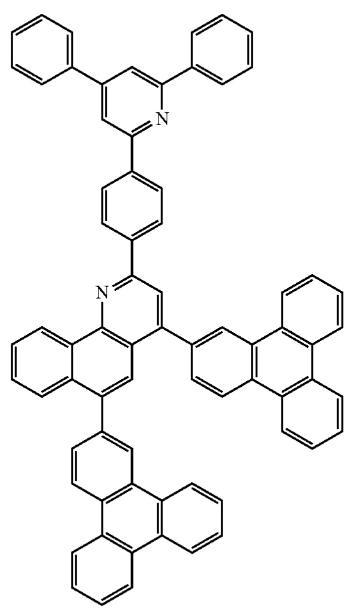

-continued
[Chemical Formula B126]
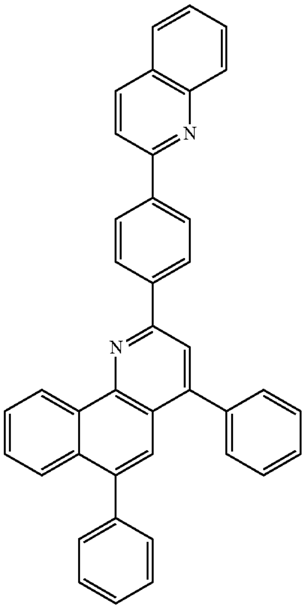
[Chemical Formula B127]
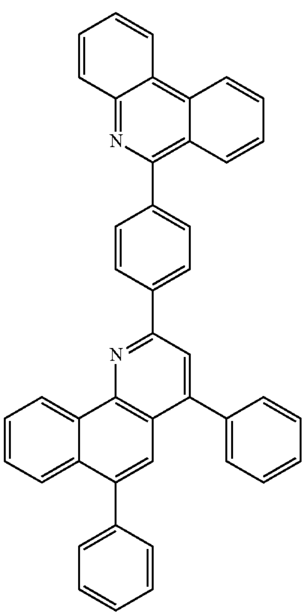
-continued
[Chemical Formula B128]
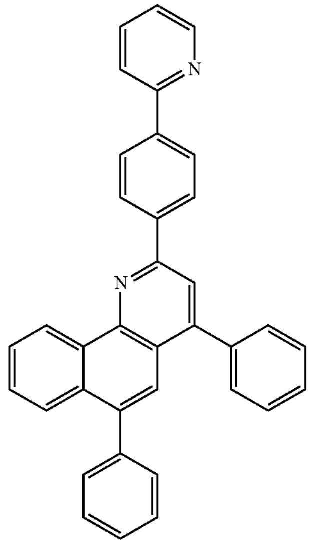
[Chemical Formula B129]
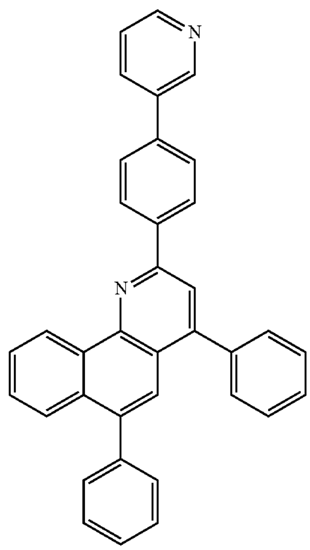
[Chemical Formula B130]
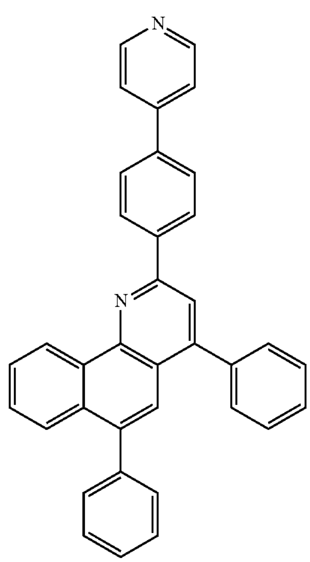

-continued
[Chemical Formula B131]
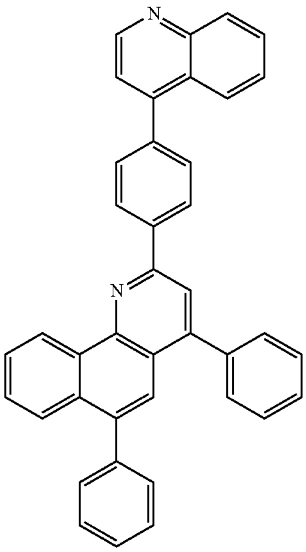
[Chemical Formula B132]
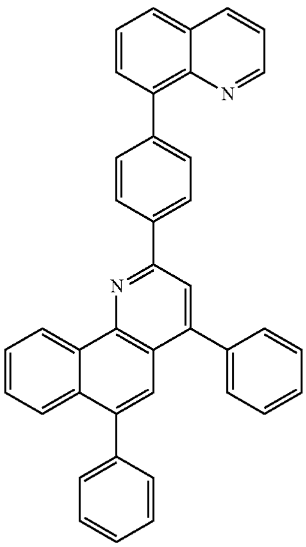
[Chemical Formula B133]
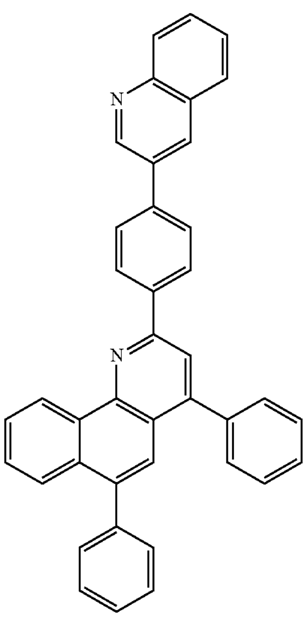
-continued
[Chemical Formula B134]
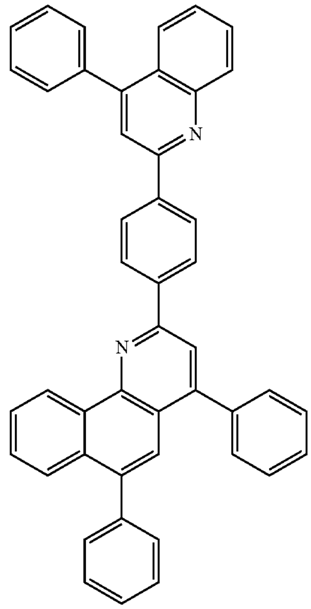
[Chemical Formula B135]
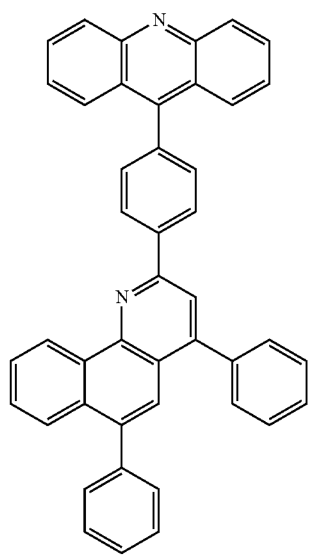
[Chemical Formula B136]
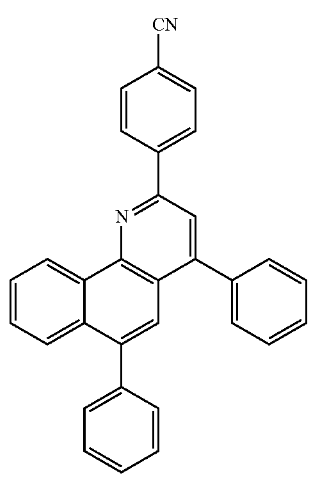

-continued
[Chemical Formula B137]
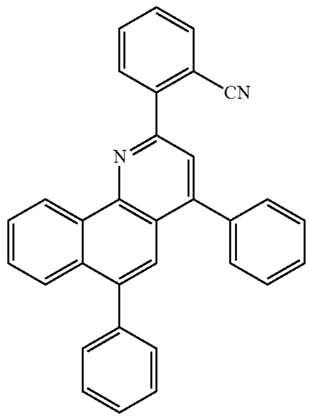
[Chemical Formula B138]
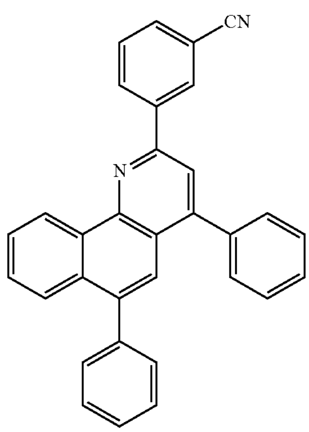
[Chemical Formula B139]
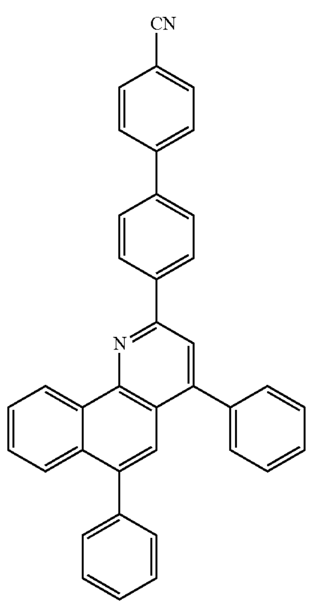
-continued
[Chemical Formula B140]
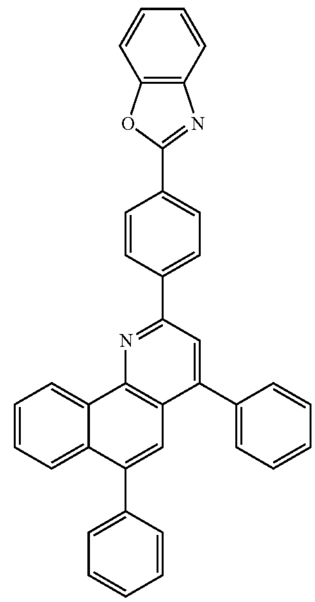
[Chemical Formula B141]
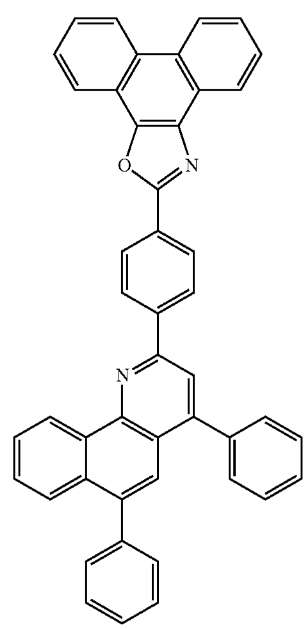

[Chemical Formula B142]
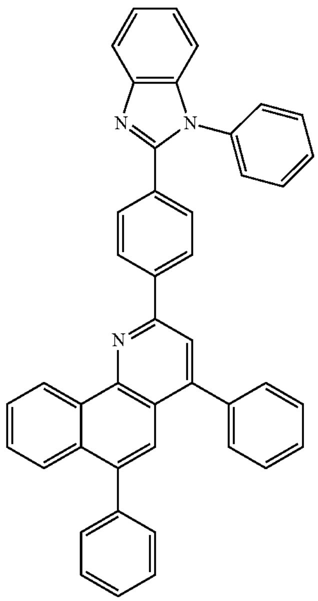
[Chemical Formula B143]
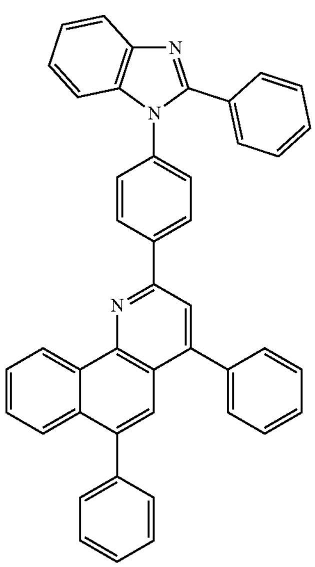
[Chemical Formula B144]
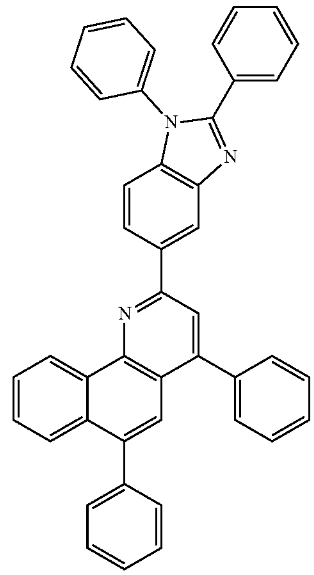
[Chemical Formula B145]
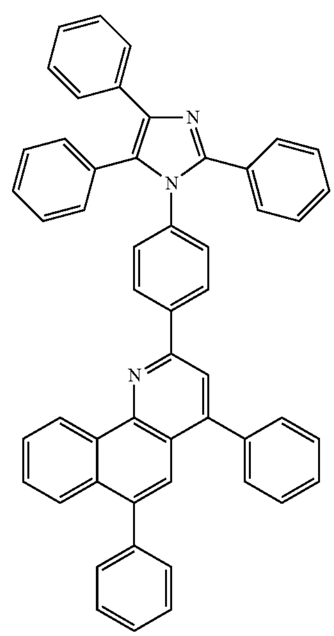

[Chemical Formula B146]
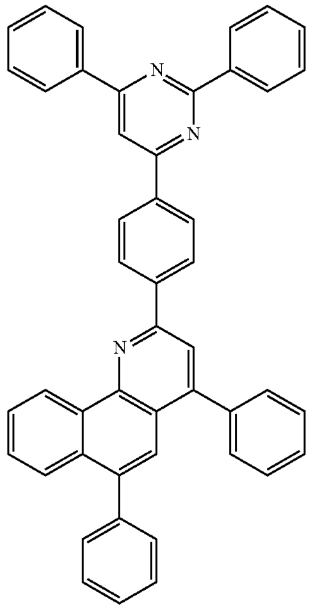
[Chemical Formula B147]
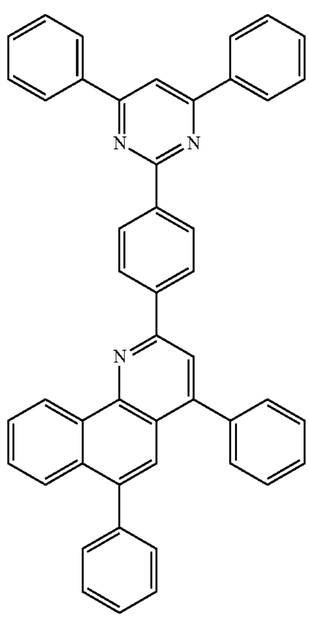
[Chemical Formula B148]
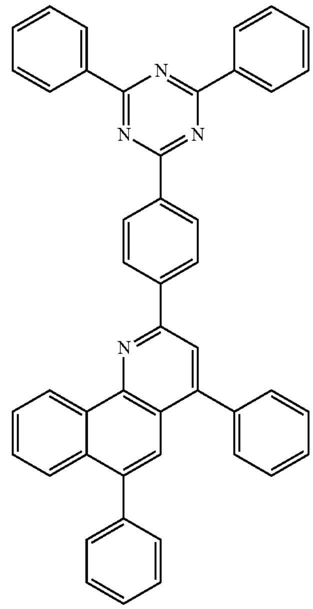
[Chemical Formula B149]
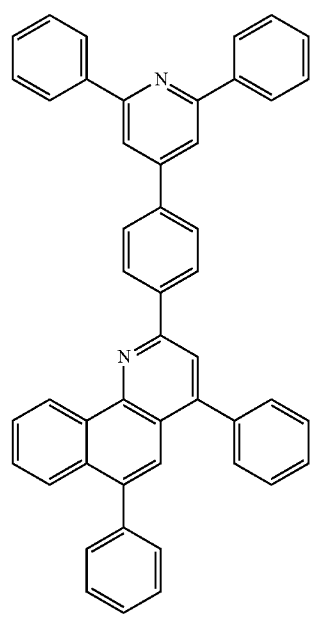

-continued
[Chemical Formula B150]
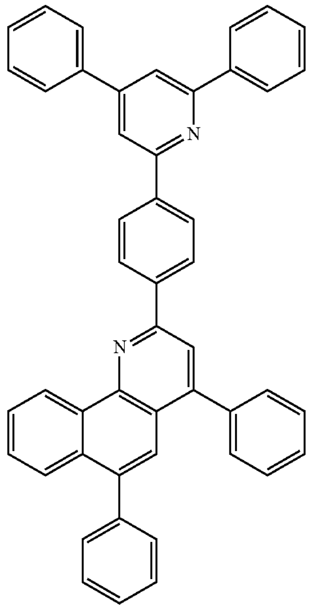
[Chemical Formula B151]
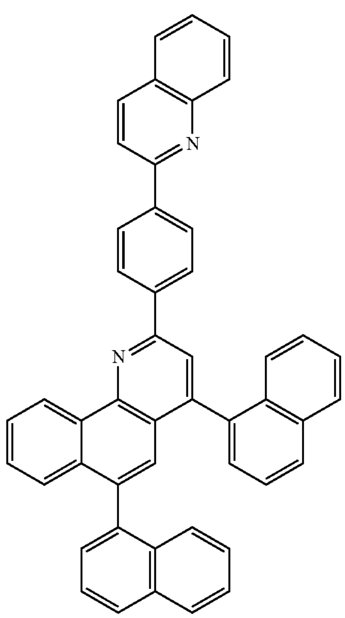
-continued
[Chemical Formula B152]
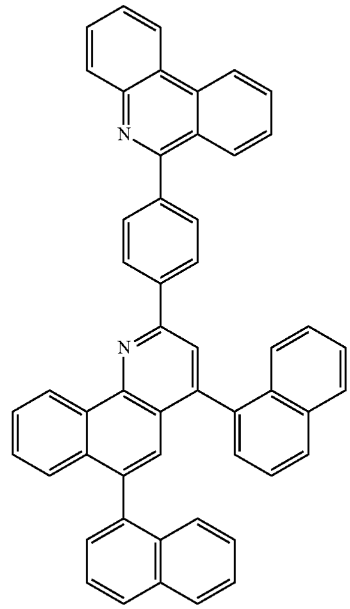
[Chemical Formula B153]
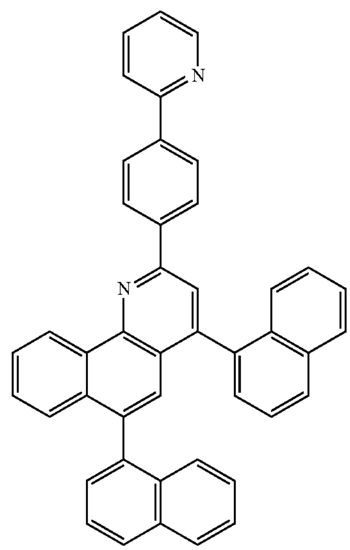
[Chemical Formula B154]
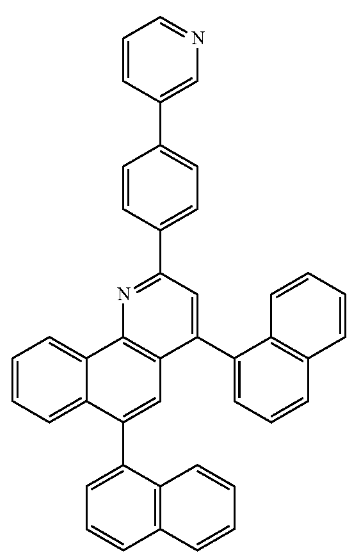

-continued
[Chemical Formula B155]
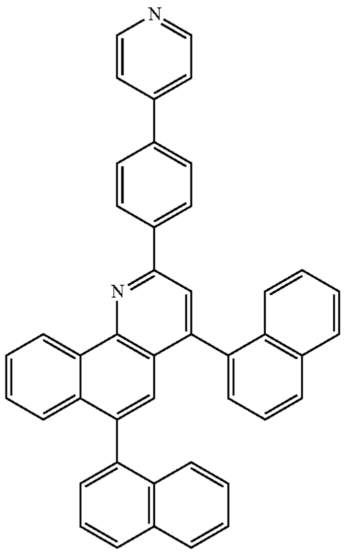
[Chemical Formula B156]
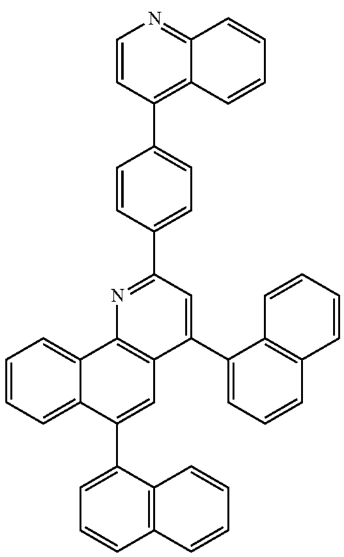
[Chemical Formula B157]
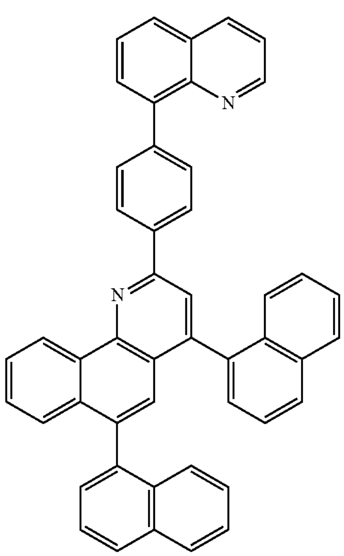
-continued
[Chemical Formula B158]
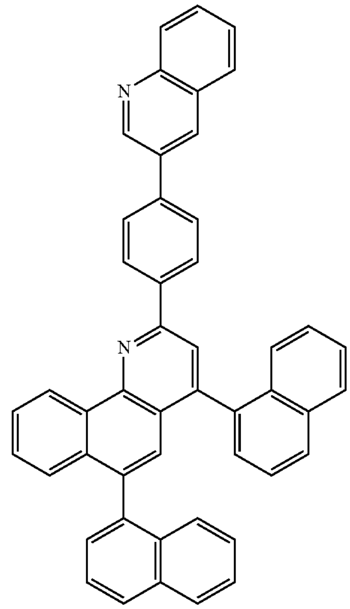
[Chemical Formula B159]
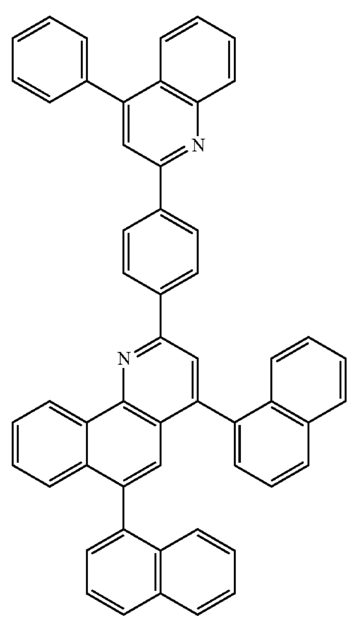

-continued
[Chemical Formula B160]
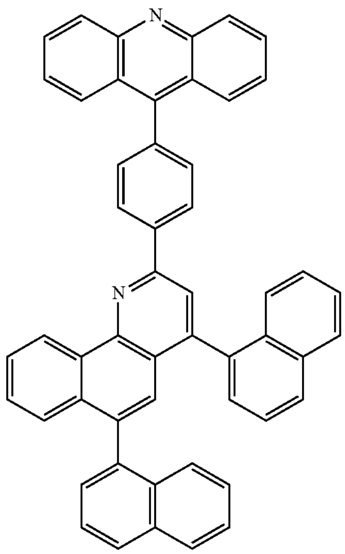
[Chemical Formula B161]
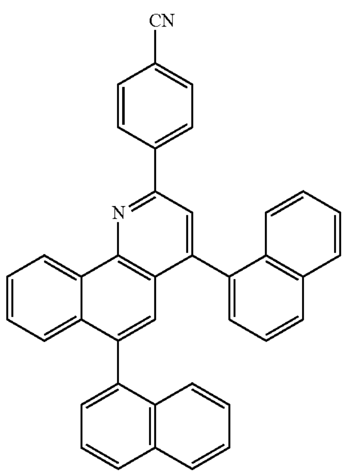
[Chemical Formula B162]
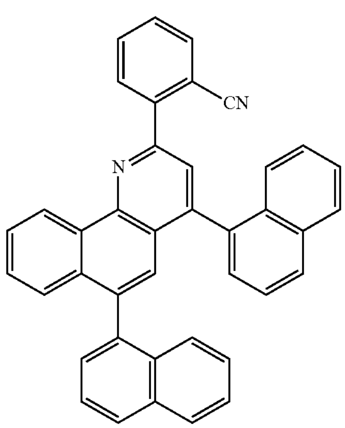
-continued
[Chemical Formula B163]
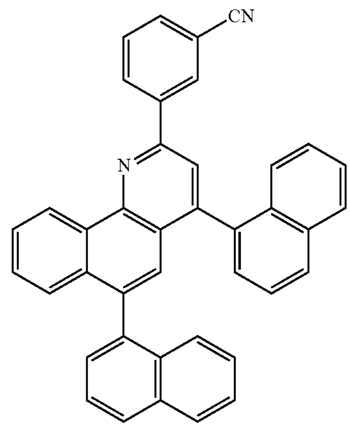
[Chemical Formula B164]
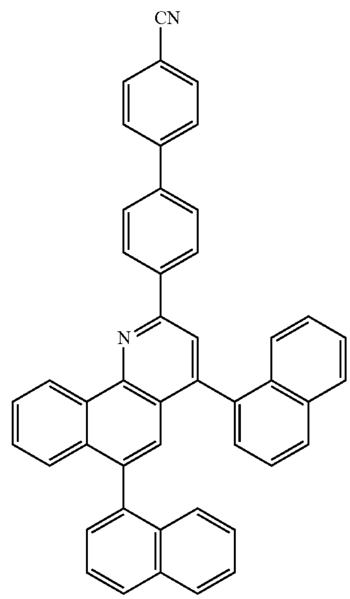
[Chemical Formula B165]
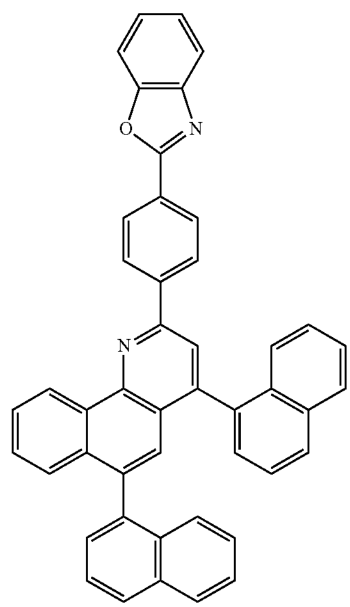

-continued
[Chemical Formula B166]
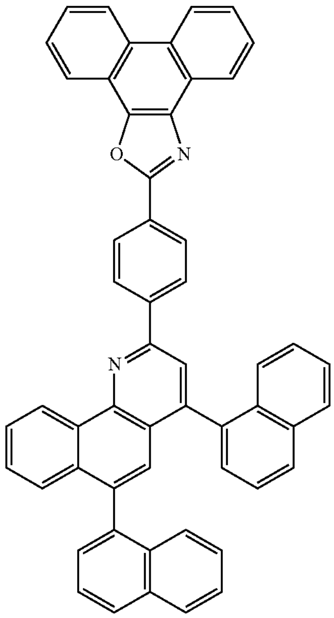
[Chemical Formula B167]
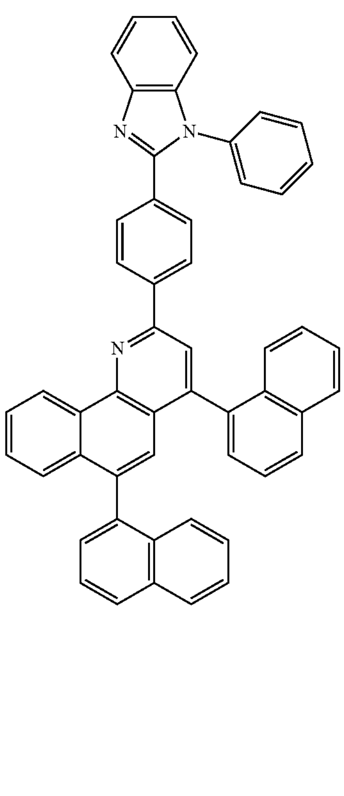
-continued
[Chemical Formula B168]
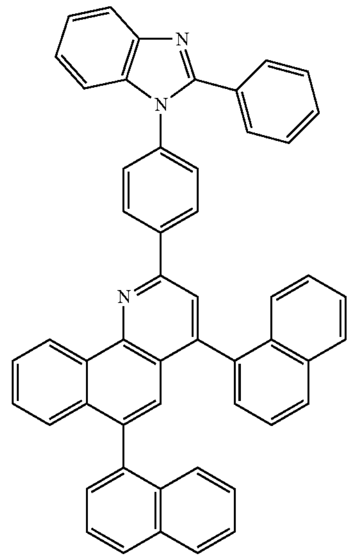
[Chemical Formula B169]
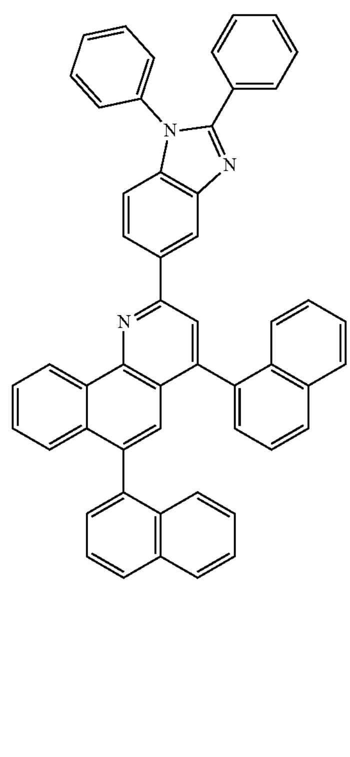

[Chemical Formula B170]
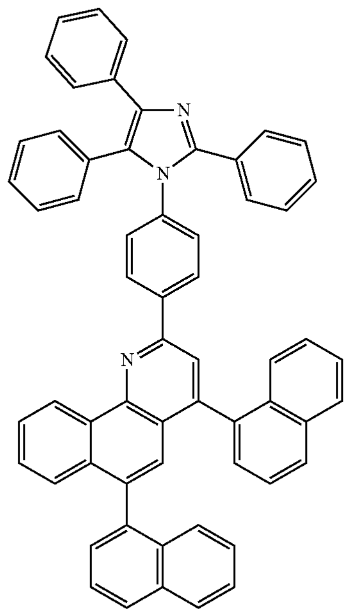
[Chemical Formula B171]
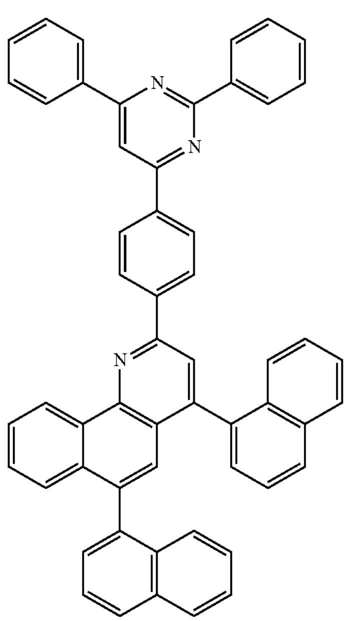
[Chemical Formula B172]
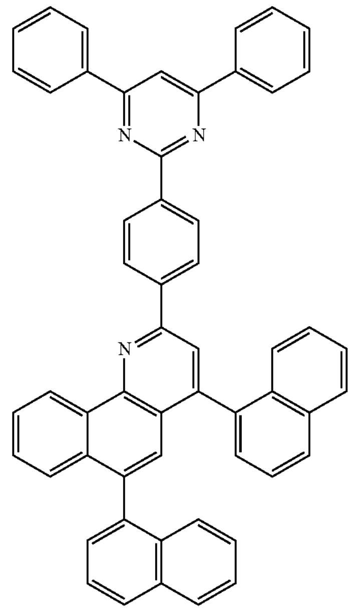
[Chemical Formula B173]
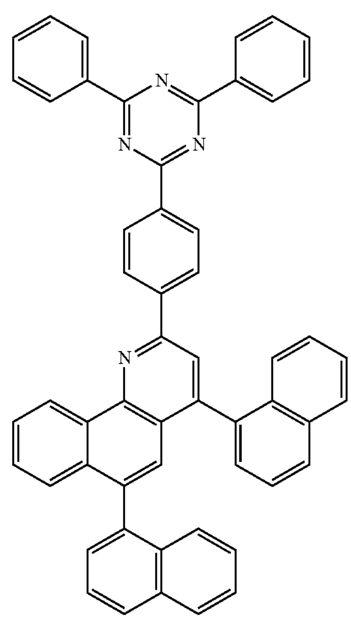

-continued
[Chemical Formula B174]
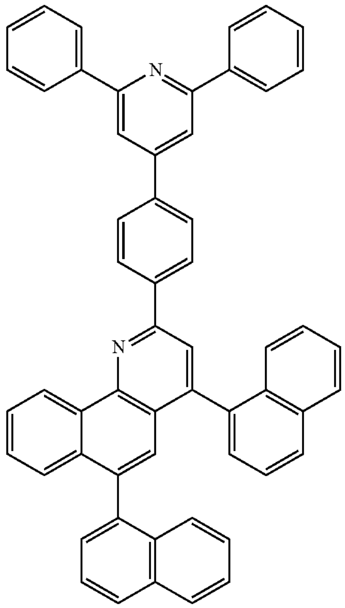
[Chemical Formula B175]
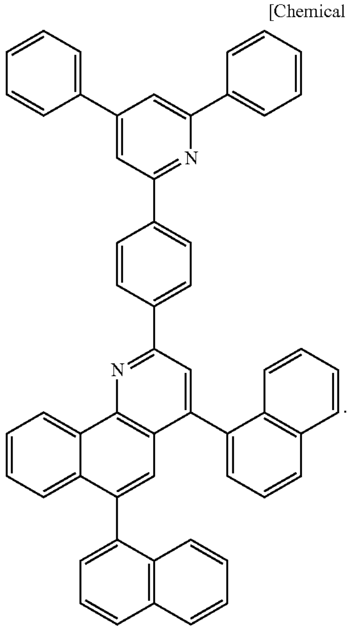
10. The compound for an organic optoelectronic device as claimed in claim 1, wherein the compound represented by
Chemical Formula 2 is represented by one of the following Chemical Formulae C1 to C173:
[Chemical Formula C1]
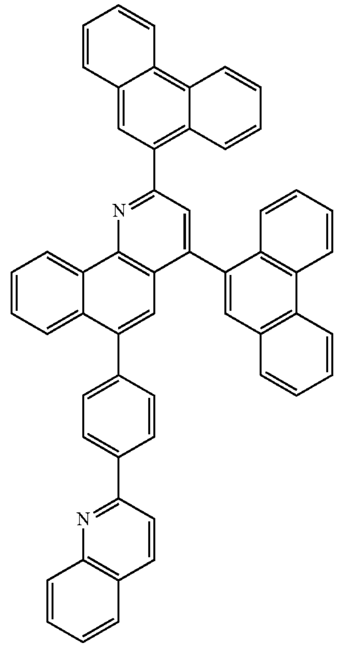
[Chemical Formula C2]
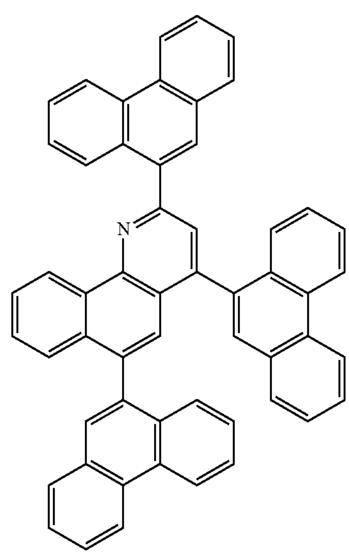

[Chemical Formula C3]
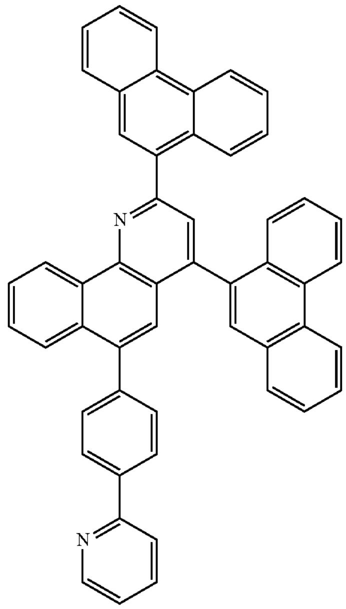
[Chemical Formula C4]
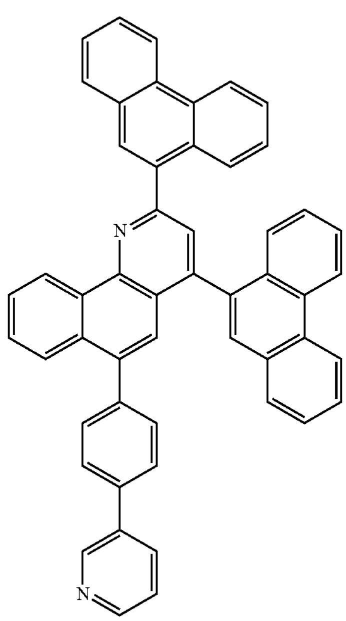
[Chemical Formula C5]
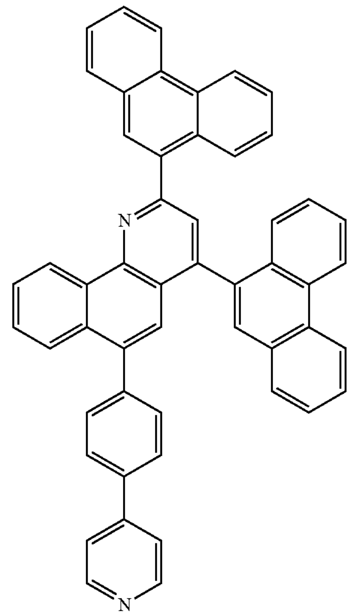
[Chemical Formula C6]
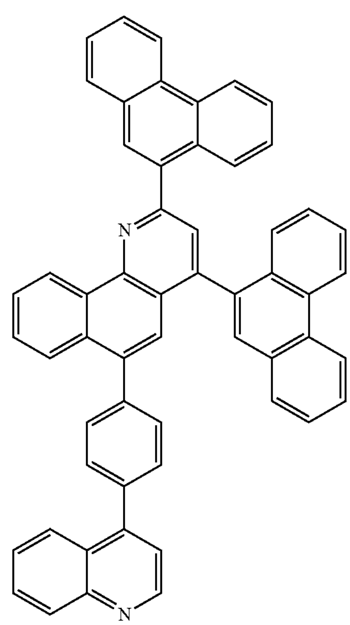

-continued
[Chemical Formula C7]
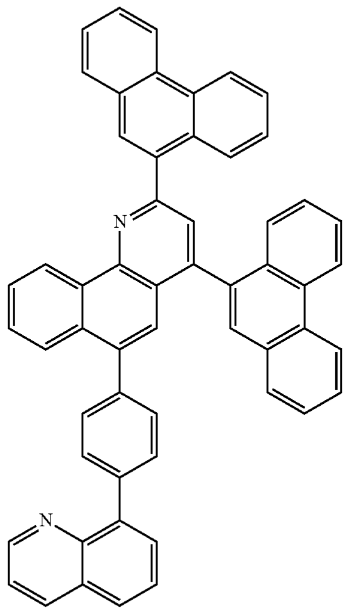
[Chemical Formula C8]
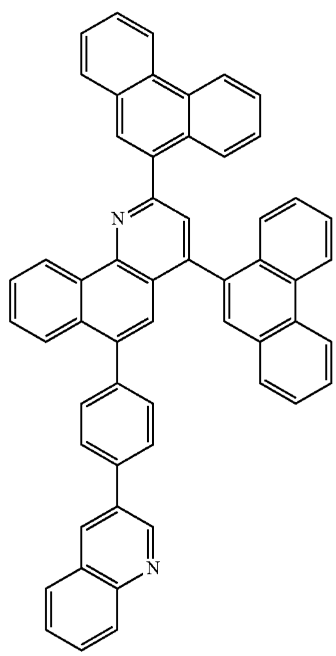
-continued
[Chemical Formula C9]
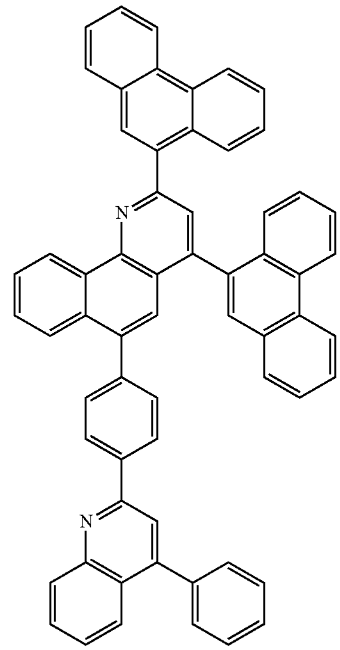
[Chemical Formula C10]
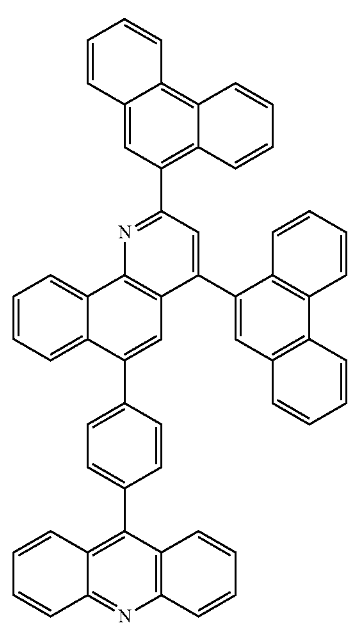

[Chemical Formula C11]
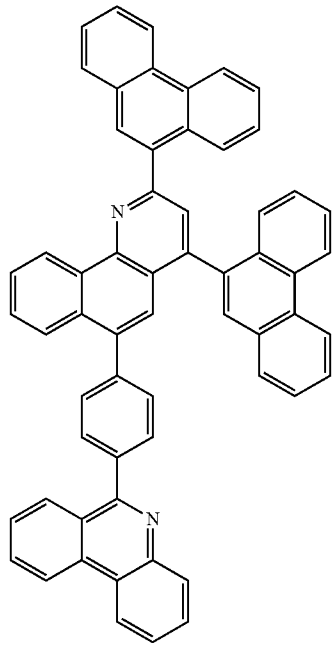
[Chemcial Formula C12]
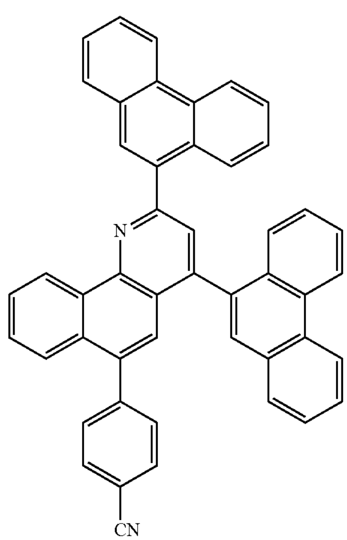
[Chemical Formula C13]
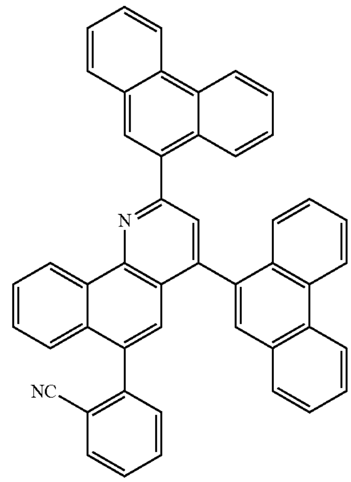
[Chemical Formula C14]
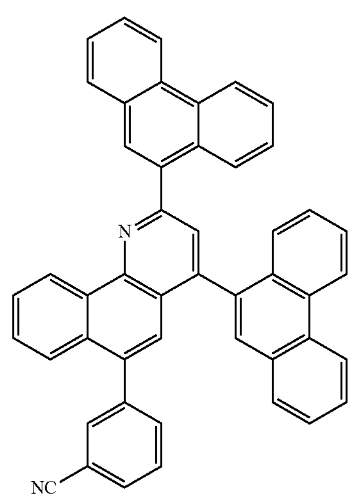

[Chemical Formula C15]
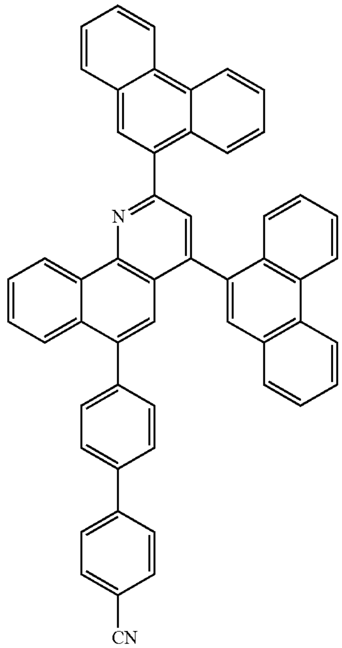
[Chemical Formula C16]
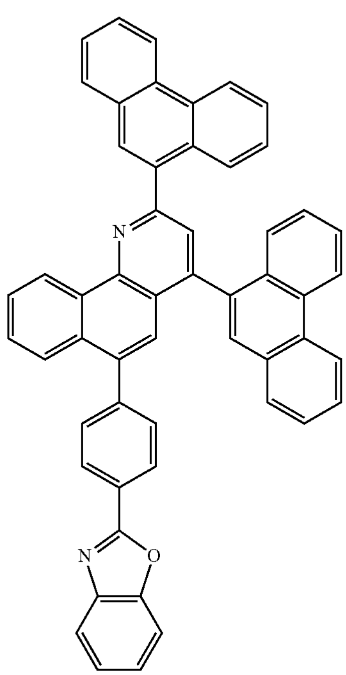
[Chemical Formula C17]
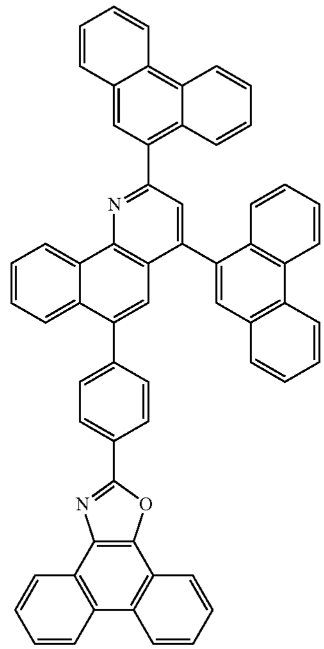
[Chemical Formula C18]
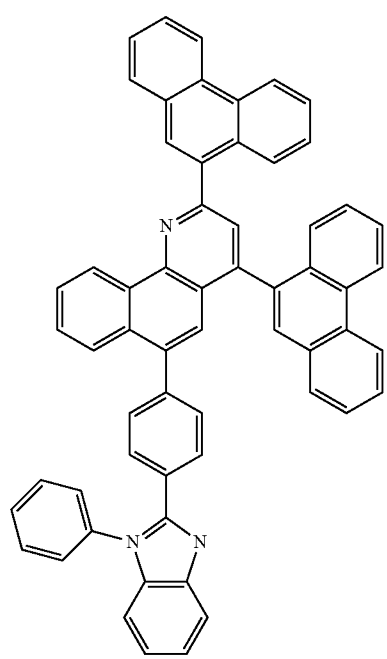

[Chemical Formula C19]
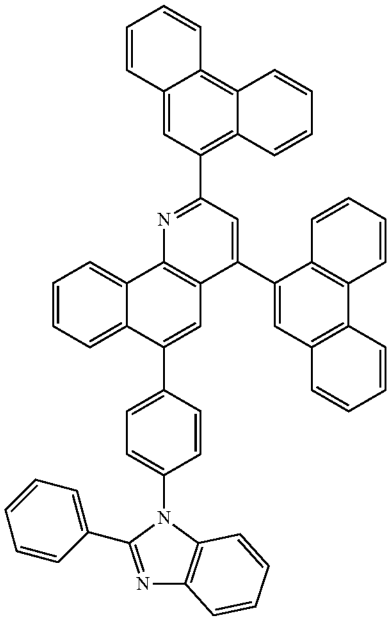
[Chemical Formula C20]
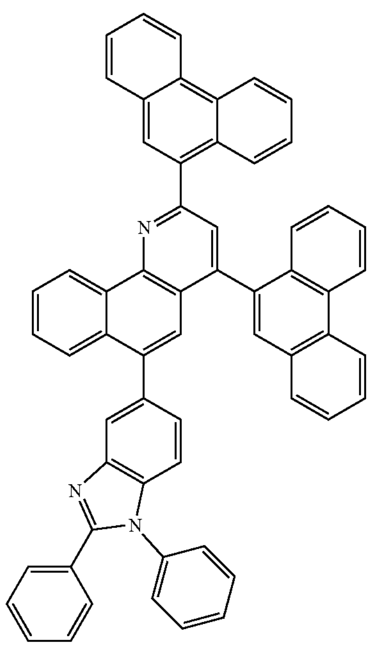
[Chemical Formula C21]
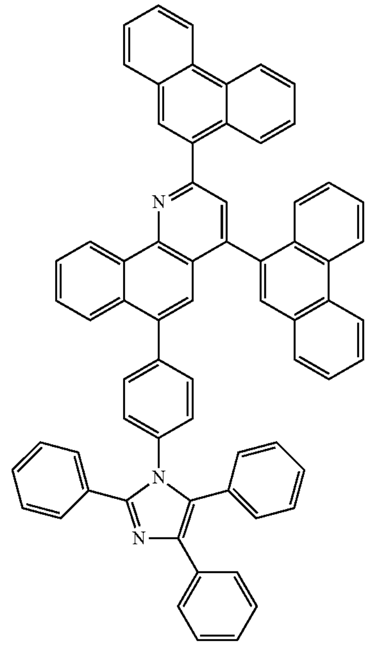
[Chemical Formula C22]
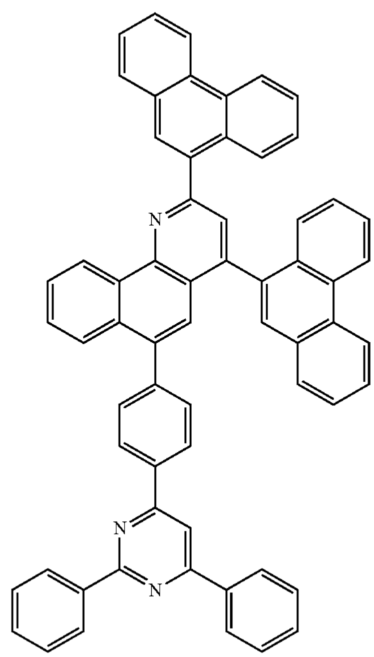

[Chemical Formula C23]
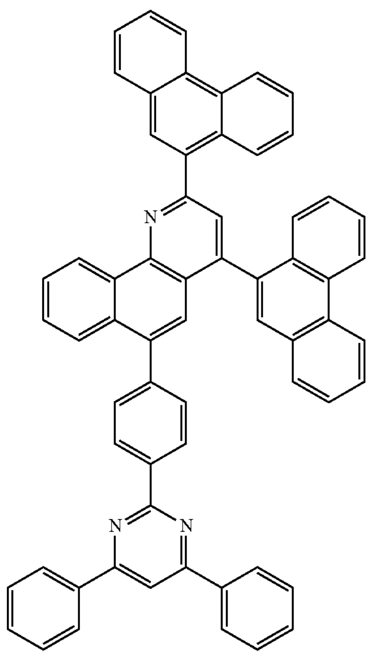
[Chemical Formula C24]
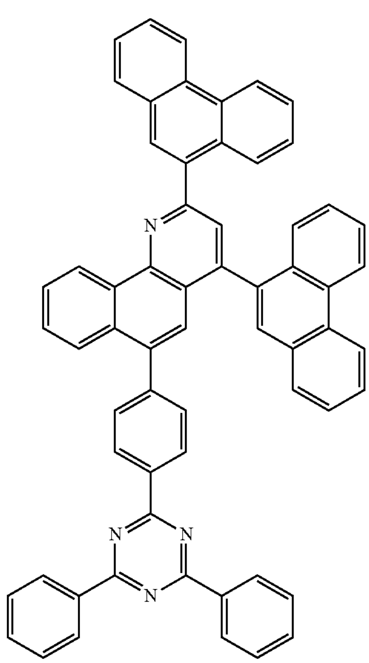
[Chemical Formula C25]
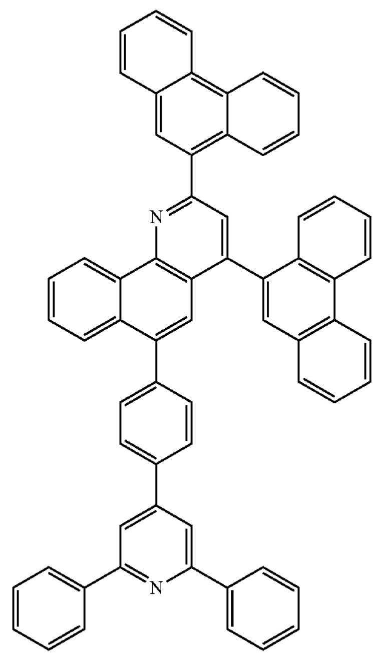
[Chemical Formula C26]
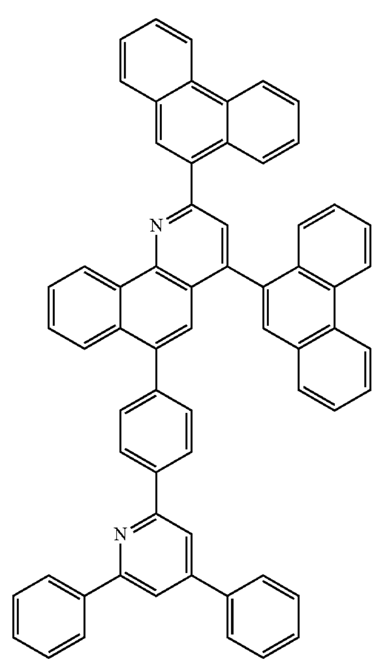

-continued
[Chemical Formula C27]
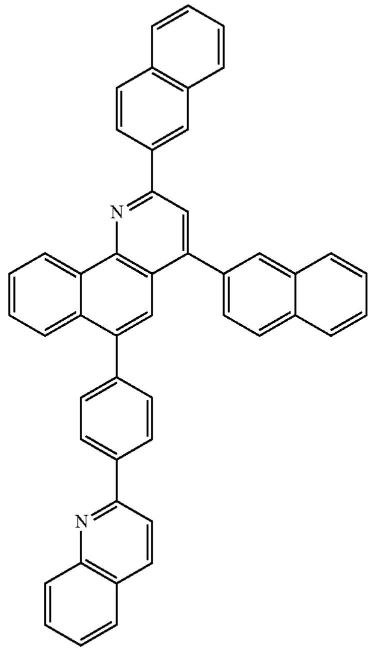
[Chemical Formula C28]
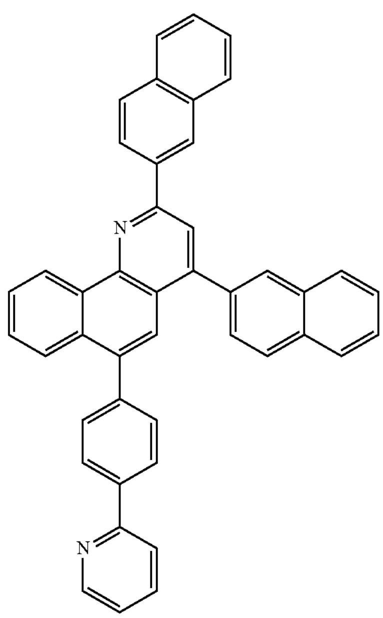
-continued
[Chemical Formula C29]
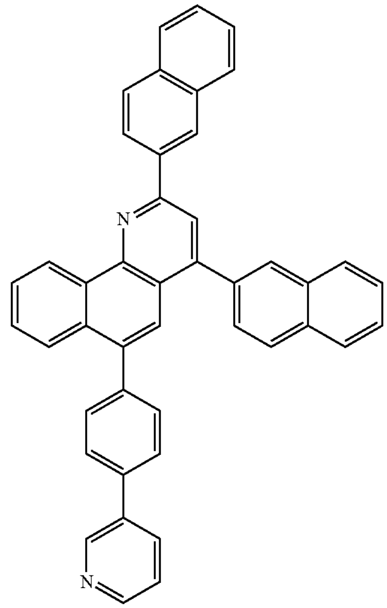
[Chemical Formula C30]
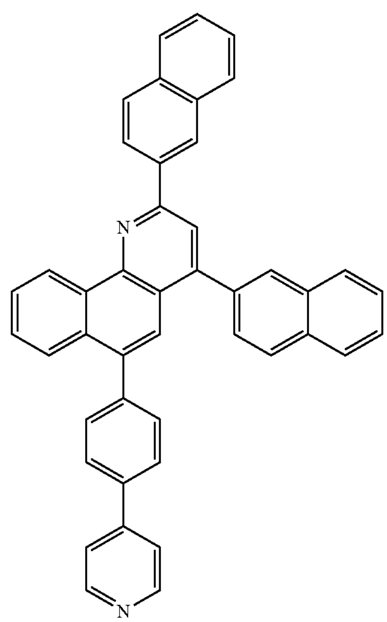

[Chemical Formula C31]
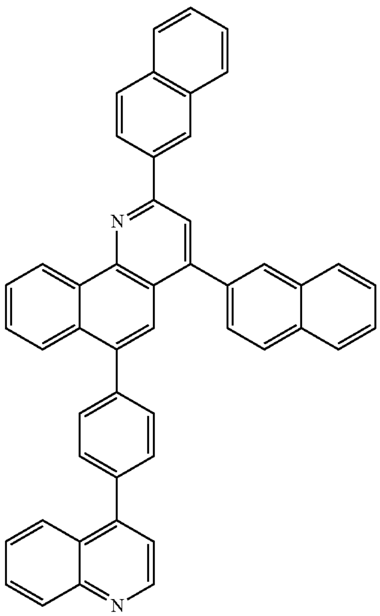
[Chemical Formula C32]
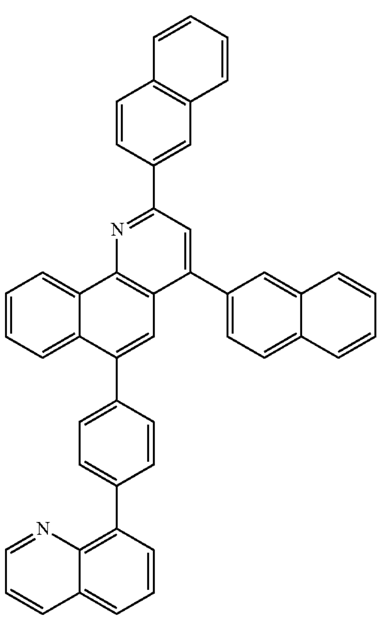
[Chemical Formula C33]
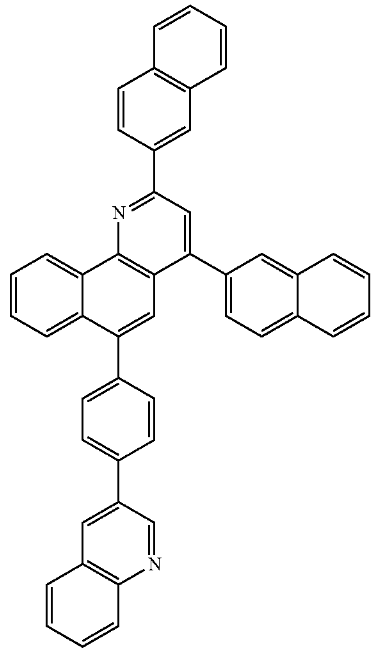
[Chemical Formula C34]
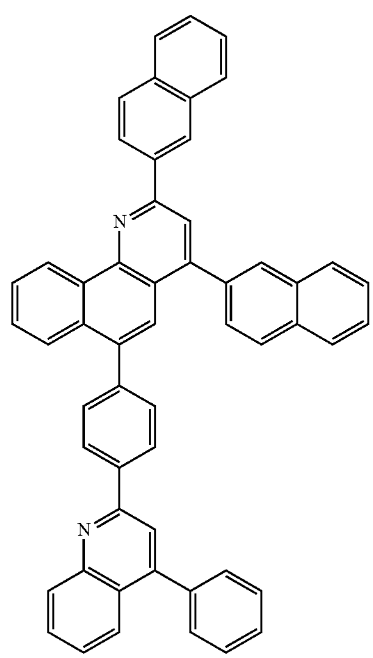

-continued
[Chemical Formula C35]
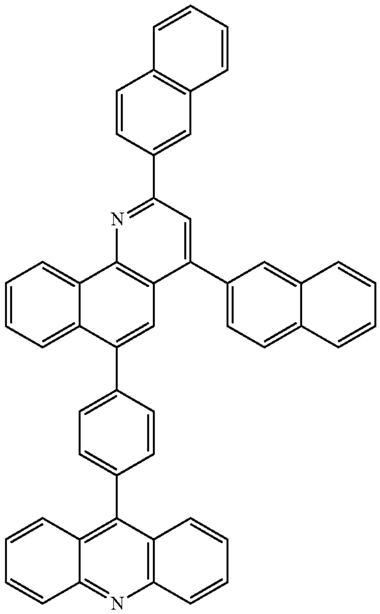
[Chemical Formula C36]
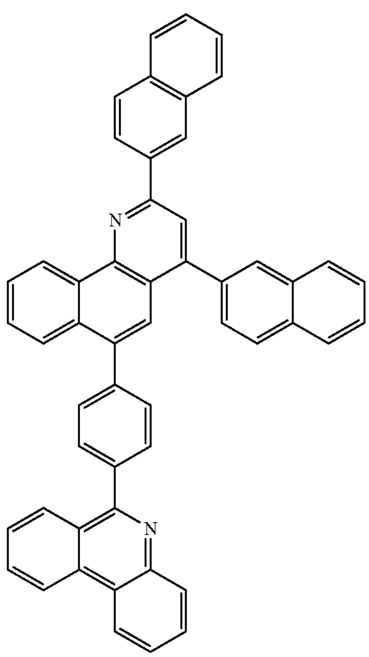
-continued
[Chemical Formula C37]
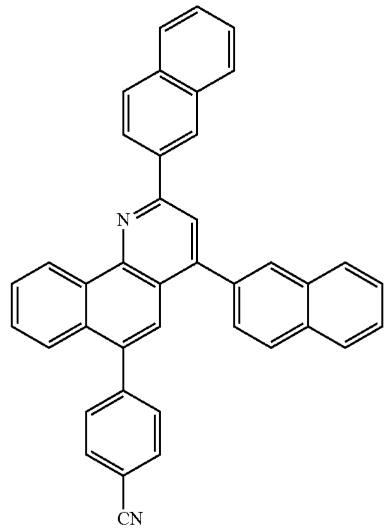
[Chemical Formula C38]
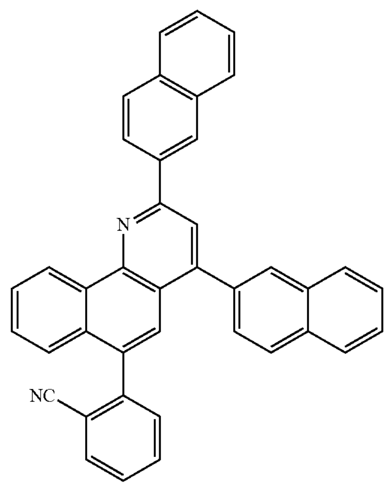
[Chemical Formula C39]
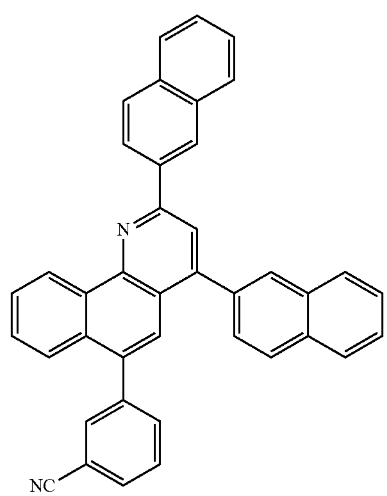

-continued
[Chemical Formula C40]
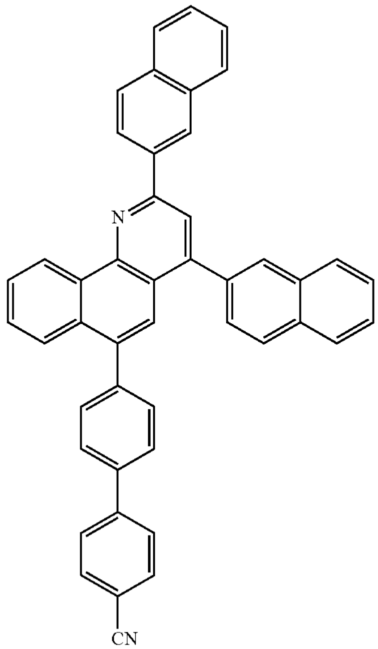
[Chemical Formula C41]
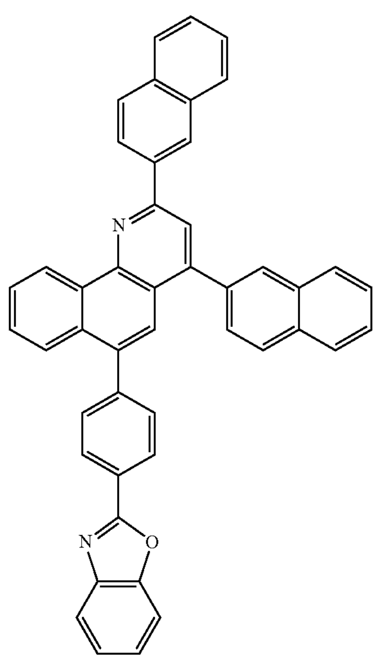
-continued
[Chemical Formula C42]
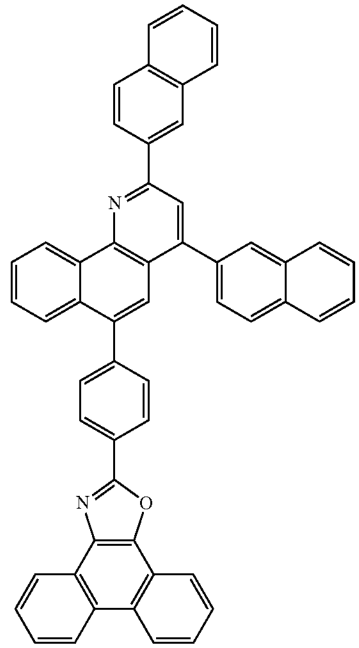
[Chemical Formula C43]
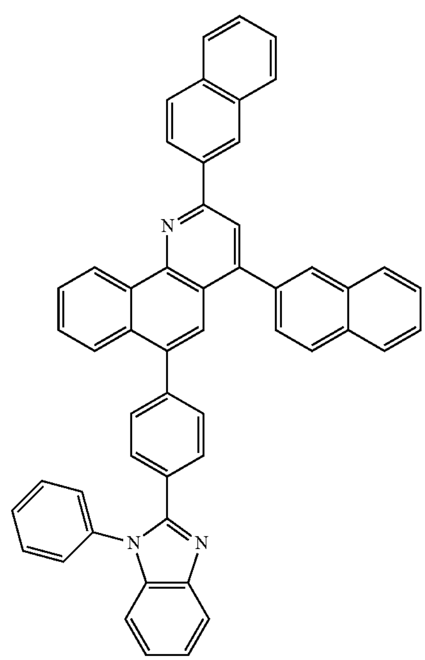

[Chemical Formula C44]
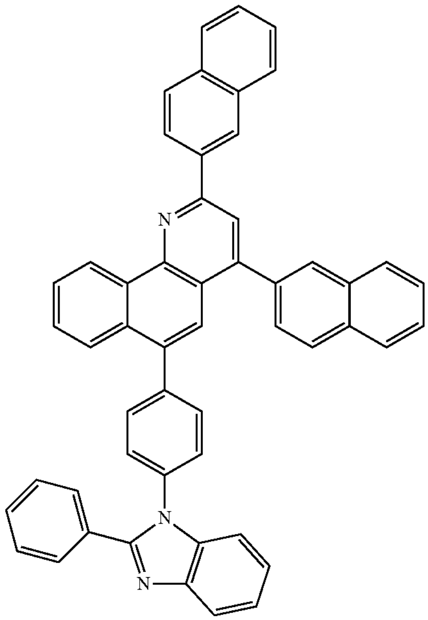
[Chemical Formula C45]
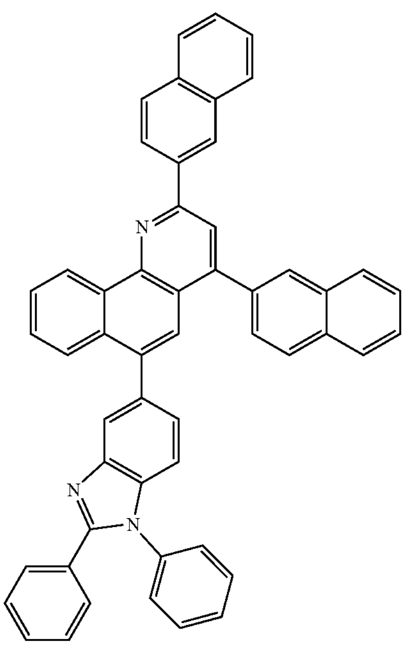
[Chemical Formula C46]
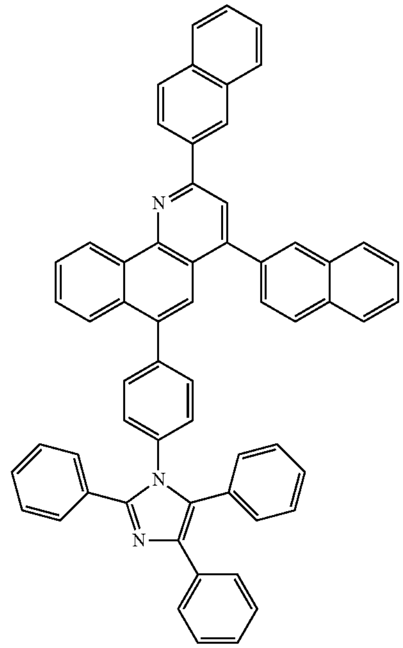
[Chemical Formula C47]
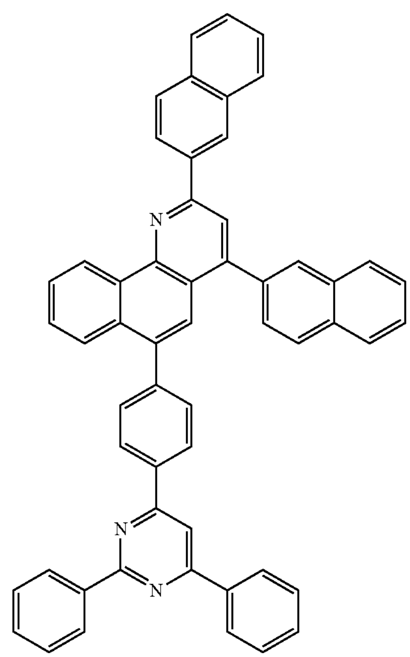

-continued
[Chemical Formula C48]
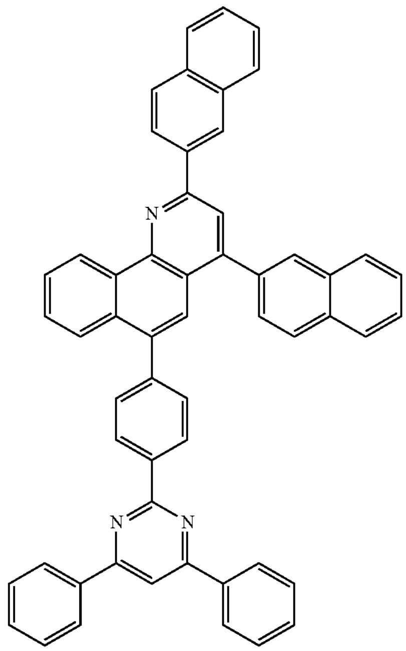
[Chemical Formula C49]
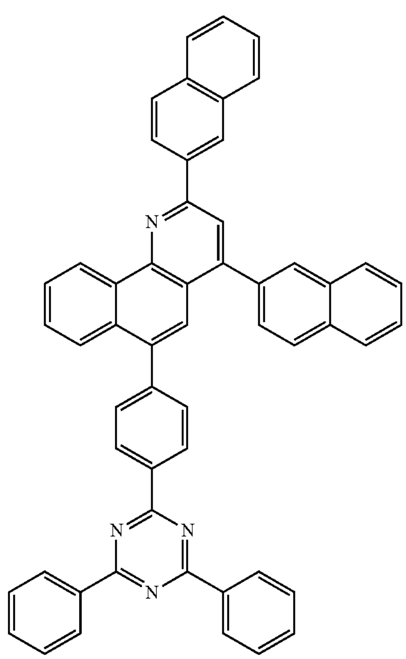
-continued
[Chemical Formula C50]
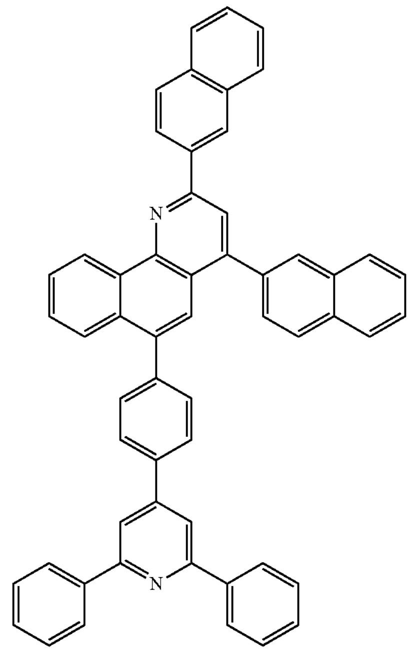
[Chemical Formula C51]
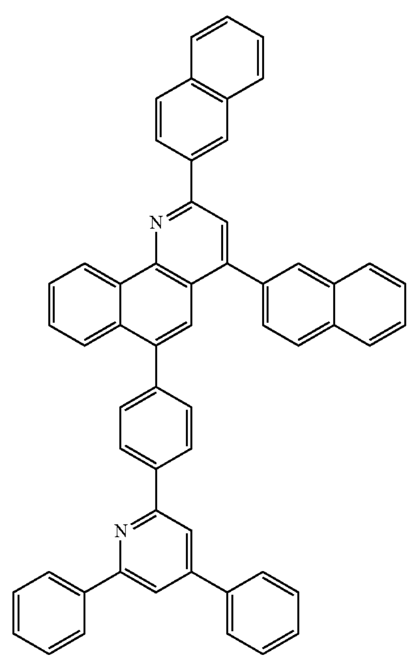

-continued
[Chemical Formula C52]
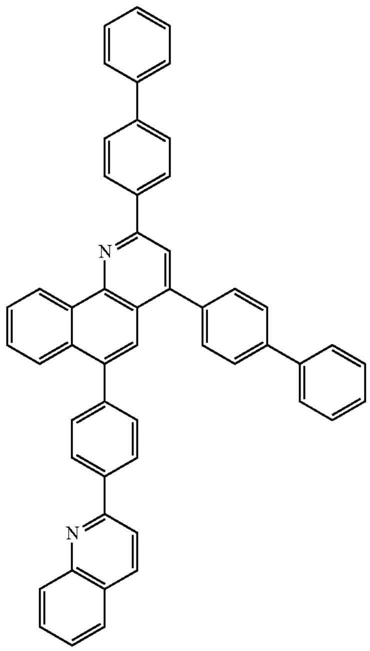
[Chemical Formula C53]
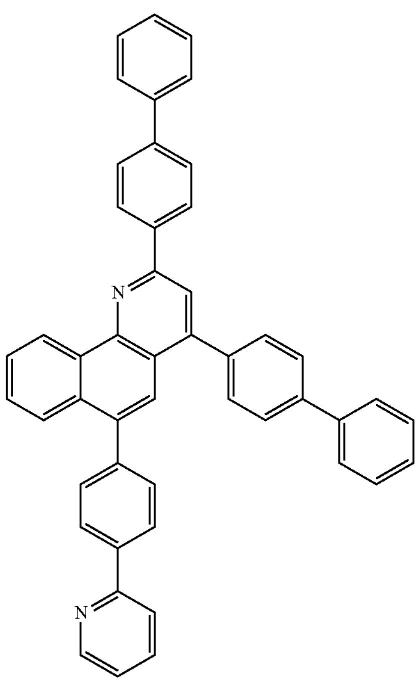
-continued
[Chemical Formula C54]
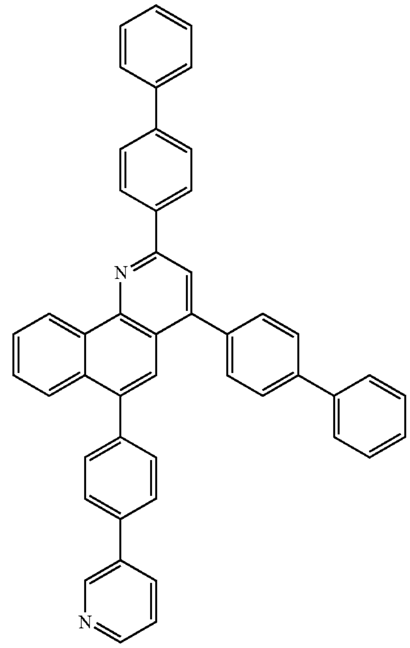
[Chemical Formula C55]
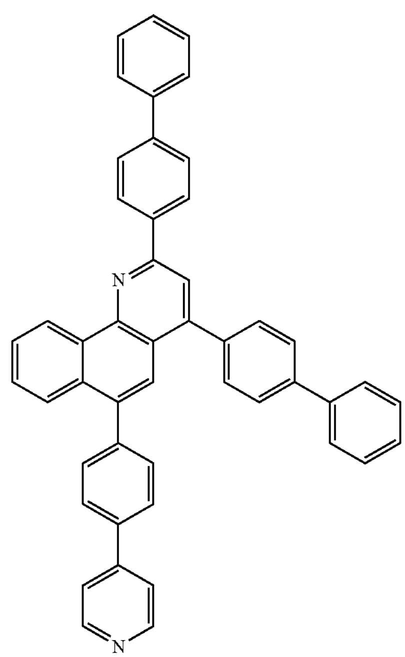

-continued
[Chemical Formula C56]
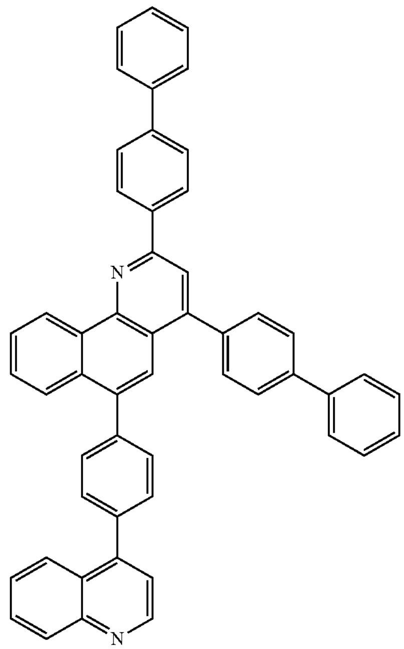
[Chemical Formula C57]
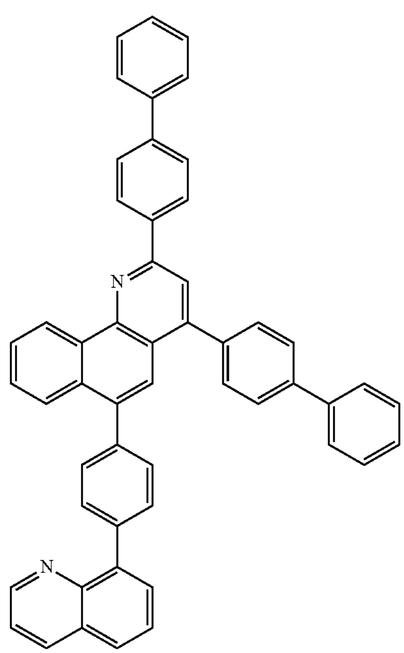
-continued
[Chemical Formula C58]
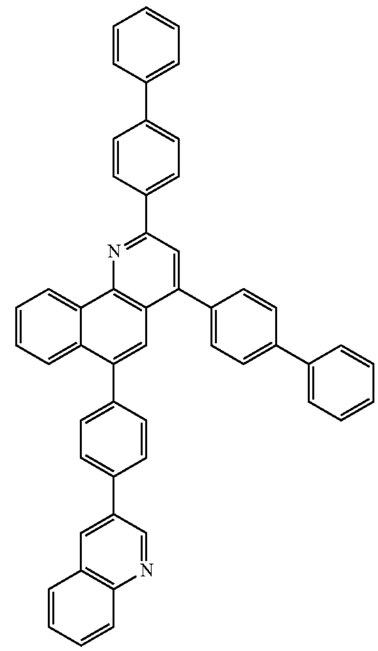
[Chemical Formula C59]
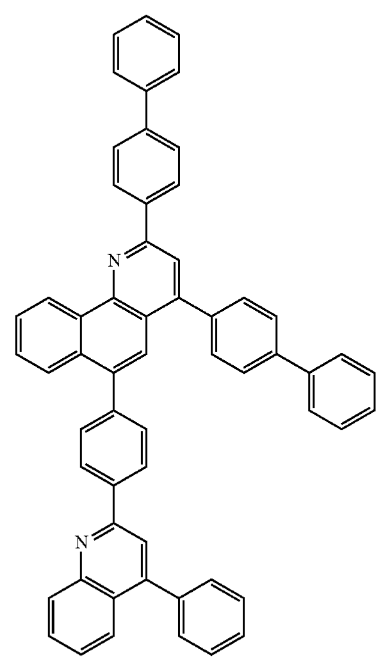

-continued
[Chemical Formula C60]
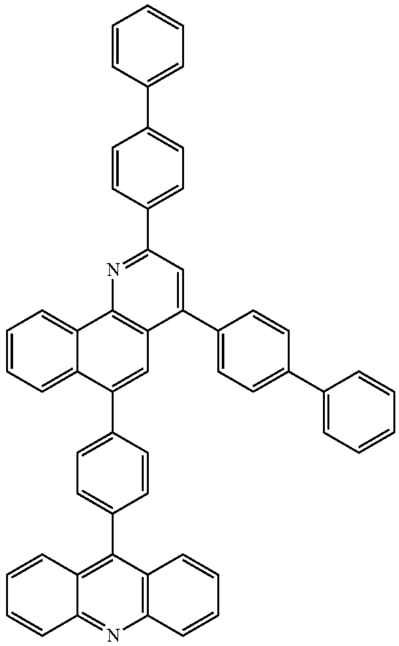
[Chemical Formula C61]
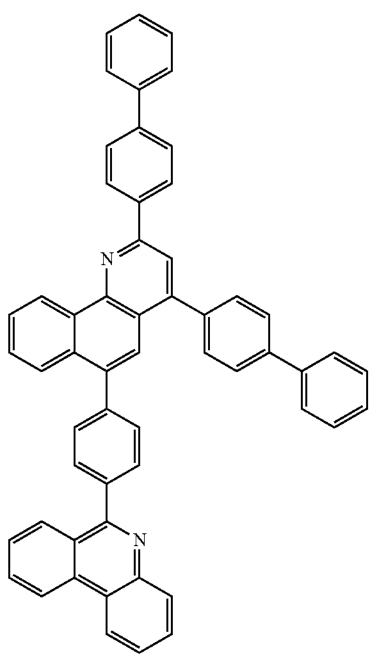
-continued
[Chemical Formula C62]
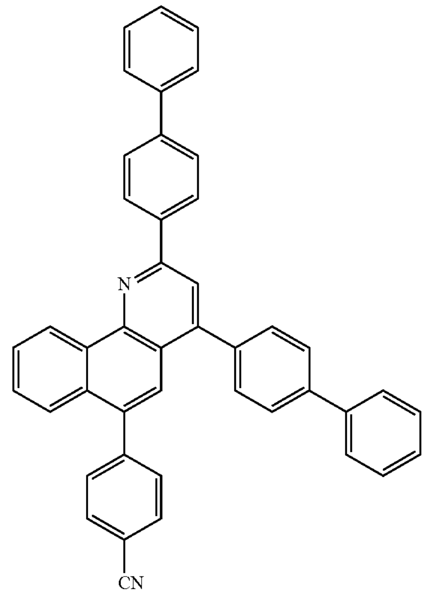
[Chemical Formula C63]
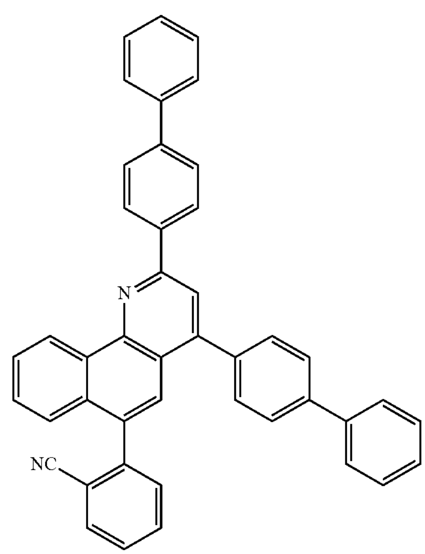

-continued
[Chemical Formula C64]
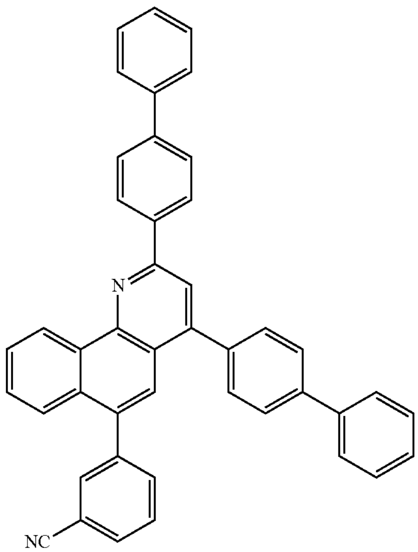
[Chemical Formula C65]
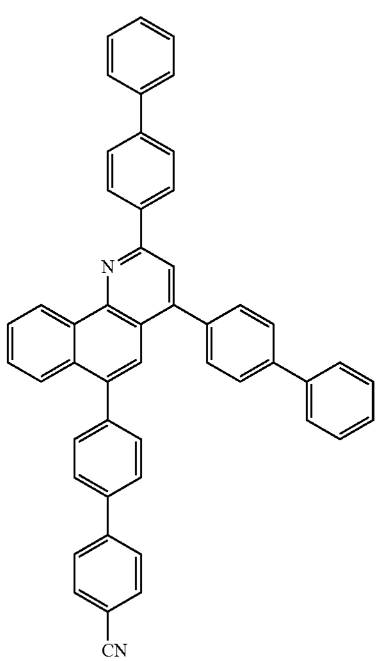
-continued
[Chemical Formula C66]
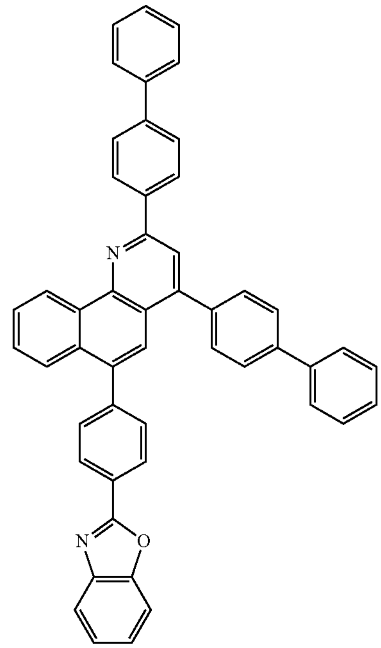
[Chemical Formula C67]
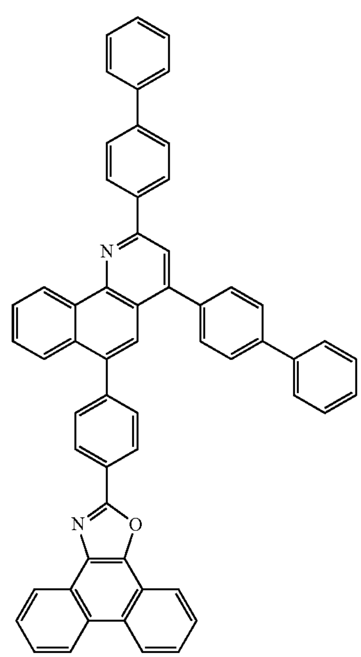

-continued
[Chemical Formula C68]
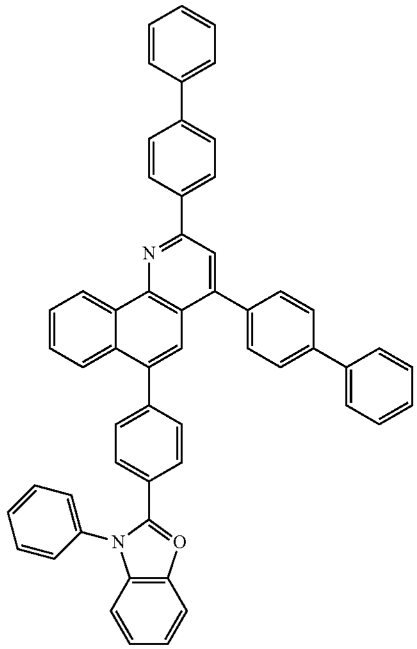
[Chemical Formula C69]
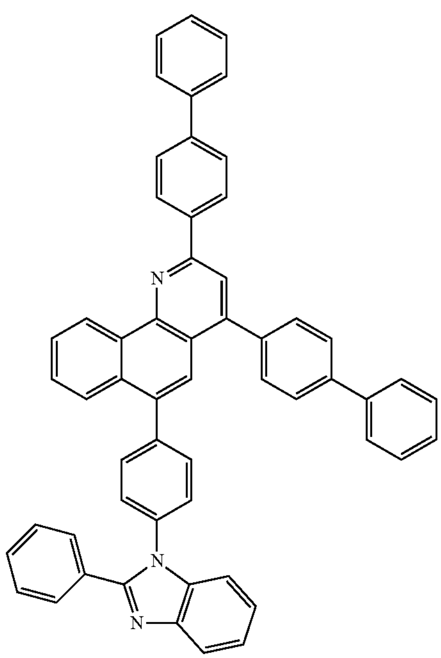
-continued
[Chemical Formula C70]
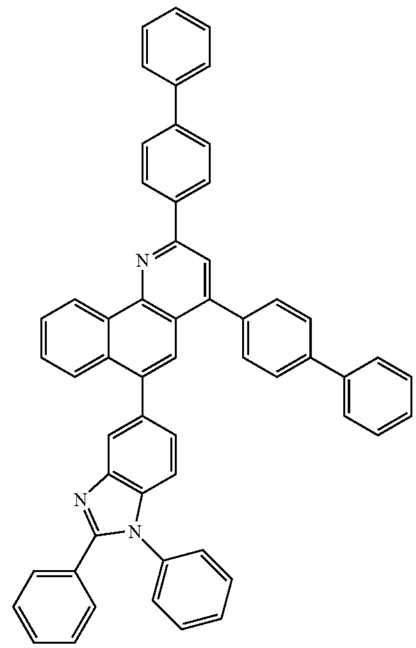
[Chemical Formula C71]
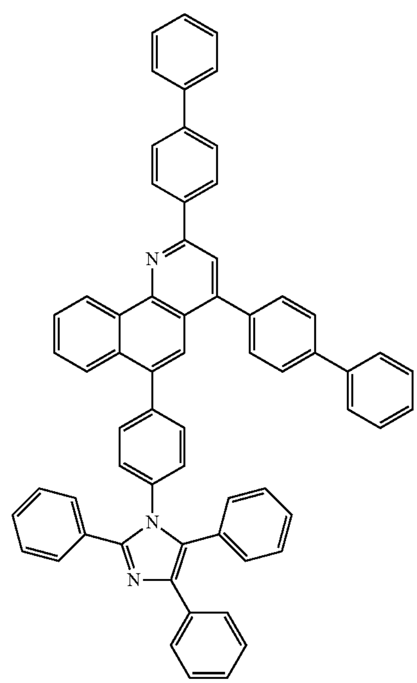

-continued
[Chemical Formula C72]
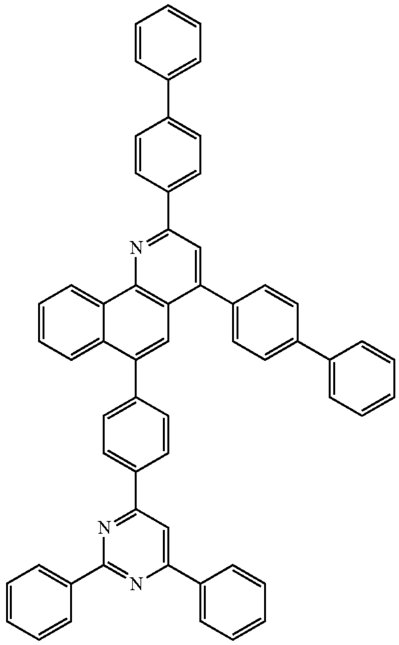
[Chemical Formula C73]
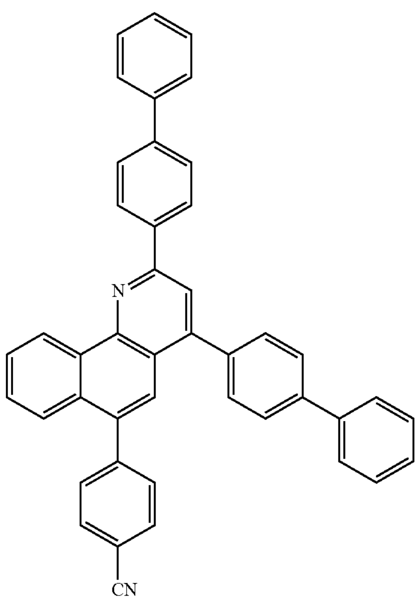
-continued
[Chemical Formula C74]
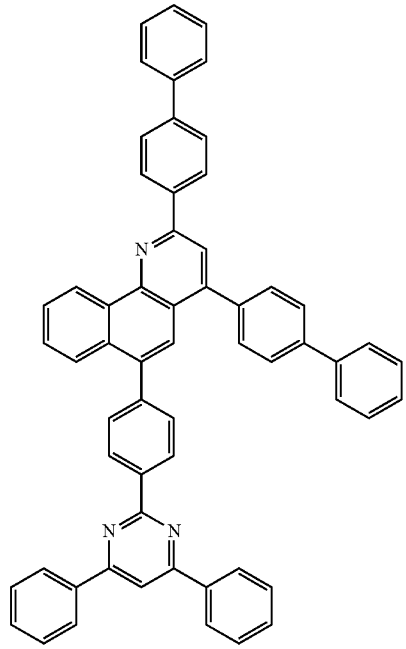
[Chemical Formula C75]
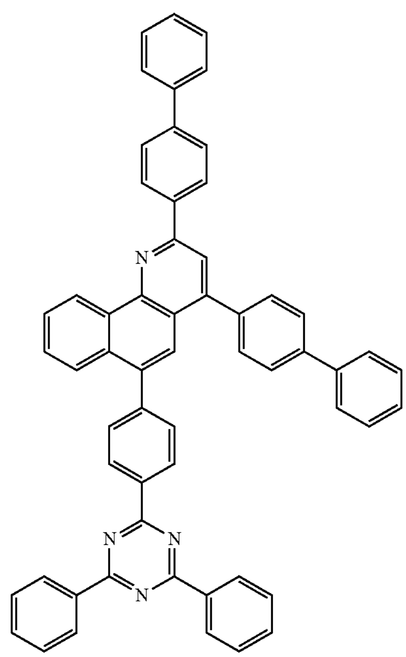

-continued
[Chemical Formula C76]
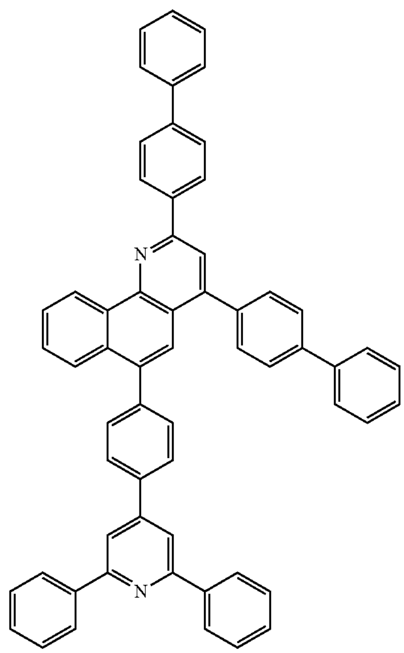
[Chemical Formula C77]
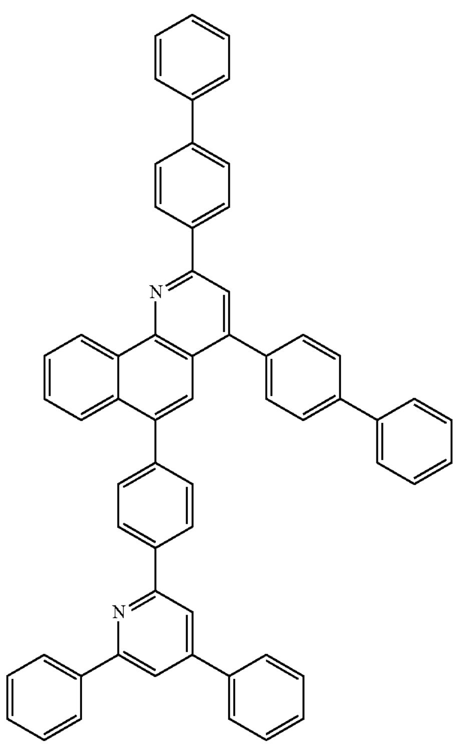
-continued
[Chemical Formula C78]
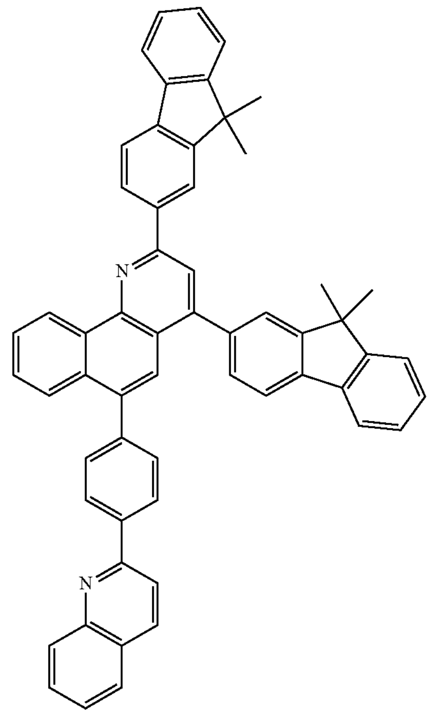
[Chemical Formula C79]
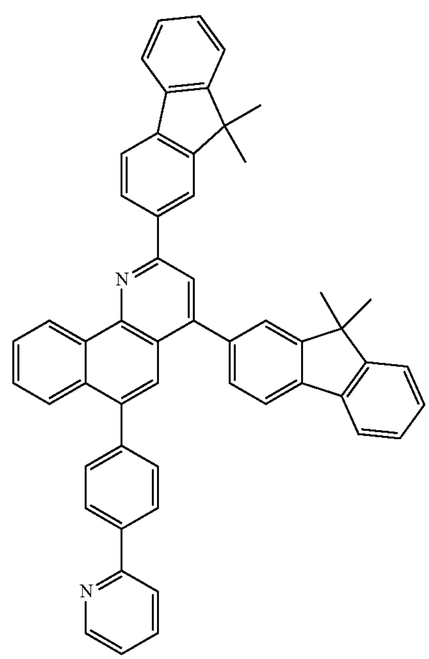

-continued
[Chemical Formula C80]
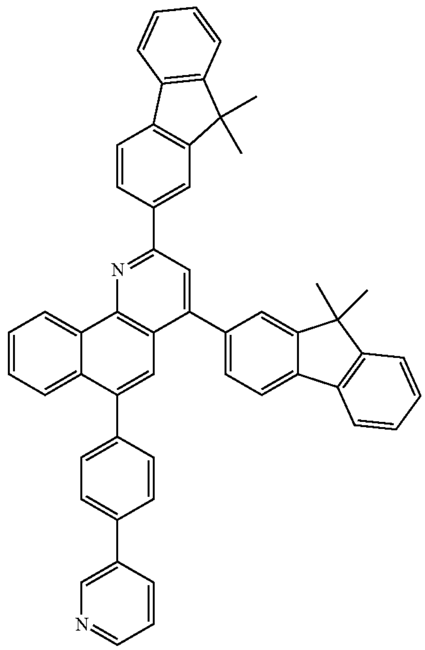
[Chemical Formula C81]
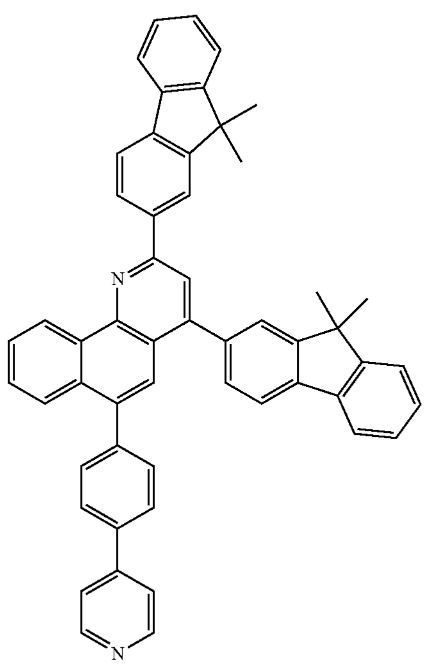
-continued
[Chemical Formula C82]
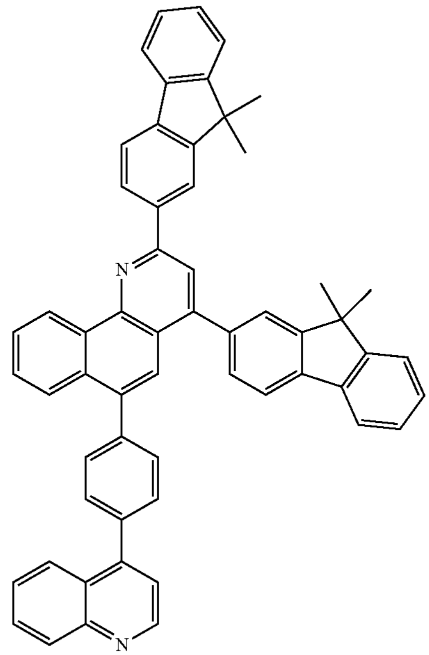
[Chemical Formula C83]
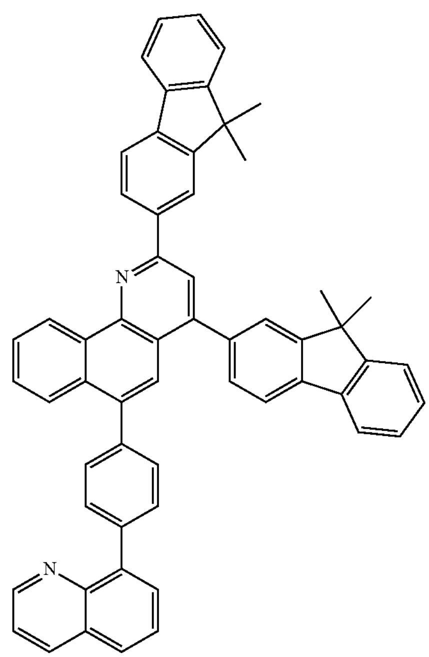

[Chemical Formula C84]
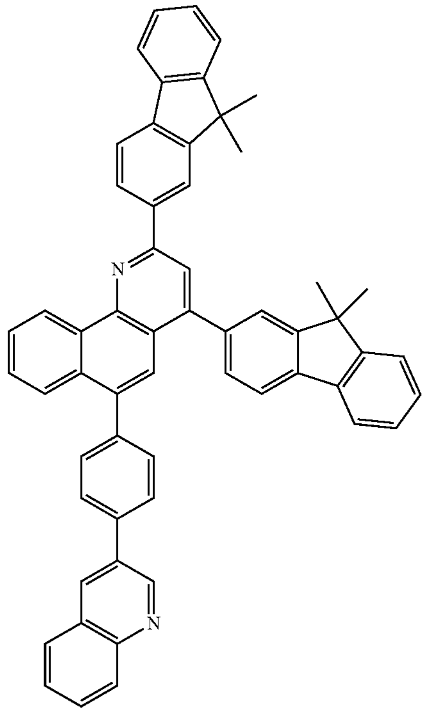
[Chemical Formula C85]
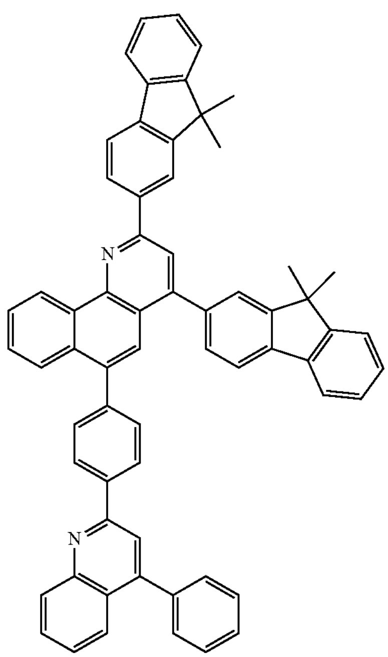
[Chemical Formula C86]
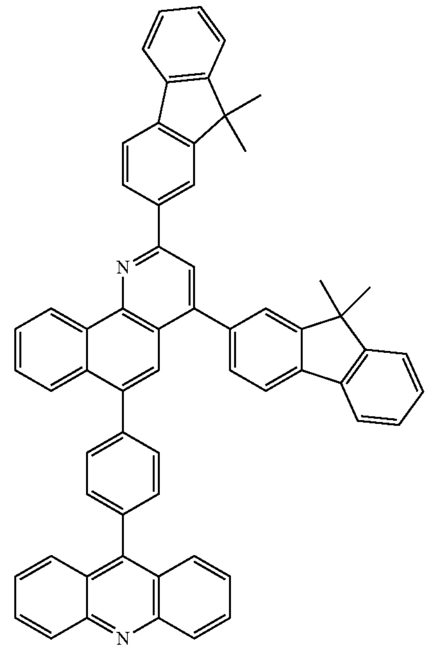
[Chemical Formula C87]
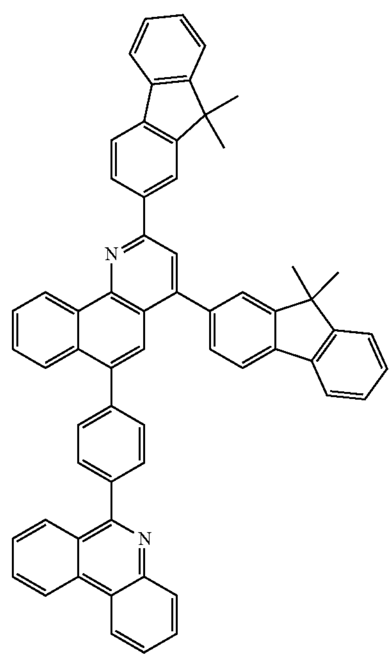

-continued
[Chemical Formula C88]
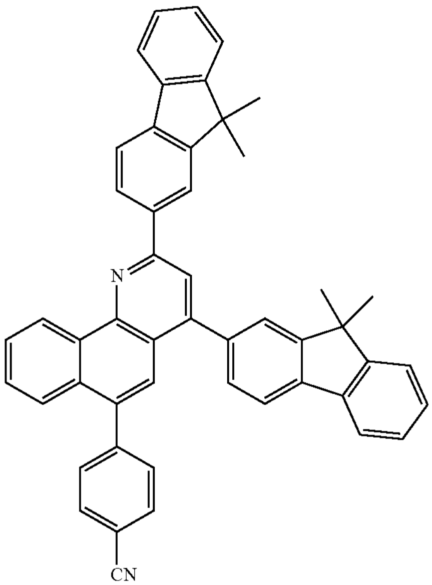
[Chemical Formula C89]
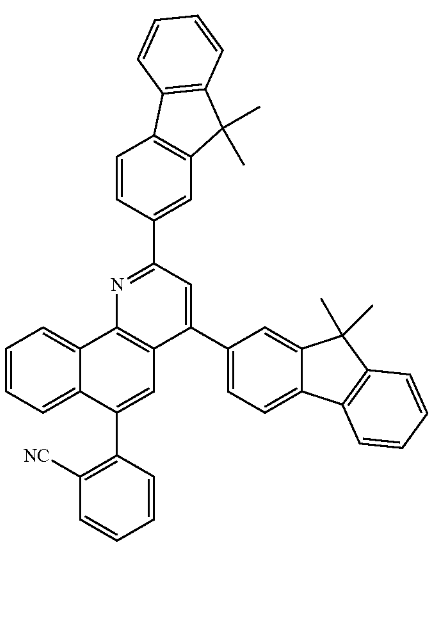
-continued
[Chemical Formula C90]
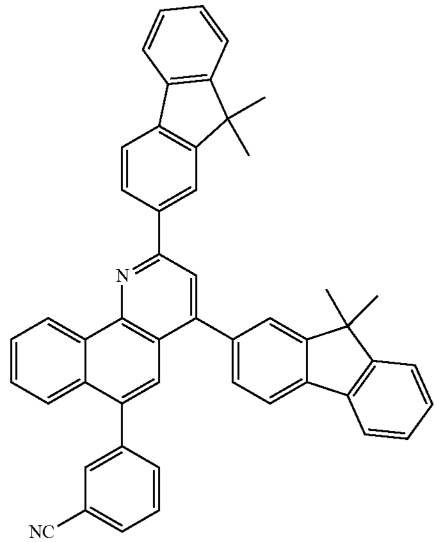
[Chemical Formula C91]
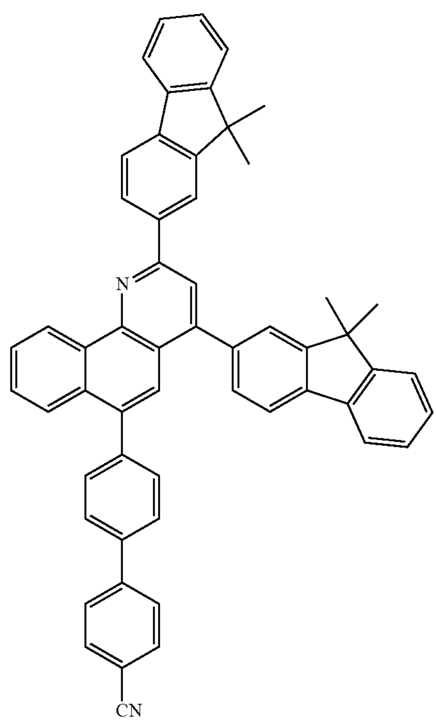

-continued
[Chemical Formula C92]
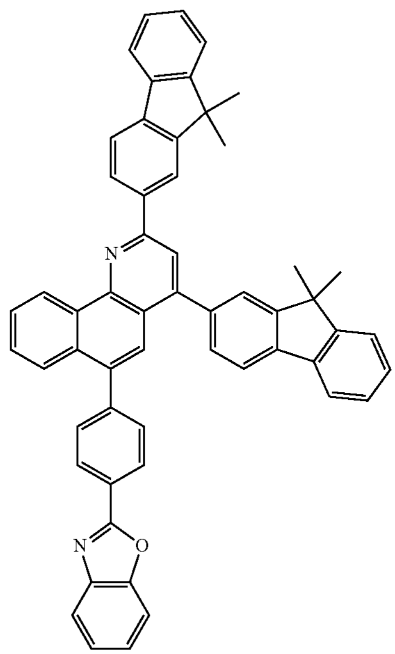
[Chemical Formula C93]
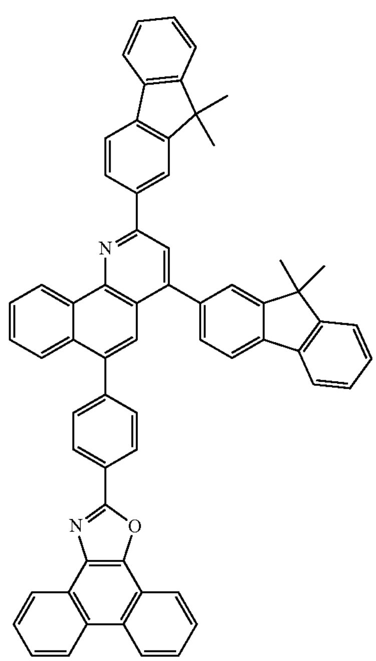
-continued
[Chemical Formula C94]
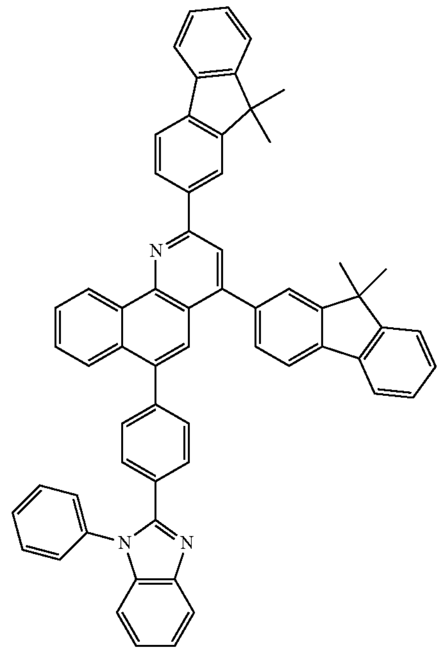
[Chemical Formula C95]
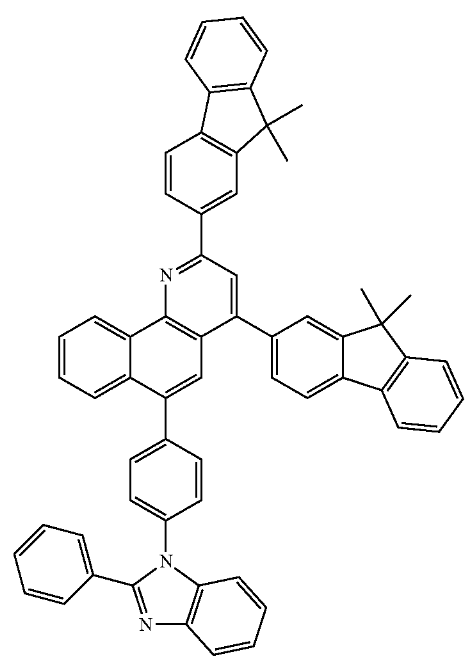

-continued
[Chemical Formula C96]
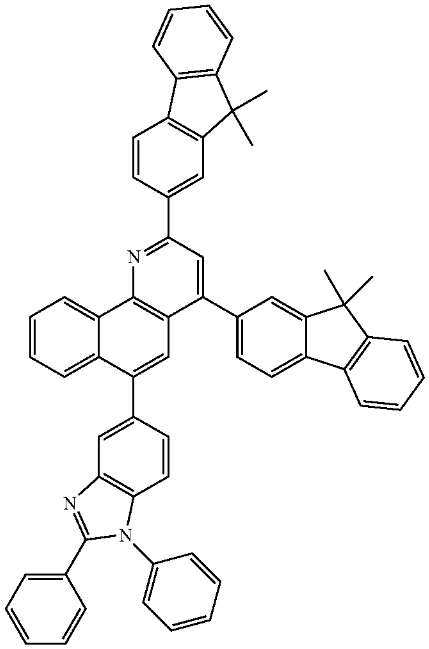
[Chemical Formula C97]
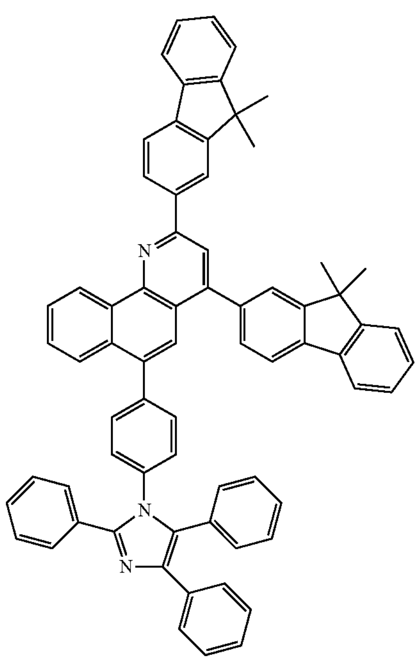
-continued
[Chemical Formula C98]
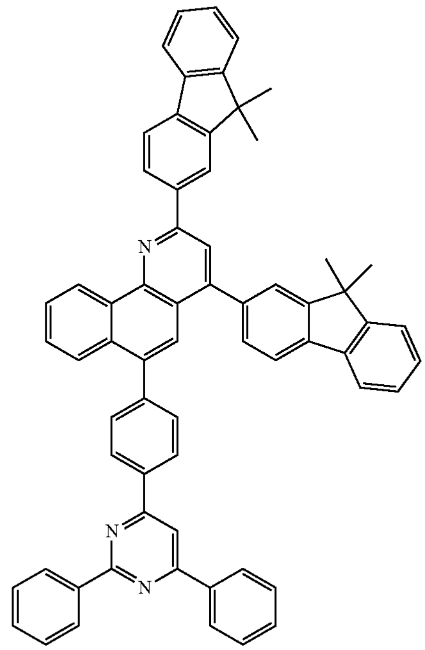
[Chemical Formula C99]
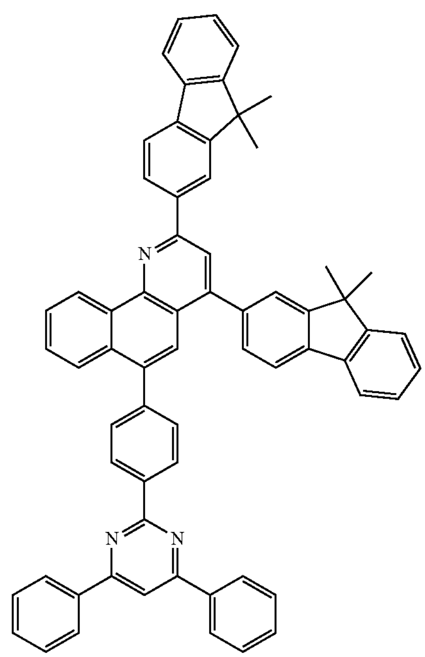

-continued
[Chemical Formula C100]
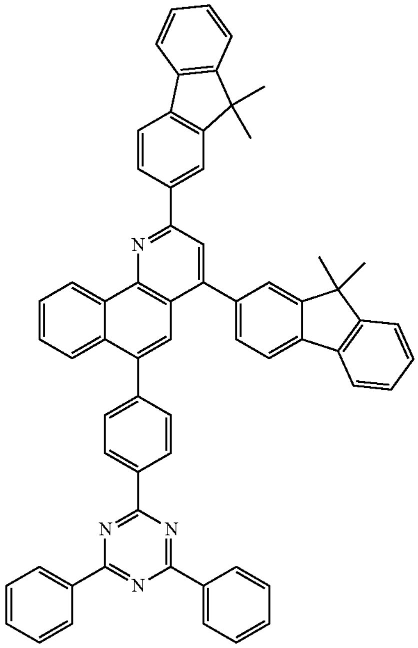
[Chemical Formula C101]
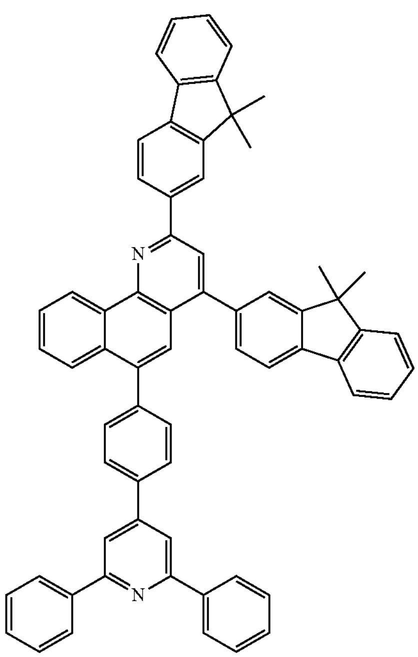
-continued
[Chemical Formula C102]
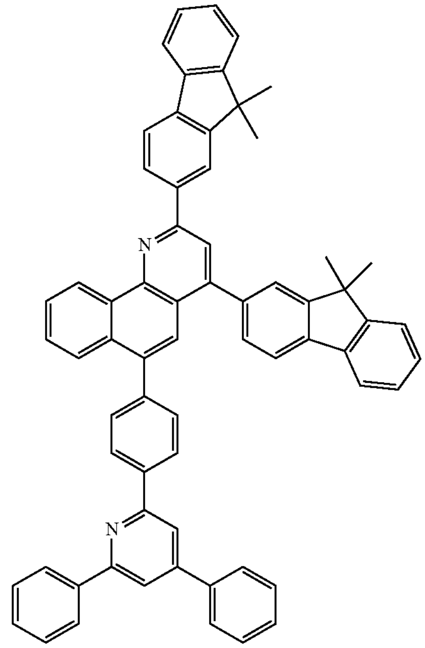
[Chemcial Formula C103]
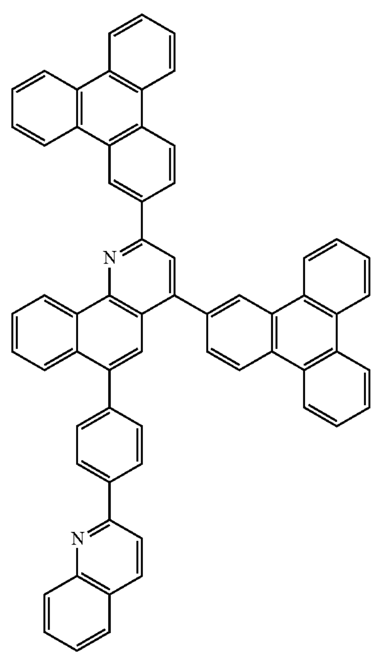

-continued
[Chemical Formula C104]
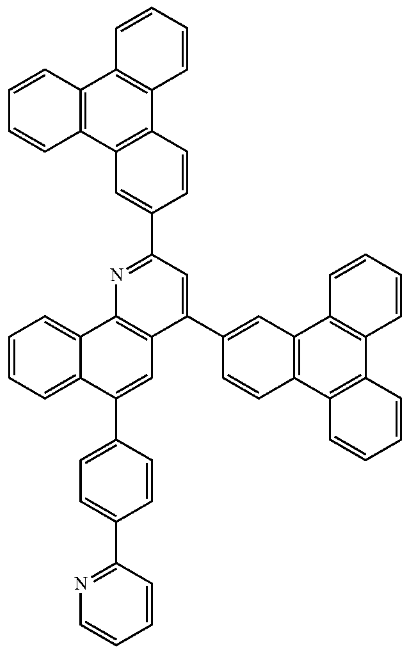
[Chemical Formula C105]
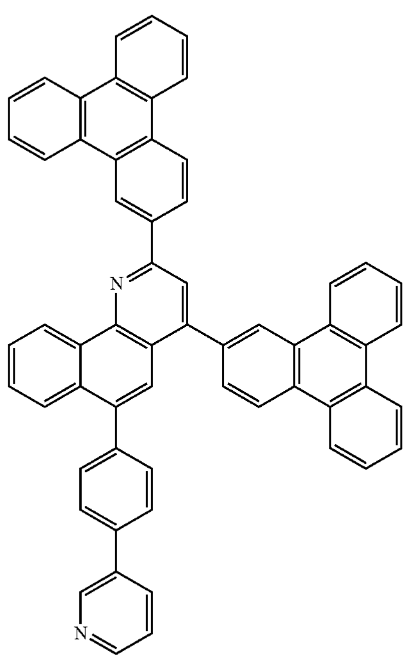
-continued
[Chemical Formula C106]
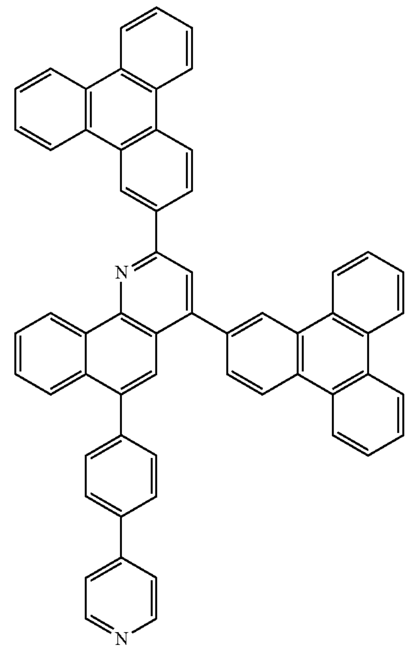
[Chemical Formula C107]
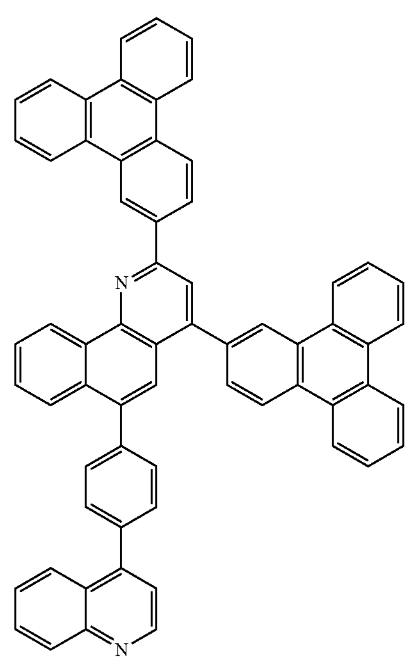

-continued
[Chemical Formula C108]
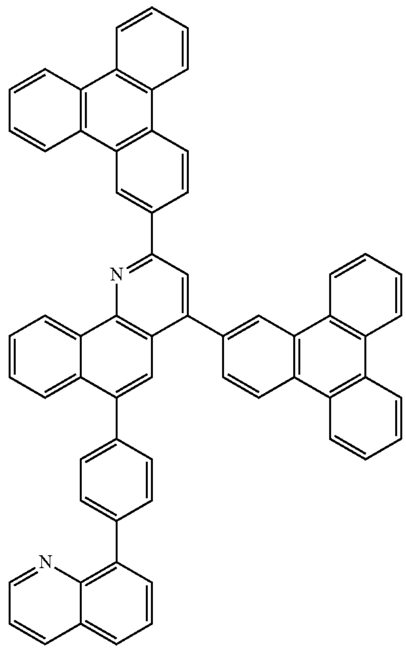
[Chemical Formula C109]
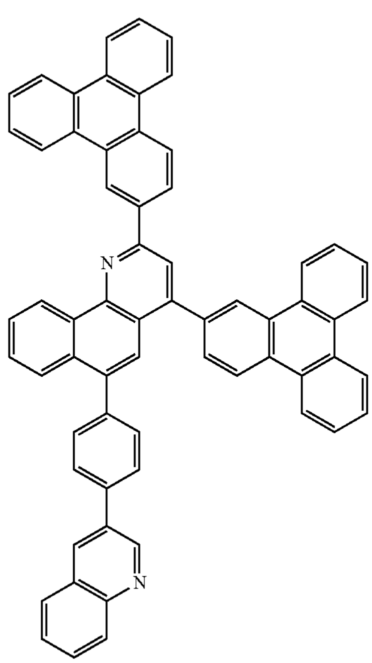
-continued
[Chemical Formula C110]
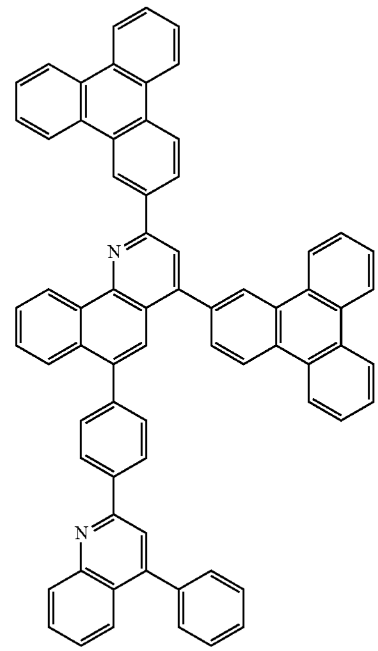
[Chemical Formula C111]
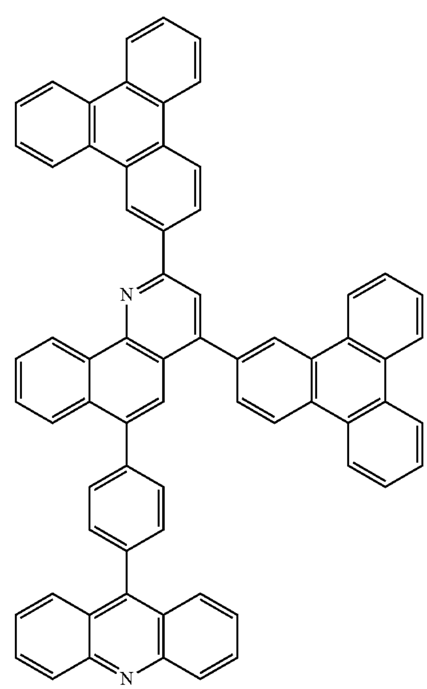

-continued
[Chemical Formula C112]
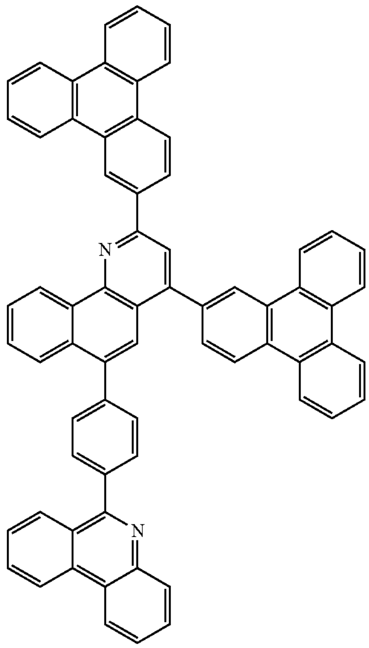
[Chemical Formula C113]
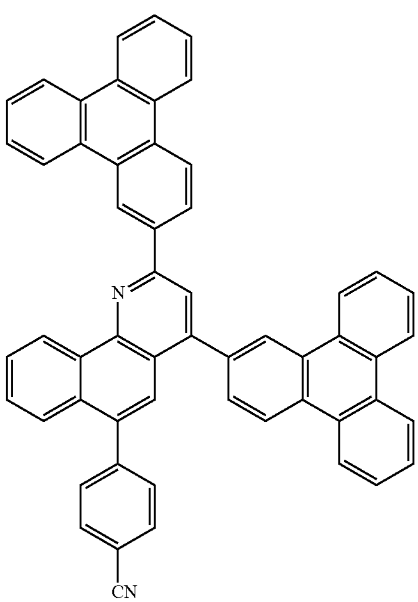
-continued
[Chemical Formula C114]
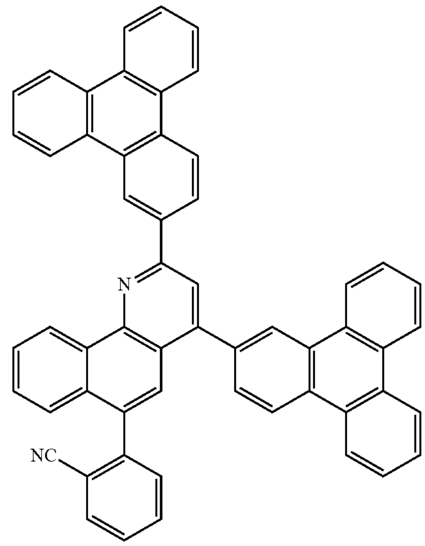
[Chemical Formula C115]
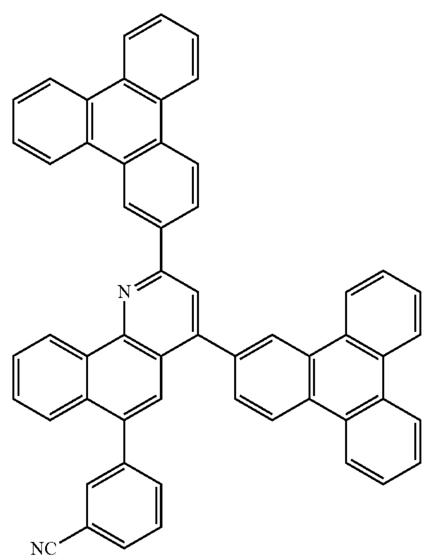

-continued
[Chemical Formula C116]
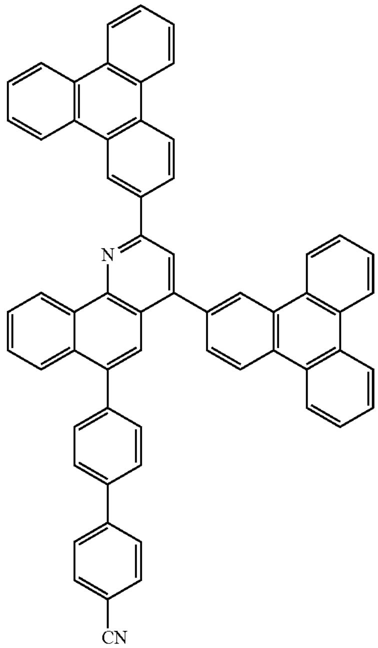
[Chemical Formula C117]
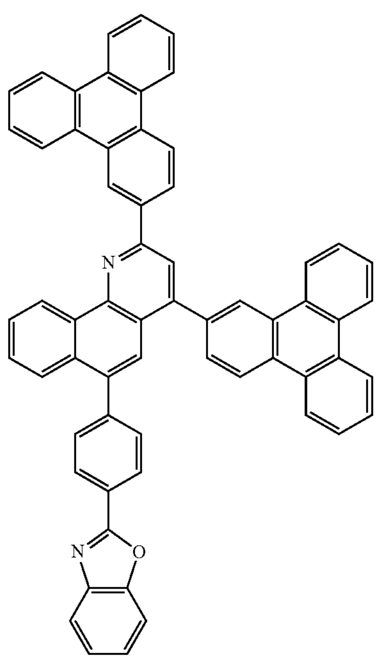
-continued
[Chemical Formula C118]
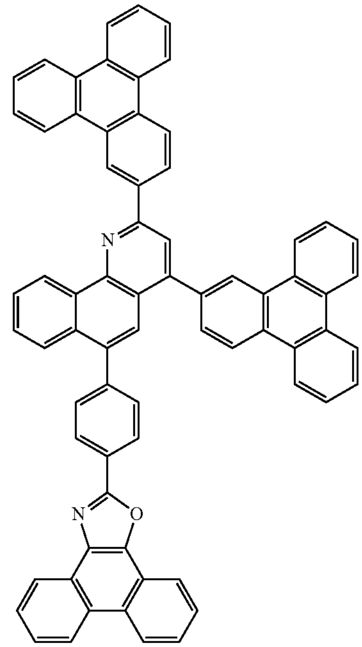
[Chemical Formula C119]
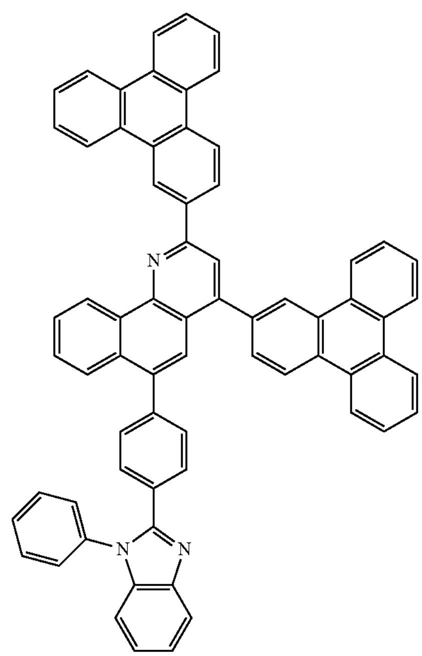

-continued
[Chemical Formula C120]
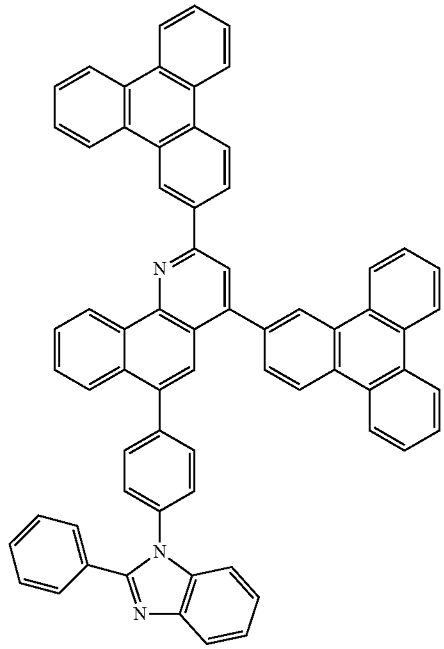
[Chemical Formula C121]
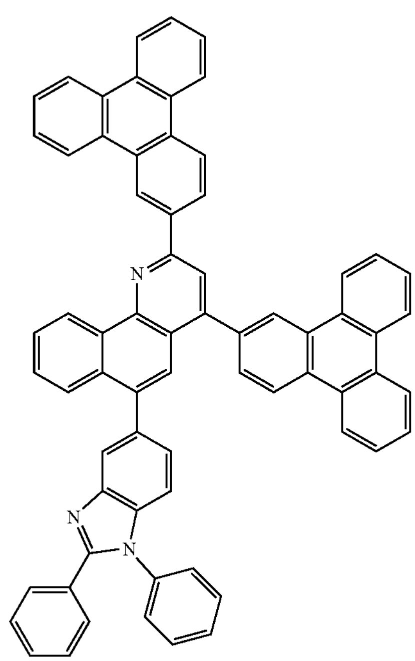
-continued
[Chemical Formula C122]
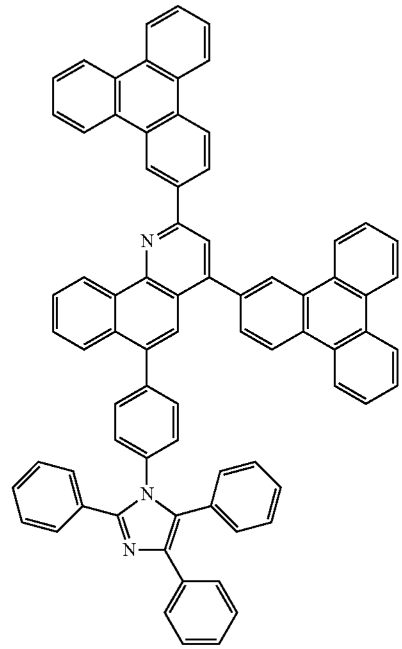
[Chemical Formula C123]
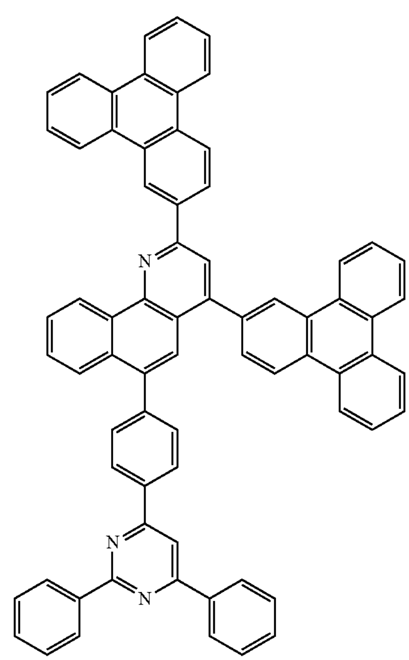

-continued
[Chemical Formula C124]
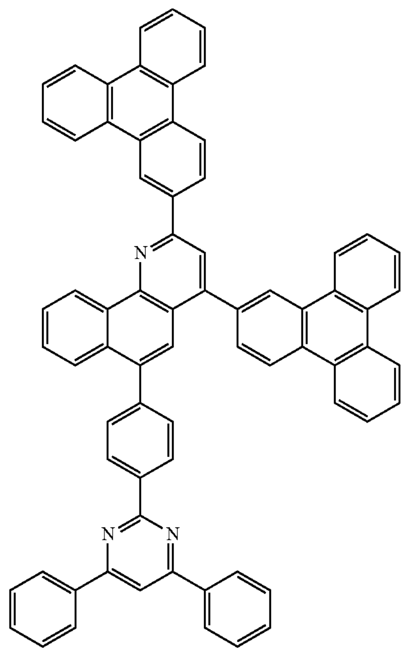
[Chemical Formula C125]
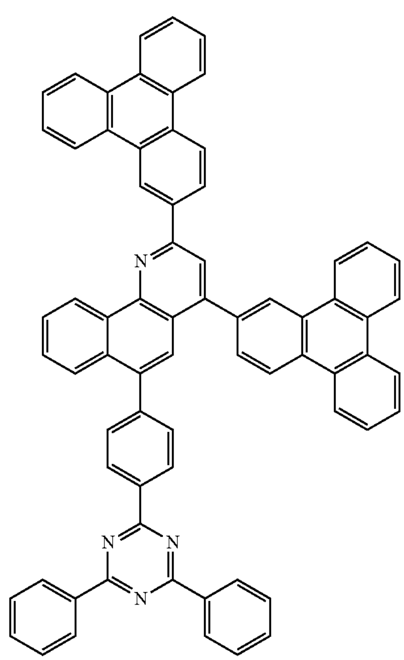
-continued
[Chemical Formula C126]
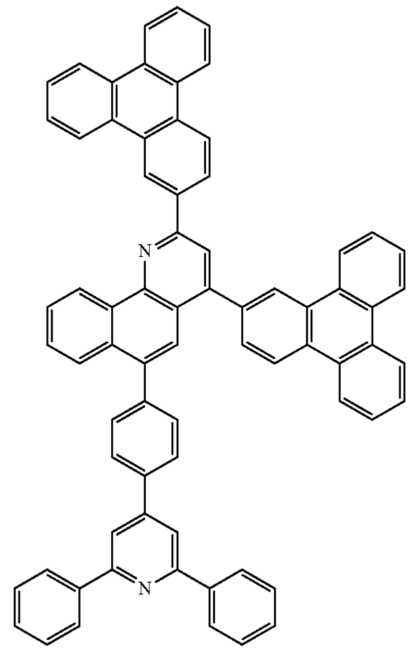
[Chemical Formula C127]
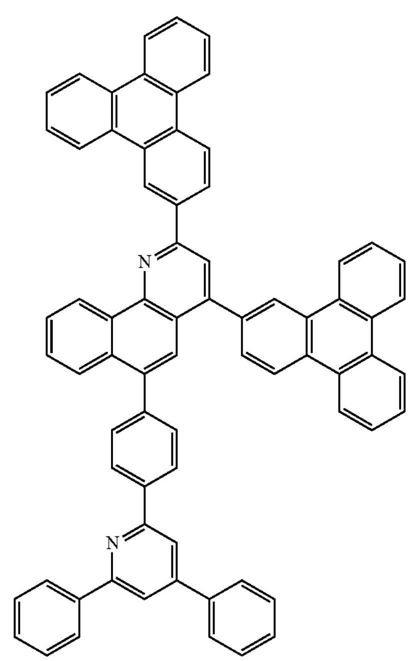

-continued
[Chemical Formula C128]
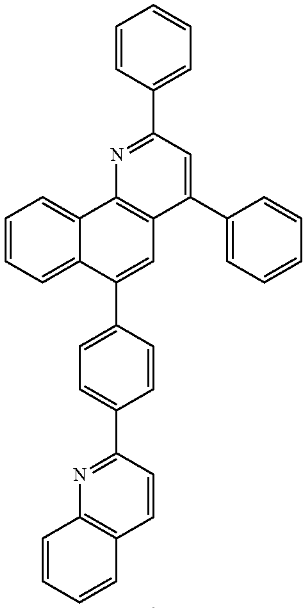
[Chemical Formula C129]
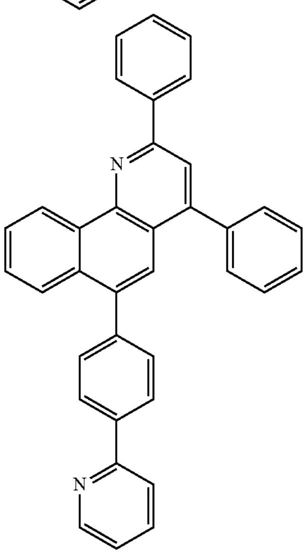
[Chemical Formula C130]
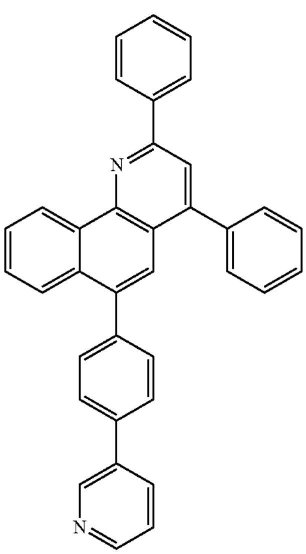
-continued
[Chemical Formula C131]
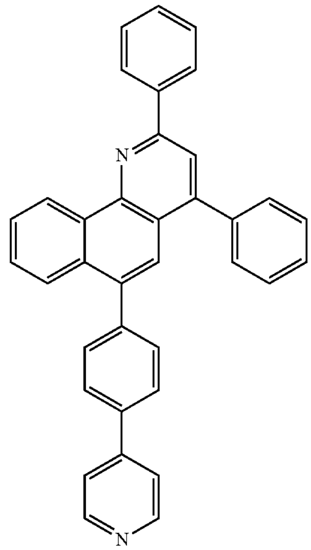
[Chemical Formula C132]
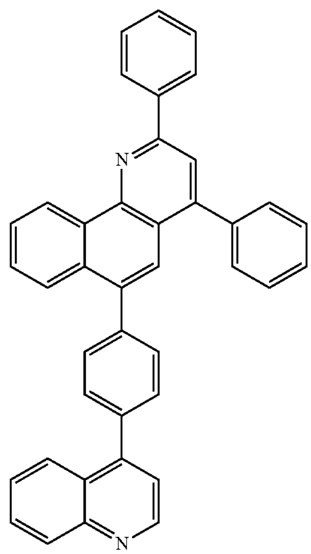
[Chemical Formula C133]
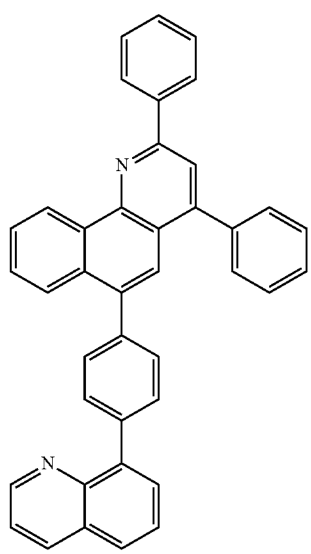

-continued
[Chemical Formula C134]
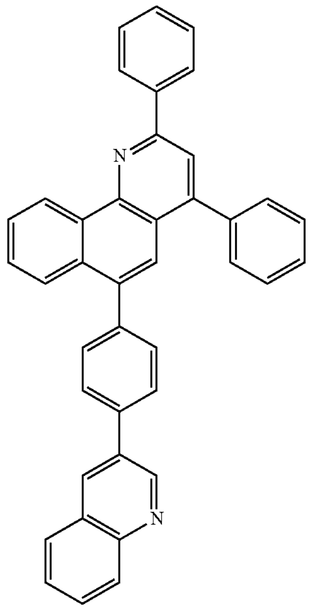
[Chemical Formula C135]
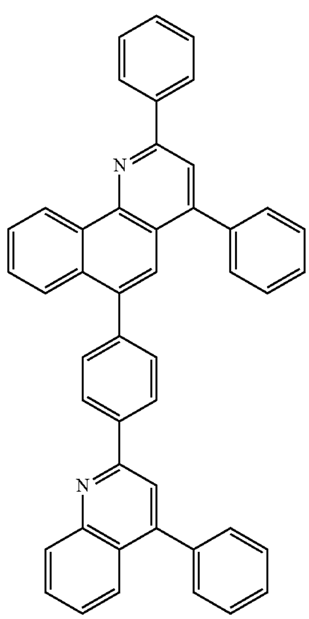
-continued
[Chemical Formula C136]
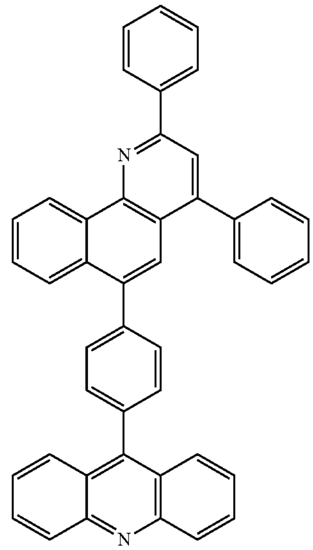
[Chemical Formula C137]
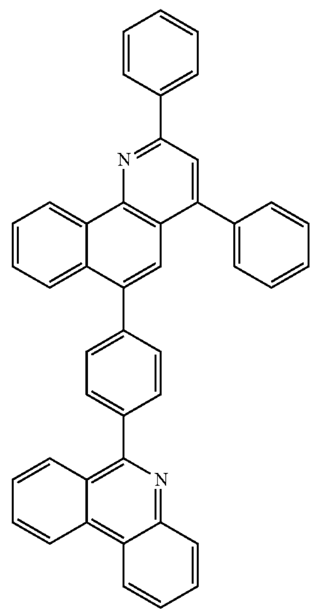
[Chemical Formula C138]
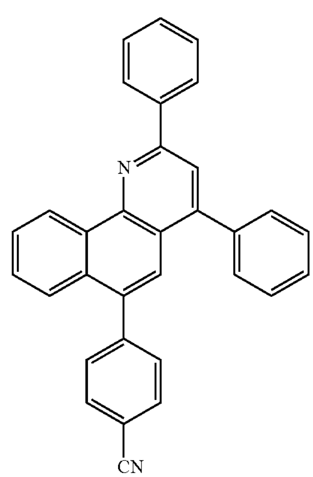

-continued
[Chemical Formula C139]
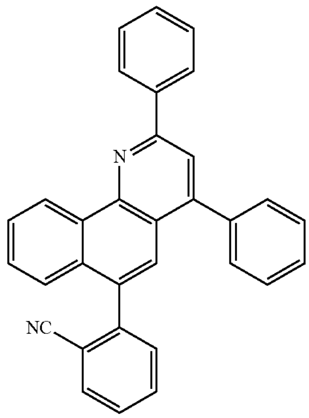
[Chemical Formula C140]
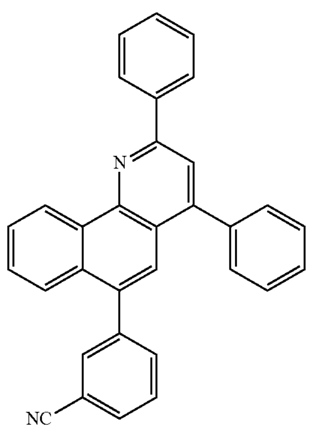
[Chemical Formula C141]
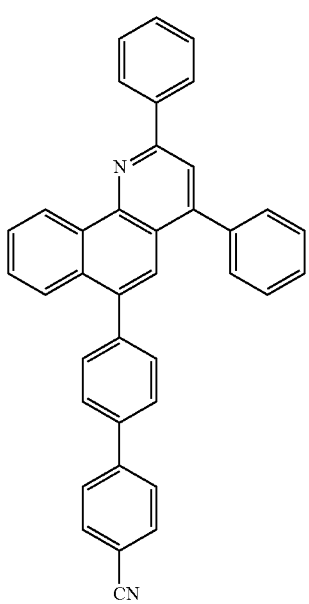
-continued
[Chemical Formula C142]
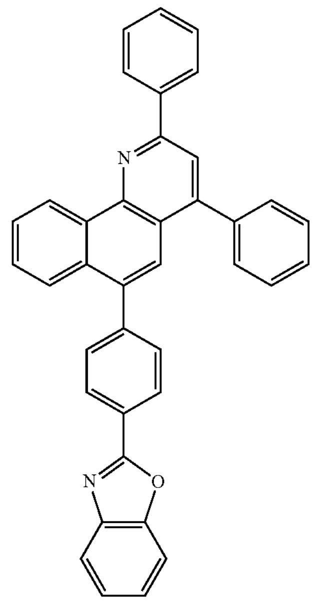
[Chemical Formula C143]
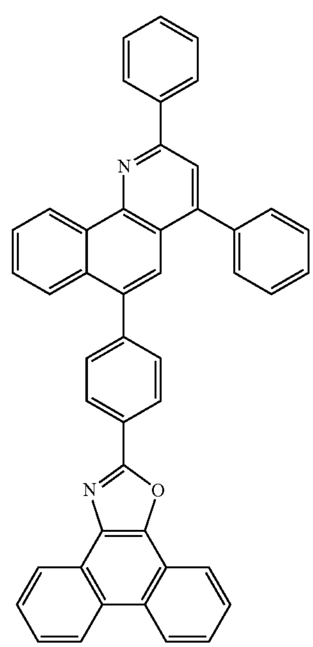

-continued
[Chemical Formula C144]
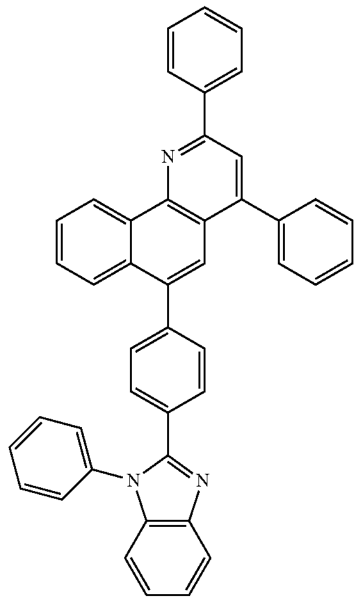
[Chemical Formula C145]
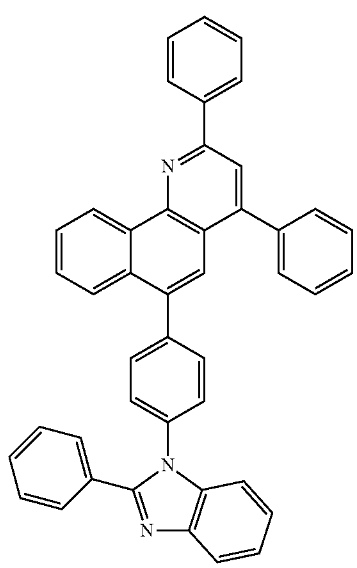
-continued
[Chemical Formula C146]
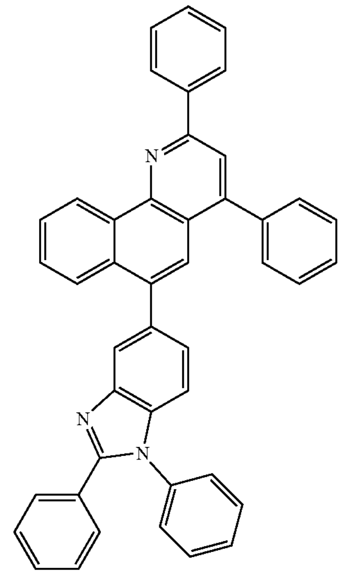
[Chemical Formula C147]
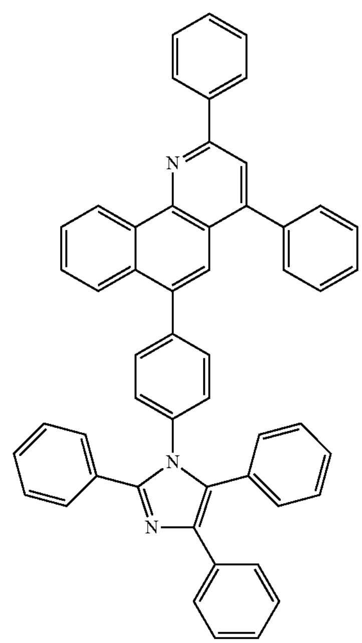

-continued
[Chemical Formula C148]
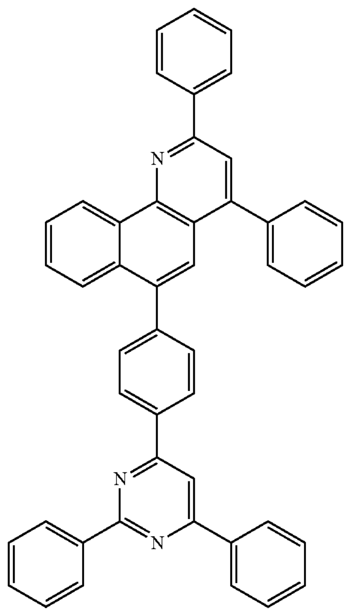
[Chemical Formula C149]
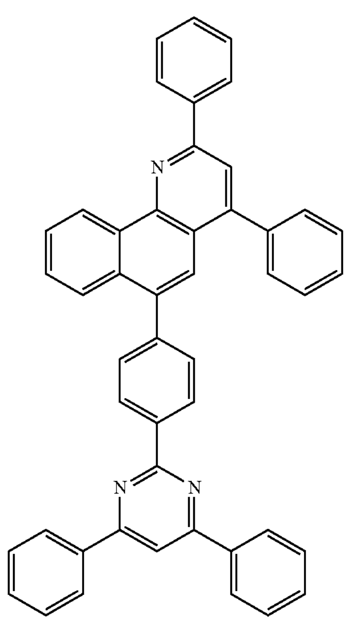
-continued
[Chemical Formula C150]
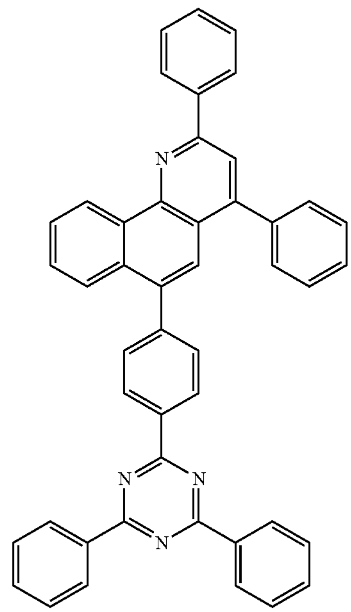
[Chemical Formula C151]
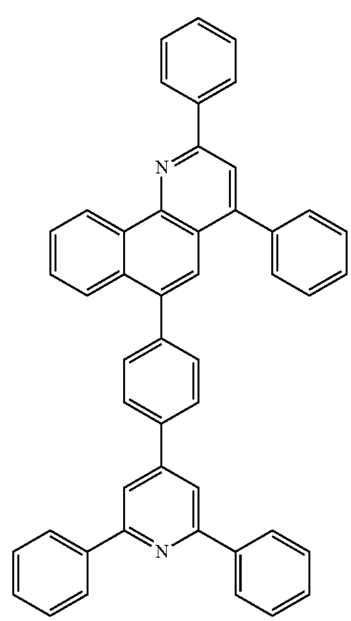

[Chemical Formula C152]
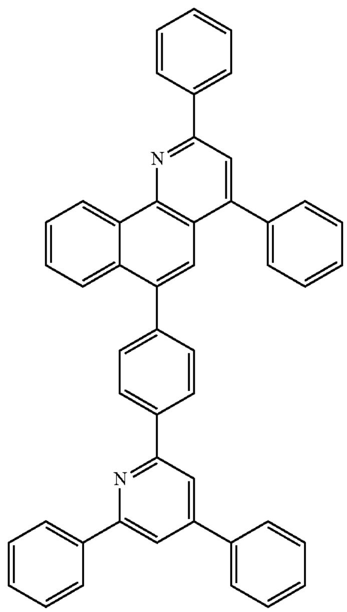
[Chemical Formula C149]
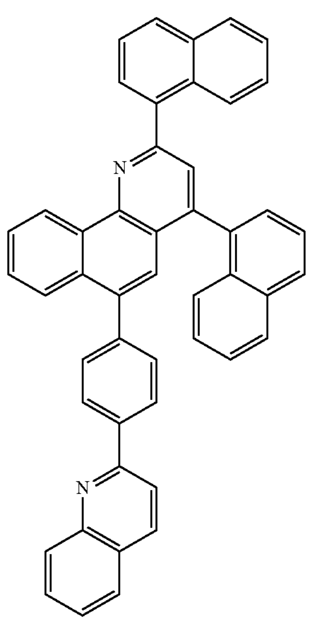
[Chemical Formula C150]
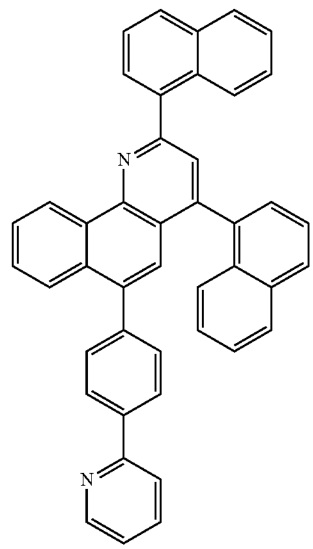
[Chemical Formula C151]
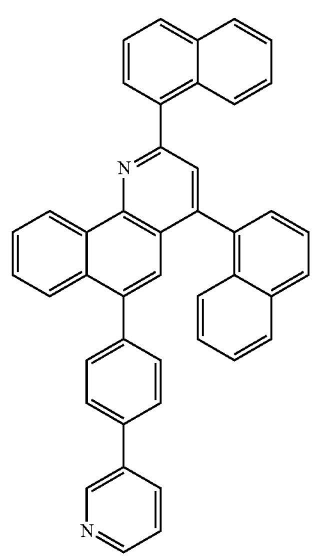

-continued
[Chemical Formula C152]
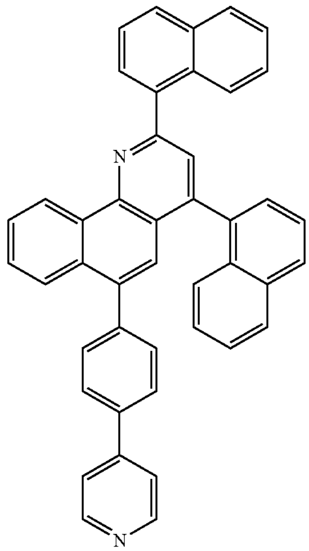
[Chemical Formula C153]
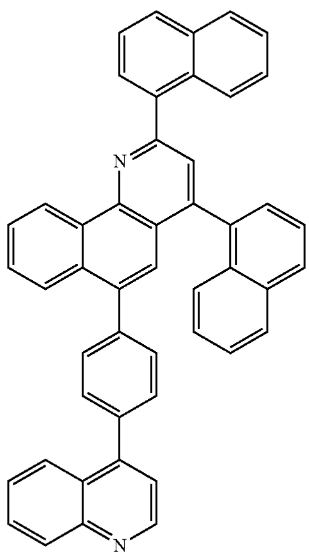
[Chemical Formula C154]
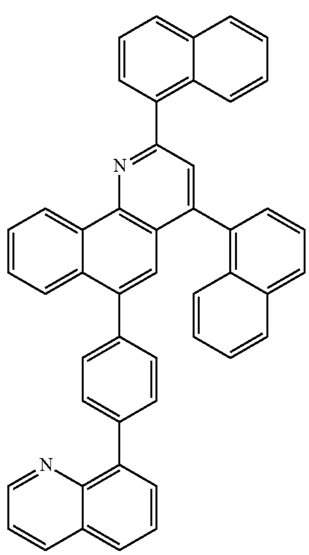
-continued
[Chemical Formula C155]
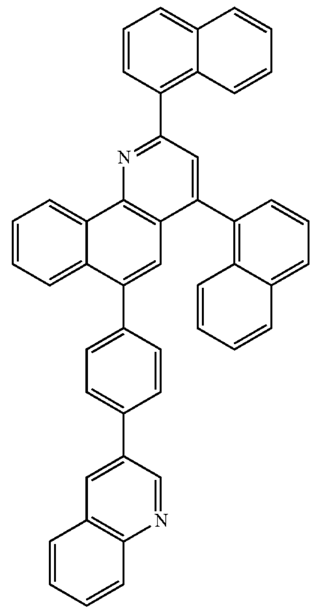
[Chemical Formula C156]
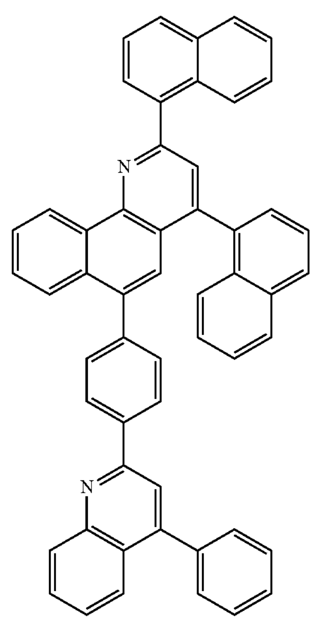

-continued
[Chemical Formula C157]
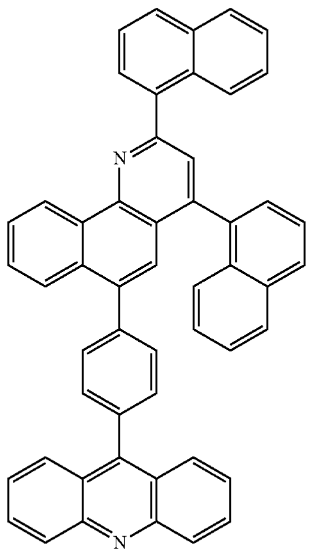
[Chemical Formula C158]
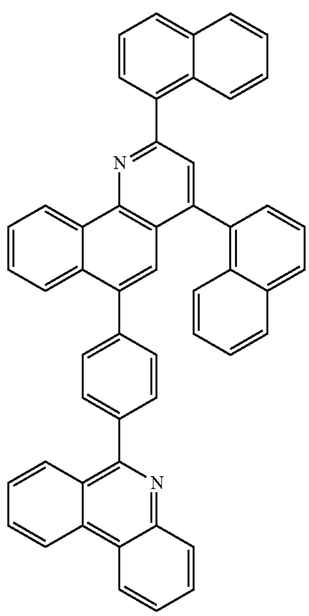
[Chemical Formula C159]
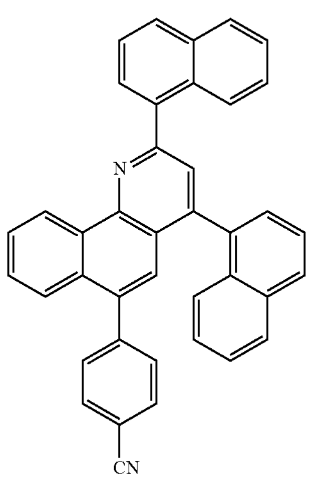
-continued
[Chemical Formula C160]
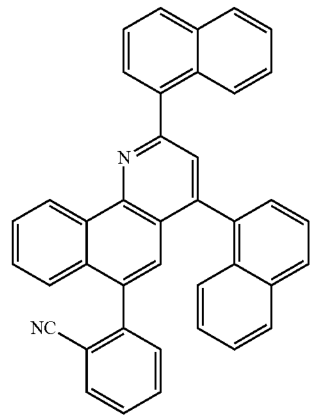
[Chemical Formula C161]
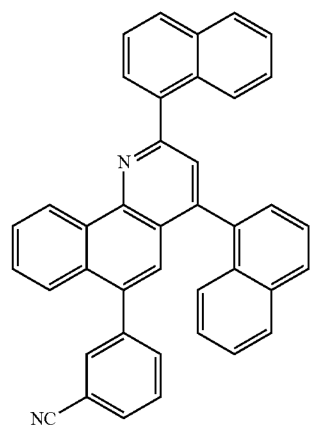
[Chemical Formula C162]
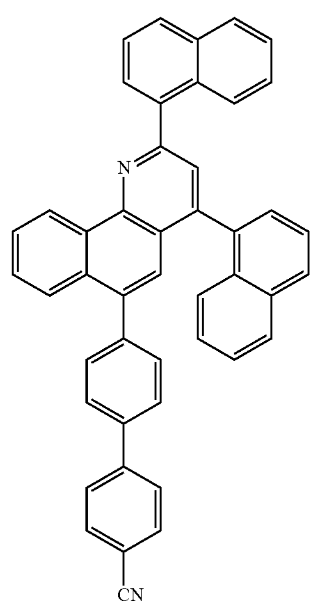

-continued
[Chemical Formula C163]
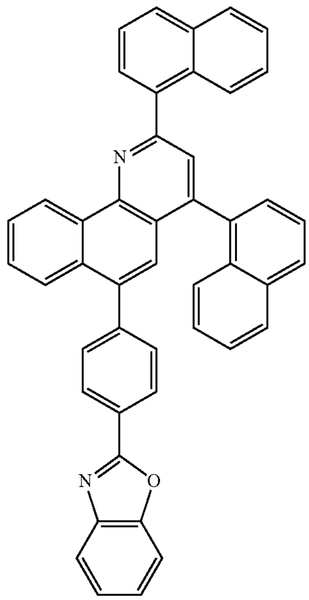
[Chemical Formula C164]
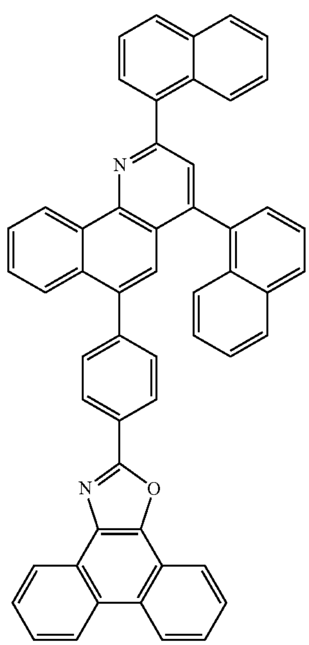
-continued
[Chemical Formula C165]
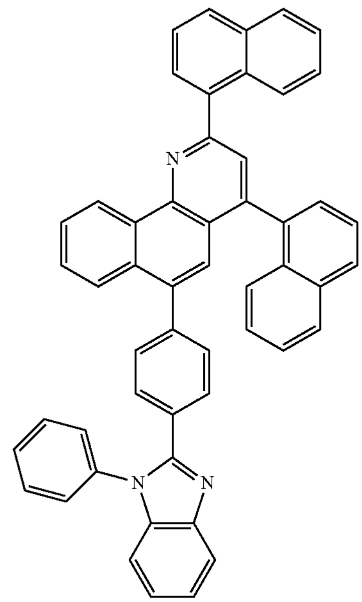
[Chemical Formula C166]
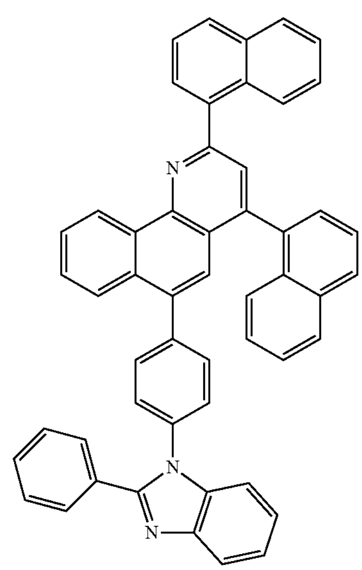

-continued
[Chemical Formula C167]
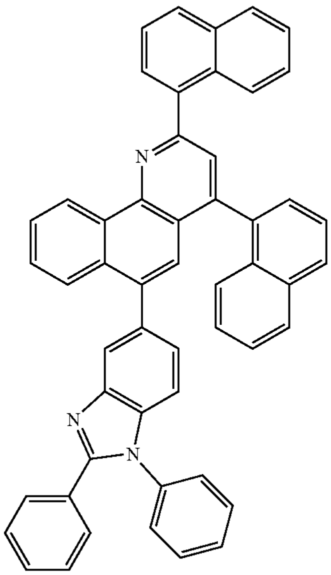
[Chemical Formula C168]
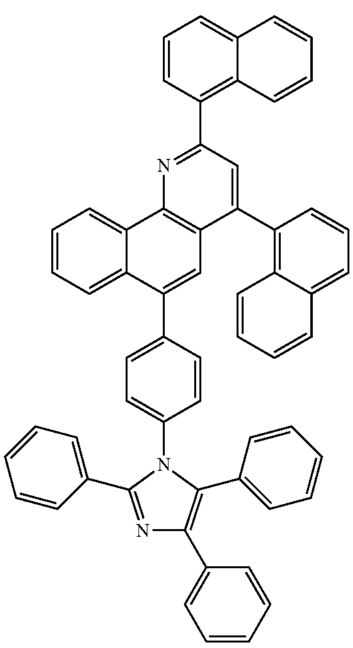
-continued
[Chemical Formula C169]
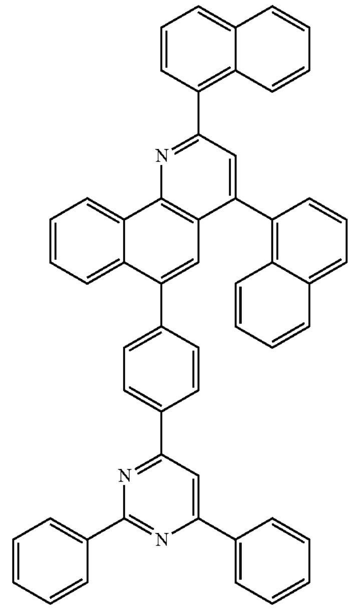
[Chemical Formula C170]
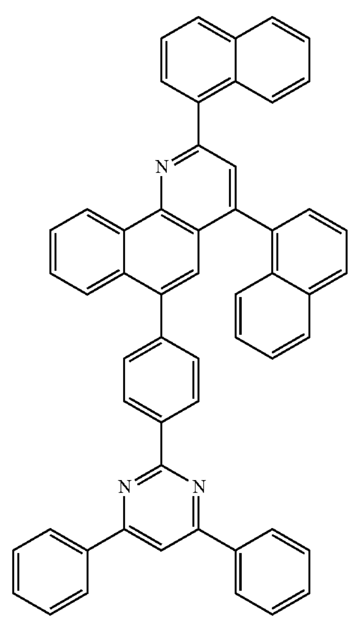

-continued

[Chemical Formula C171]

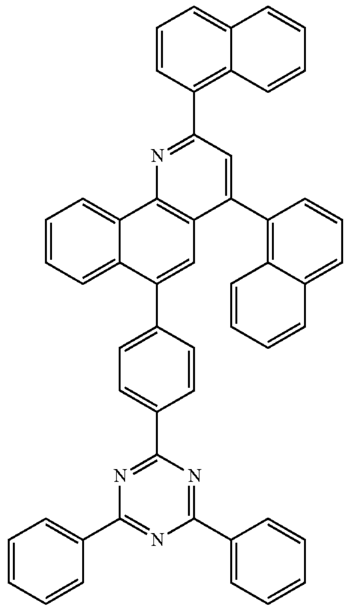

[Chemical Formula C172]

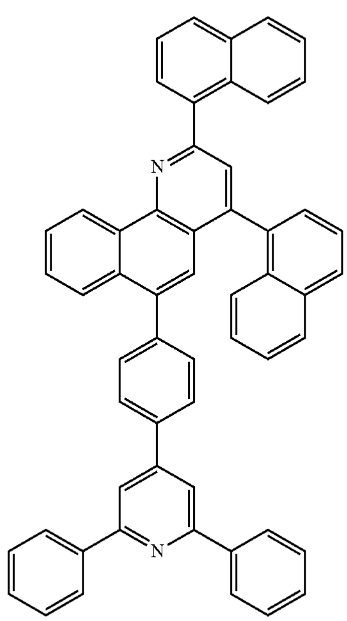

-continued

[Chemical Formula C173]

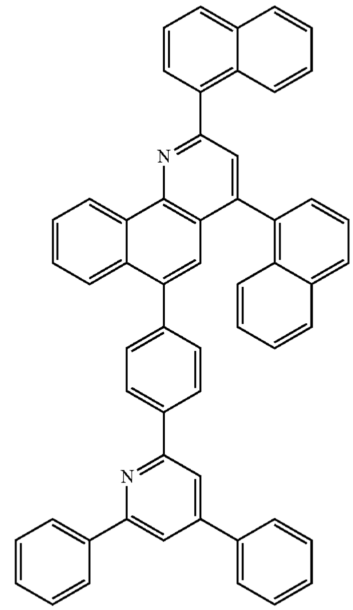

11. An organic light emitting diode, comprising an anode, a cathode, and at least one thin layer between the anode and the cathode, wherein the at least one organic thin layer includes the compound for an organic optoelectronic device as claimed in claim 2.

12. The organic light emitting diode as claimed in claim 11, wherein the at least one organic thin layer is selected from the group of an emission layer, a hole transport layer (HTL), a hole injection layer (HIL), an electron transport layer (ETL), an electron injection layer (EIL), a hole blocking layer, and a combination thereof.

13. The organic light emitting diode as claimed in claim 11, wherein the at least one organic thin layer includes an electron transport layer (ETL) or an electron injection layer (EIL), and the compound for an organic optoelectronic device is included in the electron transport layer (ETL) or the electron injection layer (EIL).

14. The organic light emitting diode as claimed in claim 11, wherein the at least one organic thin layer includes an emission layer, and the compound for an organic optoelectronic device is included in the emission layer.

15. The organic light emitting diode as claimed in claim 11, wherein the at least one organic thin layer includes an emission layer, and the compound for an organic optoelectronic device is a phosphorescent or fluorescent host material in the emission layer.

16. The organic light emitting diode as claimed in claim 11, wherein the at least one organic thin layer includes an emission layer, and the compound for an organic optoelectronic device is a fluorescent blue dopant material in the emission layer.

17. A display device including the organic light emitting diode as claimed in claim 11.

18. A compound for an organic optoelectronic device, the compound being represented by the following Chemical Formula 1:

[Chemical Formula 1]

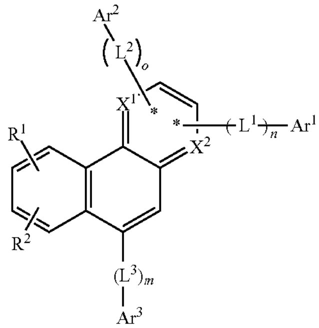

wherein, in Chemical Formula 1:

$X^1$ and $X^2$ are each independently —N— or —CR'—, in which R' is hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, or forms a sigma bond with one of the *, $R^1$ and $R^2$ are each independently hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, $Ar^1$ to $Ar^3$ are each independently a substituted or unsubstituted C6 to C30 aryl group or a substituted or unsubstituted C3 to C30 heteroaryl group, provided that at least one of $Ar^1$ or $Ar^2$ is a substituted or unsubstituted C3 to C30 heteroaryl group, $L^1$ to $L^3$ are each independently a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof, and n, m, and o are each 1.

19. A compound for an organic optoelectronic device, the compound being represented by the following Chemical Formula 1:

[Chemical Formula 1]

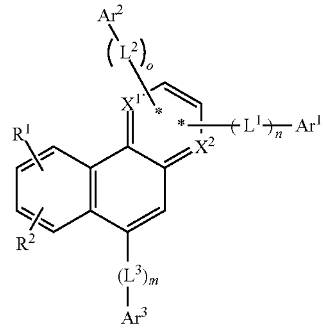

wherein, in Chemical Formula 1:

$X^1$ and $X^2$ are each independently —N— or —CR'—, in which R' is hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, or forms a sigma bond with one of the *, $R^1$ and $R^2$ are each independently hydrogen, deuterium, a substituted or unsubstituted C1 to C20 alkyl group, a substituted or unsubstituted C6 to C30 aryl group, a substituted or unsubstituted C3 to C30 heteroaryl group, or a combination thereof, $Ar^1$ is a substituted or unsubstituted C3 to C30 heteroaryl group, $Ar^2$ and $Ar^3$ are each independently a substituted or unsubstituted C6 to C30 aryl group, $L^1$ to $L^3$ are each independently a single bond, a substituted or unsubstituted C2 to C6 alkenyl group, a substituted or unsubstituted C2 to C6 alkynyl group, a substituted or unsubstituted C6 to C30 arylene group, a substituted or unsubstituted C3 to C30 heteroarylene group, or a combination thereof, and n, m, and o are each 1.

* * * * *